US012317739B2

(12) United States Patent
Lee et al.

(10) Patent No.: US 12,317,739 B2
(45) Date of Patent: May 27, 2025

(54) CONDENSED CYCLIC COMPOUND, LIGHT-EMITTING DEVICE INCLUDING CONDENSED CYCLIC COMPOUND, AND ELECTRONIC APPARATUS INCLUDING LIGHT-EMITTING DEVICE

(71) Applicant: Samsung Display Co., Ltd., Yongin-si (KR)

(72) Inventors: Yeseul Lee, Yongin-si (KR); Hyeongmin Kim, Yongin-si (KR); Heechoon Ahn, Yongin-si (KR); Hyunah Um, Yongin-si (KR); Hyoyoung Lee, Yongin-si (KR); Yirang Im, Yongin-si (KR); Seowon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 791 days.

(21) Appl. No.: 17/445,679

(22) Filed: Aug. 23, 2021

(65) Prior Publication Data

US 2022/0263034 A1 Aug. 18, 2022

(30) Foreign Application Priority Data

Feb. 1, 2021 (KR) ........................ 10-2021-0014337

(51) Int. Cl.
*H01L 51/00* (2006.01)
*C07F 7/08* (2006.01)
(Continued)

(52) U.S. Cl.
CPC ........... *H10K 85/40* (2023.02); *C07F 7/0812* (2013.01); *C09K 11/06* (2013.01);
(Continued)

(58) Field of Classification Search
None
See application file for complete search history.

(56) References Cited

U.S. PATENT DOCUMENTS 8,003,227 B2 8/2011 Vestweber et al.
8,906,521 B2 12/2014 Suda et al.
(Continued)

FOREIGN PATENT DOCUMENTS

JP 2007-520875 A 7/2007
KR 10-2010-0118700 A 11/2010
KR 10-1707799 B1 2/2017

OTHER PUBLICATIONS

Mames et al. (ChemPhysChem 2020, 21, 540-545).*
(Continued)

*Primary Examiner* — Jay Yang
(74) *Attorney, Agent, or Firm* — Womble Bond Dickinson (US) LLP

(57) ABSTRACT

An electronic apparatus includes a light-emitting device including a condensed cyclic compound represented by Formula 1, wherein, in Formula 1, $G_1$ is a group represented by Formula 2, and $G_2$ is a group represented by one of Formulae 3A to 3C:

Formula 1

(Continued)

-continued

Formula 2

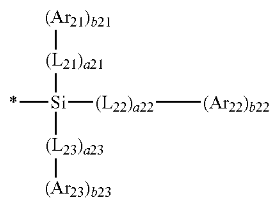

Formula 3A

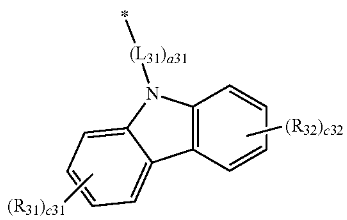

Formula 3B

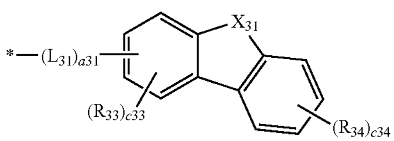

-continued

Formula 3C

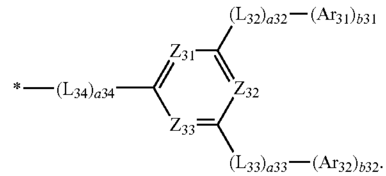

20 Claims, 3 Drawing Sheets

(51) Int. Cl.

| | |
|---|---|
| ***C09K 11/06*** | (2006.01) |
| ***H10K 85/40*** | (2023.01) |
| *H10K 50/11* | (2023.01) |
| *H10K 101/10* | (2023.01) |

(52) U.S. Cl.

CPC ................ *C09K 2211/1007* (2013.01); *C09K 2211/1011* (2013.01); *C09K 2211/1018* (2013.01); *H10K 50/11* (2023.02); *H10K 2101/10* (2023.02)

(56) References Cited

U.S. PATENT DOCUMENTS

| | | | |
|---|---|---|---|
| 10,135,002 | B2 | 11/2018 | Ono et al. |
| 2007/0173657 | A1 | 7/2007 | Chen et al. |
| 2009/0105488 | A1 | 4/2009 | Cheng et al. |
| 2015/0137084 | A1 | 5/2015 | Cheng et al. |

OTHER PUBLICATIONS

Kang, Jae-Wook et al., "Silane- and triazine-containing hole and exciton blocking material for high-efficiency phosphorescent organic light emitting diodes", *Journal of Materials Chemistry*, 2007, vol. 17, pp. 3714-3719.

* cited by examiner

CONDENSED CYCLIC COMPOUND, LIGHT-EMITTING DEVICE INCLUDING CONDENSED CYCLIC COMPOUND, AND ELECTRONIC APPARATUS INCLUDING LIGHT-EMITTING DEVICE

CROSS-REFERENCE TO RELATED APPLICATION

This application claims priority to and the benefit of Korean Patent Application No. 10-2021-0014337, filed on Feb. 1, 2021, in the Korean Intellectual Property Office, the entire content of which is incorporated herein by reference.

BACKGROUND

1. Field

One or more aspects of embodiments of the present disclosure relate to a condensed cyclic compound, a light-emitting device including the condensed cyclic compound, and an electronic apparatus including the light-emitting device.

2. Description of the Related Art

Light-emitting devices are self-emissive devices that have wide viewing angles, high contrast ratios, short response times, and/or excellent or suitable characteristics in terms of luminance, driving voltage, and/or response speed.

An example light-emitting devices includes a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers (such as holes and electrons) may then recombine in the emission layer to produce excitons. These excitons may transition from an excited state to the ground state to thereby generate light.

SUMMARY

One or more aspects of embodiments of the present disclosure are directed toward a novel condensed cyclic compound, a light-emitting device including the condensed cyclic compound, and an electronic apparatus including the light-emitting device.

Additional aspects will be set forth in part in the description that follows, and will be apparent in part from the description, or may be learned by practice of the presented embodiments of the disclosure.

One or more embodiments of the present disclosure provide a condensed cyclic compound represented by Formula 1:

Formula 1

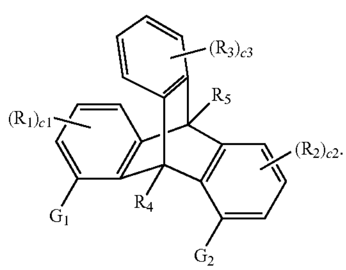

In Formula 1 (e.g., a triptycene-based molecule, for example with a core formed from a bicyclo[2.2.2]octane fused with three independent benzene groups at each pair of non-bridging carbon atoms), $G_1$ may be a group represented by Formula 2, and $G_2$ may be a group represented by one of Formulae 3A to 3C.

Formula 2

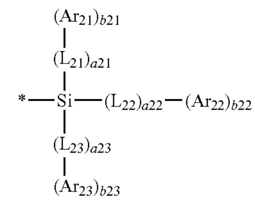

Formula 3A

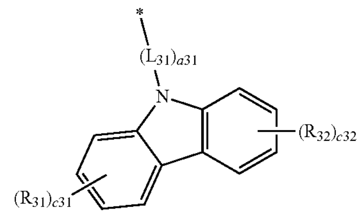

Formula 3B

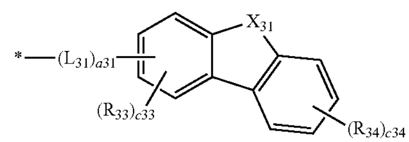

Formula 3C

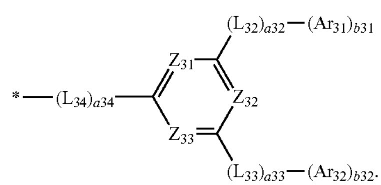

In Formulae 1, 2, and 3A to 3C, $X_{31}$ may be $N(R_{35})$, O or S, $Z_{31}$ may be $C(R_{36})$ or N, $Z_{32}$ may be $C(R_{37})$ or N, $Z_{33}$ may be $C(R_{38})$ or N, and at least one of $Z_{31}$ to $Z_{33}$ may be N, $L_{21}$ to $L_{23}$ and $L_{31}$ to $L_{34}$ may each independently be a single bond, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a21 to a23 and a31 to a34 may each independently be an integer from 1 to 3, $Ar_{21}$ to $Ar_{23}$, $Ar_{31}$, and $Ar_{32}$ may each independently be a $C_3$-$C_{60}$ carbocyclic group unsubstituted or substituted with at least one $R_{10a}$, $C_1$-$C_{60}$ heterocyclic group unsubstituted or substituted with at least one $R_{10a}$, or —$Si(Q_1)(Q_2)(Q_3)$, b21 to b23, b31, and b32 may each independently be an integer from 1 to 5, $R_1$ to $R_5$ and $R_{31}$ to $R_{38}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, $C_2$-$C_{60}$ alkenyl group unsubstituted or substituted with at least one $R_{10a}$, $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)$_2$($Q_1$), —S(=O)$_2$($Q_1$), or —P(=O)($Q_1$)($Q_2$), c1, c2, and c33 may each independently be an integer from 1 to 3, c3, c31, c32, and c34 may each independently be an integer from 1 to 4, and $R_{10a}$ may be:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

One or more embodiments of the present disclosure provide a light-emitting device including a first electrode, a second electrode facing the first electrode, and an interlayer between the first electrode and the second electrode and including an emission layer, wherein the light-emitting device may include the condensed cyclic compound.

One or more embodiments of the present disclosure provide an electronic apparatus including the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
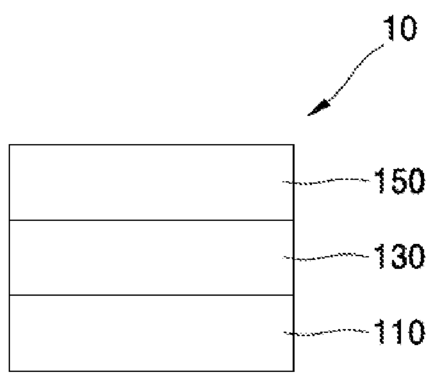
FIG. 1 is a schematic cross-sectional view of a light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variations thereof.

As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively. As used herein, expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure".

A condensed cyclic compound may be represented by Formula 1:

Formula 1

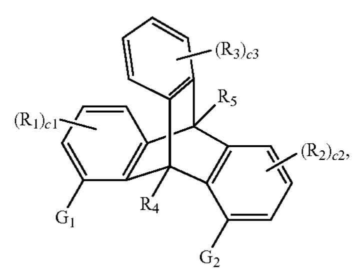

Formula 2

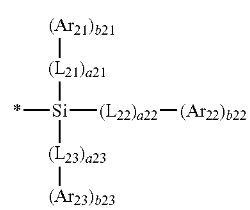

Formula 3A

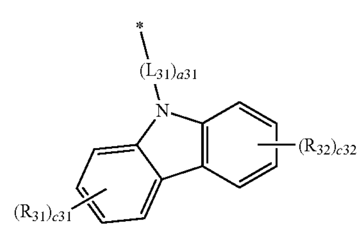

-continued

Formula 3B

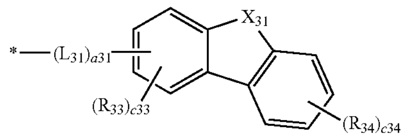

Formula 3C

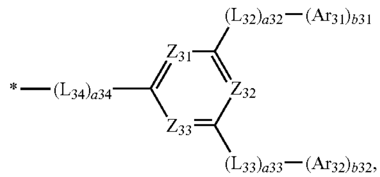

wherein, in Formula 1, $G_1$ may be a group represented by Formula 2, and $G_2$ may be a group represented by one of Formulae 3A to 3C:

wherein, in Formula 3B, $X_{31}$ may be $N(R_{35})$, O, or S.

In Formula 3C, $Z_{31}$ may be $C(R_{36})$ or N, $Z_{32}$ may be $C(R_{37})$ or N, $Z_{33}$ may be $C(R_{38})$ or N, and at least one of $Z_{31}$ to $Z_{33}$ may be N.

In an embodiment, in Formula 3C, $Z_{31}$ may be N, $Z_{32}$ may be $C(R_{37})$, and $Z_{33}$ may be $C(R_{38})$, $Z_{31}$ may be $C(R_{36})$, $Z_{32}$ may be N, and $Z_{33}$ may be $C(R_{38})$, $Z_{31}$ may be $C(R_{36})$, $Z_{32}$ may be $C(R_{37})$, and $Z_{33}$ may be N, $Z_{31}$ and $Z_{32}$ may each be N, and $Z_{33}$ may be $C(R_{38})$, $Z_{32}$ and $Z_{33}$ may each be N, and $Z_{31}$ may be $C(R_{36})$, $Z_{31}$ and $Z_{33}$ may each be N, and $Z_{32}$ may be $C(R_{37})$, or $Z_{31}$ to $Z_{33}$ may each be N.

In Formulae 2 and 3A to 3C, $L_{21}$ to $L_{23}$ and $L_{31}$ to $L_{34}$ may each independently be a single bond, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In Formulae 2 and 3A to 3C, a21 to a23 and a31 to a34 may respectively indicate the number of $L_{21}$(s) to $L_{23}$(s) and $L_{31}$(s) to $L_{34}$(s). a21 to a23 and a31 to a34 may each independently be an integer from 1 to 3.

In an embodiment, $L_{21}$ to $L_{23}$ and $L_{31}$ to $L_{34}$ may each independently be:

a single bond; or a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, or an imidazopyrimidine group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, a benzofuranyl group, a benzothiophenyl group, a dibenzofuranyl group, a dibenzothiophenyl group, a carbazolyl group, a benzosilolyl group, a dibenzosilolyl group, a quinolinyl group, an isoquinolinyl group, a benzimidazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, wherein $Q_{31}$ to $Q_{33}$ may each independently be a $C_1$-$C_{10}$ alkyl group, a $C_r$ $C_{10}$ alkoxy group, a phenyl group, a biphenyl group, a terphenyl group, or a naphthyl group.

In one or more embodiments, $L_{21}$ to $L_{23}$ and $L_{31}$ to $L_{34}$ may each independently be a group represented by one of Formulae 3-1 to 3-24:

3-1

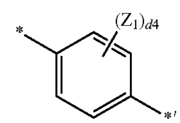

3-2

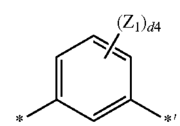

3-3

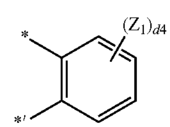

3-4

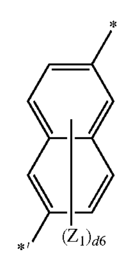

3-5

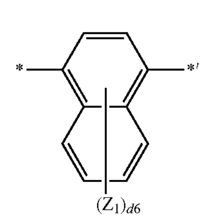

-continued
3-6
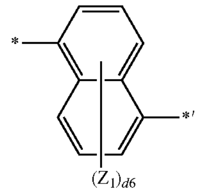
3-7
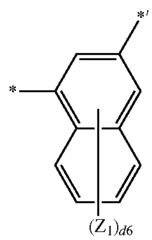
3-8
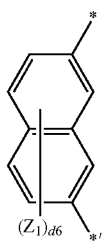
3-9
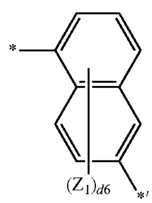
3-10
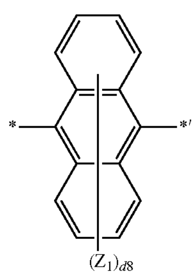
3-11
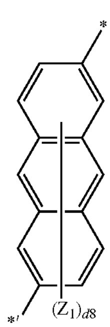
-continued
3-12
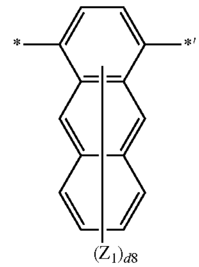
3-13
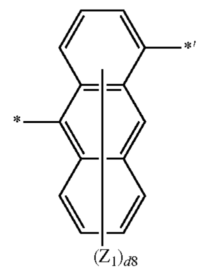
3-14
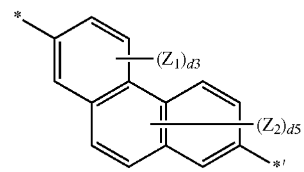
3-15
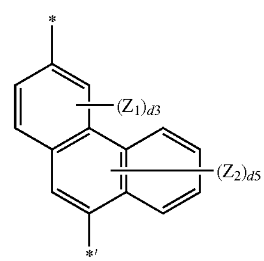
3-16
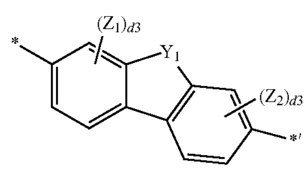
3-17
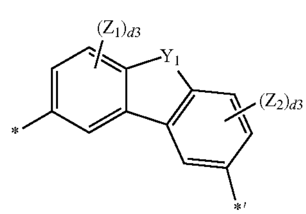
3-18
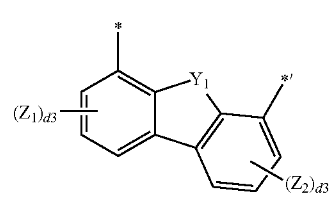

-continued 3-19

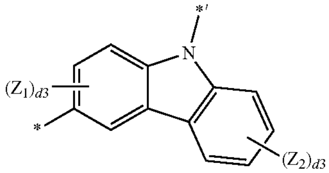

3-20

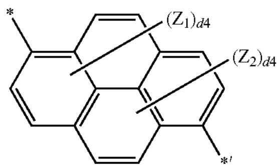

3-21

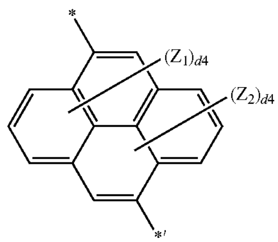

3-22

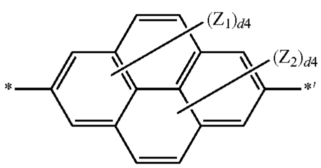

3-23

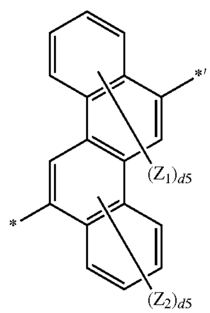

3-24

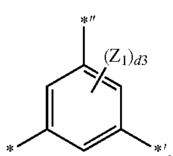

wherein, in Formulae 3-1 to 3-24, $Y_1$ may be $C(Z_3)(Z_4)$, $Si(Z_5)(Z_6)$, $N(Z_7)$, O, or S, $Z_1$ to $Z_7$ may each independently be hydrogen, deuterium, —F, —Cl, —Br, —I, a hydroxyl group, a cyano group, a nitro group, an amidino group, a hydrazino group, a hydrazono group, $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a triazinyl group, a dibenzofuranyl group, a dibenzot hiophenyl group, a carbazolyl group, a dibenzosilolyl group, a quinolinyl group, an isoquinolinyl group, a benzimidazolyl group, —$Si(Q_{31})(Q_{32})(Q_{33})$, —$N(Q_{31})(Q_{32})$, or —$B(Q_{31})(Q_{32})$, d3 may be an integer from 1 to 3, d4 may be an integer from 1 to 4, d5 may be an integer from 1 to 5, d6 may be an integer from 1 to 6, d8 may be an integer from 1 to 8, $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group, and

*, *', and *" each indicate a binding site to an adjacent atom.

In some embodiments, in Formulae 2 and 3A to 3C, a21 to a23 and a31 to a34 may each be 1, and $L_{21}$ to $L_{23}$, and $L_{31}$ to $L_{34}$ may each independently be a single bond or a group represented by one of Formulae 3-1 to 3-3 and 3-24:

3-1

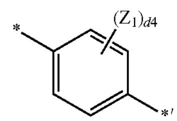

3-2

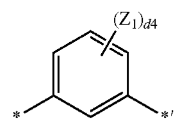

3-3

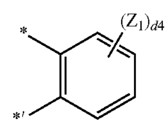

3-24

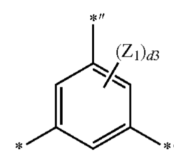

wherein, in Formulae 3-1 to 3-3 and 3-24, $Z_1$, d3, and d4 may respectively be understood by referring to the descriptions of $Z_1$, d3, and d4 provided herein, and

*, *', and *" each indicate a binding site to an adjacent atom.

In Formulae 2 and 3C, $Ar_{21}$ to $Ar_{23}$, $Ar_{31}$, and $Ar_{32}$ may each independently be a $C_3$-$C_{60}$ carbocyclic group unsubstituted or substituted with at least one $R_{10a}$, a $C_r$ $C_H$ heterocyclic group unsubstituted or substituted with at least one $R_{10a}$, or —$Si(Q_1)(Q_2)(Q_3)$, wherein $Q_1$ to $Q_3$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $Ar_{21}$ to $Ar_{23}$, $Ar_{31}$, and $Ar_{32}$ may each independently be:

a cyclopentyl group, a cyclohexyl group, a cycloheptyl group, a cyclopentenyl group, a cyclohexenyl group, a phenyl group, a biphenyl group, a naphthyl group, a terphenyl group, a fluorenyl group, a spiro-bifluorenyl group, a spiro-cyclopentane-fluorenyl group, a spiro-cyclohexane-fluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a thiadiazolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, an imidazopyridinyl group, or an imidazopyrimidinyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a terphenyl group, a fluorenyl group, a spiro-bifluorenyl group, a spiro-cyclopentane-fluorenyl group, a spiro-cyclohexane-fluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a thiadiazolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, an imidazopyridinyl group, an imidazopyrimidinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof; or —$Si(Q_1)(Q_2)(Q_3)$, wherein $Q_1$ to $Q_3$ and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In one or more embodiments, $Ar_{21}$ to $Ar_{23}$, $Ar_{31}$, and $Ar_{32}$ in Formulae 2 and 3C may each independently be a group represented by one of Formulae 5-1 to 5-19 or —$Si(Q_1)(Q_2)(Q_3)$:

5-1

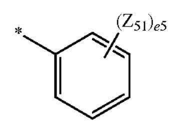

5-2

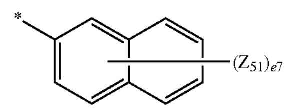

5-3

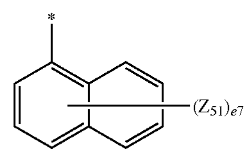

5-4

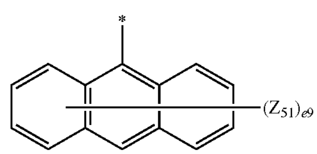

5-5

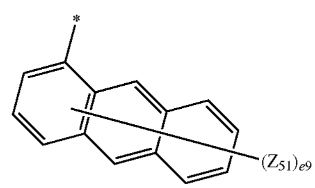

5-6

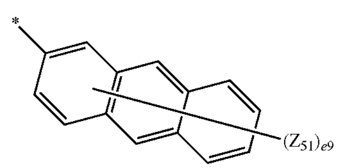

5-7

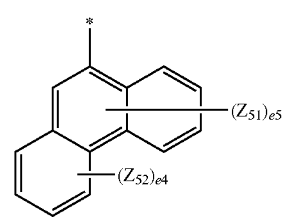

5-8

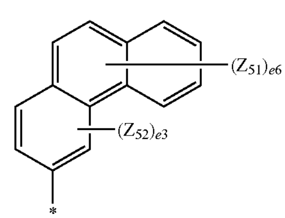

-continued 5-9

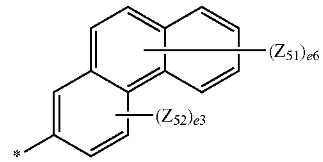

5-10

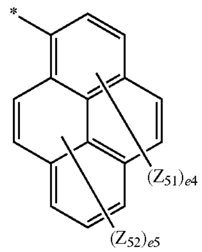

5-11

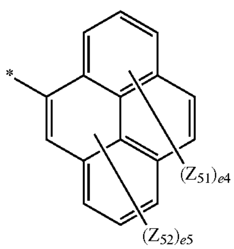

5-12

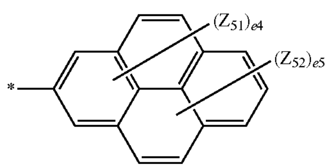

5-13

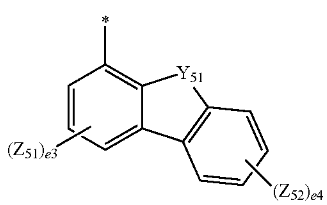

5-14

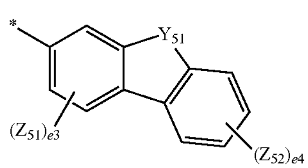

5-15

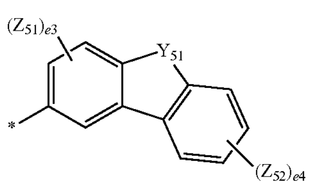

5-16

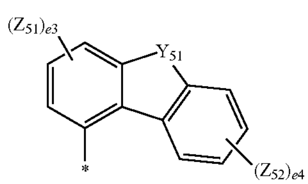

-continued 5-17

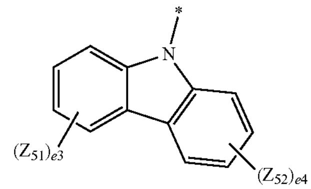

5-18

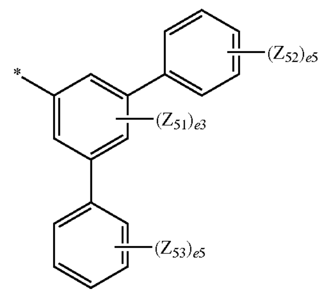

5-19

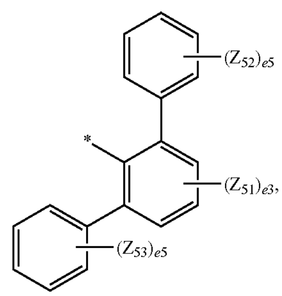

wherein, in Formulae 5-1 to 5-19, $Y_{51}$ may be O, S, $N(Z_{53})$, $C(Z_{54})(Z_{55})$, or $Si(Z_{56})(Z_{57})$, $Z_{51}$ to $Z_{57}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a pyridinyl group, a pyrazinyl group, a pyrimidinyl group, a pyridazinyl group, a triazinyl group, a dibenzofuranyl group, a dibenzothiophenyl group, a carbazolyl group, a dibenzosilolyl group, a quinolinyl group, an isoquinolinyl group, a benzimidazolyl group, $—Si(Q_{31})(Q_{32})(Q_{33})$, $—N(Q_{31})(Q_{32})$, or $—B(Q_{31})(Q_{32})$, e3 may be an integer from 1 to 3, e4 may be an integer from 1 to 4, e5 may be an integer from 1 to 5, e6 may be an integer from 1 to 6, e7 may be an integer from 1 to 7, and e9 may be an integer from 1 to 9, wherein $Q_1$ to $Q_3$ and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group, and

* indicates a binding site to an adjacent atom.

In some embodiments, $Ar_{21}$ to $Ar_{23}$, $Ar_{31}$, and $Ar_{32}$ may each independently be a group represented by one of Formulae 6-1 to 6-42:

6-1
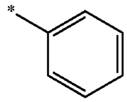
6-2
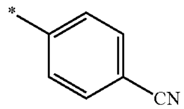
6-3
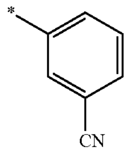
6-4
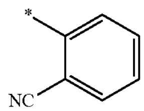
6-5
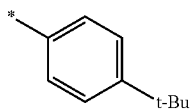
6-6
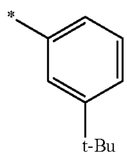
6-7
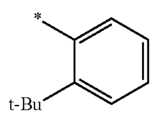
6-8
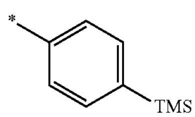
6-9
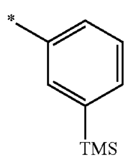
6-10
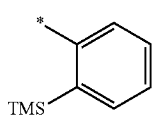
6-11
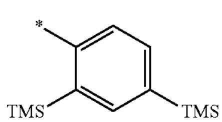
6-12
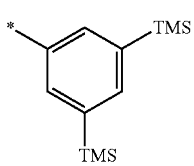
-continued
6-13
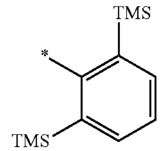
6-14
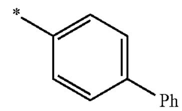
6-15
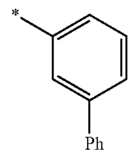
6-16
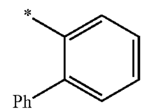
6-17
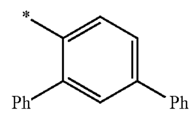
6-18
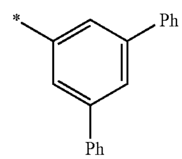
6-19
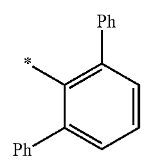
6-20
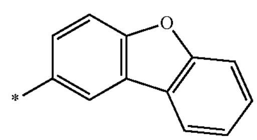
6-21
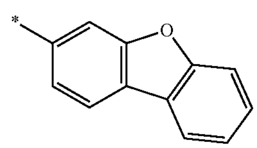
6-22
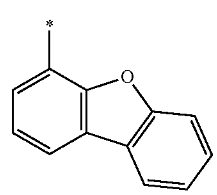

-continued
6-23
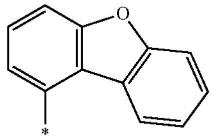
6-24
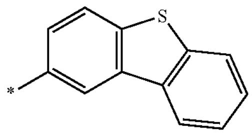
6-25
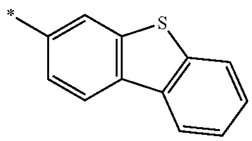
6-26
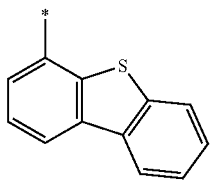
6-27
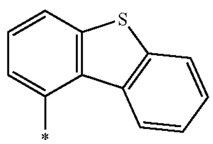
6-28
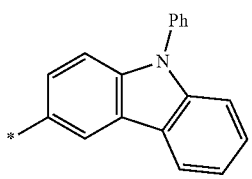
6-29
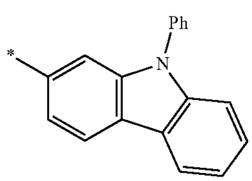
6-30
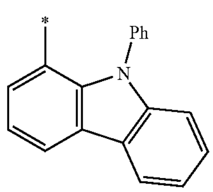
6-31
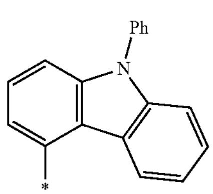
-continued
6-32
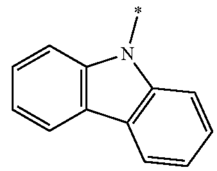
6-33
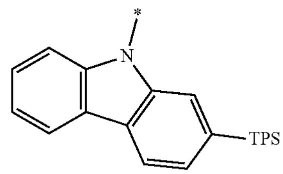
6-34
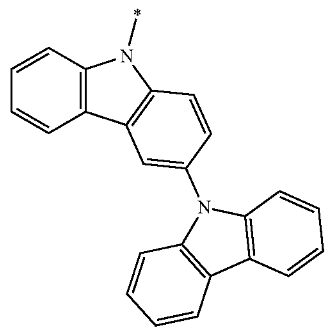
6-35
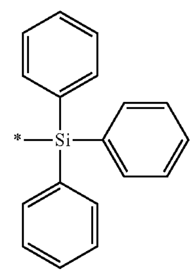
6-36
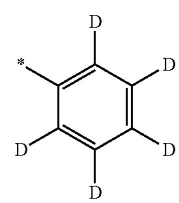
6-37
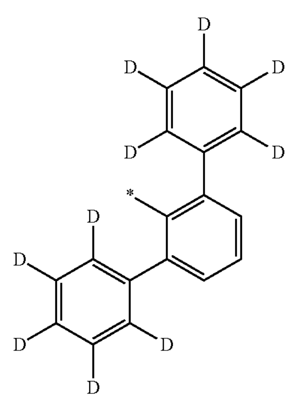

-continued 6-38

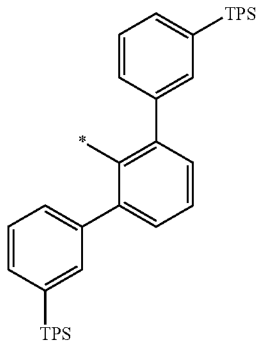

6-39

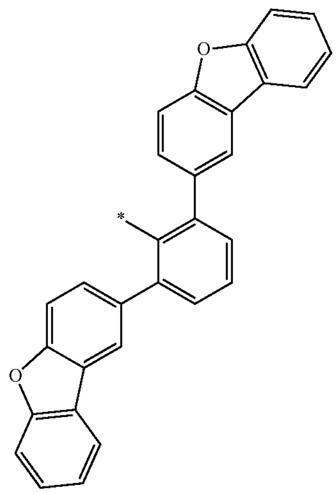

6-40

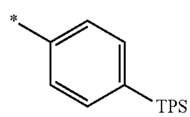

6-41

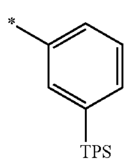

6-42

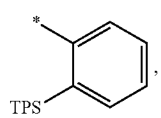

wherein, in Formulae 6-1 to 6-42,

"t-Bu" represents a tert-butyl group,

"Ph" represents a phenyl group,

"TMS" represents a trimethylsilyl group,

"TPS" represents a triphenylsilyl group, and

* indicates a binding site to an adjacent atom.

In an embodiment, in Formula 2, $L_{21}$ to $L_{23}$ may be a single bond or a group represented by one of Formulae 3-1 to 3-3 and 3-24, and $Ar_{21}$ to $Ar_{23}$ may each be a group represented by one of Formulae 6-1, 6-14, 6-15, 6-18, or 6-36:

3-1

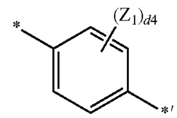

3-2

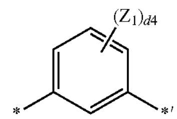

3-3

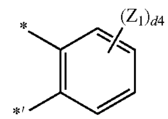

3-24

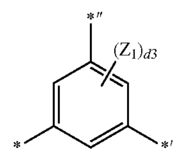

6-1

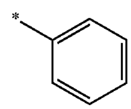

6-14

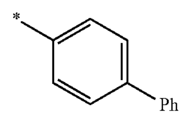

6-15

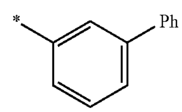

6-18

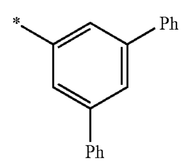

6-36

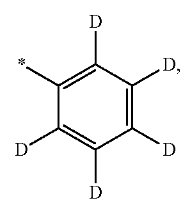

wherein, in Formulae 3-1 to 3-3, 3-24, 6-1, 6-14, 6-15, 6-18, and 6-36, $Z_1$, d3, and d4 may respectively be understood by referring to the descriptions of $Z_1$, d3, and d4 provided herein, $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group, "Ph" represents a phenyl group, and

*, *', and *" each indicate a binding site to an adjacent atom.

In one or more embodiments, in Formula 2, the groups represented by $*\text{-}(L_{21})_{a21}\text{-}(Ar_{21})_{b21}$, $*\text{-}(L_{22})_{a22}\text{-}(Ar_{22})_{b22}$, and $*\text{-}(L_{23})_{a23}\text{-}(Ar_{23})_{b23}$ may each independently be a group represented by one of Formulae 2A-1 to 2A-7:

2A-1

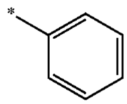

2A-2

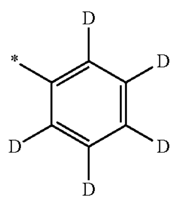

2A-3

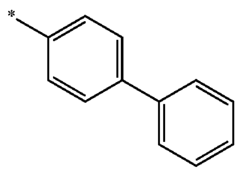

2A-4

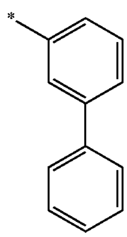

2A-5

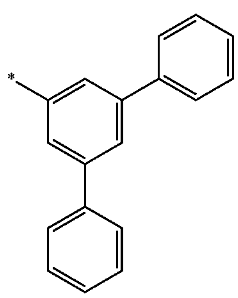

2A-6

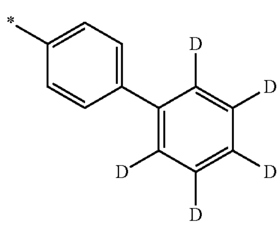

2A-7

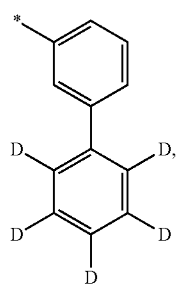

wherein, in Formulae 2A-1 to 2A-7,

*indicates a binding site to an adjacent atom.

In Formulae 1, 2, and 3A to 3C, $R_1$ to $R_5$ and $R_{31}$ to $R_{38}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), wherein $Q_1$ to $Q_3$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, c1, c2, and c33 may each independently be an integer from 1 to 3, and c3, c31, c32, and c34 may each independently be an integer from 1 to 4.

In an embodiment, the condensed cyclic compound represented by Formula 1 may satisfy one of the following criteria:

(i) at least one of $R_1$ to $R_5$ in Formula 1 may be deuterium, (ii) at least one of $Ar_{21}$ to $Ar_{23}$ in Formula 2 may be substituted with deuterium, (iii) when $G_2$ is a group represented by Formula 3A, at least one of $R_{31}$ and $R_{32}$ may be deuterium, or at least one of $R_{31}$ and $R_{32}$ may be substituted with deuterium, (iv) when $G_2$ is a group represented by Formula 3B, at least one of $R_{33}$ and $R_{34}$ may be deuterium, or at least one of $R_{33}$ to $R_{35}$ may be substituted with deuterium, (v) when $G_2$ is a group represented by Formula 3C, at least one of $Ar_{31}$ and $Ar_{32}$ may be substituted with deuterium, or (vi) any combination of (i), (ii), and one (e.g., only one) of (iii) to (v).

In an embodiment, in Formula 1, $R_1$ to $R_5$ may each be hydrogen.

In some embodiments, $R_{31}$ to $R_{38}$ in Formulae 3A to 3C may each independently be: hydrogen, deuterium, a cyano group, a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or —Si($Q_1$)($Q_2$)($Q_3$); or a phenyl group, a biphenyl group, a terphenyl group, a naphthyl group, a fluorenyl group, a dibenzofuranyl group, a dibenzothiophenyl group, a carbazolyl group, or a dibenzosilolyl group, each unsubstituted or substituted with deuterium, a cyano group, a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a dibenzofuranyl group, a dibenzothiophenyl group, a carbazolyl group, a dibenzosilolyl group, —Si($Q_{31}$)($Q_{32}$)($Q_{33}$), or any combination thereof, wherein $Q_1$ to $Q_3$ and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In some embodiments, $R_{31}$ to $R_{38}$ may each independently be hydrogen, deuterium, a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, —Si($Q_1$)($Q_2$)($Q_3$), or a group represented by one of 6-1 to 6-42:

6-1

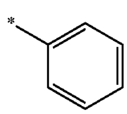

6-2

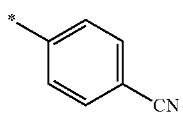

6-3

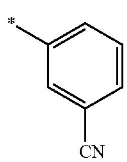

6-4

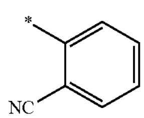

6-5

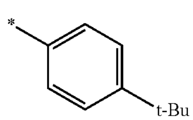

6-6

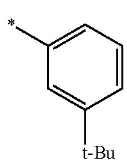

-continued 6-7

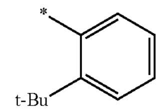

6-8

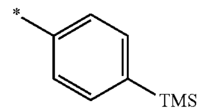

6-9

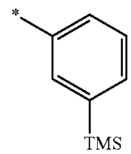

6-10

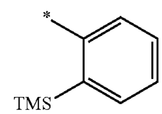

6-11

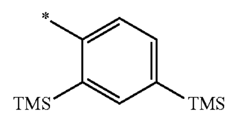

6-12

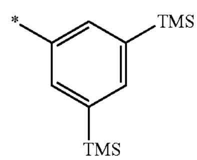

6-13

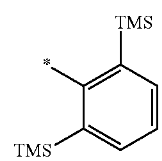

6-14

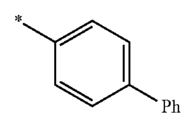

6-15

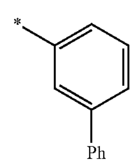

6-16

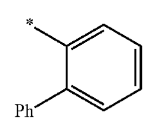

6-17

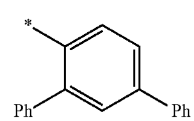

-continued
6-18
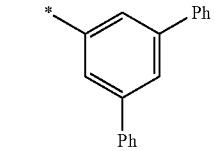
6-19
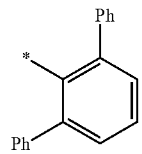
6-20
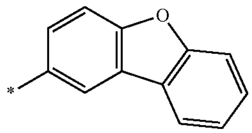
6-21
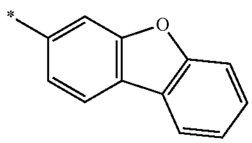
6-22
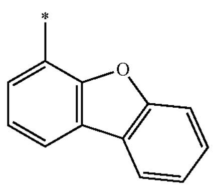
6-23
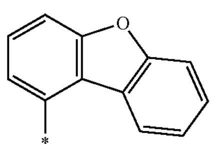
6-24
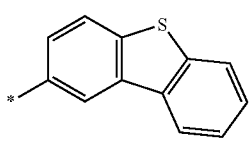
6-25
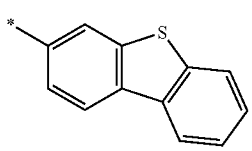
6-26
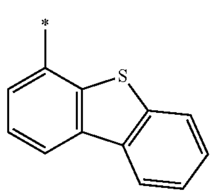
6-27
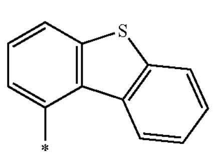
-continued
6-28
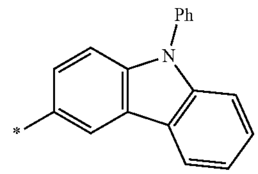
6-29
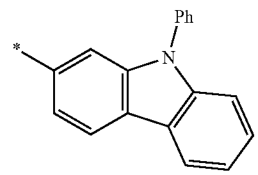
6-30
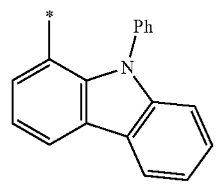
6-31
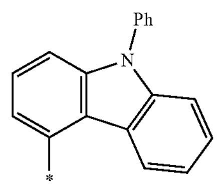
6-32
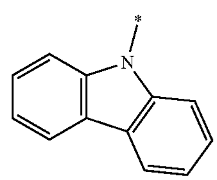
6-33
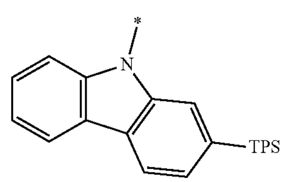
6-34
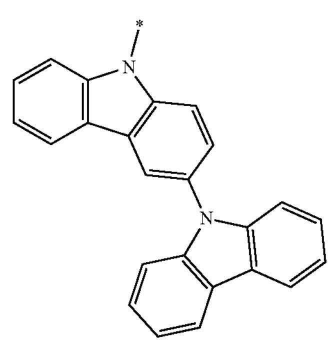

-continued 6-35

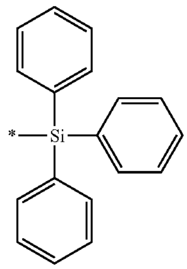

6-36

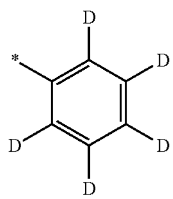

6-37

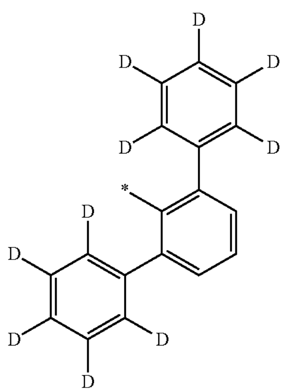

6-38

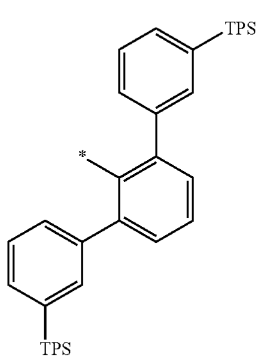

-continued 6-39

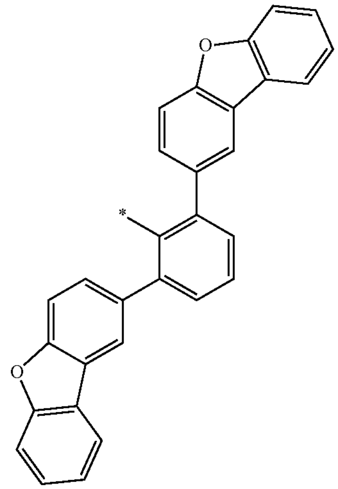

6-40

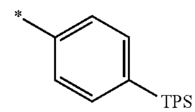

6-41

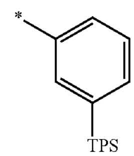

6-42

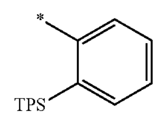

wherein, in Formulae 6-1 to 6-42,
"t-Bu" represents a tert-butyl group,
"Ph" represents a phenyl group, and
"TMS" represents a trimethylsilyl group,
"TPS" represents a triphenylsilyl group, and
* indicates a binding site to an adjacent atom.

In an embodiment, $G_1$ in Formula 1 may be a group represented by Formula 2(1):

Formula 2(1)

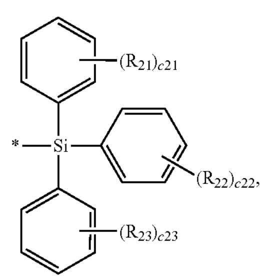

wherein, in Formula 2(1),
$R_{21}$ and $R_{23}$ may each independently be the same as $R_{10a}$,
c21 to c23 may each independently be an integer from 0 to 5, and
* indicates a binding site to an adjacent atom.

In some embodiments, in Formula 2(1), $R_{21}$ to $R_{23}$ may each independently be:

deuterium, —F, —Cl, —Br, —I, a hydroxyl group, a cyano group, a nitro group, an amidino group, a hydrazino group, a hydrazono group, a $C_1$-$C_{20}$ alkyl group, or a $C_r$ $C_{20}$ alkoxy group;

a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a pyridinyl group, a pyrazinyl group, a pyrimidinyl group, a pyridazinyl group, a triazinyl group, a dibenzofuranyl group, a dibenzothiophenyl group, a carbazolyl group, a dibenzosilolyl group, a quinolinyl group, an isoquinolinyl group, or a benzimidazolyl group, each unsubstituted or substituted with at least one deuterium; or —$Si(Q_{31})(Q_{32})(Q_{33})$, —$N(Q_{31})(Q_{32})$, or —$B(Q_{31})(Q_{32})$.

In an embodiment, in Formula 1, $G_2$ may be a group represented by one of

3C(1)

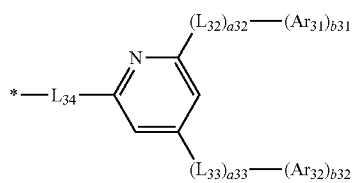

3C(2)

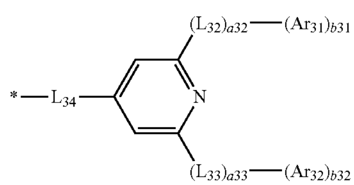

3C(3)

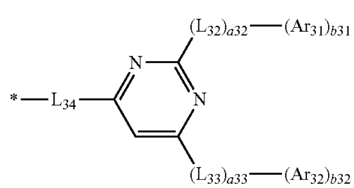

3C(4)

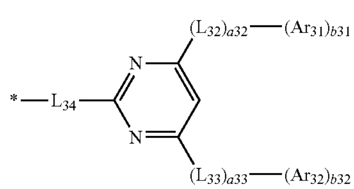

-continued

3C(5)

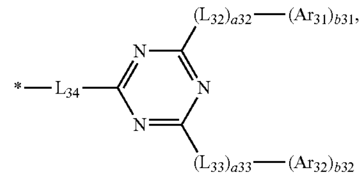

wherein, in Formulae 3C(1) to 3C(5), $L_{34}$ may be a group represented by Formula 3-2 or Formula 3-3, $L_{32}$, $L_{33}$, a32, a33, $Ar_{31}$, $Ar_{32}$, b31, and b32 may respectively be understood by referring to the descriptions of $L_{32}$, $L_{33}$, a32, a33, $Ar_{31}$, $Ar_{32}$, b31, and b32 in Formula 3C, and

* indicates a binding site to an adjacent atom.

In some embodiments, in Formulae 3C(1) to 3C(5), $L_{32}$ and $L_{33}$ may each independently be a single bond or a group represented by one of Formulae 3-1 to 3-3, a32 and a33 may each be 1, $Ar_{31}$ and $Ar_{32}$ may each independently be a group represented by one of Formulae 6-1 to 6-42, and b31 and b32 may each be 1.

$R_{10a}$ may be: deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group; or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

For example, the condensed cyclic compound represented by Formula 1 may be one selected from Compounds A-1 to A-240 and C-1 to C-136, but embodiments are not limited thereto:

A-1
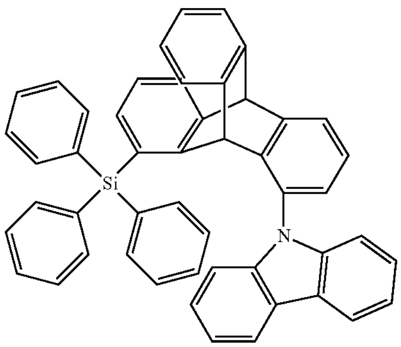
A-2
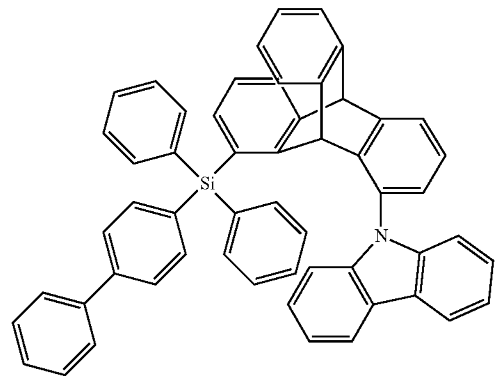
A-3
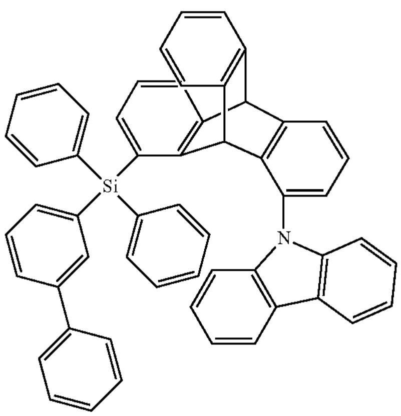
A-4
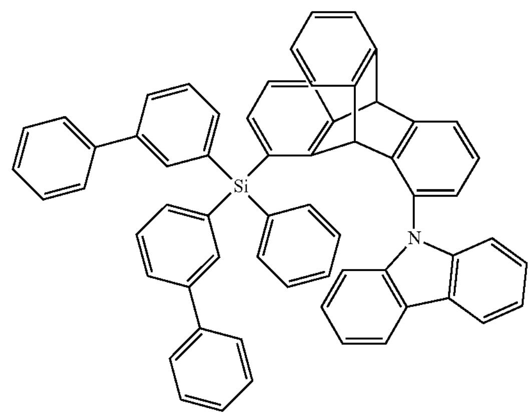
A-5
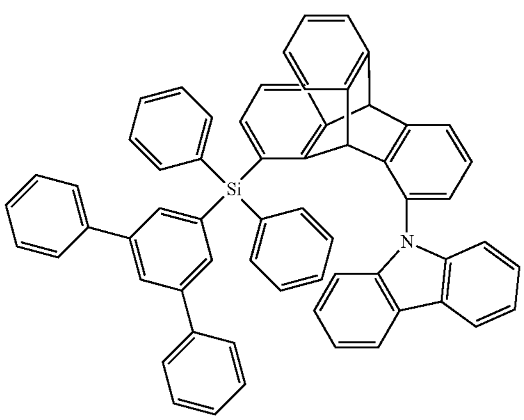
A-6
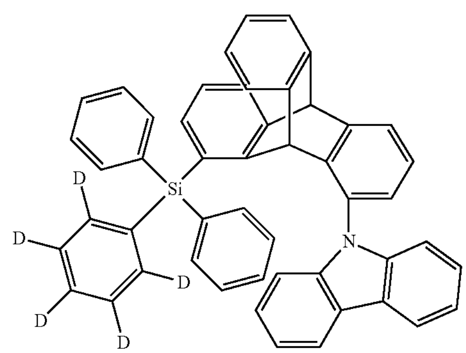

-continued
A-7
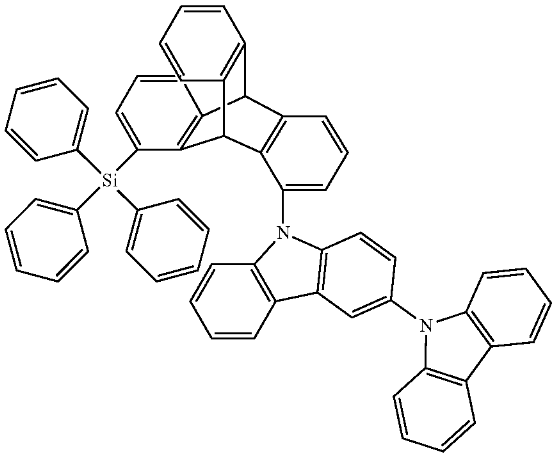
A-8
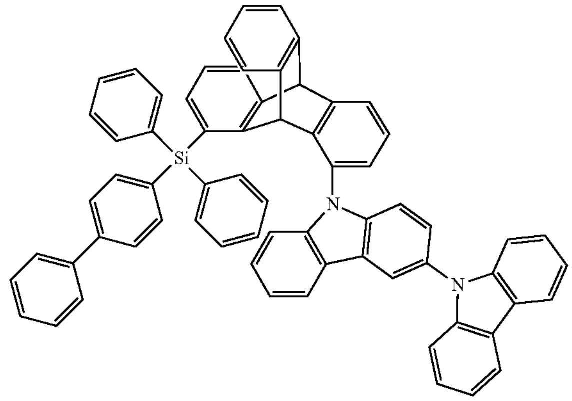
A-9
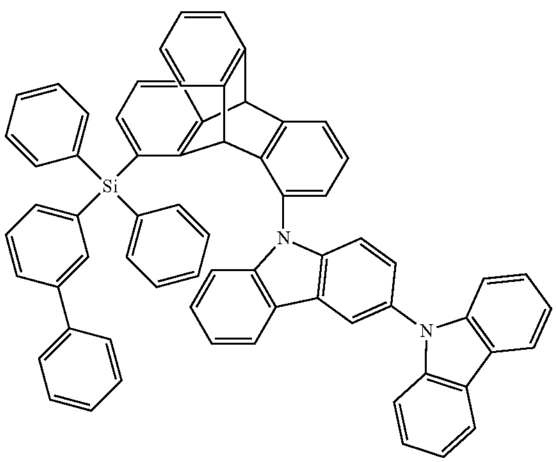
A-10
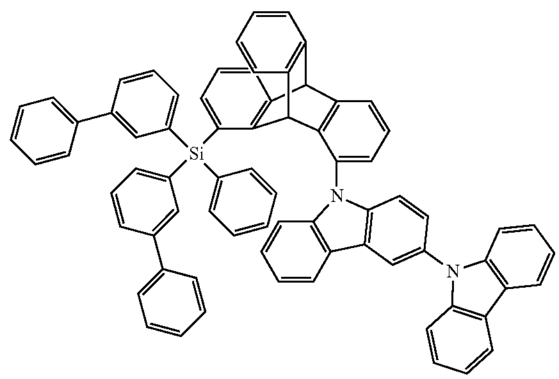
A-11
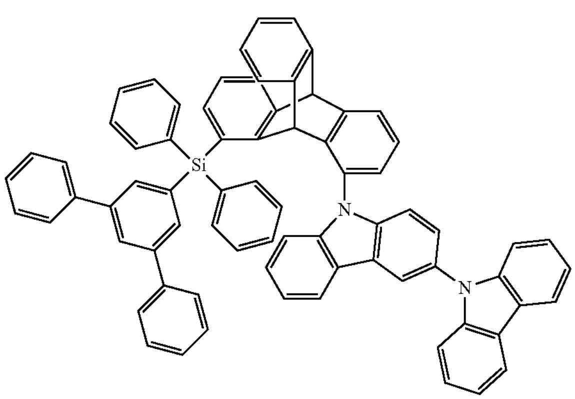
A-12
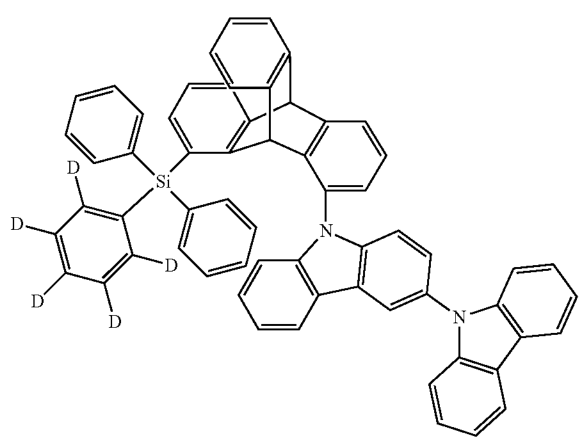

-continued
A-13
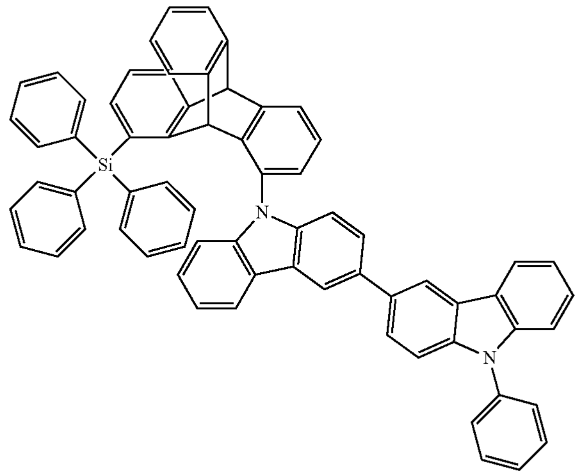
A-14
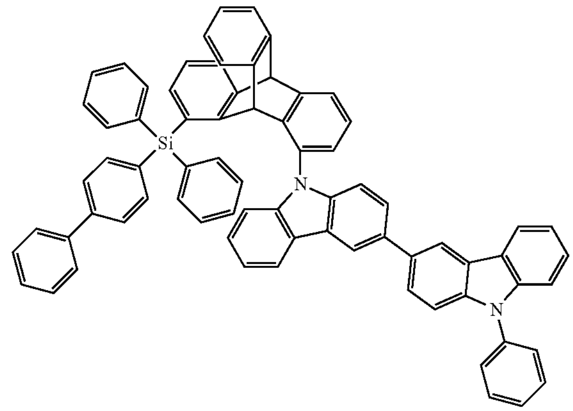
A-15
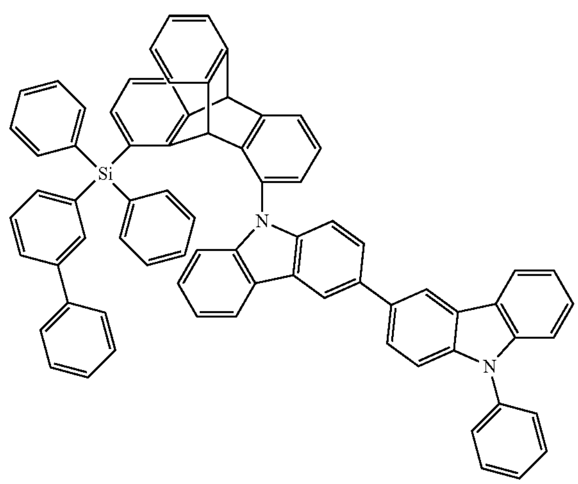
A-16
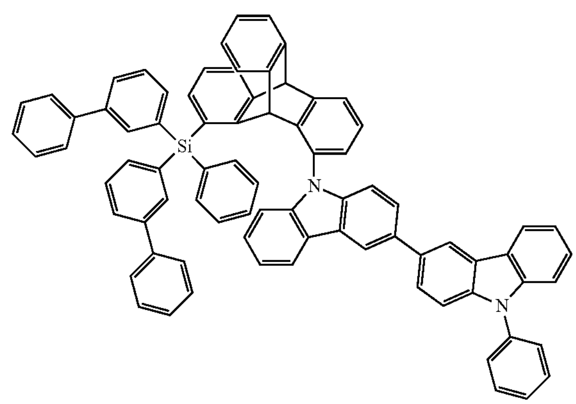
A-17
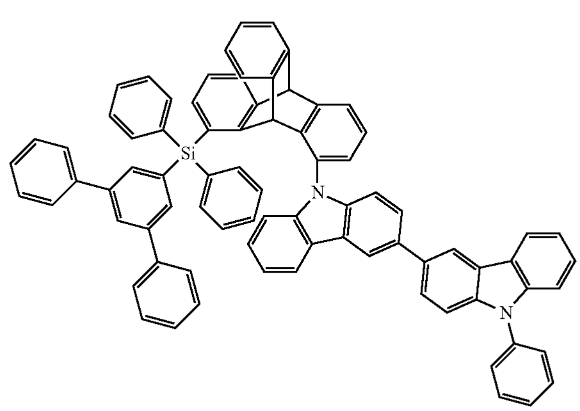
A-18
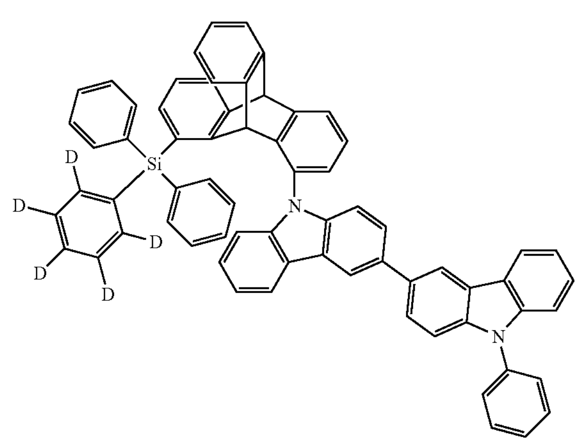

-continued
A-19
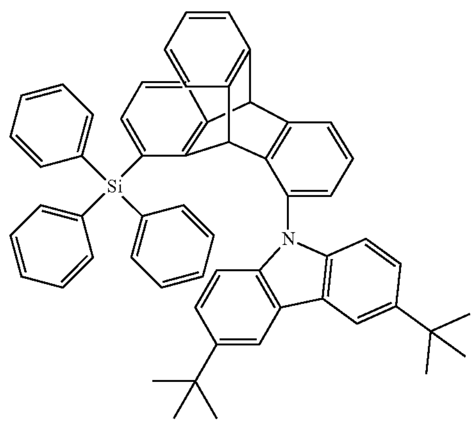
A-20
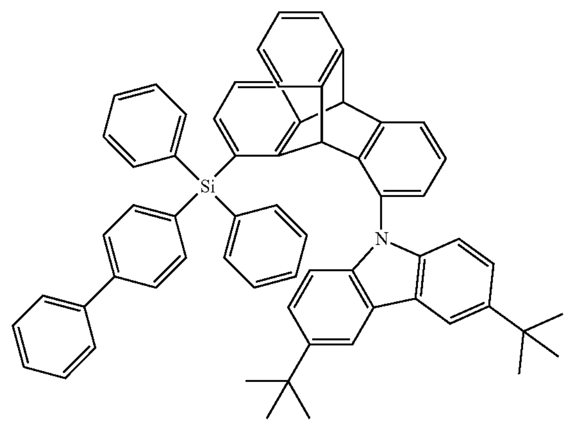
A-21
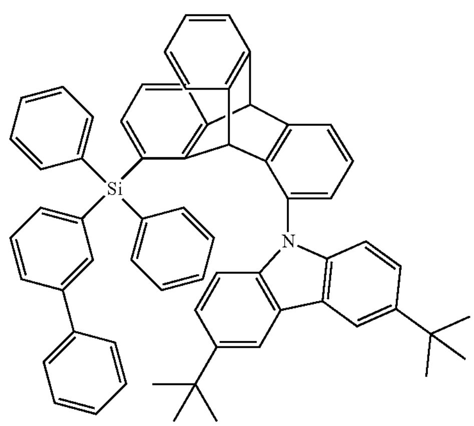
A-22
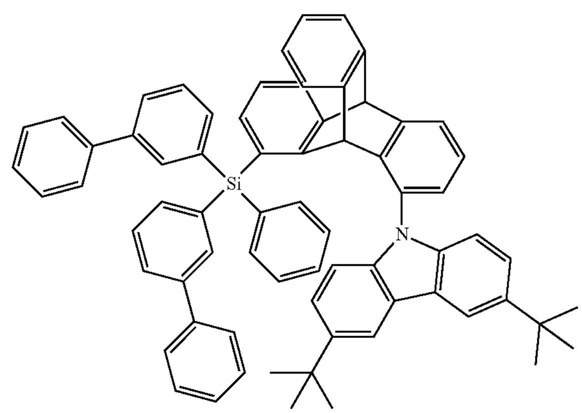
A-23
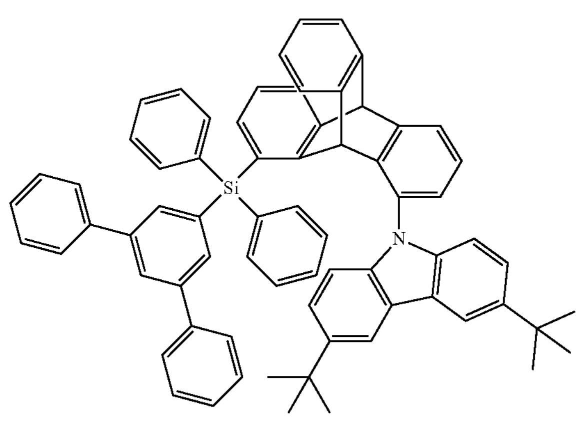
A-24
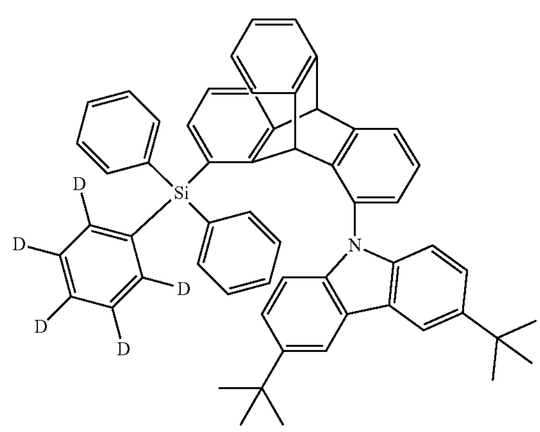

-continued
A-25
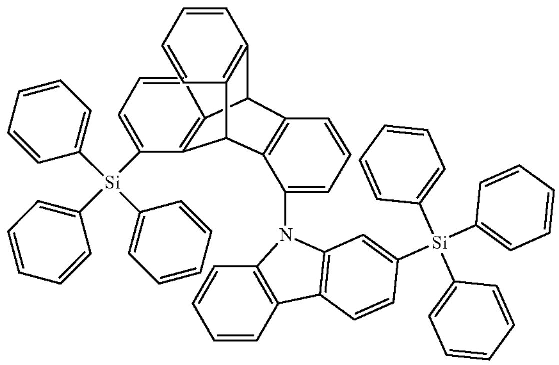
A-26
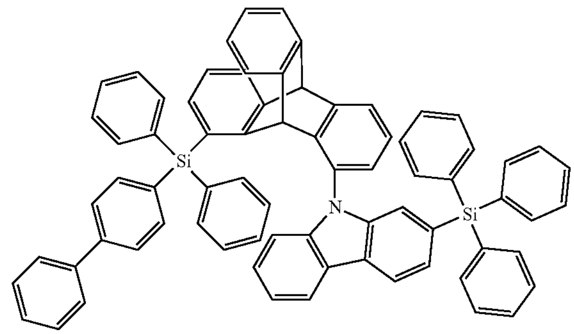
A-27
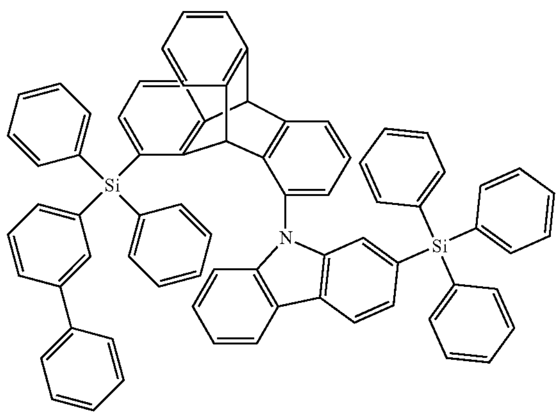
A-28
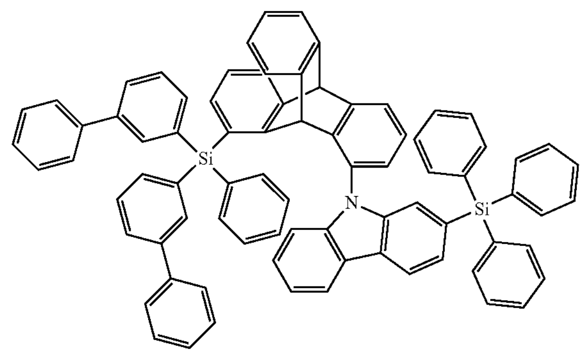
A-29
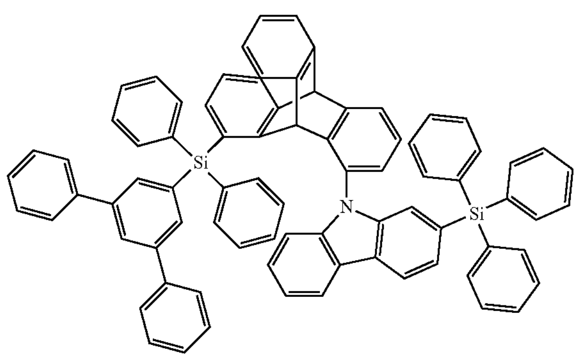
A-30
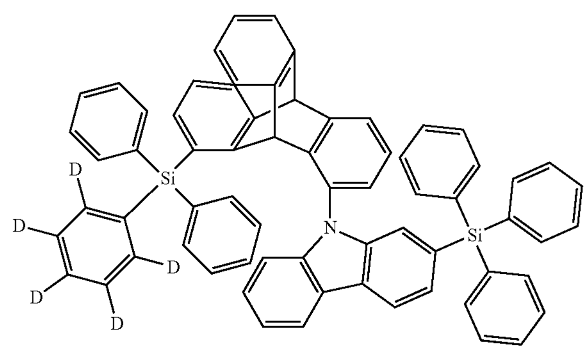
A-31
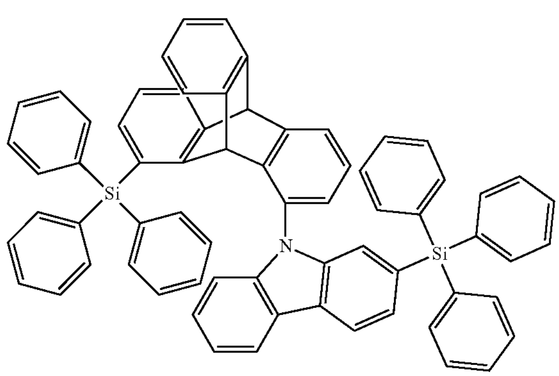
A-32
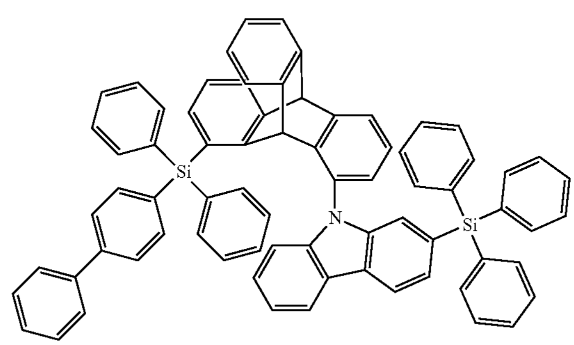

-continued
A-33
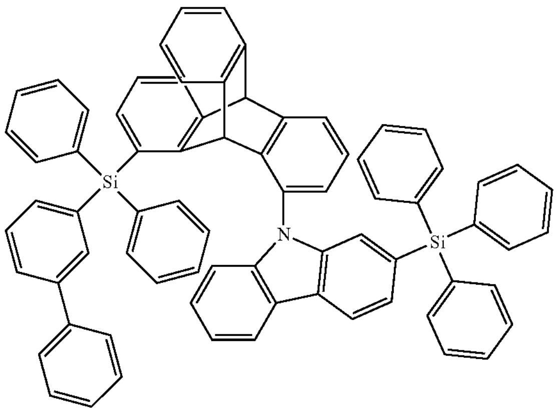
A-34
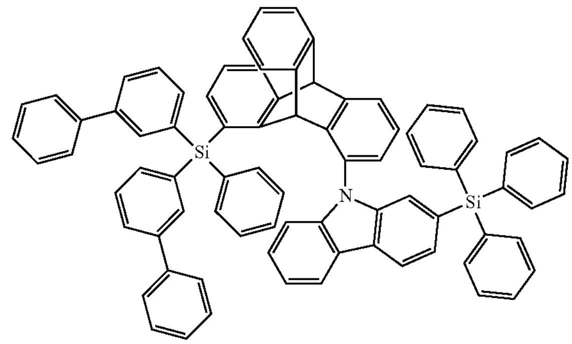
A-35
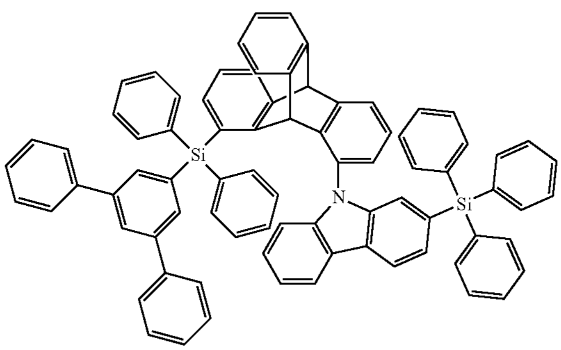
A-36
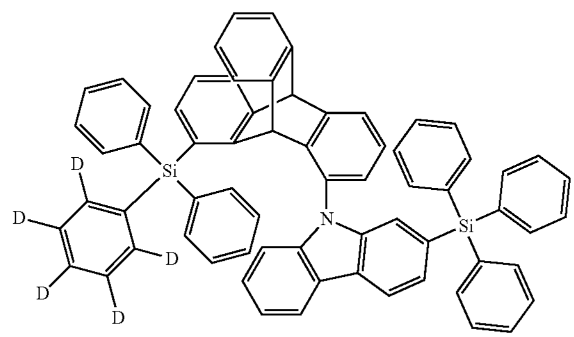
A-37
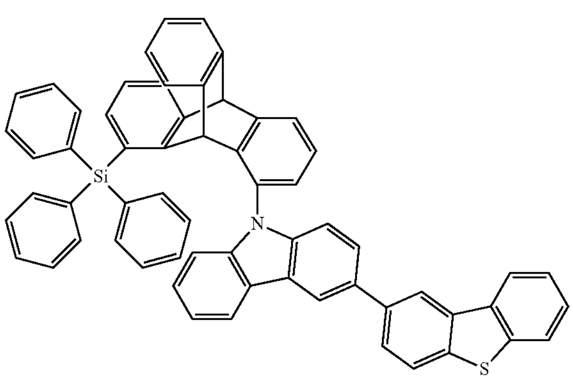
A-38
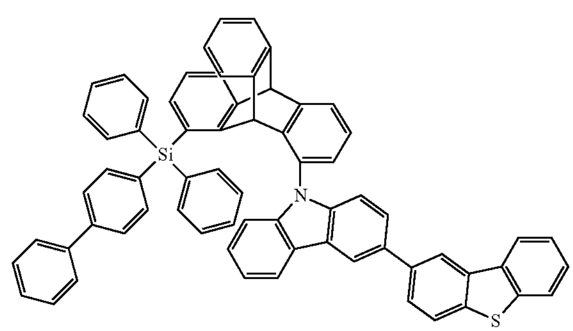
A-39
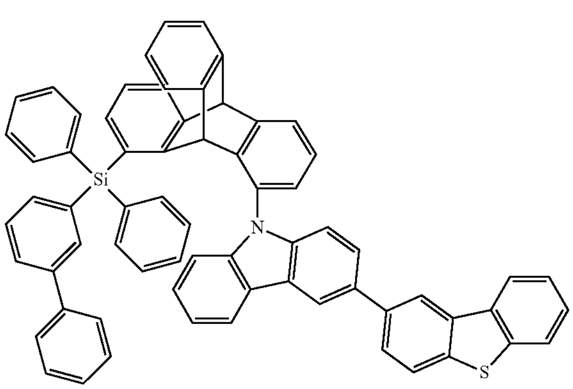
A-40
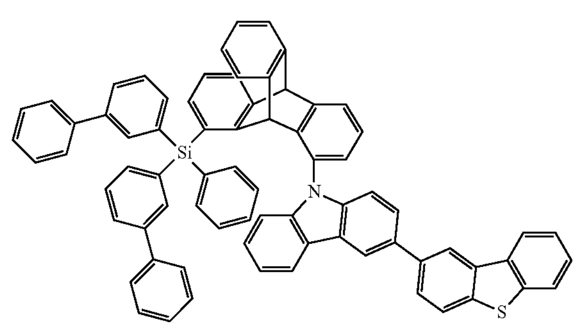

-continued
A-41
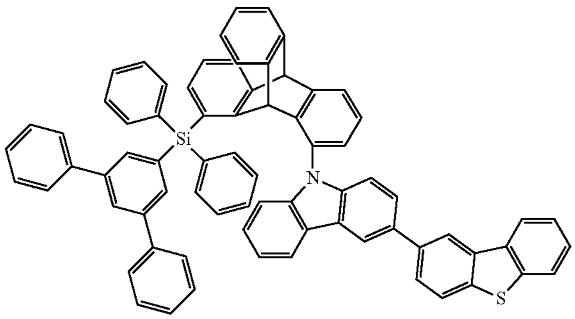
A-42
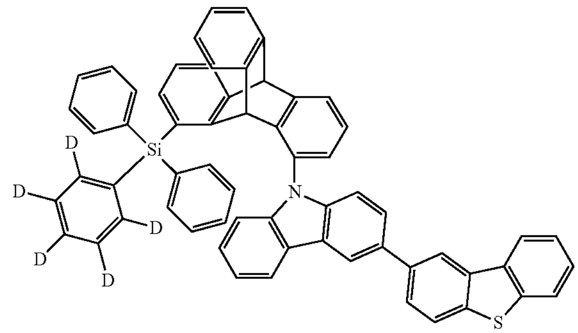
A-43
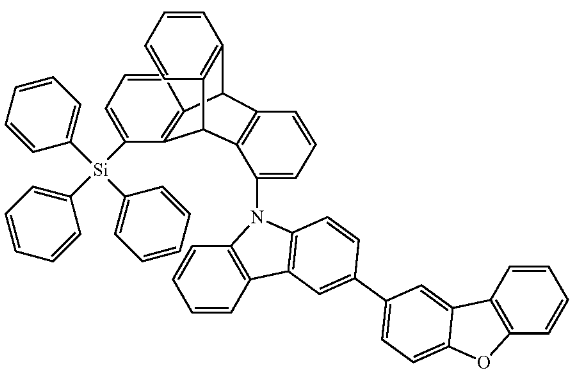
A-44
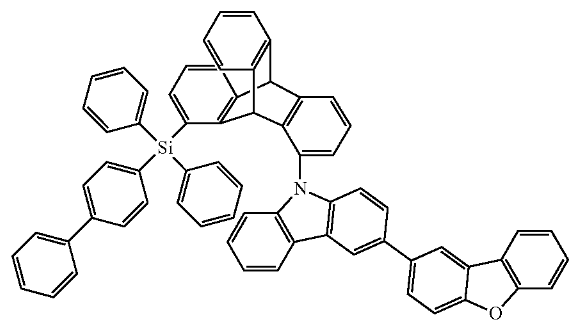
A-45
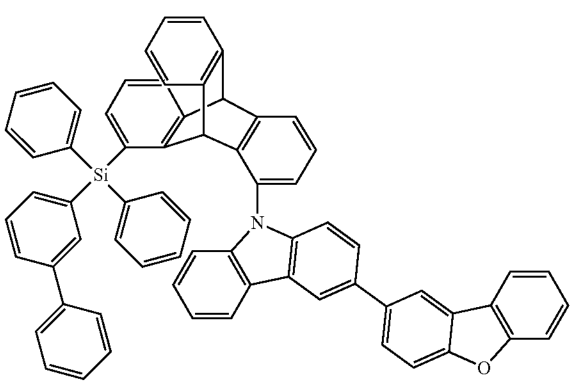
A-46
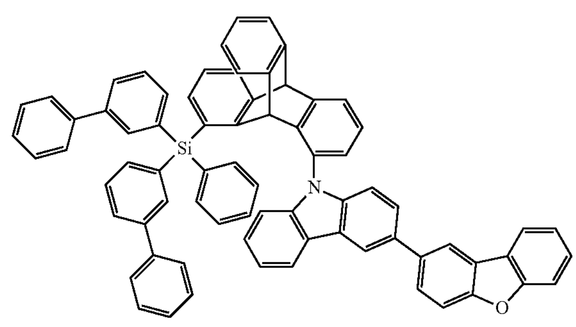
A-47
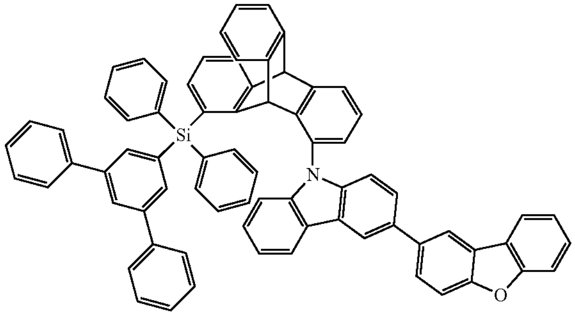
A-48
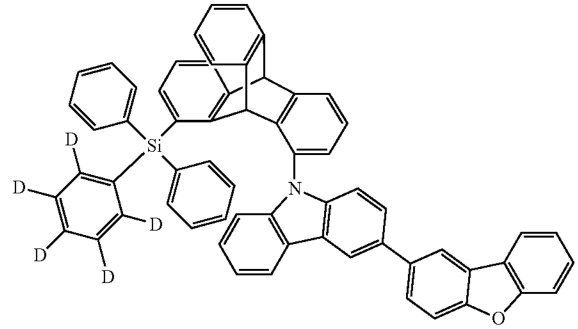

-continued
A-49
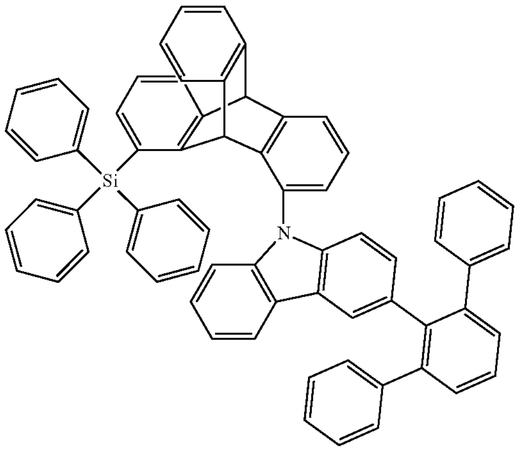
A-50
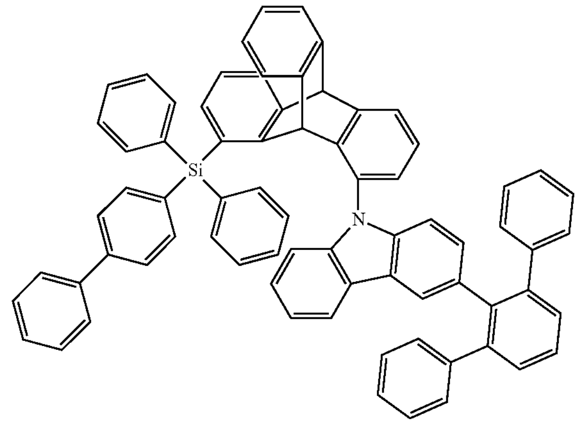
A-51
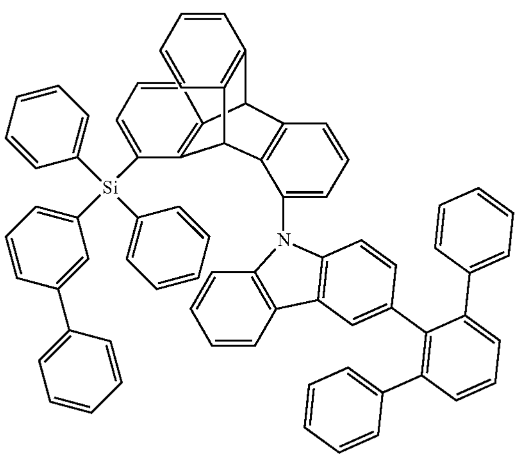
A-52
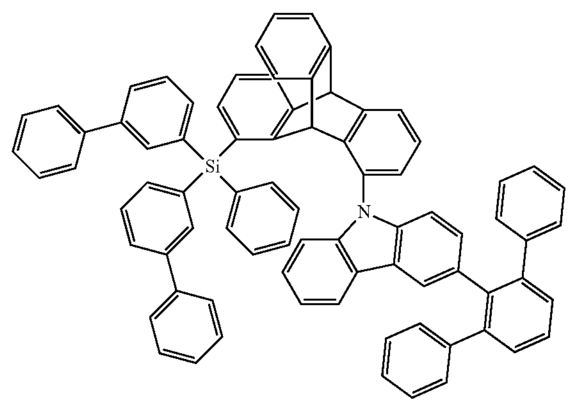
A-53
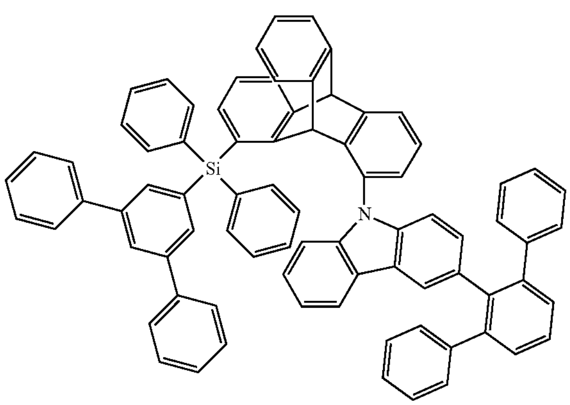
A-54
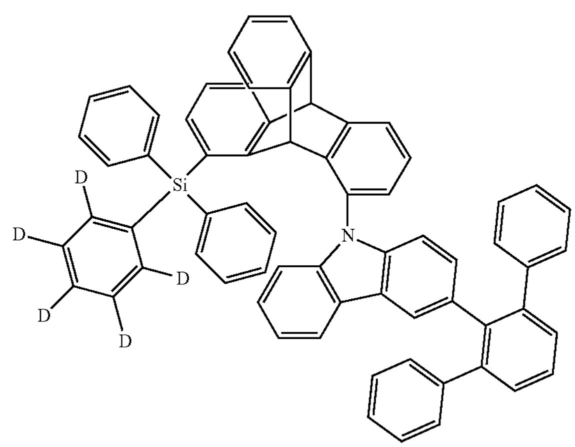

-continued
A-55
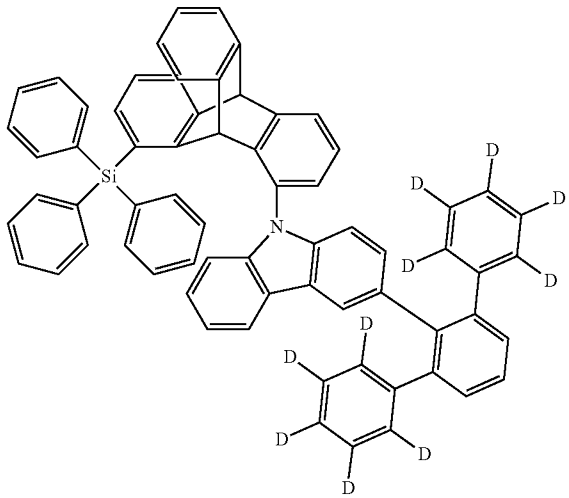
A-56
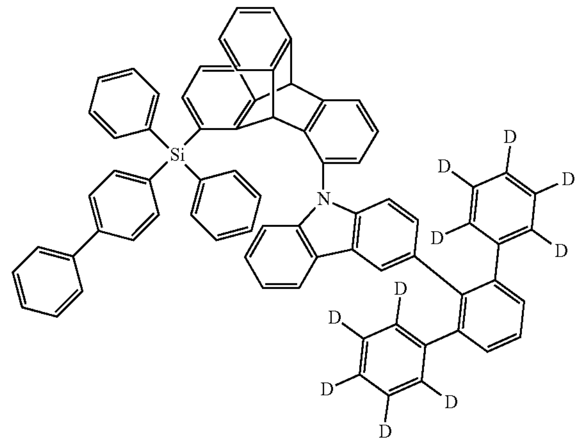
A-57
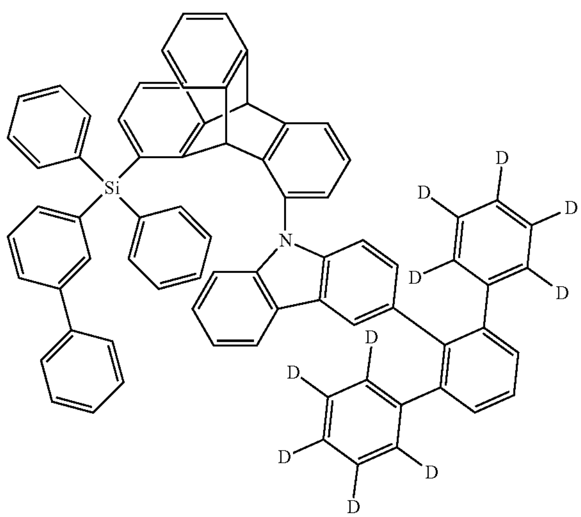
A-58
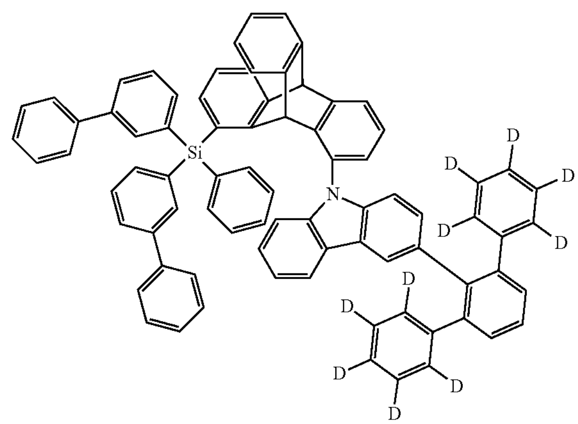
A-59
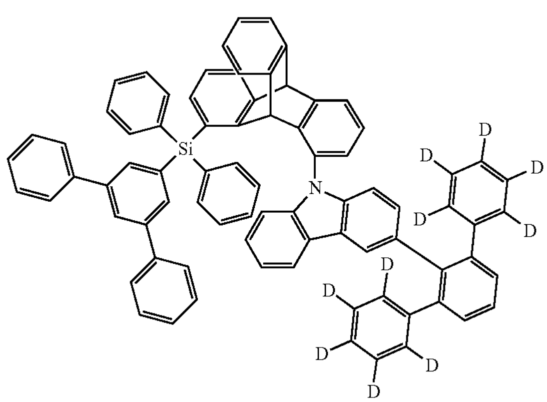
A-60
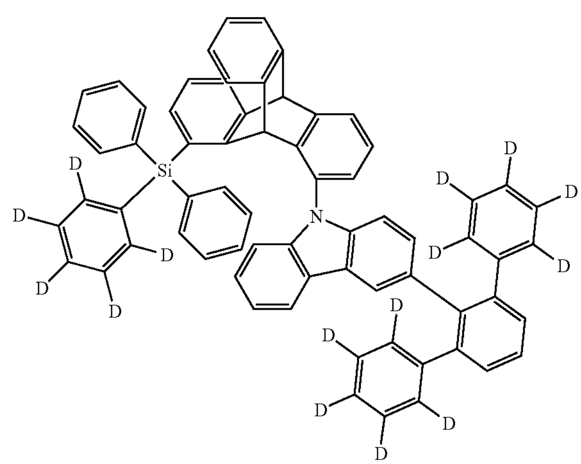

-continued
A-61
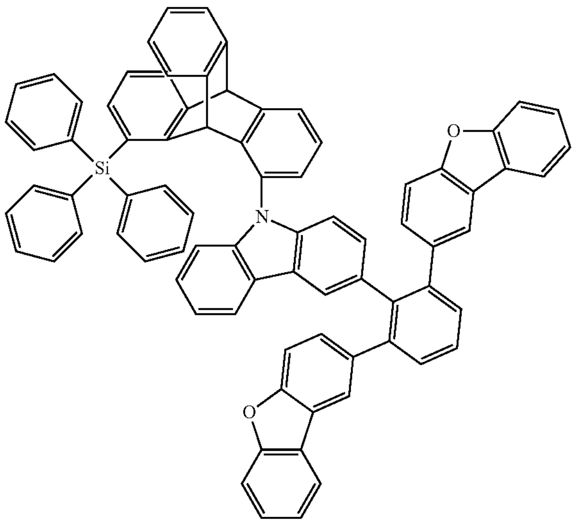
A-62
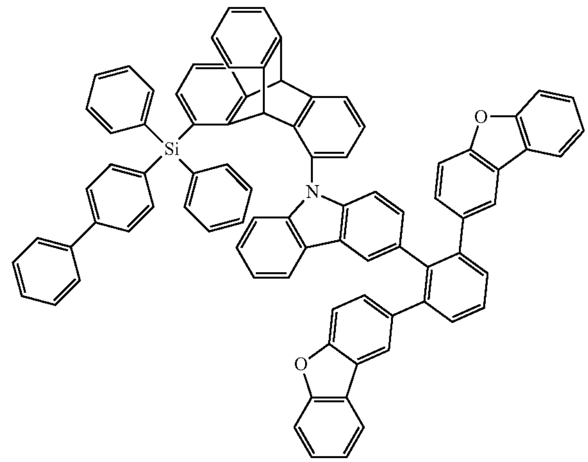
A-63
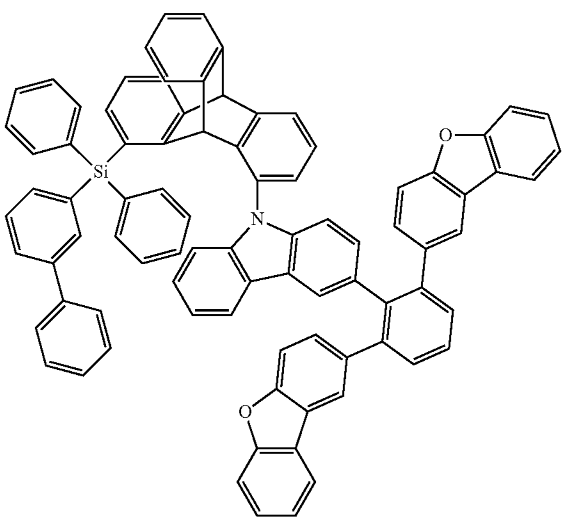
A-64
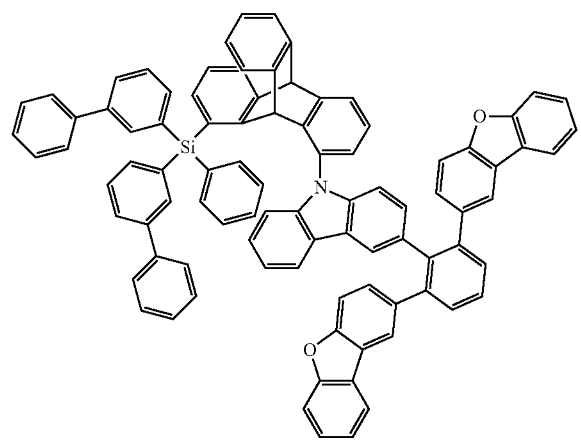
A-65
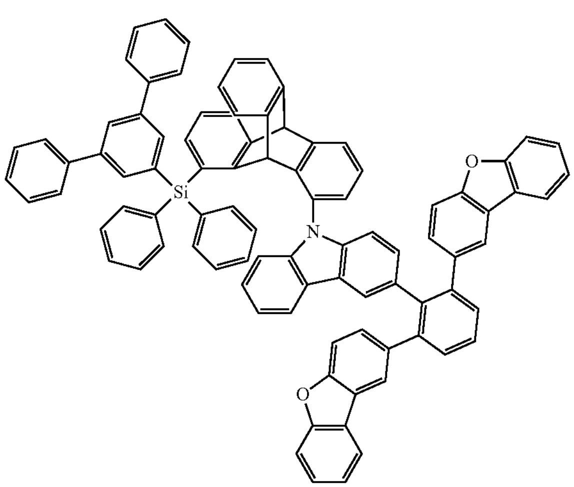
A-66
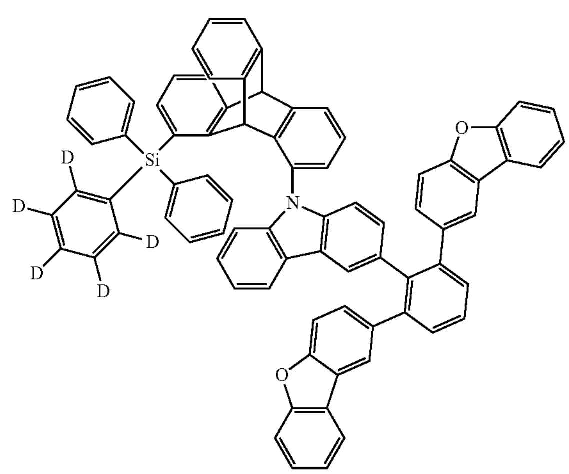

-continued
A-67
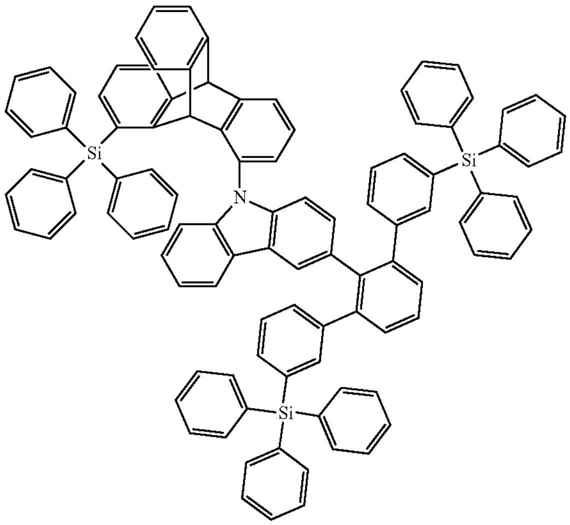
A-68
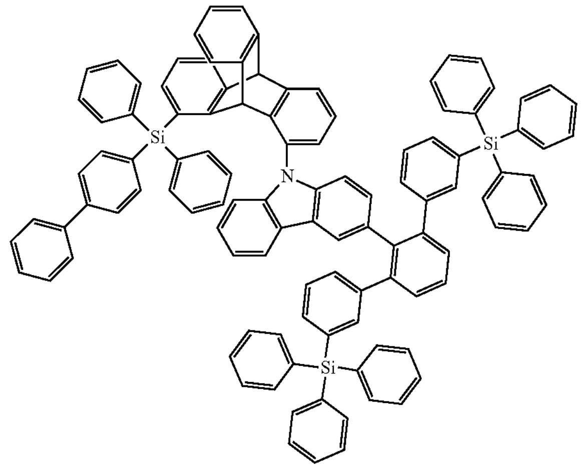
A-69
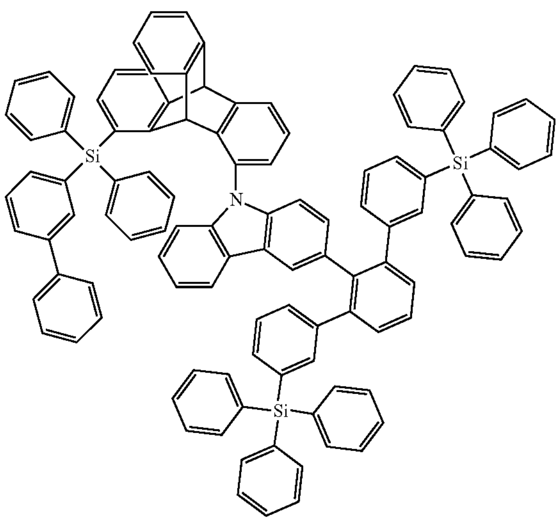
A-70
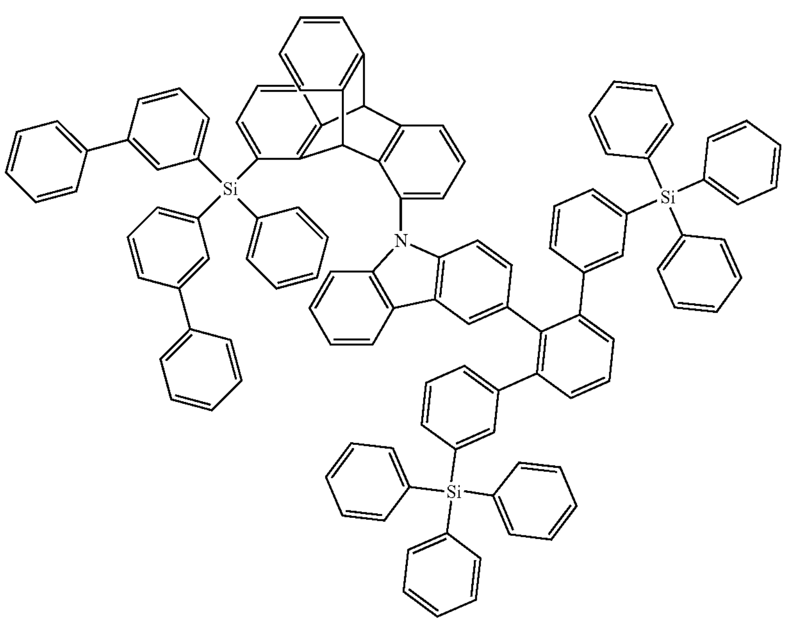

-continued
A-71
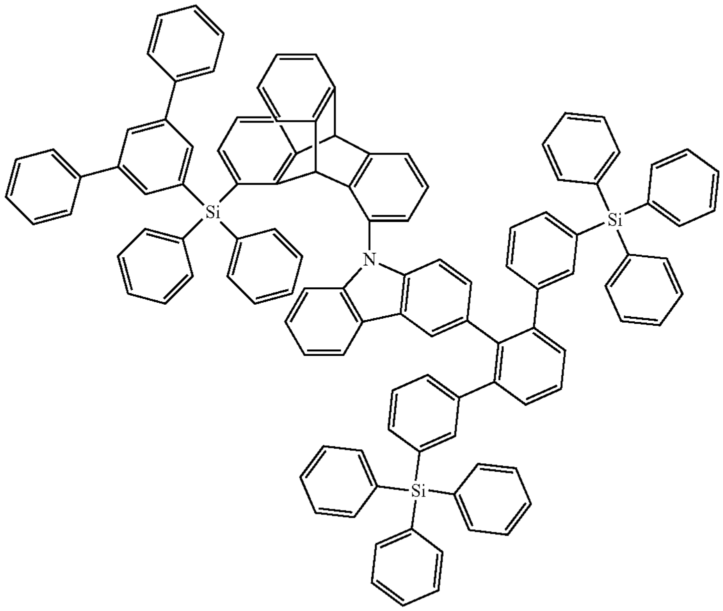
A-72
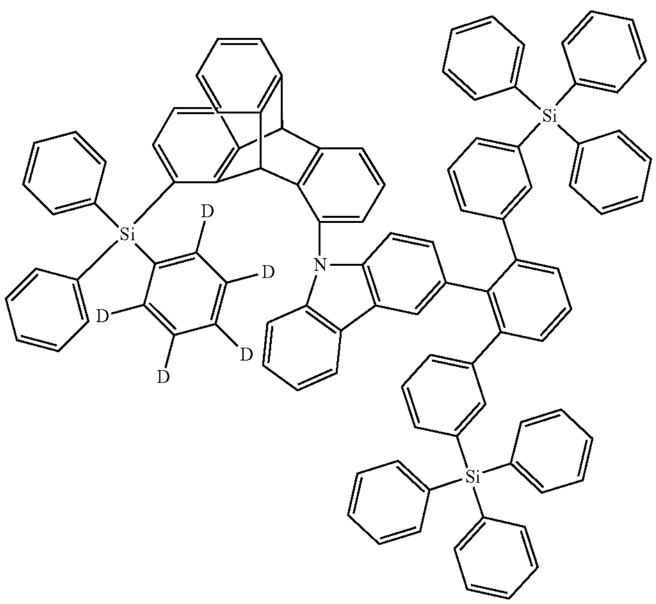

A-25
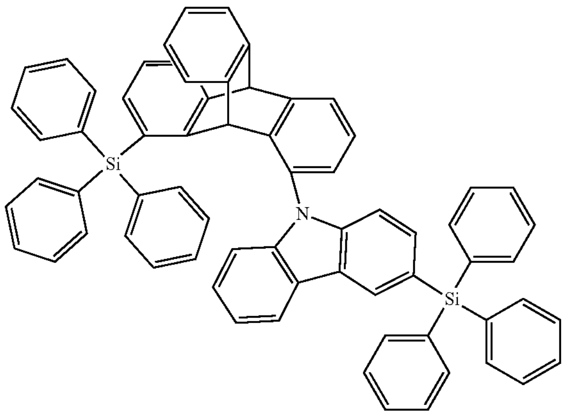
A-26
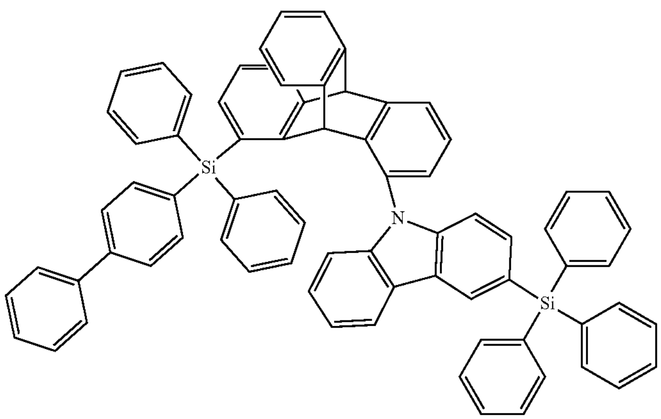
A-27
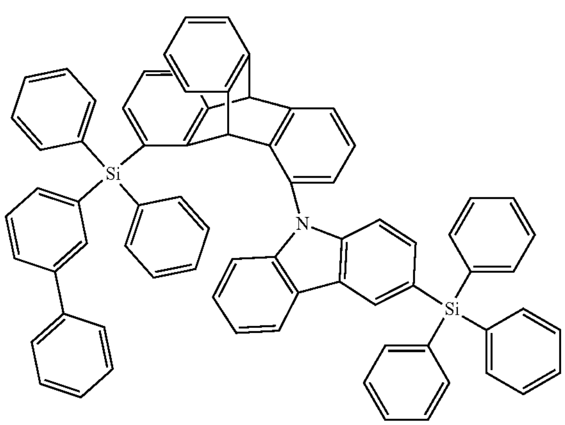

-continued
A-28
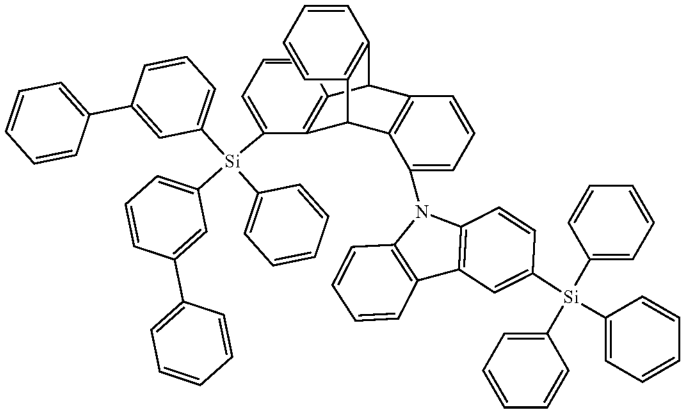
A-29
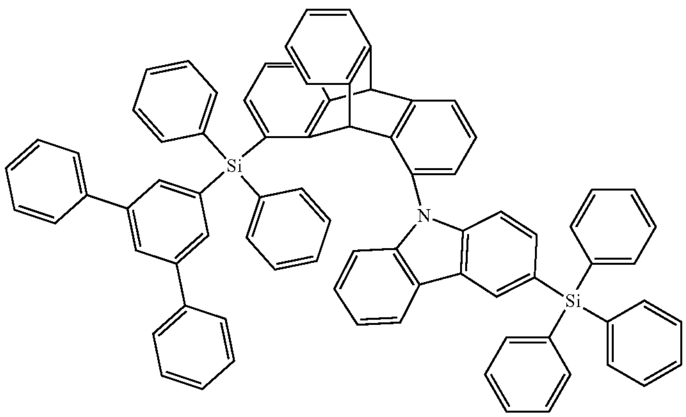
A-30
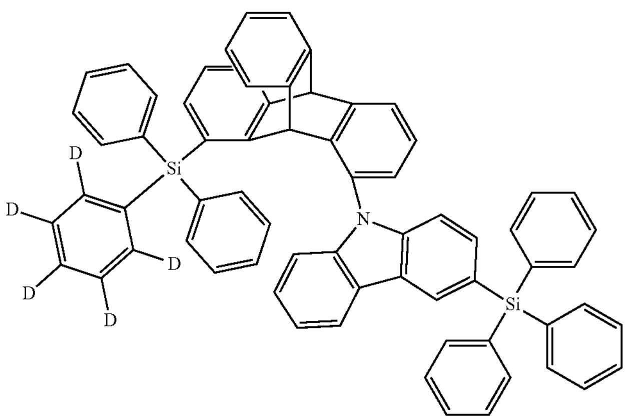
A-31
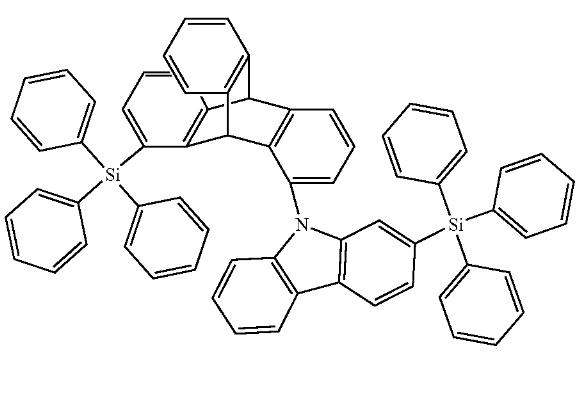

-continued
A-32
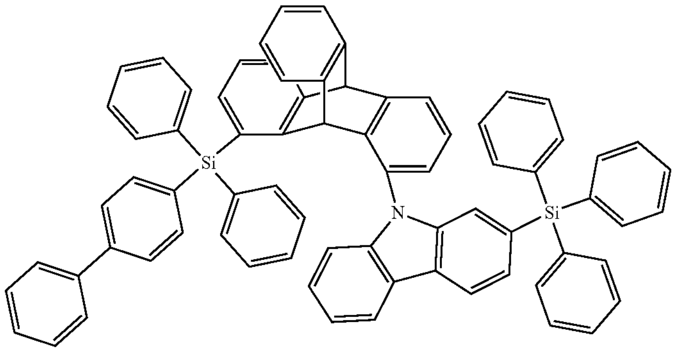
A-33
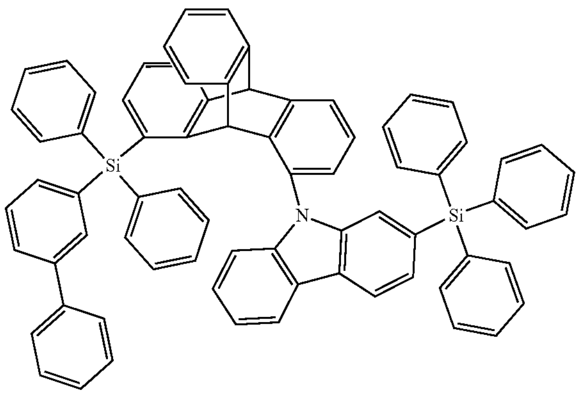
A-34
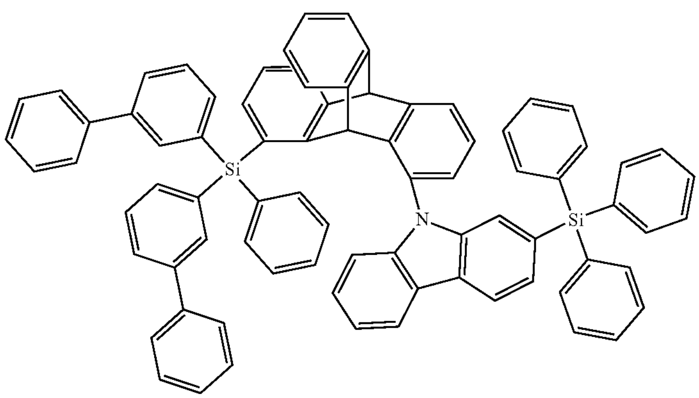
A-35
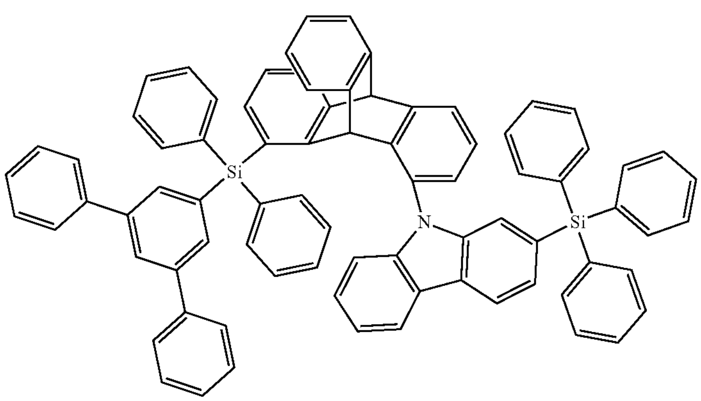

-continued
A-36
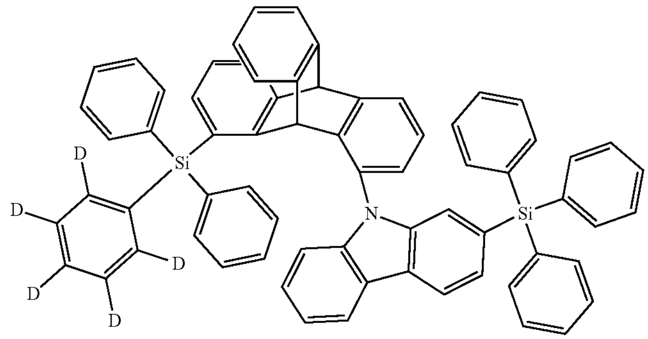
A-37
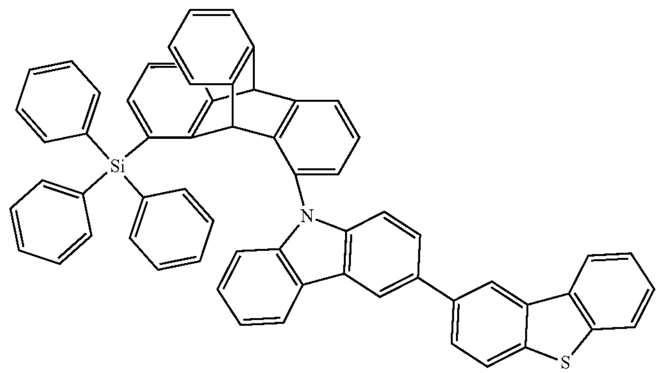
A-38
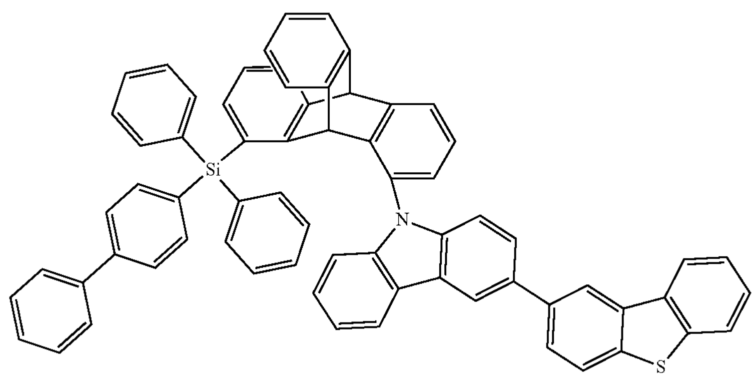
A-39
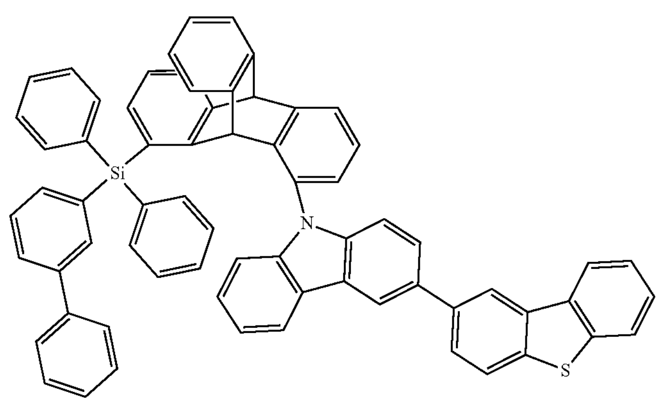

-continued
A-40
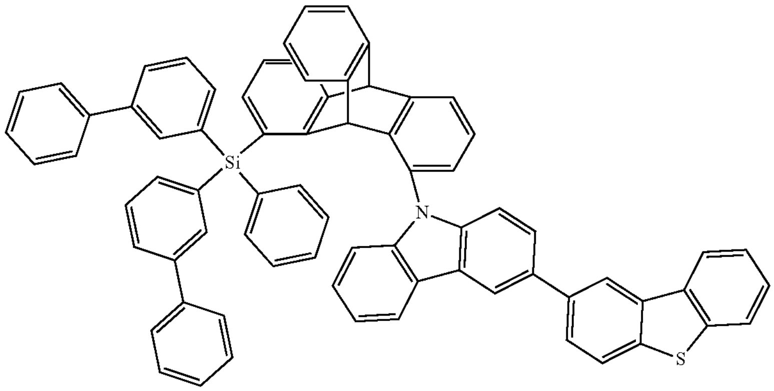
A-41
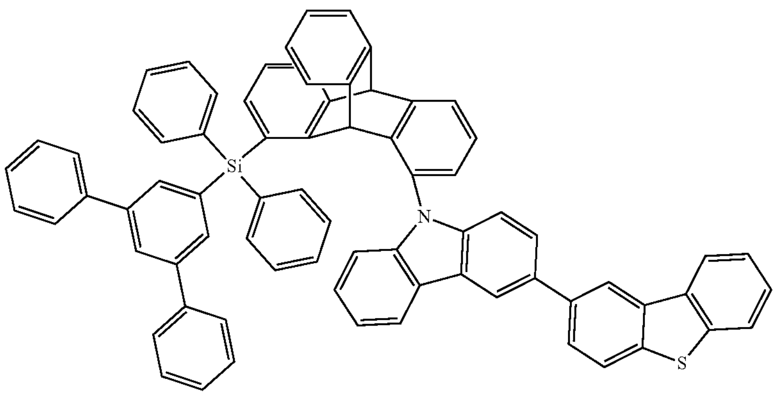
A-42
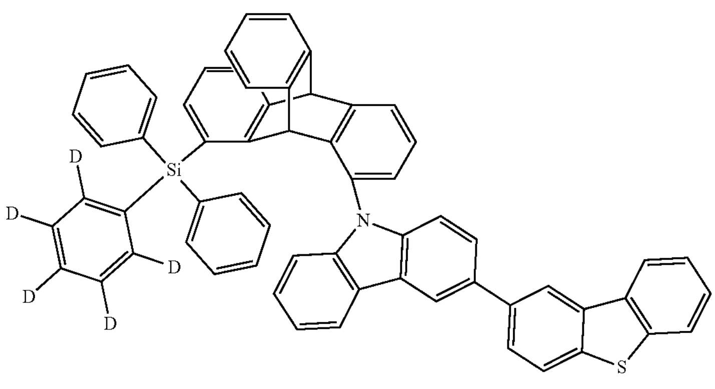
A-43
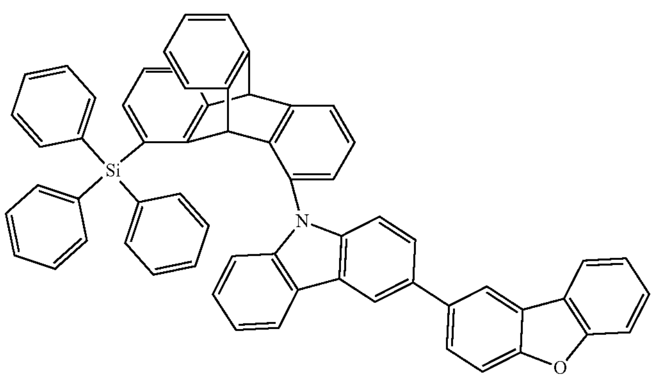

-continued
A-44
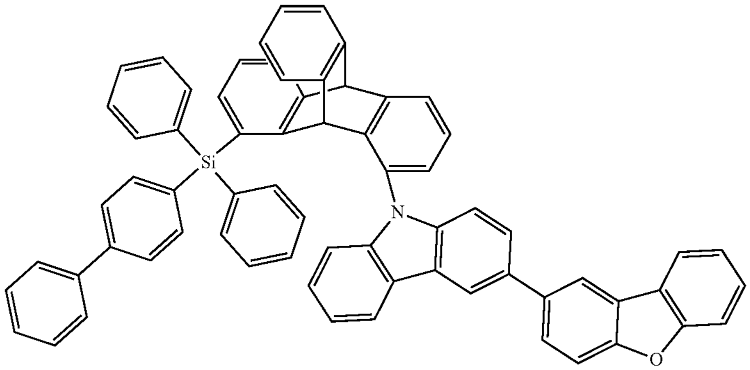
A-45
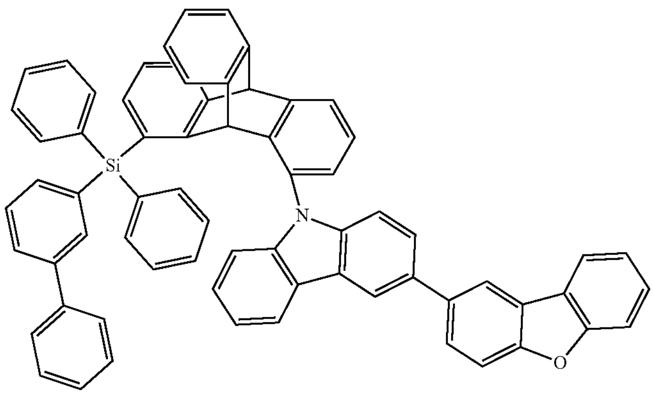
A-46
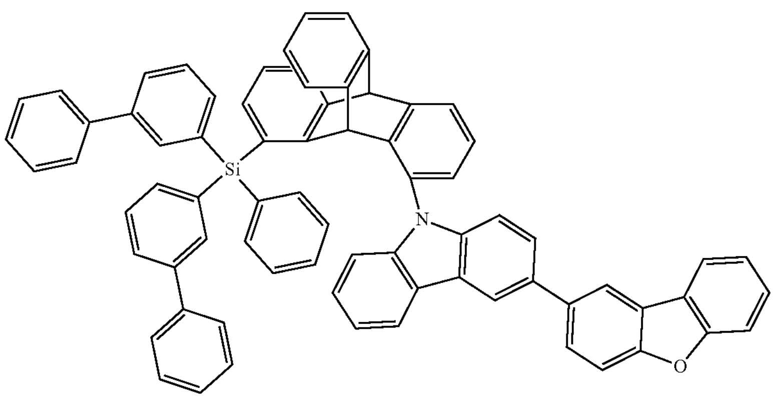
A-47
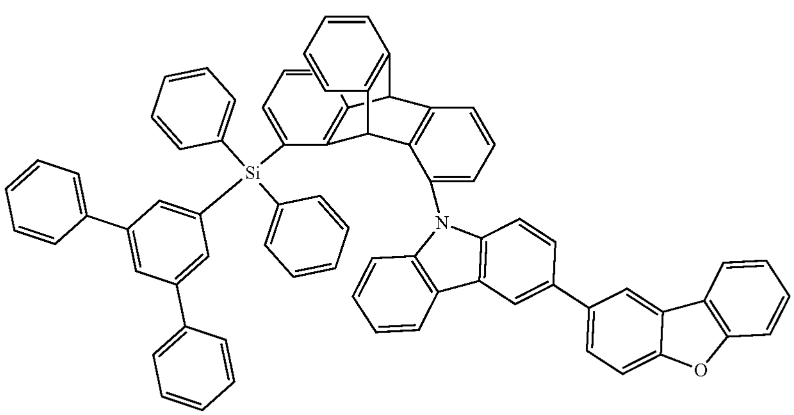

-continued
A-48
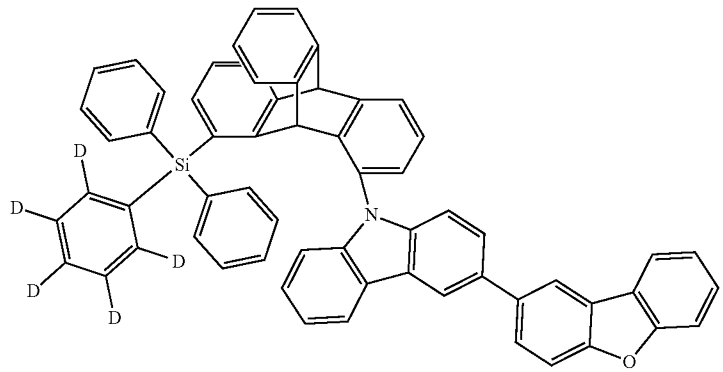
A-49
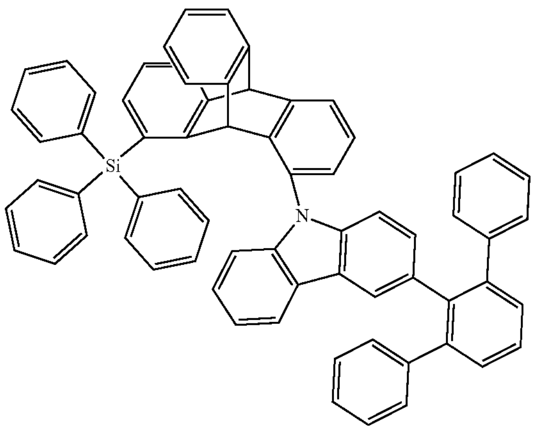
A-50
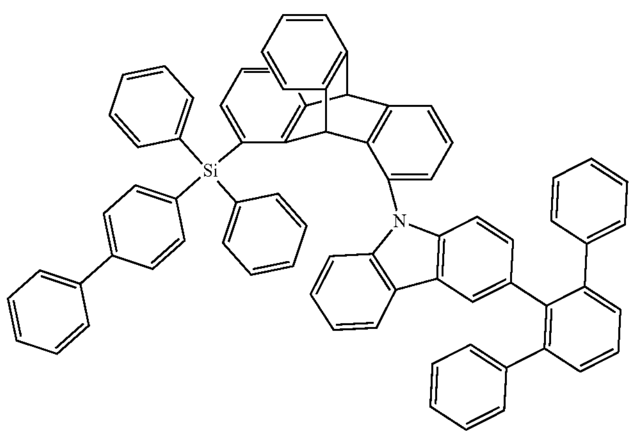
A-51
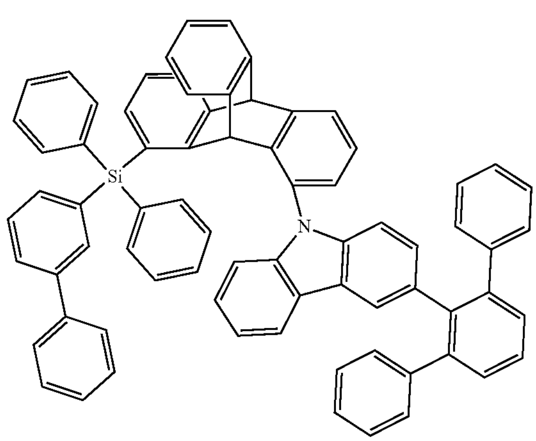

-continued
A-52
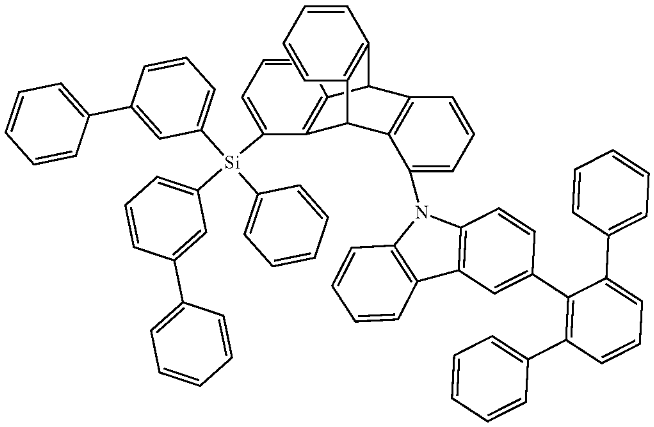
A-53
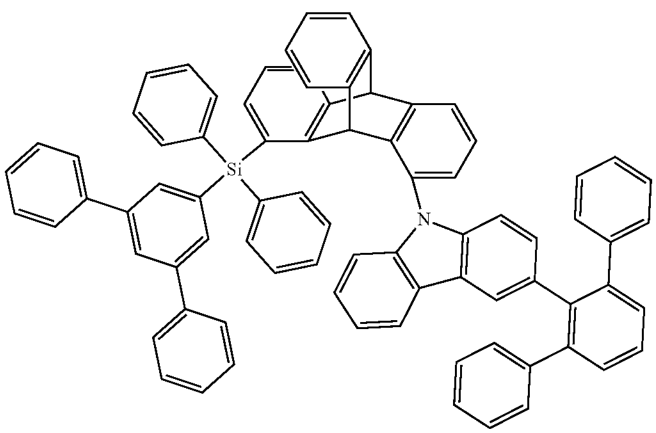
A-54
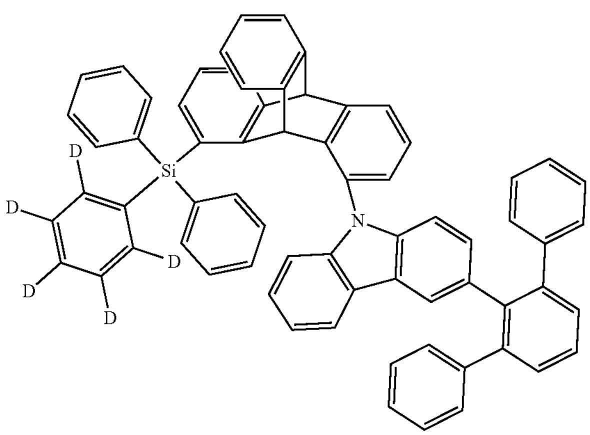

-continued
A-55
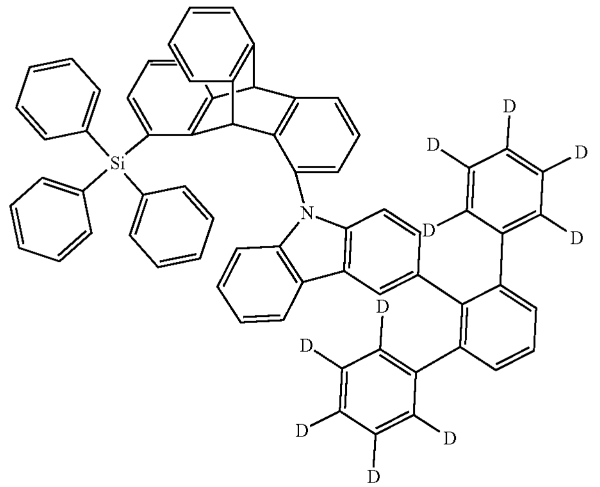
A-56
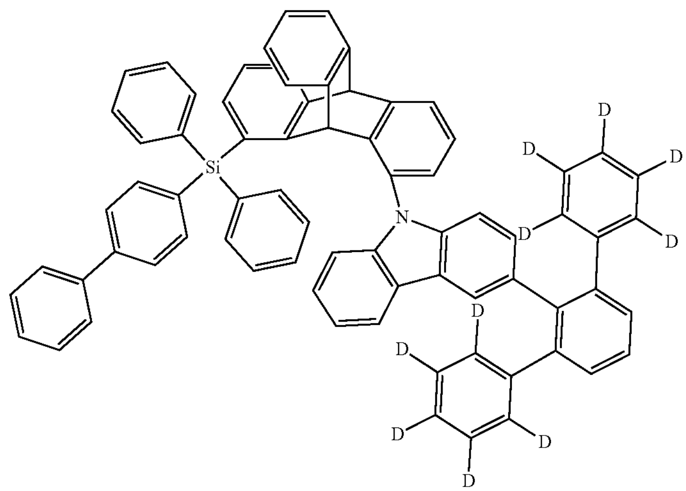
A-57
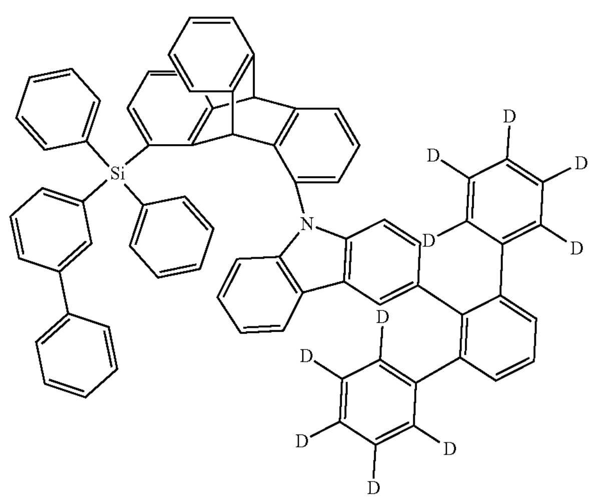

-continued
A-58
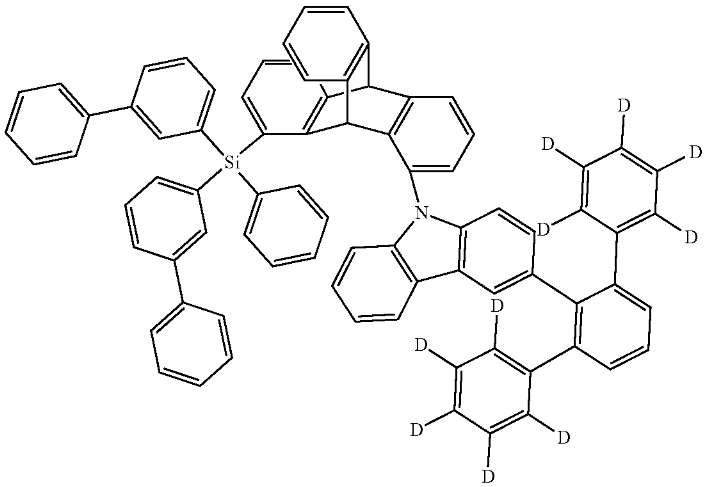
A-59
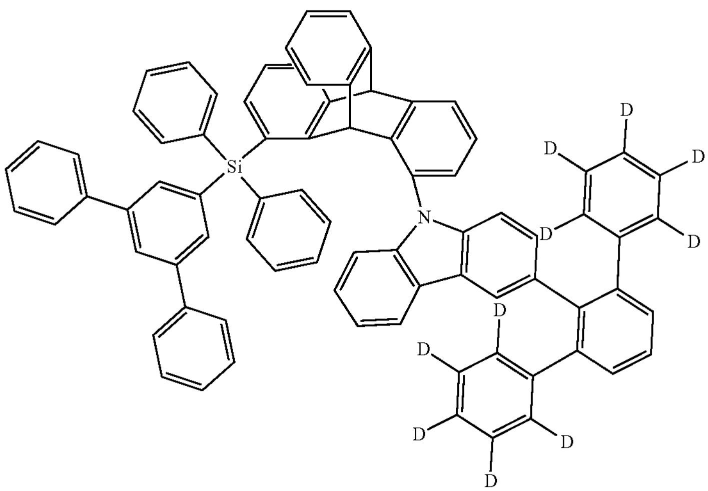
A-60
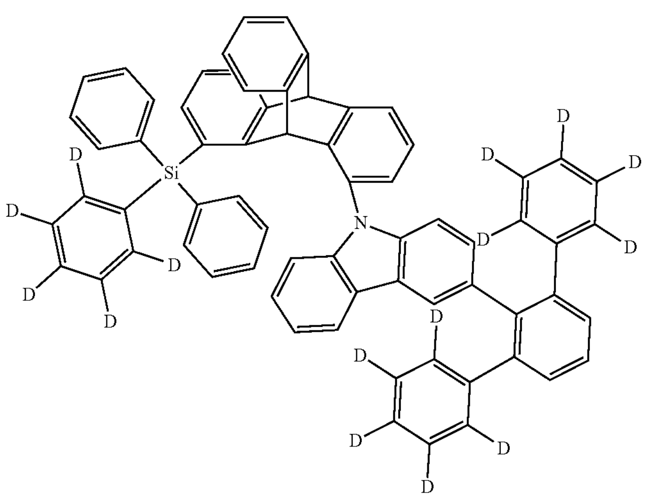

-continued
A-61
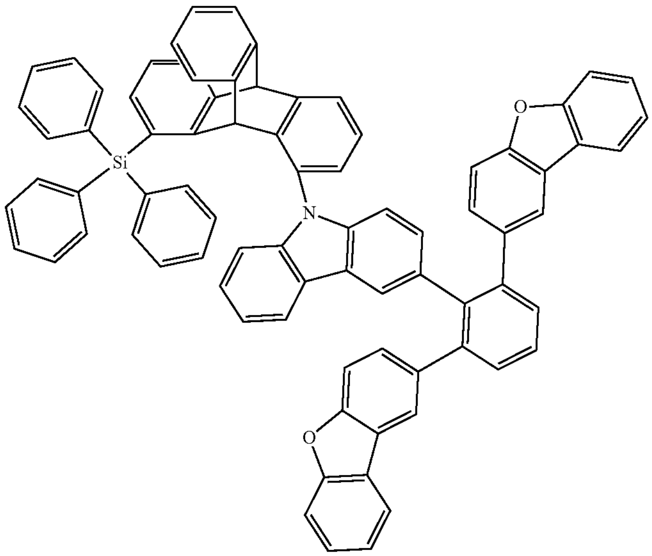
A-62
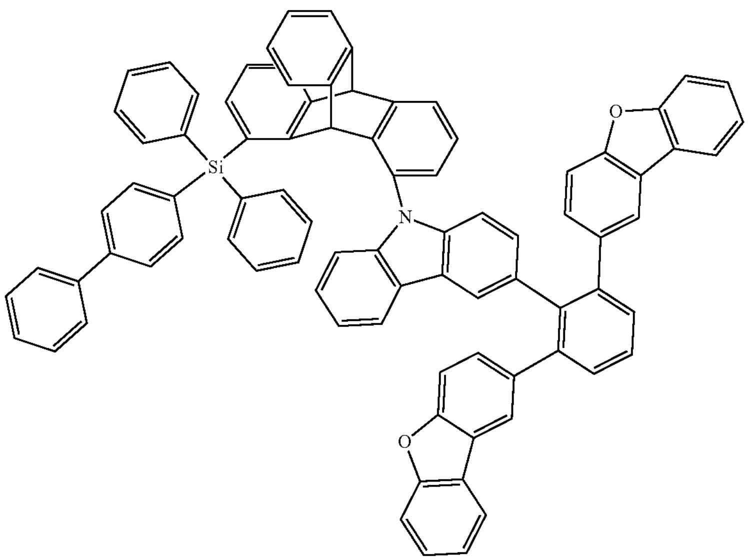
A-63
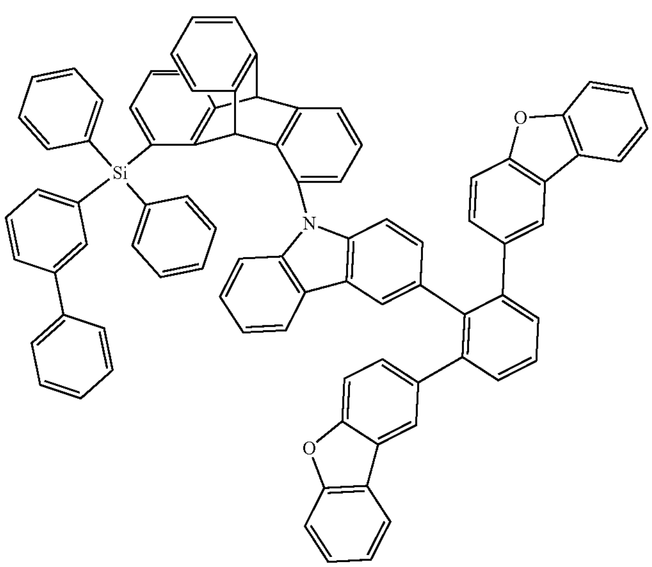

-continued
A-64
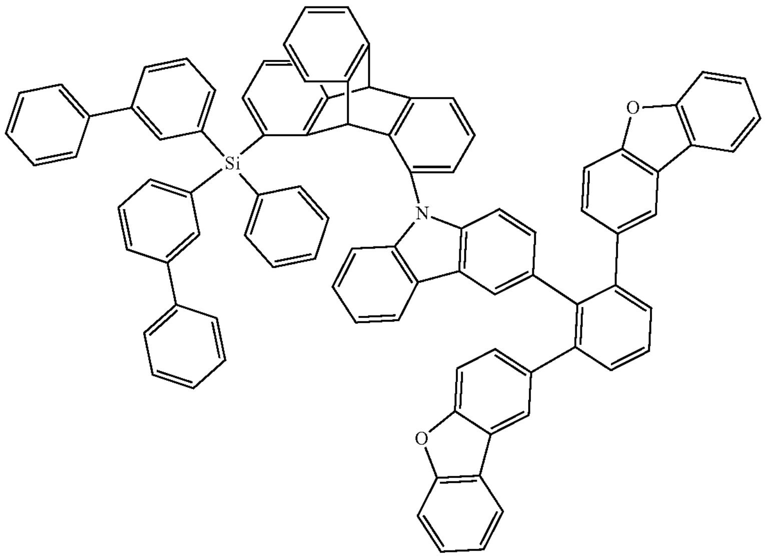
A-65
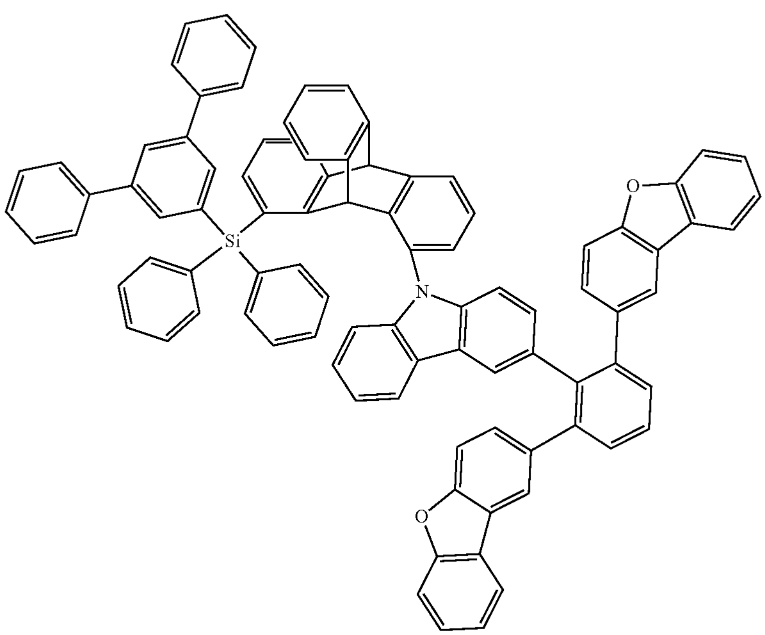

-continued
A-66
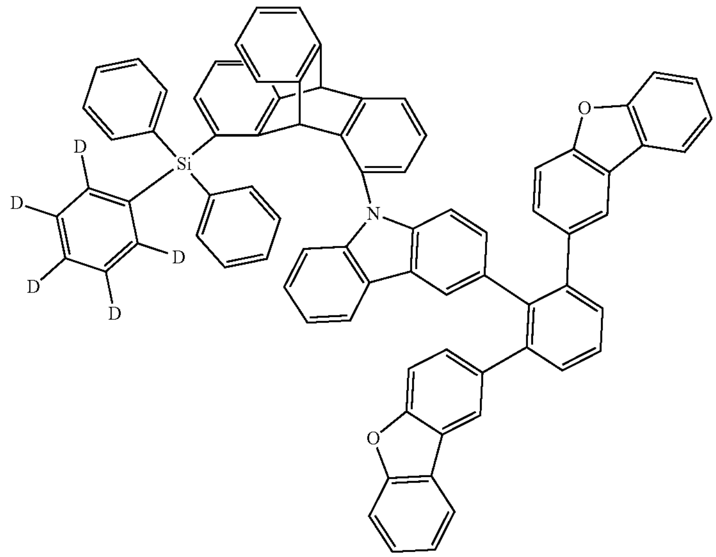
A-67
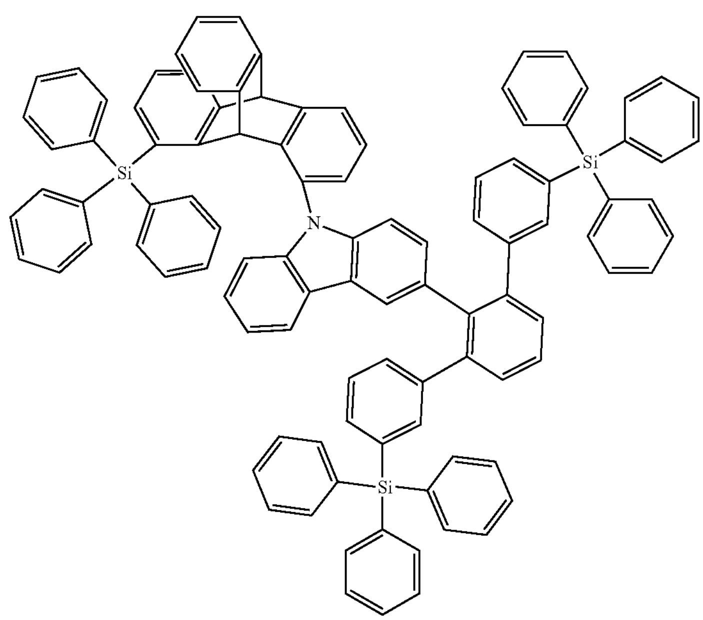

-continued
A-68
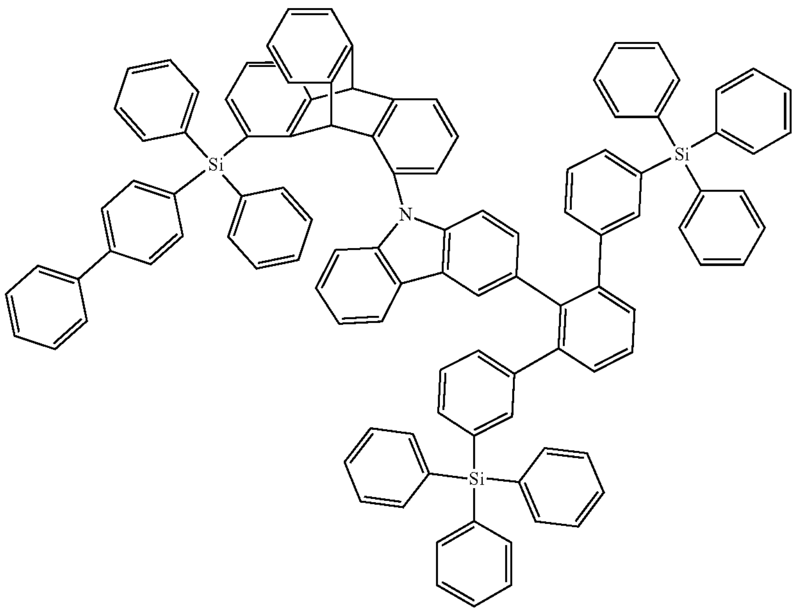
A-69
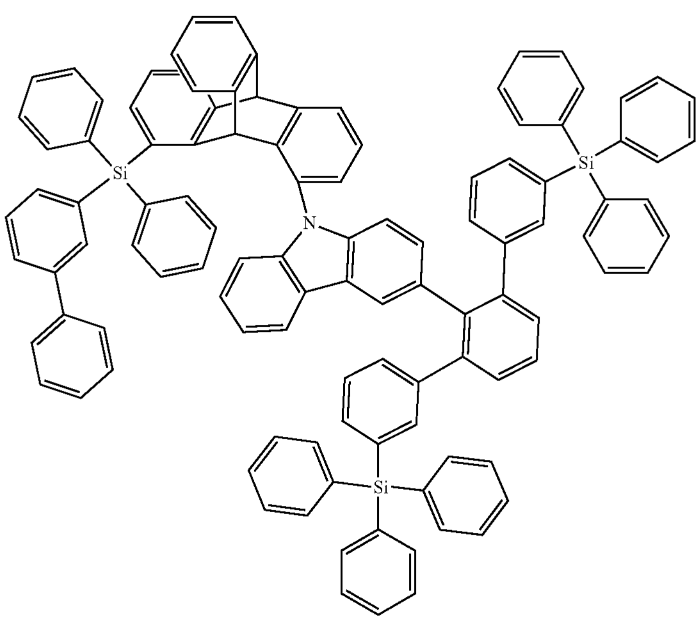

-continued
A-70
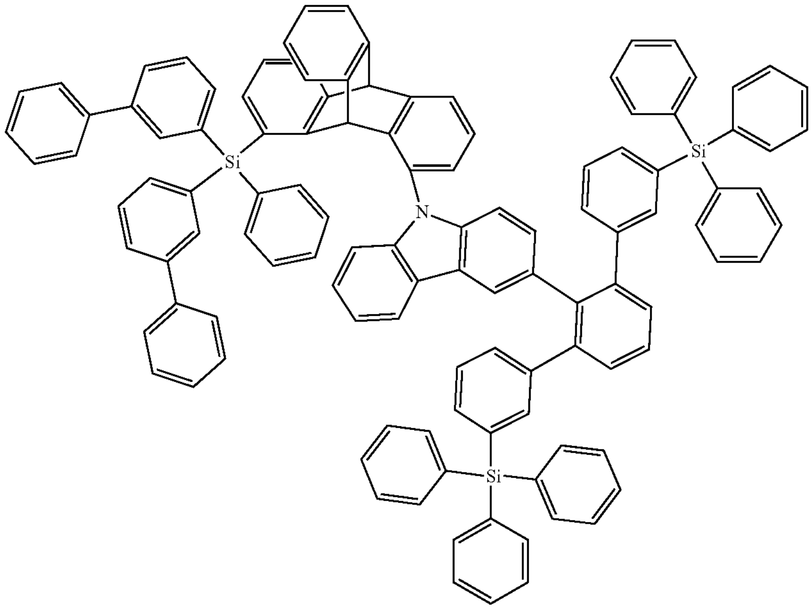
A-71
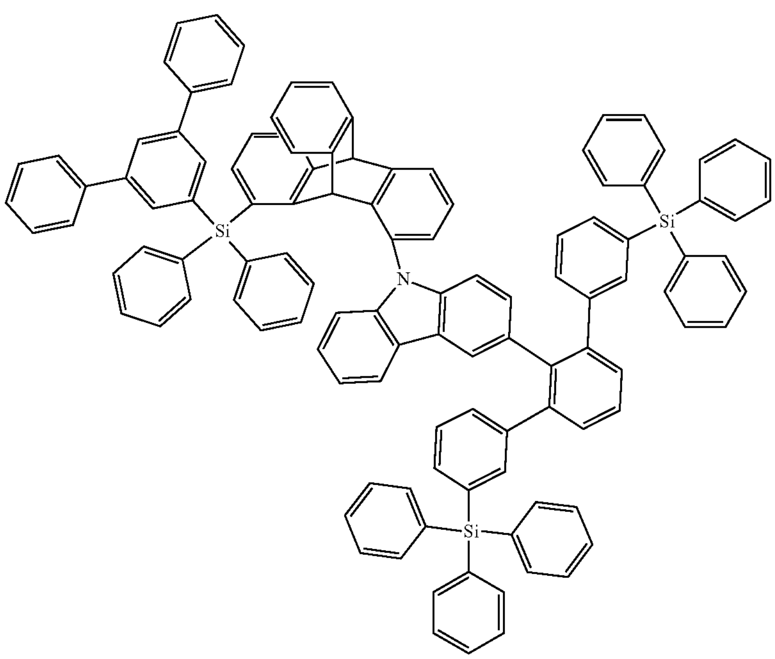

-continued
A-72
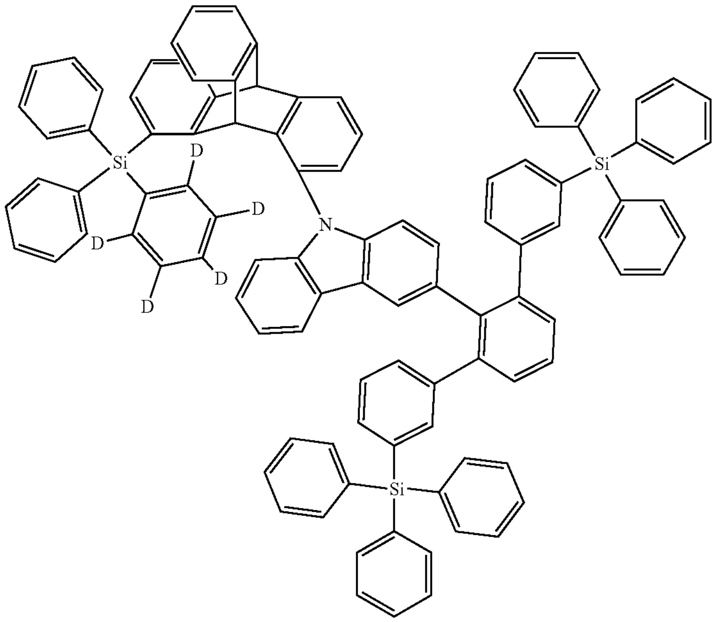
A-73
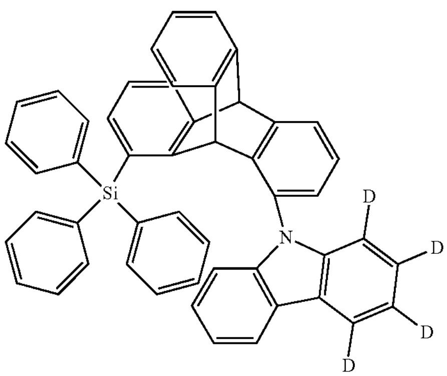
A-74
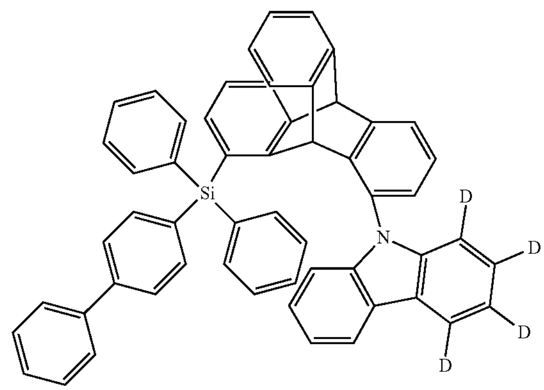
A-75
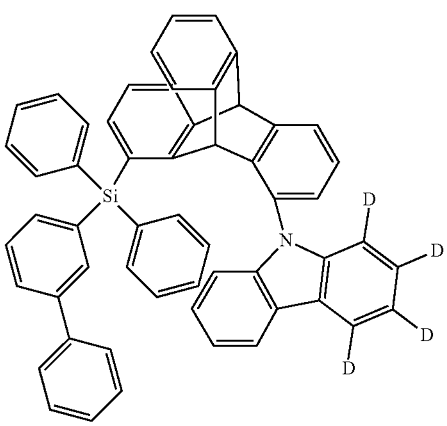
A-76
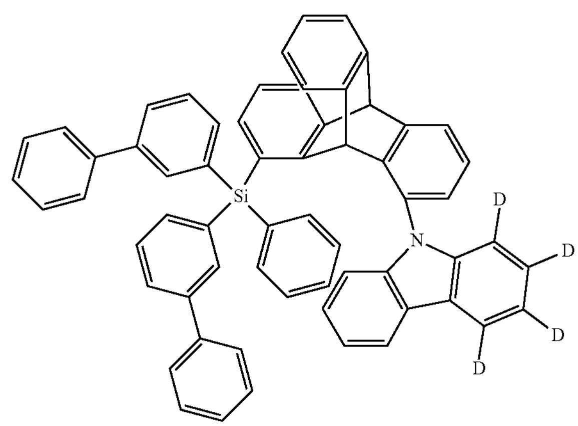

-continued
A-77
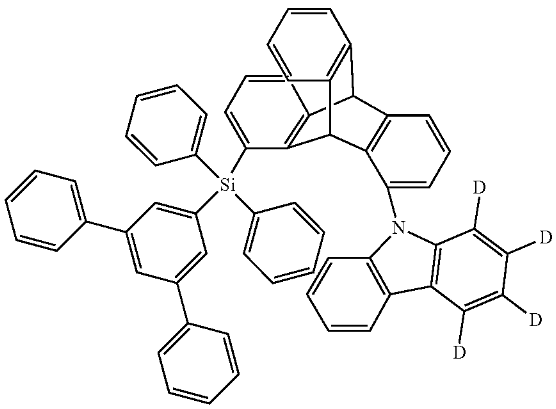
A-78
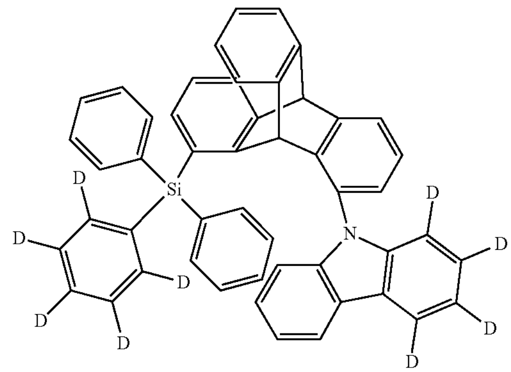
A-79
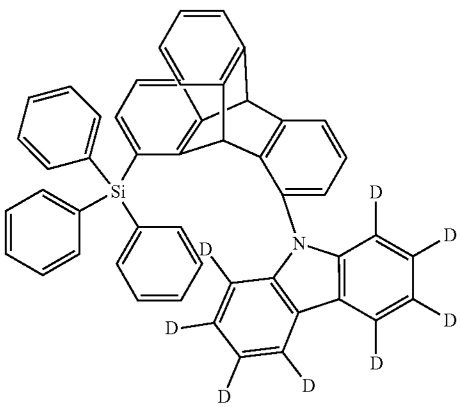
A-80
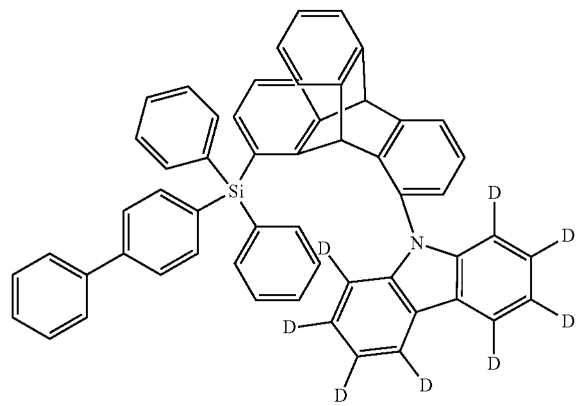
A-81
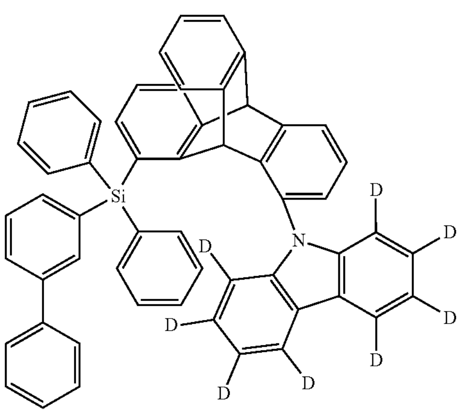
A-82
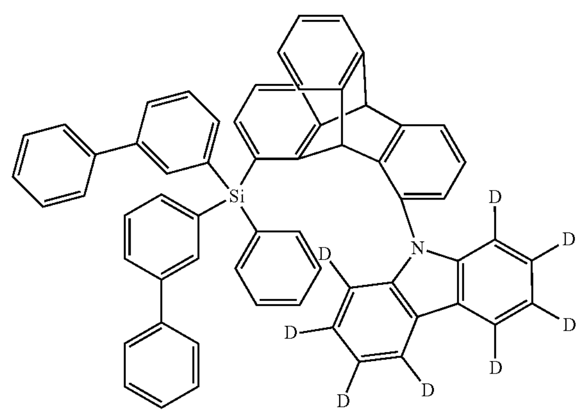

-continued
A-83
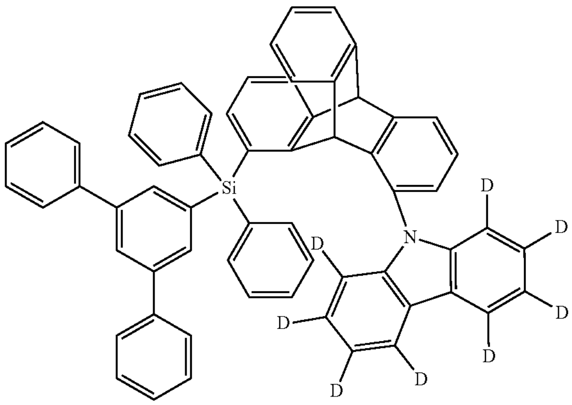
A-84
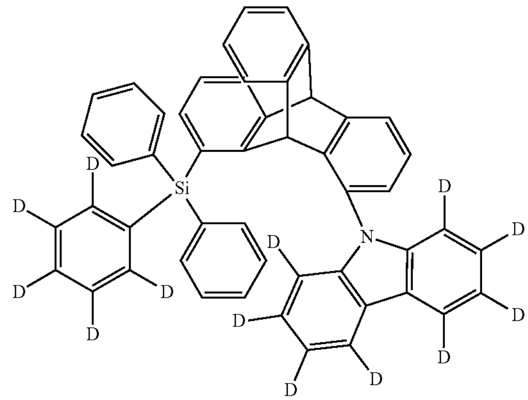
A-85
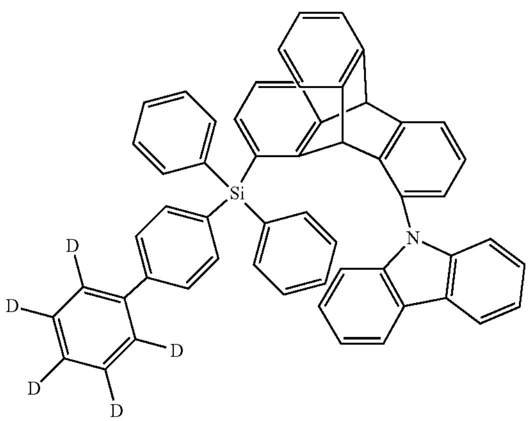
A-86
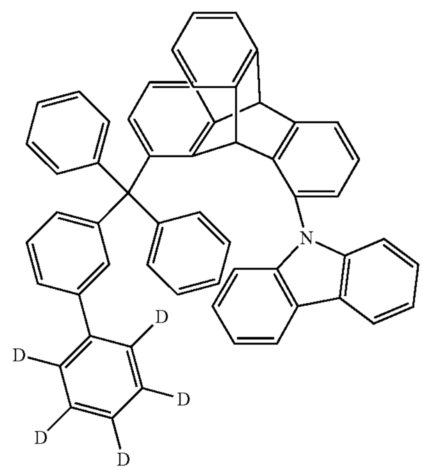
A-87
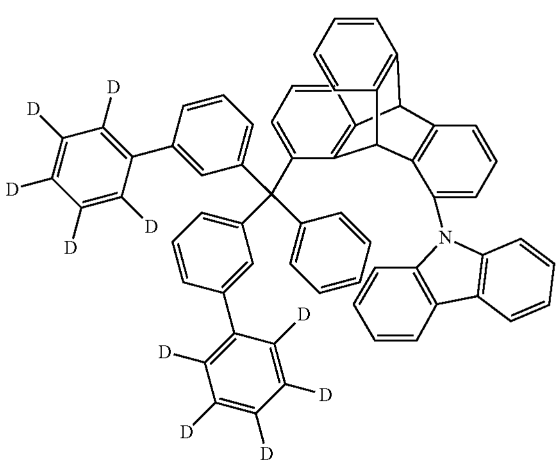
A-88
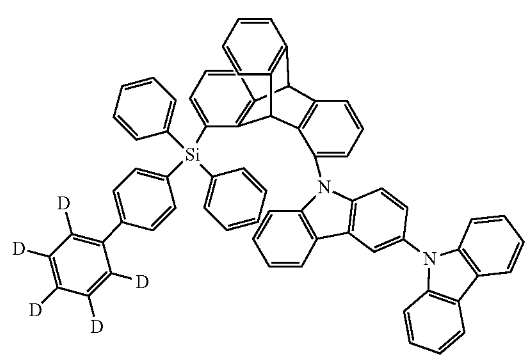

-continued
A-89
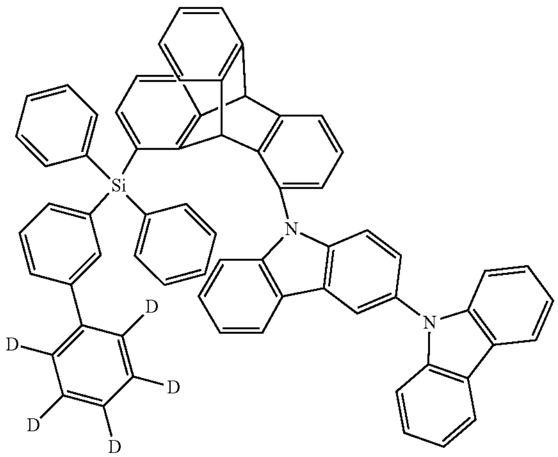
A-90
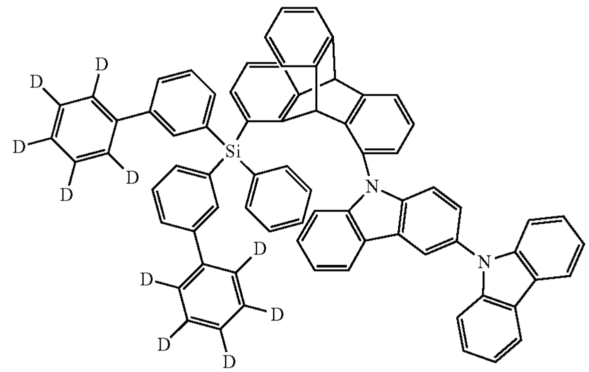
A-91
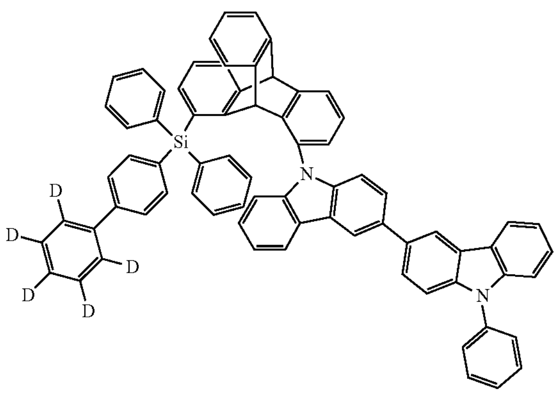
A-92
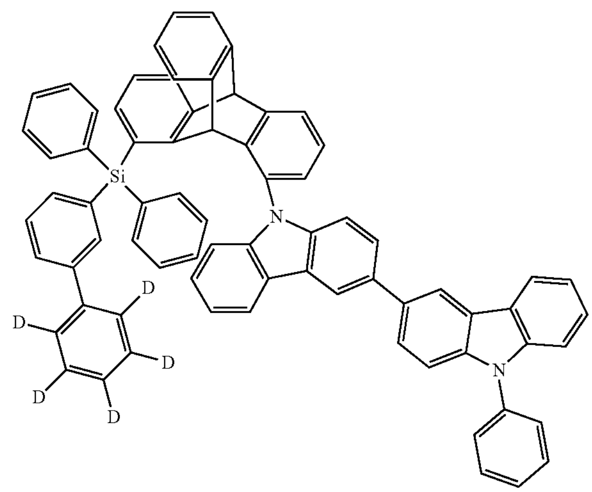
A-93
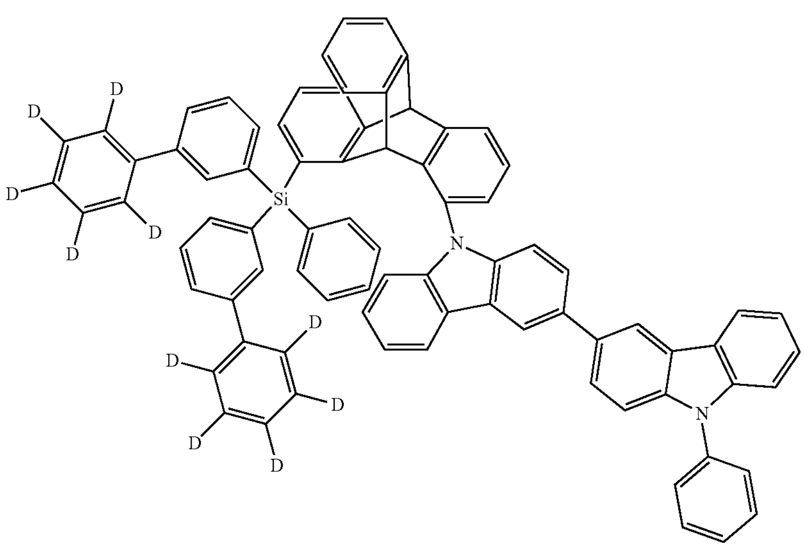

-continued
A-94
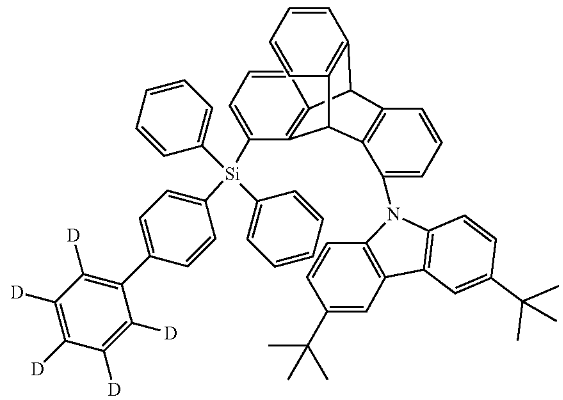
A-95
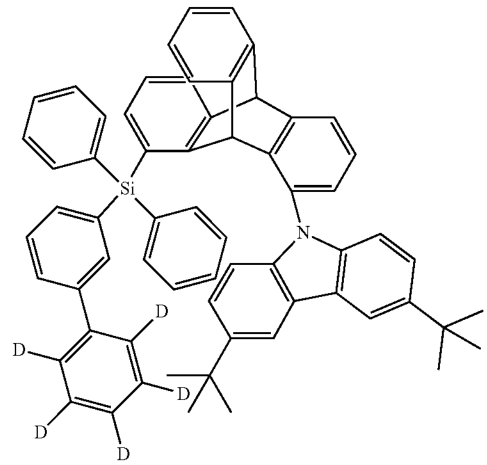
A-96
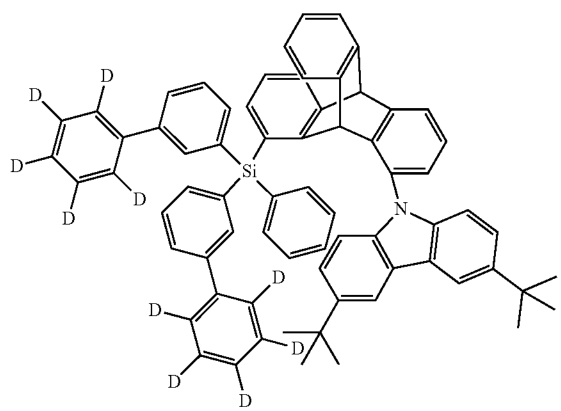
A-97
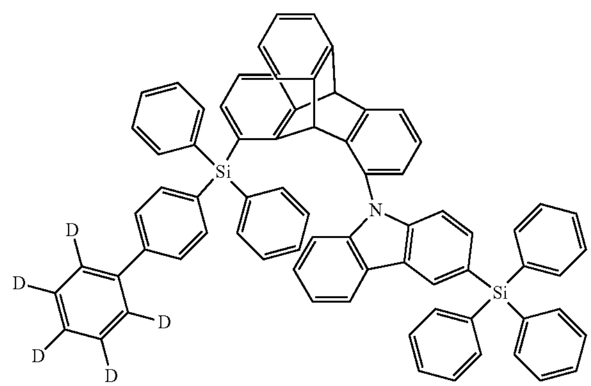
A-98
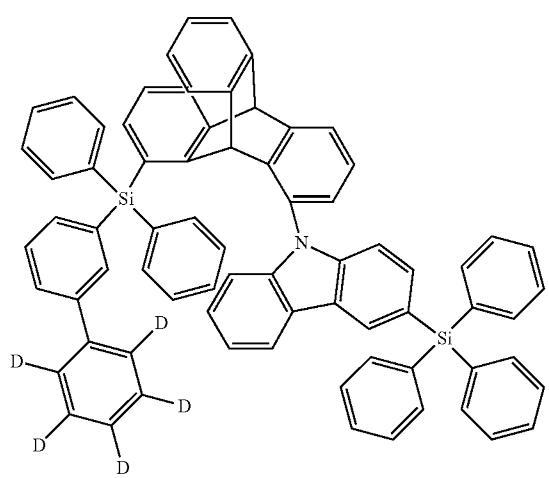
A-99
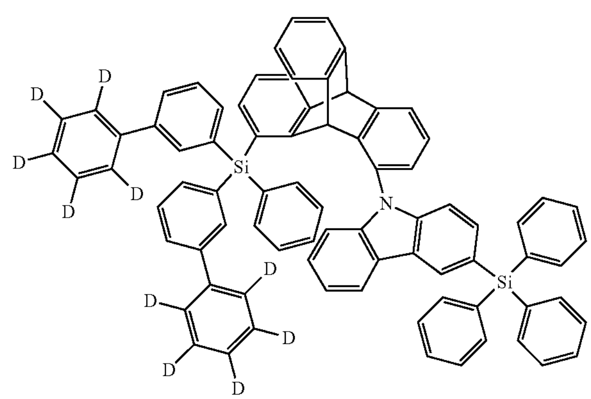

-continued
A-101
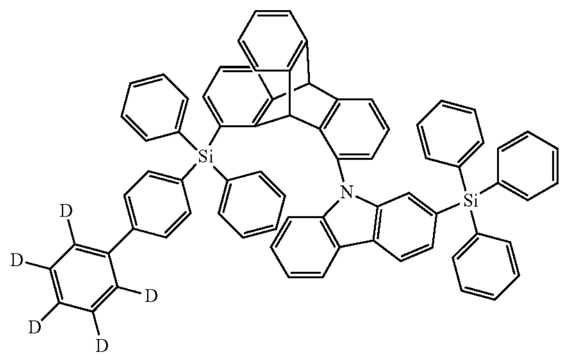
A-101
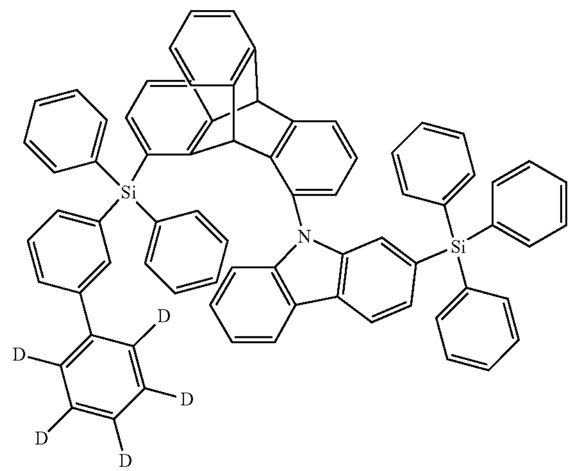
A-102
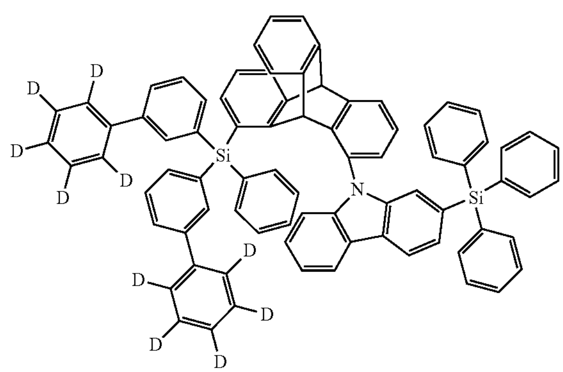
A-103
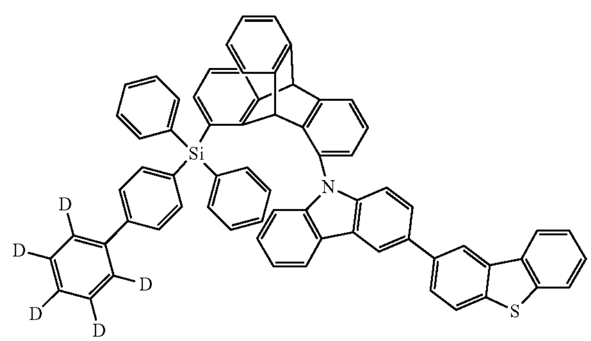
A-104
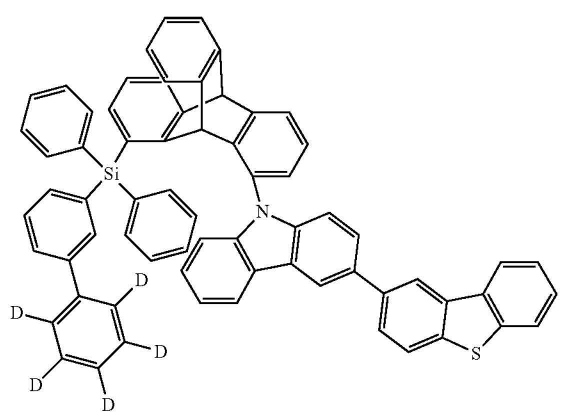

-continued
A-105
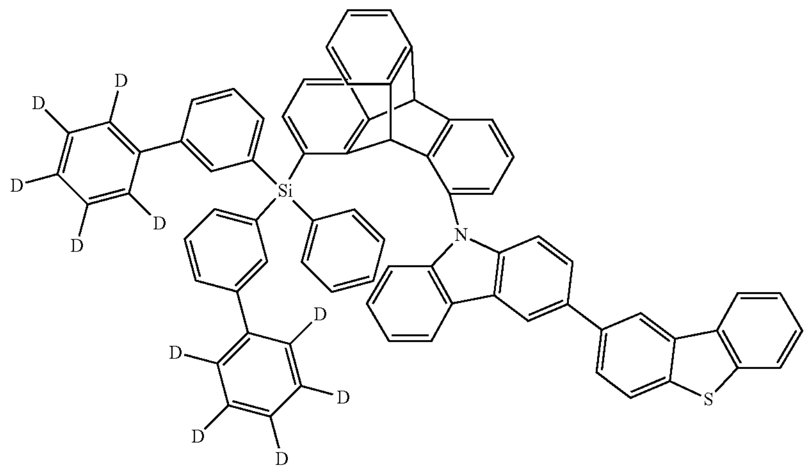
A-106
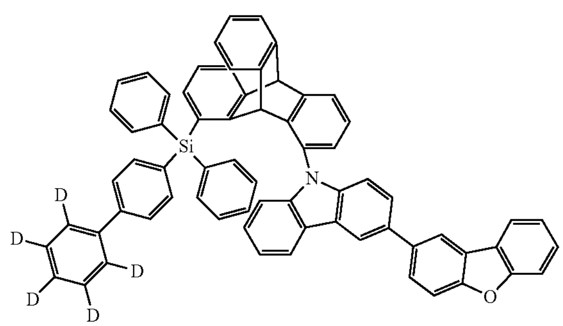
A-107
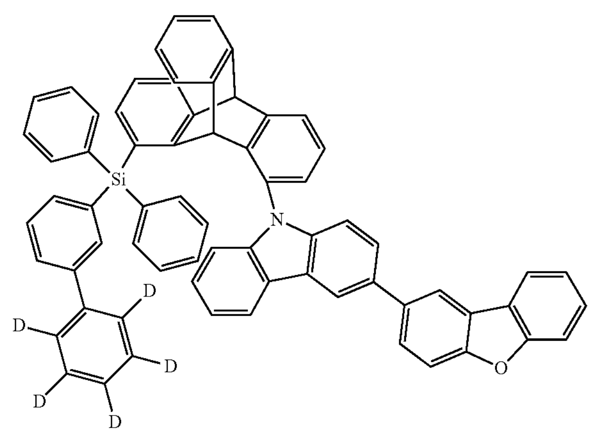
A-108
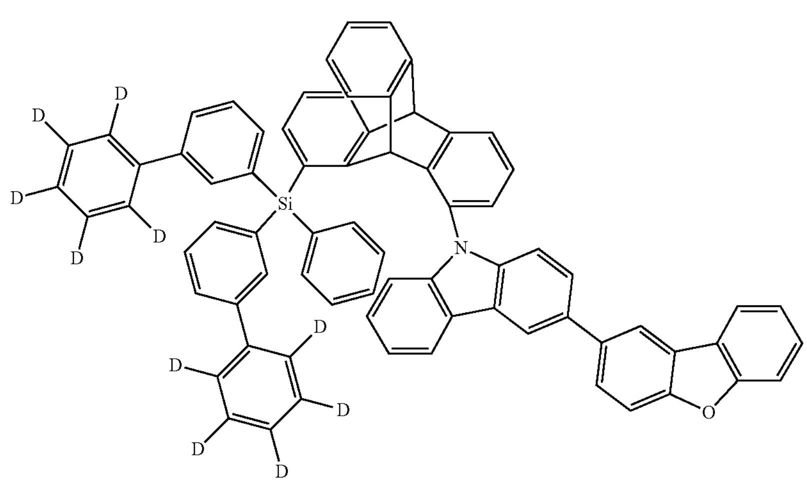

-continued
A-109
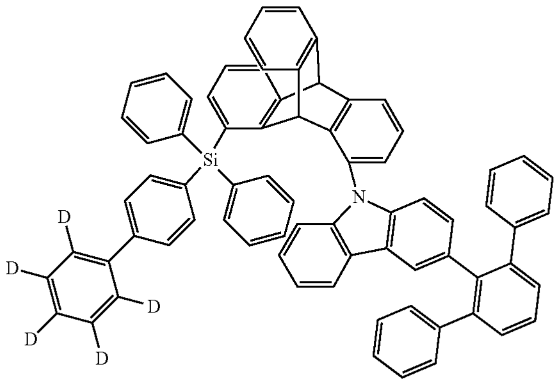
A-110
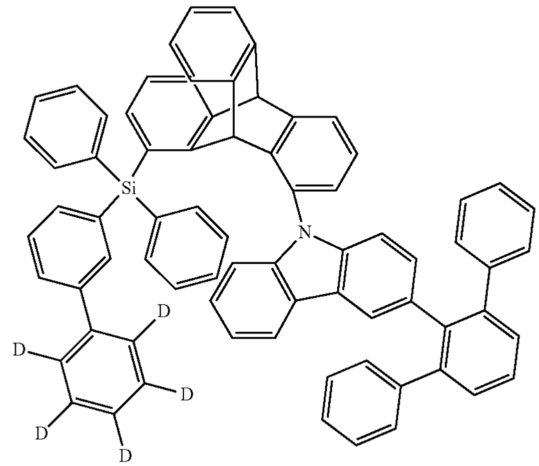
A-111
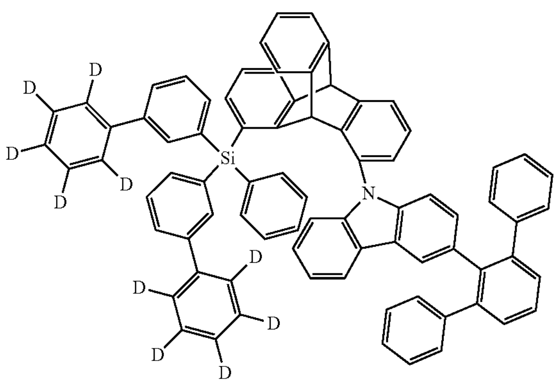
A-112
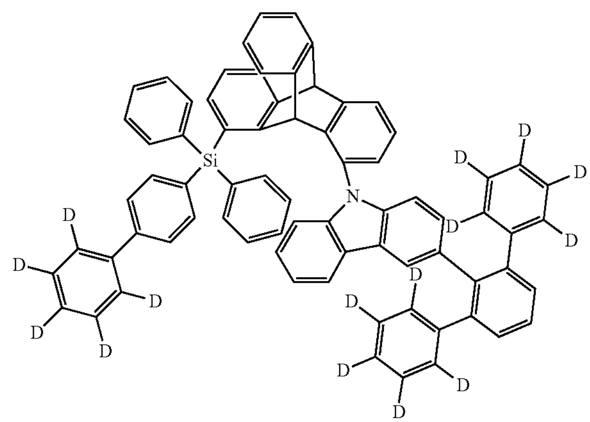
A-113
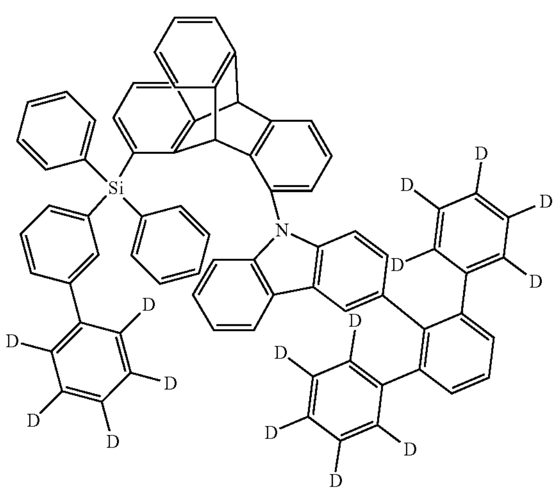
A-114
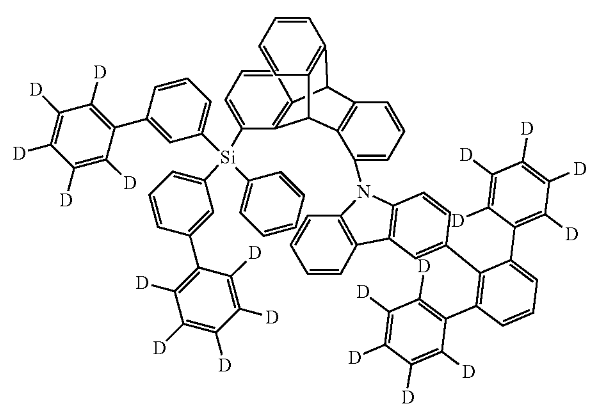

-continued
A-115
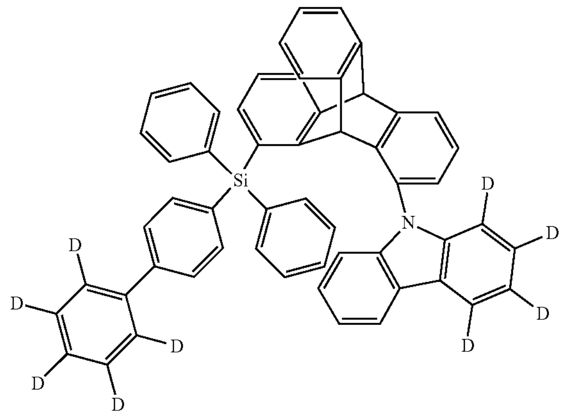
A-116
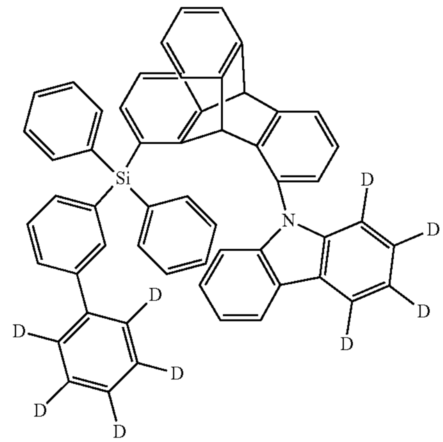
A-117
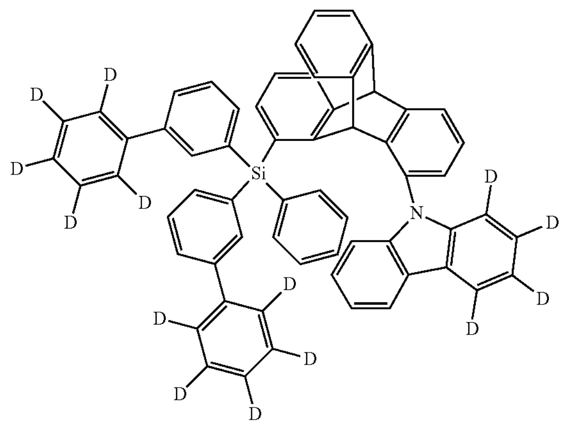
A-118
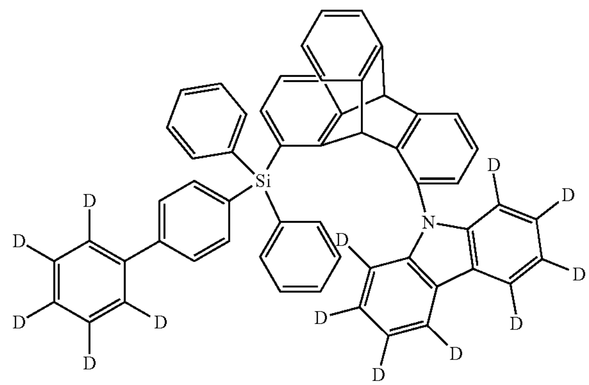
A-119
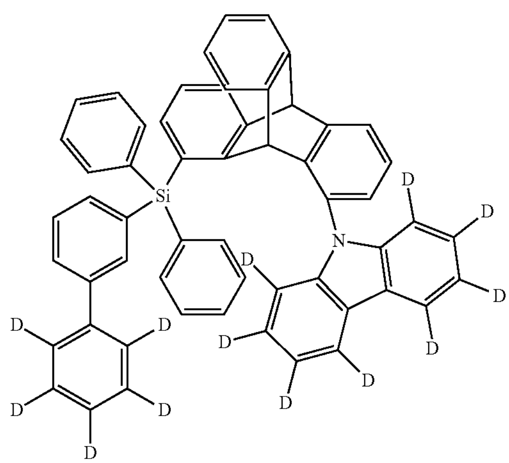
A-120
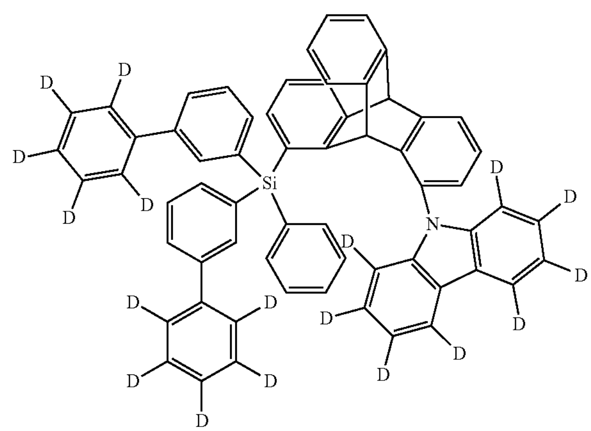

-continued
A-121
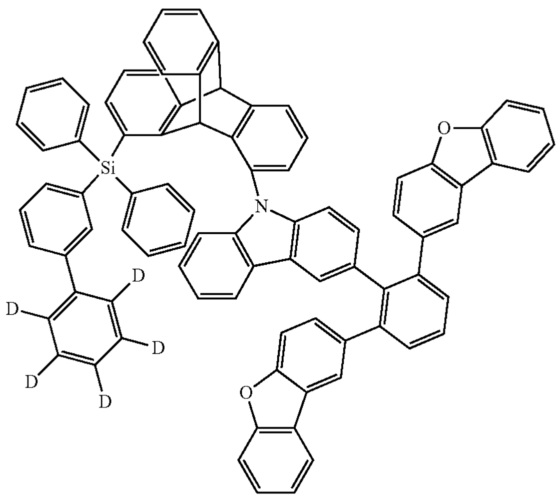
A-122
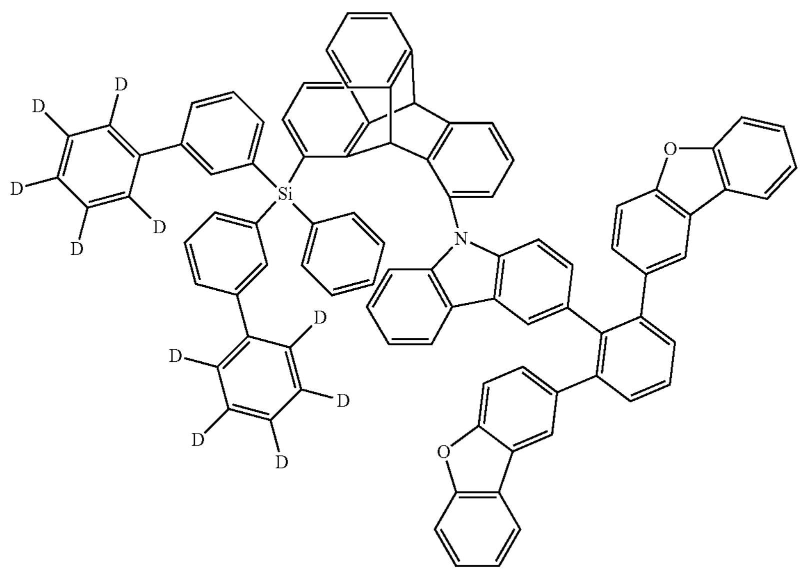
A-123
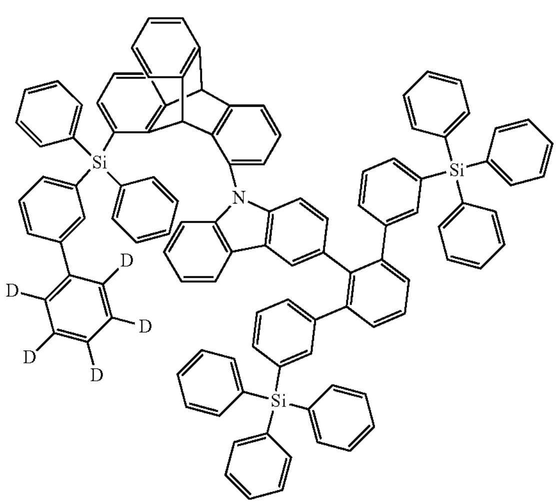

-continued
A-124
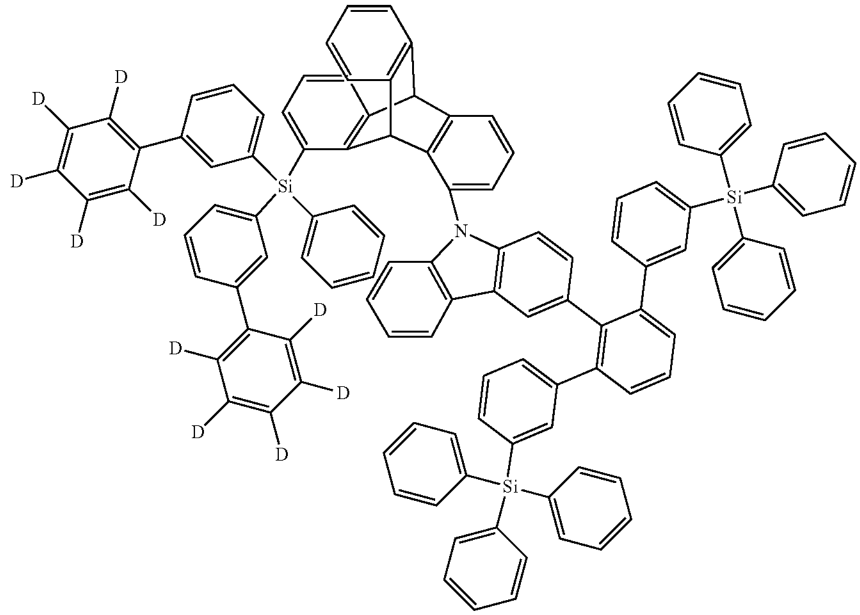
A-125
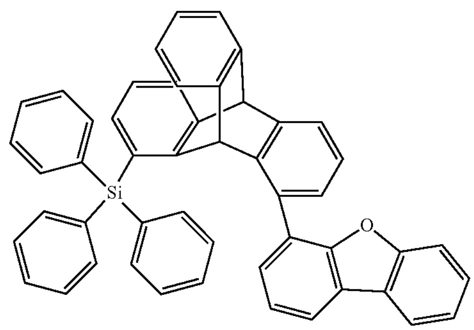
A-126
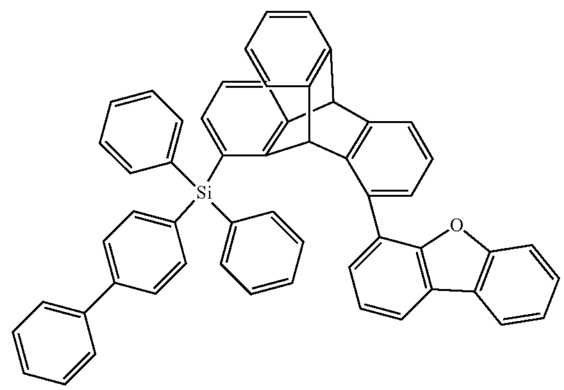
A-127
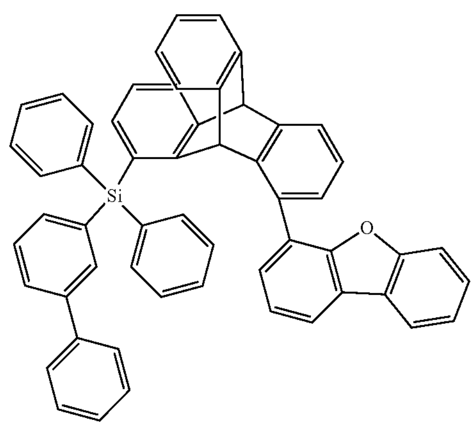
A-128
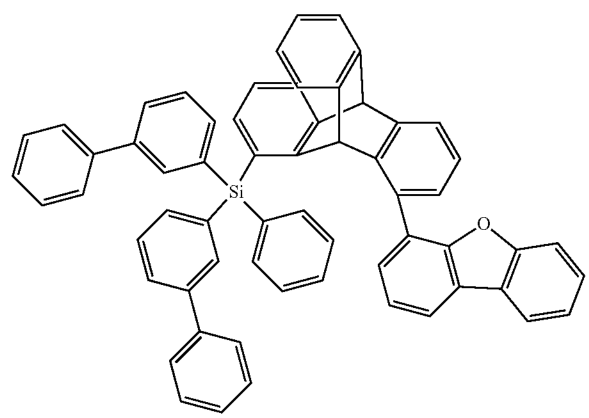

-continued
A-129
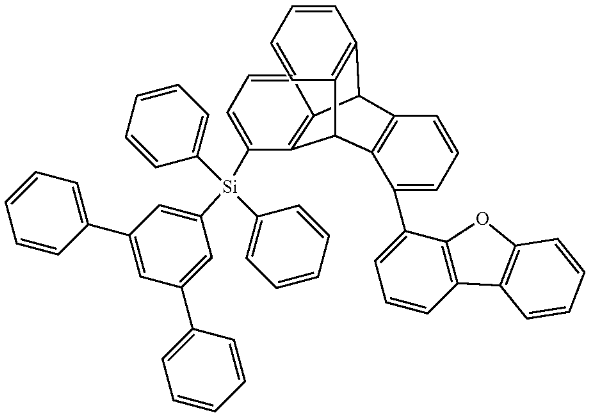
A-130
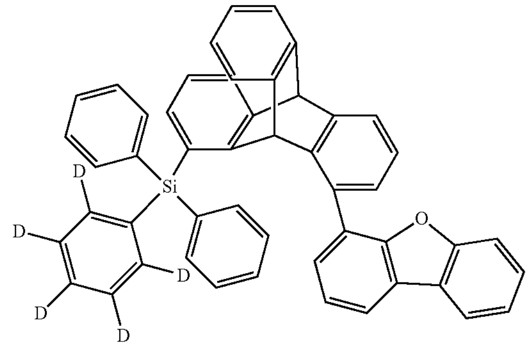
A-131
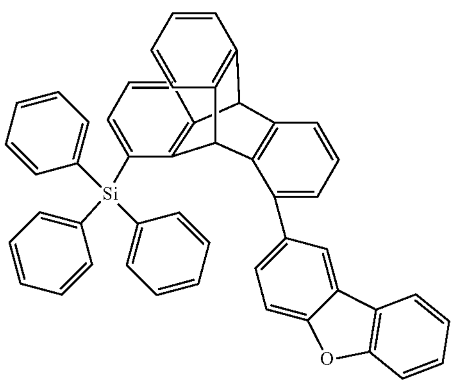
A-132
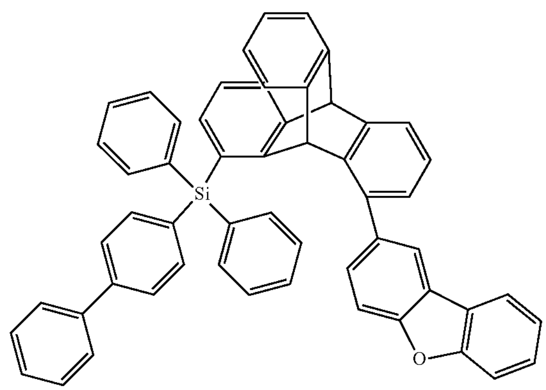
A-133
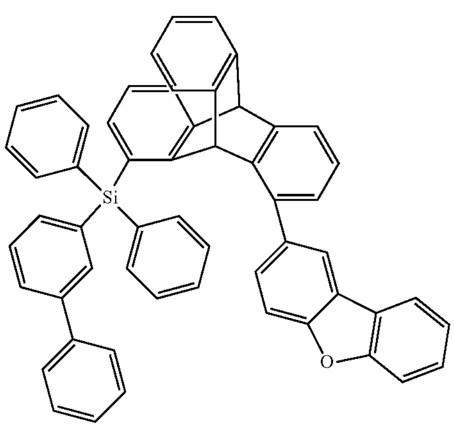
A-134
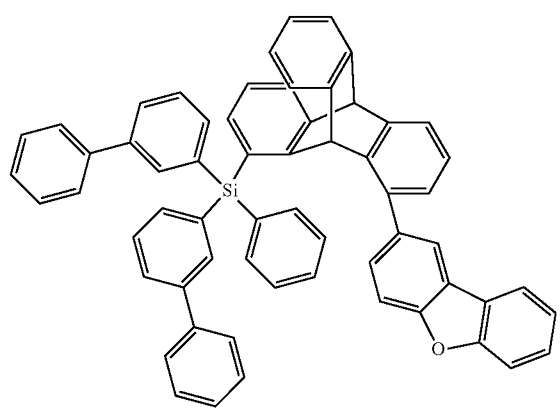

-continued
A-135
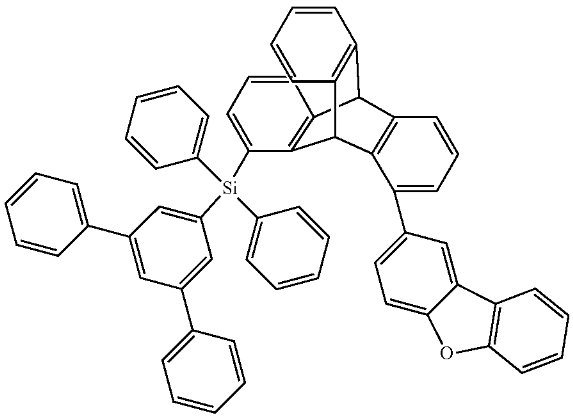
A-136
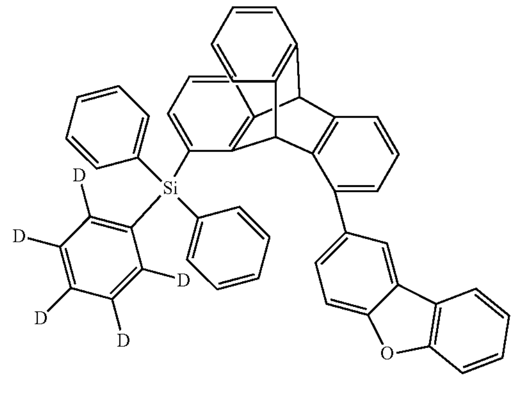
A-137
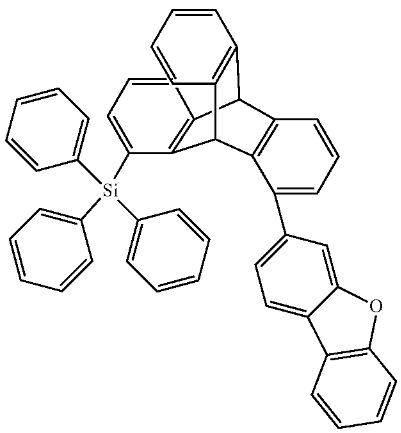
A-138
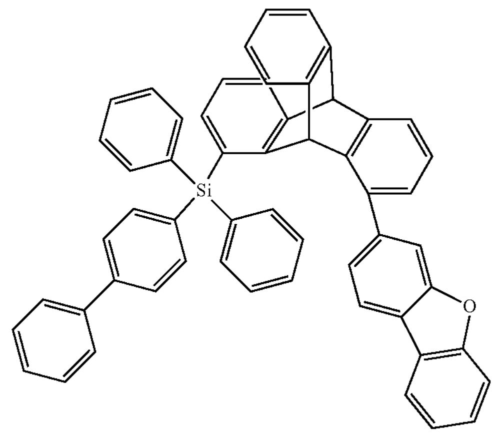
A-139
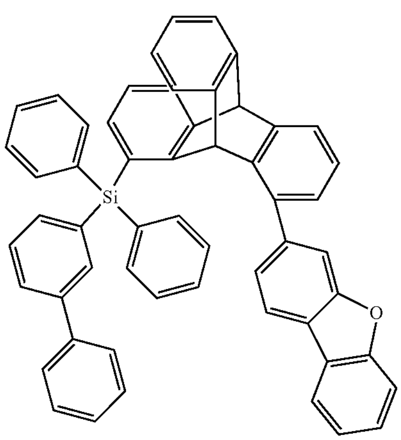
A-140
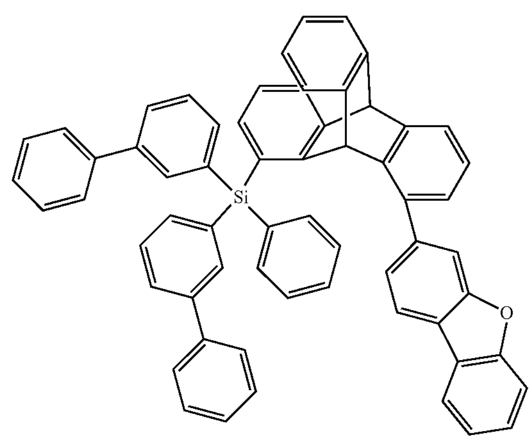

-continued
A-141
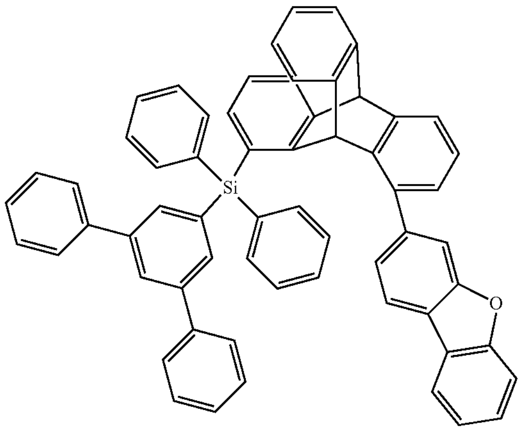
A-142
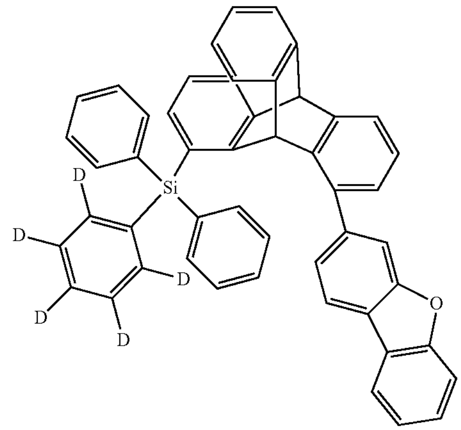
A-143
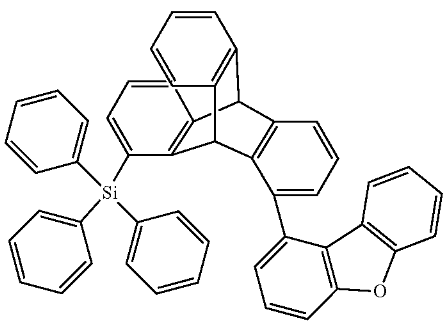
A-144
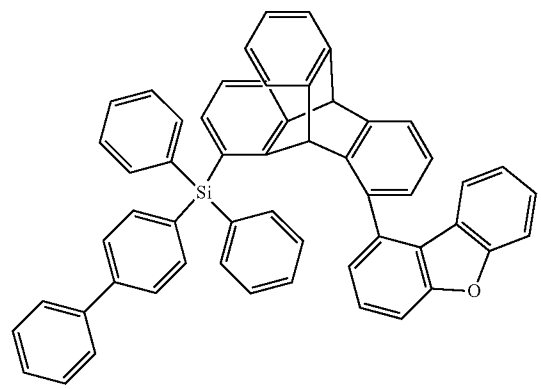
A-145
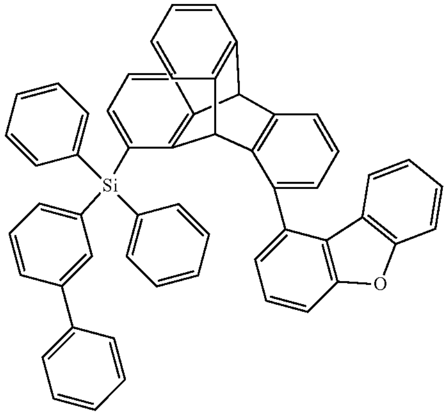
A-146
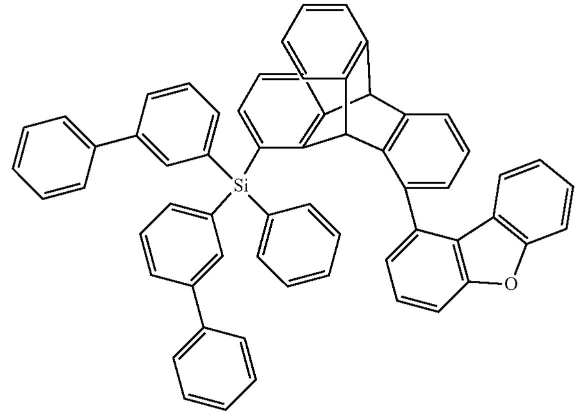

-continued
A-147
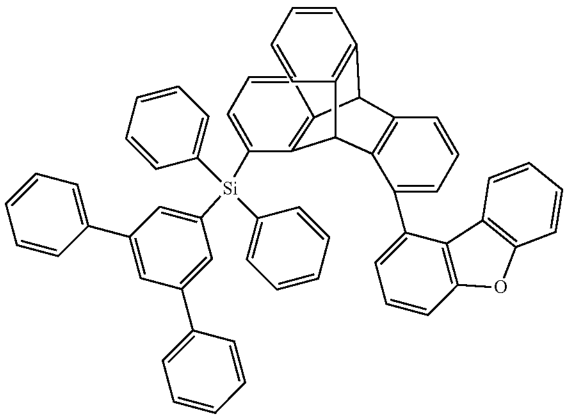
A-148
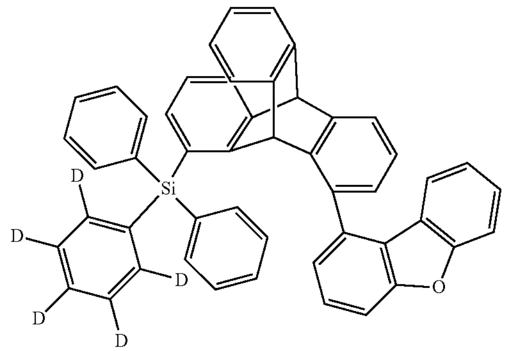
A-149
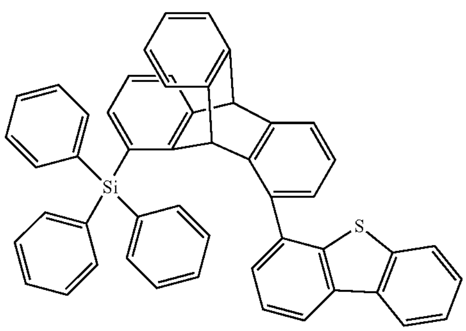
A-150
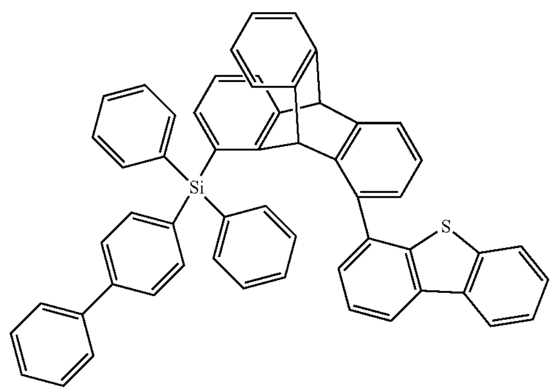
A-151
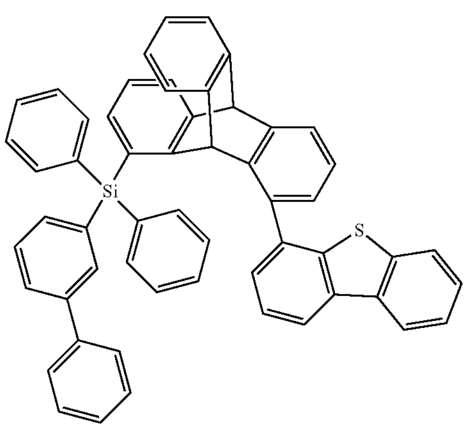
A-152
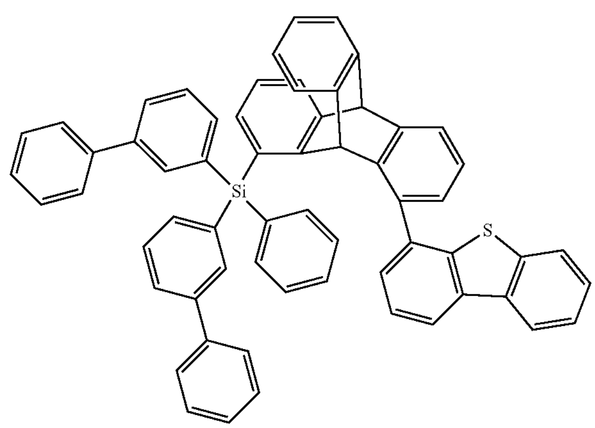

-continued
A-153
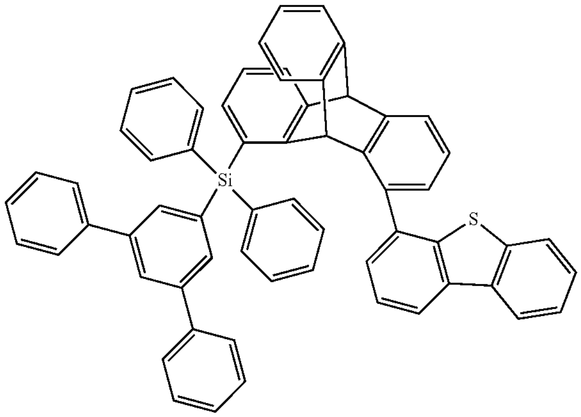
A-154
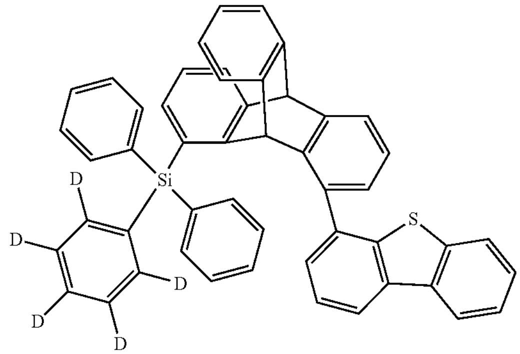
A-155
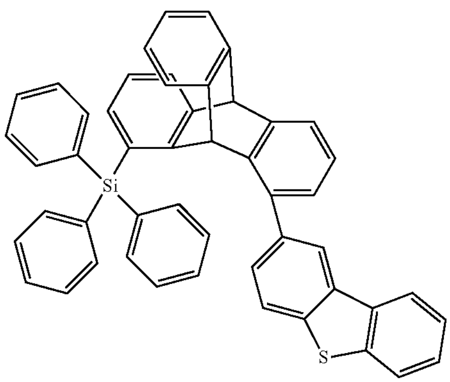
A-156
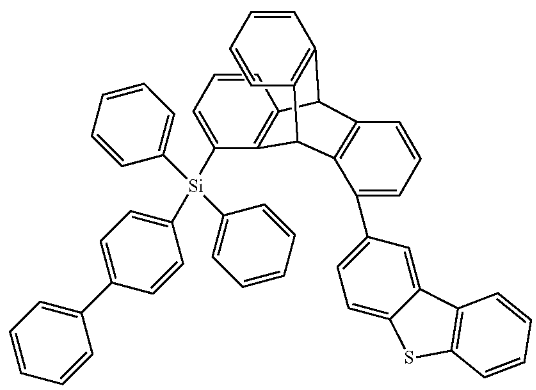
A-157
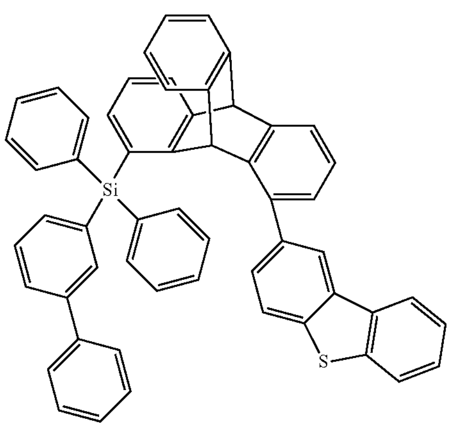
A-158
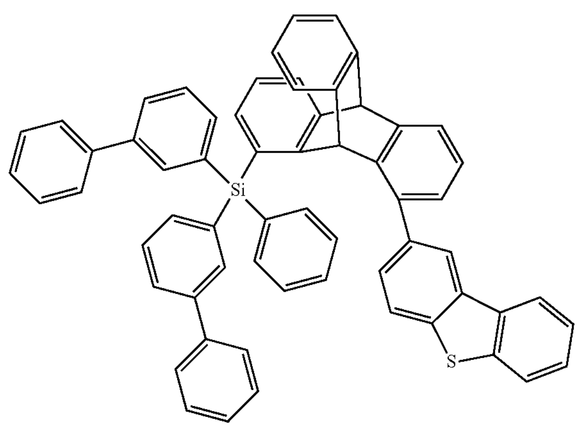

-continued
A-159
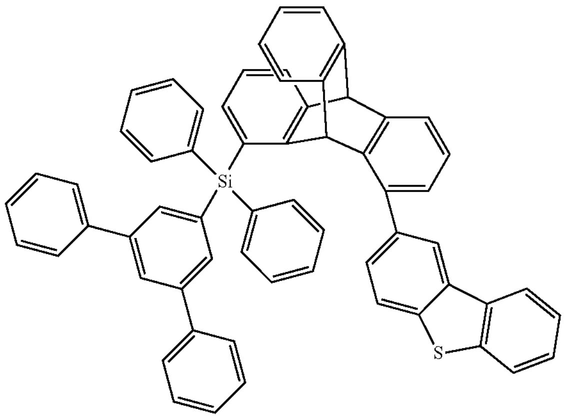
A-160
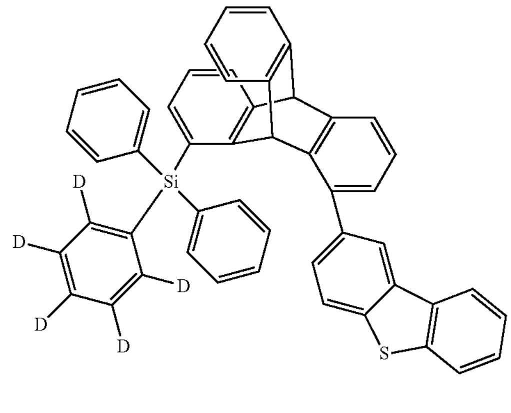
A-161
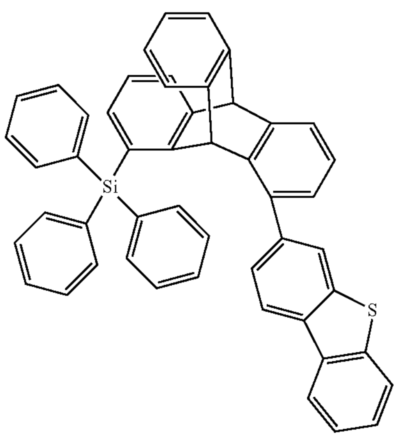
A-162
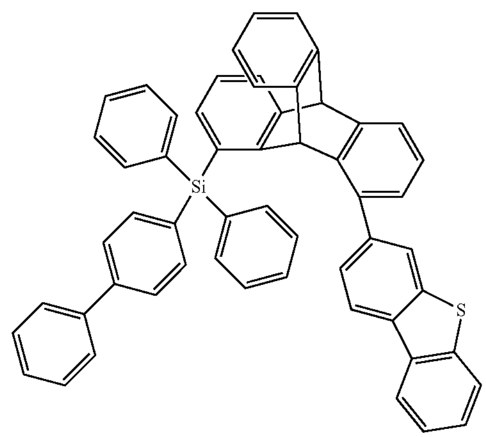
A-163
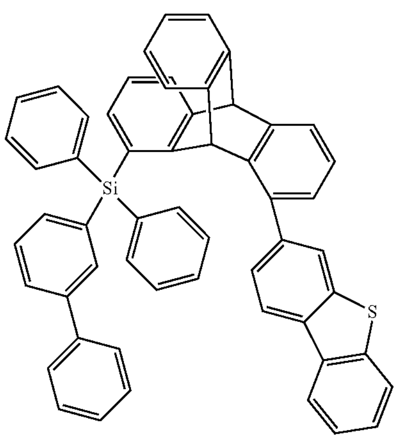
A-164
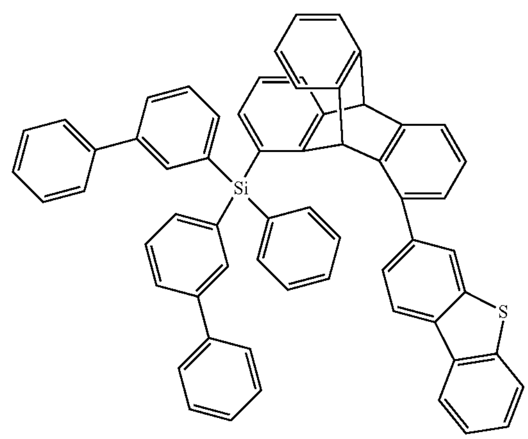

-continued
A-165
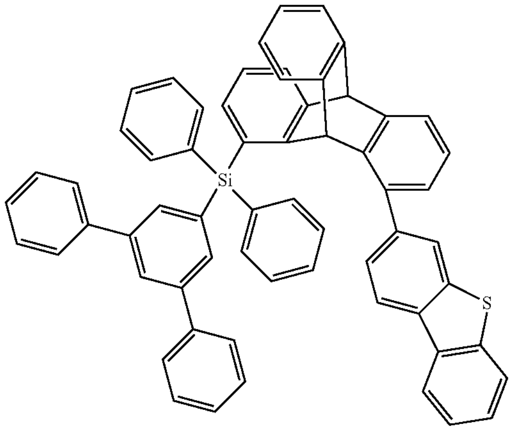
A-166
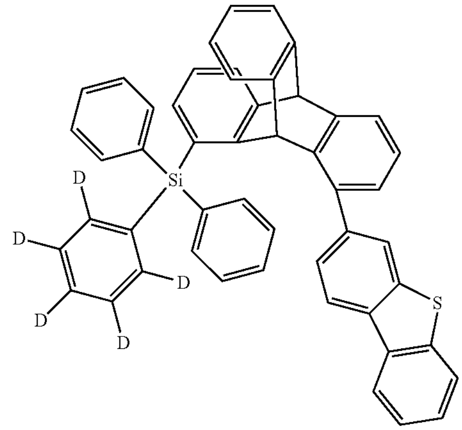
A-167
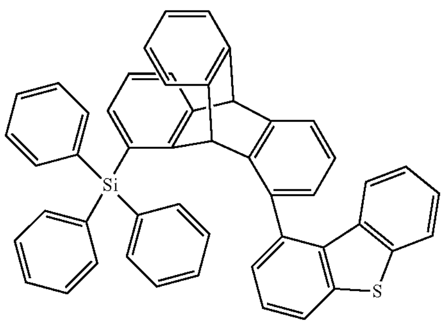
A-168
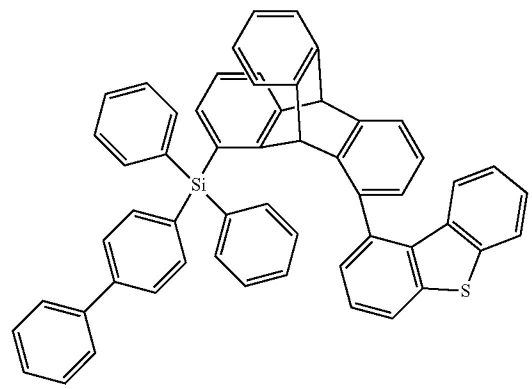
A-169
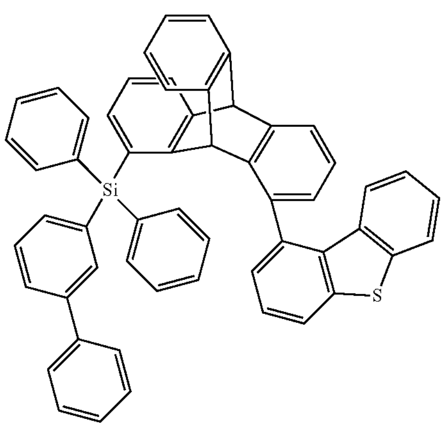
A-170
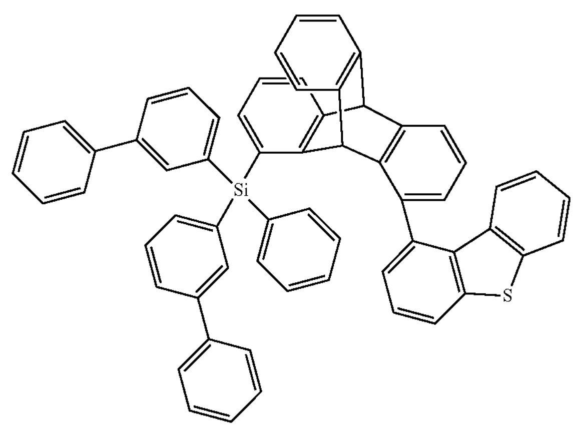

-continued
A-171
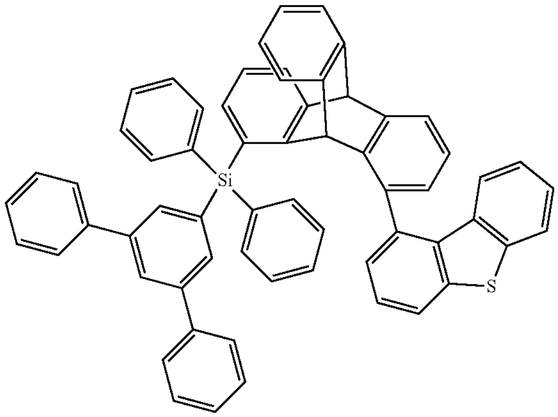
A-172
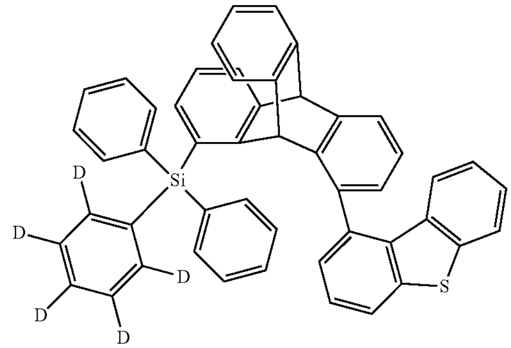
A-173
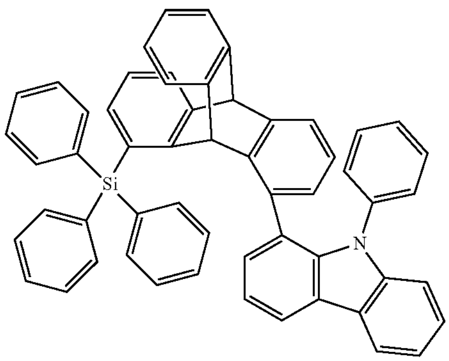
A-174
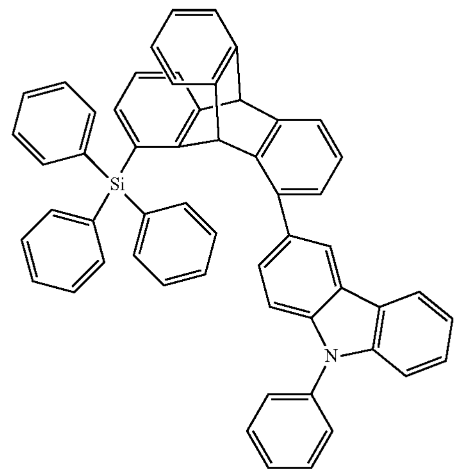
A-175
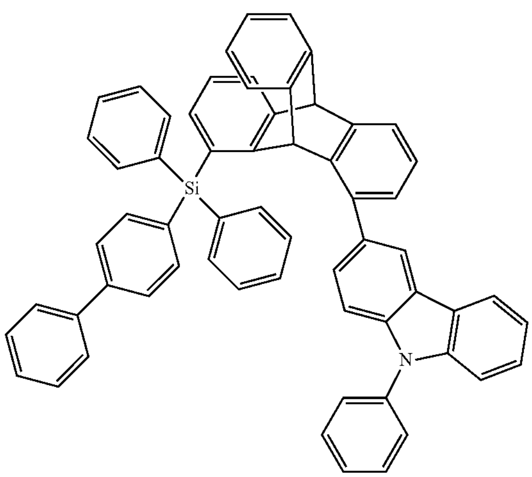
A-176
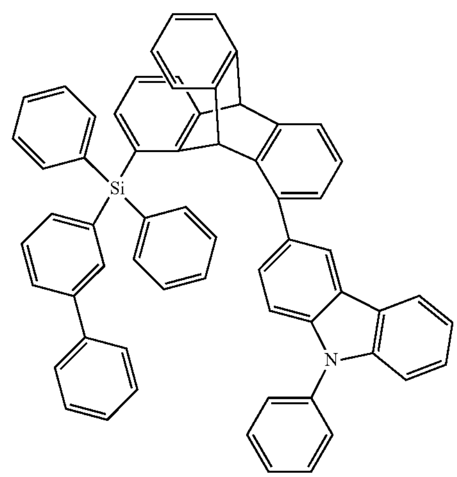

-continued
A-177
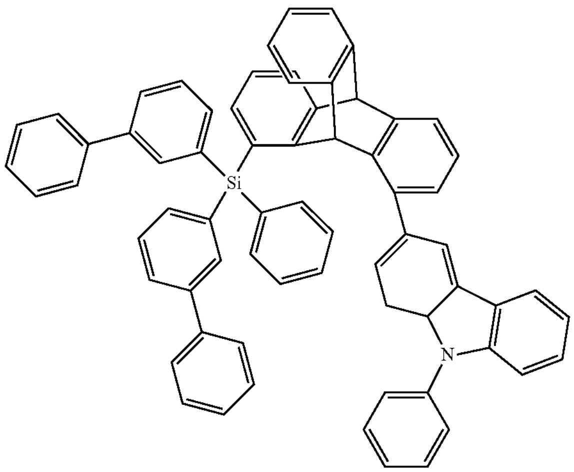
A-178
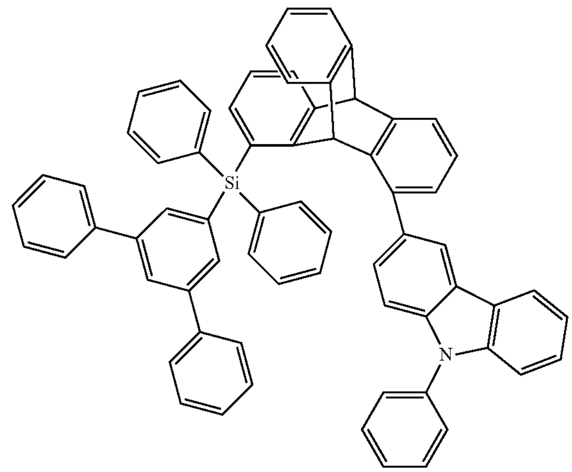
A-179
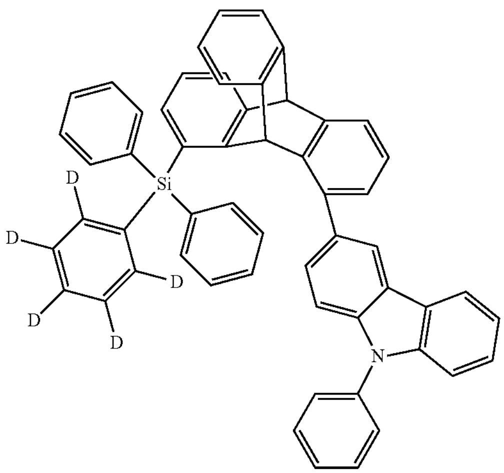
A-180
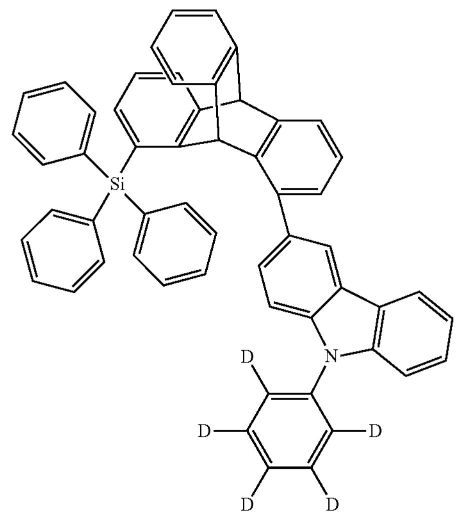
A-181
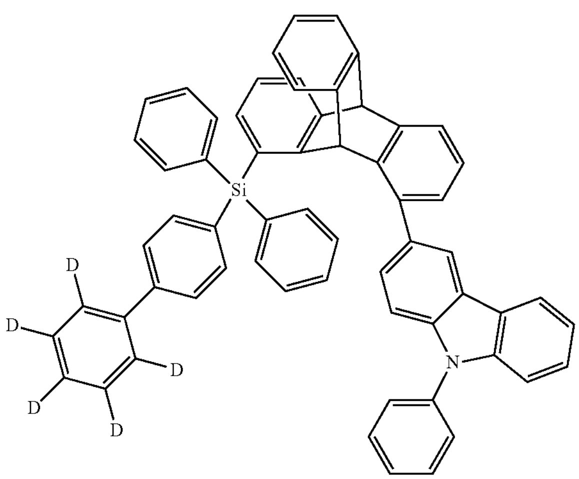
A-182
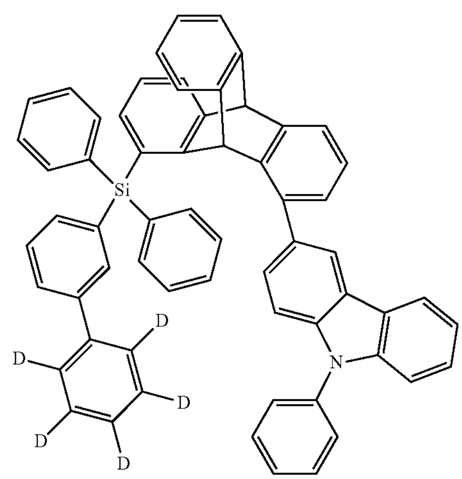

-continued
A-183
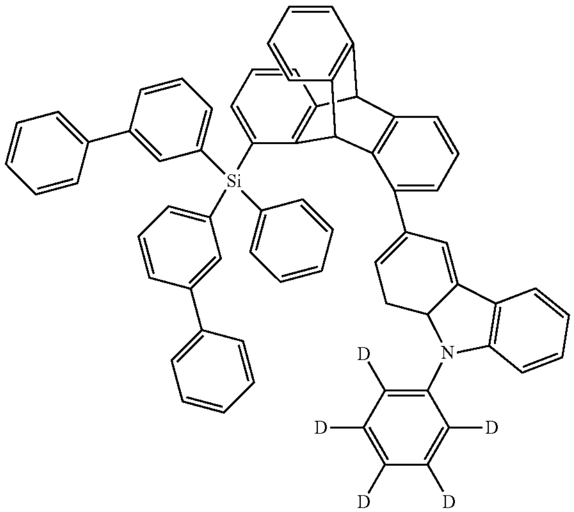
A-184
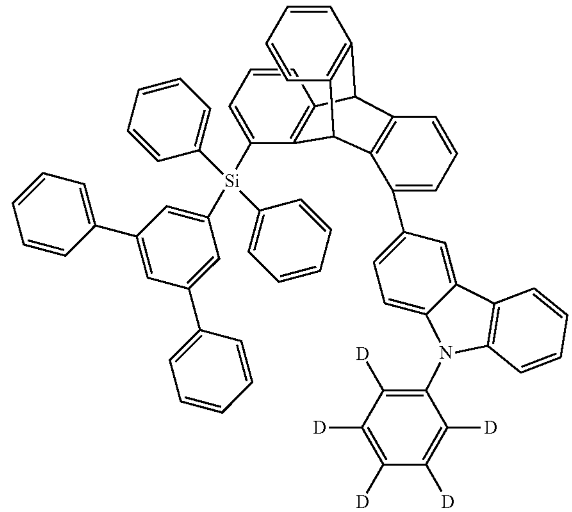
A-185
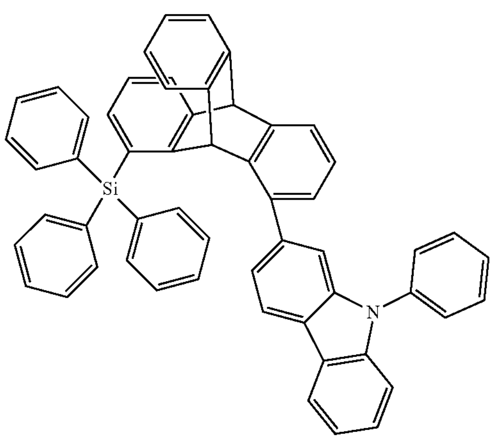
A-186
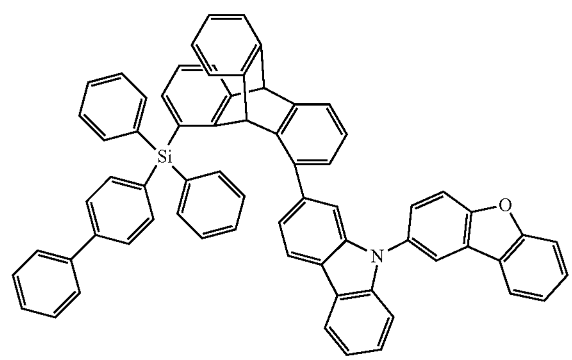
A-187
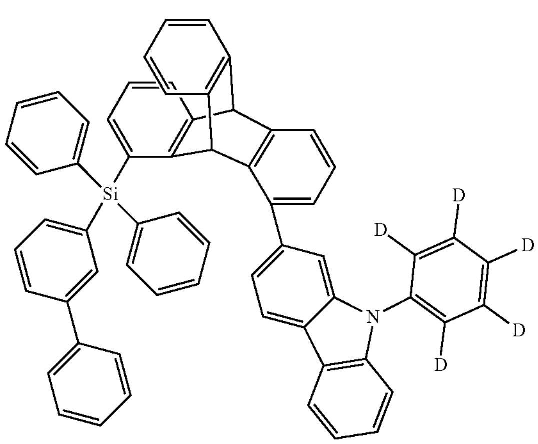
A-188
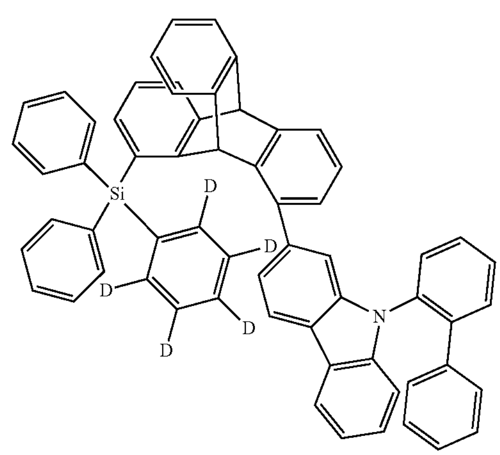

-continued
A-189
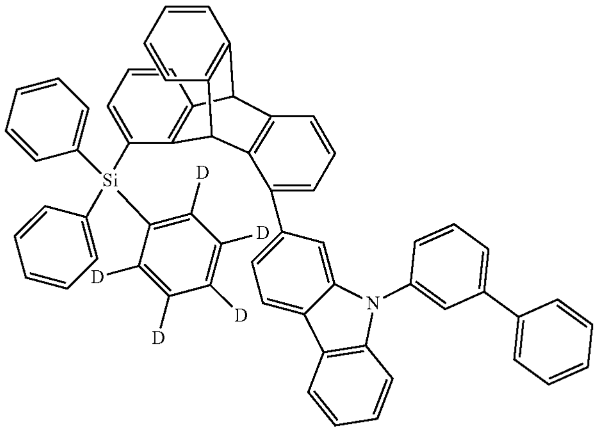
A-190
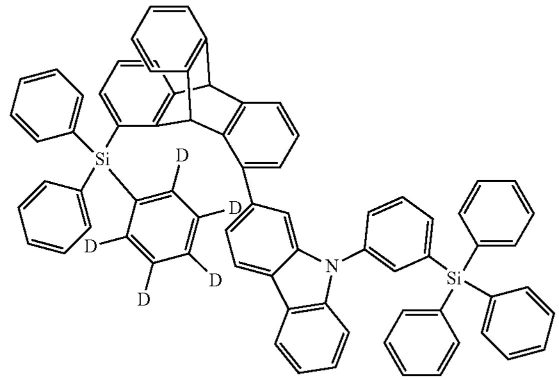
A-191
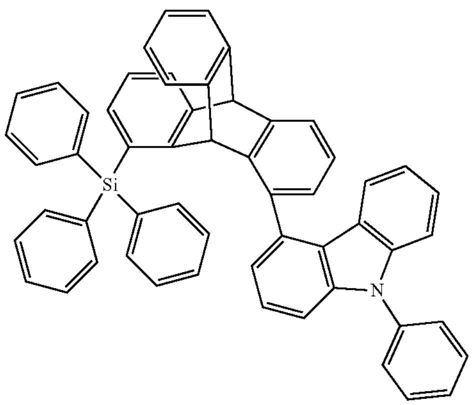
A-192
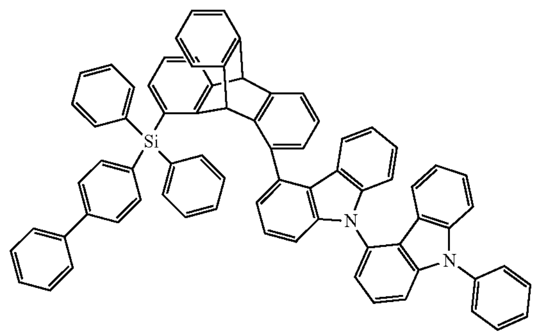
A-193
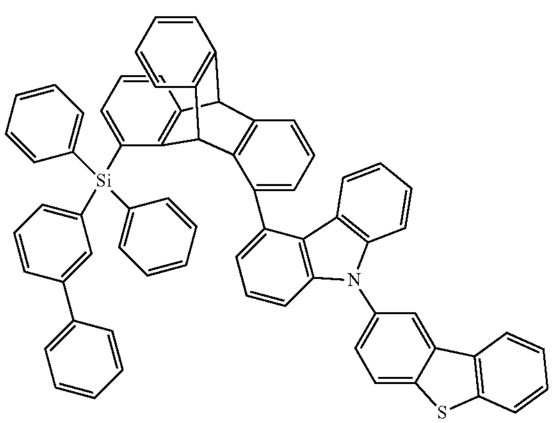
A-194
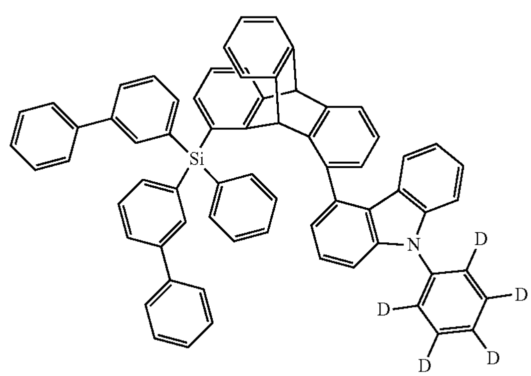

-continued
A-195
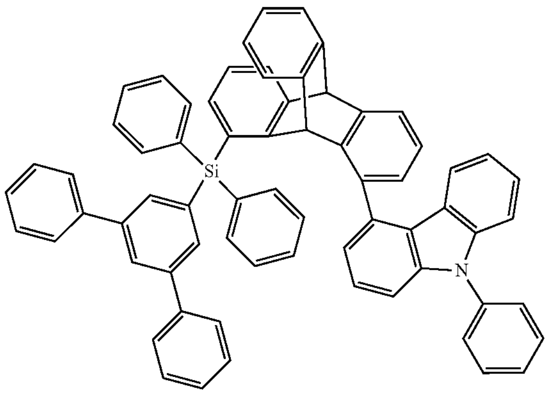
A-196
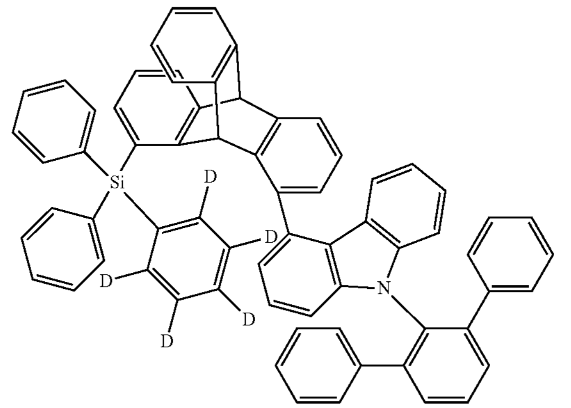
A-197
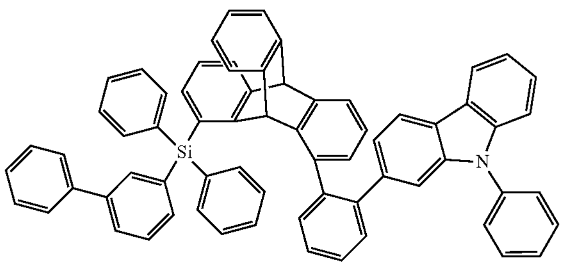
A-198
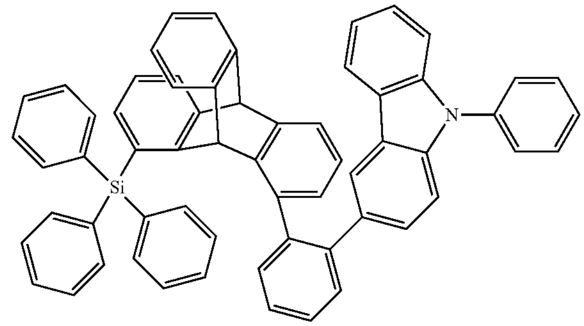
A-199
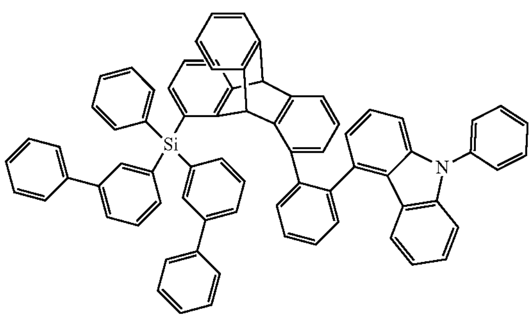
A-200
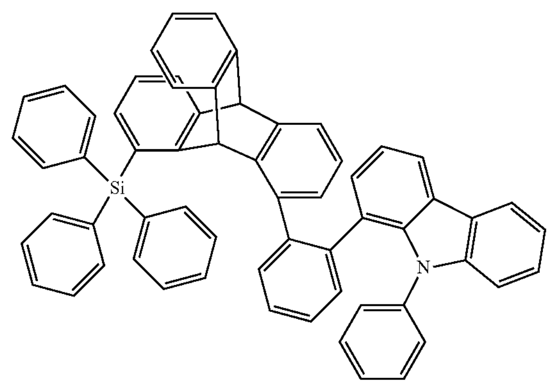
A-201
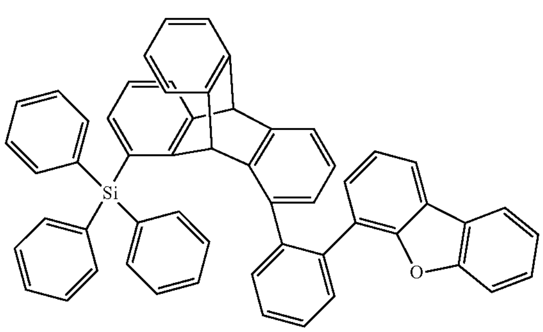
A-202
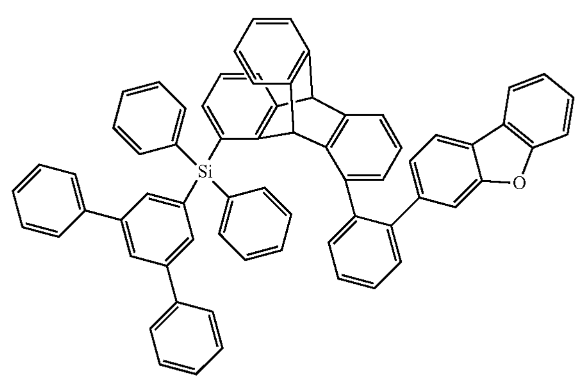

-continued
A-203
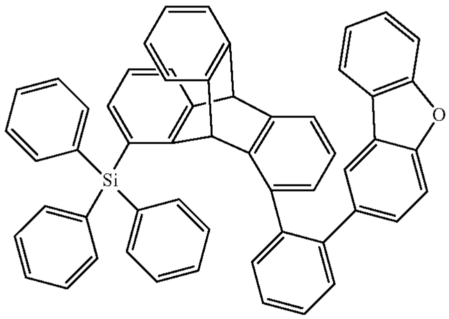
A-204
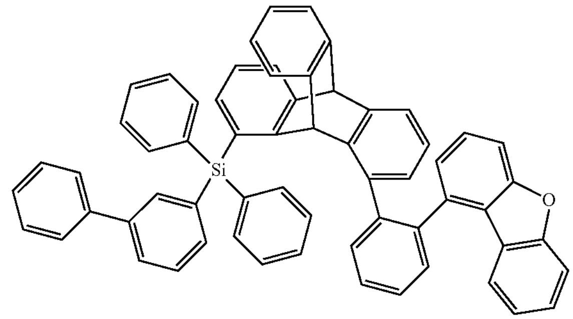
A-205
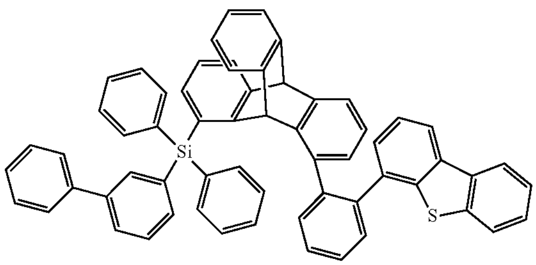
A-206
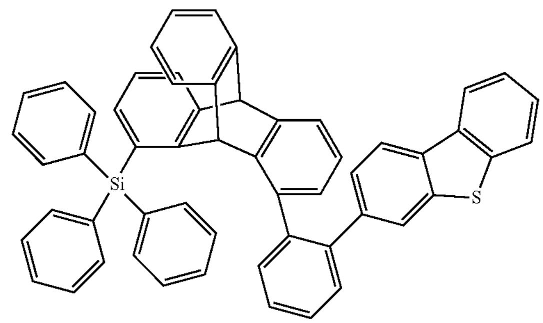
A-207
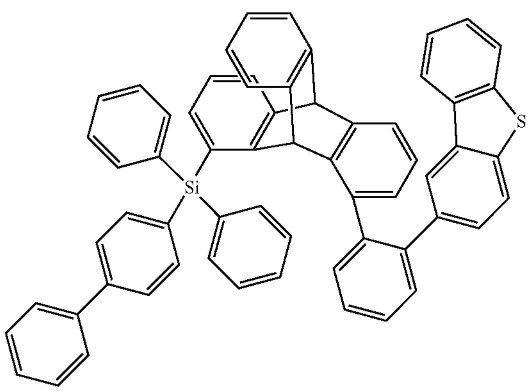
A-208
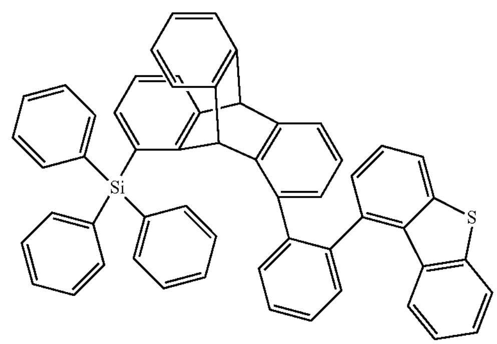
A-209
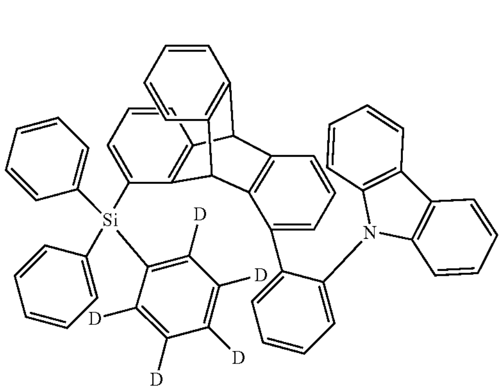
A-210
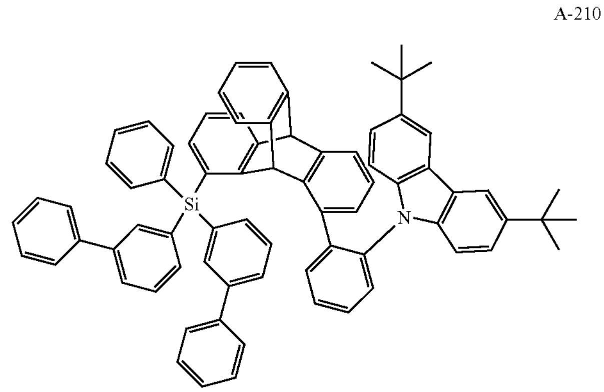

-continued
A-211
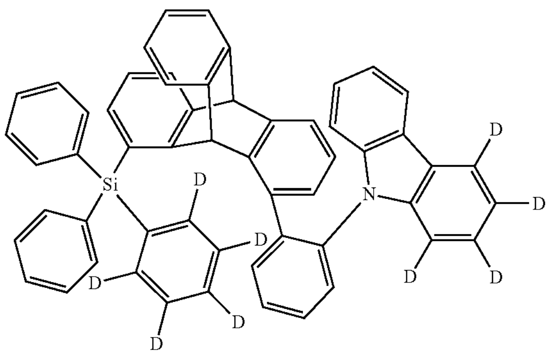
A-212
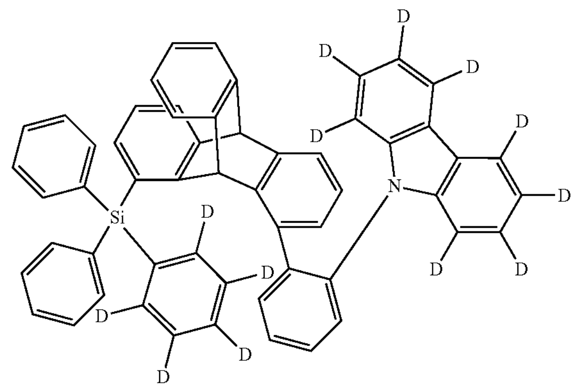
A-213
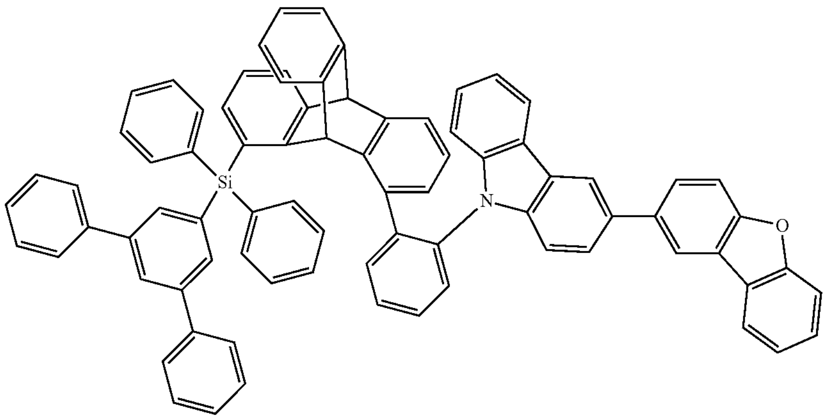
A-214
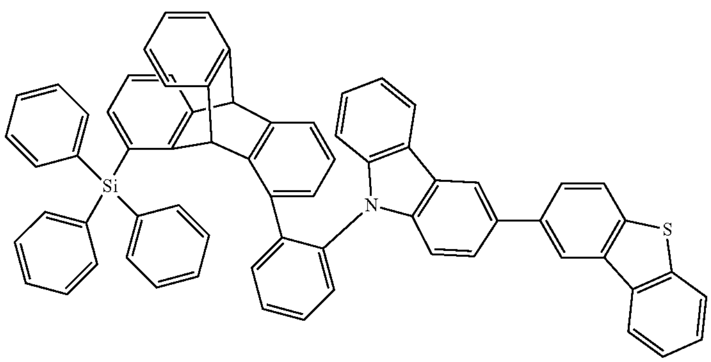
A-215
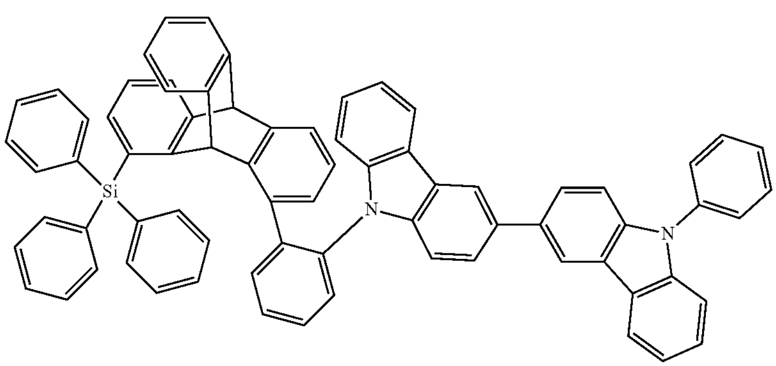

-continued
A-216
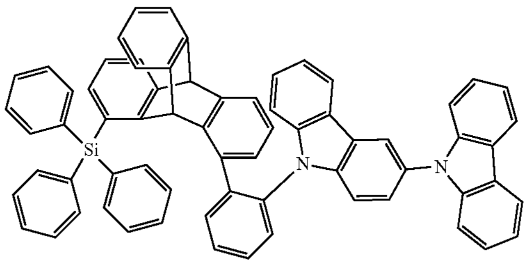
A-217
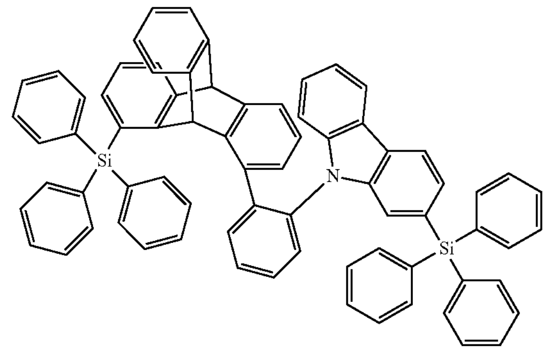
A-218
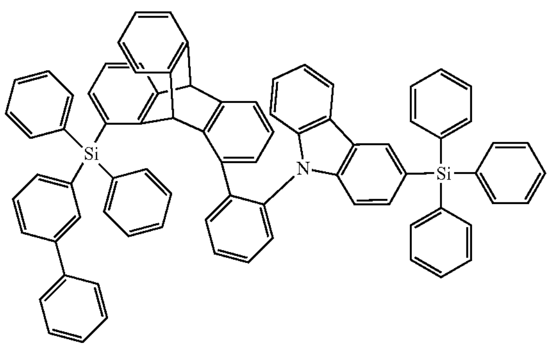
A-219
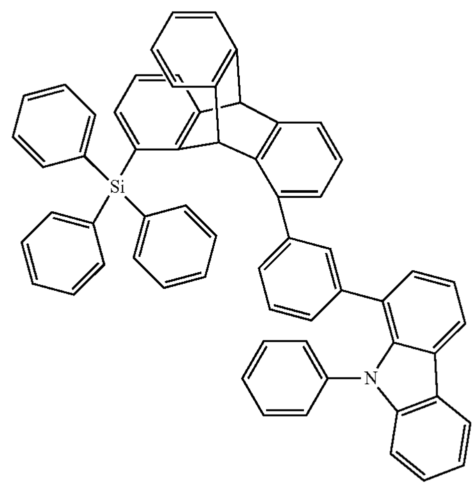
A-220
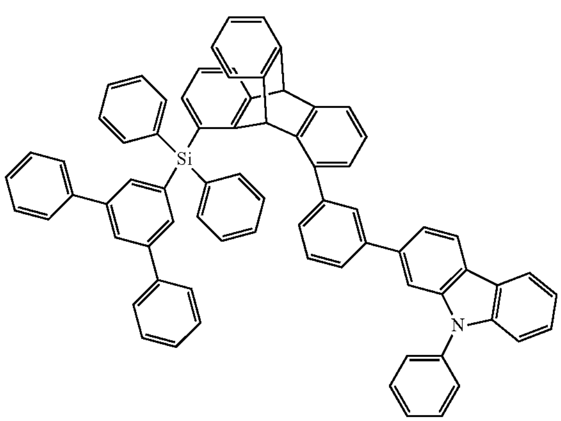
A-221
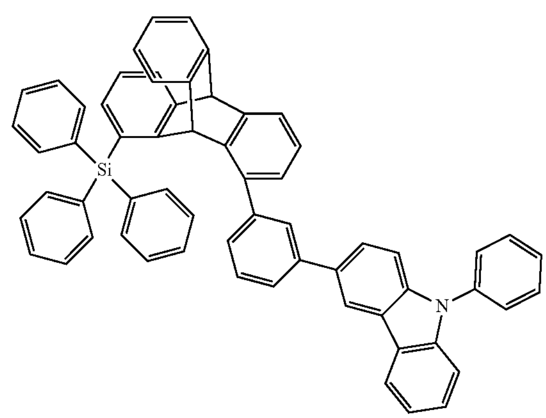

-continued
A-222
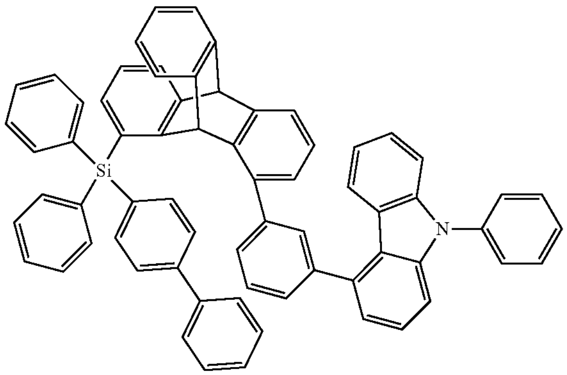
A-223
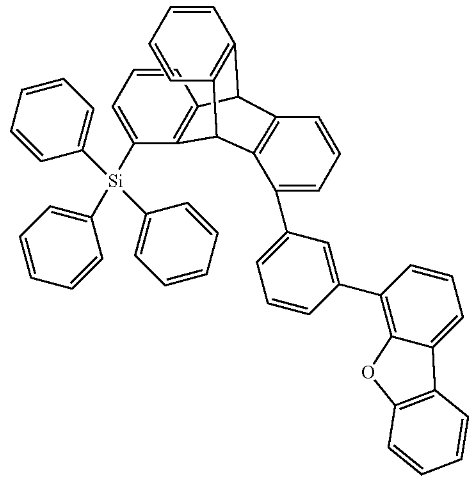
A-224
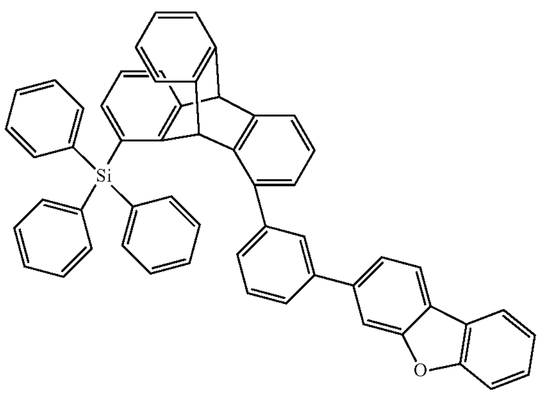
A-225
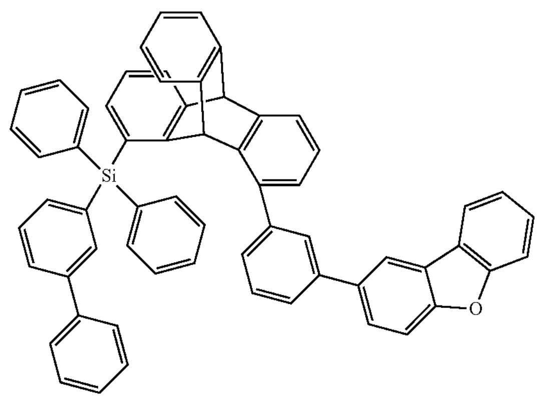
A-226
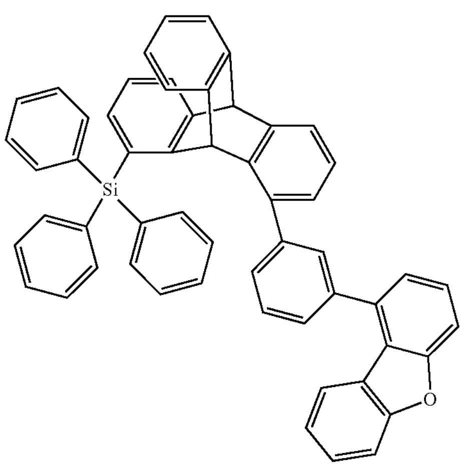
A-227
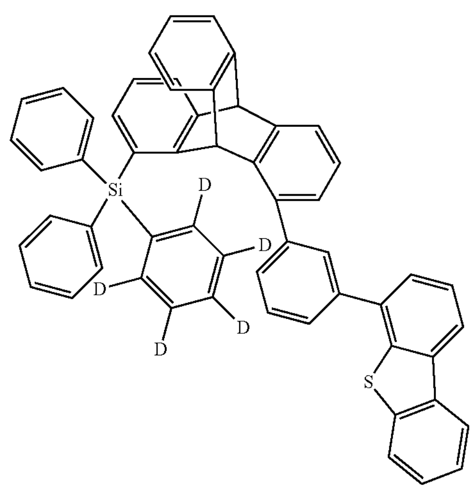

-continued
A-228
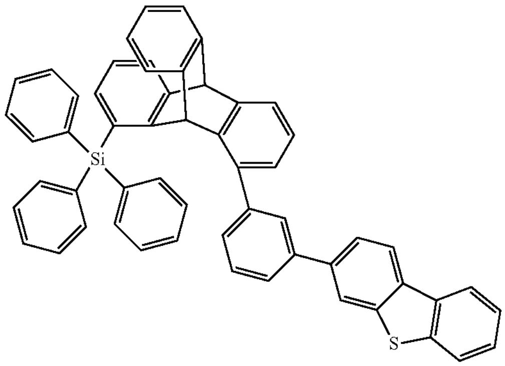
A-229
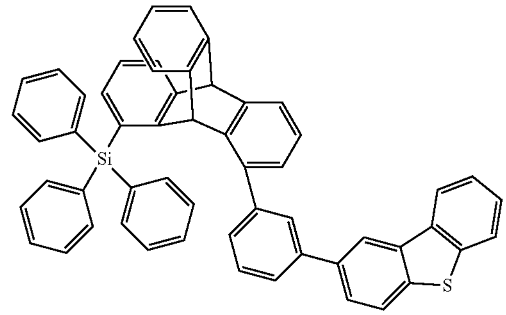
A-230
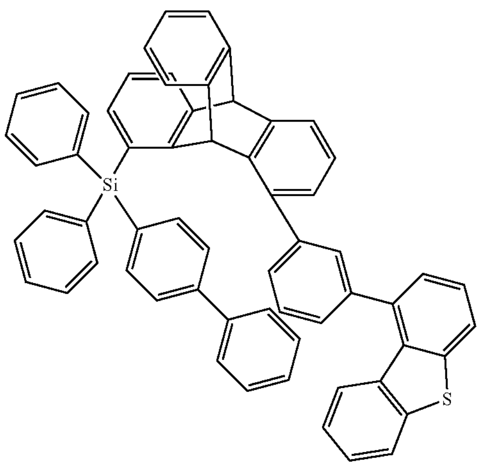
A-231
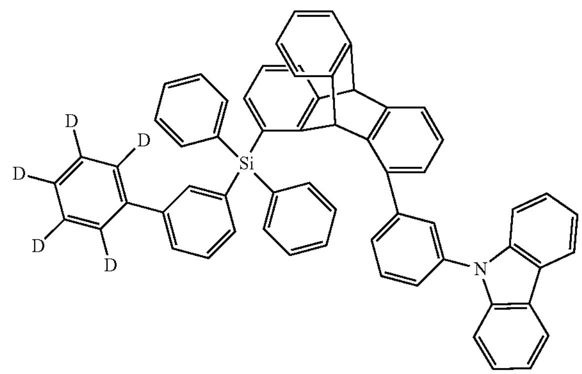
A-232
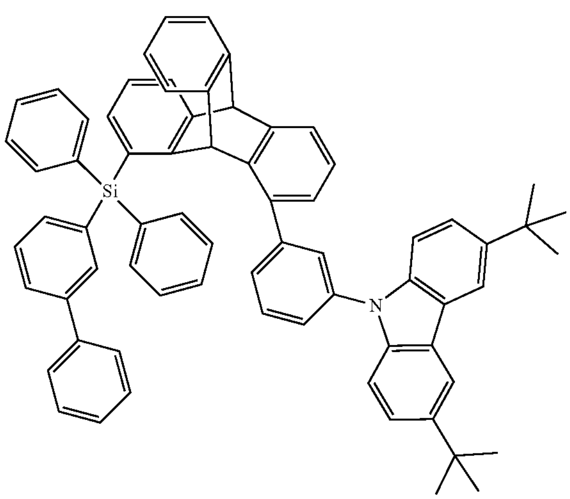
A-233
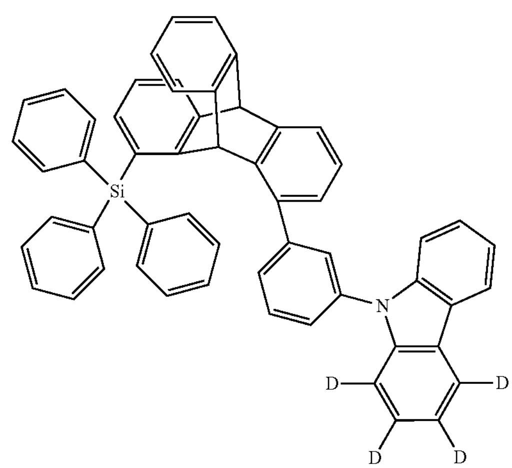

-continued
A-234
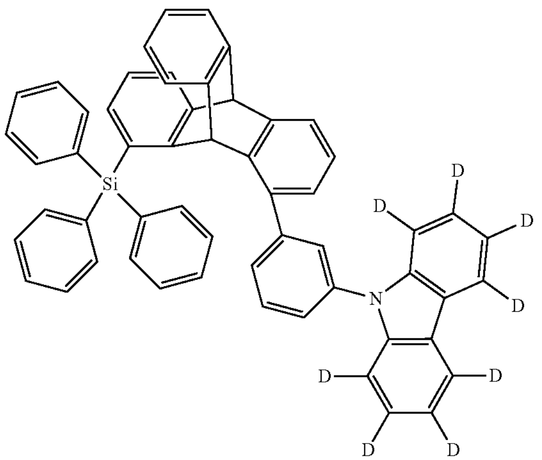
A-235
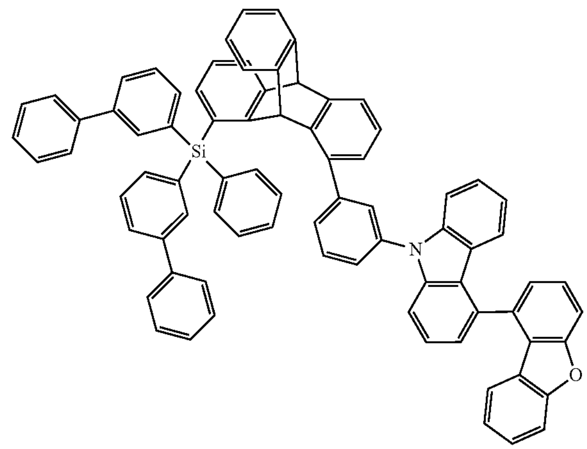
A-236
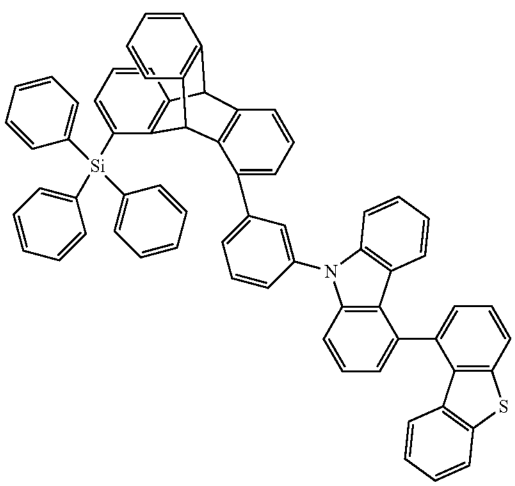
A-237
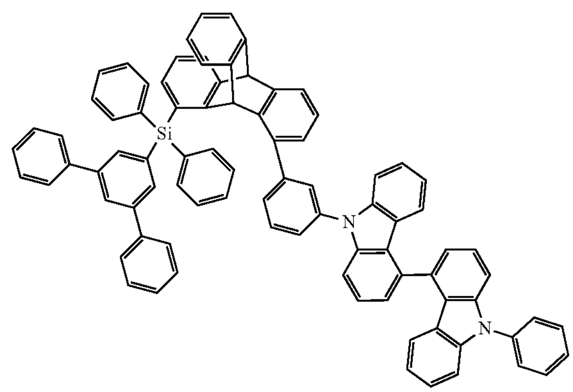
A-238
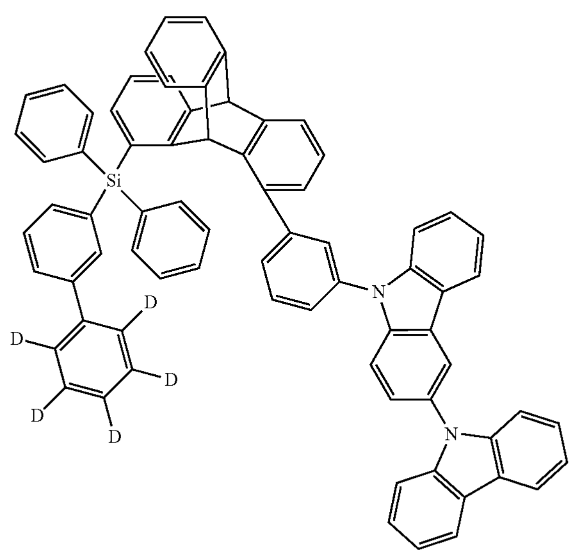
239
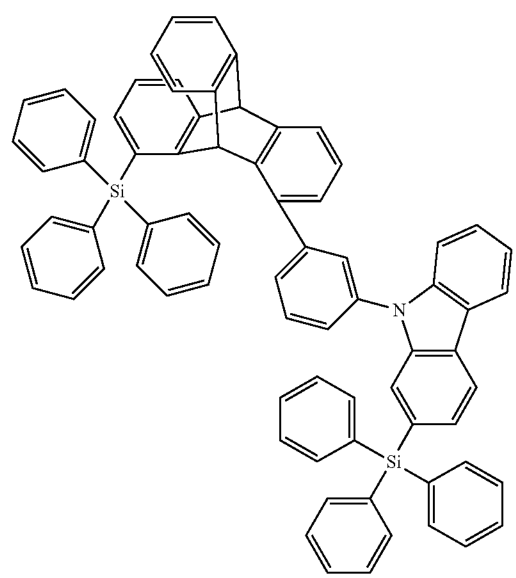

-continued
240
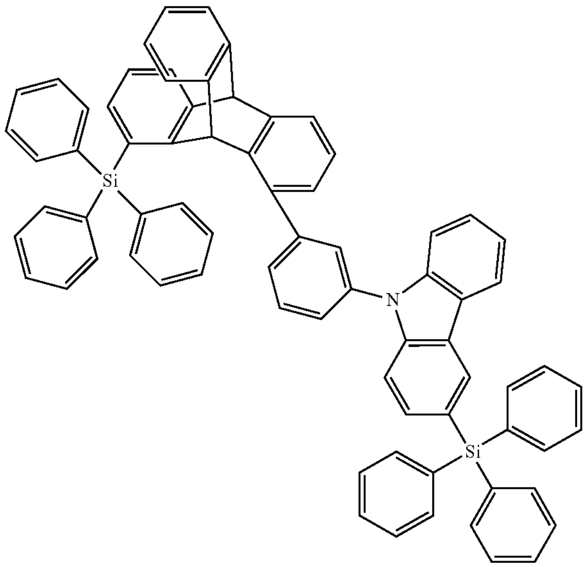
C-1
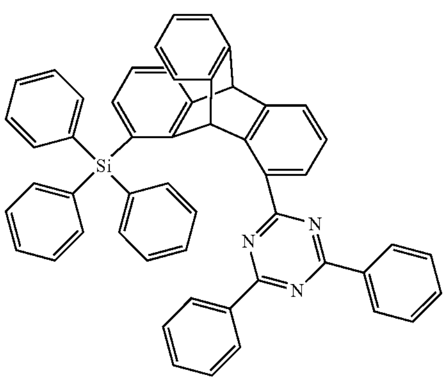
C-2
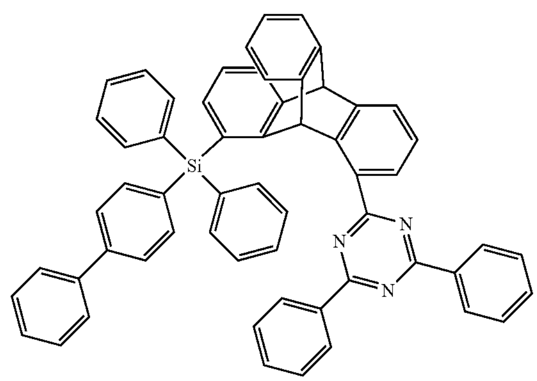
C-3
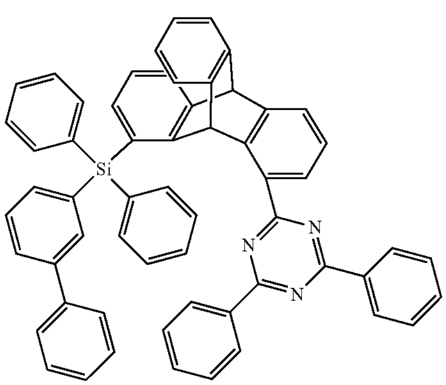
C-4
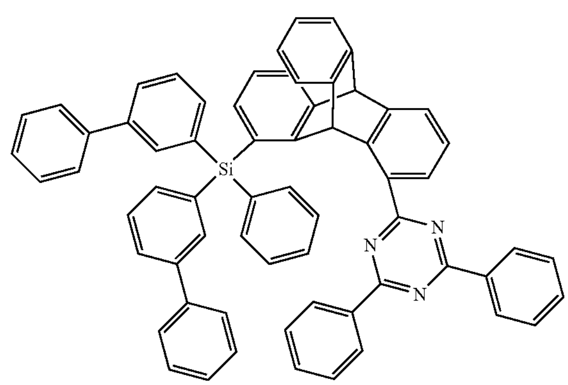

-continued
C-5
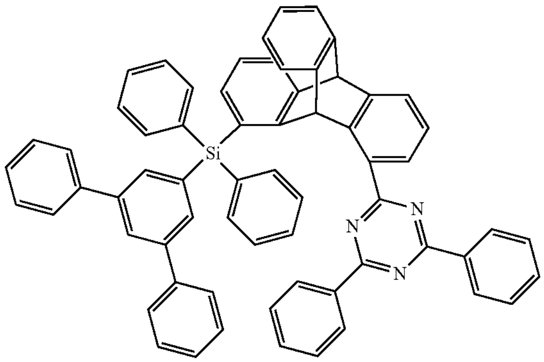
C-6
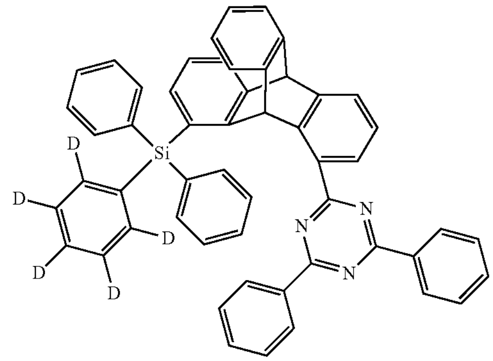
C-7
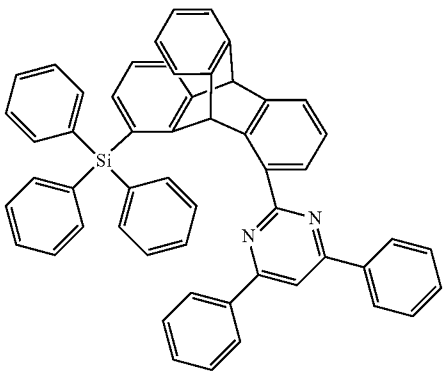
C-8
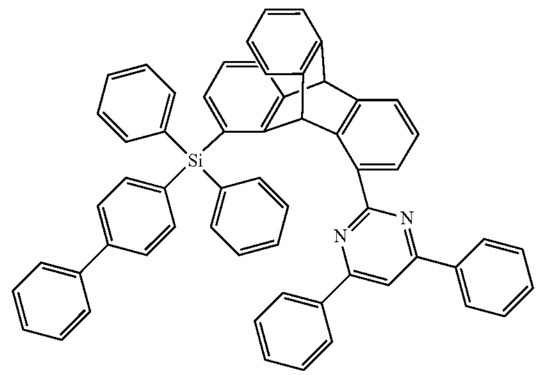
C-9
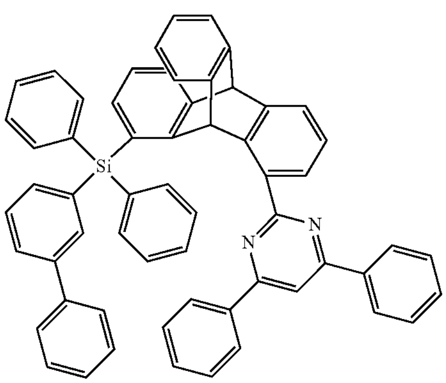
C-10
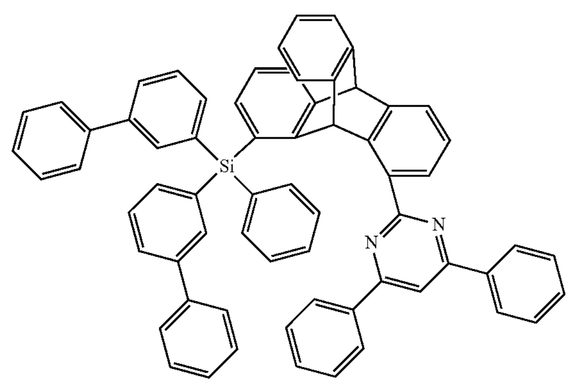
C-11
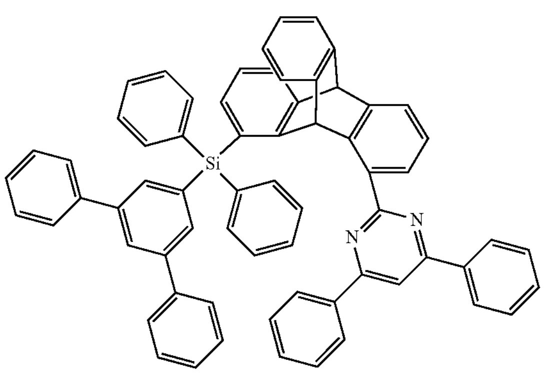
C-12
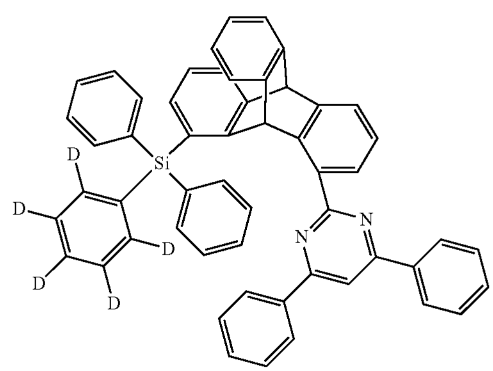

-continued
C-13
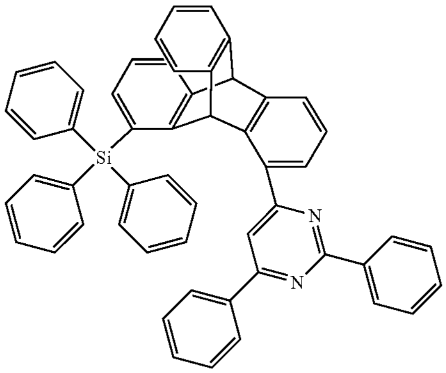
C-14
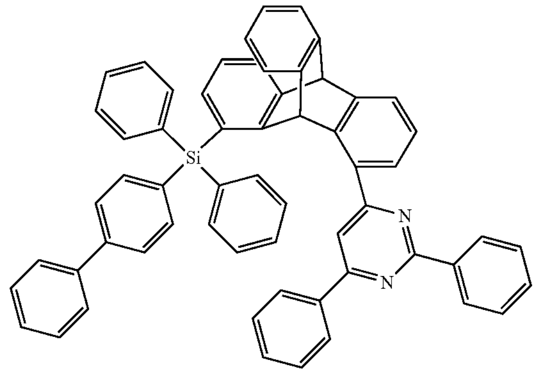
C-15
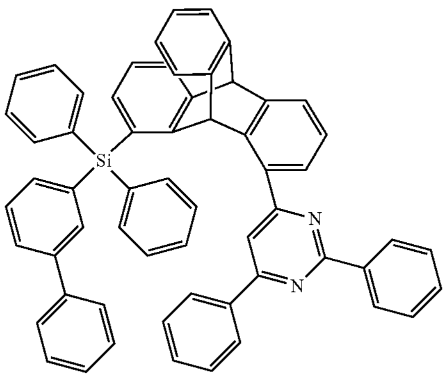
C-16
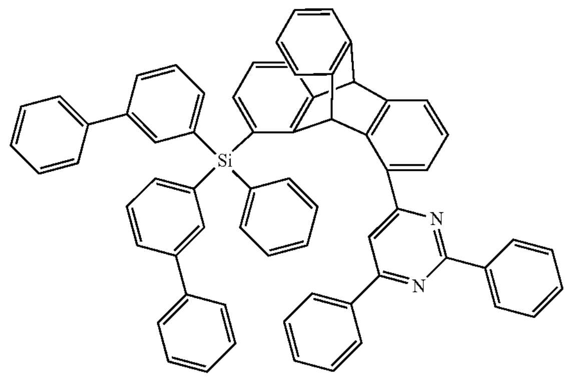
C-17
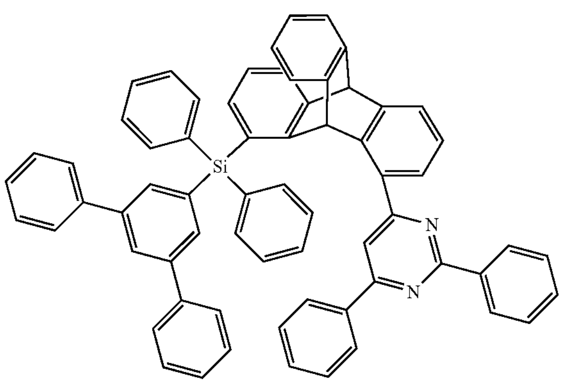
C-18
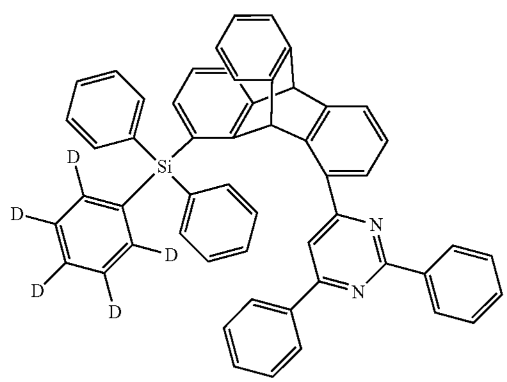
C-19
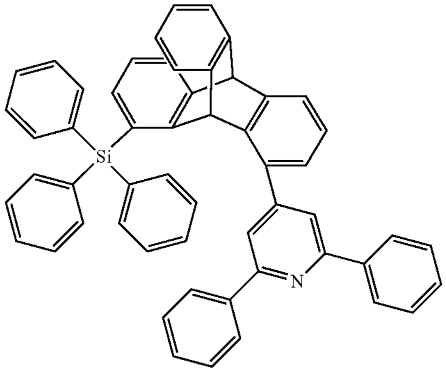
C-20
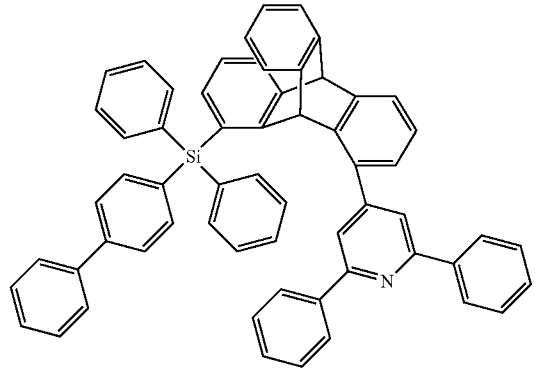

-continued
C-21
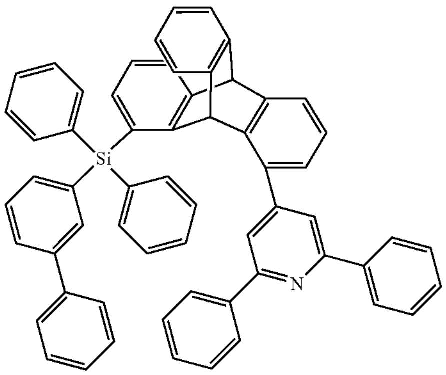
C-22
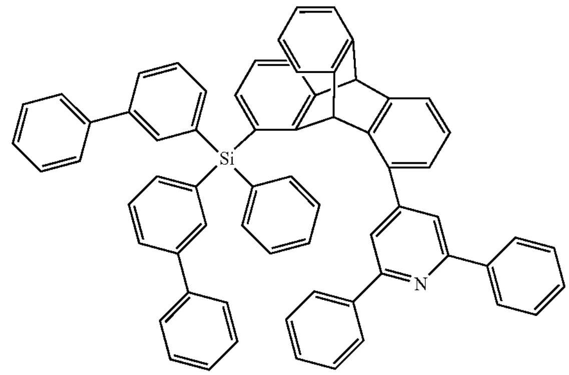
C-23
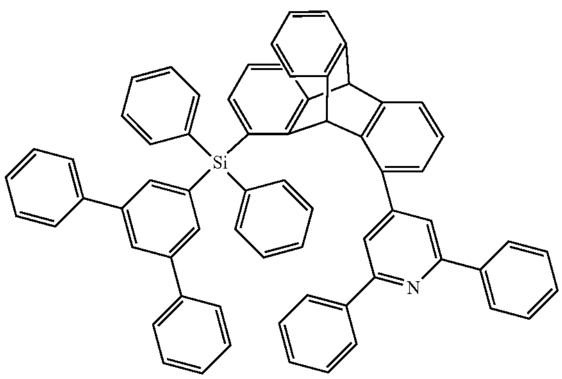
C-24
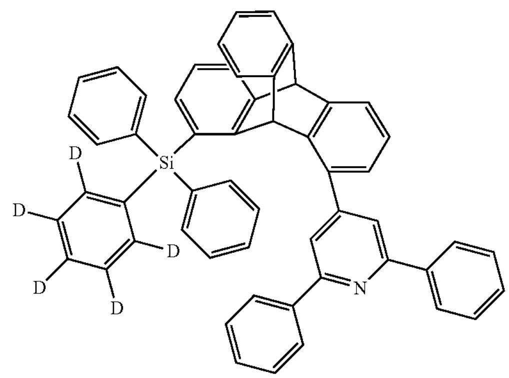
C-25
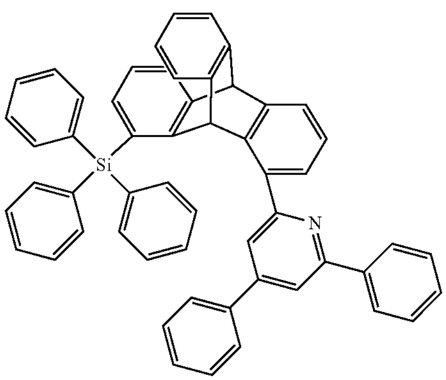
C-26
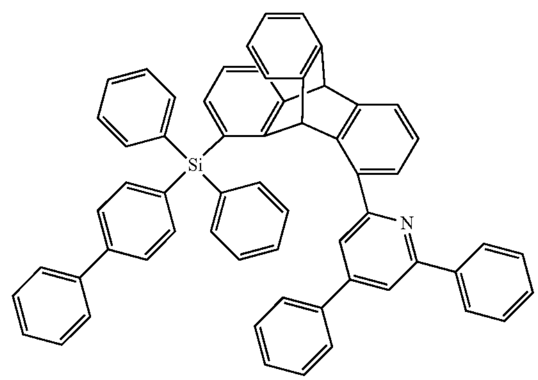
C-27
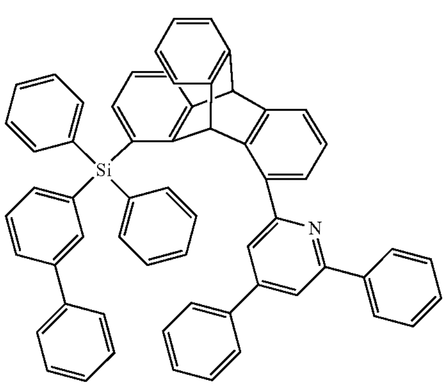
C-28
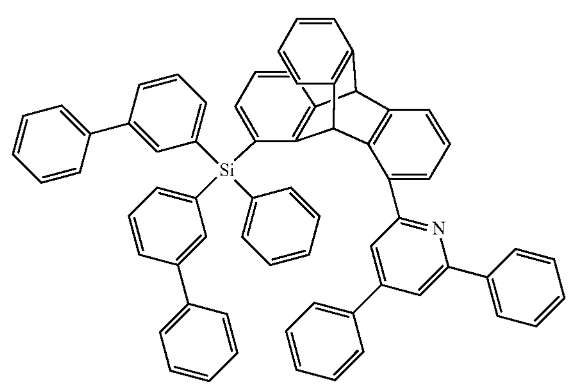

-continued
C-29
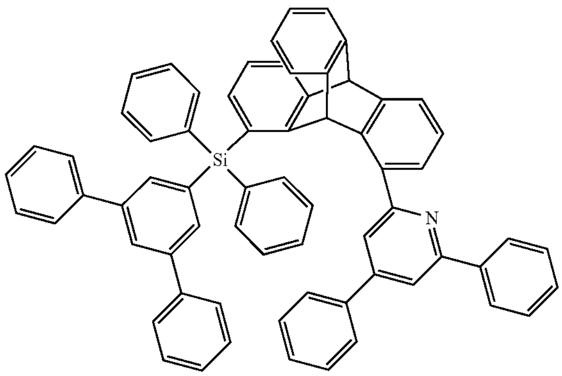
C-30
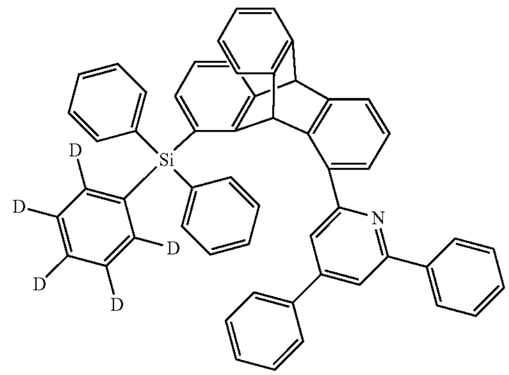
C-31
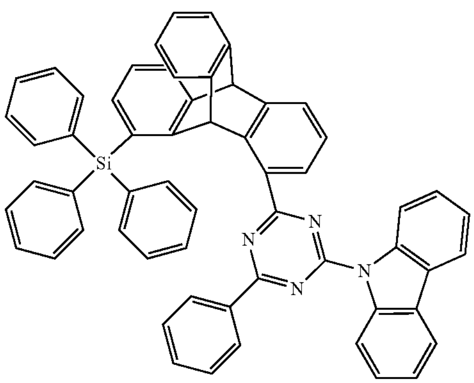
C-32
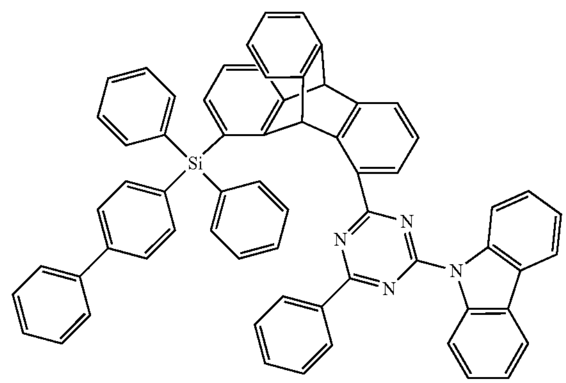
C-33
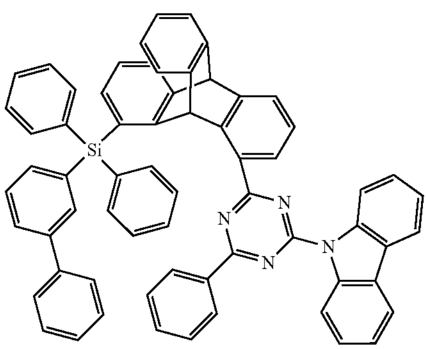
C-34
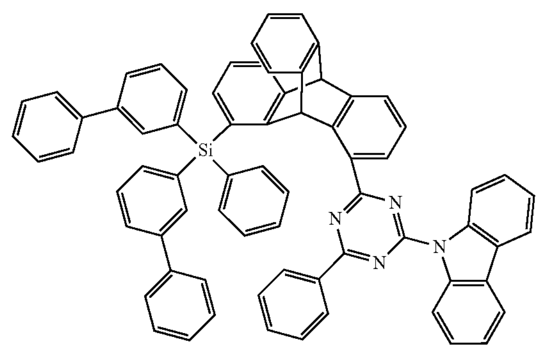
C-35
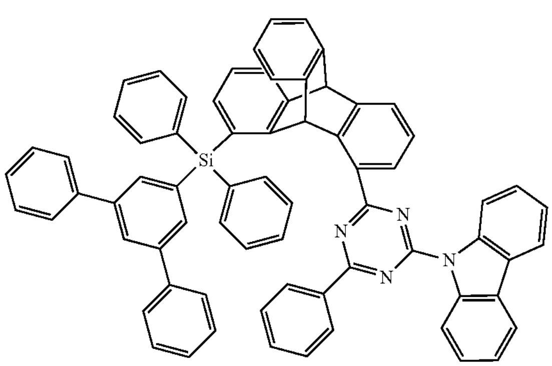
C-36
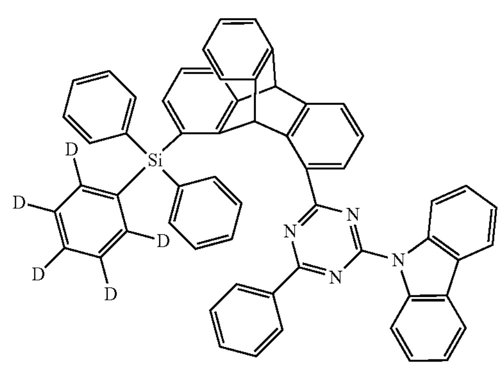

-continued
C-37
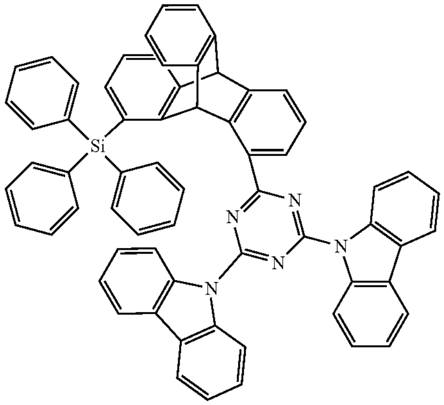
C-38
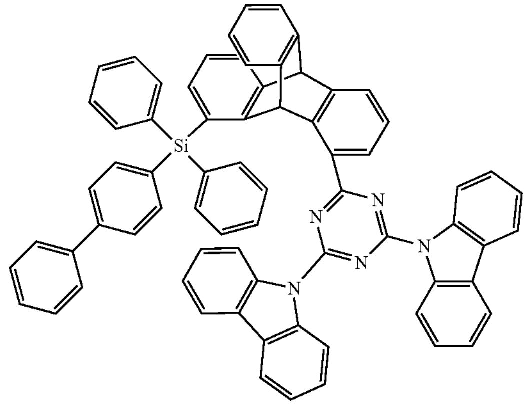
C-39
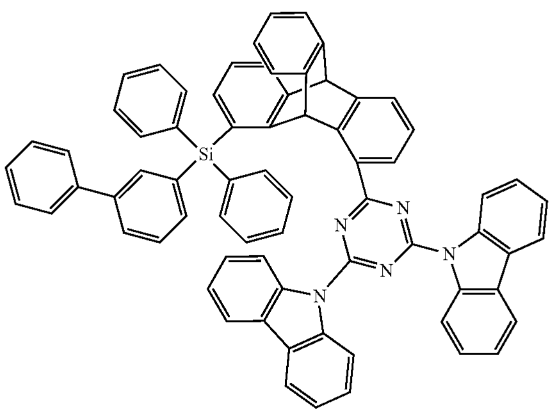
C-40
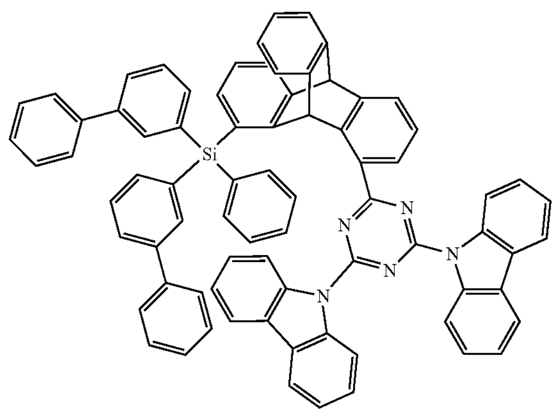
C-41
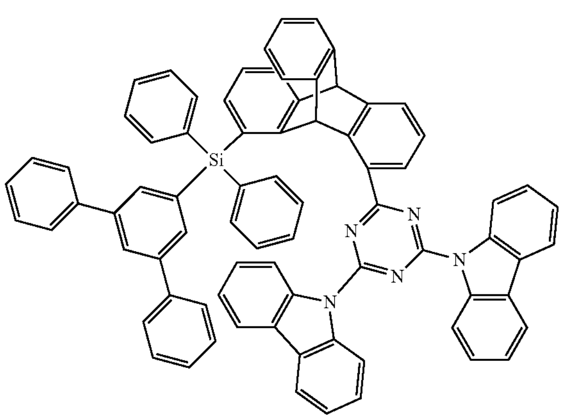
C-42
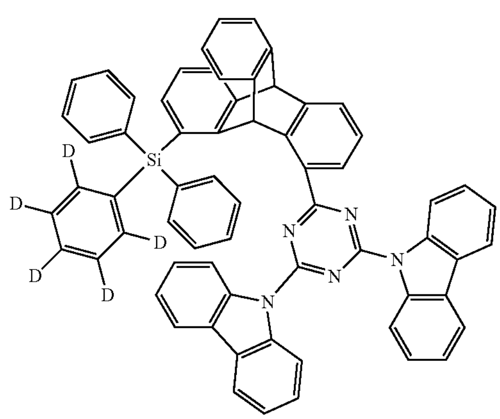

-continued
C-43
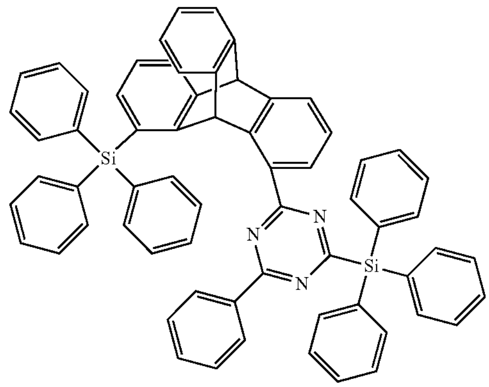
C-44
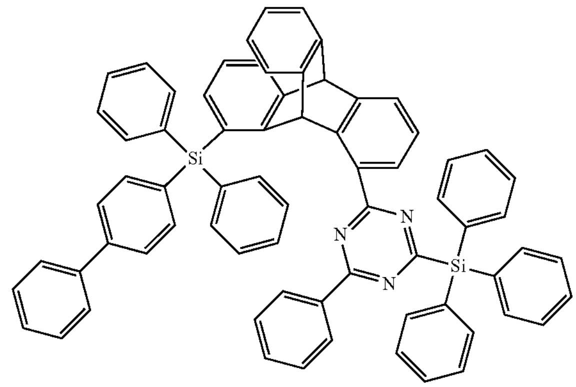
C-45
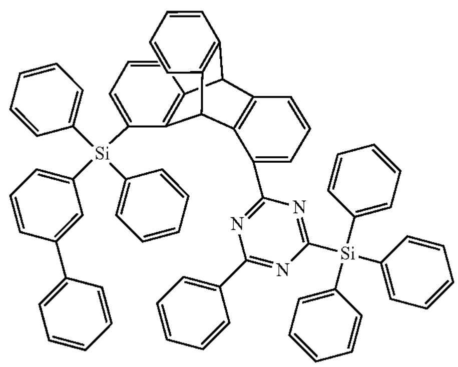
C-46
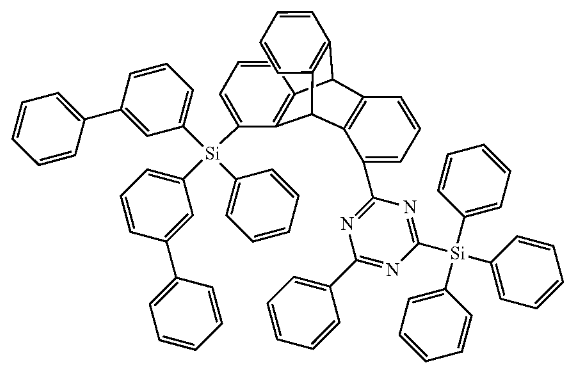
C-47
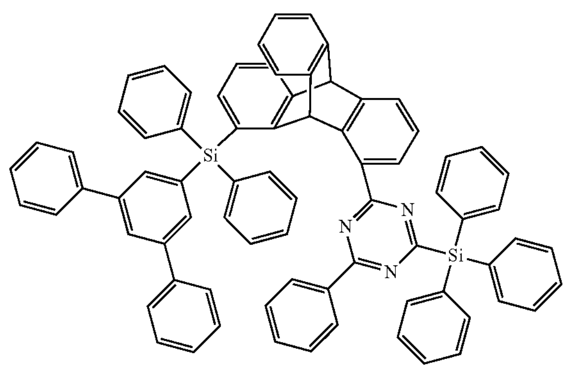
C-48
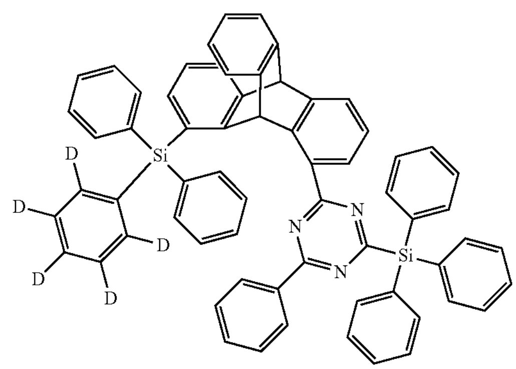
C-49
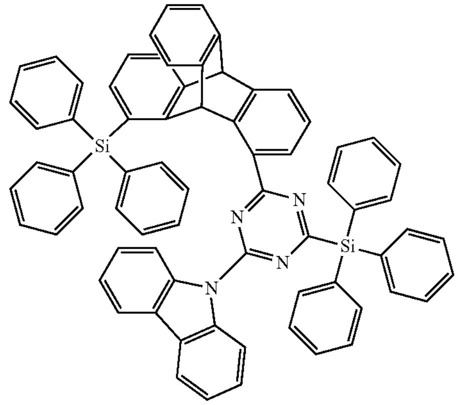
C-50
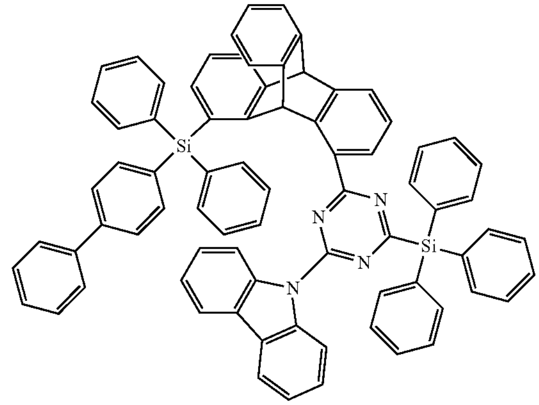

-continued
C-51
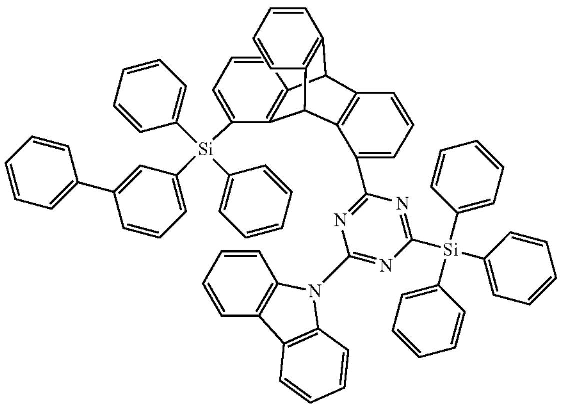
C-52
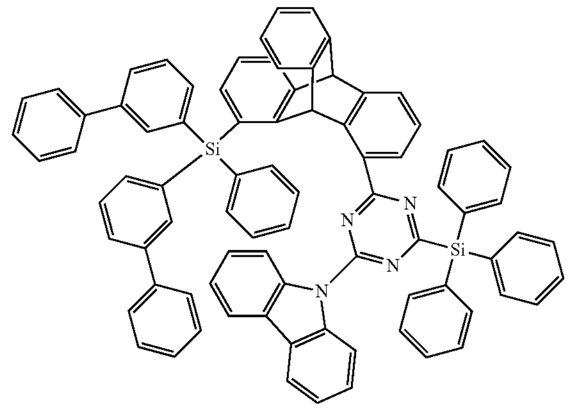
C-53
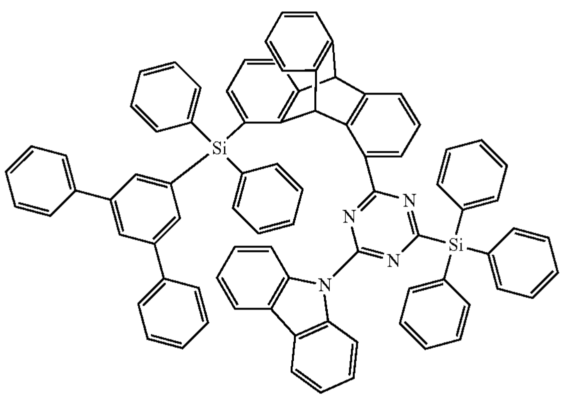
C-54
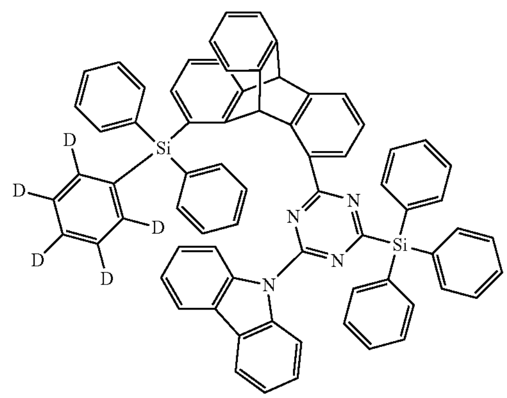
C-55
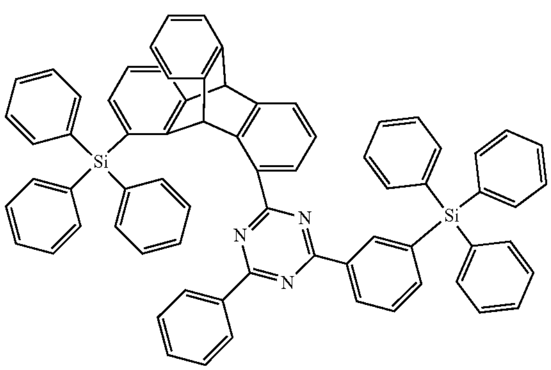
C-56
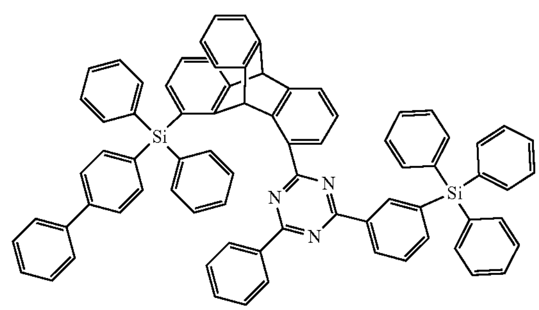
C-57
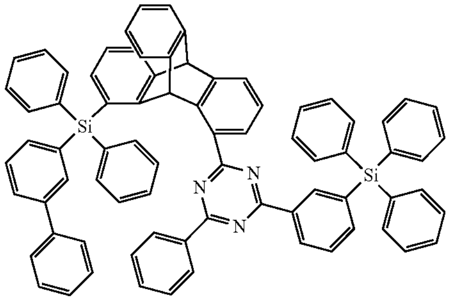
C-58
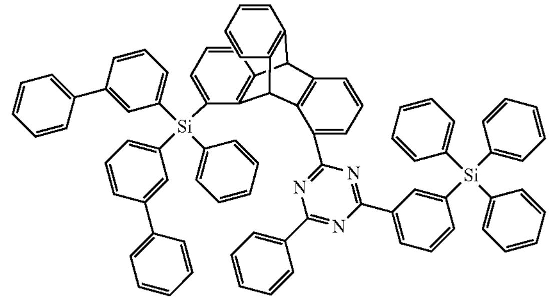

-continued
C-59
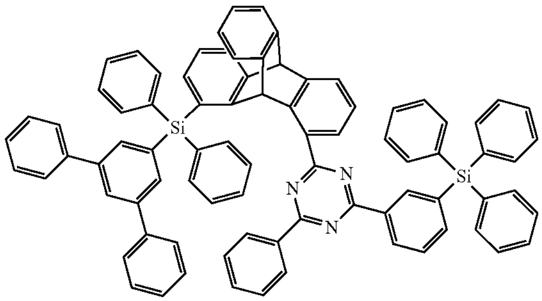
C-60
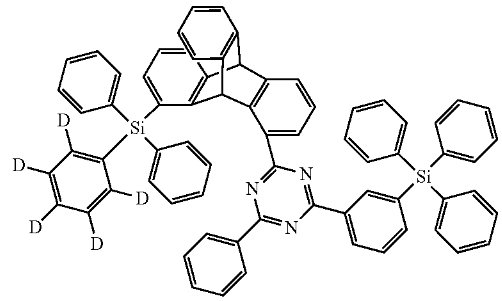
C-61
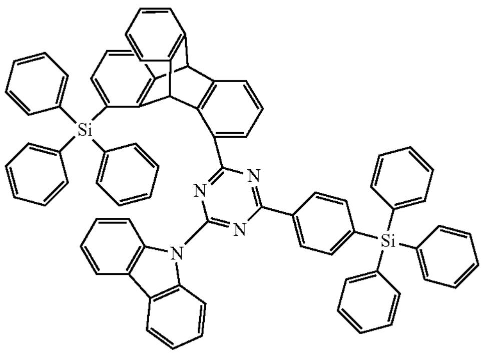
C-62
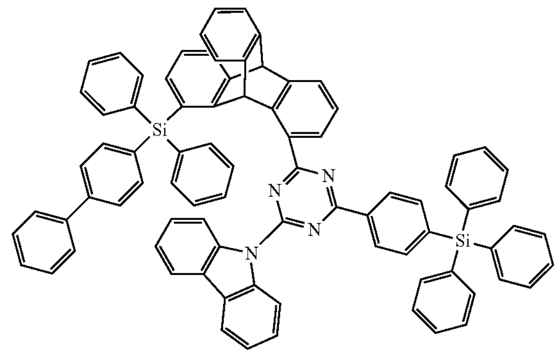
C-63
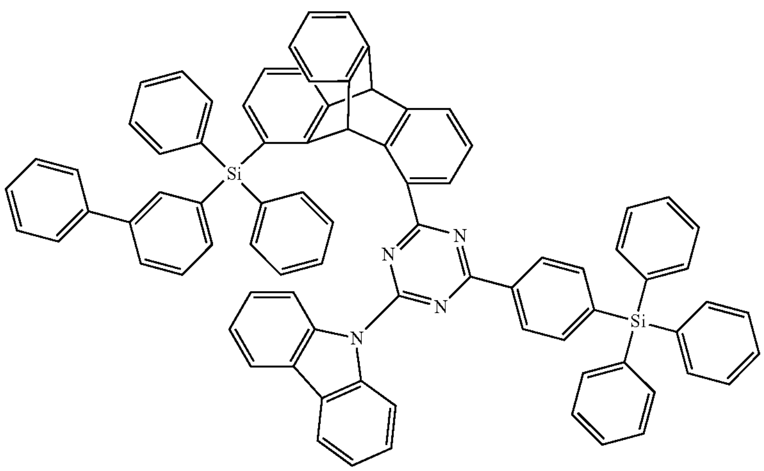
C-64
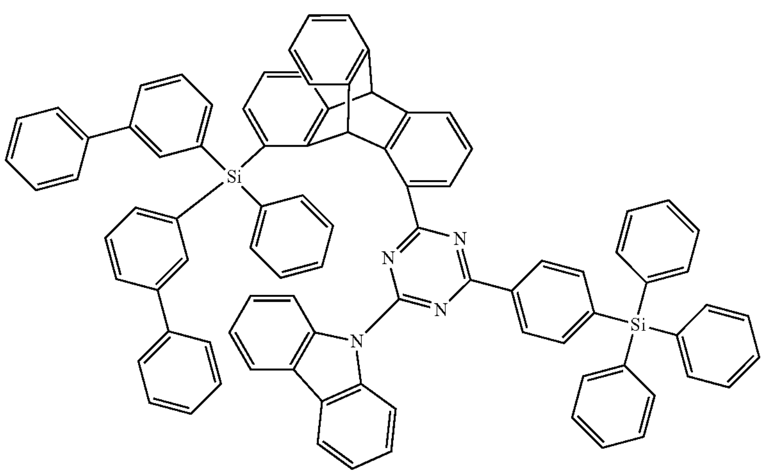

-continued
C-65
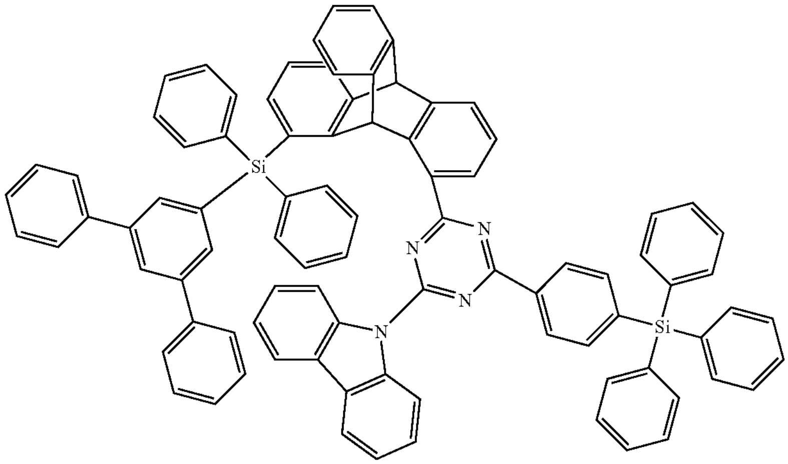
C-66
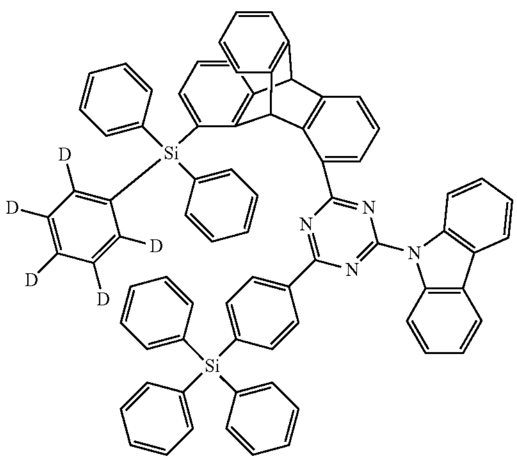
C-67
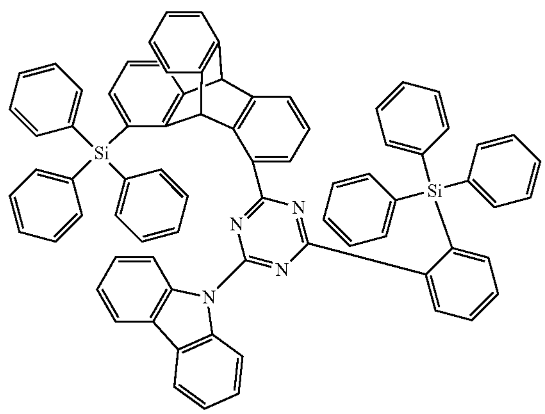
C-68
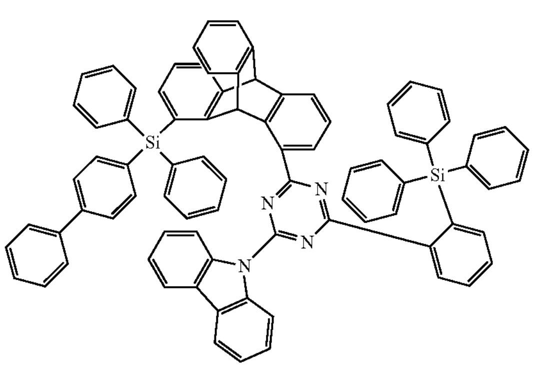
C-69
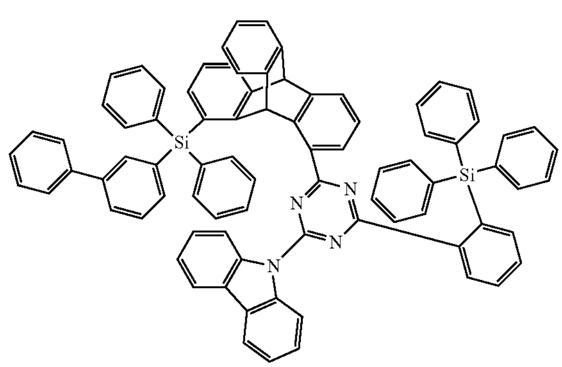

-continued
C-70
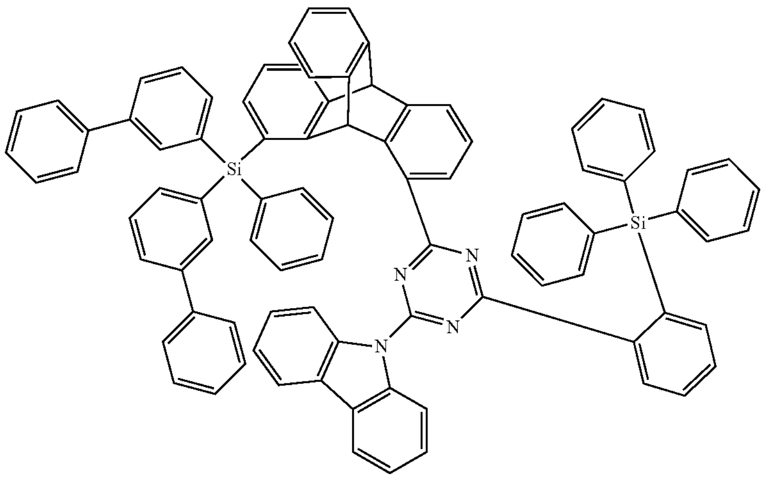
C-71
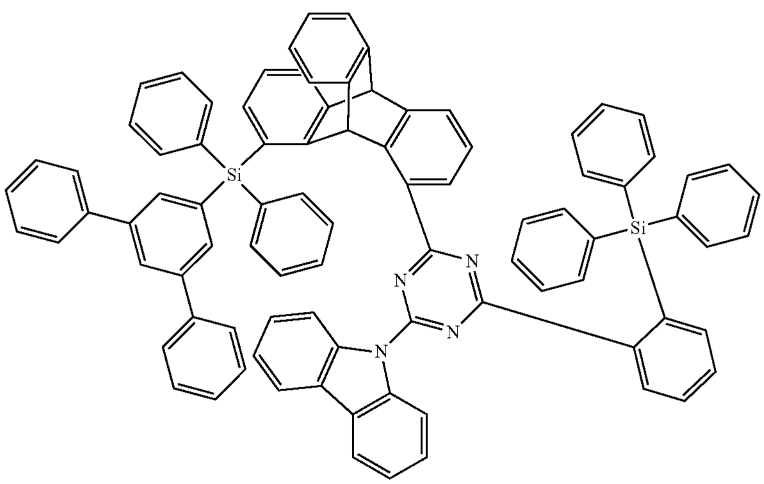
C-72
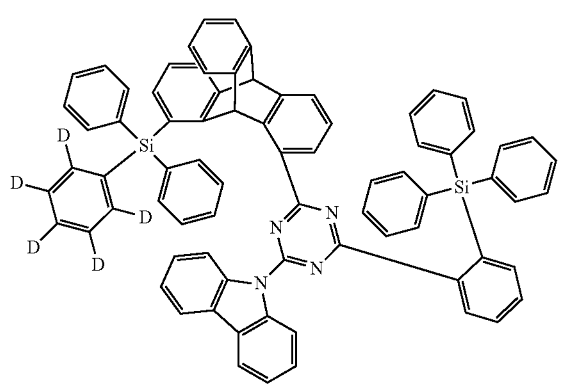
C-73
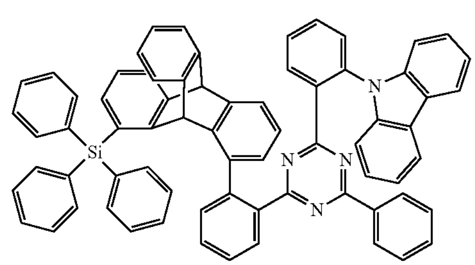

-continued
C-74
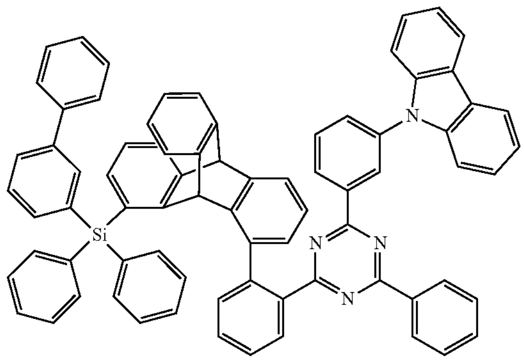
C-75
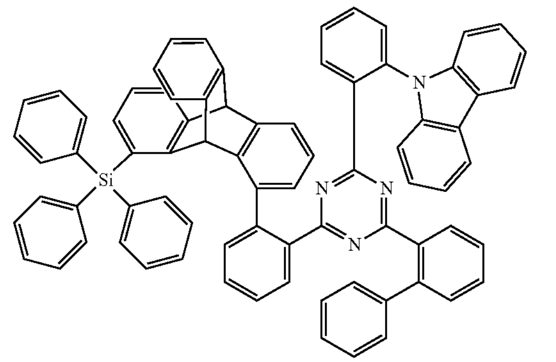
C-76
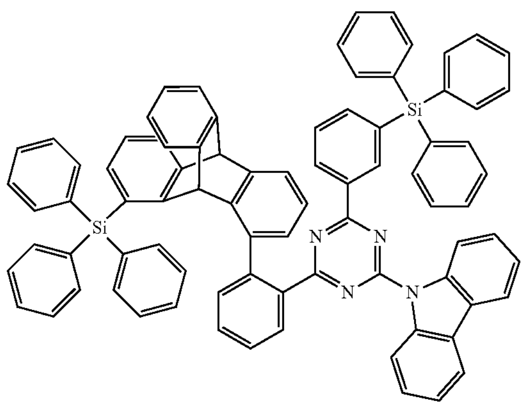
C-77
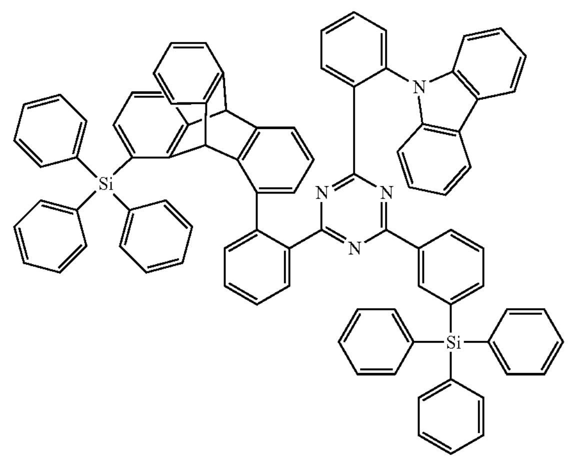
C-78
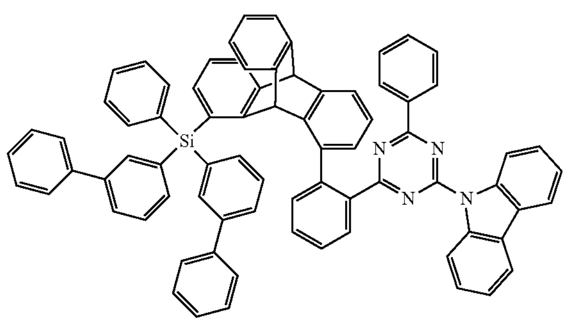
C-79
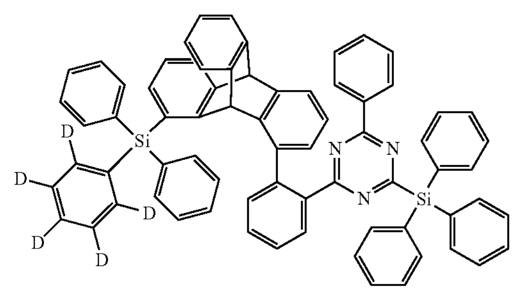
C-80
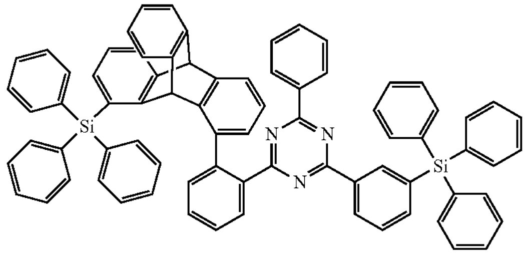
C-81
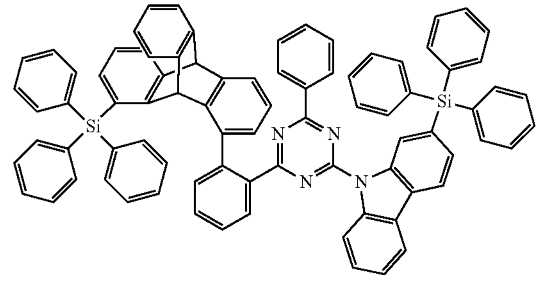

-continued
C-82
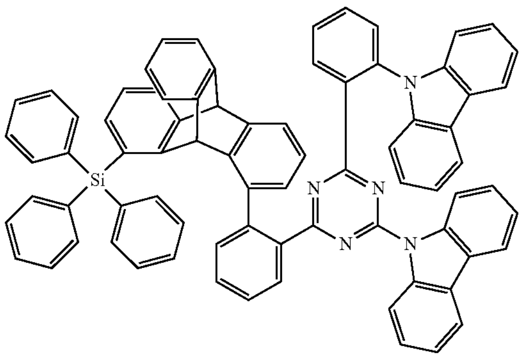
C-83
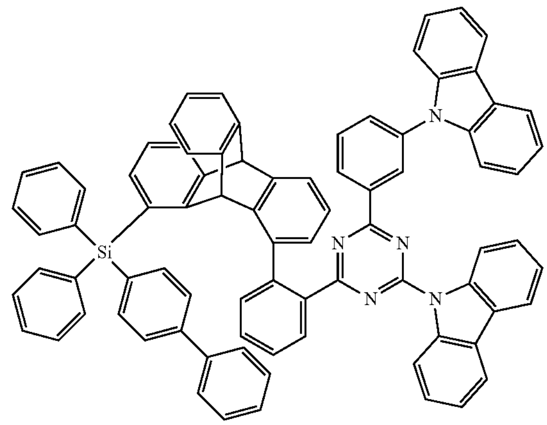
C-84
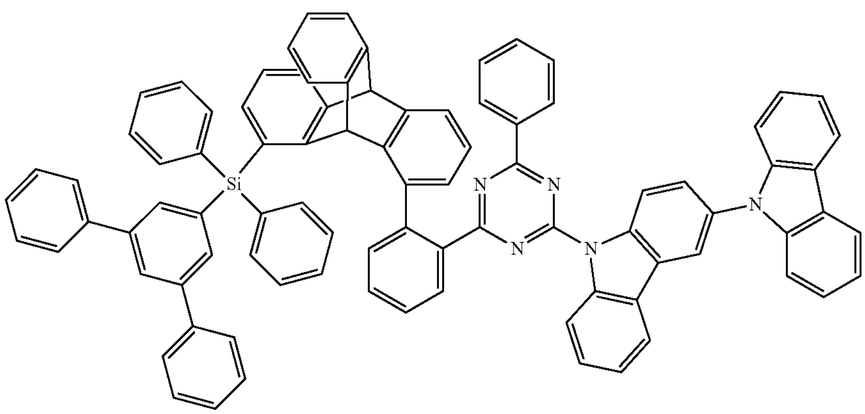
C-85
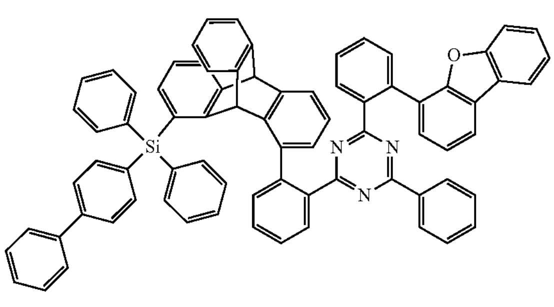
C-86
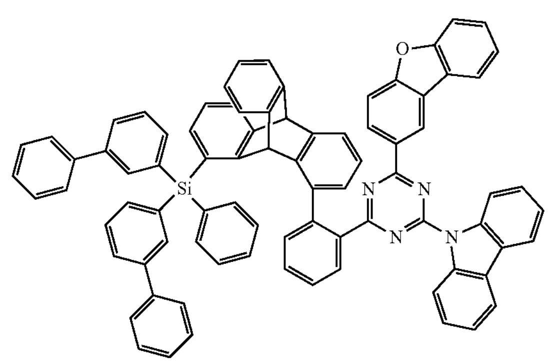
C-87
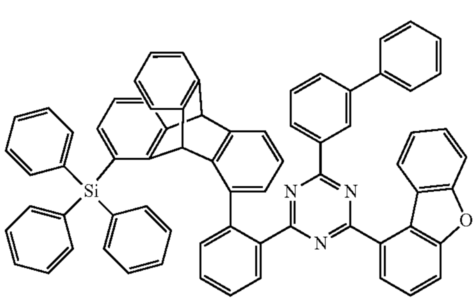
C-88
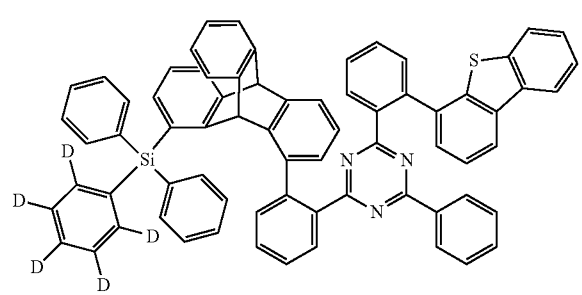

-continued
C-89
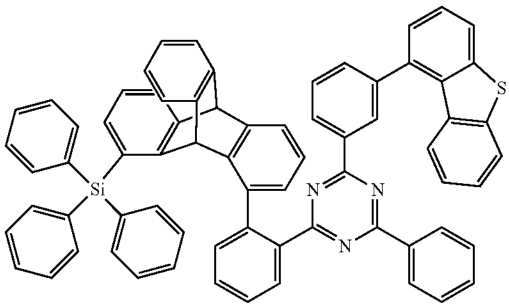
C-90
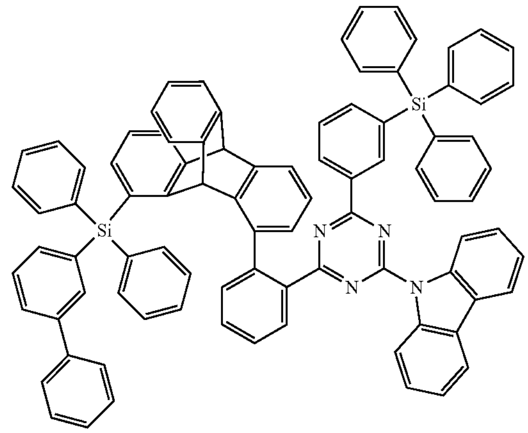
C-91
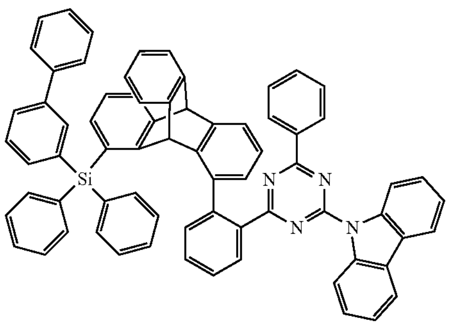
C-92
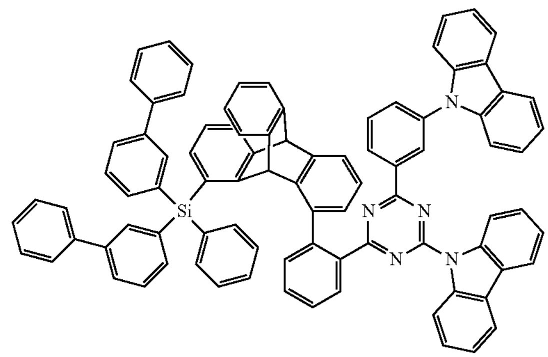
C-93
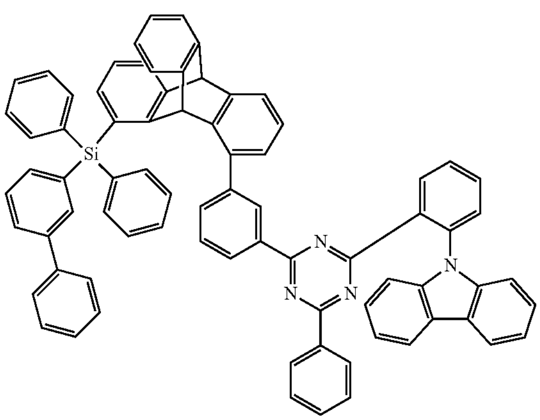
C-94
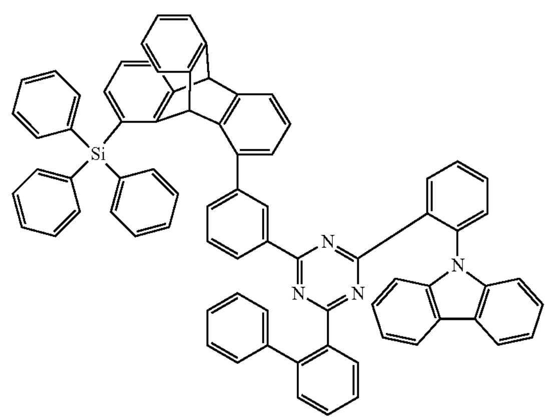

-continued
C-95
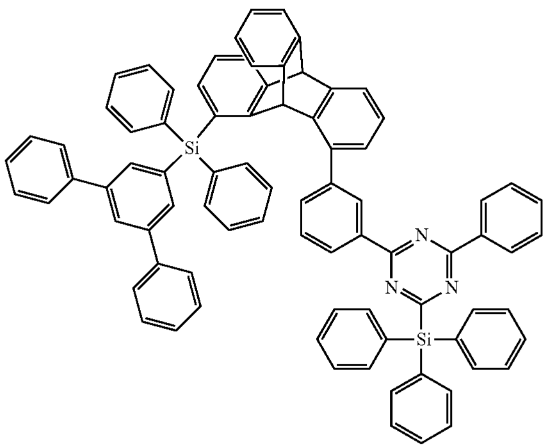
C-96
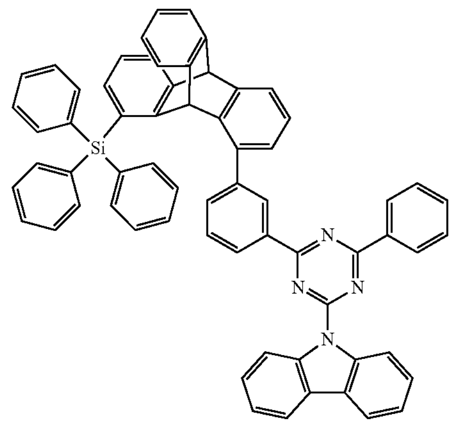
C-97
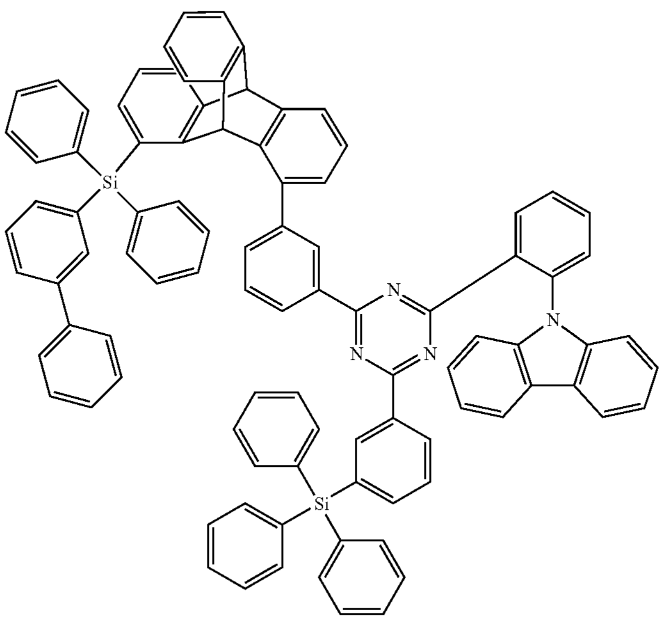
C-98
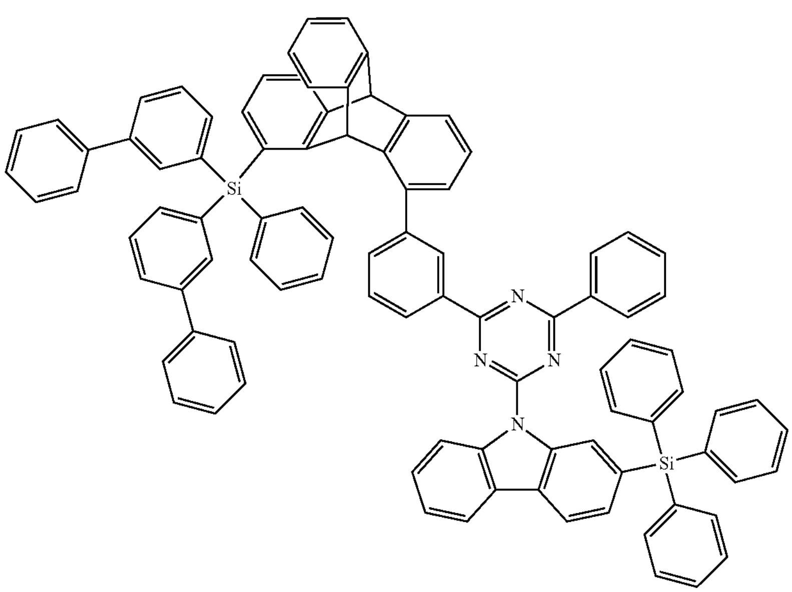

-continued
C-99
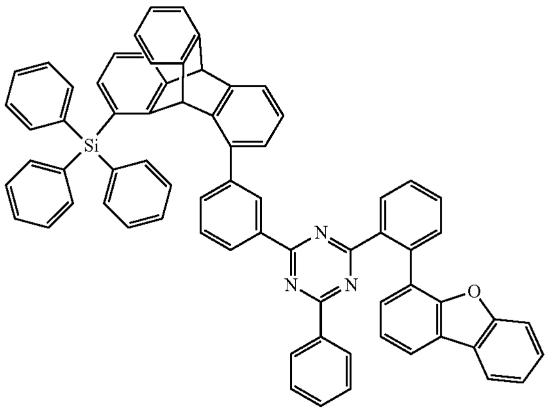
C-100
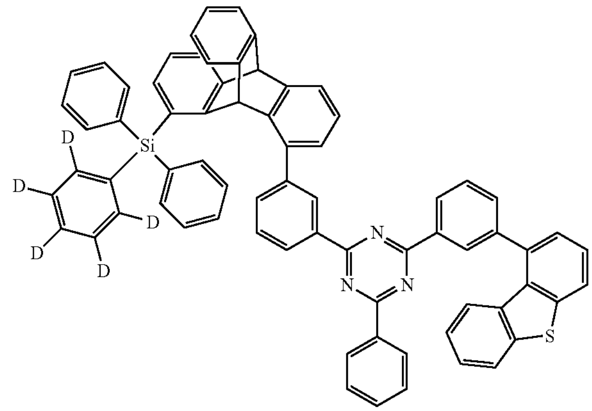
C-101
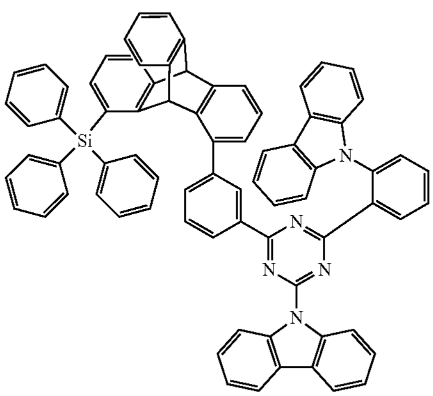
C-102
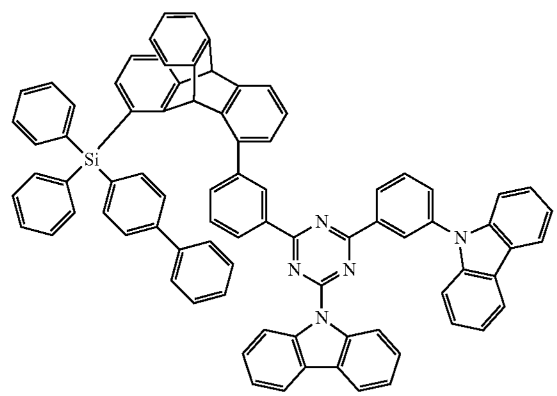
C-103
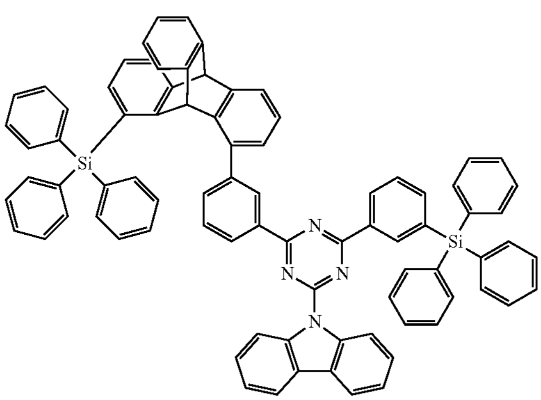
C-104
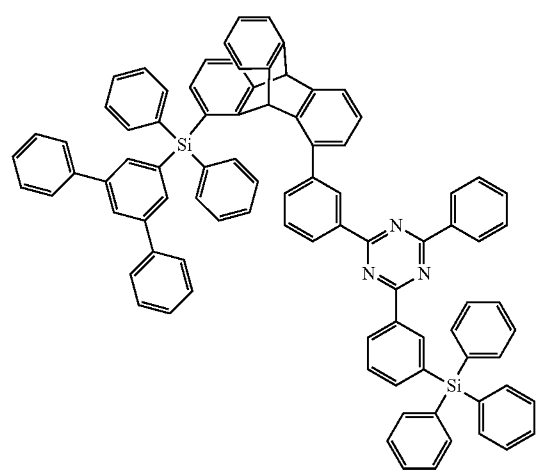

-continued
C-105
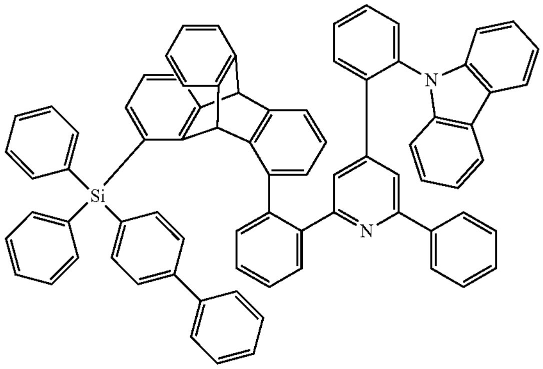
C-106
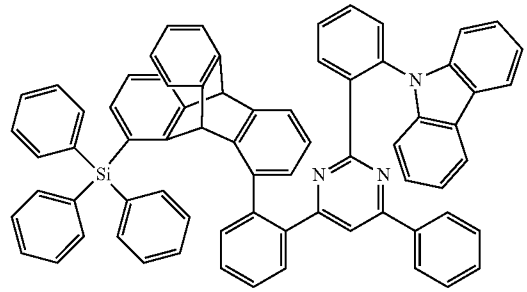
C-107
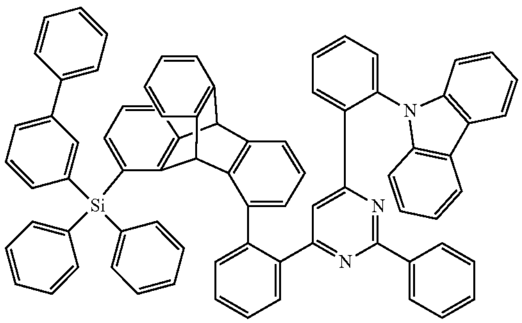
C-108
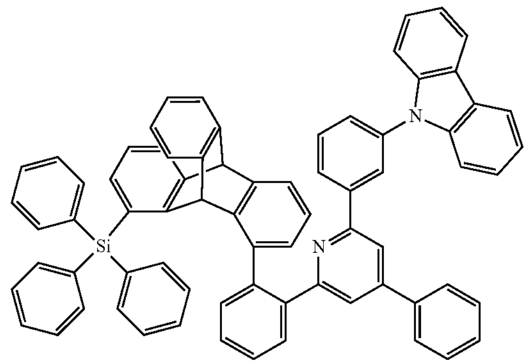
C-109
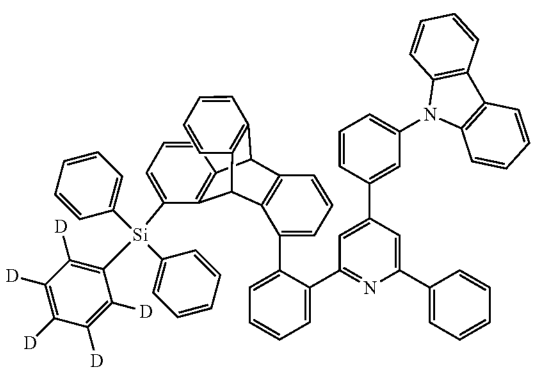
C-110
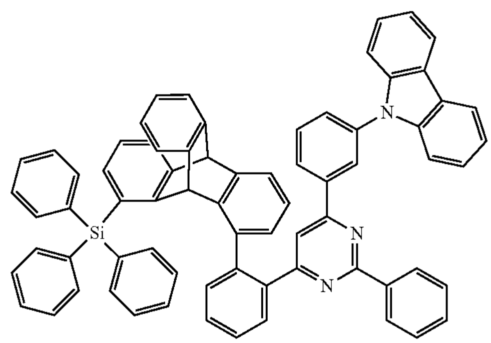
C-111
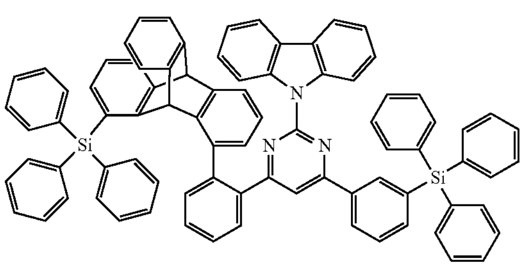
C-112
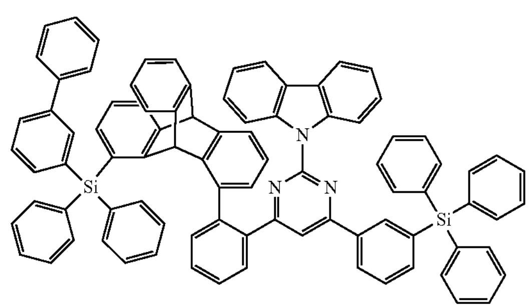

-continued
C-113
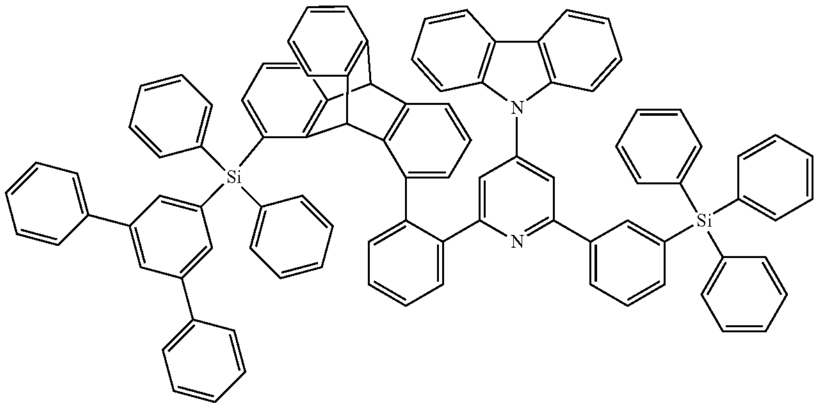
C-114
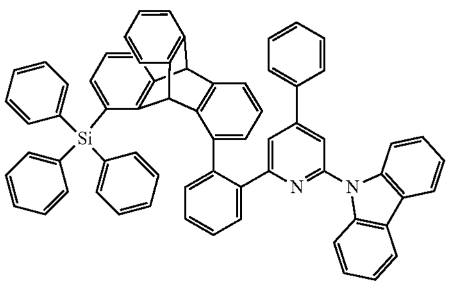
C-115
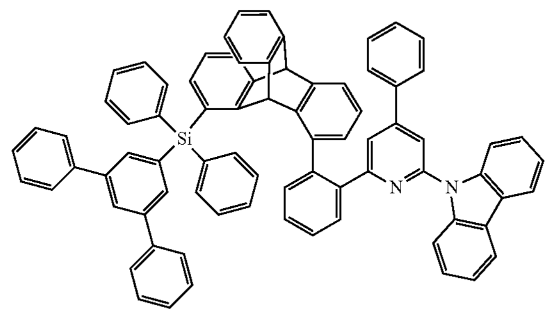
C-116
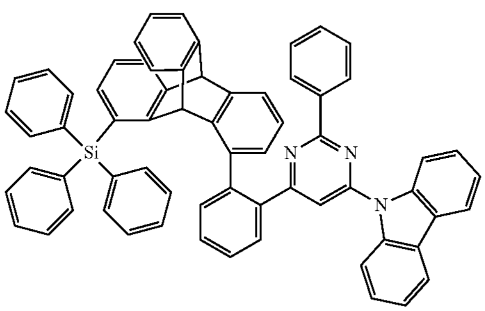
C-117
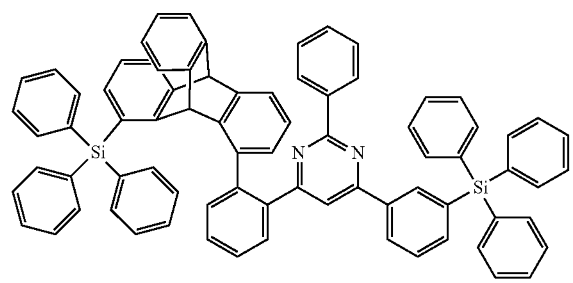
C-118
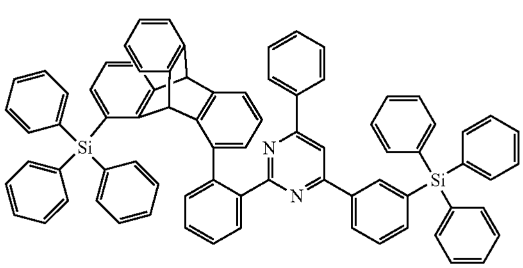
C-119
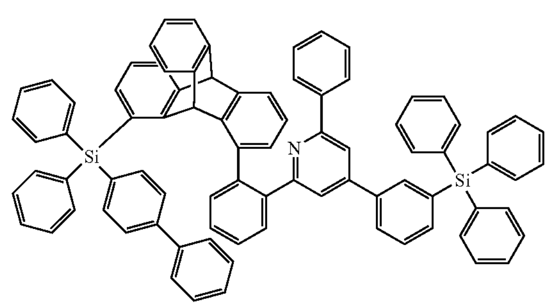

-continued
C-120
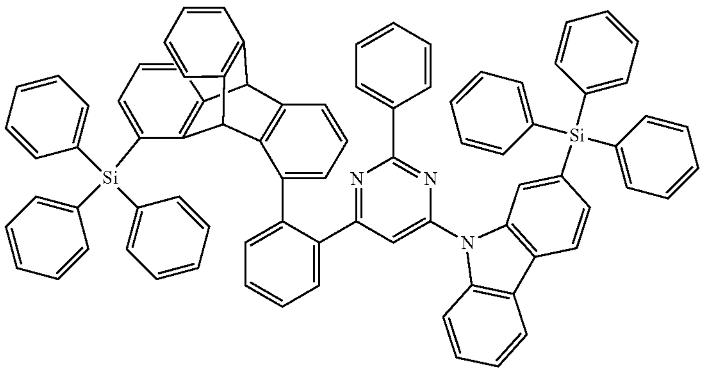
C-121
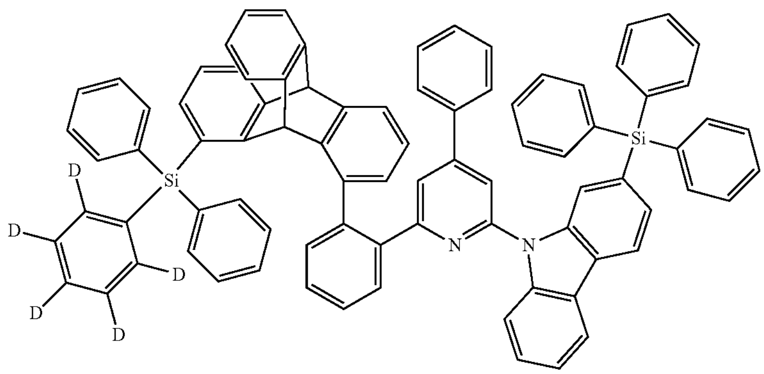
C-122
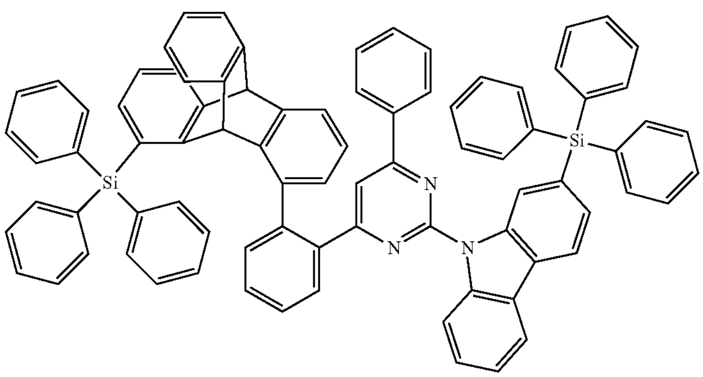
C-123
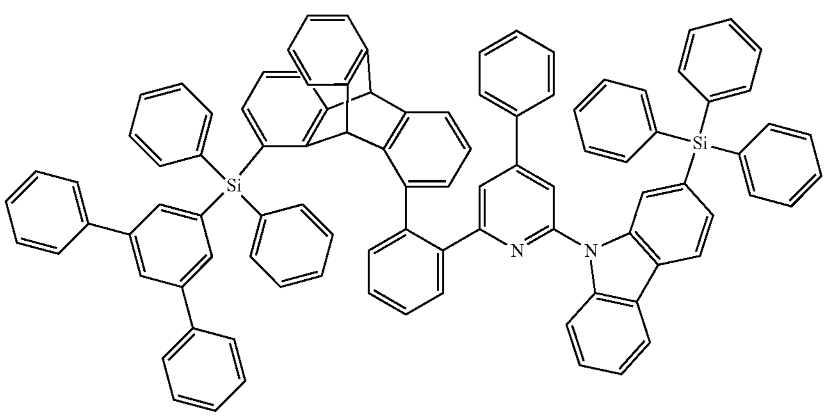

-continued
C-124
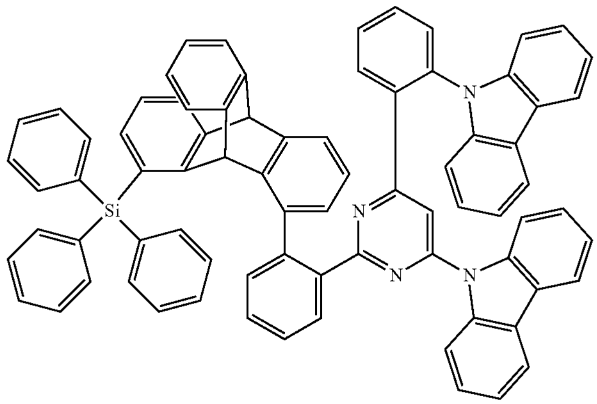
C-125
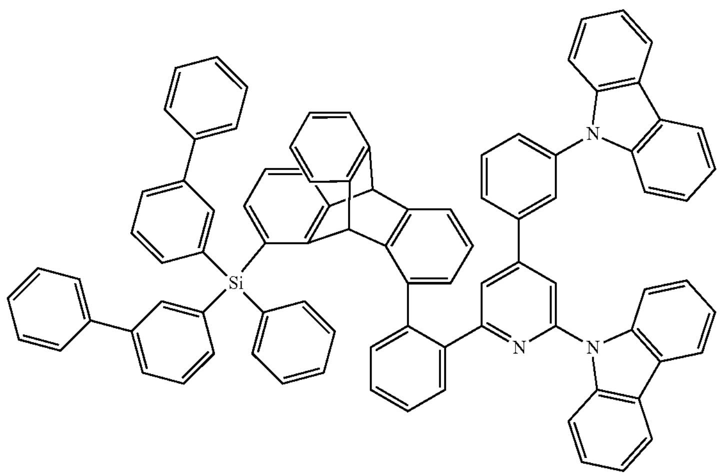
C-126
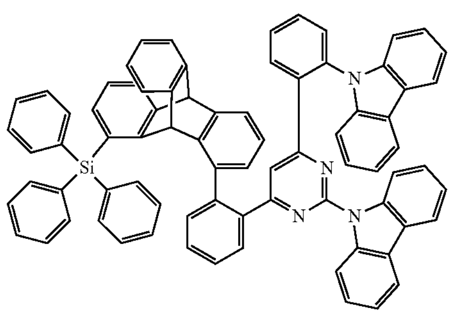
C-127
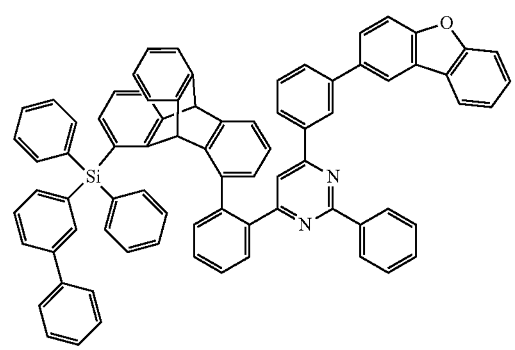
C-128
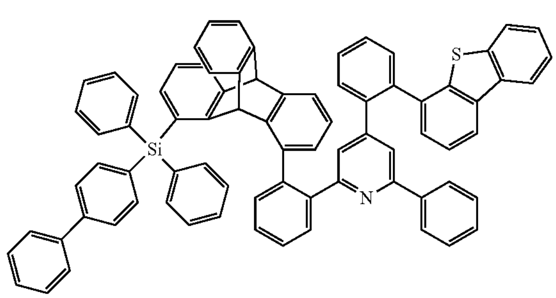
C-129
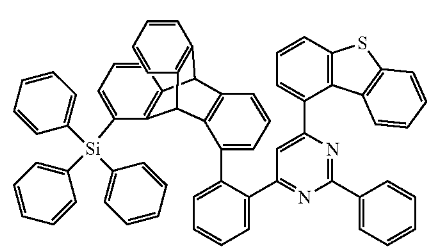

-continued
C-130
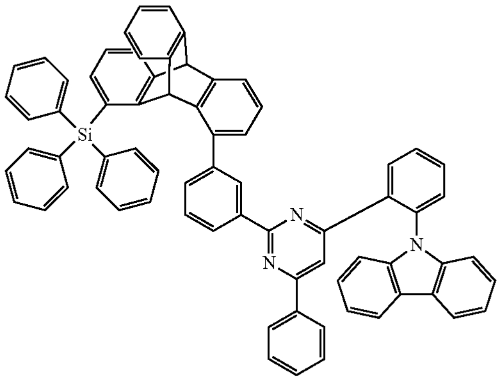
C-131
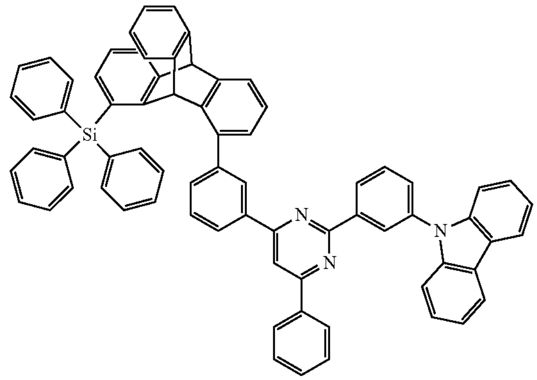
C-132
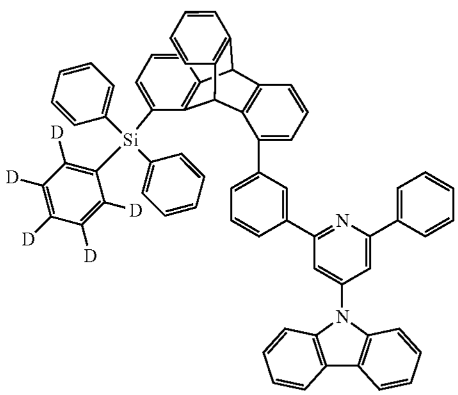
C-133
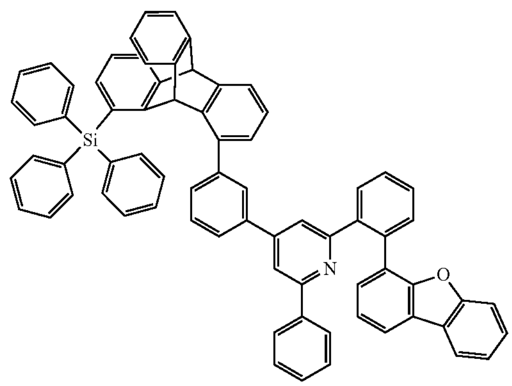
C-134
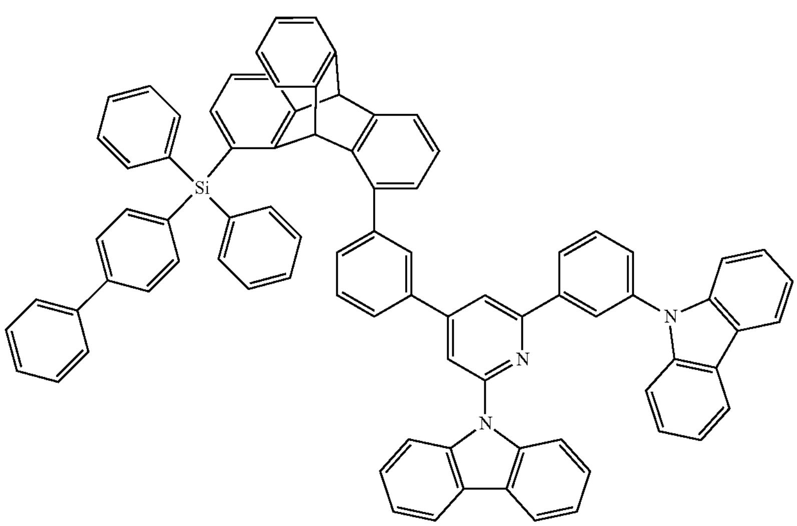

-continued

C-135

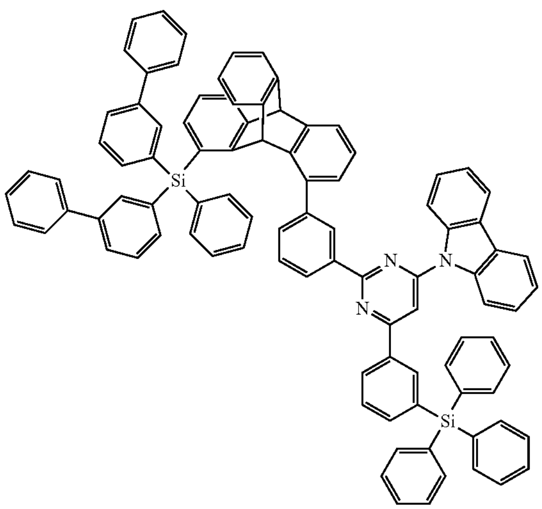

C-136

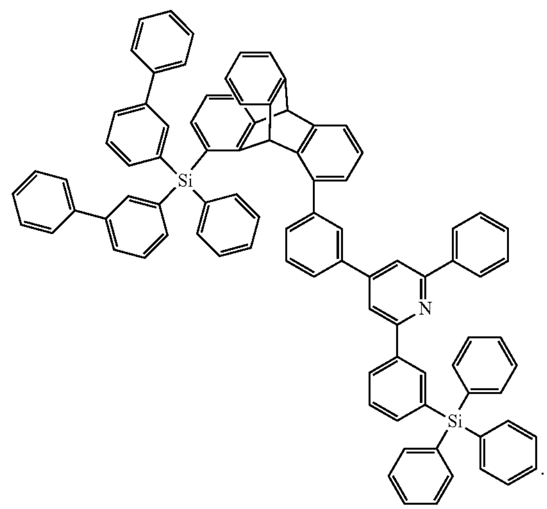

The condensed cyclic compound represented by Formula 1 may have a triptycene core having high electron transportability, and thus, the condensed cyclic compound may have high electron transportability (e.g., transport capability). For example, the $G_1$ and $G_2$ substituents may be respectively bound to the 1'-position and the 8'-position in the triptycene core, and thus, the condensed cyclic compound may have a structure having a large intramolecular interaction (e.g., the $G_1$ and $G_2$ substituents may participate in steric interactions with each other due to their large sizes and positioning on the triptycene core). Accordingly, a dihedral angle between two benzene groups (e.g., between the $G_1$- and $G_2$-substituted benzene groups of the triptycene core, and/or between the triptycene core and the $G_2$ substituent) may increase (e.g., in order to relieve strain in the molecule), and thus, the condensed cyclic compound may have a high triplet energy.

The $G_1$ substituent may be a silyl group bound (e.g., directly bound) to the triptycene core via a single bond, and thus, a dihedral angle in the core may increase due to steric effects of the bulky silyl group as the $G_1$ substituent. Accordingly, the condensed cyclic compound may have a high triplet energy level, and the condensed cyclic compound may have excellent or suitable characteristics suitable for utilize as an interlayer material in a light-emitting device, e.g., a light-emitting material.

In one or more embodiments, by binding a group represented by Formula 3A or Formula 3B having hole transportability to the triptycene core, control of an energy level and polarity of the condensed cyclic compound may be facilitated depending on introduction of one or more suitable substituents and variation of the substitution position (e.g., via the N atom in Formula 3A or via a phenyl ring C in Formula 3B). Thus, the condensed cyclic compound may have a high charge balance, and the light-emitting device including the condensed cyclic compound may have a high luminescence efficiency.

In one or more embodiments, by binding a group represented by Formula 3C having electron transportability to the triptycene core, the condensed cyclic compound may have improved electron transportability, such that energy transfer may be facilitated. For example, when the condensed cyclic compound is included in an interlayer (e.g., an emission layer, an electron transport layer, and/or a hole blocking layer) of a light-emitting device, the light-emitting device may have a high luminescence efficiency and/or a long lifespan.

Therefore, an electronic device (e.g., a light-emitting device) including the condensed cyclic compound may have a low driving voltage, high luminescence efficiency, long lifespan, and/or high colorimetric purity.

Methods of synthesizing the condensed cyclic compound represented by Formula 1 may be easily understood by those of ordinary skill in the art by referring to Synthesis Examples and Examples described herein.

The condensed cyclic compounds represented by Formula 1 may be utilized in a light-emitting device (e.g., an organic light-emitting device).

According to one or more embodiments, a light-emitting device may include: a first electrode; a second electrode facing the first electrode; and an interlayer between the first electrode and the second electrode and including an emission layer, wherein the light-emitting device may include the condensed cyclic compound represented by Formula 1.

The term “interlayer” as utilized herein may refer to a single layer and/or a plurality of all layers located between a first electrode and a second electrode in a light-emitting device.

In an embodiment, the interlayer in the light-emitting device may include the condensed cyclic compound represented by Formula 1. For example, the emission layer may include the condensed cyclic compound.

In one or more embodiments, the emission layer may include a host and a dopant, a content of the host in the emission layer may be greater than a content of the dopant in the emission layer, and the host may include the condensed cyclic compound represented by Formula 1. For example, the condensed cyclic compound may serve as a host. The dopant may include a phosphorescent dopant and/or a thermal activated delayed fluorescence (TADF) dopant.

In one or more embodiments, the host may include the condensed cyclic compound represented by Formula 1, and the dopant may be to emit blue light. In some embodiments, the dopant may include a transition metal and m ligand(s), m may be an integer from 1 to 6, the ligand(s) may be identical to or different from each other, at least one of the m ligand(s) may be bound to the transition metal via a carbon-transition metal bond, and the carbon-transition metal bond may be a coordinate bond. For example, at least one of the m ligand(s) may be a carbene ligand (e.g., the dopant may be or include $Ir(pmp)_3$ and/or the like). The transition metal may be, for example, iridium (Ir), platinum (Pt), osmium (Os), palladium (Pd), rhodium (Rh), or gold (Au). The emission layer and the dopant may respectively be understood by referring to the descriptions of the emission layer and the dopant provided herein.

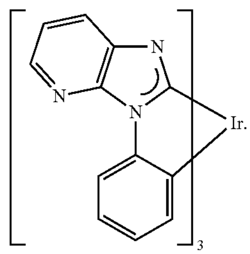

$Ir(pmp)_3$

In one or more embodiments, the dopant may include the condensed cyclic compound represented by Formula 1 (for example, when a content of the host in the emission layer is greater than a content of the dopant in the emission layer). For example, the condensed cyclic compound may serve as a dopant.

In an embodiment, the emission layer in the light-emitting device may be to emit blue light having a maximum emission wavelength in a range of about 390 nanometers (nm) to about 440 nm, but embodiments are not limited thereto.

In some embodiments, the first electrode of the light-emitting device may be an anode, the second electrode of the light-emitting device may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, or an electron injection layer.

In one or more embodiments, the light-emitting device may include a capping layer located outside the first electrode or the second electrode.

In one or more embodiments, the light-emitting device may further include at least one of a first capping layer located outside the first electrode and a second capping layer located outside the second electrode, and at least one of the first capping layer and the second capping layer may include the condensed cyclic compound represented by Formula 1. The first capping layer and the second capping layer may respectively be understood by referring to the descriptions of the first capping layer and the second capping layer provided herein.

In some embodiments, the light-emitting device may include:

a first capping layer located outside the first electrode and including the condensed cyclic compound represented by Formula 1;

a second capping layer located outside the second electrode and including the condensed cyclic compound represented by Formula 1; or the first capping layer and the second capping layer (e.g., simultaneously).

The expression that an "(interlayer and/or a capping layer) includes at least one condensed cyclic compound" as utilized herein may be construed as meaning that the "(interlayer and/or the capping layer) may include one (e.g., type or kind of) condensed cyclic compound of Formula 1, or two or more different (e.g., types or kinds of) condensed cyclic compounds of Formula 1".

For example, the interlayer may include Compound A-1 only as the condensed cyclic compound. In this embodiment, Compound A-1 may be included in the emission layer of the light-emitting device. In some embodiments, Compounds A-1 and A-2 may be included in the interlayer as the condensed cyclic compounds. In this embodiment, Compounds A-1 and A-2 may be included in the same layer (for example, both Compounds A-1 and A-2 may be included (e.g., simultaneously) in an emission layer) or in different layers (for example, Compound A-1 may be included in an emission layer, and Compound A-2 may be included in an electron transport region).

According to one or more embodiments, an electronic apparatus may include the light-emitting device. The electronic apparatus may further include a thin-film transistor. In some embodiments, the electronic apparatus may further include a thin-film transistor including a source electrode and drain electrode, and a first electrode of the light-emitting device may be electrically connected to the source electrode or the drain electrode. The electronic apparatus may further include a color filter, a color-conversion layer, a touchscreen layer, a polarization layer, or any combination thereof.

The electronic apparatus may be understood by referring to the description of the electronic apparatus provided herein.

[Description of FIG. 1]

FIG. 1 is a schematic view of a light-emitting device 10 according to an embodiment. The light-emitting device 10 may include a first electrode 110, an interlayer 130, and a second electrode 150.

Hereinafter, the structure of the light-emitting device 10 according to an embodiment and a method of manufacturing the light-emitting device 10 according to an embodiment will be described in connection with FIG. 1.

[First electrode 110]

In FIG. 1, a substrate may be additionally located under the first electrode 110 and/or above the second electrode 150. The substrate may be a glass substrate and/or a plastic substrate. The substrate may be a flexible substrate including plastic having excellent or suitable heat resistance and/or durability, for example, polyimide, polyethylene terephthalate (PET), polycarbonate, polyethylene naphthalate, polyarylate (PAR), polyetherimide, or any combination thereof.

The first electrode 110 may be formed by depositing or sputtering, on the substrate, a material for forming the first electrode 110. When the first electrode 110 is an anode, a high work function material that may easily inject holes may be utilized as a material for a first electrode.

The first electrode 110 may be a reflective electrode, a semi-transmissive electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combinations thereof. In some embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be utilized as a material for forming the first electrode 110.

The first electrode 110 may have a single-layered structure consisting of a single layer or a multi-layered structure including two or more layers. In some embodiments, the first electrode 110 may have a triple-layered structure of ITO/Ag/ITO.

[Interlayer 130]

The interlayer 130 may be on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds (such as organometallic compounds), inorganic materials (such as quantum dots), and/or the like, in addition to one or more suitable organic materials.

The interlayer 130 may include: i) at least two emitting units sequentially stacked between the first electrode 110 and the second electrode 150; and ii) a charge generation layer located between the at least two emitting units. When the interlayer 130 includes the at least two emitting units and a charge generation layer, the light-emitting device 10 may be a tandem light-emitting device.

[Hole Transport Region in Interlayer 130]

The hole transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The hole transport region may include a hole injection layer, a hole transport layer, an emission auxiliary layer, an electron blocking layer, or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order.

The hole transport region may include the compound represented by Formula 201, the compound represented by Formula 202, or any combination thereof:

Formula 201

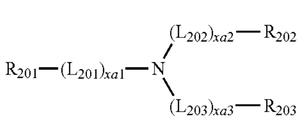

-continued

Formula 202

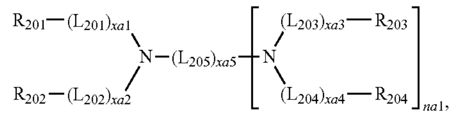

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—N($Q_{201}$)-*", a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group and/or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In some embodiments, Formulae 201 and 202 may each include at least one of groups represented by Formulae CY201 to CY217:

CY201

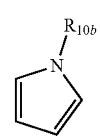

CY202

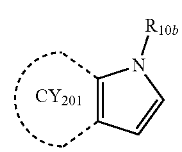

CY203

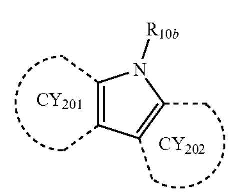

-continued

CY204

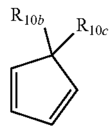

CY205

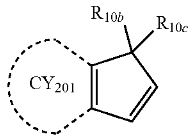

CY206

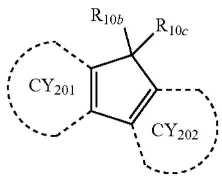

CY207

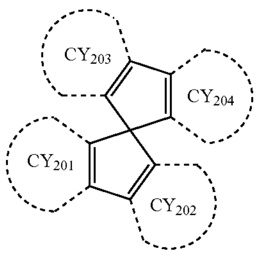

CY208

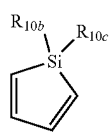

CY209

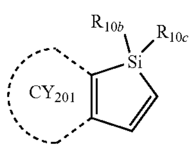

CY210

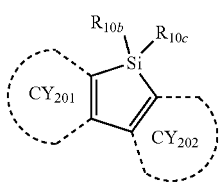

CY211

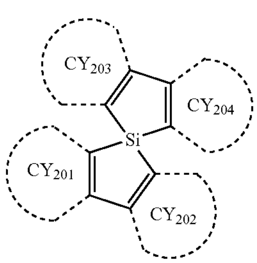

CY212

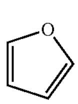

-continued

CY213

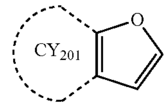

CY214

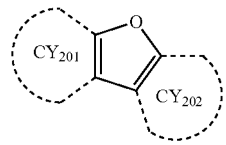

CY215

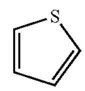

CY216

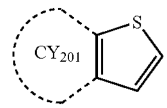

CY217

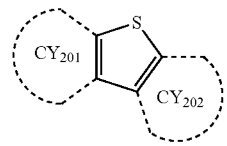

, wherein, in Formulae CY201 to CY217, $R_{i0b}$ and $R_{10c}$ may each be understood by referring to the descriptions of $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In some embodiments, in Formulae CY201 to CY217, ring $CY_{201}$ to ring $CY_{204}$ may each independently be a benzene group, a naphthalene group, a phenanthrene group, or an anthracene group.

In one or more embodiments, Formulae 201 and 202 may each include at least one of groups represented by Formulae CY201 to CY203.

In one or more embodiments, Formula 201 may include at least one of groups represented by Formulae CY201 to CY203 and at least one of groups represented by Formulae CY204 to CY217.

In one or more embodiments, in Formula 201, xa1 may be 1, $R_{201}$ may be a group represented by any one of Formulae CY201 to CY203, xa2 may be 0, and $R_{202}$ may be a group represented by Formulae CY204 to CY207.

In one or more embodiments, Formulae 201 and 202 may each not include groups represented by Formulae CY201 to CY203.

In one or more embodiments, Formulae 201 and 202 may each not include groups represented by Formulae CY201 to CY203, and include at least one of groups represented by Formulae CY204 to CY217.

In one or more embodiments, Formulae 201 and 202 may each not include groups represented by Formulae CY201 to CY217.

In some embodiments, the hole transport region may include one of Compounds HT1 to HT46 and m-MTDATA, TDATA, 2-TNATA, NPB (NPD), β-NPB, TPD, spiro-TPD, spiro-NPB, methylated-NPB, TAPC, HMTPD, 4,4',4"-tris (N-carbazolyl)triphenylamine (TCTA), polyaniline/dodecylbenzene sulfonic acid (PANI/DBSA), poly(3,4-ethylene dioxythiophene)/poly(4-styrene sulfonate) (PEDOT/PSS), polyaniline/camphor sulfonic acid (PANI/CSA), polyaniline/poly(4-styrene sulfonate (PANI/PSS), or any combination thereof:

HT1
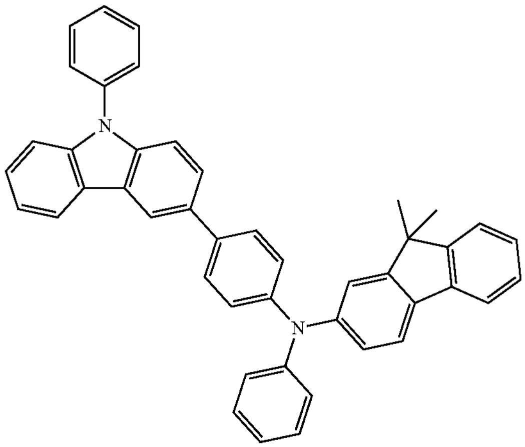
HT2
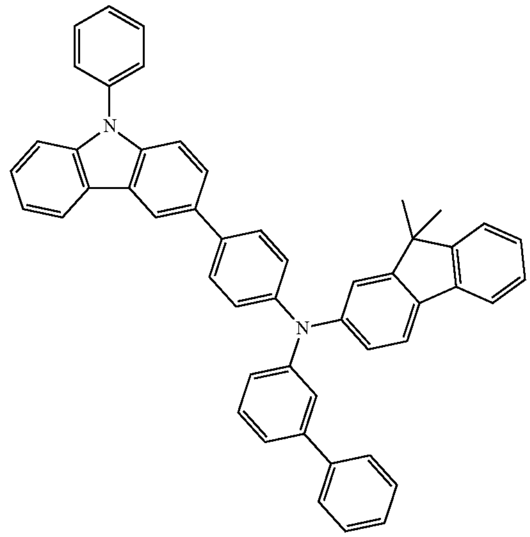
HT3
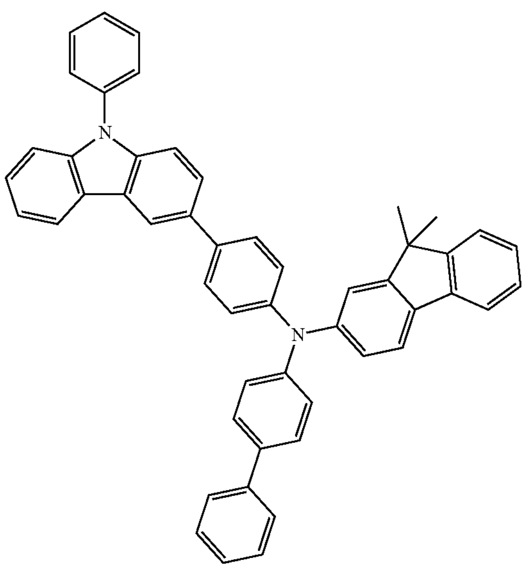
HT4
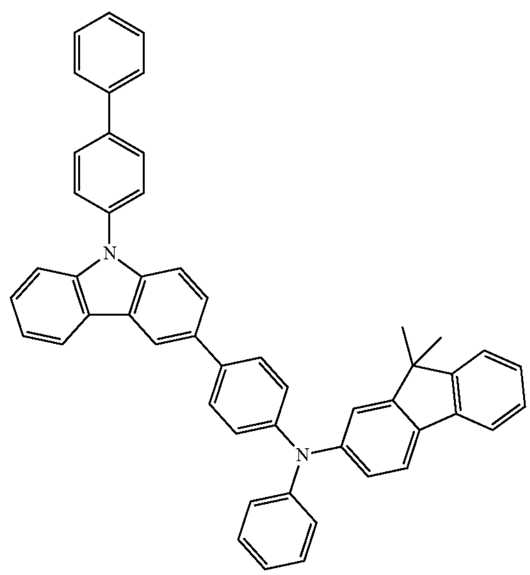

-continued
HT5
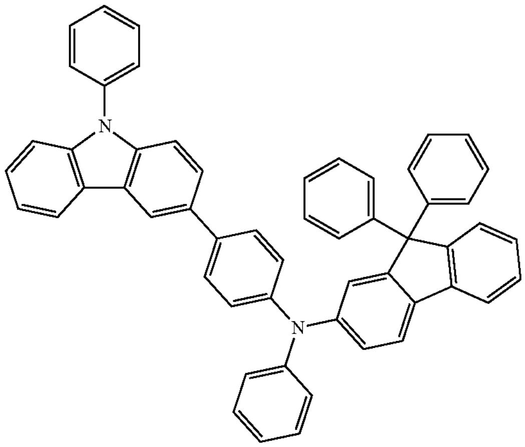
HT6
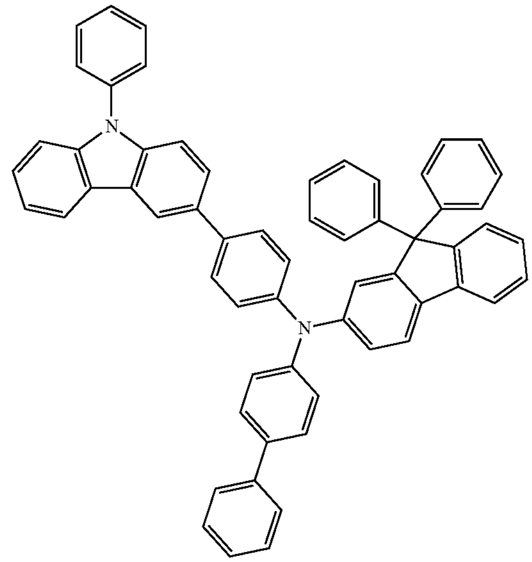
HT7
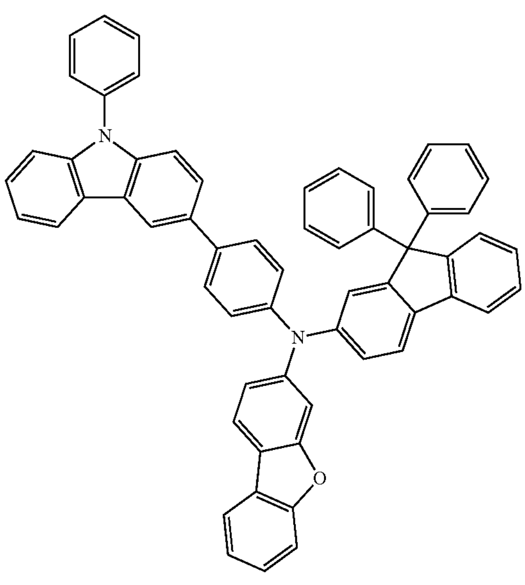
HT8
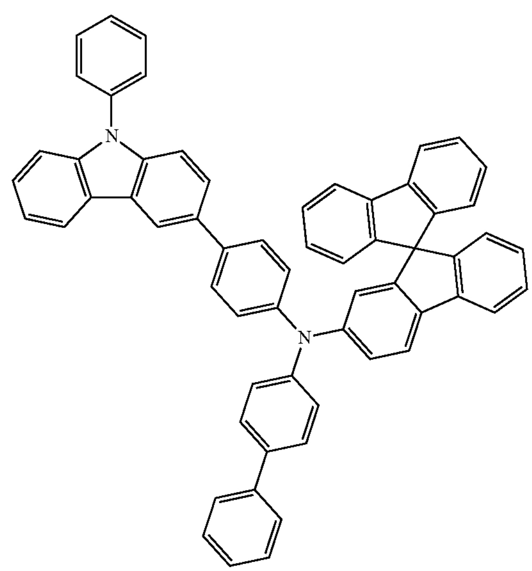

-continued
HT9
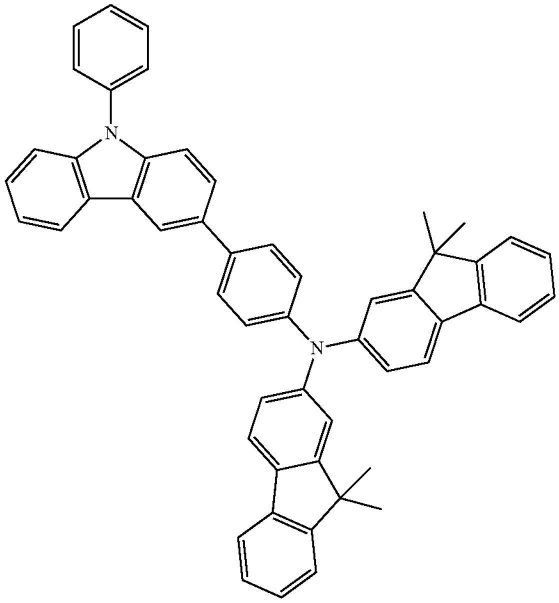
HT10
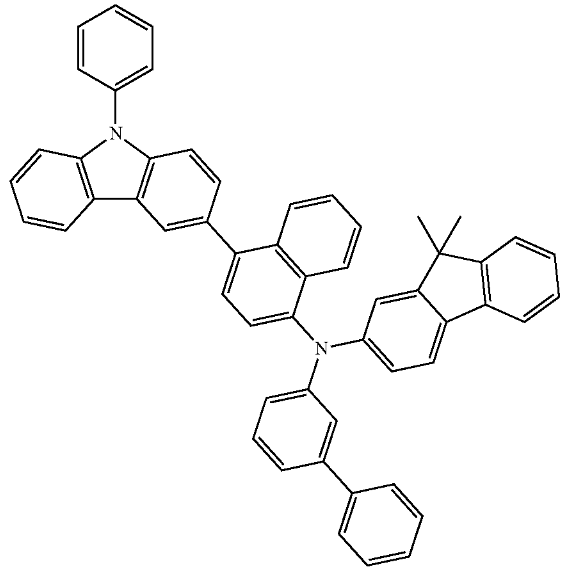
HT11
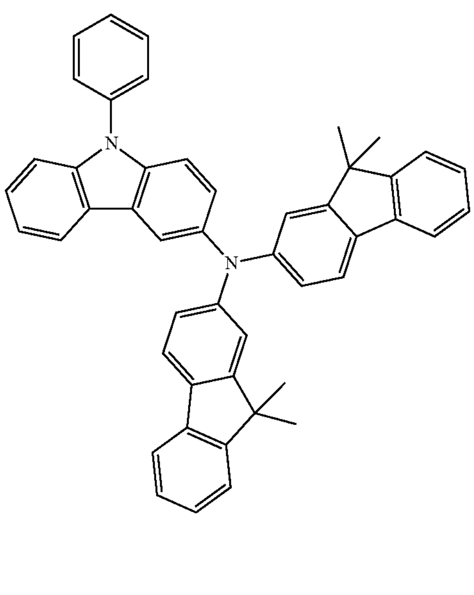
H12
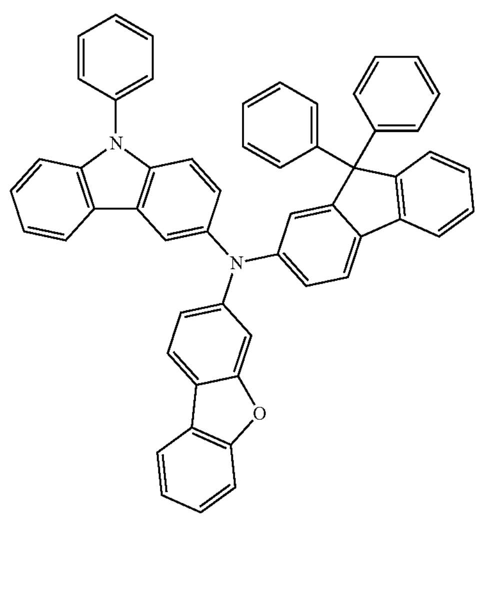

-continued
HT13
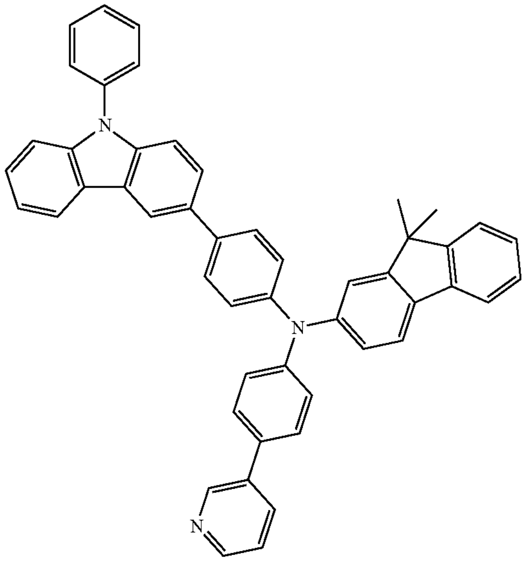
HT14
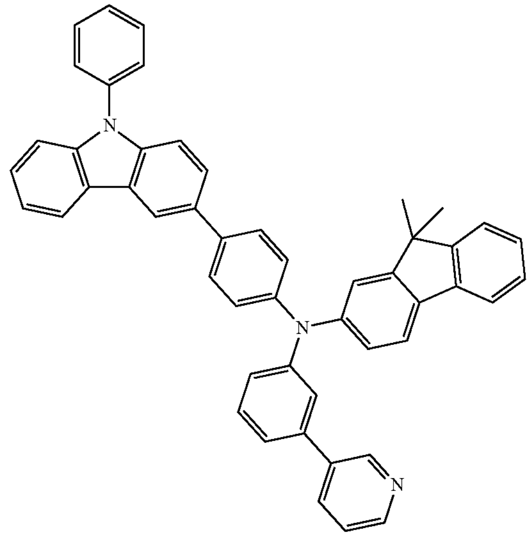
HT15
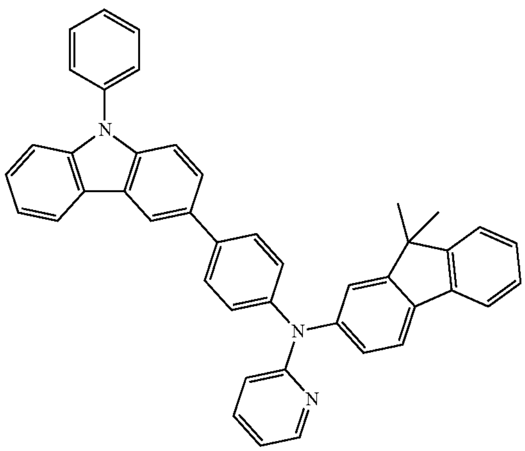
HT16
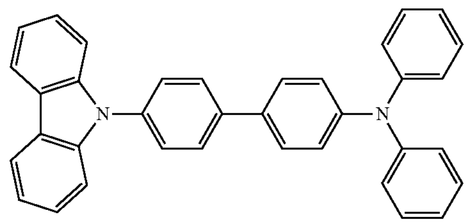
HT17
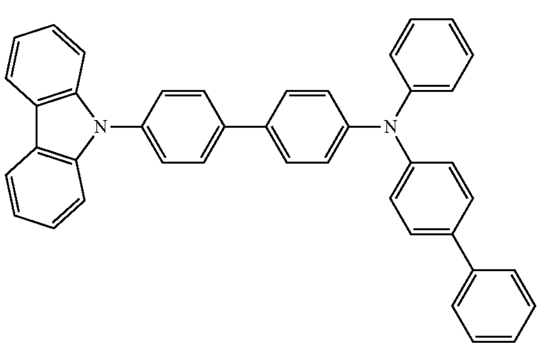
HT18
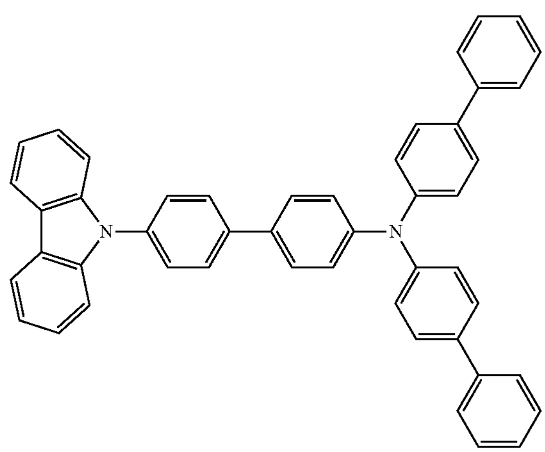

-continued
HT19
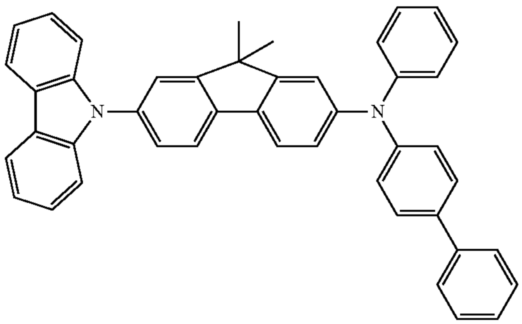
HT20
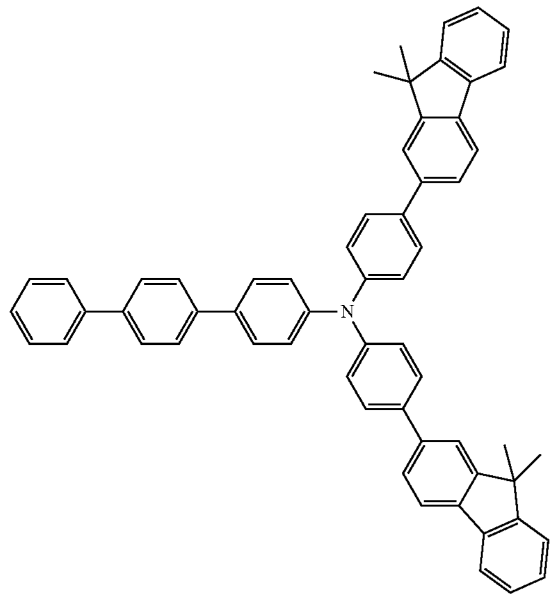
HT21
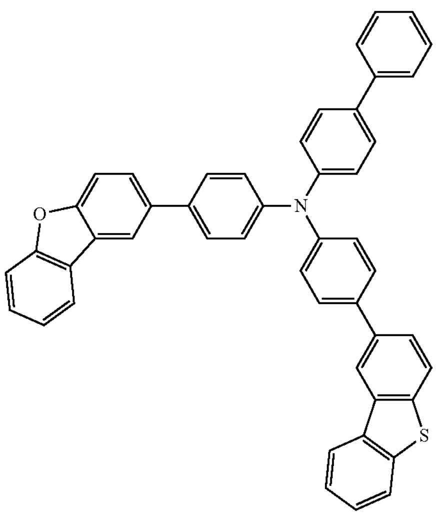
HT22
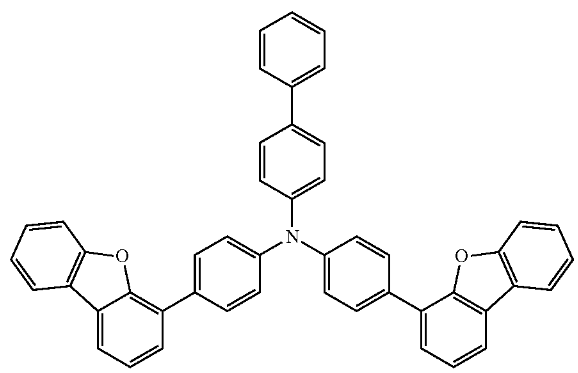
HT23
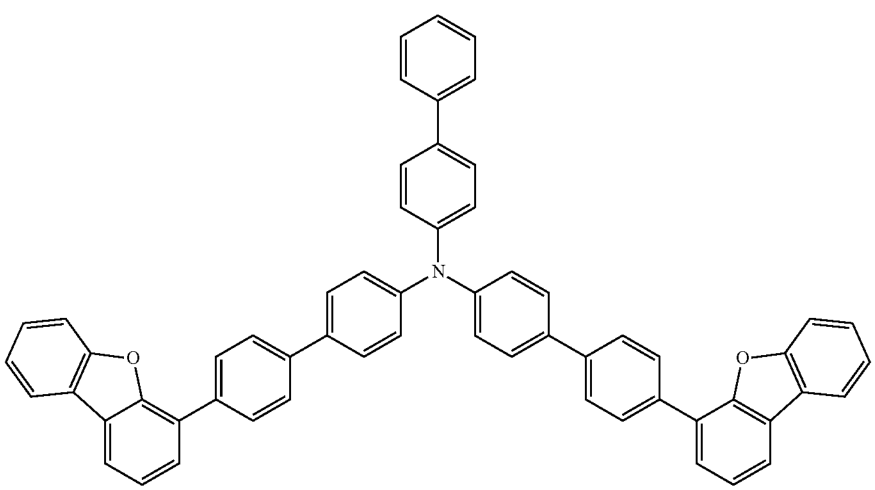

-continued
HT24
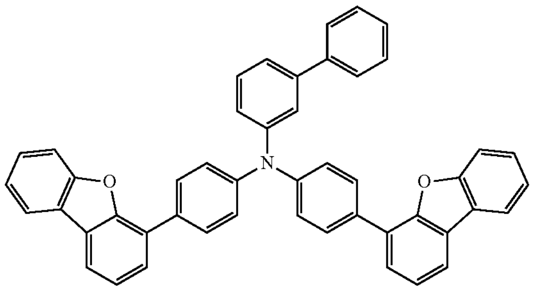
HT25
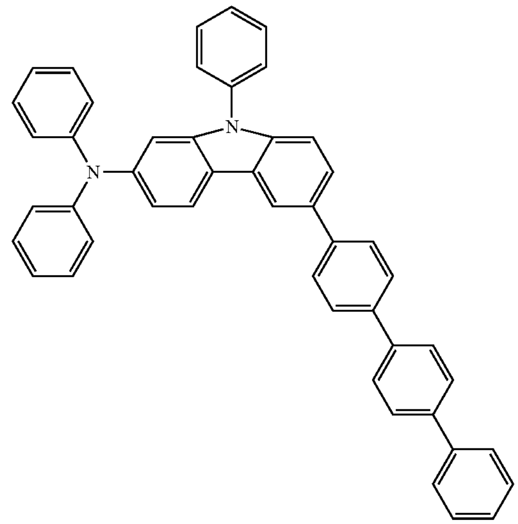
HT26
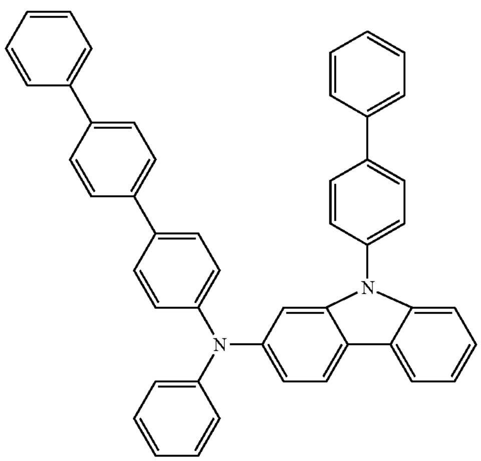
HT27
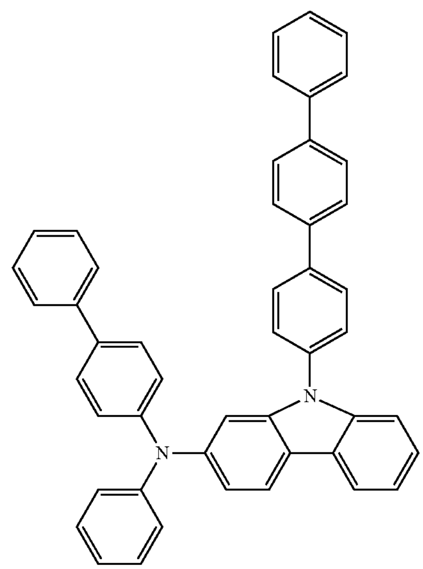
HT28
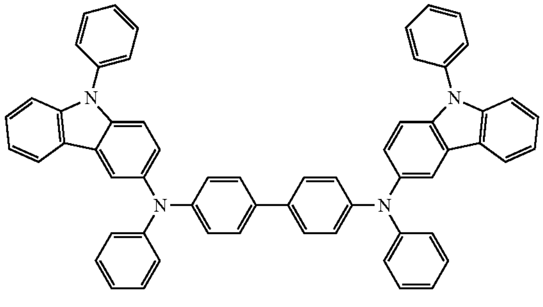
HT29
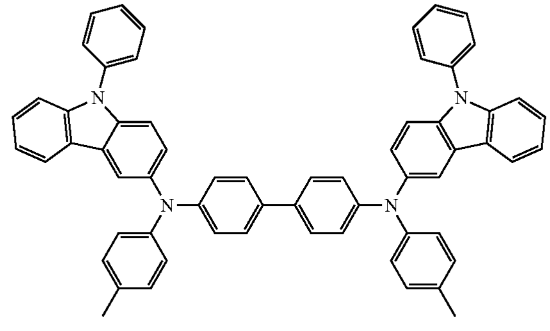

-continued
HT30
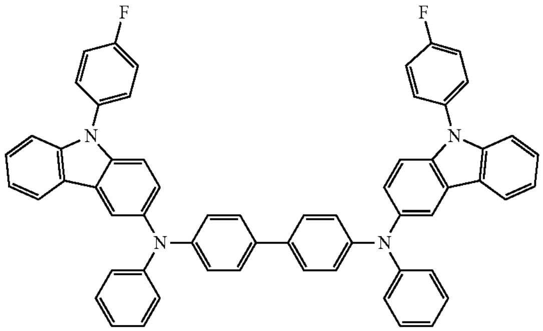
HT31
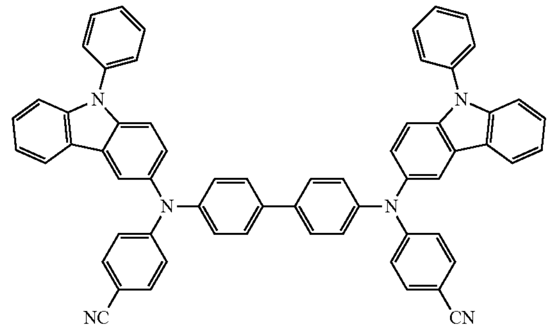
HT32
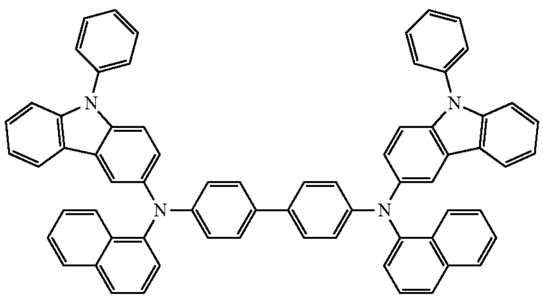
HT33
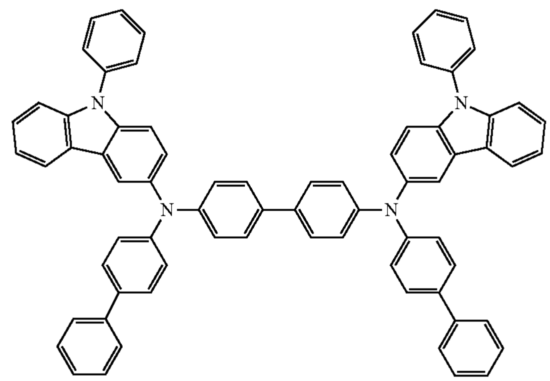
HT34
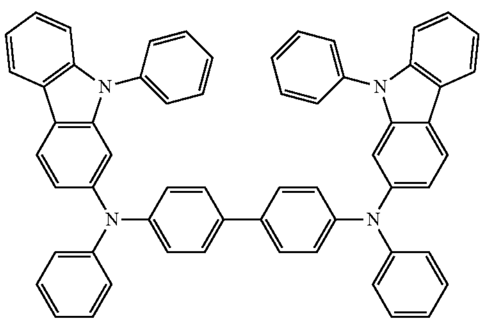
HT35
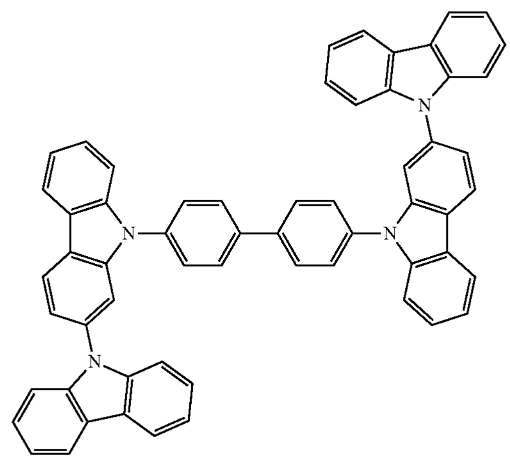
HT36
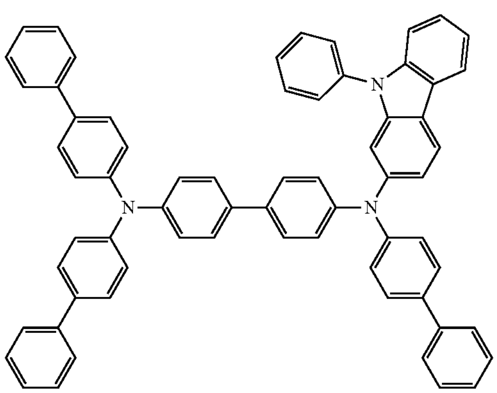
HT37
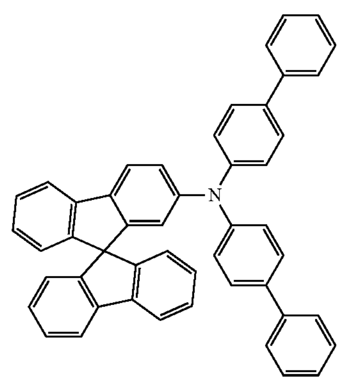

-continued
HT38
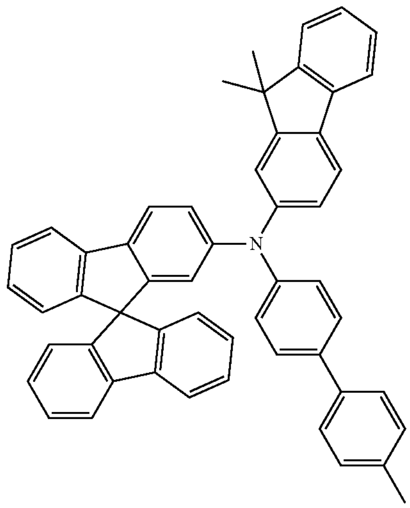
HT39
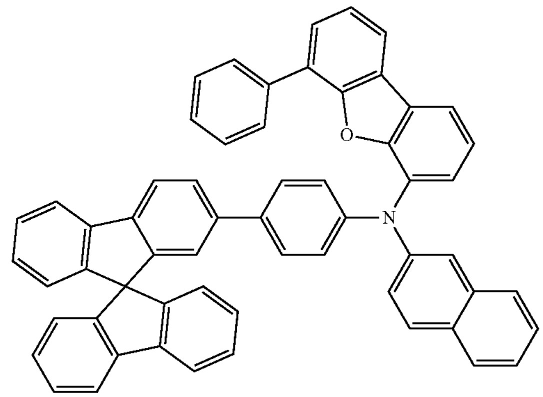
HT40
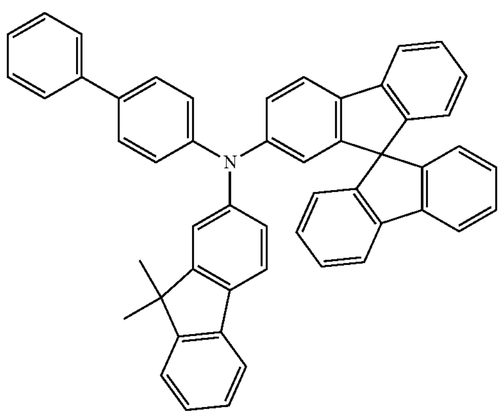
HT41
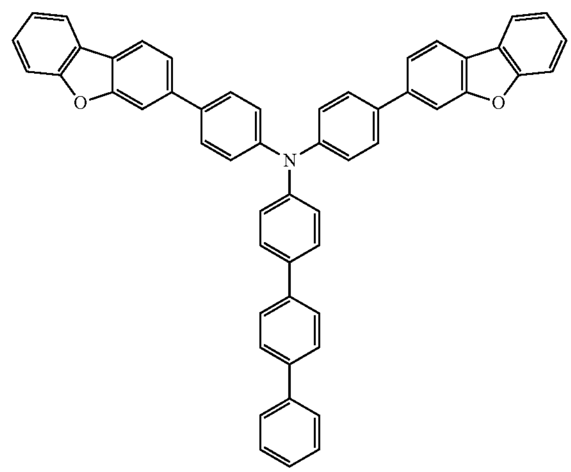
HT42
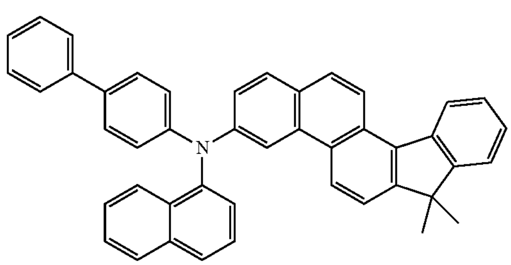
HT43
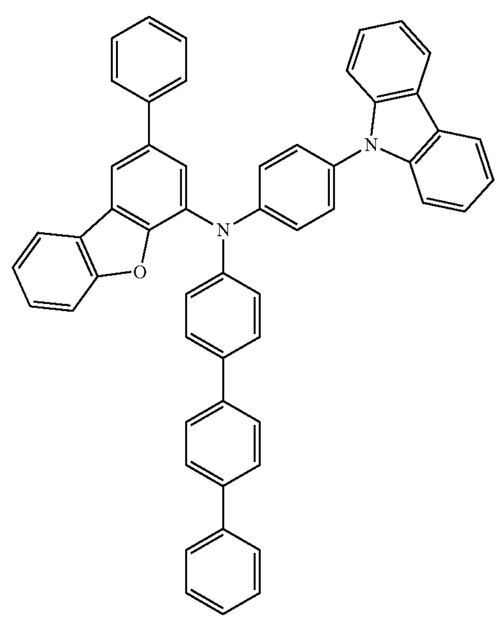

-continued
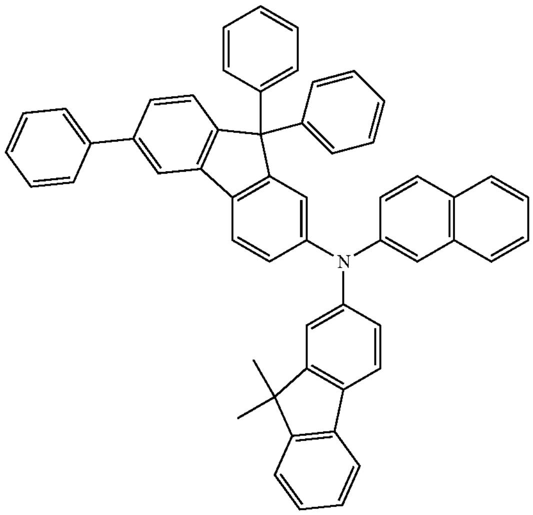
HT44
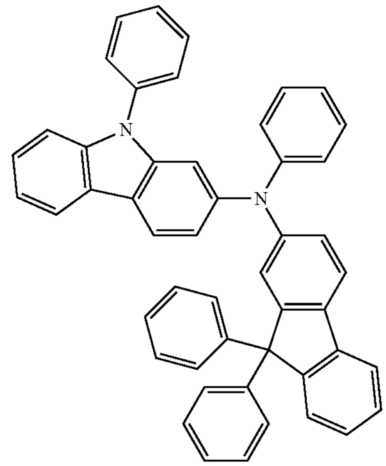
HT45
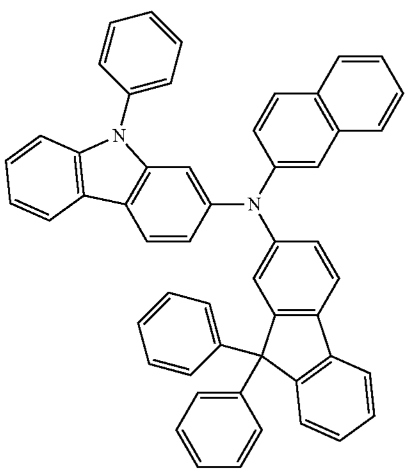
HT46
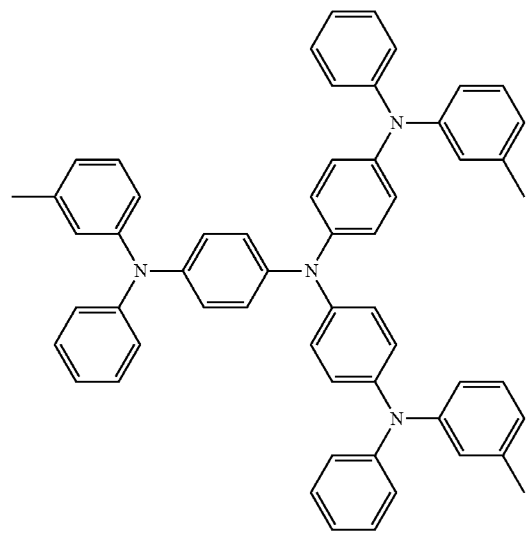
m-MTDATA
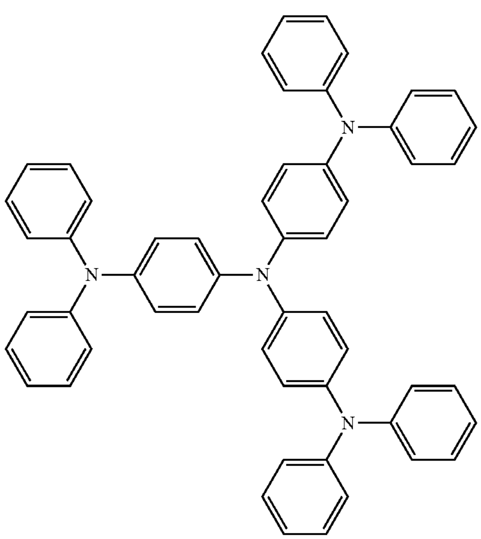
TDATA
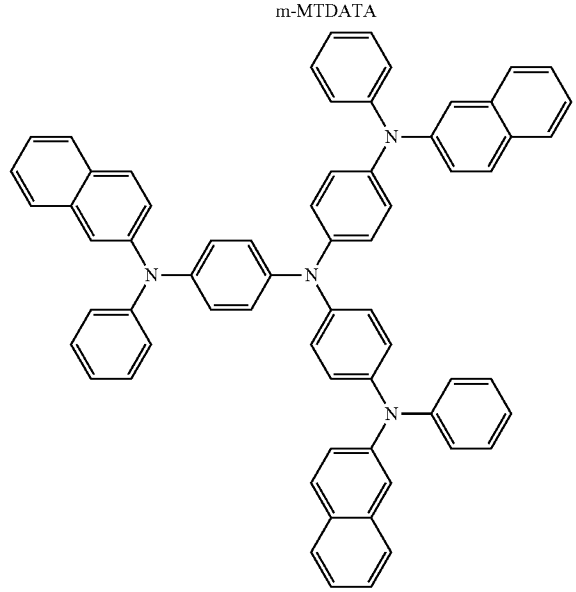
2-TNATA -continued

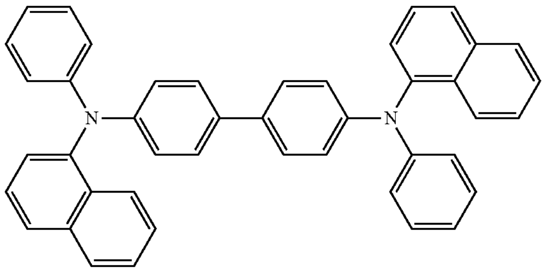

NPB

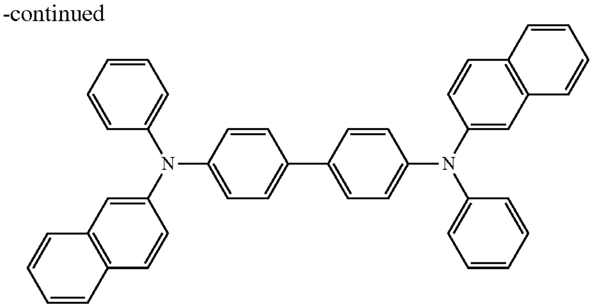

β-NPB

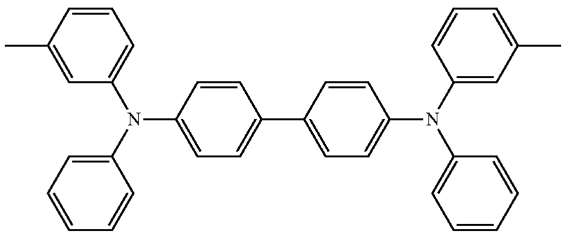

TPD

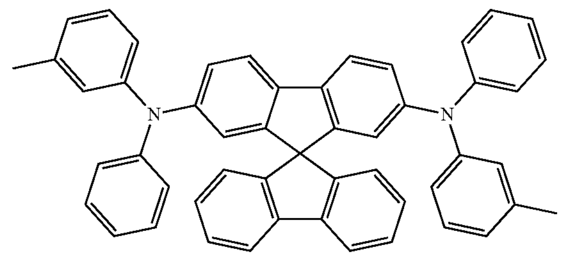

Spiro-TPD

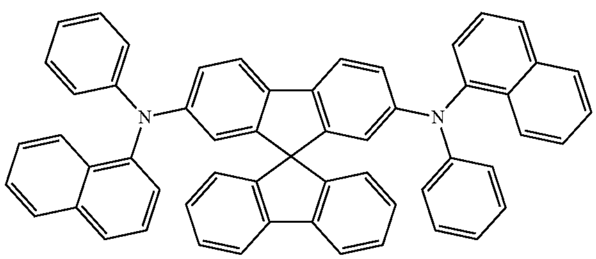

Spiro-TPD

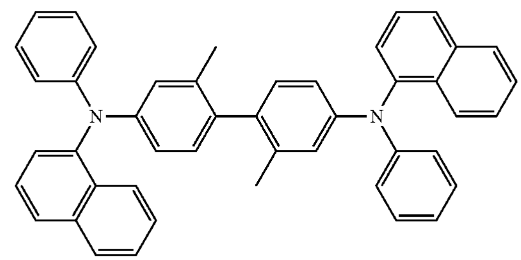

methylated NPB

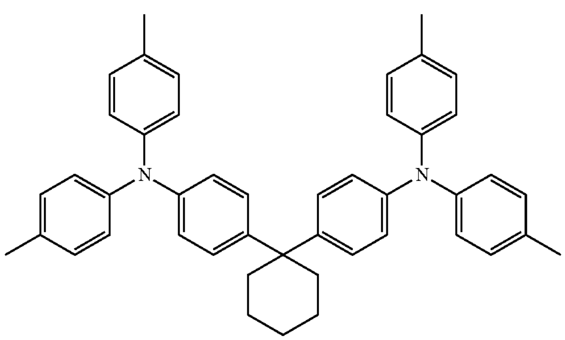

TAPC

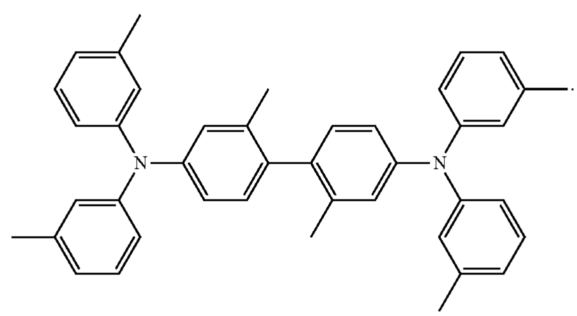

HMTPD

The thickness of the hole transport region may be in a range of about 50 Angstroms (Å) to about 10,000 Å, for example, about 100 Å to about 4,000 Å. When the hole transport region includes a hole injection layer, a hole transport layer, and any combination thereof, the thickness of the hole injection layer may be in a range of about 100 Å to about 9,000 Å, for example, about 100 Å to about 1,000 Å, the thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, excellent or suitable hole transport characteristics may be obtained without a substantial increase in driving voltage.

The emission auxiliary layer may increase light emission efficiency by compensating for an optical resonance distance according to the wavelength of light emitted by an emission layer. The electron blocking layer may prevent or reduce leakage of electrons to a hole transport region from the emission layer. Materials that may be included in the hole transport region may also be included in an emission auxiliary layer and an electron blocking layer.

[p-Dopant]

The hole transport region may include a charge generating material as well as the aforementioned materials to improve conductive properties of the hole transport region. The charge generating material may be substantially homogeneously or non-homogeneously dispersed (for example, as a single layer consisting of charge generating material) in the hole transport region.

The charge generating material may include, for example, a p-dopant.

In some embodiments, a lowest unoccupied molecular orbital (LUMO) energy level of the p-dopant may be −3.5 eV or less.

In some embodiments, the p-dopant may include a quinone derivative, a compound containing a cyano group, a compound containing an element EL1 and an element EL2, or any combination thereof.

Examples of the quinone derivative may include TCNQ, F4-TCNQ, and/or the like.

Examples of the compound containing a cyano group may include HAT-CN, a compound represented by Formula 221, and/or the like:

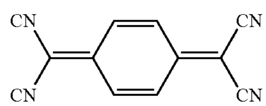

TCNQ

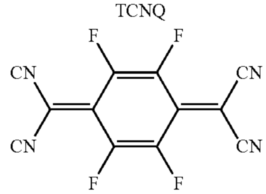

F4-TCNQ

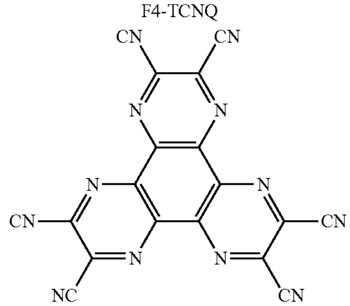

HAT-CN

Formula 221

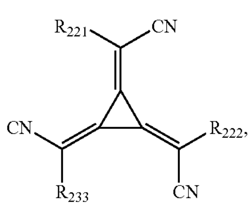

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing the element EL1 and the element EL2, the element EL1 may be a metal, a metalloid, or a combination thereof, and the element EL2 may be non-metal, a metalloid, or a combination thereof.

Examples of the metal may include: an alkali metal (e.g., lithium (Li), sodium (Na), potassium (K), rubidium (Rb), cesium (Cs), and/or the like); an alkaline earth metal (e.g., beryllium (Be), magnesium (Mg), calcium (Ca), strontium (Sr), barium (Ba), and/or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); a post-transition metal (e.g., zinc (Zn), indium (In), tin (Sn), and/or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like); and/or the like.

Examples of the metalloid may include silicon (Si), antimony (Sb), tellurium (Te), and/or the like.

Examples of the non-metal may include oxygen (0), a halogen (e.g., F, Cl, Br, I, and/or the like), and/or the like.

For example, the compound containing the element EL1 and the element EL2 may include a metal oxide, a metal halide (e.g., a metal fluoride, a metal chloride, a metal bromide, a metal iodide, and/or the like), a metalloid halide (e.g., a metalloid fluoride, a metalloid chloride, a metalloid bromide, a metalloid iodide, and/or the like), a metal telluride, or any combination thereof.

Examples of the metal oxide may include a tungsten oxide (e.g., WO, $W_2O_3$, $WO_2$, $WO_3$, $W_2O_5$, and/or the like), a vanadium oxide (e.g., VO, $V_2O_3$, $VO_2$, $V_2O_5$, and/or the like), a molybdenum oxide (MoO, $Mo_2O_3$, $MoO_2$, $MoO_3$, $Mo_2O_5$, and/or the like), a rhenium oxide (e.g., $ReO_3$ and/or the like), and/or the like.

Examples of the metal halide may include an alkali metal halide, an alkaline earth metal halide, a transition metal halide, a post-transition metal halide, a lanthanide metal halide, and/or the like.

Examples of the alkali metal halide may include LiF, NaF, KF, RbF, CsF,

LiCl, NaCl, KCl, RbCl, CsCl, LiBr, NaBr, KBr, RbBr, CsBr, LiI, NaI, KI, RbI, CsI, and/or the like.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and/or the like.

Examples of the transition metal halide may include a titanium halide (e.g., $TiF_4$, $TiCl_4$, $TiBr_4$, $TiI_4$, and/or the like), a zirconium halide (e.g., $ZrF_4$, $ZrCl_4$, $ZrBr_4$, $ZrI_4$, and/or the like), a hafnium halide (e.g., $HfF_4$, $HfCl_4$, $HfBr_4$, $HfI_4$, and/or the like), a vanadium halide (e.g., $VF_3$, $VCl_3$, $VBr_3$, $VI_3$, and/or the like), a niobium halide (e.g., $NbF_3$, $NbCl_3$, $NbBr_3$, $NbI_3$, and/or the like), a tantalum halide (e.g., $TaF_3$, $TaCl_3$, $TaBr_3$, $TaI_3$, and/or the like), a chromium halide (e.g., $CrF_3$, $CrCl_3$, $CrBr_3$, $CrI_3$, and/or the like), a molybdenum halide (e.g., $MoF_3$, $MoCl_3$, $MoBr_3$, $MoI_3$, and/or the like), a tungsten halide (e.g., $WF_3$, $WCl_3$, $WBr_3$, $WI_3$, and/or the like), a manganese halide (e.g., $MnF_2$, $MnCl_2$, $MnBr_2$, $MnI_2$, and/or the like), a technetium halide (e.g., $TcF_2$, $TcCl_2$, $TcBr_2$, $TcI_2$, and/or the like), a rhenium halide (e.g., $ReF_2$, $ReCl_2$, $ReBr_2$, $ReI_2$, and/or the like), an iron halide (e.g., $FeF_2$, $FeCl_2$, $FeBr_2$, $FeI_2$, and/or the like), a ruthenium halide (e.g., $RuF_2$, $RuCl_2$, $RuBr_2$, $RuI_2$, and/or the like), an osmium halide (e.g., $OsF_2$, $OsCl_2$, $OsBr_2$, $OsI_2$, and/or the like), a cobalt halide (e.g., $CoF_2$, $CoCl_2$, $CoBr_2$, $CoI_2$, and/or the like), a rhodium halide (e.g., $RhF_2$, $RhCl_2$, $RhBr_2$, $RhI_2$, and/or the like), an iridium halide (e.g., $IrF_2$, $IrCl_2$, $IrBr_2$, $Ir1_2$, and/or the like), a nickel halide (e.g., $NiF_2$, $NiCl_2$, $NiBr_2$, $NiI_2$, and/or the like), a palladium halide (e.g., $PdF_2$, $PdCl_2$, $PdBr_2$, $PdI_2$, and/or the like), a platinum halide (e.g., $PtF_2$, $PtCl_2$, $PtBr_2$, $PtI_2$, and/or the like), a copper halide (e.g., CuF, CuCl, CuBr, CuI, and/or the like), a silver halide (e.g., AgF, AgCl, AgBr, AgI, and/or the like), a gold halide (e.g., AuF, AuCl, AuBr, AuI, and/or the like), and/or the like.

Examples of the post-transition metal halide may include a zinc halide (e.g., $ZnF_2$, $ZnCl_2$, $ZnBr_2$, $ZnI_2$, and/or the like), an indium halide (e.g., $InI_3$ and/or the like), a tin halide (e.g., $SnI_2$ and/or the like), and/or the like.

Examples of the lanthanide metal halide may include YbF, $YbF_2$, $YbF_3$, Sm $F_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and/or the like.

Examples of the metalloid halide may include antimony halide (e.g., $SbCl_5$ and/or the like) and/or the like.

Examples of the metal telluride may include an alkali metal telluride (e.g., $Li_2Te$, $Na_2Te$, $K_2Te$, $Rb_2Te$, $Cs_2Te$, and/or the like), an alkaline earth metal telluride (e.g., BeTe, MgTe, CaTe, SrTe, BaTe, and/or the like), a transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and/or the like), a post-transition metal telluride (e.g., ZnTe and/or the like), a lanthanide metal telluride (e.g., LaTe, CeTe, PrTe, NdTe, PmTe, EuTe, GdTe, TbTe, DyTe, HoTe, ErTe, TmTe, YbTe, LuTe, and/or the like), and/or the like.

[Emission layer in interlayer 130]

When the light-emitting device 10 is a full color light-emitting device, the emission layer may be patterned into a red emission layer, a green emission layer, and/or a blue emission layer, according to a sub-pixel. In one or more embodiments, the emission layer may have a stacked structure. The stacked structure may include two or more layers selected from a red emission layer, a green emission layer, and a blue emission layer. In some embodiments, the two or more layers may be in direct contact with each other. In some embodiments, the two or more layers may be separated from each other. In one or more embodiments, the emission layer may include two or more materials. The two or more materials may each independently include a red light-emitting material, a green light-emitting material, or a blue light-emitting material. The two or more materials may be mixed with each other in a single layer. The two or more materials mixed with each other in the single layer may be to emit white light.

The emission layer may include a host and a dopant. The dopant may be a phosphorescent dopant, a fluorescent dopant, or any combination thereof.

The amount of the dopant in the emission layer may be in a range of about 0.01 parts to about 15 parts by weight based on 100 parts by weight of the host.

In some embodiments, the emission layer may include a quantum dot.

The emission layer may include a delayed fluorescence material. The delayed fluorescence material may serve as a host or a dopant in the emission layer.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

[Host]

The host may include the condensed cyclic compound represented by Formula 1.

[Phosphorescent Dopant]

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In some embodiments, the phosphorescent dopant may include an organometallic complex represented by Formula 401:

Formula 401

$$M(L_{401})_{xc1}(L_{402})_{xc2}$$

Formula 402

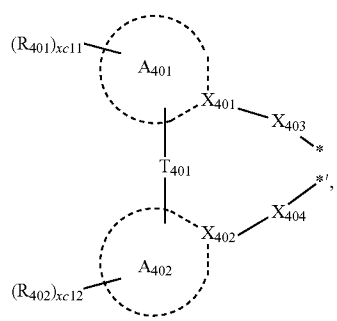

wherein, in Formulae 401 and 402,

M may be a transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), and/or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—C(═O)—*—I, *—N($Q_{411}$)—*I', *—C($O_{411}$)($Q_{412}$)—*I', *—C($O_{411}$)═C($Q_{412}$)-', *—C($Q_{411}$)═*', or *═C═', $X_{403}$ and $X_{404}$ may each independently be a chemical bond (e.g., a covalent bond or a coordinate bond), O, S, N($O_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ may each independently be the same as $Q_1$, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) $X_{401}$ and $X_{402}$ may both (e.g., simultaneously) be nitrogen.

In one or more embodiments, when xc1 in Formula 402 is 2 or greater, two ring $A_{401}$(s) of at least two $L_{401}$(s) may optionally be bound via $T_{402}$ as a linking group, or two ring $A_{402}$(s) may optionally be bound via $T_{403}$ as a linking group (see Compounds PD1 to PD4 and PD7). $T_{402}$ and $T_{403}$ may each independently be the same as $T_{401}$.

$L_{402}$ in Formula 401 may be any suitable organic ligand. For example, $L_{402}$ may be a halogen group, a diketone group (e.g., an acetylacetonate group), a carboxylic acid group (e.g., a picolinate group), ═C(═O), an isonitrile group, —CN, or a phosphorus group (e.g., a phosphine group or a phosphite group).

The phosphorescent dopant may be, for example, one of Compounds PD1 to PD25 or any combination thereof:

PD1

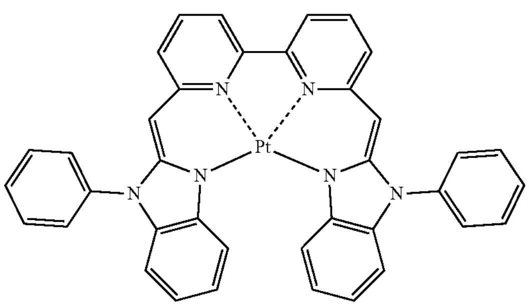

PD2

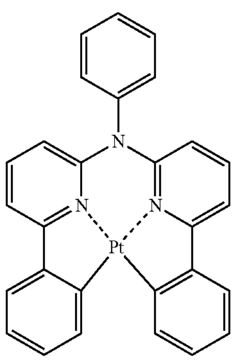

PD3

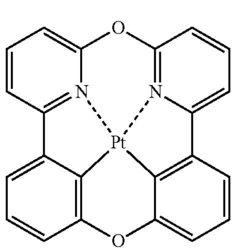

-continued

PD4

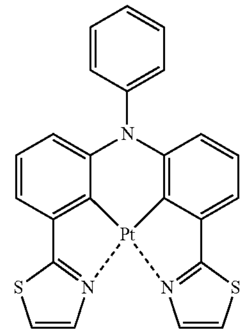

PD5

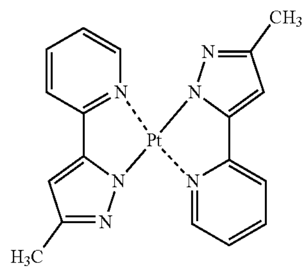

PD6

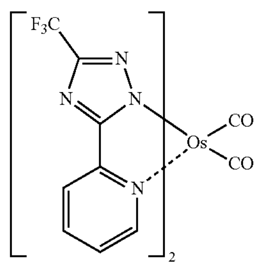

PD7

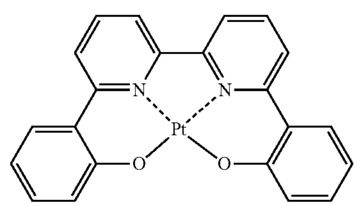

PD8

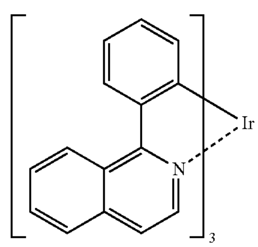

PD9

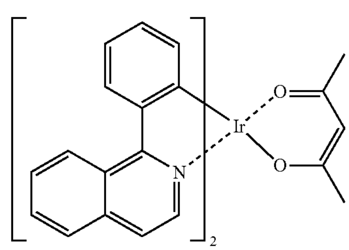

-continued
PD10
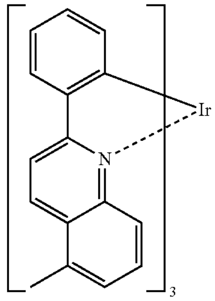
PD11
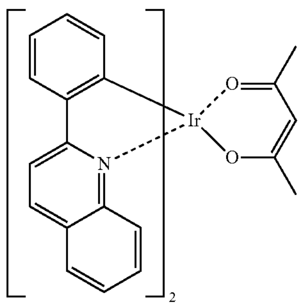
PD12
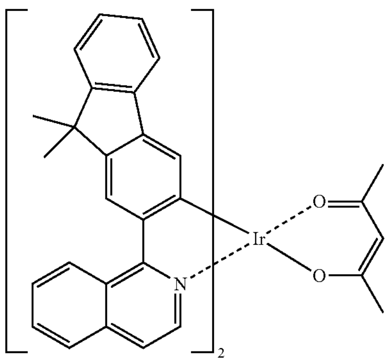
PD13
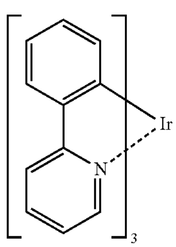
PD14
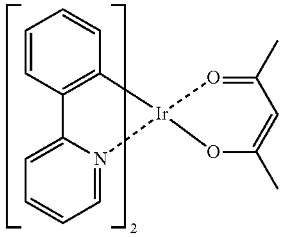
-continued
PD15
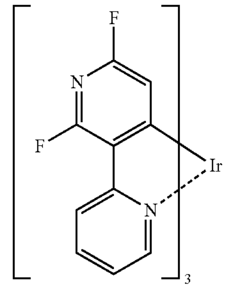
PD16
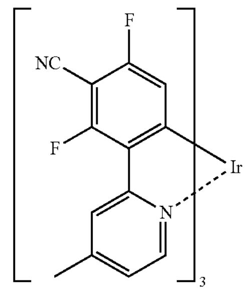
PD17
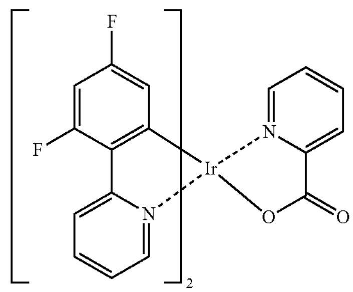
PD18
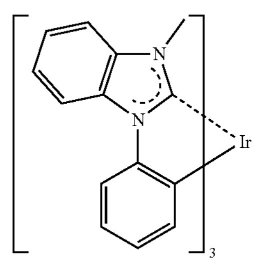
PD19
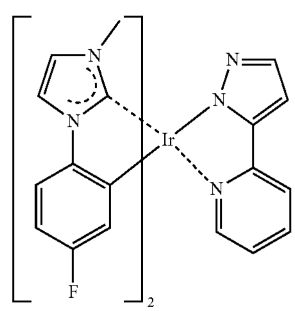

-continued

PD20

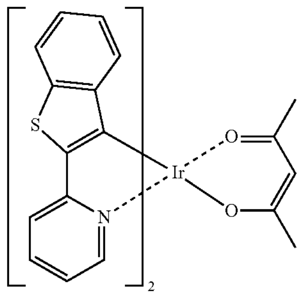

PD21

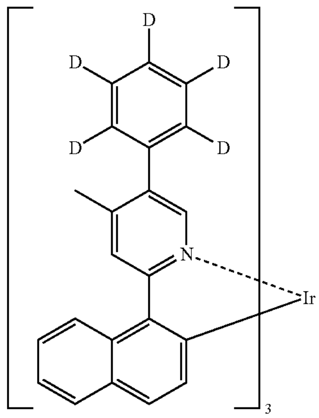

PD22

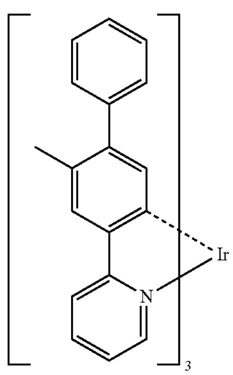

PD23

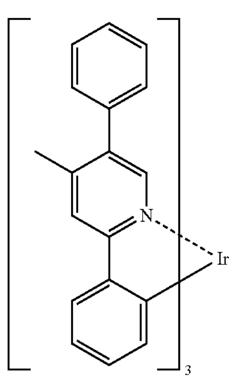

-continued

PD24

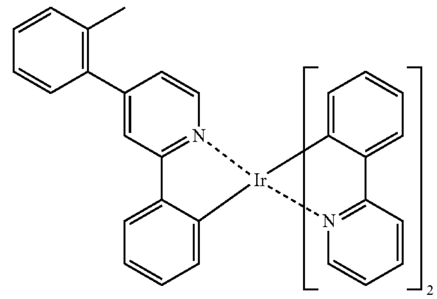

PD25

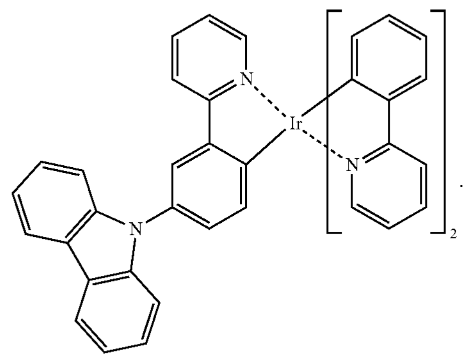

[Fluorescent Dopant]

The fluorescent dopant may include an amine group-containing compound, a styryl group-containing compound, or any combination thereof.

In some embodiments, the fluorescent dopant may include a compound represented by Formula 501:

Formula 501

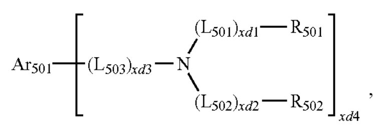

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In some embodiments, in Formula 501, $Ar_{501}$ may include a condensed ring group in which at least three monocyclic groups are condensed (e.g., may be an anthracene group, a chrysene group, or a pyrene group).

In some embodiments, xd4 in Formula 501 may be 2.

In some embodiments, the fluorescent dopant may include one of Compounds FD1 to FD36, DPVBi, DPAVBi, or any combination thereof:

FD1
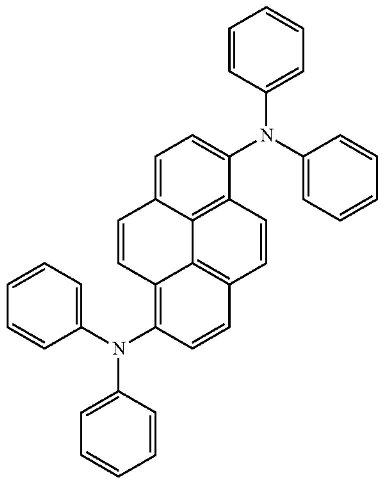
FD2
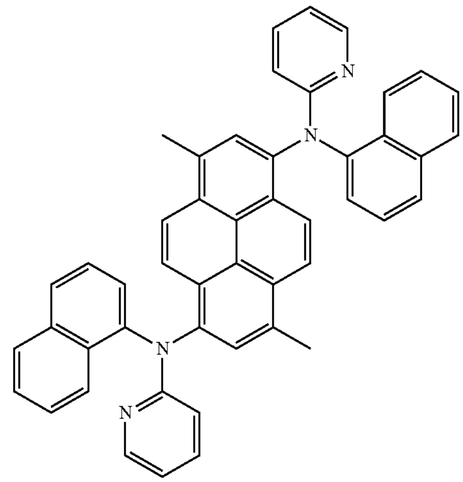
FD3
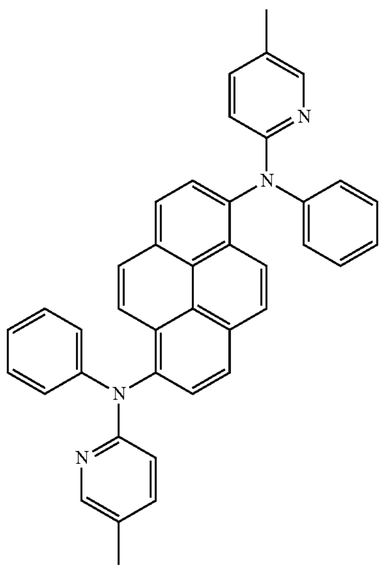
FD4
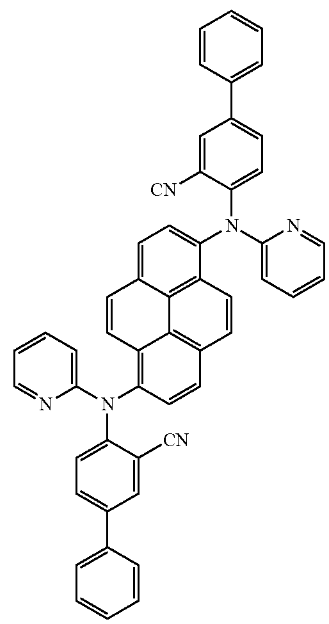
FD5
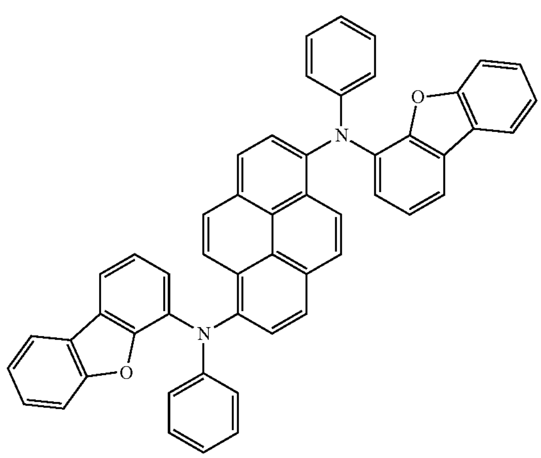
FD6
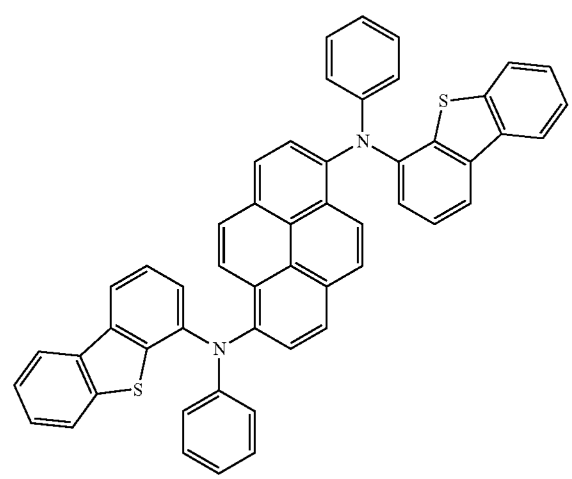

-continued
FD7
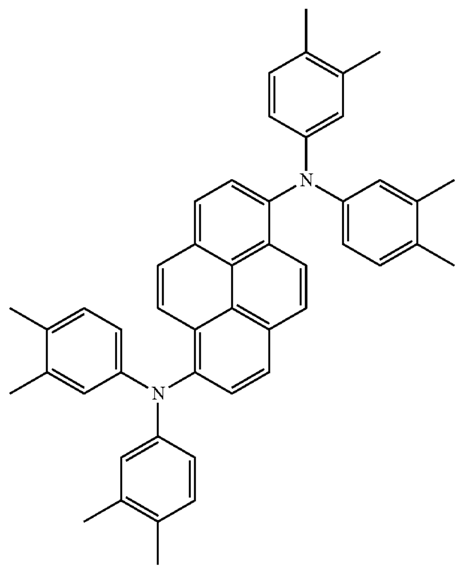
FD8
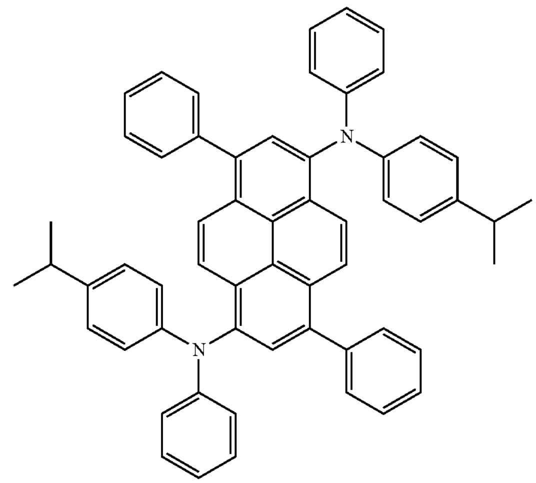
FD9
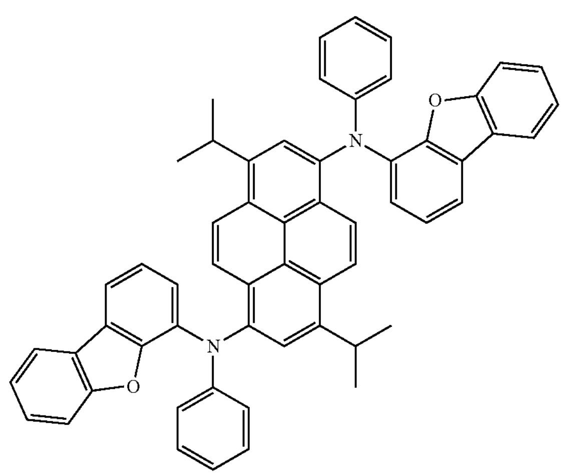
FD10
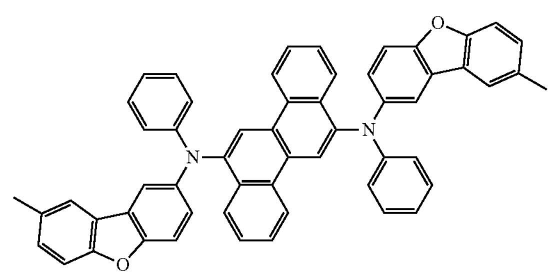
FD11
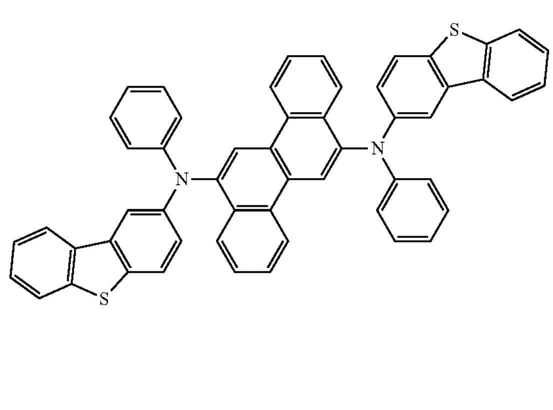
FD12
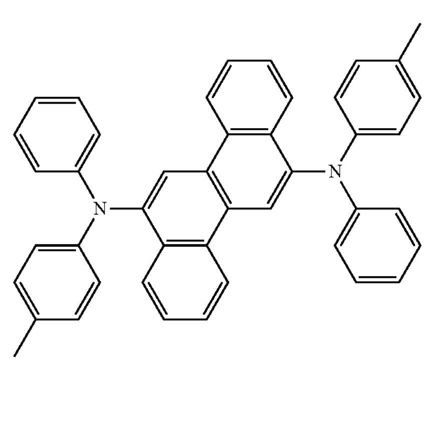

-continued
FD13
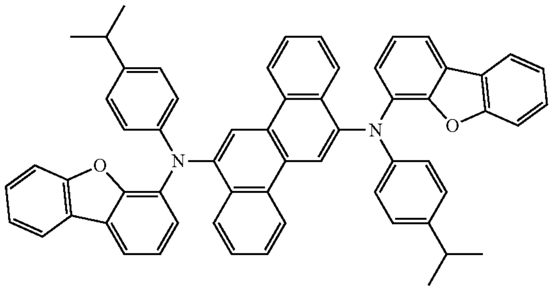
FD14
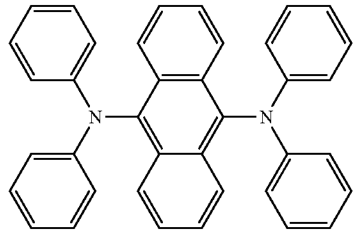
FD15
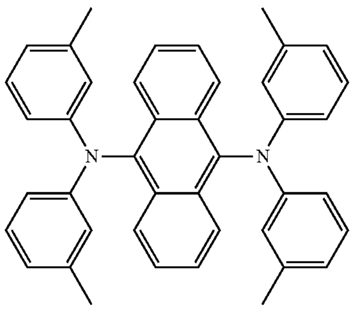
FD16
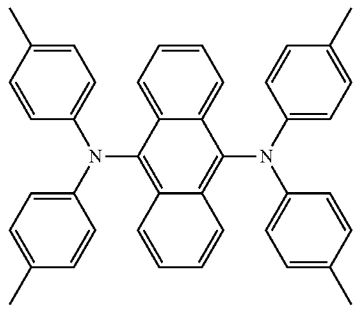
FD17
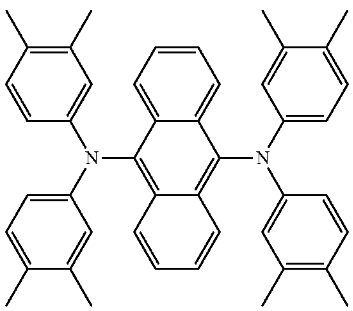
FD18
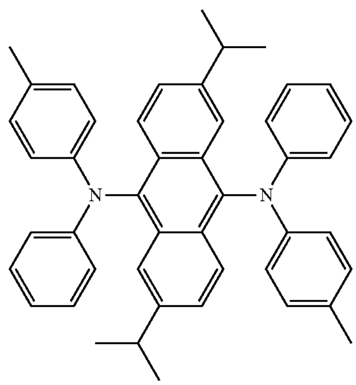
FD19
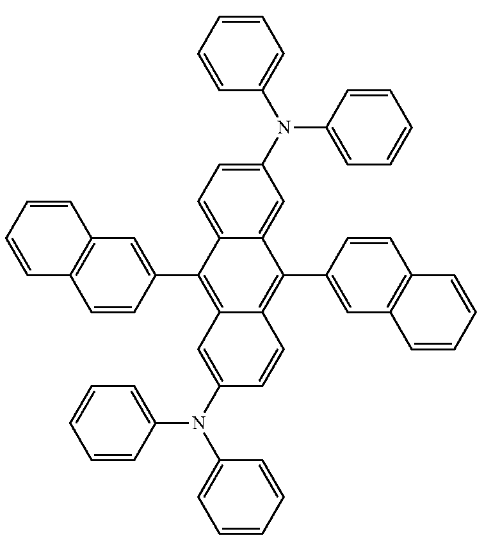
FD20
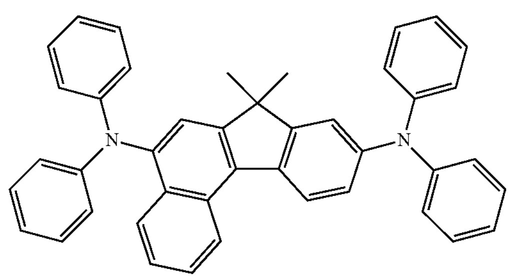

-continued
FD21
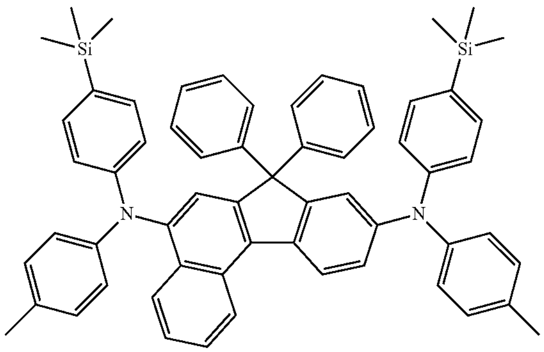
FD22
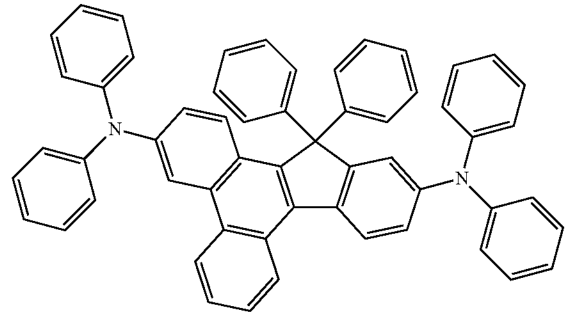
FD23
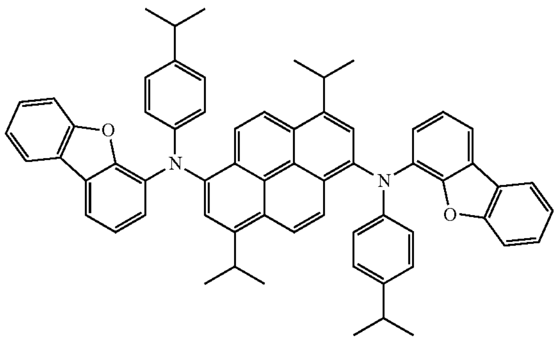
FD24
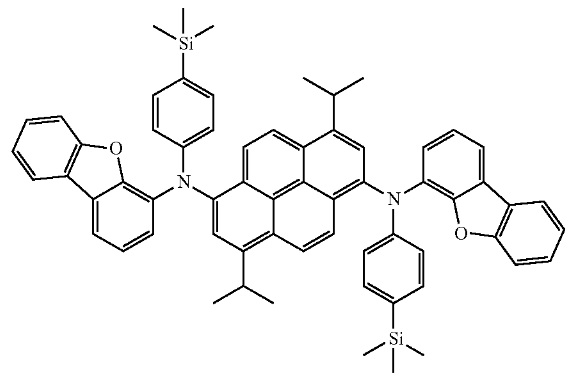
FD25
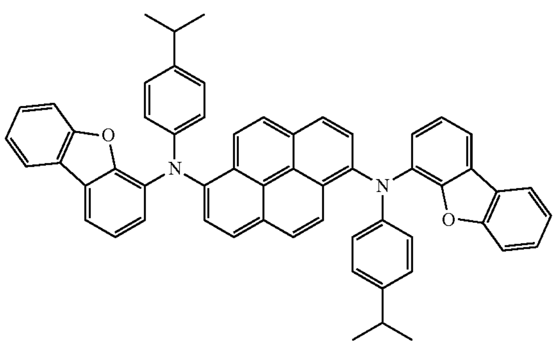
FD26
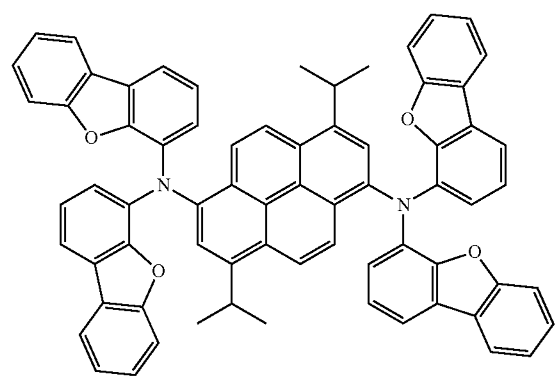
FD27
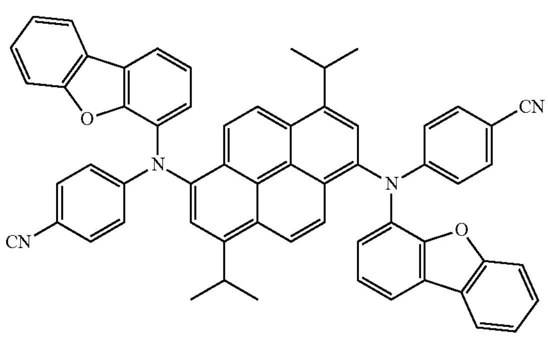
FD28
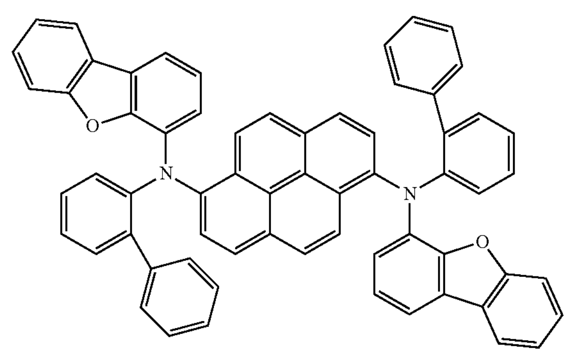

-continued
FD29
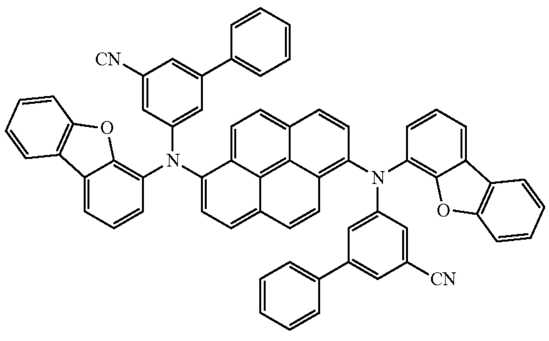
FD30
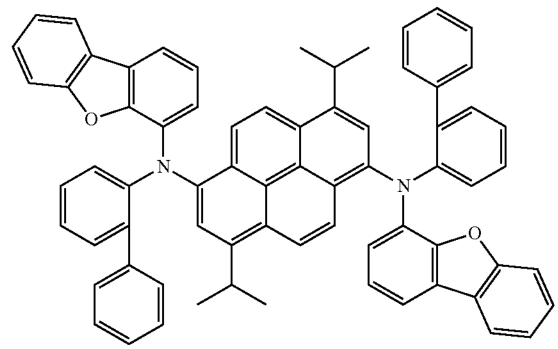
FD31
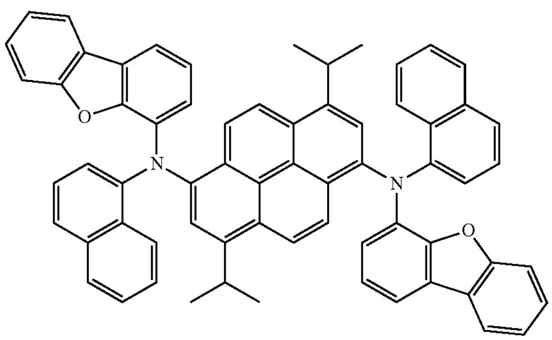
FD32
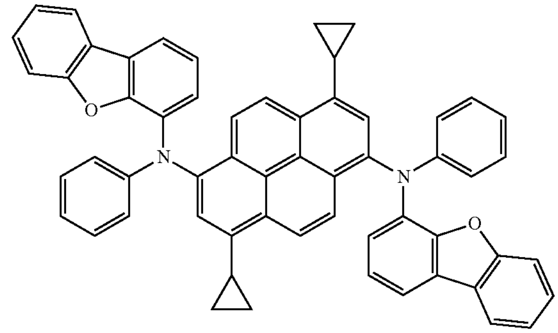
FD33
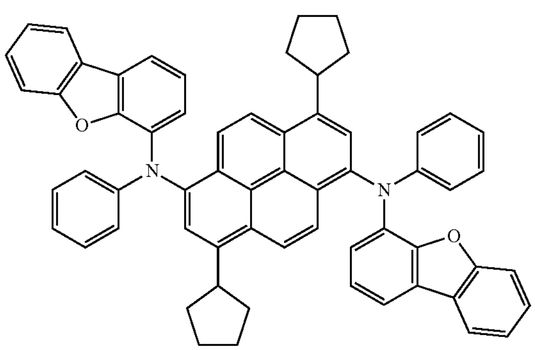
FD34
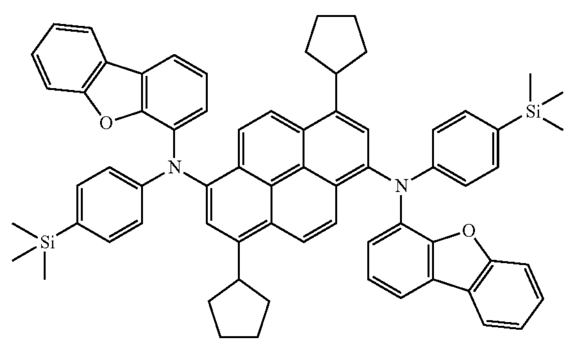
FD35
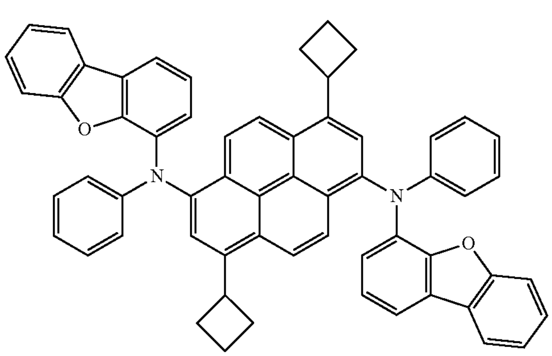
FD36
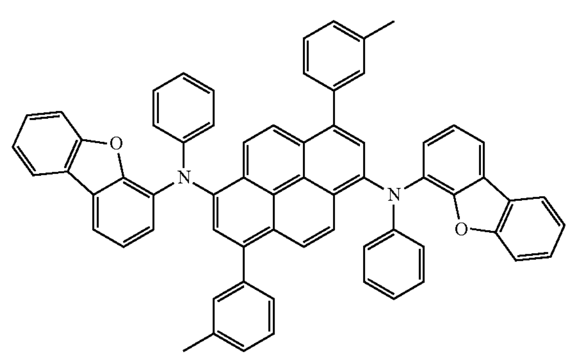

-continued

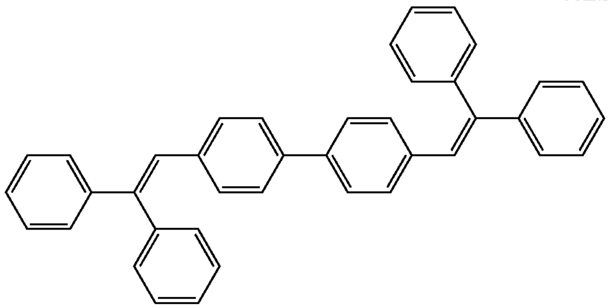

DPVBi

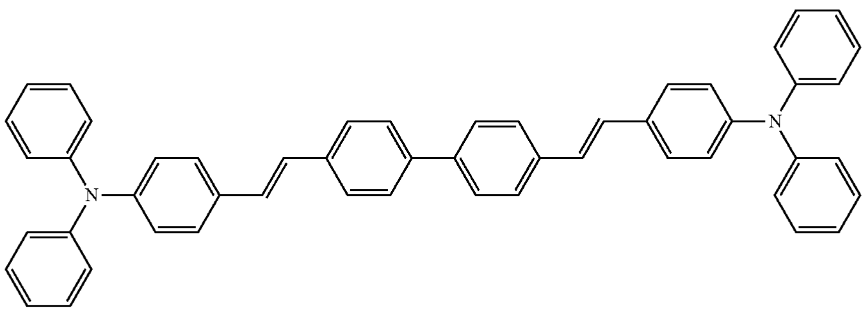

DPAVBi

[Delayed Fluorescence Material]

The emission layer may include a delayed fluorescence material.

The delayed fluorescence material described herein may be any suitable compound that may be to emit delayed fluorescence according to a delayed fluorescence emission mechanism.

The delayed fluorescence material included in the emission layer may serve as a host or a dopant, depending on the types (kinds) of other materials included in the emission layer.

In some embodiments, a difference between a triplet energy level (eV) of the delayed fluorescence material and a singlet energy level (eV) of the delayed fluorescence material may be about 0 eV or greater and about 0.5 eV or less. When the difference between a triplet energy level (eV) of the delayed fluorescence material and a singlet energy level (eV) of the delayed fluorescence material is within this range, up-conversion from a triplet state to a singlet state in the delayed fluorescence material may occur effectively (e.g., with high efficiency), thus improving luminescence efficiency and/or the like of the light-emitting device 10.

In some embodiments, the delayed fluorescence material may include: i) a material including at least one electron donor (e.g., a π electron-rich $C_3$-$C_{60}$ cyclic group, such as a carbazole group and/or the like) and at least one electron acceptor (e.g., a sulfoxide group, a cyano group, a π electron-deficient nitrogen-containing $C_1$-$C_{60}$ cyclic group, and/or the like), ii) a material including a $C_8$-$C_{60}$ polycyclic group including at least two cyclic groups condensed to each other and sharing boron (B), and/or the like.

Examples of the delayed fluorescence material may include at least one of

Compounds DF1 to DF9:

DF1

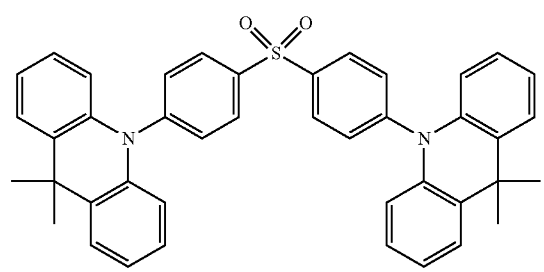

(DMAC-DPS)

DF2

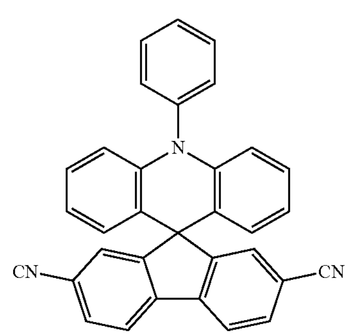

(ACRFLCN)

-continued

DF3

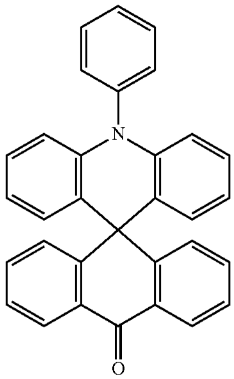

(ACRSA)

DF4

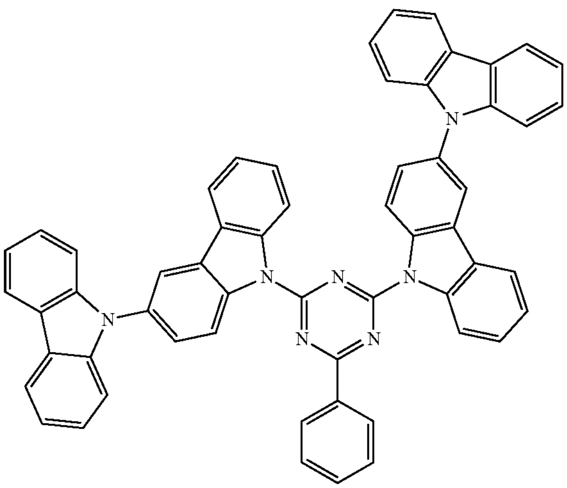

(CC2TA)

DF5

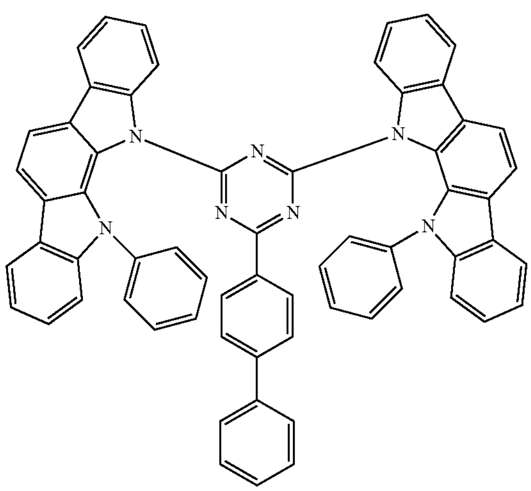

(PIC-TRZ)

-continued

DF6

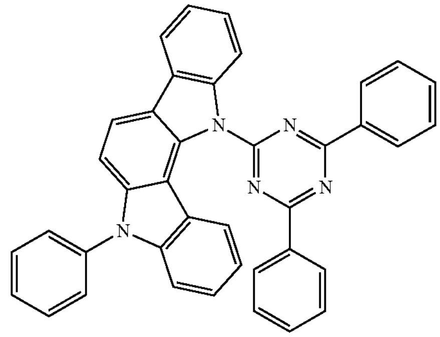

(PIC-TRZ2)

DF7

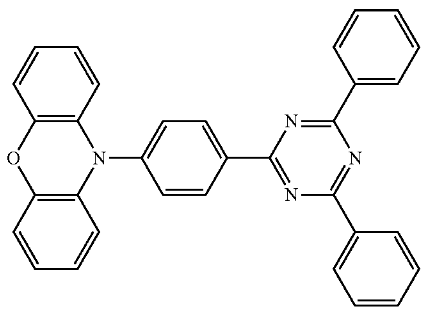

(PXZ-TRZ)

DF8

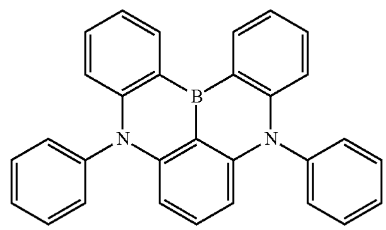

(DABNA-1)

DF9

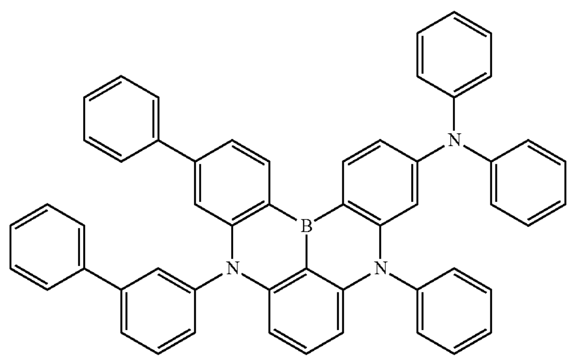

(DABNA-2)

[Quantum Dots]

The emission layer may include quantum dots.

The term "quantum dot" as utilized herein refers to a crystal of a semiconductor compound and may include any suitable material capable of emitting emission wavelengths of one or more suitable lengths according to the size of the crystal.

The diameter of the quantum dot may be, for example, in a range of about 1 nm to about 10 nm.

Quantum dots may be synthesized by a wet chemical process, an organic metal chemical vapor deposition process, a molecular beam epitaxy process, or any similar process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be easier to perform than a vapor deposition process (such a metal organic chemical vapor deposition (MOCVD) and/or a molecular beam epitaxy (MBE) process). Further, the growth of quantum dot particles may be controlled or selected with a lower manufacturing cost.

The quantum dot may include a Group II-VI semiconductor compound; a Group III-V semiconductor compound; a Group III-VI semiconductor compound; a Group semiconductor compound; a Group IV-VI semiconductor compound; a Group IV element or compound; or any combination thereof.

Examples of the Group II-VI semiconductor compound may include a binary compound (such as CdS, CdSe, CdTe, ZnS, ZnSe, ZnTe, ZnO, HgS, HgSe, HgTe, MgSe, and/or MgS); a ternary compound (such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS); a quaternary compound (such as CdZnSeS, CdZnSeTe, CdZnSTe, CdHgSeS, CdHgSeTe, CdHgSTe, HgZnSeS, HgZnSeTe, and/or HgZnSTe); or any combination thereof.

Examples of the Group III-V semiconductor compound may include a binary compound (such as GaN, GaP, GaAs, GaSb, AlN, AlP, AlAs, AlSb, InN, InP, InAs, and/or InSb); a ternary compound (such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb); a quaternary compound (such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb); or any combination thereof. In some embodiments, the Group III-V semiconductor compound may further include a group II element. Examples of the Group III-V semiconductor compound further including the Group II element may include InZnP, InGaZnP, InAlZnP, and/or the like.

Examples of the III-VI Group semiconductor compound may include a binary compound (such as GaS, GaSe, $Ga_2Se_3$, GaTe, InS, InSe, $In_2S_3$, $In_2Se_3$, InTe, and/or the like); a ternary compound (such as $InGaS_3$, $InGaSe_3$, and/or the like); or any combination thereof.

Examples of the Group I-III-VI semiconductor compound may include a ternary compound (such as AgInS, $AgInS_2$, CuInS, $CuInS_2$, $CuGaO_2$, $AgGaO_2$, $AgAlO_2$, or any combination thereof).

Examples of the Group IV-VI semiconductor compound may include a binary compound (such as SnS, SnSe, SnTe, PbS, PbSe, and/or PbTe); a ternary compound (such as SnSeS, SnSeTe, SnSTe, PbSeS, PbSeTe, PbSTe, SnPbS, SnPbSe, and/or SnPbTe); a quaternary compound (such as SnPbSSe, SnPbSeTe, and/or SnPbSTe); or any combination thereof.

The Group IV element or compound may be a single element material (such as Si and/or Ge); a binary compound (such as SiC and/or SiGe); or any combination thereof.

Individual elements included in the multi-element compound, (such as a binary compound, a ternary compound, and/or a quaternary compound), may be present in a particle thereof at a substantially uniform or non-uniform concentration.

The quantum dot may have a single structure in which the concentration of each element included in the quantum dot is substantially spatially uniform, or a core-shell double structure (e.g., in which the concentrations of each element included in the quantum dot vary between the core and the shell). In some embodiments, the materials included in the core may be different from the materials included in the shell.

The shell of the quantum dot may serve as a protective layer for preventing or reducing chemical denaturation of the core in order to maintain semiconductor characteristics, and/or as a charging layer for imparting electrophoretic characteristics to the quantum dot. The shell may be a monolayer or a multilayer. An interface between a core and a shell may have a concentration gradient where a concentration of elements present in the shell decreases toward the core.

Examples of the shell of the quantum dot include metal, metalloid, or nonmetal oxide, a semiconductor compound, or a combination thereof. Examples of the metal oxide, metalloid, or nonmetal oxide may include: a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO); a ternary compound (such as $MgAl_2O_4$, $CoFe_2O_4$, $NiFe_2O_4$, and/or $CoMn_2O_4$); and any combination thereof. Examples of the semiconductor compound may include a Group II-VI semiconductor compound; a Group III-V semiconductor compound; a group III-VI semiconductor compound; a Group I-III-VI semiconductor compound; a Group IV-VI semiconductor compound; or any combination thereof. In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width at half maximum (FWHM) of a spectrum of an emission wavelength of about 45 nm or less, about 40 nm or less, or about 30 nm or less. When the FWHM of the quantum dot is within this range, color purity or color reproducibility may be improved. In some embodiments, because light emitted through the quantum dot is emitted in all directions, an optical viewing angle may be improved.

In some embodiments, the quantum dot may be a spherical, pyramidal, multi-arm, or cubic nanoparticle, nanotube, nanowire, nanofiber, or nanoplate particle.

By adjusting the size of the quantum dot, the energy band gap may also be adjusted, thereby obtaining light of one or more suitable wavelengths in the quantum dot emission layer. By utilizing quantum dots of various suitable sizes, a light-emitting device that may be to emit light of various suitable wavelengths may be realized. In some embodiments, the size of the quantum dot may be selected such that the quantum dot may be to emit red, green, and/or blue light. In some embodiments, the size of the quantum dot may be selected such that the quantum dot may be to emit white light by combining one or more suitable light colors.

[Electron Transport Region in Interlayer 130]

The electron transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron transport region may include a buffer layer, a hole blocking layer, an electron control layer, an electron transport layer, or an electron injection layer.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order.

The electron transport region (e.g., a buffer layer, a hole blocking layer, an electron control layer, or an electron transport layer in the electron transport region) may include a metal-free compound including at least one 7 electron-deficient nitrogen-containing $C_1$-$C_{60}$ cyclic group.

In some embodiments, the electron transport region may include a compound represented by Formula 601:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each independently be the same as $Q_1$, xe21 may be 1, 2, 3, 4, or 5, and at least one of $Ar_{601}$, $L_{601}$, and $R_{601}$ may each independently be a 7 electron-deficient nitrogen-containing $C_1$-$C_{60}$ cyclic group unsubstituted or substituted with at least one $R_{10a}$.

In some embodiments, when xe11 in Formula 601 is 2 or greater, at least two $Ar_{601}$(s) may be bound via a single bond.

In some embodiments, in Formula 601, $Ar_{601}$ may be a substituted or unsubstituted anthracene group.

In some embodiments, the electron transport region may include a compound represented by Formula 601-1:

Formula 601-1

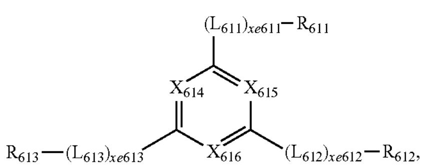

wherein, in Formula 601-1, $X_{614}$ may be N or C($R_{614}$), $X_{615}$ may be N or C($R_{615}$), $X_{616}$ may be N or C($R_{616}$), at least one selected from $X_{614}$ to $X_{616}$ may be N, $L_{611}$ to $L_{613}$ may each independently be the same as $L_{601}$, xe611 to xe613 may each independently be the same as xe1

$R_{611}$ to $R_{613}$ may each independently be the same as $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

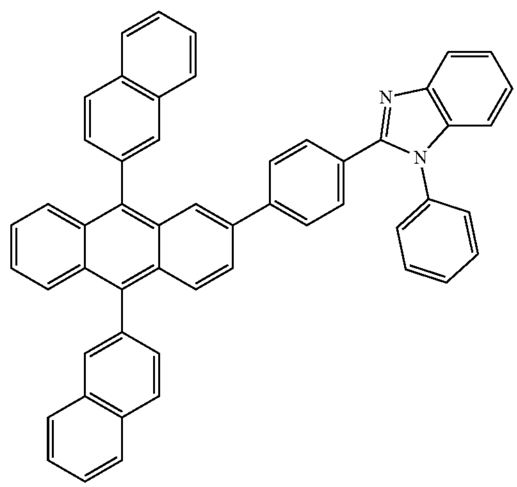

ET2

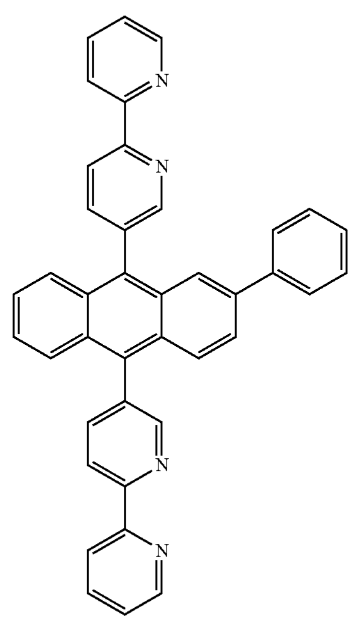

-continued
ET3
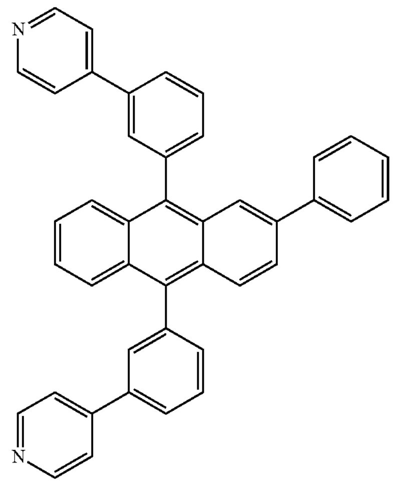
ET4
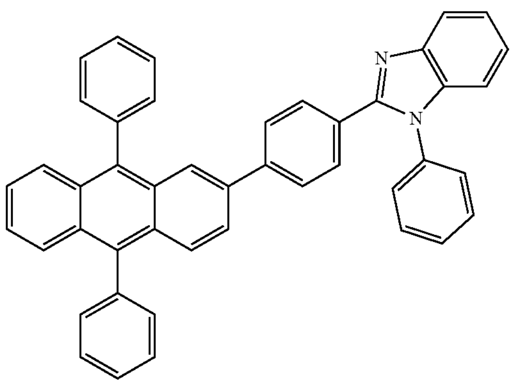
ET5
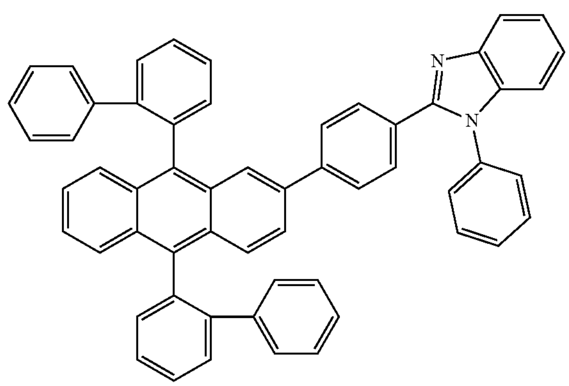
ET6
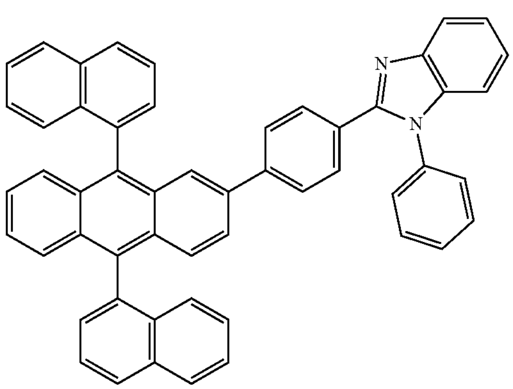
-continued
ET7
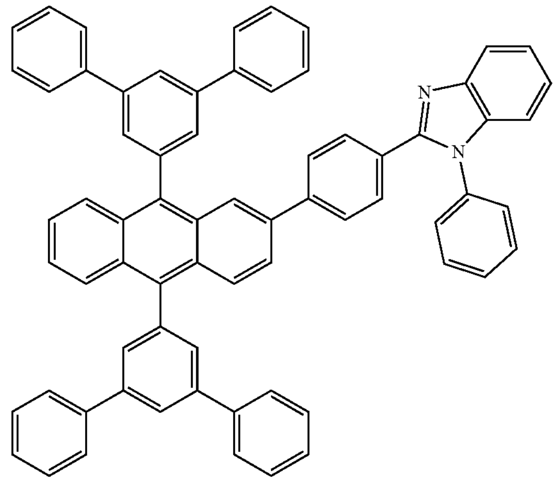
ET8
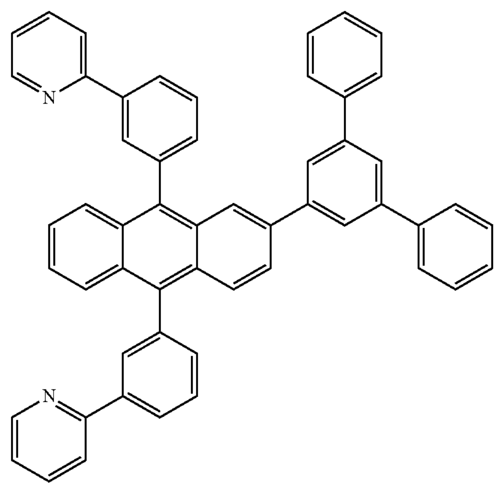
ET9
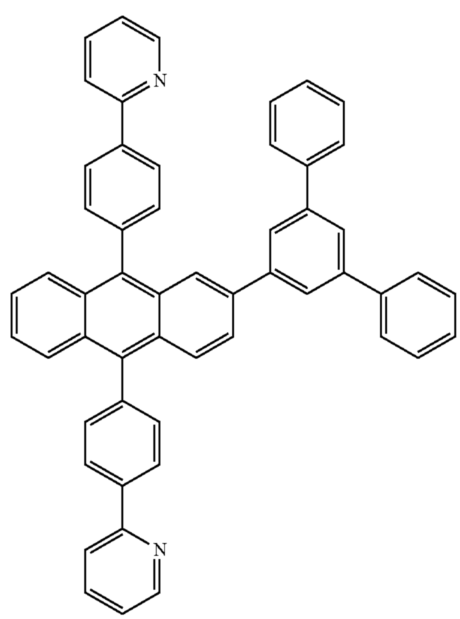

ET10
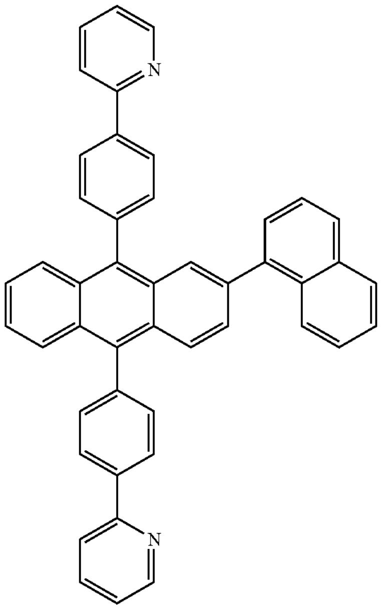
ET11
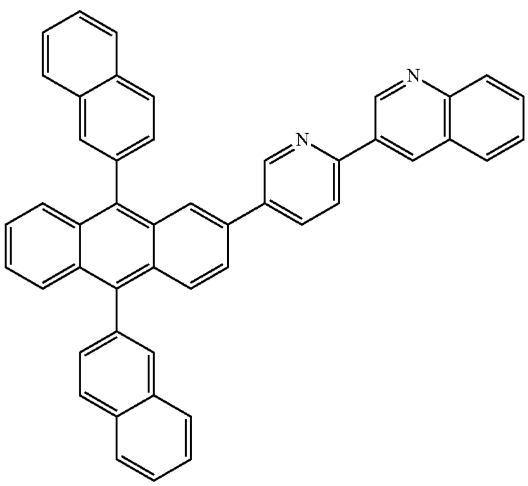
ET12
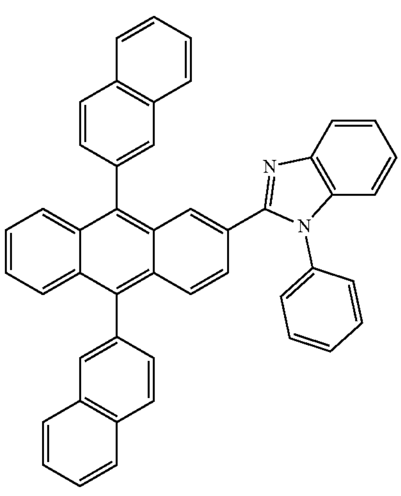
ET13
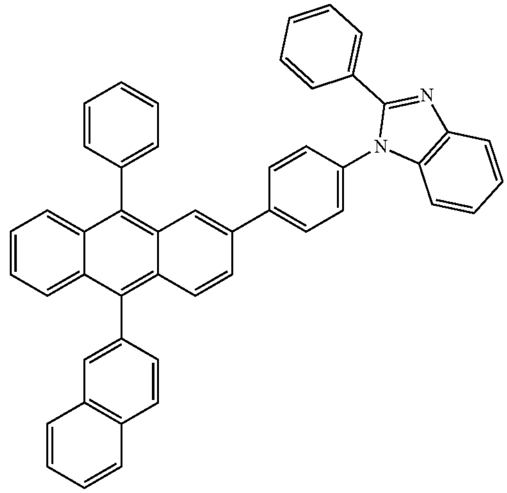
ET14
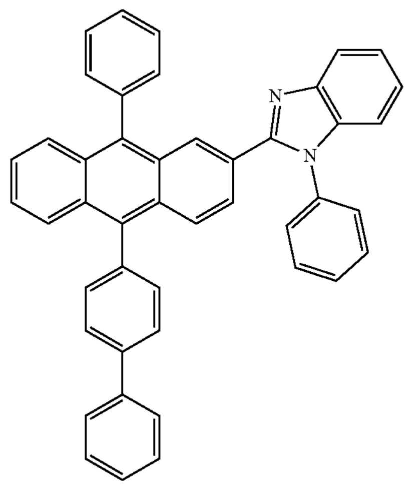
ET15
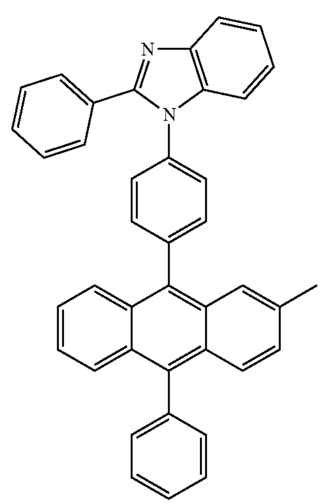

ET16
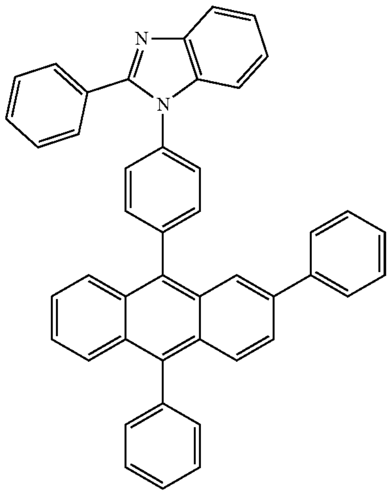
ET17
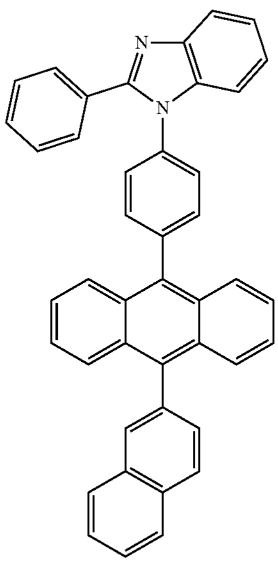
ET18
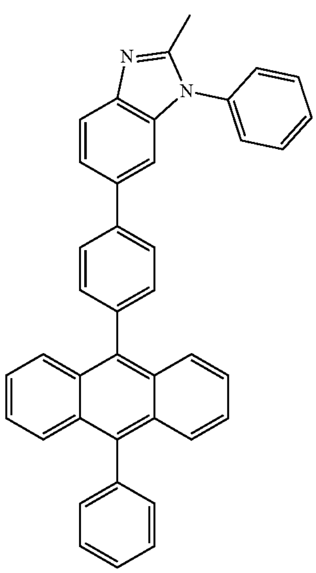
ET19
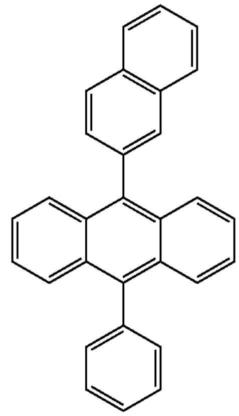
ET20
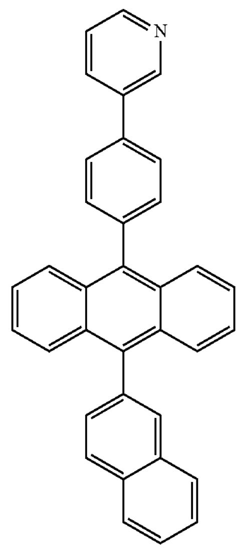
ET21
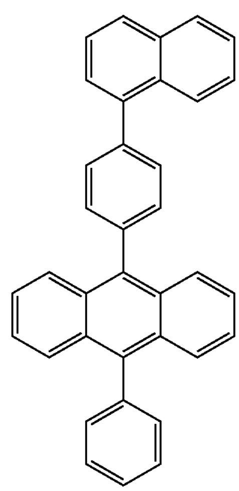

-continued
ET22
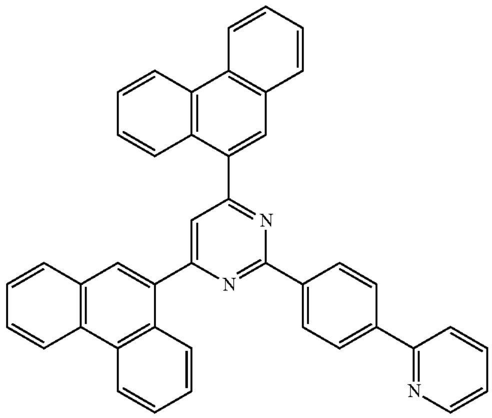
ET23
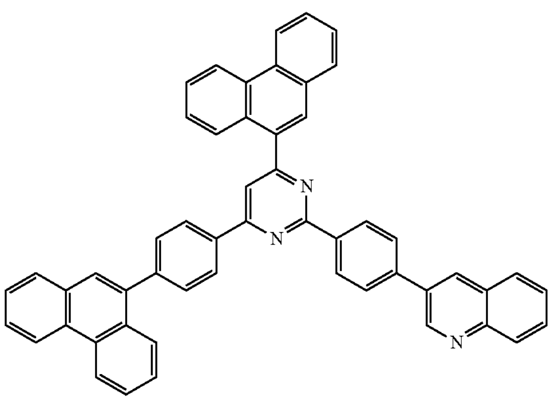
ET24
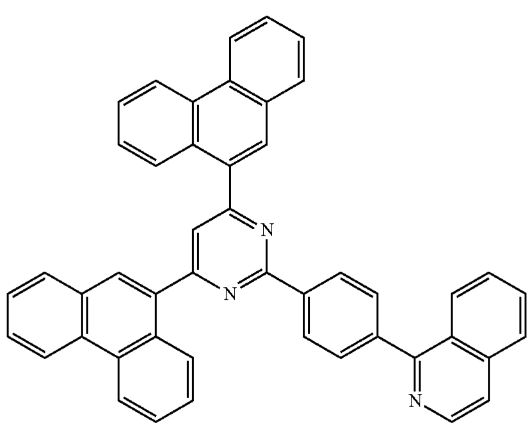
-continued
ET25
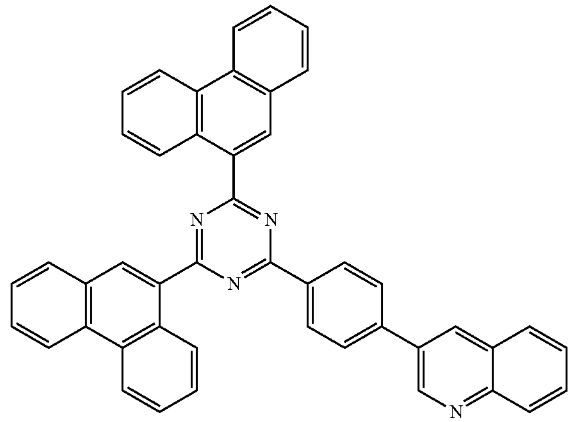
ET26
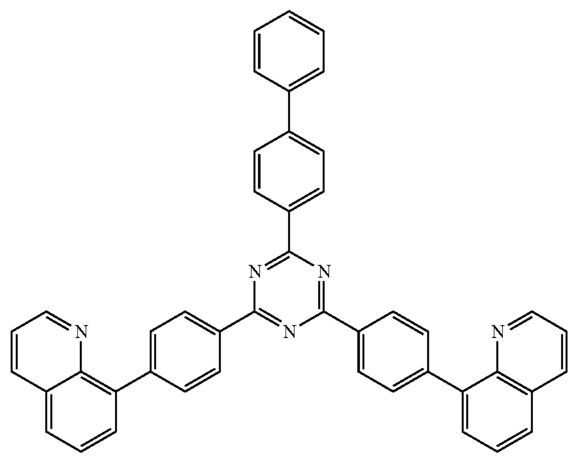
ET27
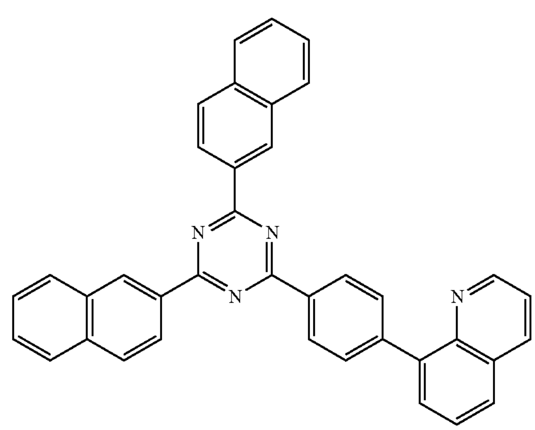

-continued
ET28
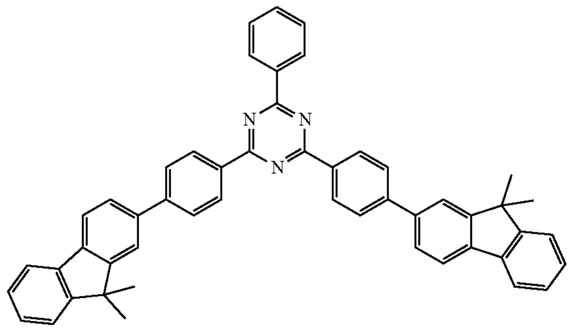
ET29
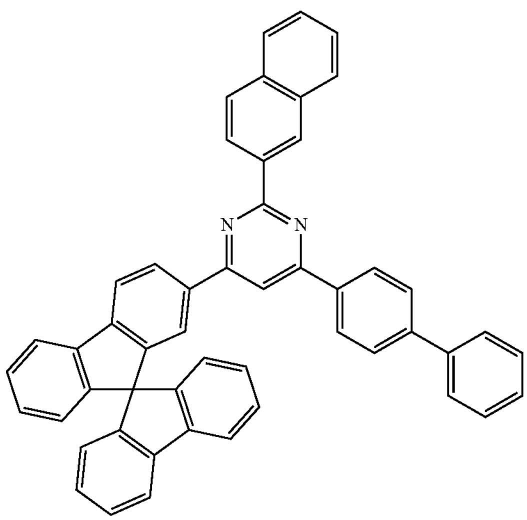
ET30
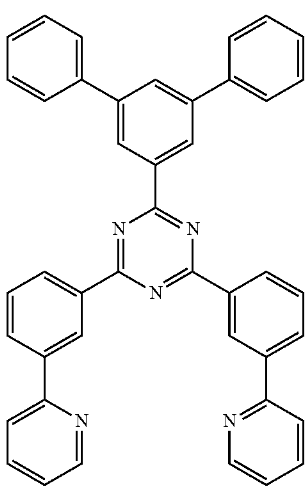
-continued
ET31
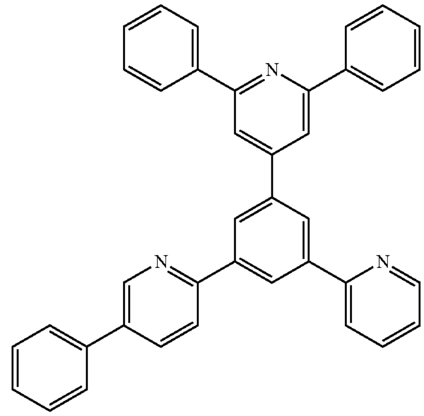
ET32
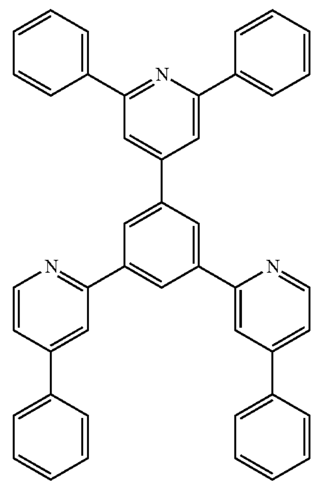
ET33
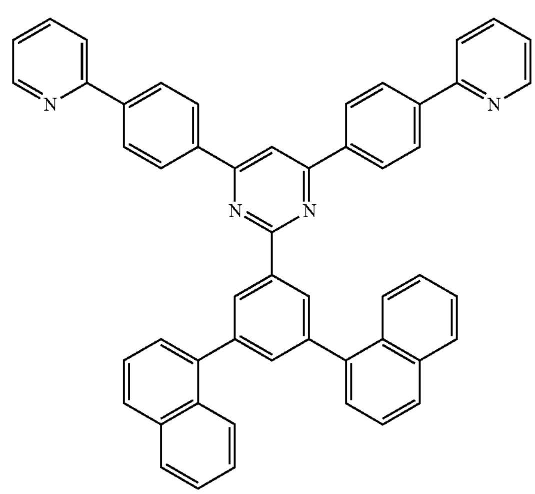

ET34
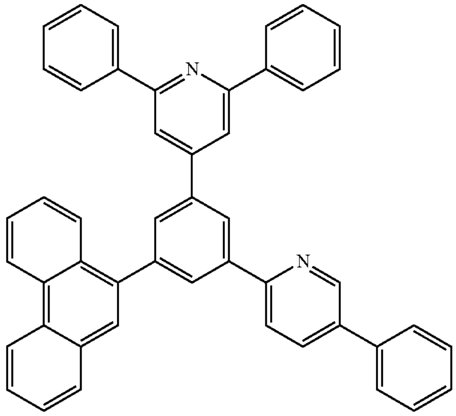
ET35
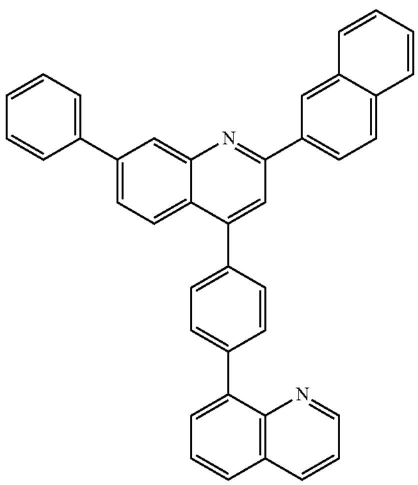
ET36
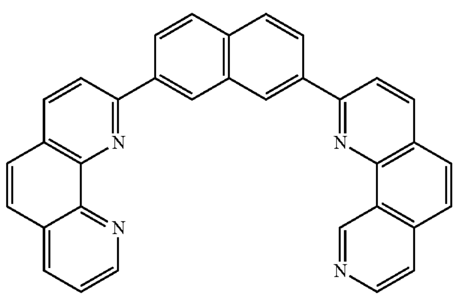
ET37
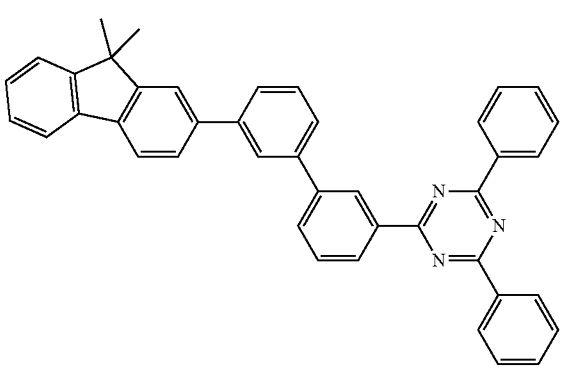
ET38
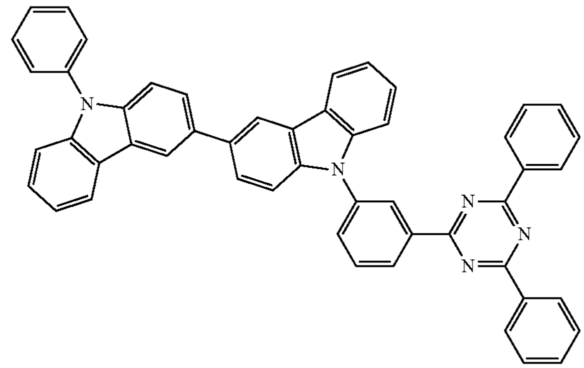
ET39
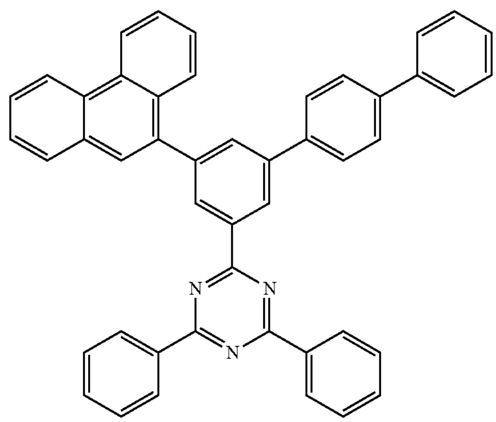
ET40
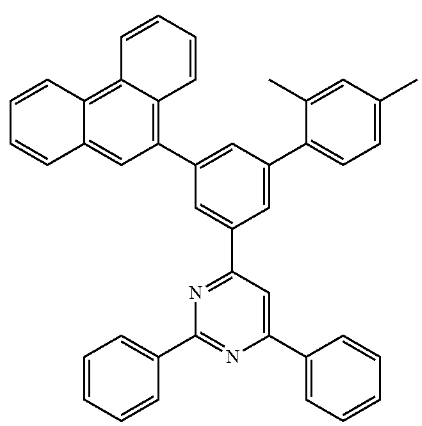

ET41
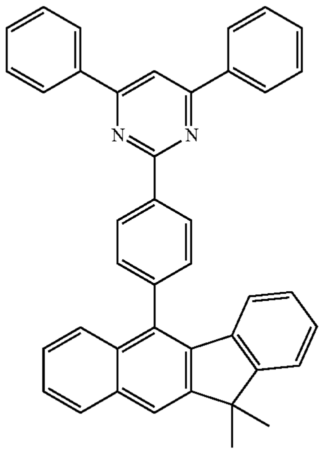
ET42
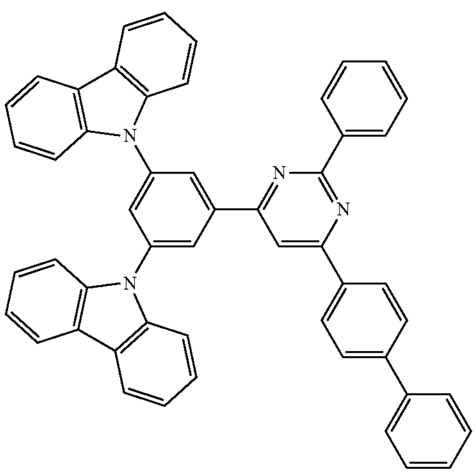
ET43
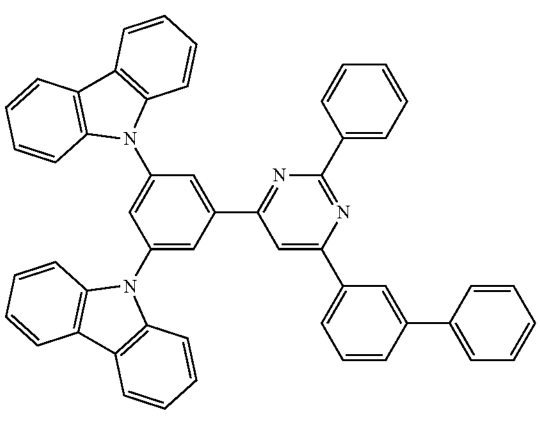
ET44
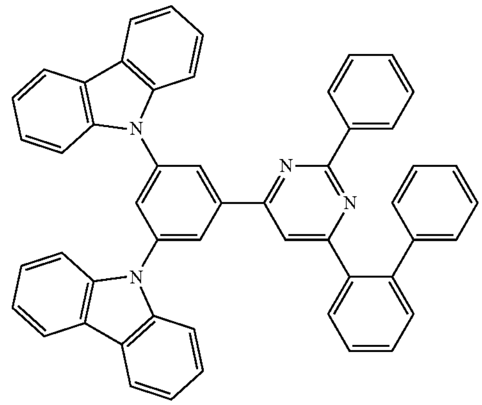
ET45
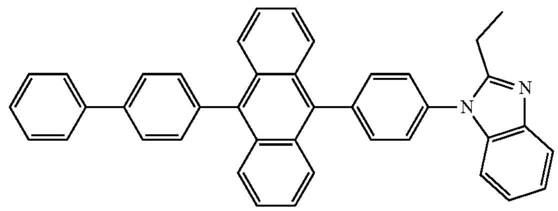
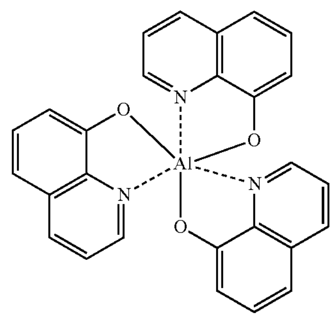
$Alq_3$
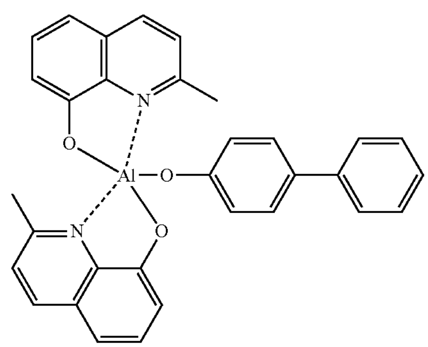
BAlq
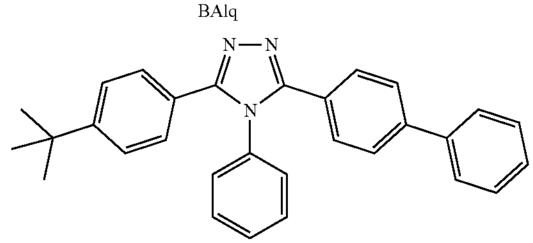
TAZ -continued

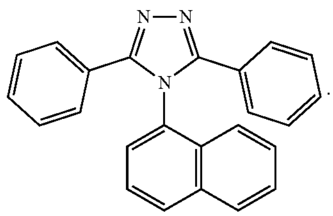

NTAZ

-continued

ET-D2

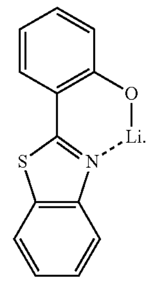

The thickness of the electron transport region may be in a range of about 50 Angstroms (A) to about 5,000 Å, for example, about 100 Å to about 4,000 Å. When the electron transport region includes a buffer layer, a hole blocking layer, an electron control layer, an electron transport layer, or any combination thereof, the thicknesses of the buffer layer, the hole blocking layer, or the electron control layer may each independently be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport layer are each within these ranges, excellent or suitable electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) or Compound ET-D2:

ET-D1

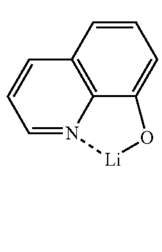

The electron transport region may include an electron injection layer to facilitate injection of electrons from the second electrode 150. The electron injection layer may be in direct contact with the second electrode 150.

The electron injection layer may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be lithium (Li), sodium (Na), potassium (K), rubidium (Rb), cesium (Cs) or any combination thereof. The alkaline earth metal may be magnesium (Mg), calcium (Ca), strontium (Sr), barium (Ba), or any combination thereof. The rare earth metal may be scandium (Sc), yttrium (Y), cerium (Ce), terbium (Tb), ytterbium (Yb), gadolinium (Gd), or any combination thereof.

The alkali metal-containing compound, the alkaline earth metal-containing compound, and the rare earth metal-containing compound may each independently be one or more oxides, halides (e.g., fluorides, chlorides, bromides, or iodides), tellurides, or any combination thereof of each of the alkali metal, the alkaline earth metal, and the rare earth metal, respectively.

The alkali metal-containing compound may be one or more alkali metal oxides (such as $Li_2O$, $Cs_2O$, and/or $K_2O$), alkali metal halides (such as LiF, NaF, CsF, KF, LiI, NaI, CsI, and/or KI), or any combination thereof. The alkaline earth-metal-containing compound may include one or more alkaline earth-metal oxides, (such as BaO, SrO, CaO, $Ba_xSr_{1-x}O$, (wherein x is a real number satisfying $0<x<1$), and/or $Ba_xCa_{1-x}O$ (wherein x is a real number satisfying $0<x<1$)). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2re_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and/or the like.

The alkali metal complex, the alkaline earth metal complex, and the rare earth metal complex may include: i) an ion of the alkali metal, alkaline earth metal, and rare earth metal, respectively, as described above, and ii) a ligand bond to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In some embodiments, the electron injection layer may further include an organic material (e.g., a compound represented by Formula 601).

In some embodiments, the electron injection layer may include (e.g., consist of) i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In some embodiments, the electron injection layer may be a KI:Yb co-deposition layer, a RbI:Yb co-deposition layer, and the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or combination thereof may be substantially homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent or suitable electron injection characteristics may be obtained without a substantial increase in driving voltage.

[Second electrode 150]

The second electrode 150 may be on the interlayer 130. In an embodiment, the second electrode 150 may be a cathode that is an electron injection electrode. In this embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

[Capping Layer]

A first capping layer may be located outside the first electrode 110, and/or a second capping layer may be located outside the second electrode 150. In some embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference.

Accordingly, the optical extraction efficiency of the light-emitting device 10 may be increased, thus improving the luminescence efficiency of the light-emitting device 10.

The first capping layer and the second capping layer may each include a material having a refractive index of 1.6 or higher (at 589 nm).

The first capping layer and the second capping layer may each independently be a capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of oxygen (O), nitrogen (N), sulfur (S), selenium (Se), silicon (Si), fluorine (F), chlorine (Cl), bromine (Br), iodine (I), or any combination thereof. In some embodiments, at least one of the first capping layer and the second capping layer may each independently include an amine group-containing compound.

In some embodiments, at least one of the first capping layer and the second capping layer may each independently include the compound represented by Formula 201, the compound represented by Formula 202, or any combination thereof.

In one or more embodiments, at least one of the first capping layer and the second capping layer may each independently include one of Compounds HT28 to HT33, one of Compounds CP1 to CP6, β-NPB, or any combination thereof:

CP1

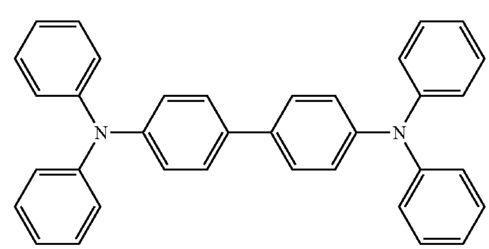

-continued

CP2

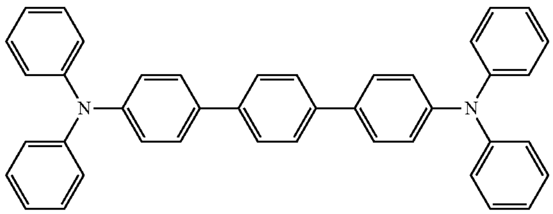

CP3

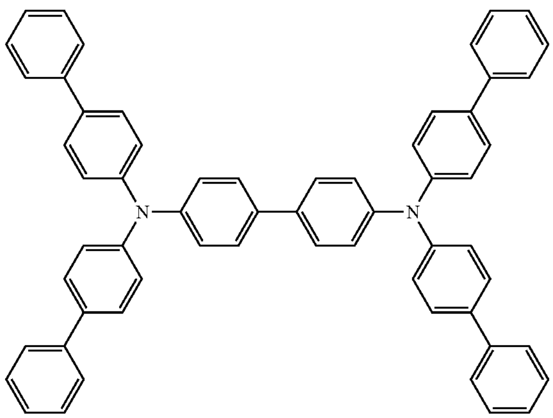

CP4

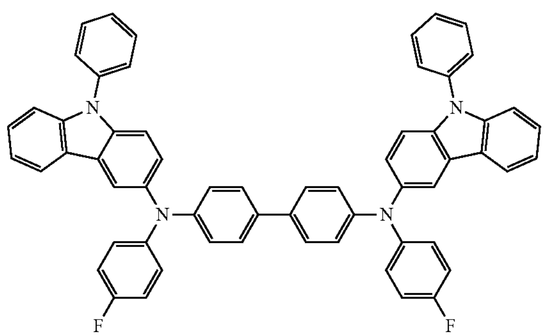

CP5

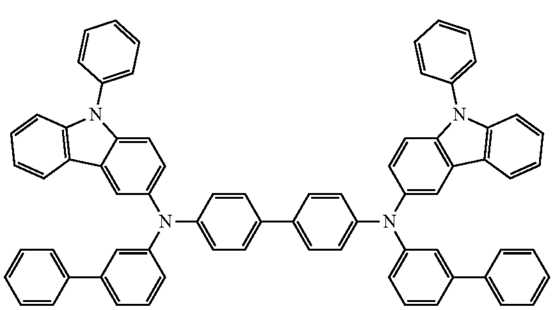

-continued

CP6

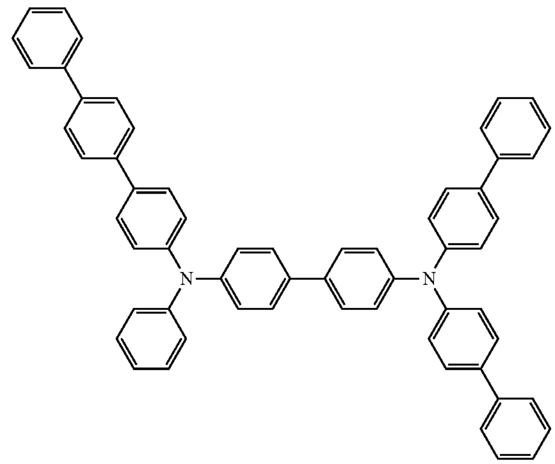

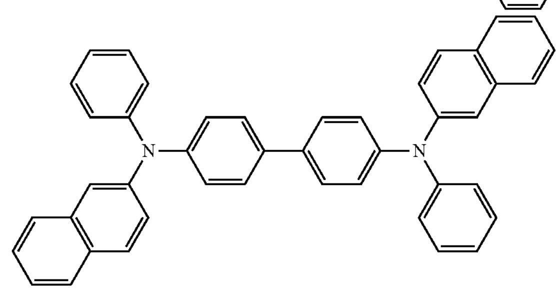

β-NPB

[Film]

The condensed cyclic compound represented by Formula 1 may be included in one or more suitable films. According to one or more embodiments, a film including the condensed cyclic compound represented by Formula 1 may be provided. The film may be or acts as, for example, an optical member (or, a light-controlling member) (e.g., a color filter, a color-conversion member, a capping layer, a light extraction efficiency improvement layer, a selective light-absorbing layer, a polarization layer, a quantum dot-containing layer, and/or the like), a light-blocking member (e.g., a light reflection layer or a light-absorbing layer), or a protection member (e.g., an insulating layer or a dielectric material layer).

[Electronic Apparatus]

The light-emitting device may be included in one or more suitable electronic apparatuses. In some embodiments, an electronic apparatus including the light-emitting device may be an emission apparatus or an authentication apparatus.

The electronic apparatus (e.g., an emission apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the descriptions provided herein. In some embodiments, the color-conversion layer may include quantum dots. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel-defining film may be located between the plurality of sub-pixel areas to define each sub-pixel area.

The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or a plurality of color-conversion areas) may include: a first area to emit first color light; a second area to emit second color light; and/or a third area to emit third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (or the plurality of color-conversion areas) may each include quantum dots. In some embodiments, the first area may include red quantum dots, the second area may include green quantum dots, and the third area may not include a quantum dot. The quantum dot may be understood by referring to the description of the quantum dot provided herein. The first area, the second area, and/or the third area may each further include an emitter.

In some embodiments, the light-emitting device may be to emit first light, the first area may be to absorb the first light to emit 1-1 color light, the second area may be to absorb the first light to emit 2-1 color light, and the third area may be to absorb the first light to emit 3-1 color light (for example, to transmit, or to absorb and emit the first light as 3-1 color light). In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 color light may be blue light.

The electronic apparatus may further include a thin-film transistor, in addition to the light-emitting device. The thin-film transistor may include a source electrode, a drain electrode, and an active layer, wherein one of the source electrode and the drain electrode may be electrically connected to one of the first electrode and the second electrode of the light-emitting device.

The thin-film transistor may further include a gate electrode, a gate insulating film, and/or the like.

The active layer may include a crystalline silicon, an amorphous silicon, an organic semiconductor, and/or an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device while at the same time (e.g., simultaneously) preventing or reducing permeation of air and moisture to the light-emitting device. The encapsulation unit may be a sealing substrate including transparent glass and/or a plastic substrate. The encapsulation unit may be a thin-film encapsulating layer including at least one of an organic layer and/or an inorganic layer. When the encapsulation unit is a thin-film encapsulating layer, the electronic apparatus may be flexible.

In addition to the color filter and/or the color-conversion layer, one or more suitable functional layers may be disposed on the encapsulation unit depending on the desired use of an electronic apparatus. Examples of the functional layer may include a touch screen layer, a polarization layer, and/or the like. The touch screen layer may be a resistive touch screen layer, a capacitive touch screen layer, or an infrared beam touch screen layer. The authentication apparatus may be, for example, a biometric authentication apparatus that identifies an individual according to biometric information (e.g., a fingertip, a pupil, and/or the like).

The authentication apparatus may further include a biometric information collecting unit, in addition to the light-emitting device described above.

The electronic apparatus may be applicable to one or more suitable displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, or an endoscope display device), a fish finder, one or more suitable measurement devices, gauges (e.g., gauges of an automobile, an airplane, and/or a ship), and/or a projector.

Figure 2:
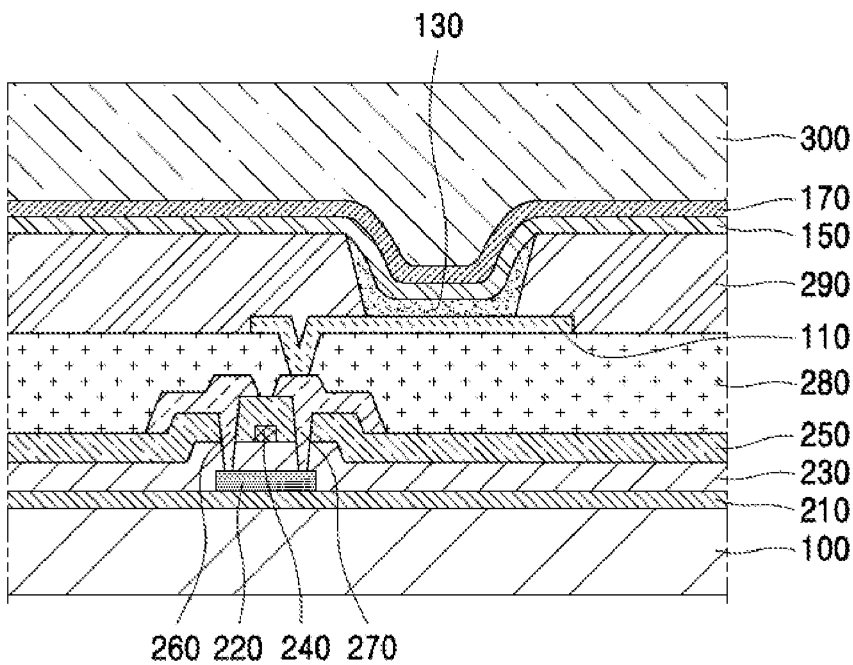
FIG. 2 is a schematic cross-sectional view of an electronic apparatus according to an embodiment.
Figure 3:
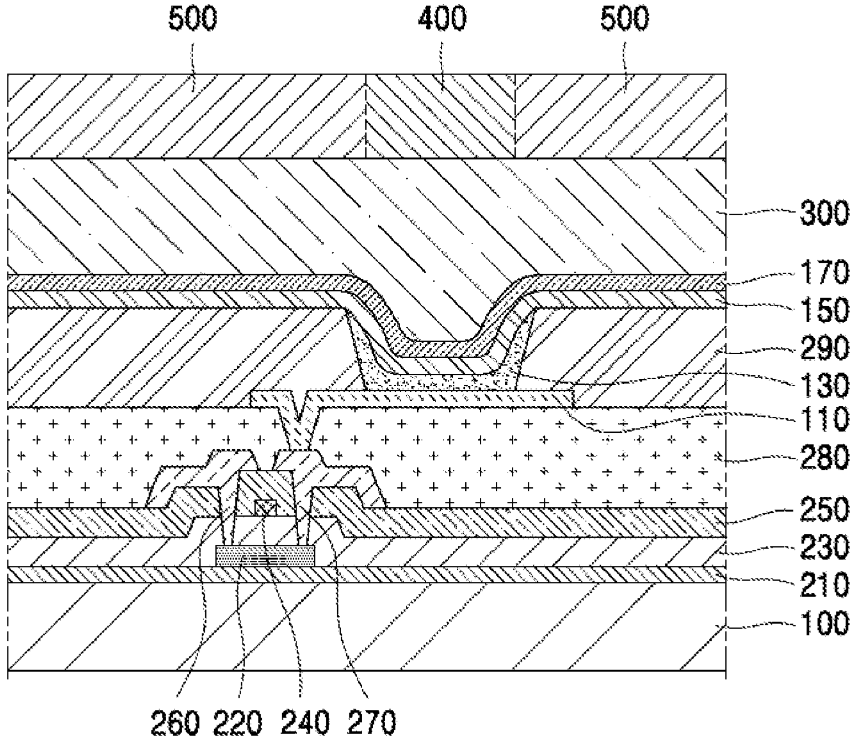
FIG. 3 is a schematic cross-sectional view of an electronic apparatus according to another embodiment.

[Descriptions of FIGS. 2 and 3]

FIG. 2 is a schematic cross-sectional view of a light-emitting apparatus according to an embodiment.

An emission apparatus in FIG. 2 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent or reduce penetration of impurities through the substrate 100 and provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor (such as silicon and/or polysilicon), an organic semiconductor, or an oxide semiconductor, and includes a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected to a light-emitting device to drive the light-emitting device, and may be protected by a passivation layer 280. The passivation layer 280 may include an inorganic insulating film, an organic insulating film, or a combination thereof. A light-emitting device may be on the passivation layer 280.

The light-emitting device may include a first electrode 110, an interlayer 130, and a second electrode 150.

The first electrode 110 may be on the passivation layer 280. The passivation layer 280 may not fully cover the drain electrode 270, and may expose a specific area of the drain electrode 270, and the first electrode 110 may be disposed to connect to the exposed area of the drain electrode 270.

A pixel-defining film 290 may be on the first electrode 110. The pixel-defining film 290 may expose a set or predetermined area of the first electrode 110, and the interlayer 130 may be formed in the exposed area of the first electrode 110. The pixel-defining film 290 may be a polyimide or polyacryl organic film. In some embodiments, some higher layers of the interlayer 130 may extend to the upper portion of the pixel-defining film 290, and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture and/or oxygen. The encapsulation unit 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyl disiloxane, an acrylic resin (e.g., polymethyl methacrylate, polyacrylic acid, and/or the like), an epoxy resin (e.g., aliphatic glycidyl ether (AGE) and/or the like), or any combination thereof; or a combination of the inorganic film and the organic film.

FIG. 3 is a schematic cross-sectional view of another light-emitting apparatus according to an embodiment.

The emission apparatus shown in FIG. 3 may be substantially similar (e.g., identical) to the emission apparatus shown in FIG. 2, except that a light-shielding pattern 500 and a functional area 400 may be additionally located on the encapsulation unit 300. The functional area 400 may be i) a color filter area, ii) a color-conversion area, or iii) a combination of a color filter area and a color-conversion area. In some embodiments, the light-emitting device shown in FIG. 3 included in the emission apparatus may be a tandem light-emitting device.

[Manufacturing Method]

The layers constituting the hole transport region, the emission layer, and the layers constituting the electron transport region may each be formed in a set or predetermined region by utilizing one or more suitable methods (such as vacuum deposition, spin coating, casting, Langmuir-Blodgett (LB) deposition, ink-jet printing, laser printing, and/or laser-induced thermal imaging).

When the layers constituting the hole transport region, the emission layer, and the layers constituting the electron transport region are each independently formed by vacuum-deposition, the vacuum-deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (A/sec) to about 100 Å/sec, depending on the material to be included in each layer and the structure of each layer to be formed.

[General Definitions of Terms]

The term "$C_3$-$C_{60}$ carbocyclic group" as utilized herein refers to a cyclic group consisting of carbon atoms only and having 3 to 60 carbon atoms as ring-forming atoms. The term "$C_1$-$C_{60}$ heterocyclic group" as utilized herein refers to a cyclic group having 1 to 60 carbon atoms in addition to a heteroatom as ring-forming atoms other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as utilized herein may include the $C_3$-$C_{60}$ carbocyclic group and the $C_1$-$C_{60}$ heterocyclic group.

The term "T1 electron-rich $C_3$-$C_{60}$ cyclic group" refers to a cyclic group having 3 to 60 carbon atoms and not including (e.g., excluding) *—N═*' as a ring-forming moiety. The term "T1 electron-deficient nitrogen-containing $C_1$-$C_{60}$ cyclic group" as utilized herein refers to a heterocyclic group having 1 to 60 carbon atoms and *—N═*' as a ring-forming moiety.

In some embodiments, the $C_3$-$C_{60}$ carbocyclic group may be i) a T1 group (defined below) or ii) a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group (defined below), ii) a group in which at least two T2 groups are condensed, or iii) a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the 7 electron-rich $C_3$-$C_{60}$ cyclic group may be i) a T1 group, ii) a condensed group in which at least two T1 groups are condensed, iii) a T3 group (defined below), iv) a condensed group in which at least two T3 groups are condensed, or v) a condensed group in which at least one T3 group is condensed with at least one T1 group (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like), and the 7 electron-deficient nitrogen-containing $C_1$-$C_{60}$ cyclic group may be i) a T4 group (defined below), ii) a group in which at least two T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "T1 electron-rich $C_3$-$C_{60}$ cyclic group", or "T1 electron-deficient nitrogen-containing $C_1$-$C_{60}$ cyclic group" as utilized herein may be a group condensed with any suitable cyclic group, a monovalent group, or a polyvalent group (e.g., a divalent group, a trivalent group, a quadvalent group, and/or the like), depending on the structure of the formula to which the term is applied. For example, a "benzene group" may be a benzene ring, a phenyl group, a phenylene group, and/or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group may include a $C_3$-$C_{10}$ cycloalkylene group, a $C_r$ $C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as utilized herein refers to a linear or branched aliphatic hydrocarbon monovalent group having 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, and/or a tert-decyl group. The term "$C_1$-$C_{60}$ alkylene group" as utilized herein refers to a divalent group having substantially the same structure as the $C_1$-$C_{60}$ alkyl group.

The term "$C_2$-$C_{60}$ alkenyl group" as utilized herein refers to a hydrocarbon group having at least one carbon-carbon double bond in the middle or at the terminus of the $C_2$-$C_{60}$ alkyl group. Examples thereof may include an ethenyl group, a propenyl group, and/or a butenyl group. The term "$C_2$-$C_{60}$ alkenylene group" as utilized herein refers to a divalent group having substantially the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle or at the terminus of the $C_2$-$C_{60}$ alkyl group. Examples thereof may include an ethynyl group and/or a propynyl group. The term "$C_2$-$C_{60}$ alkynylene group" as utilized herein refers to a divalent group having substantially the same structure as the $C_2$-$C_{60}$ alkynyl group.

The term "$C_1$-$C_{60}$ alkoxy group" as utilized herein refers to a monovalent group represented by —$OA_{101}$ (wherein $A_{101}$ is a $C_1$-$C_1$ alkyl group). Examples thereof may include a methoxy group, an ethoxy group, and an isopropyloxy group.

The term "$C_3$-$C_{10}$ cycloalkyl group" as utilized herein refers to a monovalent saturated hydrocarbon monocyclic group including 3 to 10 carbon atoms. Examples of the $C_3$-$C_{10}$ cycloalkyl group as utilized herein may include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, and/or a bicyclo[2.2.2]octyl group. The term "$C_3$-$C_{10}$ cycloalkylene group" as utilized herein refers to a divalent group having substantially the same structure as the $C_3$-$C_{10}$ cycloalkyl group.

The term "$C_1$-$C_{10}$ heterocycloalkyl group" as utilized herein refers to a monovalent cyclic group including at least one heteroatom other than carbon atoms as a ring-forming atom and having 1 to 10 carbon atoms. Examples thereof may include a 1,2,3,4-oxatriazolidinyl group, a tetrahydrofuranyl group, and/or a tetrahydrothiophenyl group. The term "$C_1$-$C_{10}$ heterocycloalkylene group" as utilized herein refers to a divalent group having substantially the same structure as the $C_1$-$C_{10}$ heterocycloalkyl group.

The term "$C_3$-$C_{10}$ cycloalkenyl group" as utilized herein refers to a monovalent cyclic group that has 3 to 10 carbon atoms and at least one carbon-carbon double bond in its ring, and is not aromatic. Examples thereof may include a cyclopentenyl group, a cyclohexenyl group, and/or a cycloheptenyl group. The term "$C_3$-$C_{10}$ cycloalkenylene group" as utilized herein refers to a divalent group having substantially the same structure as the $C_3$-$C_{10}$ cycloalkenyl group.

The term "$C_1$-$C_{10}$ heterocycloalkenyl group" as utilized herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group may include a 4,5-dihydro-1,2,3,4-oxatriazolyl group, a 2,3-dihydrofuranyl group, and/or a 2,3-dihydrothiophenyl group. The term "$C_1$-$C_{10}$ heterocycloalkylene group" as utilized herein refers to a divalent group having substantially the same structure as the $C_1$-$C_{10}$ heterocycloalkyl group.

The term "$C_6$-$C_{60}$ aryl group" as utilized herein refers to a monovalent group having a carbocyclic aromatic system having 6 to 60 carbon atoms. The term "$C_6$-$C_{60}$ arylene group" as utilized herein refers to a divalent group having a carbocyclic aromatic system having 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and/or an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as utilized herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as utilized herein refers to a divalent group having a heterocyclic aromatic system further including at least one heteroatom other than carbon atoms as a ring-forming atom and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and/or a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as utilized herein refers to a monovalent group that has two or more condensed rings and only carbon atoms (e.g., 8 to 60 carbon atoms) as ring forming atoms, wherein the molecular structure when considered as a whole is non-aromatic. Examples of the monovalent non-aromatic condensed polycyclic group may include an indenyl group, a fluorenyl group, a spiro-bifluorenyl group, a benzofluorenyl group, an indenophenanthrenyl group, and/or an indenoanthracenyl group. The term "divalent non-aromatic condensed polycyclic group" as utilized herein refers to a divalent group having substantially the same structure as the monovalent non-aromatic condensed polycyclic group.

The term "monovalent non-aromatic condensed heteropolycyclic group" as utilized herein refers to a monovalent group that has two or more condensed rings and at least one heteroatom other than carbon atoms (e.g., 1 to 60 carbon atoms), as a ring-forming atom, wherein the molecular structure when considered as a whole is non-aromatic. Examples of the monovalent non-aromatic condensed heteropolycyclic group may include a 9,9-dihydroacridinyl group and a 9H-xanthenyl group. The term "divalent non-aromatic condensed heteropolycyclic group" as utilized herein refers to a divalent group having substantially the same structure as the monovalent non-aromatic condensed heteropolycyclic group.

The term "$C_6$-$C_{60}$ aryloxy group" as utilized herein indicates —$OA_{102}$ (wherein $A_{102}$ is a $C_6$-$C_{60}$ aryl group), and a $C_6$-$C_{60}$ arylthio group as utilized herein indicates —$SA_{103}$ (wherein $A_{103}$ is a $C_6$-$C_{60}$ aryl group).

The term "$C_7$-$C_{60}$ aryl alkyl group" utilized herein refers to -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" utilized herein refers to -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as utilized herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(═O)($Q_{ii}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term “heteroatom” as utilized herein refers to any atom other than a carbon atom. Examples of the heteroatom may include O, S, N, P, Si, B, Ge, Se, or any combination thereof.

The term “third-row transition metal” as utilized herein may include hafnium (Hf), tantalum (Ta), tungsten (W), rhenium (Re), osmium (Os), iridium (Ir), platinum (Pt), and/or gold (Au).

“Ph” utilized herein represents a phenyl group, “Me” utilized herein represents a methyl group, “Et” utilized herein represents an ethyl group, “ter-Bu” or “But” utilized herein represents a tert-butyl group, and “OMe” utilized herein represents a methoxy group.

The term “biphenyl group” as utilized herein refers to a phenyl group substituted with a phenyl group. The “biphenyl group” belongs to a substituted phenyl group having a $C_6$-$C_{60}$ aryl group as a substituent.

The term “terphenyl group” as utilized herein refers to a phenyl group substituted with a biphenyl group or a phenyl group substituted with two phenyl groups. The “terphenyl group” belongs to a substituted phenyl group having a $C_6$-$C_{60}$ aryl group substituted with a $C_6$-$C_{60}$ aryl group or a $C_6$-$C_{60}$ aryl group as a substituent.

The symbols * and *' as utilized herein, unless defined otherwise, refer to a binding site to an adjacent atom in a corresponding formula or moiety.

Hereinafter, compounds and a light-emitting device according to one or more embodiments will be described in more detail with reference to Synthesis Examples and Examples. The wording “B was utilized instead of A” utilized in describing Synthesis Examples refers to that an amount of B utilized was identical to an amount of A utilized in terms of molar equivalents.

EXAMPLES

Synthesis Example 1

Synthesis of Compound A-1

Condensed Cyclic Compound A-1 according to one or more embodiments may be synthesized, for example, according to Reaction Scheme 1:

Reaction Scheme 1

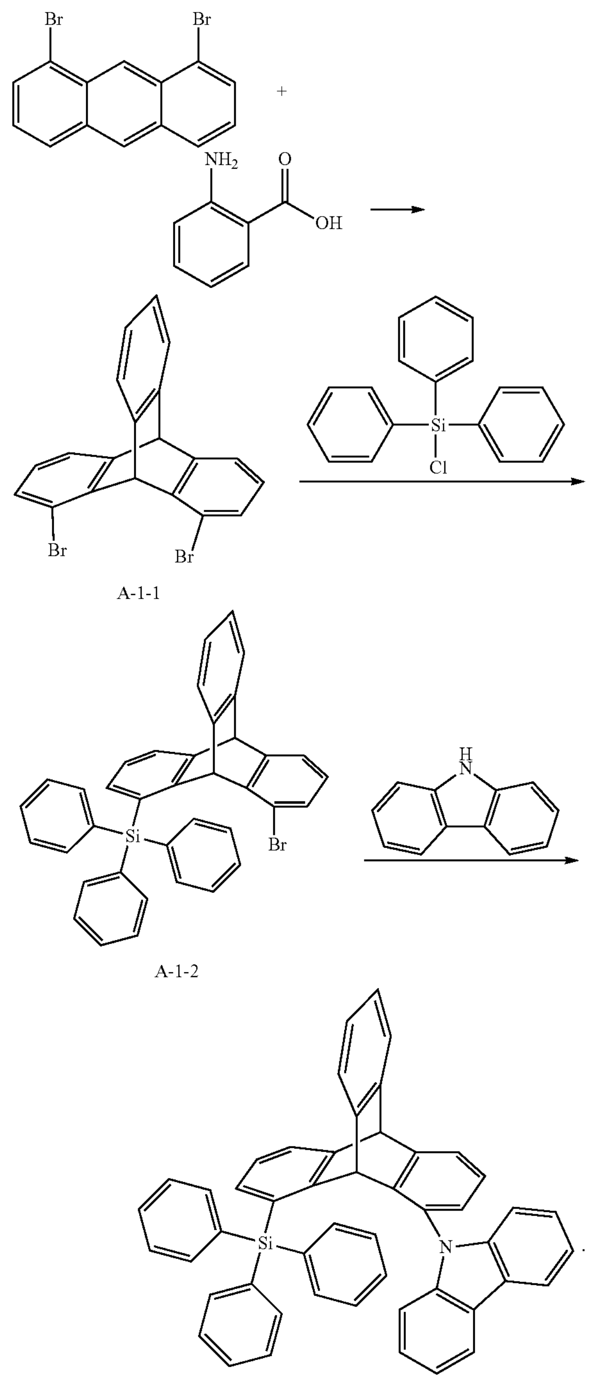

(Synthesis of Intermediate A-1-1)

1,8-dibromoanthracene (CAS no. 131276-24-9), amyl nitrite (CAS no. 110-46-3), and 2-am inobenzoic acid (CAS no. 118-92-3) were reacted to obtain Intermediate A-1-1. Intermediate A-1-1 was subjected to liquid chromatography-mass spectrometry (LC-MS) to identify the M+1 peak value thereof.

$C_{20}H_{12}Br_2$:M+1 410.93

(Synthesis of Intermediate A-1-2)

Intermediate A-1-1 was reacted with n-BuLi and then with chlorotriphenyl silane (CAS no. 76-86-8) to thereby obtain Intermediate A-1-2. Intermediate A-1-2 was subjected to liquid chromatography-mass spectrometry (LC-MS) to identify the M+1 peak value thereof.

$C_{38}H_{27}BrSi$: M+1 591.10

(Synthesis of Compound A-1)

5 g of Intermediate A-1-2, 1.4 g of 9H-carbazole (CAS no. 86-74-8), 1.2 g of sodium tert-butoxide, 0.3 g of tris(dibenzylideneacetone)dipalladium (0), 0.3 mL of tri tert-butylphosphine, and 45 mL of toluene were added to a reaction vessel and refluxed for 24 hours. Once the reaction was complete, the reaction solution was extracted utilizing ethyl acetate, and the resulting organic layer was dried utilizing magnesium sulfate. After evaporation of the solvent, the resulting residue was separated and purified utilizing silica gel column chromatography to thereby obtain 4.3 g of Compound A-1 (yield: 75%). Compound A-1 was identified utilizing LC-MS and $^1$H-NMR.

Synthesis Example 2: Synthesis of Compound A-12

Condensed Cyclic Compound A-12 according to one or more embodiments may be synthesized, for example, according to Reaction Scheme 2.

Reaction Scheme 2

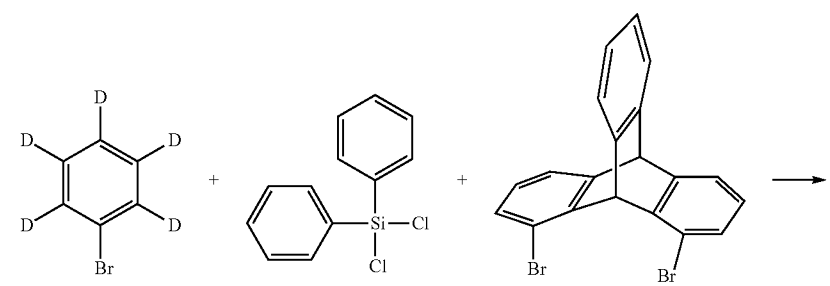

A-1-1

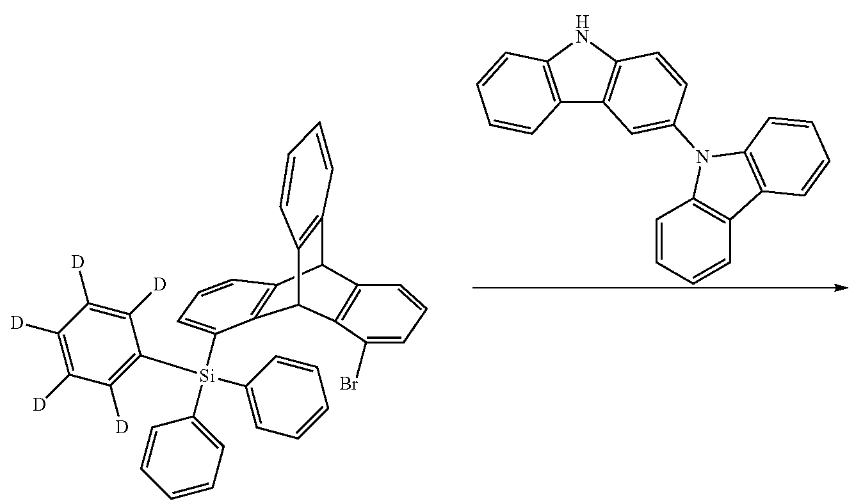

A-12-1

-continued

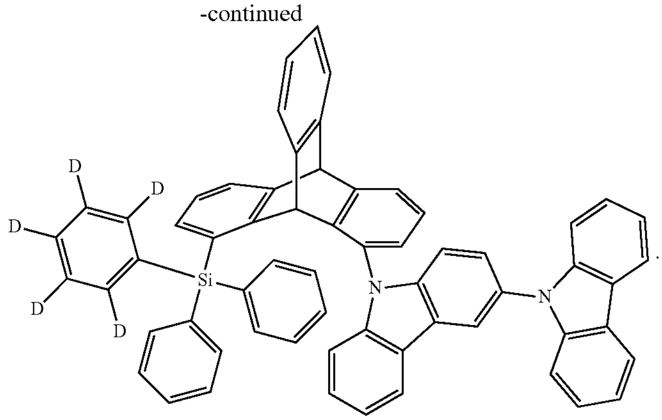

A-12

(Synthesis of Intermediate A-12-1)

Bromobenzene-$d_5$ (CAS no. 4165-57-5) and Intermediate A-1-1 were each reacted with n-BuLi and then with dichlorodiphenyl silane (CAS no. 80-10-4) to thereby obtain Intermediate A-12-1. Intermediate A-12-1 was subjected to liquid chromatography-mass spectrometry (LC-MS) to identify the M+1 peak value thereof.

$C_{38}H_{22}D_5BrSi$: M+1 596.15

(Synthesis of Compound A-12)

4.5 g of Intermediate A-12-1, 2.5 g of 3,9'-bi-9H-carbazole (CAS no. 18628-07-4), 1.1 g of sodium tert-butoxide, 0.27 g of tris(dibenzylideneacetone)dipalladium (0), 0.25 mL of tri tert-butylphosphine, and 40 mL of toluene were added to a reaction vessel and refluxed for 24 hours. Once the reaction was complete, the reaction solution was extracted utilizing ethyl acetate, and the resulting organic layer was dried utilizing magnesium sulfate. After evaporation of the solvent, the resulting residue was separated and purified utilizing silica gel column chromatography to thereby obtain 4.4 g of Compound A-12 (yield: 70%). Compound A-12 was identified utilizing LC-MS and $^1$H-NMR.

Synthesis Example 3: Synthesis of Compound A-39

Condensed Cyclic Compound A-39 according to one or more embodiments may be synthesized, for example, according to Reaction Scheme 3.

Reaction Scheme 3

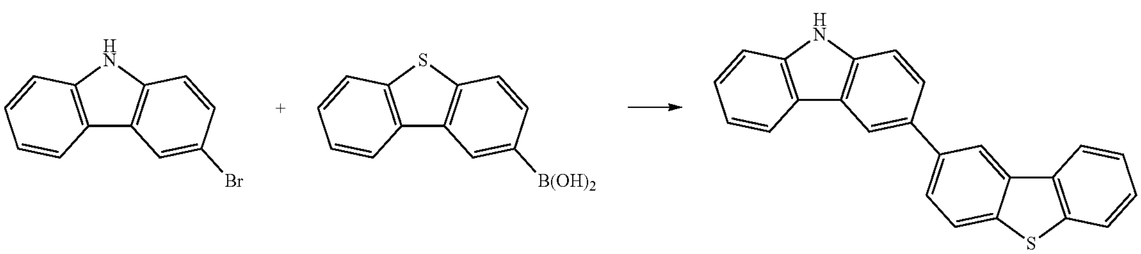

A-39-1

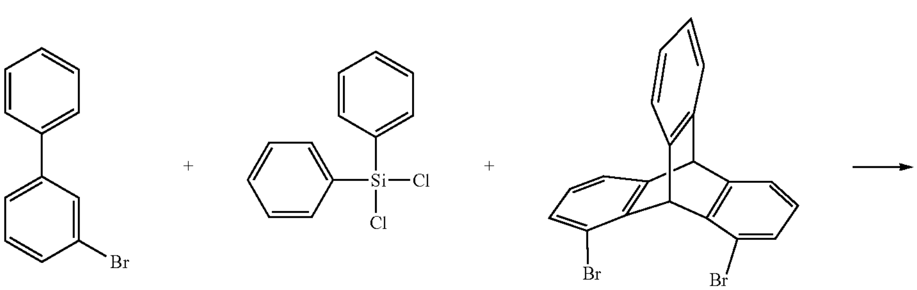

A-1-1

-continued

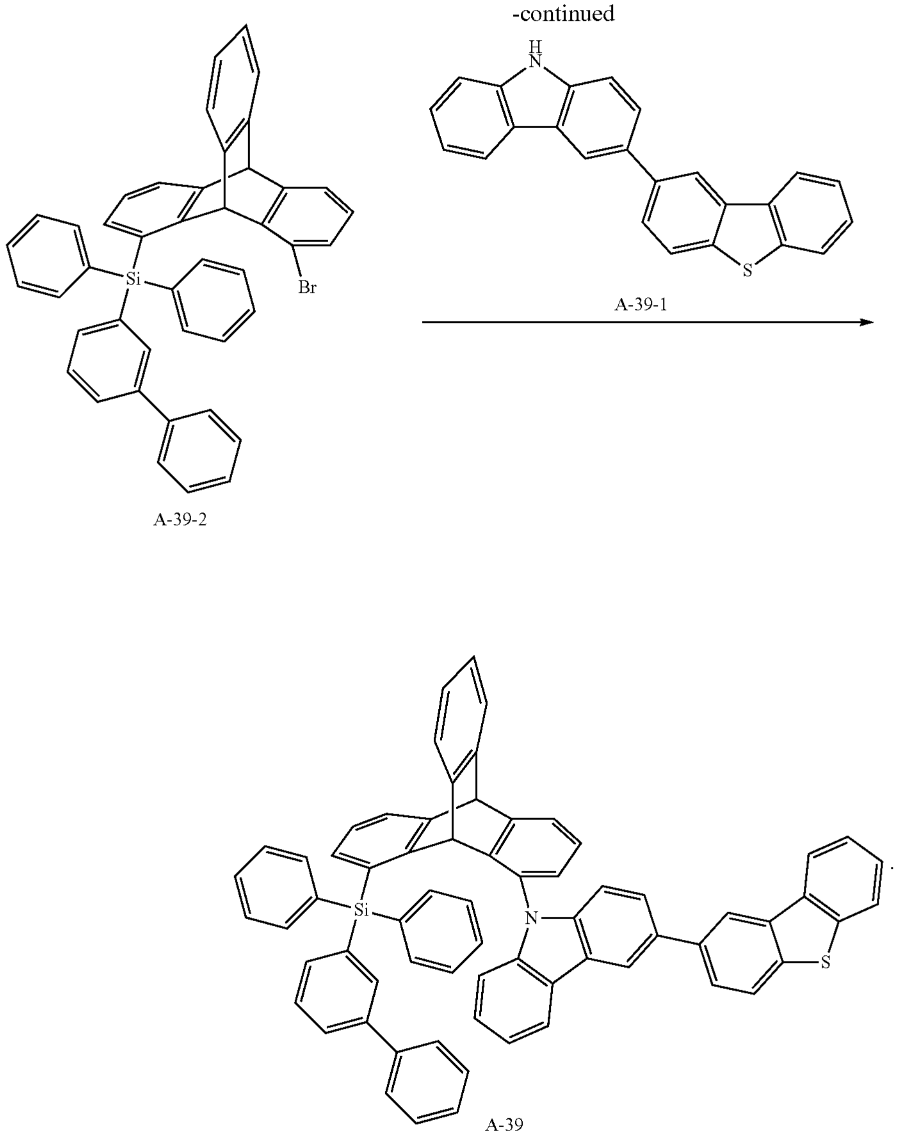

A-39-2

A-39-1

A-39

(Synthesis of Intermediate A-39-1)

3-bromo-9H-carbazole (CAS no. 1592-95-6) was reacted with 2-dibenzothienylboronic acid (CAS no. 668983-97-9) in the presence of a Pd catalyst to obtained Intermediate A-39-1. Intermediate A-39-1 was subjected to liquid chromatography-mass spectrometry (LC-MS) to identify the M+1 peak value thereof.

$C_{24}H_{15}NS$: M+1 350.11

(Synthesis of Intermediate A-39-2)

Intermediate A-39-2 was synthesized in substantially the same manner as in Synthesis of Intermediate A-12-1, except that 3-bromo-1,1'-biphenyl (CAS no. 2113-57-7) was utilized instead of bromobenzene-$d_5$ (CAS no. 4165-57-5). Intermediate A-39-2 was subjected to LC-MS to identify the M+1 peak value thereof.

$C_{44}H_{31}BrSi$: M+1 667.13

(Synthesis of Compound A-39)

2.4 g of Intermediate A-39-1, 4.5 g of Intermediate A-39-2, 0.97 g of sodium tert-butoxide, 0.25 g of tris (dibenzylideneacetone)dipalladium (0), 0.2 mL of tri tert-butylphosphine, and 35 mL of toluene were added to a reaction vessel and refluxed for 24 hours. Once the reaction was complete, the reaction solution was extracted utilizing ethyl acetate, and the resulting organic layer was dried utilizing magnesium sulfate.

After evaporation of the solvent, the resulting residue was separated and purified utilizing silica gel column chromatography to thereby obtain 4.6 g of Compound A-39 (yield: 73%). Compound A-39 was identified utilizing LC-MS and $^1$H-NMR. Synthesis Example 4: Synthesis of Compound A-127

Condensed Cyclic Compound A-127 according to one or more embodiments may be synthesized, for example, according to Reaction Scheme 4.

Reaction Scheme 4

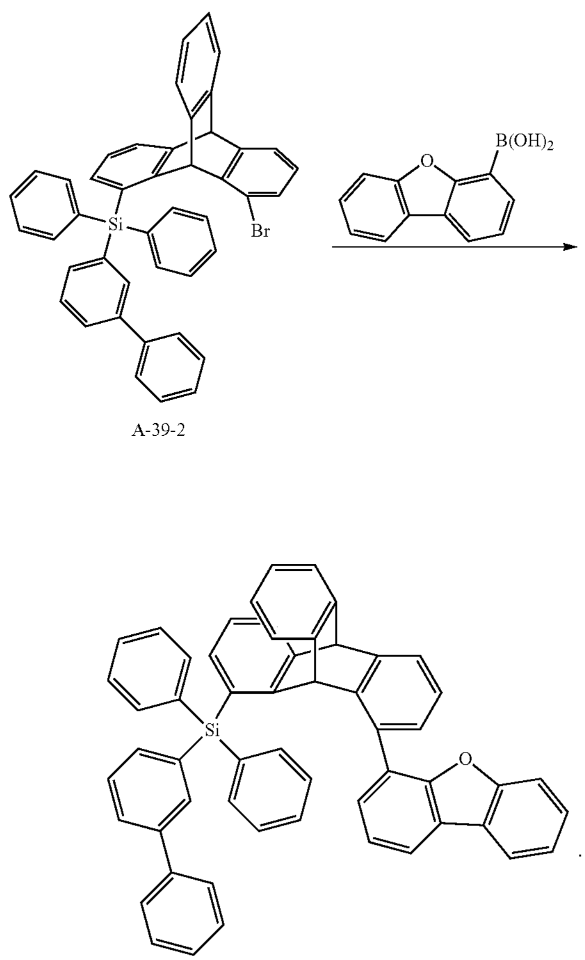

A-39-2

A-127

Reaction Scheme 5

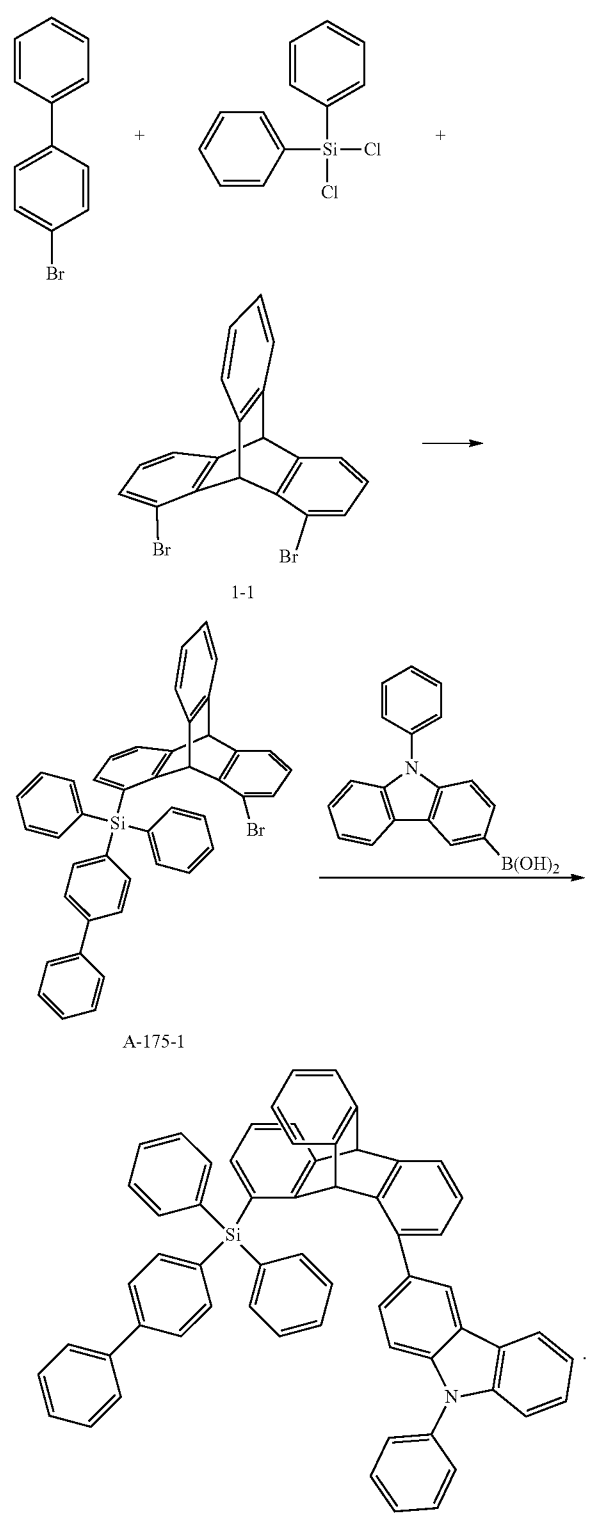

1-1

A-175-1

A-175

(Synthesis of Compound A-127)

4 g of Intermediate A-39-2, 1.3 g of dibenzofuranboronic acid (CAS no. 100124-06-9), 1.6 g of potassium carbonate, 0.35 g of tetrakis(triphenyl phosphine)palladium (0), 32 mL of tetrahydrofuran, and 8 mL of water were added to a reaction vessel and refluxed for 24 hours. Once the reaction was complete, the reaction solution was extracted utilizing ethyl acetate, and the resulting organic layer was dried utilizing magnesium sulfate. After evaporation of the solvent, the resulting residue was separated and purified utilizing silica gel column chromatography to thereby obtain 3.1 g of Compound A-127 (yield: 70%). Compound A-127 was identified utilizing LC-MS and $^{1}$H-NMR.

Synthesis Example 5: Synthesis of Compound A-175

Condensed Cyclic Compound A-175 according to one or more embodiments may be synthesized, for example, according to Reaction Scheme 5.

(Synthesis of Intermediate A-175-1)

Intermediate A-175-1 was synthesized in substantially the same manner as in Synthesis of Intermediate A-12-1, except that 4-bromo-1,1'-biphenyl (CAS no. 92-66-0) was utilized instead of bromobenzene-$d_5$ (CAS no. 4165-57-5). Intermediate A-175-1 was subjected to LC-MS to identify the M+1 peak value thereof.

$C_{44}H_{31}BrSi$: M+1 667.17

(Synthesis of Compound A-175)

4.5 g of Intermediate A-175-1, 2 g of 9-phenyl-3-carbazole boronic acid (CAS no. 854952-58-2), 2.3 g of potassium carbonate, 0.4 g of tetrakis(triphenyl phosphine)palladium (0), 40 mL of tetrahydrofuran, and 10 mL of water were added to a reaction vessel and refluxed for 24 hours. Once the reaction was complete, the reaction solution was extracted utilizing ethyl acetate, and the resulting organic layer was dried utilizing magnesium sulfate. After evaporation of the solvent, the resulting residue was separated and purified utilizing silica gel column chromatography to thereby obtain 3.8 g of Compound A-175 (yield: 68%). Compound A-175 was identified utilizing LC-MS and $^{1}$H-NMR. Synthesis Example 6: Synthesis of Compound C-6

Condensed Cyclic Compound C-6 according to one or more embodiments may be synthesized, for example, according to Reaction Scheme 6.

Reaction Scheme 6

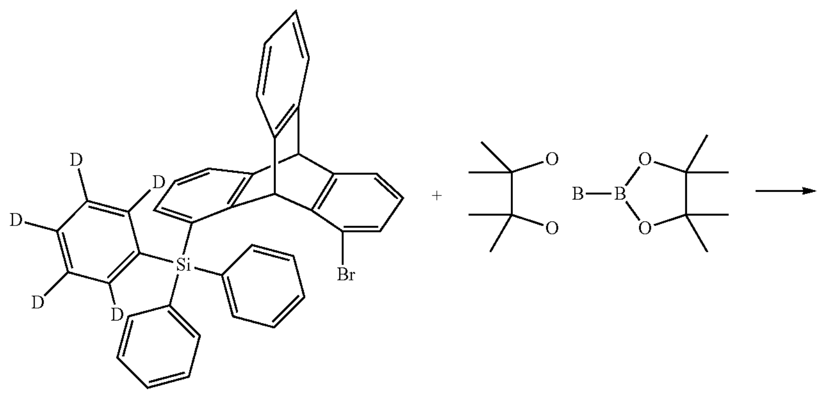

A-12-1

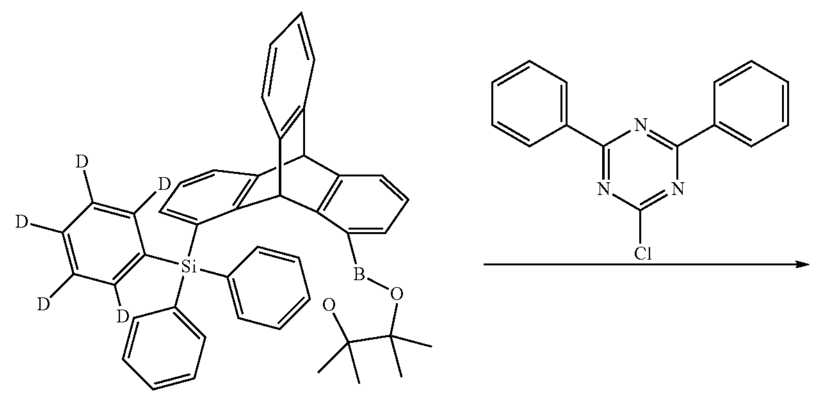

C-6-1

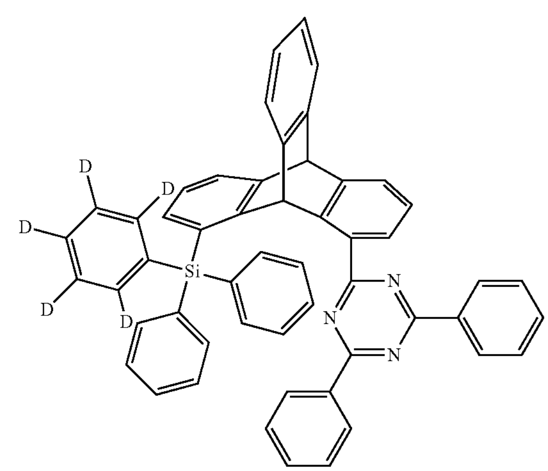

C-6

(Synthesis of Intermediate C-6-1)

Intermediate A-12-1 was reacted with 1,3,2-dioxaborolane (CAS no. 73183-34-3) in the presence of a Pd catalyst, thereby obtaining Intermediate C-6-1. Intermediate C-6-1 was subjected to LC-MS to identify the M+1 peak value thereof.

$C_{44}H_{34}D_5B0_2Si$: M+1 644.32

(Synthesis of Compound C-6)

5 g of Intermediate C-6-1, 2.1 g of 2-chloro-4,6-diphenyl-1,3,5-triazine (CAS no. 3842-55-5), 2.7 g of potassium carbonate, 0.45 g of tetrakis(triphenyl phosphine)palladium (0), 40 mL of tetrahydrofuran, and 10 mL of water were added to a reaction vessel and refluxed for 24 hours. Once the reaction was complete, the reaction solution was extracted utilizing ethyl acetate, and the resulting organic layer was dried utilizing magnesium sulfate. After evaporation of the solvent, the resulting residue was separated and purified utilizing silica gel column chromatography to thereby obtain 3.9 g of Compound C-6 (yield: 68%). Compound C-6 was identified utilizing LC-MS and $^1$H-NMR.

Synthesis Example 7: Synthesis of Compound C-11

Condensed Cyclic Compound C-11 according to one or more embodiments may be synthesized, for example, according to Reaction Scheme 7.

Reaction Scheme 7

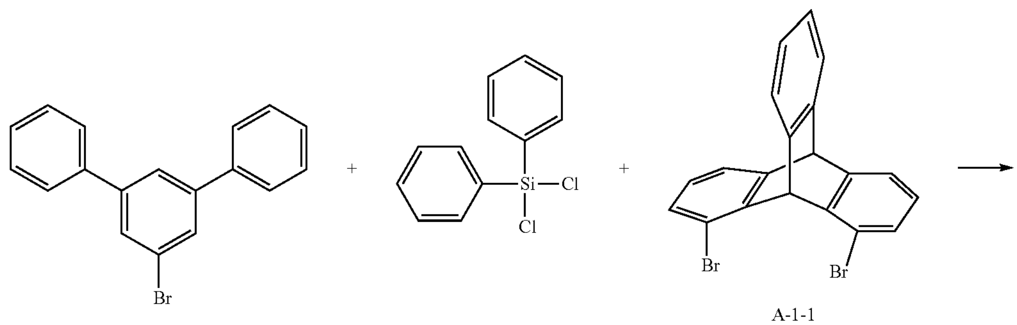

A-1-1

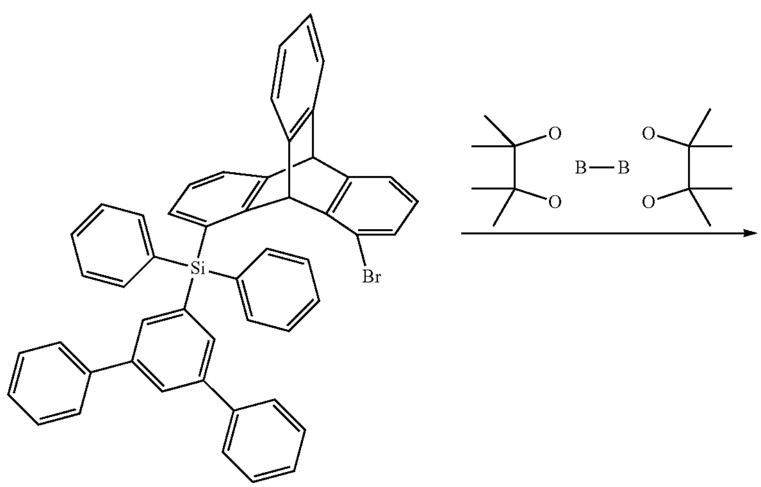

C-11-1

-continued

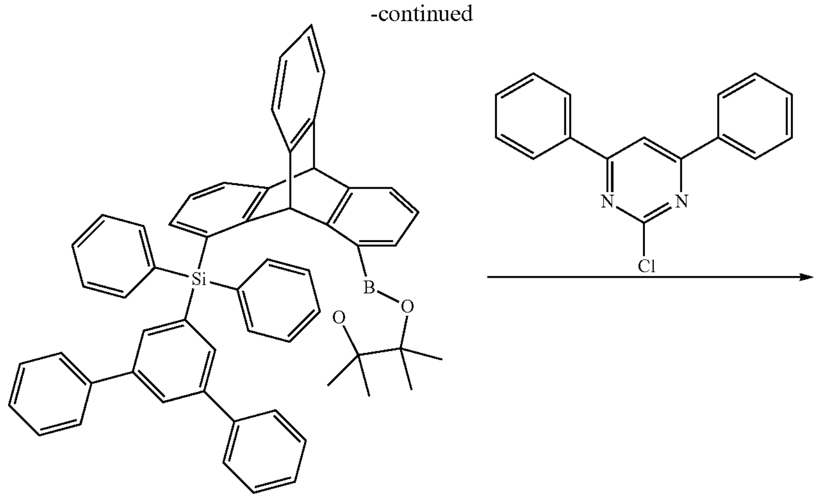

C-11-2

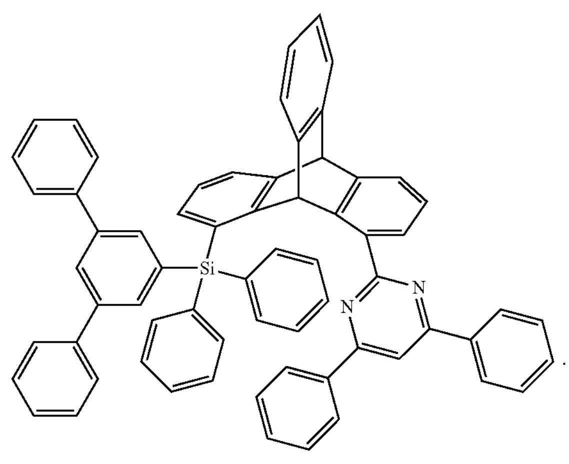

C-11

(Synthesis of Intermediate C-11-1)

Intermediate C-11-1 was synthesized in substantially the same manner as in Synthesis of Intermediate A-12-1, except that 5'-bromo-1,1':3',1"-terphenyl (CAS no. 103068-20-8) was utilized instead of bromobenzene-$d_5$ (CAS no. 4165-57-5). Intermediate C-11-1 was subjected to LC-MS to identify the M+1 peak value thereof.

$C_{50}H_{35}BrSi$: M+1 743.15

(Synthesis of Intermediate C-11-2)

Intermediate C-11-2 was synthesized in substantially the same manner as in Synthesis of Intermediate C-6-1, except that Intermediate C-11-1 was utilized instead of Intermediate A-12-1. Intermediate C-11-2 was subjected to LC-MS to identify the M+1 peak value thereof.

$C_{56}H_{47}B0_2Si$: M+1 791.33

(Synthesis of Compound C-11)

4 g of Intermediate C-11-2, 1.35 g of 2-chloro-4,6-diphenylpyrimidine (CAS no. 2915-16-4), 1.75 g of potassium carbonate, 0.3 g of tetrakis(triphenyl phosphine)palladium (0), 28 mL of tetrahydrofuran, and 7 mL of water were added to a reaction vessel and refluxed for 24 hours. Once the reaction was complete, the reaction solution was extracted utilizing ethyl acetate, and the resulting organic layer was dried utilizing magnesium sulfate. After evaporation of the solvent, the resulting residue was separated and purified utilizing silica gel column chromatography to thereby obtain 3 g of Compound C-11 (yield: 65%). Compound C-11 was identified utilizing LC-MS and $^1$H-NMR.

Synthesis Example 8: Synthesis of Compound C-19

Condensed Cyclic Compound C-19 according to one or more embodiments may be synthesized, for example, according to Reaction Scheme 8.

Reaction Scheme 8

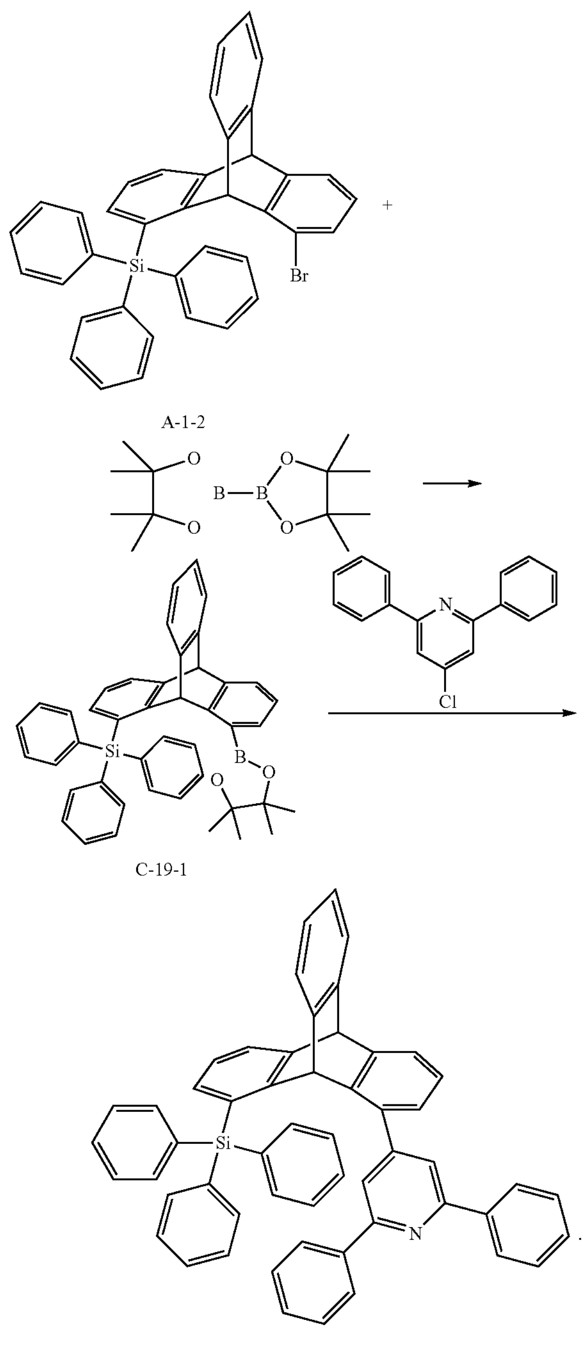

A-1-2

C-19-1

C-19

(Synthesis of Intermediate C-19-1)

Intermediate C-19-1 was synthesized in substantially the same manner as in Synthesis of Intermediate C-6-1, except that Intermediate A-1-2 was utilized instead of Intermediate A-12-1. Intermediate C-19-1 was subjected to LC-MS to identify the M+1 peak value thereof.

$C_{44}H_{39}BO_2Si$: M+1 639.30

(Synthesis of Compound C-19)

5 g of Intermediate C-19-1, 2.1 g of 4-chloro-2,6-diphenylpyridine (CAS no. 133785-60-1), 2.7 g of potassium carbonate, 0.45 g of tetrakis(triphenyl phosphine)palladium (0), 40 mL of tetrahydrofuran, and 10 mL of water were added to a reaction vessel and refluxed for 24 hours. Once the reaction was complete, the reaction solution was extracted utilizing ethyl acetate, and the resulting organic layer was dried utilizing magnesium sulfate. After evaporation of the solvent, the resulting residue was separated and purified utilizing silica gel column chromatography to thereby obtain 4 g of Compound C-19 (yield: 70%). Compound C-19 was identified utilizing LC-MS and $^1$H-NMR.

Synthesis Example 9: Synthesis of Compound C-33

Condensed Cyclic Compound C-33 according to one or more embodiments may be synthesized, for example, according to Reaction Scheme 9.

Reaction Scheme 9

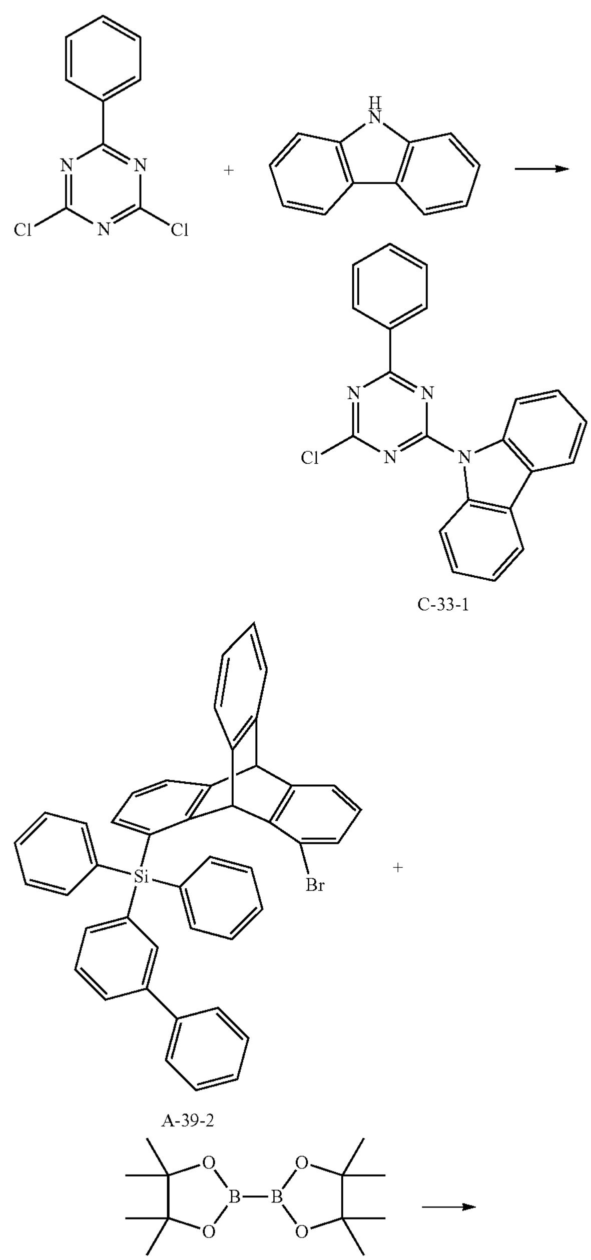

C-33-1

A-39-2

-continued

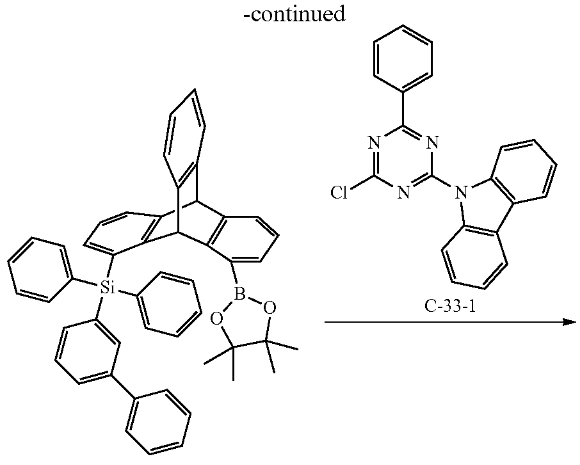

C-33-1

C-33-2

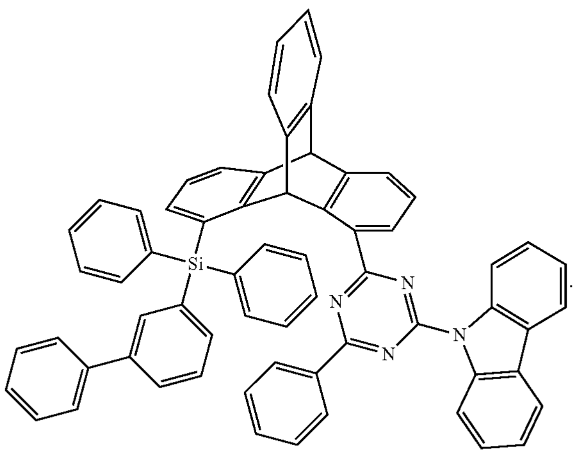

C-33

(Synthesis of Intermediate C-33-1)

9H-carbazole (CAS no. 86-74-8) was reacted with n-BuLi and then with 2,4-dichloro-6-phenyl-1,3,5-triazine (CAS no. 1700-02-3) to thereby obtain Intermediate C-33-1. Intermediate C-33-1 was subjected to LC-MS to identify the M+1 peak value thereof.

$C_{21}H_{13}ClN_4$: M+1 357.08

(Synthesis of Intermediate C-33-2)

Intermediate C-33-2 was synthesized in substantially the same manner as in Synthesis of Intermediate C-6-1, except that Intermediate A-39-2 was utilized instead of Intermediate A-12-1. Intermediate C-33-2 was subjected to LC-MS to identify the M+1 peak value thereof.

$C_{50}F1_{43}B0_2Si$: M+1 715.30

(Synthesis of Compound C-33)

2.5 g of Intermediate C-33-1, 5 g of Intermediate C-33-2, 2.5 g of potassium carbonate, 0.4 g of tetrakis(triphenyl phosphine)palladium (0), 40 mL of tetrahydrofuran, and 10 mL of water were added to a reaction vessel and refluxed for 24 hours. Once the reaction was complete, the reaction solution was extracted utilizing ethyl acetate, and the resulting organic layer was dried utilizing magnesium sulfate. After evaporation of the solvent, the resulting residue was separated and purified utilizing silica gel column chromatography to thereby obtain 4 g of Compound C-33 (yield: 64%). Compound C-33 was identified utilizing LC-MS and $^1$H-NMR. Synthesis Example 10: Synthesis of Compound C-55

Condensed Cyclic Compound C-55 according to one or more embodiments may be synthesized, for example, according to Reaction Scheme 10.

Reaction Scheme 10

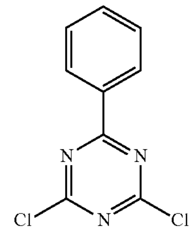

+

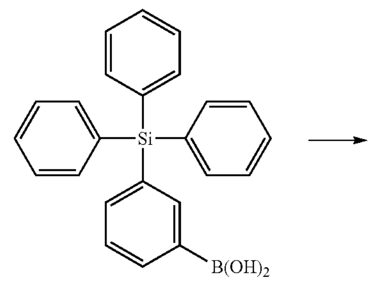

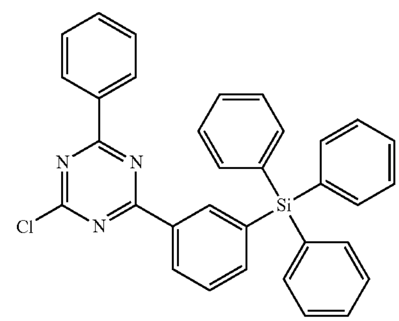

C-55-1

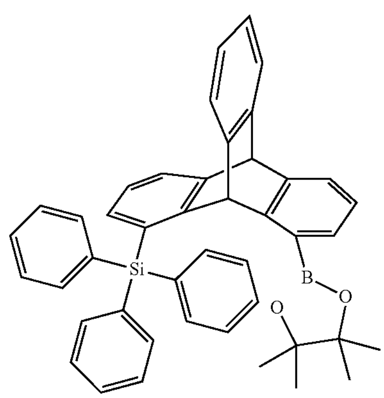

+

C-19-1

-continued

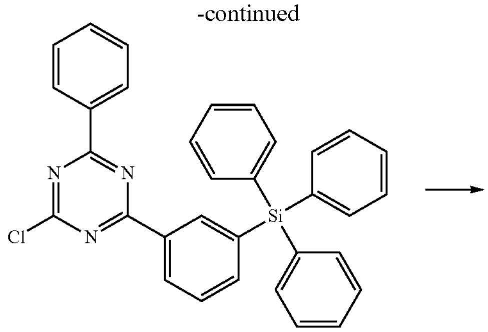

C-55-1

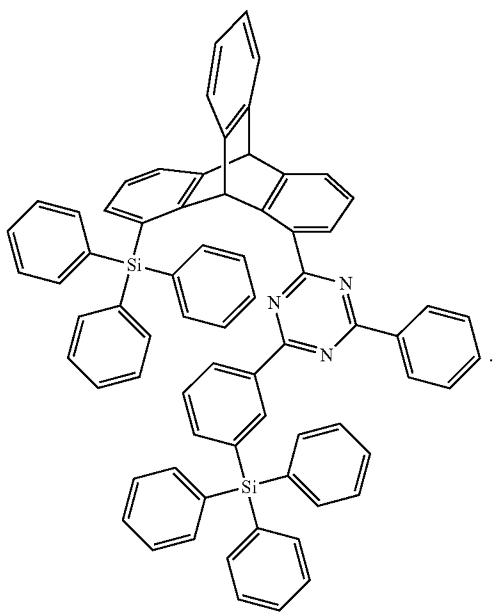

C-55

(Synthesis of Intermediate C-55-1)

2,4-dichloro-6-phenyl-1,3,5-triazine (CAS no. 1700-02-3) was reacted with [3-(triphenylsilyl)phenyl]boronic acid (CAS no. 1253915-58-1) in the presence of a Pd catalyst to thereby obtain Intermediate C-55-1. Intermediate C-55-1 was subjected to LC-MS to identify the M+1 peak value thereof.

$C_{33}H_{24}ClN_3Si$: M+1 526.13

(Synthesis of Compound C-55)

4.9 g of Intermediate C-19-1, 4 g of Intermediate C-55-1, 2.6 g of potassium carbonate, 0.44 g of tetrakis(triphenyl phosphine)palladium (0), 40 mL of tetrahydrofuran, and 10 mL of water were added to a reaction vessel and refluxed for 24 hours. Once the reaction was complete, the reaction solution was extracted utilizing ethyl acetate, and the resulting organic layer was dried utilizing magnesium sulfate. After evaporation of the solvent, the resulting residue was separated and purified utilizing silica gel column chromatography to thereby obtain 4.6 g of Compound C-55 (yield: 60%). Compound C-55 was identified utilizing LC-MS and $^1$H-NMR.

Synthesis Example 11: Synthesis of Compound C-61

Condensed Cyclic Compound C-61 according to one or more embodiments may be synthesized, for example, according to Reaction Scheme 11.

Reaction Scheme 11

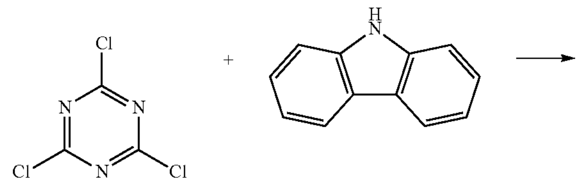

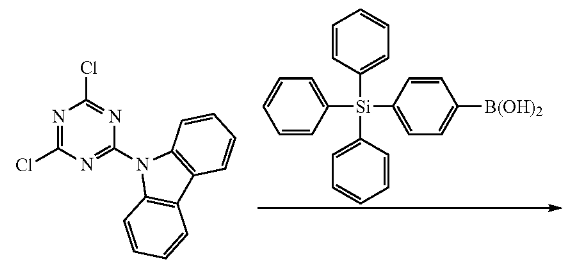

C-61-1

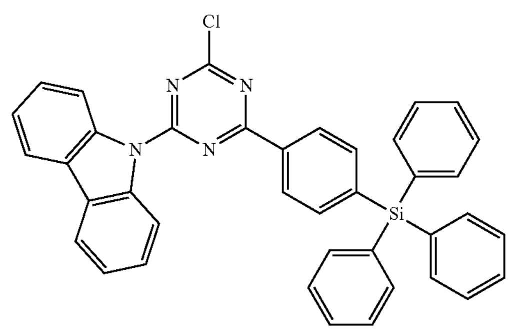

C-61-2

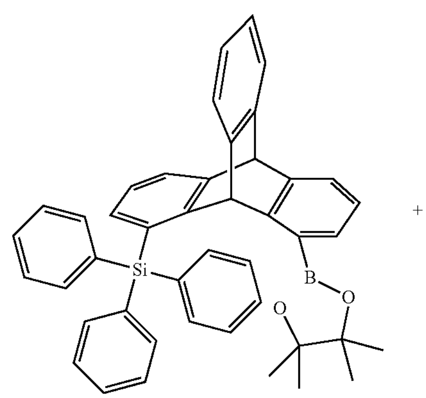

C-19-1

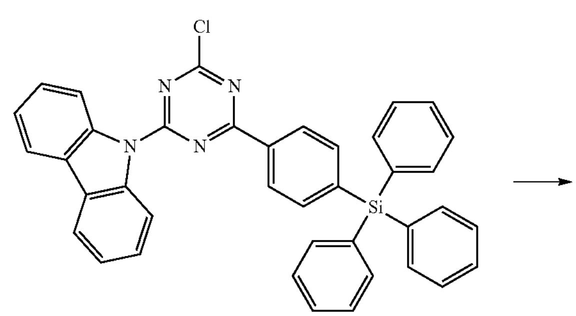

C-61-2

-continued

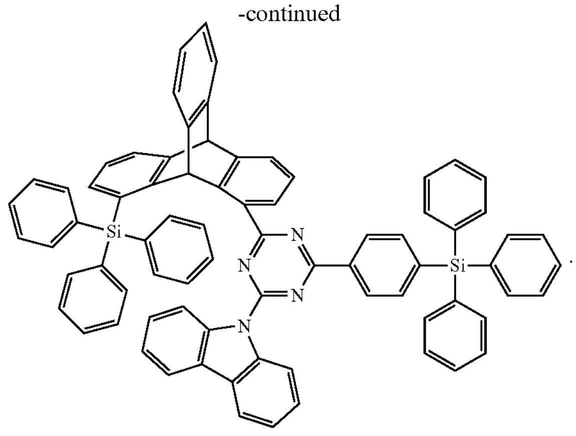

C-61

(Synthesis of Intermediate C-61-1)

9H-carbazole (CAS no. 86-74-8) was reacted with n-BuLi and then with 2,4,6-trichloro-1,3,5-triazine (CAS no. 108-77-0) to thereby obtain Intermediate C-61-1. Intermediate C-61-1 was subjected to LC-MS to identify the M+1 peak value thereof.

$C_{15}H_8Cl_2N_4$: M+1 315.00 (Synthesis of Intermediate C-61-2)

Intermediate C-61-1 and [4-(triphenylsilyl)phenyl]boronic acid (CAS no. 852475-03-7) were reacted in the presence of a Pd catalyst to thereby obtain Intermediate C-61-2. Intermediate C-61-2 was subjected to LC-MS to identify the M+1 peak value thereof.

$C_{39}H_{27}ClN_4Si$: M+1 615.17

(Synthesis of Compound C-61)

4.2 g of Intermediate C-19-1, 4 g of Intermediate C-61-2, 2.6 g of potassium carbonate, 0.38 g of tetrakis(triphenyl phosphine)palladium (0), 32 mL of tetrahydrofuran, and 8 mL of water were added to a reaction vessel and refluxed for 24 hours. Once the reaction was complete, the reaction solution was extracted utilizing ethyl acetate, and the resulting organic layer was dried utilizing magnesium sulfate. After evaporation of the solvent, the resulting residue was separated and purified utilizing silica gel column chromatography to thereby obtain 3.9 g of Compound C-61 (yield: 55%). Compound C-61 was identified utilizing LC-MS and $^1$H-NMR.

Compounds synthesized in Synthesis Examples 1 to 11 were identified by $^1$H-NMR and mass spectroscopy/fast atom bombardment (MS/FAB). The results thereof are shown in Table 1. Methods of synthesizing compounds other than compounds shown in Table 1 may be easily understood to those skilled in the art by referring to the synthesis schemes and raw materials described above.

TABLE 1

| Compound | $^1$H NMR (δ) | MS/FAB [M + 1] Calc | MS/FAB [M + 1] Found |
|---|---|---|---|
| A-1 | 8.55(d, 1H), 8.19(d, 1H), 7.94(d, 1H), 7.58(d, 1H), 7.38-7.08(m, 29H), 5.19(s, 2H) | 677.92 | 678.97 |
| A-12 | 8.55(d, 2H), 8.19(d, 1H), 7.94(d, 2H), 7.72(d, 1H), 7.67(s, 1H), 7.50-7.08(m, 28H), 5.19(s, 2H) | 848.15 | 849.11 |
| A-39 | 8.55(d, 1H), 8.45(d, 1H), 8.12(m, 2H), 7.99-7.89(m, 6H), 7.77-7.75(m, 3H), 7.64-7.16(m, 30H), 5.19(s, 2H) | 936.26 | 937.25 |
| A-127 | 8.08(d, 1H), 8.02(d, 1H), 7.98(d, 1H), 7.88(s, 1H), 7.75(d, 2H), 7.53-7.31(m, 26H), 7.20(m, 2H), 7.08(m, 2H), 5.19(s, 2H) | 755.00 | 756.01 |
| A-175 | 8.30(d, 1H), 8.19(d, 1H), 8.13(d, 1H), 7.89-7.87(m, 3H), 7.75(d, 2H), 7.62-7.20(m, 31H), 7.08(m, 2H), 5.19(s, 2H) | 830.12 | 831.11 |
| C-6 | 8.36(m, 4H), 7.53-7.38(m, 22H), 7.20(d, 2H), 7.08(t, 2H), 5.19(s, 2H) | 748.31 | 749.33 |
| C-11 | 8.23(s, 1H), 8.04(s, 1H), 7.98-7.94(m, 6H), 7.75(m, 4H), 7.55-7.38(m, 28H), 7.20(d, 2H), 7.08(t, 2H), 5.19(s, 2H) | 895.19 | 896.19 |
| C-19 | 8.29(d, 4H), 8.20(s, 2H), 7.55-7.37(m, 27H), 7.20(d, 2H), 7.08(d, 2H), 5.19(s, 2H) | 742.01 | 743.01 |
| C-33 | 8.55(d, 1H), 8.36(m, 2H), 8.19(d, 1H), 7.94(d, 2H), 7.88(s, 1H), 7.75(d, 2H), 7.51-7.16(m, 33H), 5.19(s, 2H) | 909.18 | 910.16 |
| C-55 | 8.38-8.36(m, 3H), 7.88(s, 1H), 7.64(t, 1H), 7.64-7.38(m, 40H), 7.20(d, 2H), 7.08(t, 2H), 5.19(s, 2H) | 1002.38 | 1003.37 |
| C-61 | 8.55(d, 1H), 8.19(d, 1H), 7.94(d, 1H), 7.87(d, 2H), 7.65(d, 2H), 7.58-7.38(m, 39H), 7.20-7.16(m, 4H), 7.08(t, 2H), 5.19(s, 2H) | 1091.48 | 1092.45 |

Example 1

A Corning 15 Ohms per square centimeter ($\Omega/cm_2$) (1,200 Å) ITO glass substrate was cut to a size of 50 millimeters (mm)×50 mm×0.7 mm, sonicated in isopropyl alcohol and pure water for 5 minutes in each solvent, and cleaned by exposure to ultraviolet rays with ozone to utilize the glass substrate as an anode. Then, the glass substrate was mounted to a vacuum-deposition apparatus.

N,N'-di(1-naphthyl)-N,N'-diphenylbenzidine (NPB) was vacuum-deposited on the substrate to a thickness of 300 Å to form a hole injection layer. Subsequently, mCP was vacuum-deposited on the hole injection layer to a thickness of 200 Å to form a hole transport layer.

Compound A-1 as a host and $Ir(pmp)_3$ as a dopant were co-deposited on the hole transport layer at a weight ratio of 92:8 to a thickness of 250 Å to form an emission layer.

Then, 3-(4-biphenylyl)-4-phenyl-5-tert-butylphenyl-1,2,4-triazole (TAZ) was deposited on the emission layer to a thickness of 200 Å to form an electron transport layer.

LiF was deposited on the electron transport layer to a thickness of 10 Å to form an electron injection layer, and Al was vacuum-deposited on the electron injection layer to a thickness of 100 Å to form a cathode, thereby completing formation of a LiF/AI electrode. Thus, a light-emitting device was manufactured. Examples 2 to 11

Additional light-emitting devices were manufactured in substantially the same manner as in Example 1, except that Compounds shown in Table 2 were respectively utilized instead of Compound A-1 to form an emission layer. Comparative Examples 1 to 7

Additional light-emitting devices were manufactured in substantially the same manner as in Example 1, except that Compounds mCP and Compounds CP-1 to CP-6 were respectively utilized instead of Compound A-1 to form an emission layer.

mCP

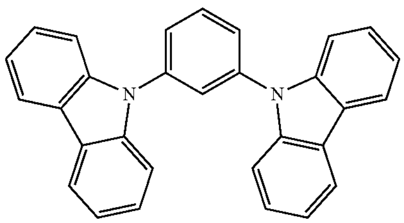

CP-1

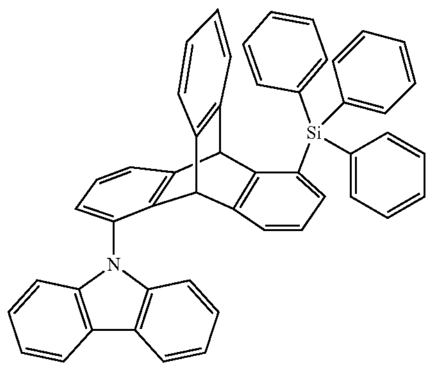

CP-2

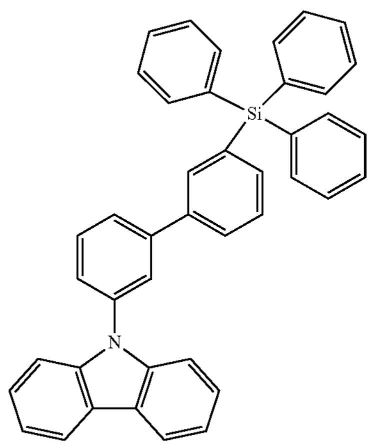

CP-3

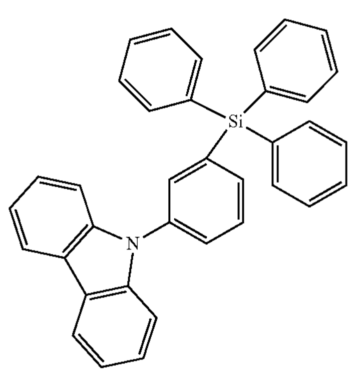

-continued

CP-4

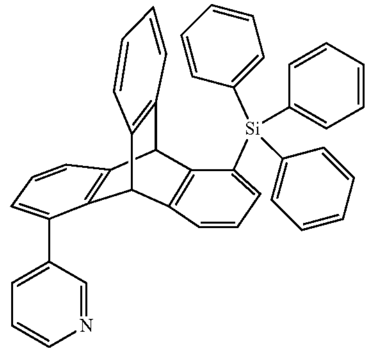

CP-5

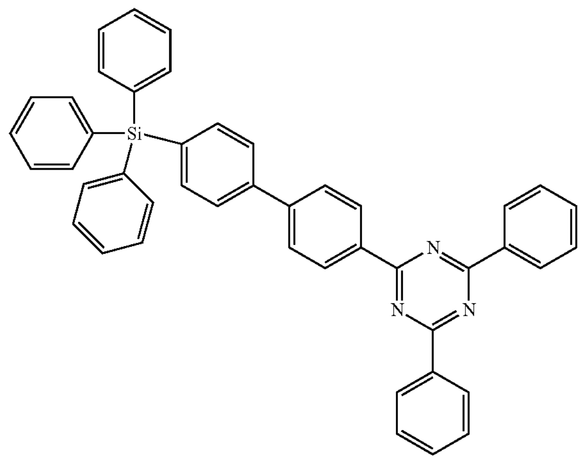

CP-6

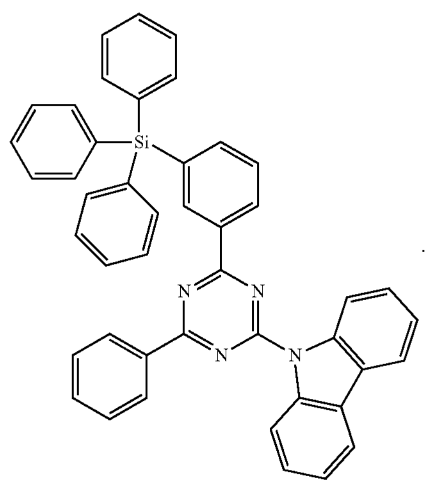

To evaluate the characteristics of the light-emitting devices according to Examples 1 to 11 and Comparative Examples 1 to 7, the driving voltage, current density, and a maximum quantum yield were measured at a current density of 10 milliamperes per square centimeter ($mA/cm^2$). The driving voltage and the current density of each of the light-emitting devices were measured utilizing a source meter (Keithley Instrument, 2400 series). The maximum quantum yield of each of the light-emitting devices were measured utilizing Hamamatsu Absolute PL Measurement System C9920-2-12. In evaluation of the maximum quantum efficiency, luminance/current density was measured utilizing a luminance meter with calibration of wavelength sensitivity, and the maximum external quantum efficiency was calculated on the assumption of the angular luminance distribution (Lambertian) assuming a complete diffusion reflecting surface. The evaluation results of the light-emitting devices are shown in Table 2.

TABLE 2

| Classification | Emission layer | Driving voltage (V) | Current density (mA/cm$^2$) | Maximum quantum yield (%) | Emission color |
|---|---|---|---|---|---|
| Example 1 | Compound A-1 | 4.3 | 10 | 19.4 | Blue |
| Example 2 | Compound A-12 | 4.2 | 10 | 20.8 | Blue |
| Example 3 | Compound A-39 | 4.1 | 10 | 18.9 | Blue |
| Example 4 | Compound A-127 | 4.1 | 10 | 19.6 | Blue |
| Example 5 | Compound A-175 | 4.2 | 10 | 20.3 | Blue |
| Example 6 | Compound C-6 | 4.4 | 10 | 20.1 | Blue |
| Example 7 | Compound C-11 | 4.2 | 10 | 19.5 | Blue |
| Example 8 | Compound C-19 | 4.3 | 10 | 18.9 | Blue |
| Example 9 | Compound C-33 | 4.2 | 10 | 19.8 | Blue |
| Example 10 | Compound C-55 | 4.3 | 10 | 19.3 | Blue |
| Example 11 | Compound C-66 | 4.2 | 10 | 19.1 | Blue |
| Comparative Example 1 | mCP | 4.9 | 10 | 19.9 | Blue |
| Comparative Example 2 | Compound CP-1 | 4.6 | 10 | 17.7 | Blue |
| Comparative Example 3 | Compound CP-2 | 4.7 | 10 | 18.5 | Blue |
| Comparative Example 4 | Compound CP-3 | 4.5 | 10 | 18.1 | Blue |
| Comparative Example 5 | Compound CP-4 | 4.6 | 10 | 18.8 | Blue |
| Comparative Example 6 | Compound CP-5 | 4.8 | 10 | 16.8 | Blue |
| Comparative Example 7 | Compound CP-6 | 4.6 | 10 | 17.9 | Blue |

Referring to the results of Table 2, the light-emitting devices of Examples 1 to 11 were each found to have a low driving voltage and a high maximum quantum yield, as compared with the ligh-emitting devices of Comparative Examples 1 to 7.

As apparent from the foregoing description, the condensed cyclic compound may have a high triplet energy, and thus, a light-emitting device including the condensed cyclic compound may exhibit high luminescence efficiency.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that the embodiments described herein should be considered in a descriptive sense only and not for purposes of limitation. Descriptions of features or aspects within each embodiment should typically be considered as being available for other similar features or aspects in other embodiments. While one or more embodiments have been described with reference to the drawings, it will be understood by those of ordinary skill in the art that various suitable changes in form and details may be made therein without departing from the spirit and scope as defined by the following claims and equivalents thereof.

What is claimed is:

1. A light-emitting device comprising:

a first electrode;

a second electrode facing the first electrode; and an interlayer between the first electrode and the second electrode and comprising an emission layer, wherein the light-emitting device comprises a condensed cyclic compound represented by Formula 1:

Formula 1

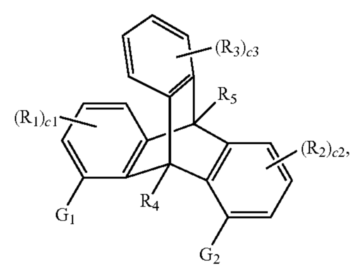

wherein, in Formula 1, $G_1$ is a group represented by Formula 2, and $G_2$ is a group represented by one of Formulae 3A to 3C:

Formula 2

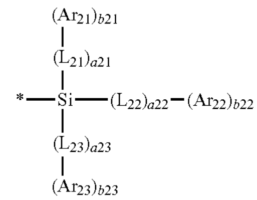

-continued

Formula 3A

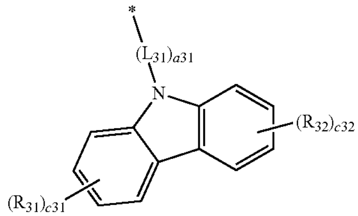

Formula 3B

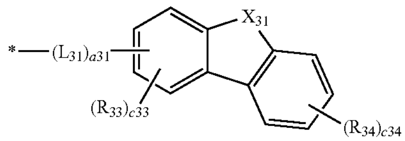

Formula 3C

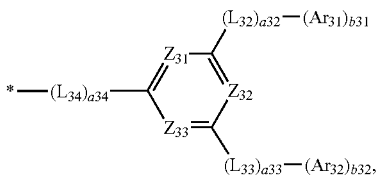

wherein, in Formulae 1, 2, and 3A to 3C, $X_{31}$ is $N(R_{35})$, O or S, $Z_{31}$ is $C(R_{36})$ or N, $Z_{32}$ is $C(R_{37})$ or N, $Z_{33}$ is $C(R_{38})$ or N, and at least one of $Z_{31}$ to $Z_{33}$ is N, $L_{21}$ to $L_{23}$ and $L_{31}$ to $L_{34}$ are each independently a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, a21 to a23 and a31 to a34 are each independently an integer from 1 to 3, $Ar_{21}$ to $Ar_{23}$, $Ar_{31}$, and $Ar_{32}$ are each independently a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, or —$Si(Q_1)(Q_2)(Q_3)$, b21 to b23, b31, and b32 are each independently an integer from 1 to 5, $R_1$ to $R_5$ and $R_{31}$ to $R_{38}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, c1, c2, and c33 are each independently an integer from 1 to 3, c3, c31, c32, and c34 are each independently an integer from 1 to 4, "*" is a binding site to a corresponding adjacent atom in Formula 1, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The light-emitting device of claim 1, wherein the emission layer comprises the condensed cyclic compound.

3. The light-emitting device of claim 1, wherein the emission layer comprises a host and a dopant, a content of the host in the emission layer is greater than a content of the dopant in the emission layer, and the host comprises the condensed cyclic compound.

4. The light-emitting device of claim 1, wherein the emission layer comprises a host and a dopant, a content of the host in the emission layer is greater than a content of the dopant in the emission layer, and the dopant comprises the condensed cyclic compound.

5. The light-emitting device of claim 2, wherein the emission layer is to emit blue light having a maximum emission wavelength in a range of about 390 nanometers (nm) to about 440 nm.

6. The light-emitting device of claim 1, wherein the first electrode is an anode, the second electrode is a cathode, the interlayer further comprises a hole transport region between the first electrode and the emission layer and an electron transport region between the emission layer and the second electrode, the hole transport region comprises a hole injection layer, a hole transport layer, an emission auxiliary layer, an electron blocking layer, or any combination thereof, and the electron transport region comprises a buffer layer, a hole blocking layer, an electron control layer, an electron transport layer, an electron injection layer, or any combination thereof.

7. An electronic apparatus comprising the light-emitting device of claim 1.

8. The electronic apparatus of claim 7, further comprising a color filter, a color-conversion layer, a touchscreen layer, a polarization layer, or any combination thereof.

9. A condensed cyclic compound represented by Formula 1:

Formula 1

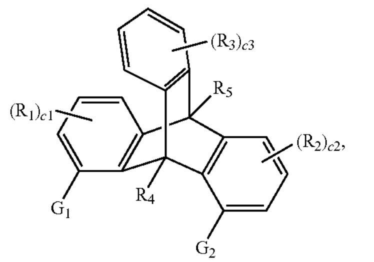

wherein, in Formula 1, $G_1$ is a group represented by Formula 2, and $G_2$ is a group represented by one of Formulae 3A to 3C:

Formula 2

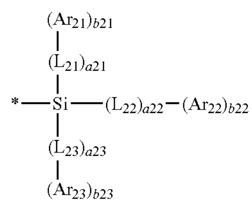

Formula 3A

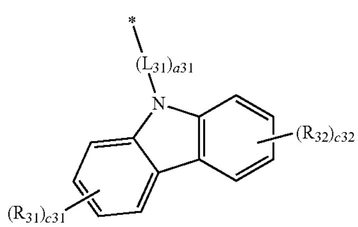

Formula 3B

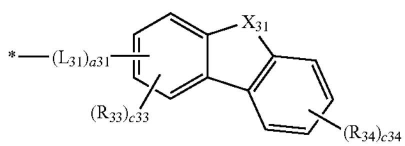

Formula 3C

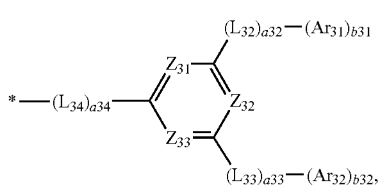

wherein, in Formulae 1, 2, and 3A to 3C, $X_{31}$ is $N(R_{35})$, O or S, $Z_{31}$ is $C(R_{36})$ or N, $Z_{32}$ is $C(R_{37})$ or N, $Z_{33}$ is $C(R_{38})$ or N, and at least one of $Z_{31}$ to $Z_{33}$ is N, $L_{21}$ to $L_{23}$ and $L_{31}$ to $L_{34}$ are each independently a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, a21 to a23 and a31 to a34 are each independently an integer from 1 to 3, $Ar_{21}$ to $Ar_{23}$, $Ar_{31}$, and $Ar_{32}$ are each independently a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, or —$Si(Q_1)(Q_2)(Q_3)$, b21 to b23, b31, and b32 are each independently an integer from 1 to 5, $R_1$ to $R_5$ and $R_{31}$ to $R_{38}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, c1, c2, and c33 are each independently an integer from 1 to 3, c3, c31, c32, and c34 are each independently an integer from 1 to 4, "*" is a binding site to a corresponding adjacent atom in Formula 1, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

10. The condensed cyclic compound of claim 9, wherein $L_{21}$ to $L_{23}$ and $L_{31}$ to $L_{34}$ in Formulae 2 and 3C are each independently:

a single bond; or a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, or an imidazopyrimidine group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, a benzofuranyl group, a benzothiophenyl group, a dibenzofuranyl group, a dibenzothiophenyl group, a carbazolyl group, a benzosilolyl group, a dibenzosilolyl group, a quinolinyl group, an isoquinolinyl group, a benzimidazolyl group, an imidazopyridinyl group, an imidazopyrimidinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof, and wherein $Q_{31}$ to $Q_{33}$ are each independently a $C_1$-$C_{10}$ alkyl group, a $C_1$-$C_{10}$ alkoxy group, a phenyl group, a biphenyl group, a terphenyl group, or a naphthyl group.

11. The condensed cyclic compound of claim 9, wherein a21 to a23 and a31 to a34 in Formulae 2 and 3A to 3C are each 1, and $L_{21}$ to $L_{23}$ and $L_{31}$ to $L_{34}$ are each independently a single bond or a group represented by one of Formulae 3-1 to 3-3 and 3-24:

3-1

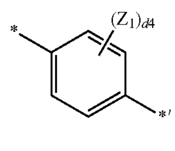

-continued 3-2

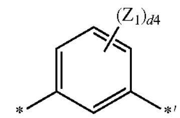

3-3

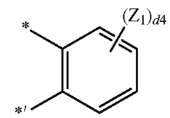

3-24

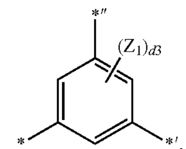

wherein, in Formulae 3-1 to 3-3 and 3-24, $Z_1$ is hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a triazinyl group, a dibenzofuranyl group, a dibenzothiophenyl group, a carbazolyl group, a quinolinyl group, an isoquinolinyl group, a benzimidazolyl group, —$Si(Q_{31})(Q_{32})(Q_{33})$, —$N(Q_{31})(Q_{32})$, or —$B(Q_{31})(Q_{32})$, d3 is an integer from 1 to 3, and d4 is an integer from 1 to 4, and wherein $Q_{31}$ to $Q_{33}$ are each independently a $C_1$-$C_{10}$ alkyl group, a $C_1$-$C_{10}$ alkoxy group, a phenyl group, a biphenyl group, a terphenyl group, or a naphthyl group, and

* and *' each indicate a binding site to an adjacent atom.

12. The condensed cyclic compound of claim 9, wherein $Ar_{21}$ to $Ar_{23}$, $Ar_{31}$, and $Ar_{32}$ in Formulae 2 and 3C are each independently:

a cyclopentyl group, a cyclohexyl group, a cycloheptyl group, a cyclopentenyl group, a cyclohexenyl group, a phenyl group, a biphenyl group, a naphthyl group, a terphenyl group, a fluorenyl group, a spiro-bifluorenyl group, a spiro-cyclopentane-fluorenyl group, a spiro-cyclohexane-fluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a thiadiazolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, an imidazopyridinyl group, or an imidazopyrimidinyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a terphenyl group, a fluorenyl group, a spiro-bifluorenyl group, a spiro-cyclopentane-fluorenyl group, a spiro-cyclohexane-fluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a thiadiazolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, an imidazopyridinyl group, an imidazopyrimidinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof; or —Si($Q_1$)($Q_2$)($Q_3$), and wherein $Q_1$ to $Q_3$ and $Q_{31}$ to $Q_{33}$ are each independently a $C_1$-$C_{10}$ alkyl group, a $C_1$-$C_{10}$ alkoxy group, a phenyl group, a biphenyl group, a terphenyl group, or a naphthyl group.

13. The condensed cyclic compound of claim 9, wherein $Ar_{21}$ to $Ar_{23}$, $Ar_{31}$, and $Ar_{32}$ in Formulae 2 and 3C are each independently a group represented by one of Formulae 5-1 to 5-19 or —Si($Q_1$)($Q_2$)($Q_3$):

5-1

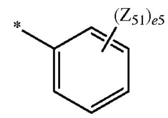

5-2

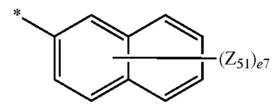

5-3

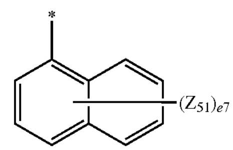

5-4

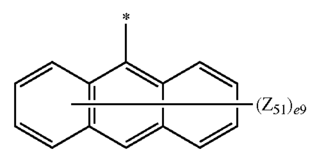

5-5

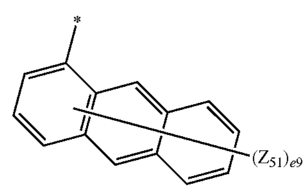

5-6

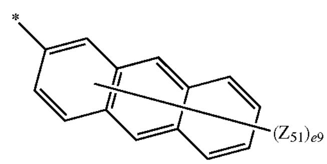

5-7

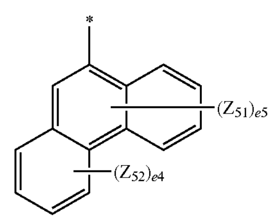

5-8

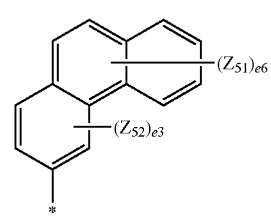

5-9

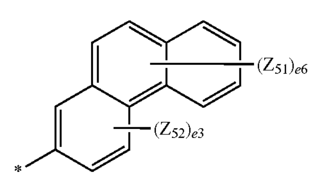

-continued 5-10

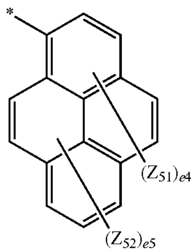

5-11

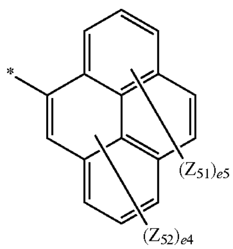

5-12

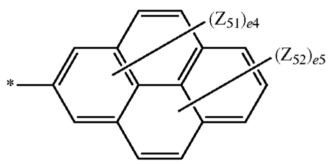

5-13

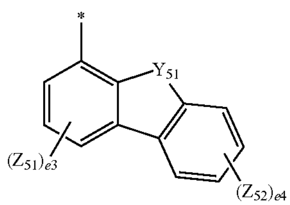

5-14

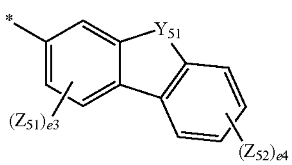

5-15

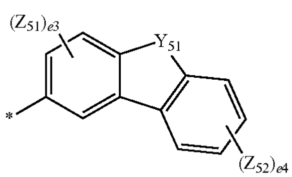

5-16

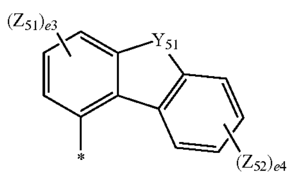

5-17

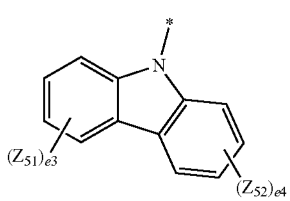

-continued 5-18

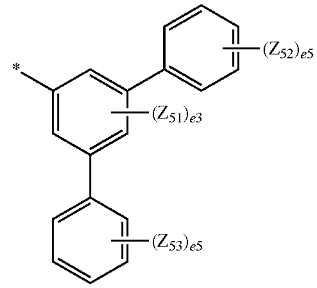

5-19

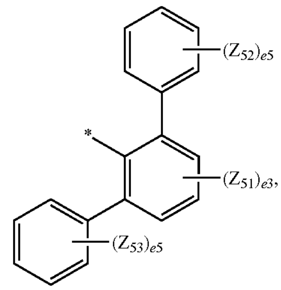

wherein, in Formulae 5-1 to 5-19, $Y_{51}$ is O, S, $N(Z_{53})$, $C(Z_{54})(Z_{55})$, or $Si(Z_{56})(Z_{57})$, $Z_{51}$ to $Z_{57}$ are each independently hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a pyridinyl group, a pyrazinyl group, a pyrimidinyl group, a pyridazinyl group, a triazinyl group, a dibenzofuranyl group, a dibenzothiophenyl group, a carbazolyl group, a dibenzosilolyl group, a quinolinyl group, an isoquinolinyl group, or a benzimidazolyl group, $—Si(Q_{31})(Q_{32})(Q_{33})$, $—N(Q_{31})(Q_{32})$, or $—B(Q_{31})(Q_{32})$, e3 is an integer from 1 to 3, e4 is an integer from 1 to 4, e5 is an integer from 1 to 5, e6 is an integer from 1 to 6, e7 is an integer from 1 to 7, and e9 is an integer from 1 to 9, and wherein $Q_1$ to $Q_3$ and $Q_{31}$ to $Q_{33}$ are each independently a $C_1$-$C_{10}$ alkyl group, a $C_1$-$C_{10}$ alkoxy group, a phenyl group, a biphenyl group, a terphenyl group, or a naphthyl group, and

* indicates a binding site to an adjacent atom.

14. The condensed cyclic compound of claim 9, wherein $Ar_{21}$ to $Ar_{23}$, $Ar_{31}$, and $Ar_{32}$ in Formulae 2 and 3C are each independently a group represented by one of Formulae 6-1 to 6-42:

6-1

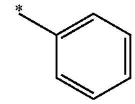

-continued
6-2
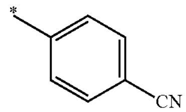
6-3
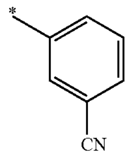
6-4
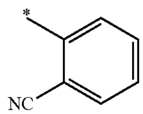
6-5
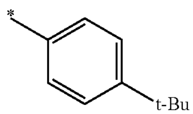
6-6
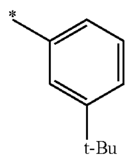
6-7
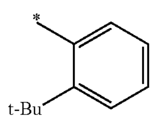
6-8
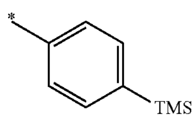
6-9
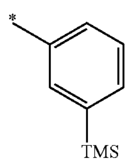
6-10
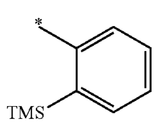
6-11
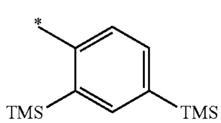
6-12
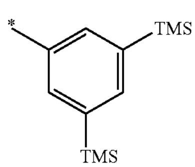
-continued
6-13
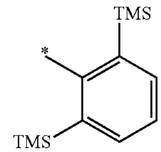
6-14
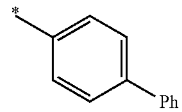
6-15
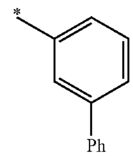
6-16
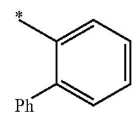
6-17
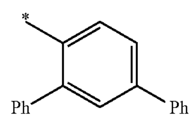
6-18
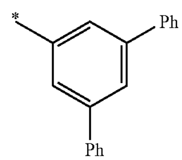
6-19
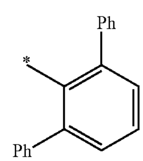
6-20
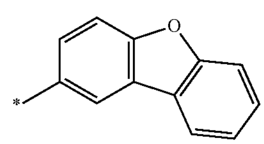
6-21
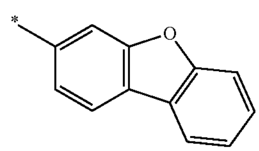
6-22
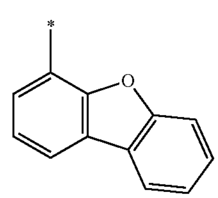

-continued
6-23
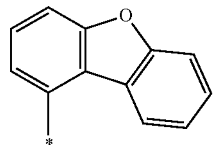
6-24
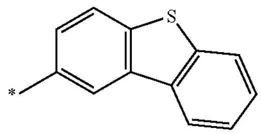
6-25
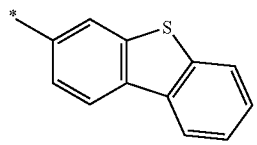
6-26
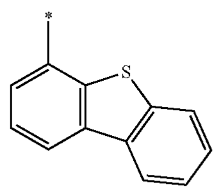
6-27
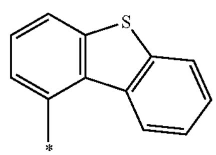
6-28
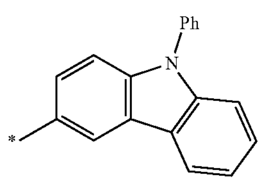
6-29
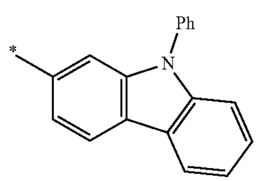
6-30
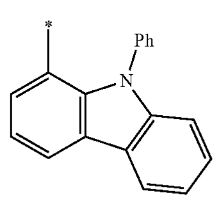
6-31
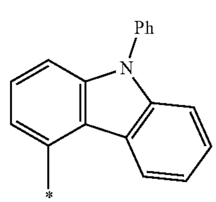
-continued
6-32
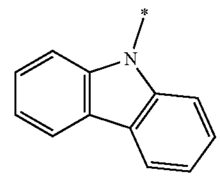
6-33
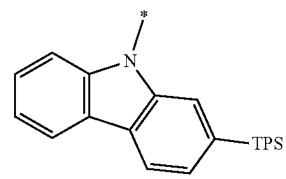
6-34
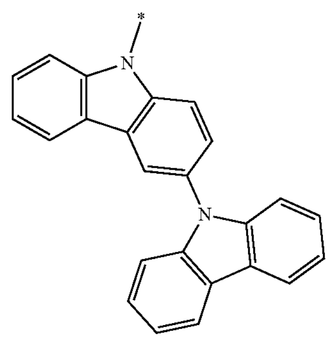
6-35
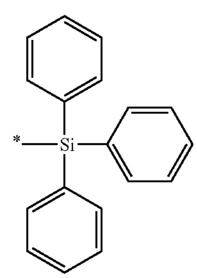
6-36
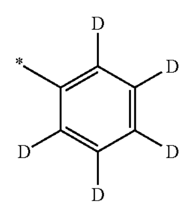
6-37
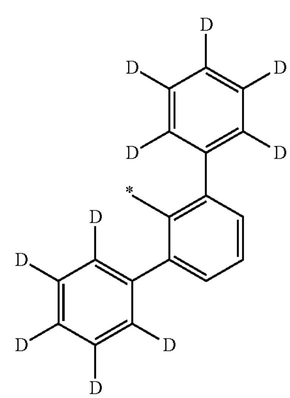

-continued 6-38

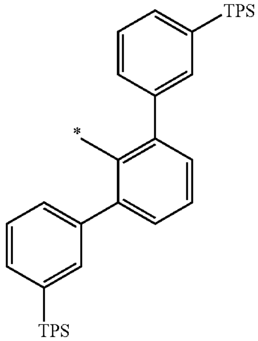

6-39

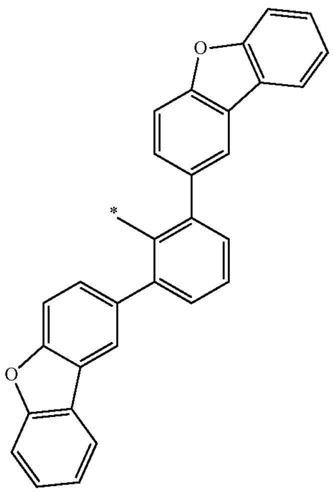

6-40

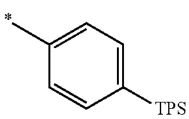

6-41

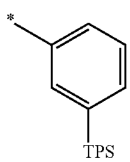

6-42

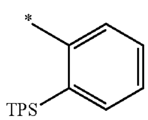

, and wherein, in Formulae 6-1 to 6-42,

"t-Bu" represents a tert-butyl group,

"Ph" represents a phenyl group,

"TMS" represents a trimethylsilyl group,

"TPS" represents a triphenylsilyl group, and

* indicates a binding site to an adjacent atom.

15. The condensed cyclic compound of claim 9, wherein:

(i) at least one of $R_1$ to $R_5$ in Formula 1 is deuterium, (ii) at least one of $Ar_{21}$ to $Ar_{23}$ in Formula 2 is substituted with deuterium, (iii) when $G_2$ is a group represented by Formula 3A, at least one of $R_{31}$ and $R_{32}$ is deuterium, or at least one of $R_{31}$ and $R_{32}$ is substituted with deuterium, (iv) when $G_2$ is a group represented by Formula 3B, at least one of $R_{33}$ and $R_{34}$ is deuterium, or at least one of $R_{33}$ to $R_{35}$ is substituted with deuterium, (v) when $G_2$ is a group represented by Formula 3C, at least one of $Ar_{31}$ and $Ar_{32}$ is substituted with deuterium, or any combination of (i), (ii), and one of (iii) to (v).

16. The condensed cyclic compound of claim 9, wherein $R_{31}$ to $R_{38}$ in Formulae 3A to 3C are each independently: hydrogen, deuterium, a cyano group, a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or —$Si(Q_1)(Q_2)(Q_3)$; or a phenyl group, a biphenyl group, a terphenyl group, a naphthyl group, a fluorenyl group, a dibenzofuranyl group, a dibenzothiophenyl group, a carbazolyl group, or a dibenzosilolyl group, each unsubstituted or substituted with deuterium, a cyano group, a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a naphthyl group, a fluorenyl group, a dibenzofuranyl group, a dibenzothiophenyl group, a carbazolyl group, a dibenzosilolyl group, —$Si(Q_{31})(Q_{32})(Q_{33})$, or any combination thereof, and wherein $Q_1$ to $Q_3$ and $Q_{31}$ to $Q_{33}$ are each independently a $C_1$-$C_{10}$ alkyl group, a $C_1$-$C_{10}$ alkoxy group, a phenyl group, a biphenyl group, a terphenyl group, or a naphthyl group.

17. The condensed cyclic compound of claim 9, wherein $G_1$ in Formula 1 is a group represented by Formula 2 (1):

Formula 2(1)

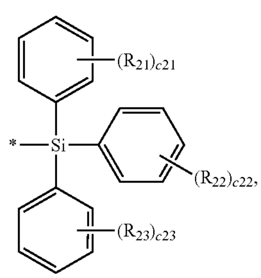

and wherein, in Formula 2 (1), $R_{21}$ to $R_{23}$ are each independently the same as $R_{10a}$, c21 to c23 are each independently an integer from 0 to 5, and

* indicates a binding site to an adjacent atom.

18. The condensed cyclic compound of claim 9, wherein $G_2$ in Formula 1 is represented by one of Formulae 3C (1) to 3C (5):

3C(1)

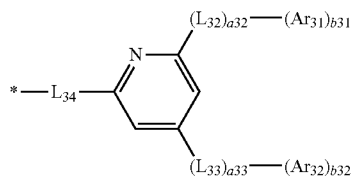

3C(2)

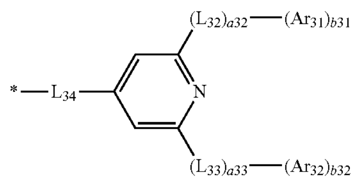

3C(3)

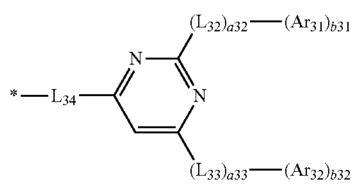

3C(4)

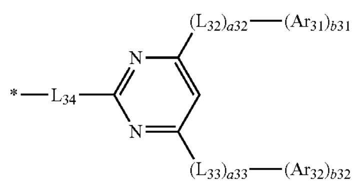

3C(5)

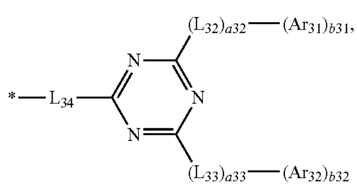

wherein, in Formulae 3C (1) to 3C (5), $L_{34}$ is a single bond or a group represented by Formula 3-2 or Formula 3-3, 3-2

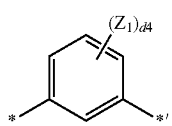

3-3

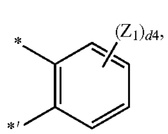

and wherein, in Formulae 3-2 and 3-3, $Z_1$ is hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a triazinyl group, a dibenzofuranyl group, a dibenzothiophenyl group, a carbazolyl group, a quinolinyl group, an isoquinolinyl group, a benzimidazolyl group, —Si($Q_{31}$)($Q_{32}$)($Q_{33}$), —N($Q_{31}$)($Q_{32}$), or —B($Q_{31}$)($Q_{32}$), d4 is an integer from 1 to 4, $Q_{31}$ to $Q_{33}$ are each independently a $C_1$-$C_{10}$ alkyl group, a $C_1$-$C_{10}$ alkoxy group, a phenyl group, a biphenyl group, a terphenyl group, or a naphthyl group, and $L_{32}$, $L_{33}$, a32, a33, $Ar_{31}$, $Ar_{32}$, b31, and b32 are each independently the same as defined in Formula 3C, and

* indicates a binding site to an adjacent atom.

19. The condensed cyclic compound of claim 18, wherein, in Formulae 3C (1) to 3C (5), $L_{32}$ and $L_{33}$ are each independently a single bond or a group represented by one of Formulae 3-1 to 3-3, a32 and a33 are each 1, $Ar_{31}$ and $Ar_{32}$ are each independently a group represented by one of Formulae 6-1 to 6-42, and b31 and b32 are each 1:

3-1

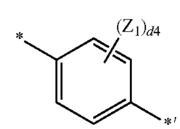

3-2

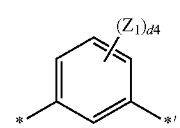

3-3

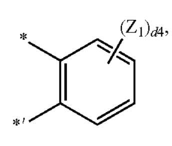

and wherein, in Formula 3-1, $Z_1$ and d4 are each independently the same as described in connection with Formulae 3-2 and 3-3, and in Formulae 3-1 to 3-3, * indicates a binding site to an adjacent atom, 6-1

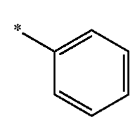

6-2

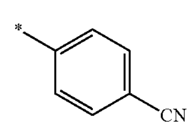

-continued
6-3
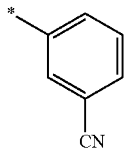
6-4
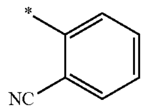
6-5
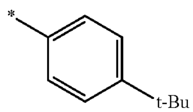
6-6
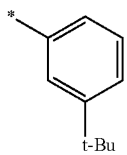
6-7
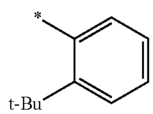
6-8
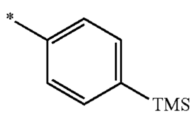
6-9
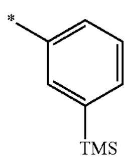
6-10
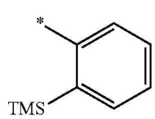
6-11
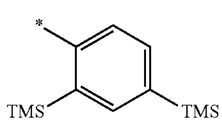
6-12
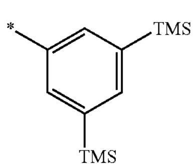
6-13
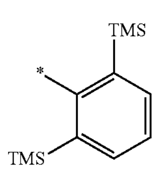
-continued
6-14
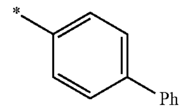
6-15
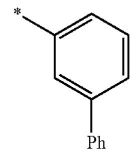
6-16
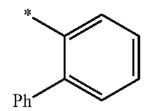
6-17
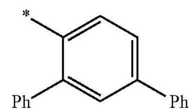
6-18
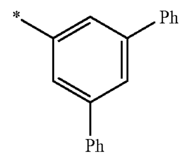
6-19
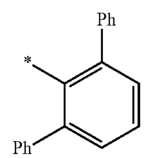
6-20
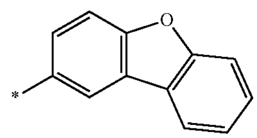
6-21
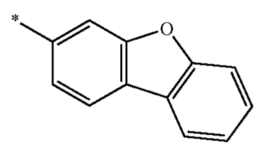
6-22
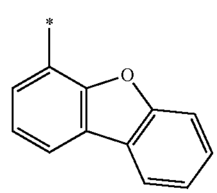
6-23
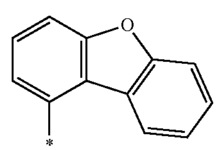
6-24
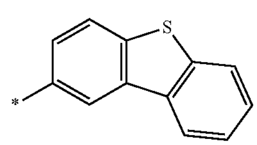

-continued
6-25
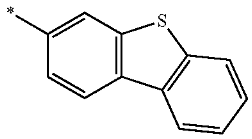
6-26
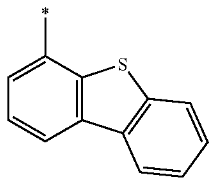
6-27
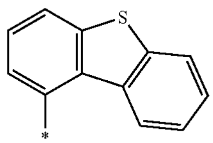
6-28
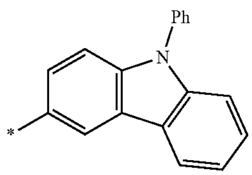
6-29
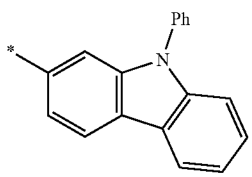
6-30
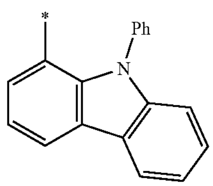
6-31
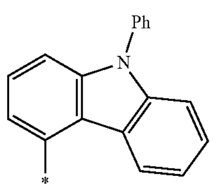
6-32
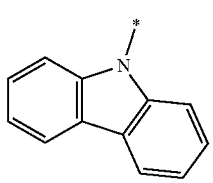
6-33
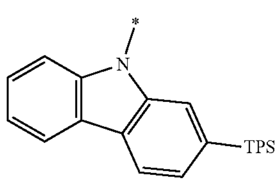
-continued
6-34
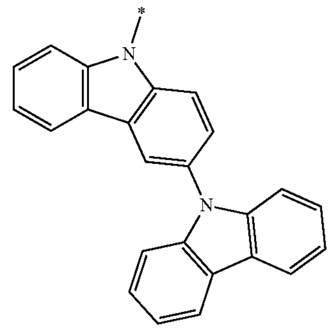
6-35
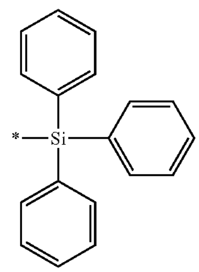
6-36
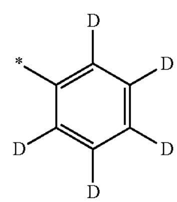
6-37
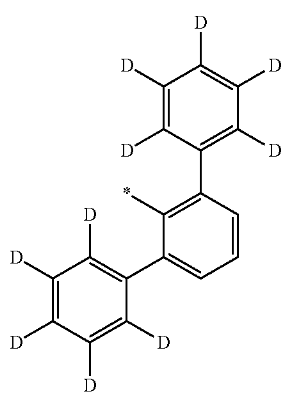
6-38
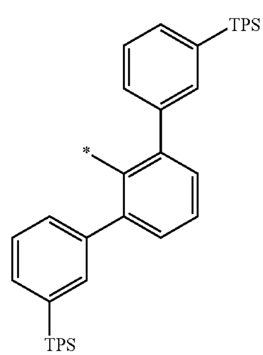

-continued 6-39

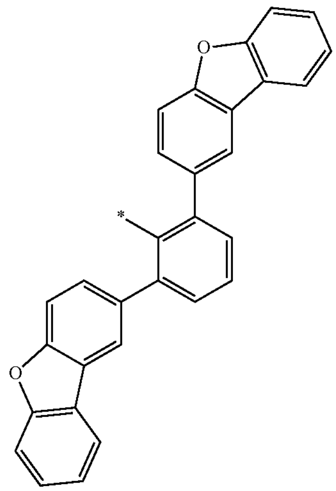

6-40

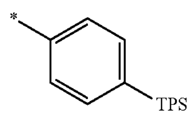

6-41

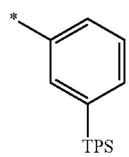

6-42

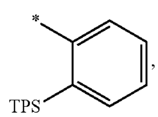

wherein, in Formulae 6-1 to 6-42,

"t-Bu" represents a tert-butyl group,

"Ph" represents a phenyl group,

"TMS" represents a trimethylsilyl group,

"TPS" represents a triphenylsilyl group, and

* indicates a binding site to an adjacent atom.

20. The condensed cyclic compound of claim 9, wherein the condensed cyclic compound is one selected from Compounds A-1 to A-240 and C-1 to C-136:

A-1

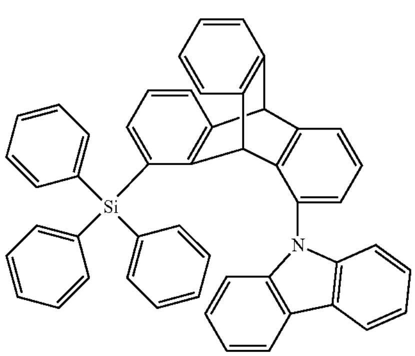

-continued

A-2

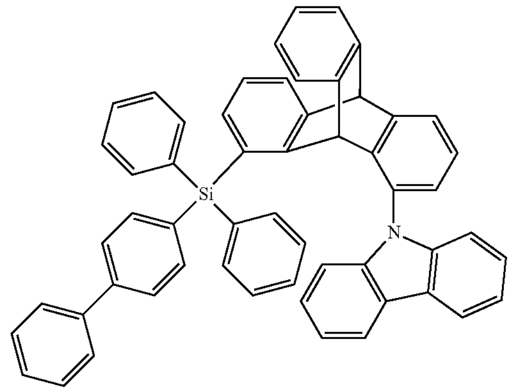

A-3

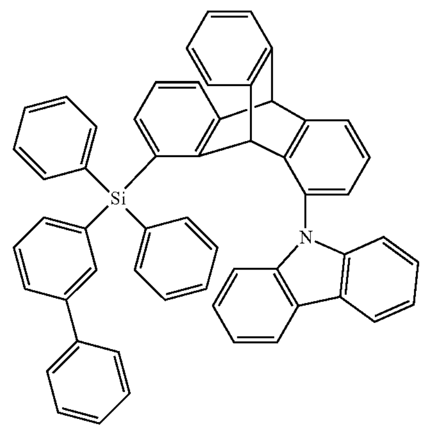

A-4

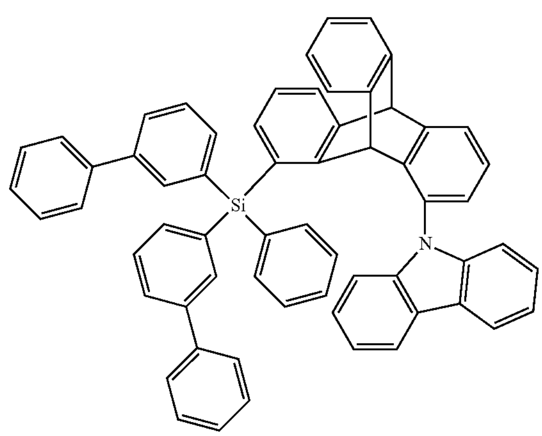

-continued
A-5
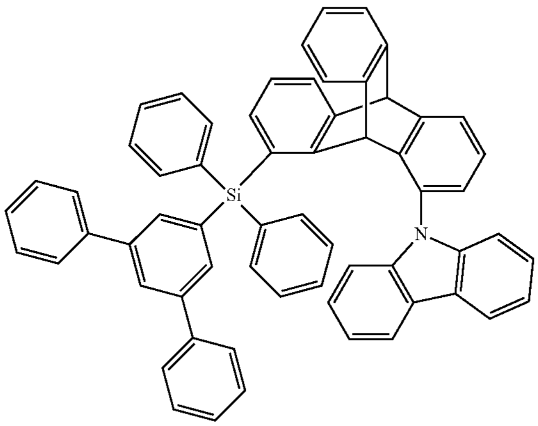
A-6
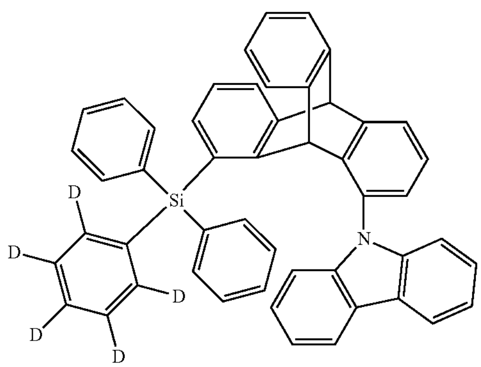
A-7
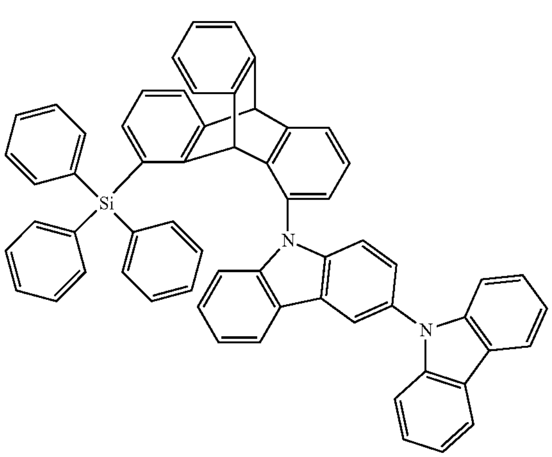
-continued
A-8
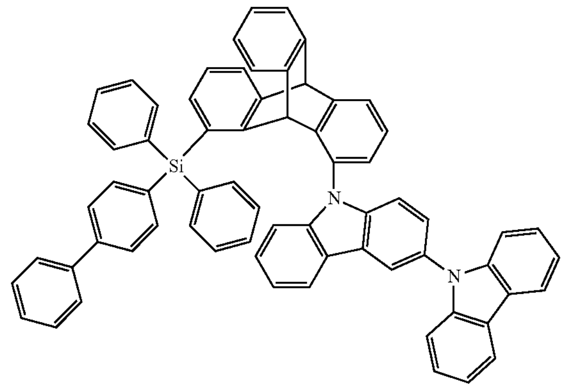
A-9
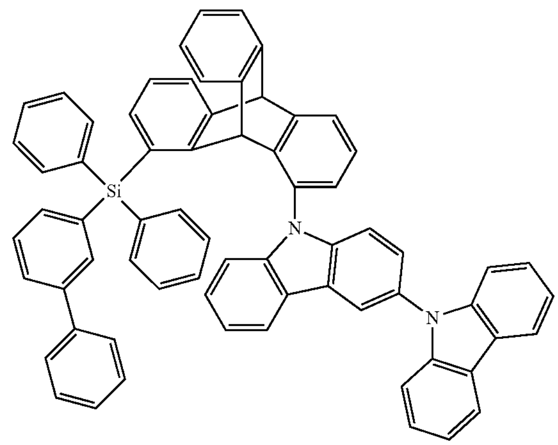
A-10
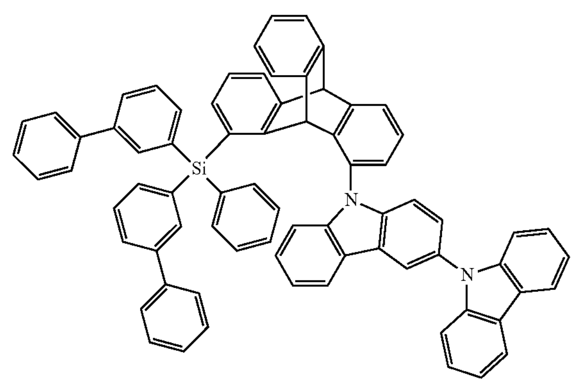
A-11
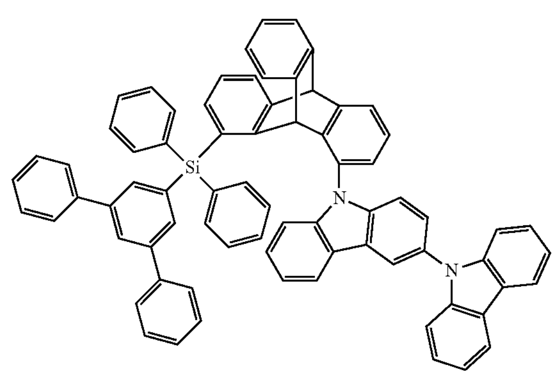

-continued
A-12
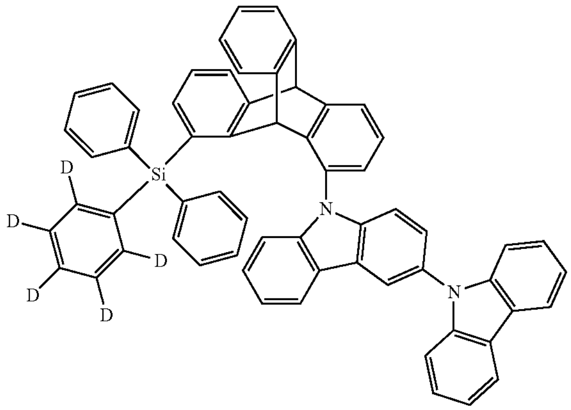
A-13
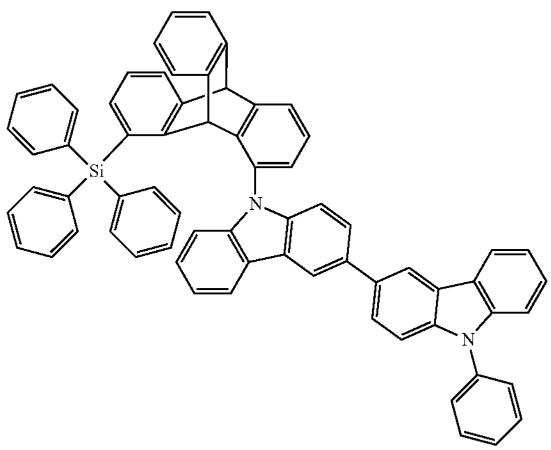
A-14
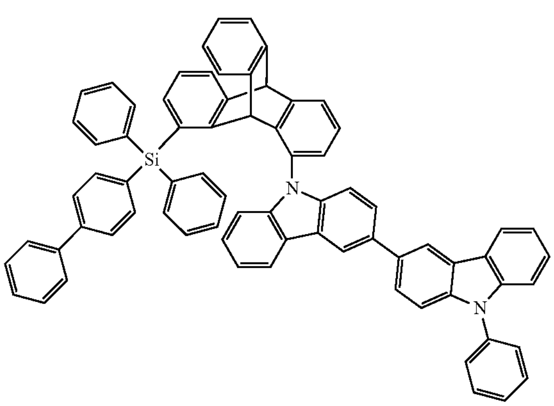
-continued
A-15
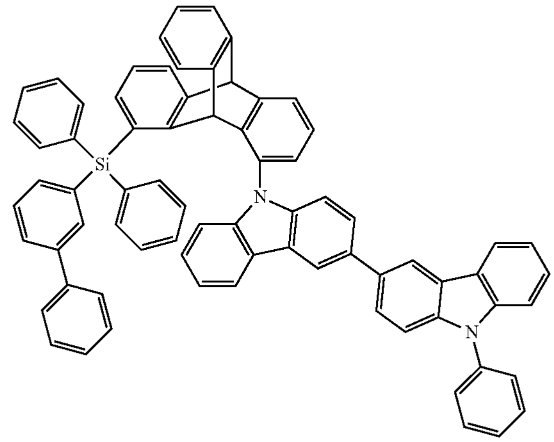
A-16
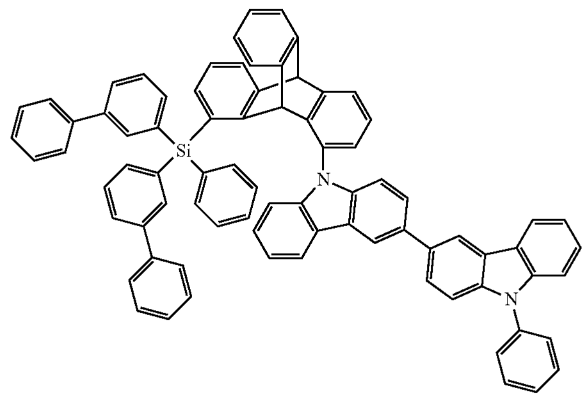
A-17
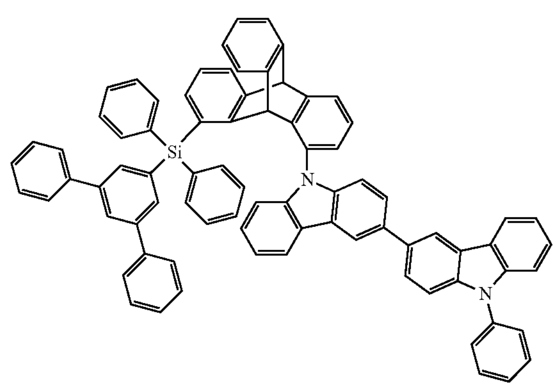

-continued
A-18
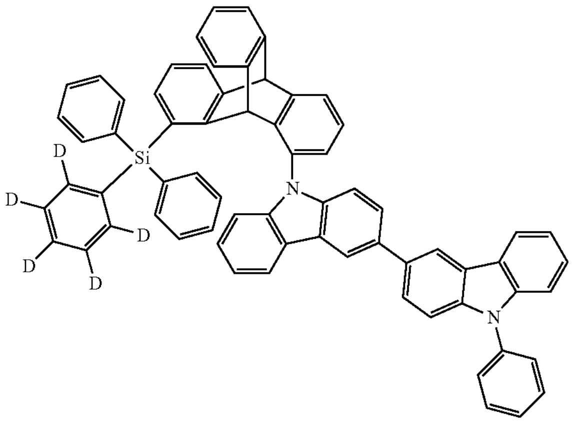
A-19
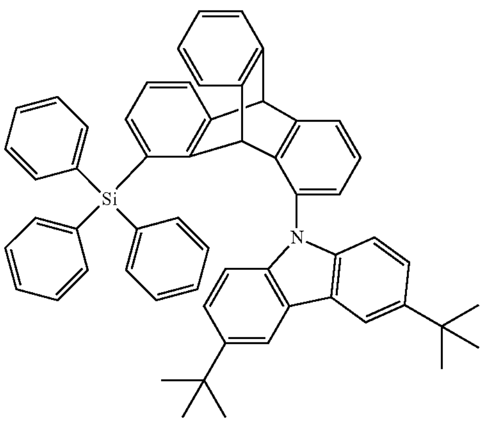
A-20
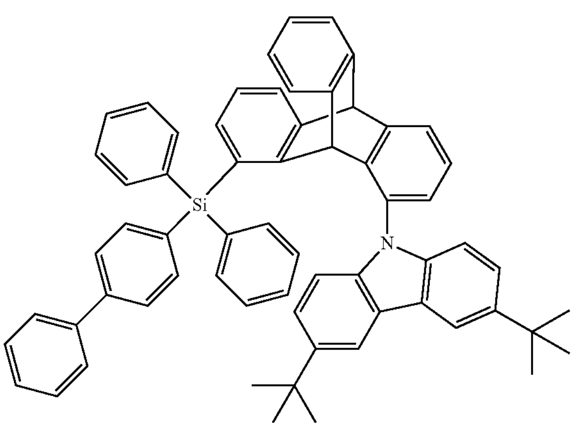
-continued
A-21
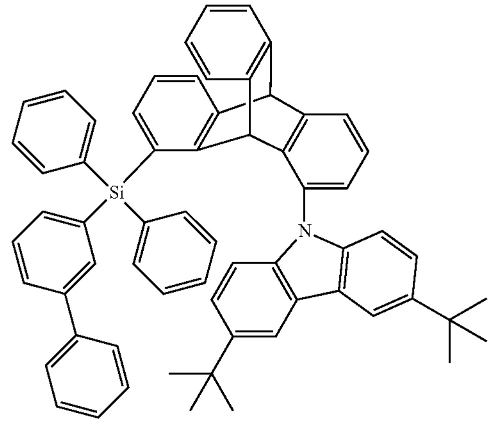
A-22
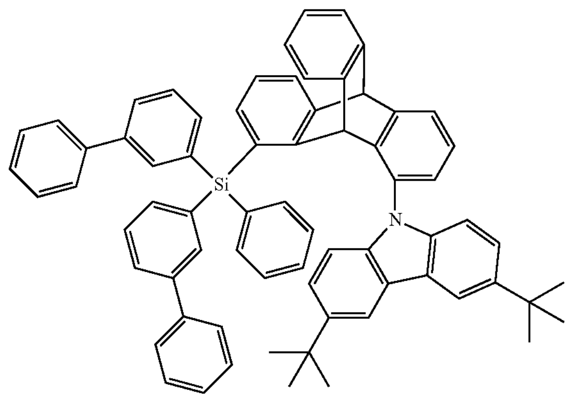
A-23
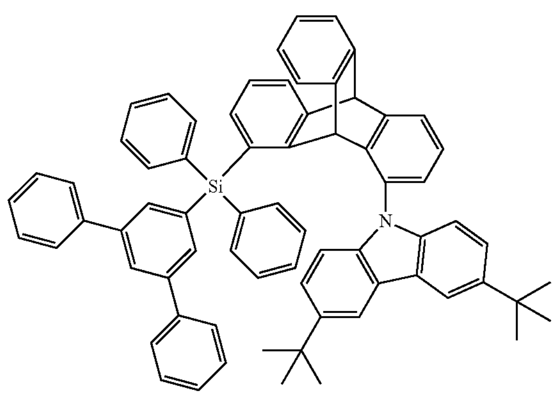

-continued
A-24
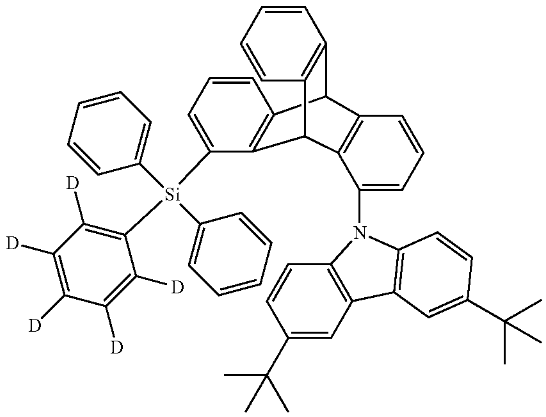
A-25
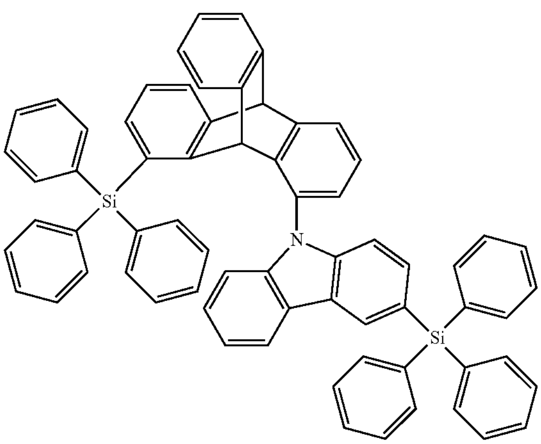
A-26
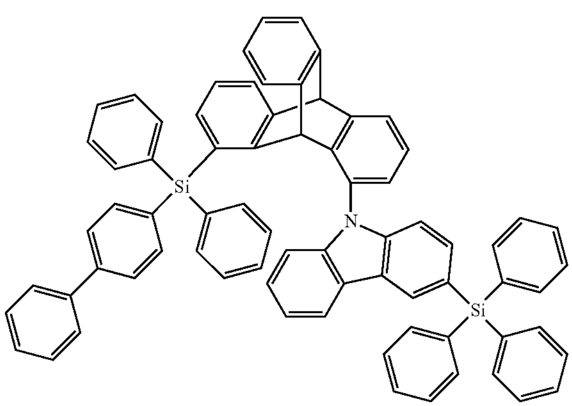
-continued
A-27
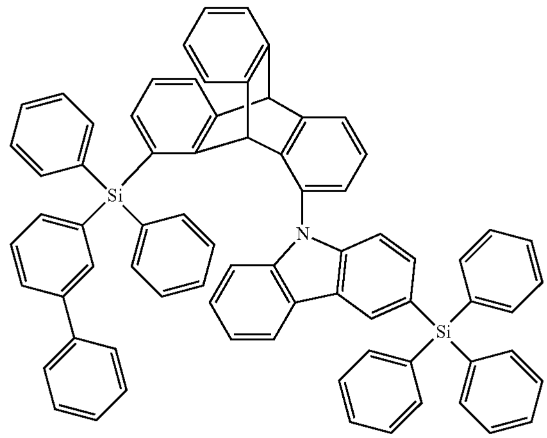
A-28
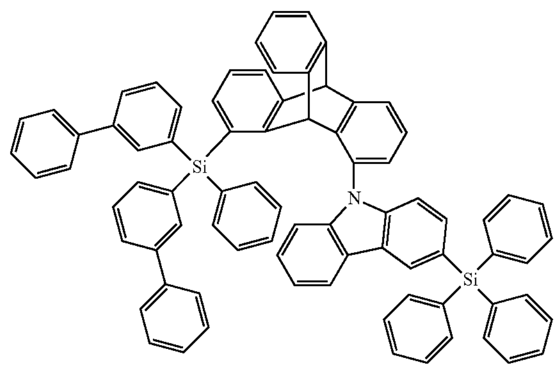
A-29
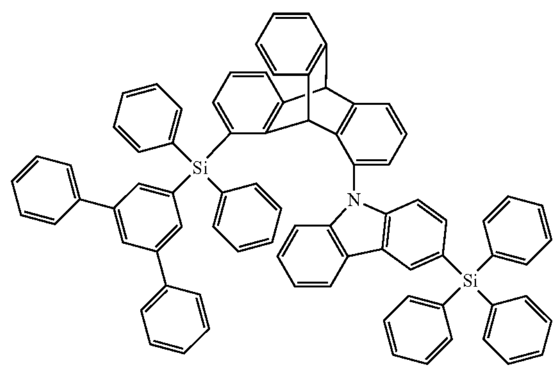
A-30
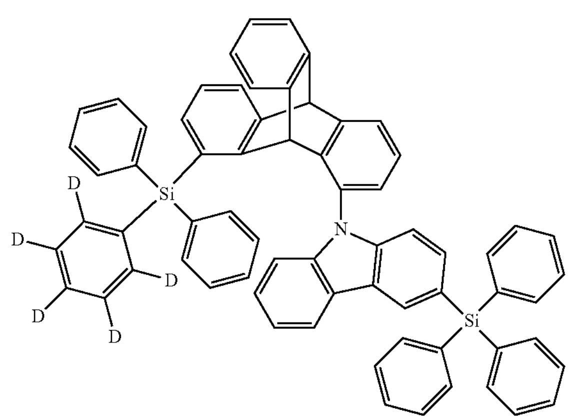

-continued
A-31
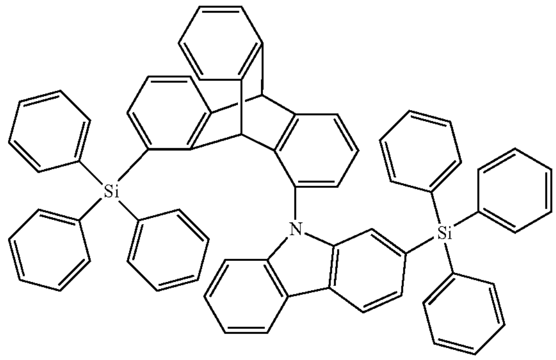
A-32
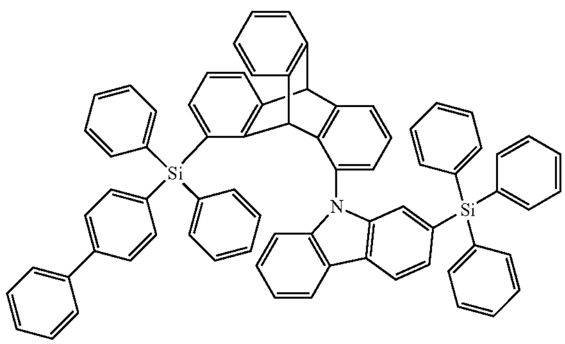
A-33
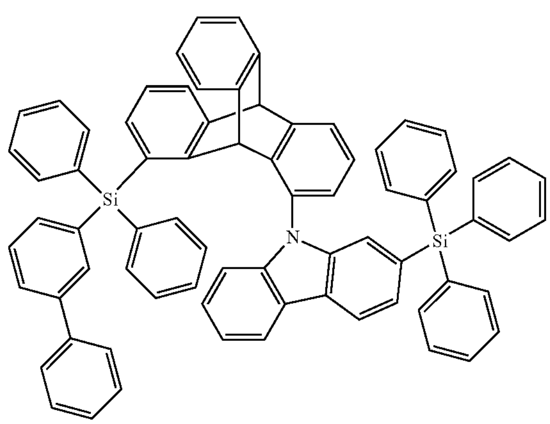
A-34
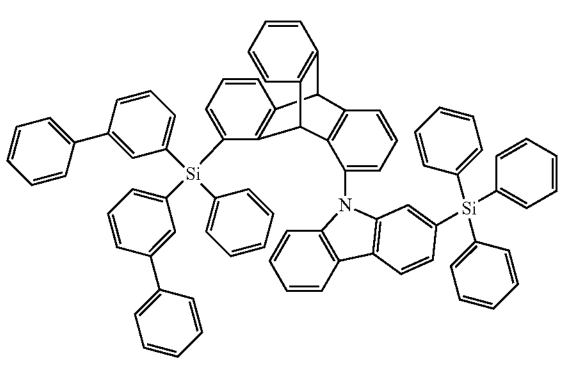
-continued
A-35
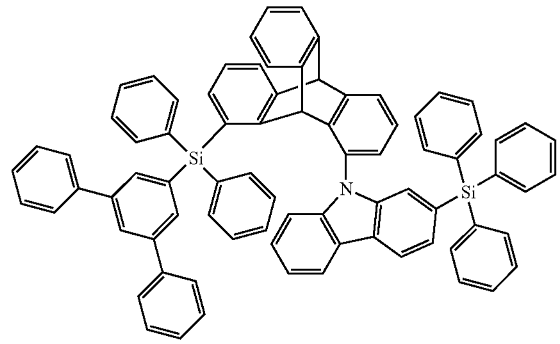
A-36
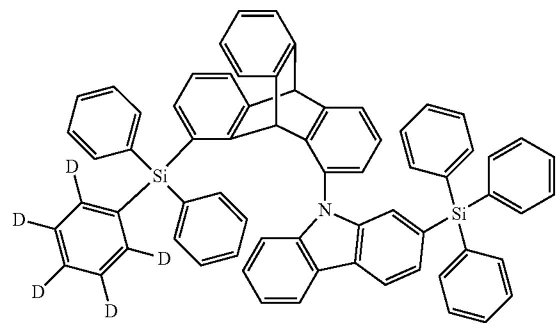
A-37
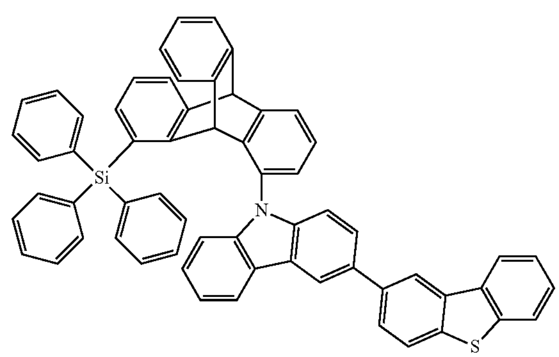
A-38
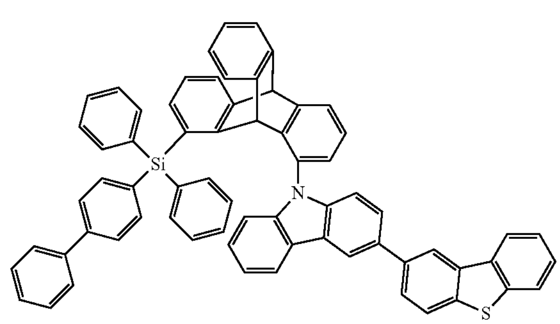

-continued
A-39
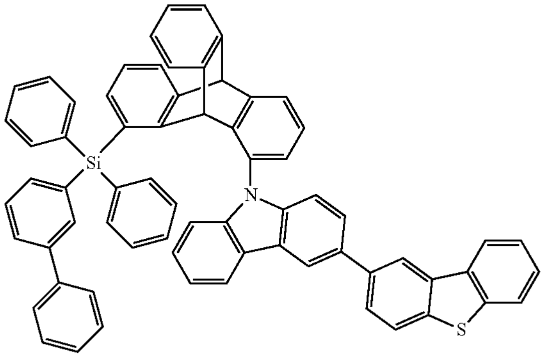
A-40
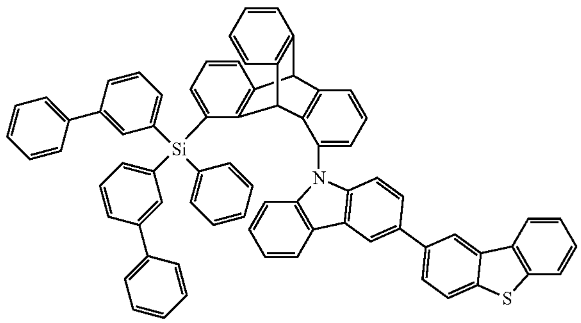
A-41
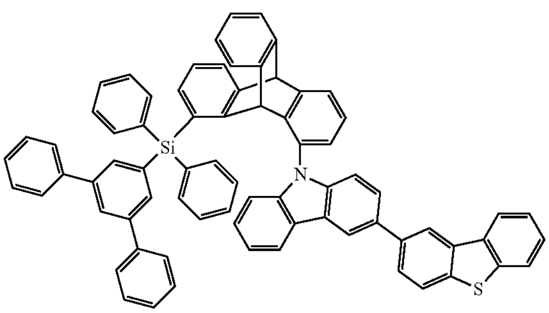
A-42
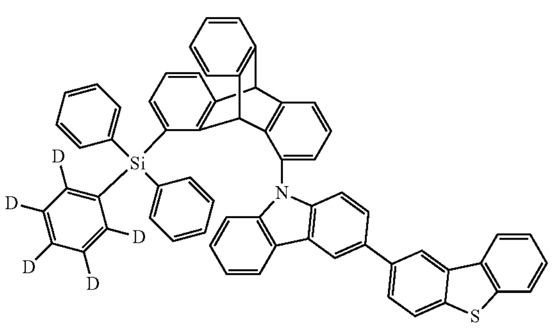
-continued
A-43
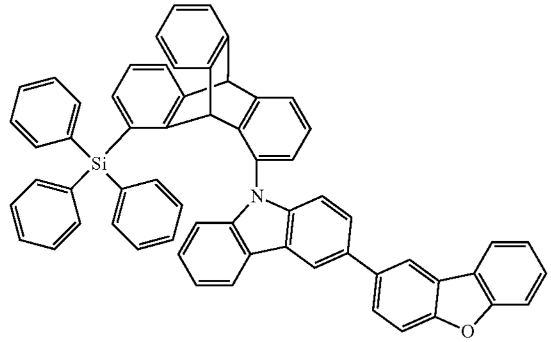
A-44
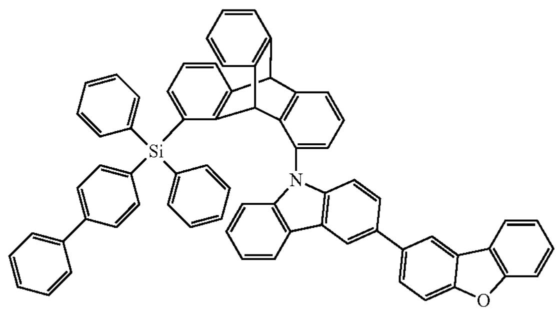
A-45
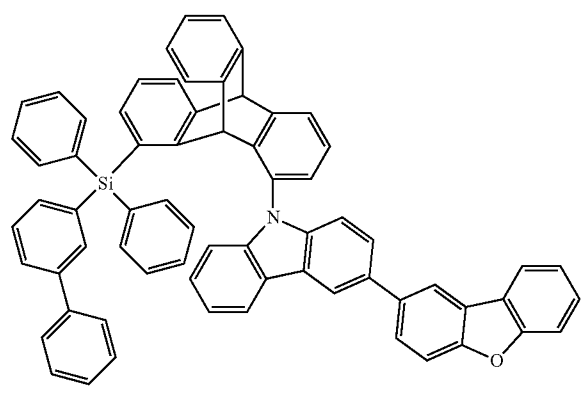

A-46
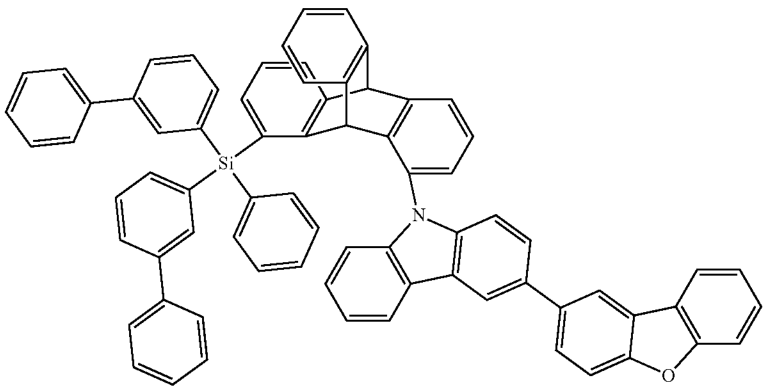
A-47
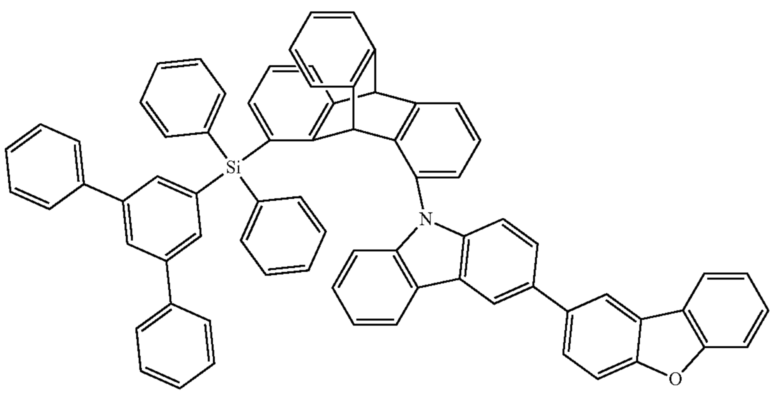
A-48
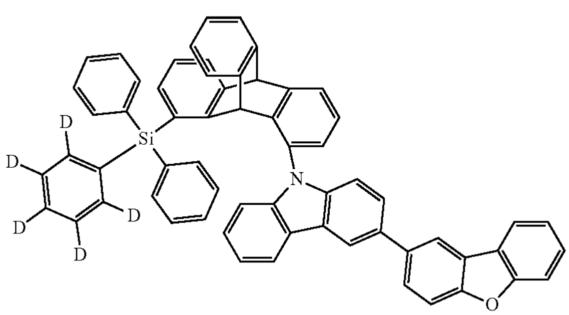
A-49
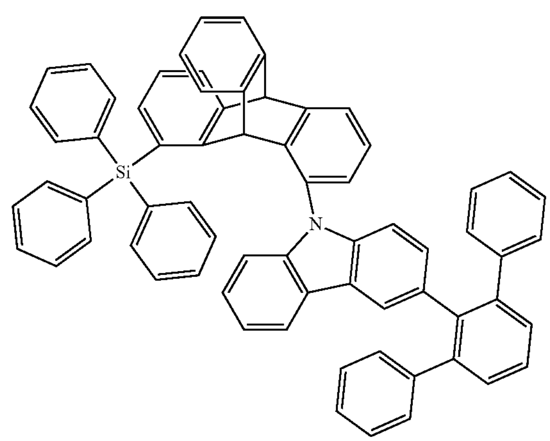

-continued
A-50
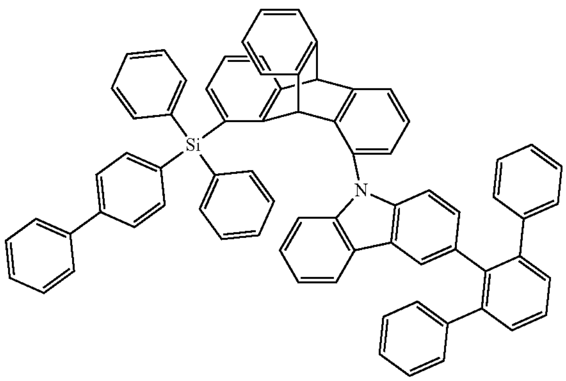
A-51
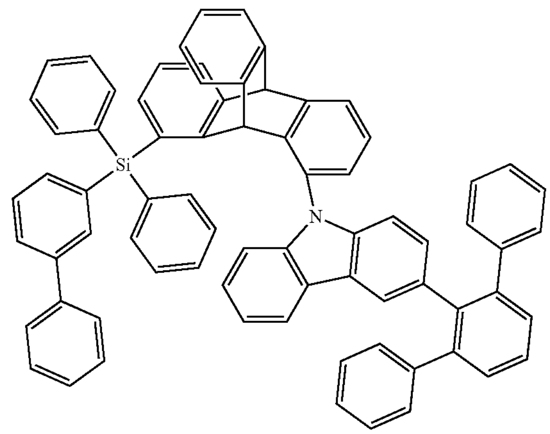
A-52
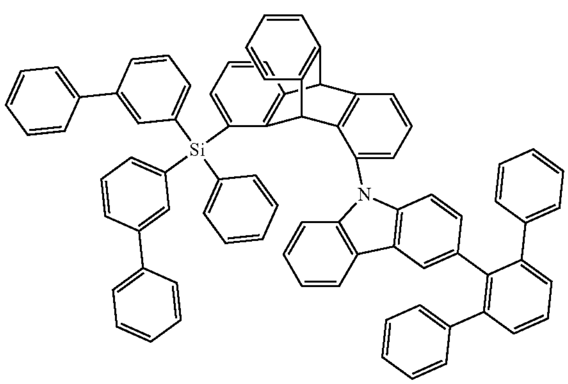
A-53
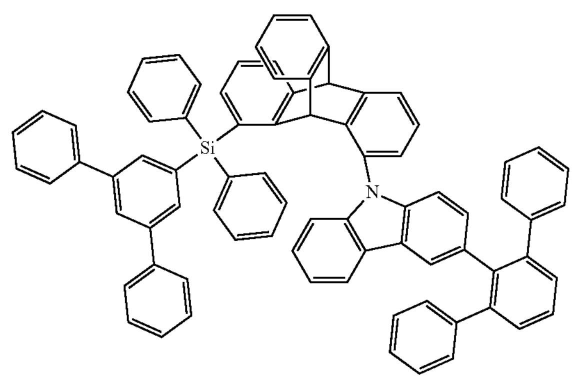
A-54
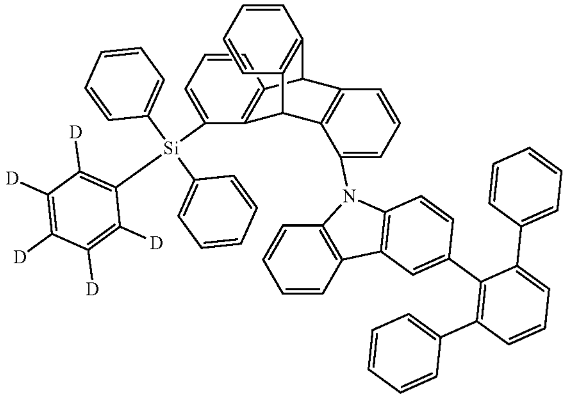
A-55
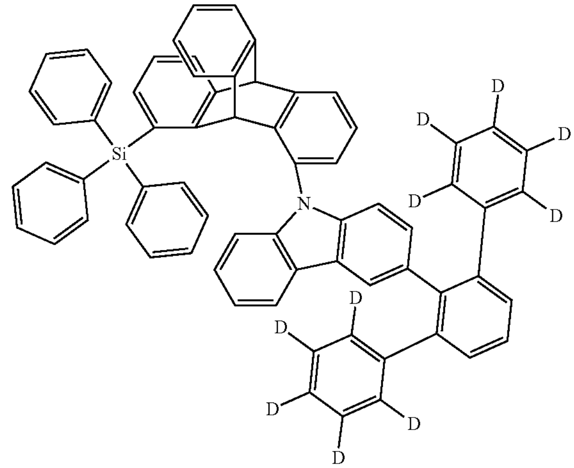

-continued
A-56
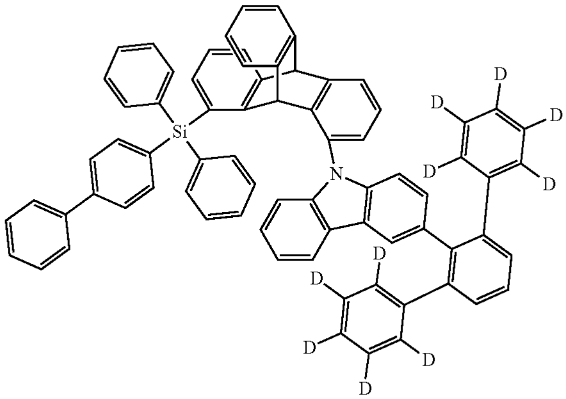
A-57
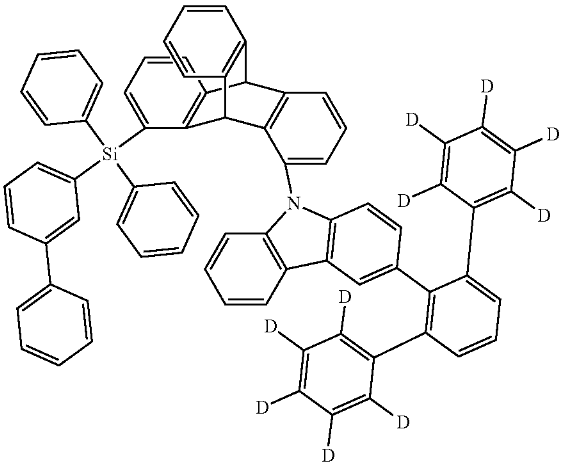
A-58
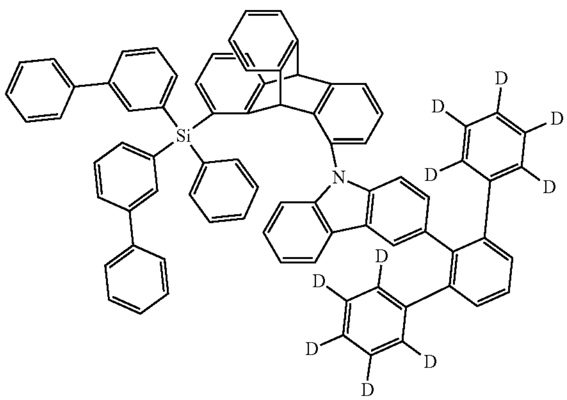
A-59
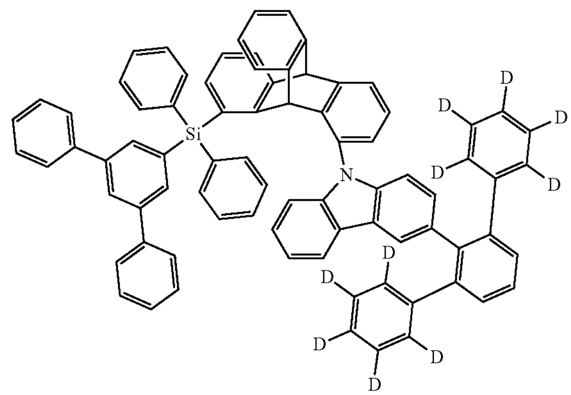
A-60
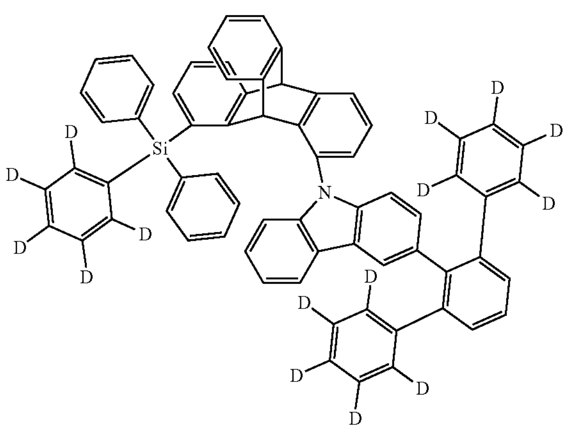
A-61
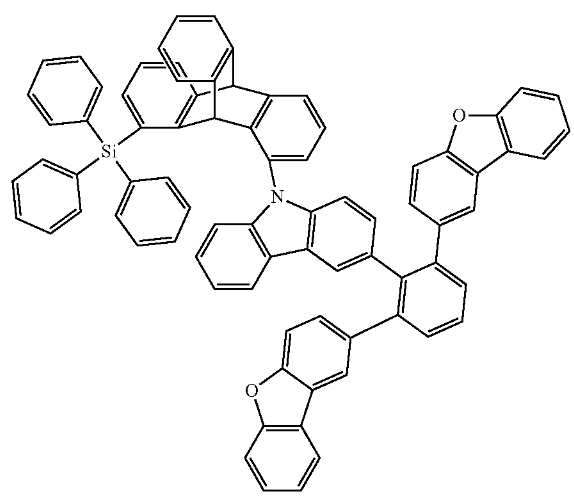

-continued
A-62
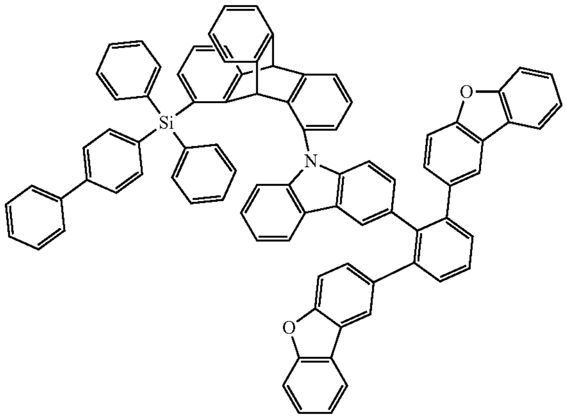
A-63
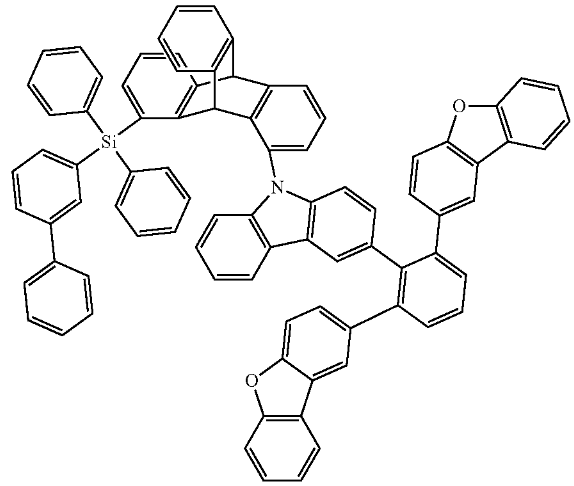
A-64
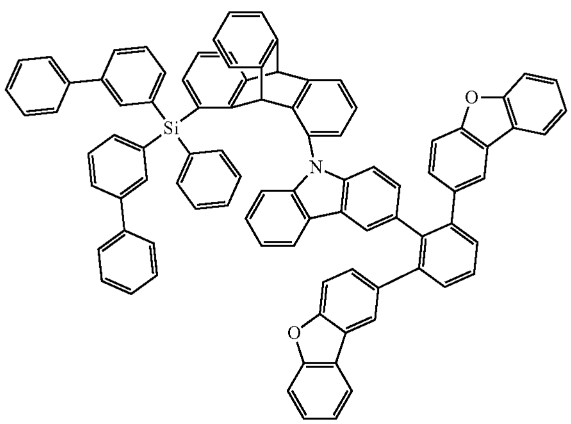
A-65
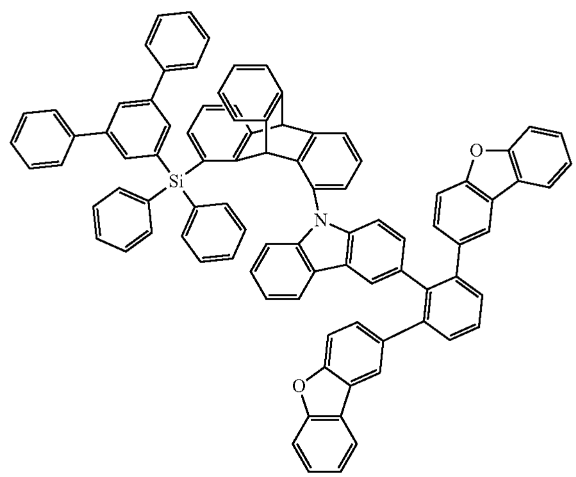
A-66
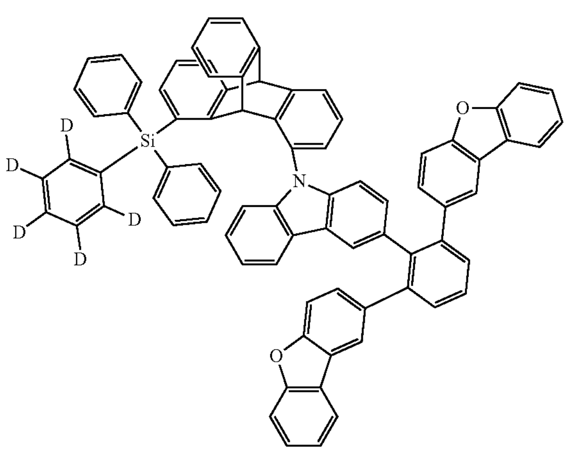
A-67
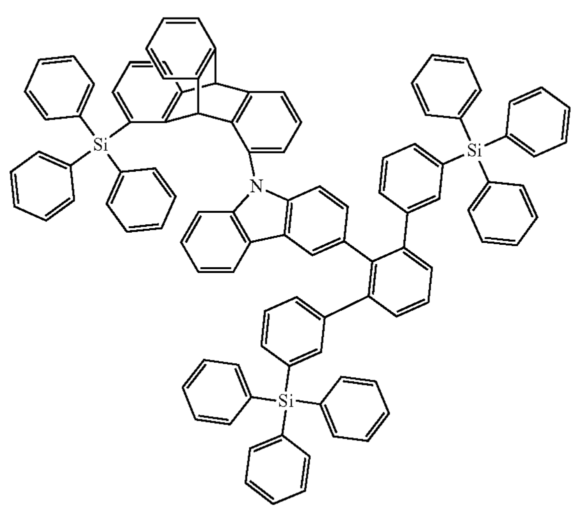

-continued
A-68
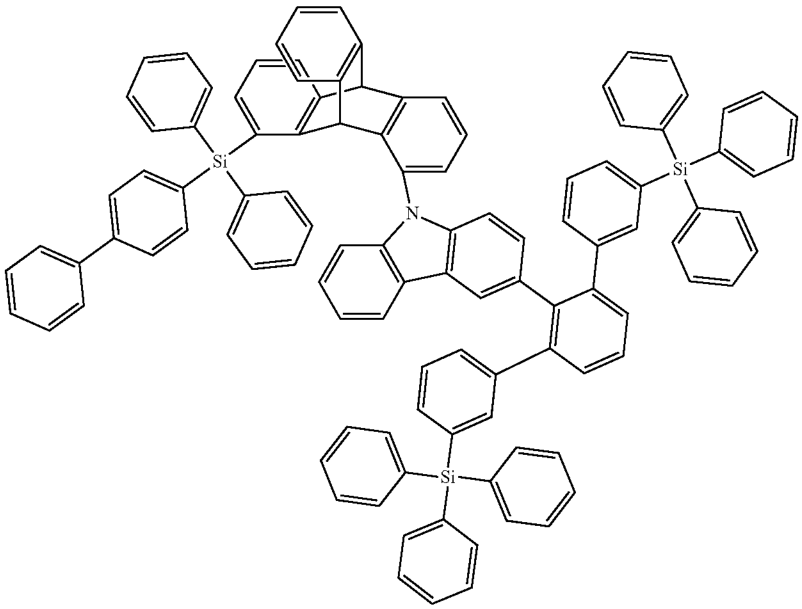
A-69
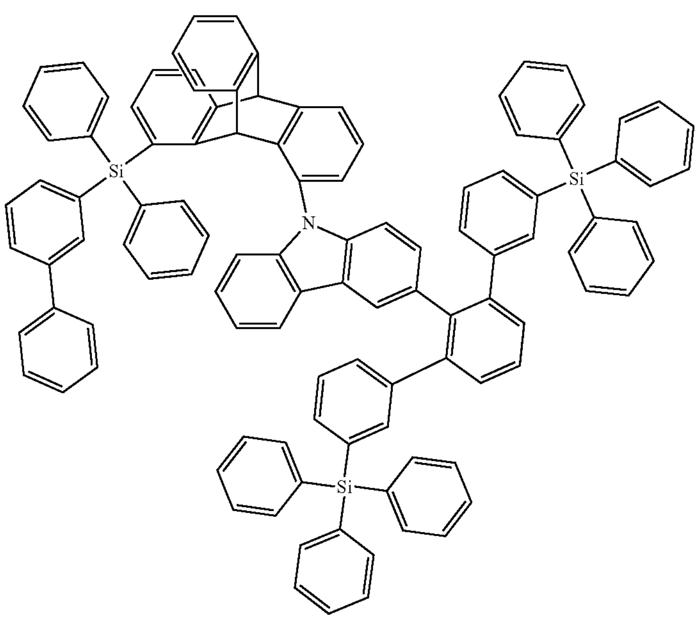

-continued
A-70
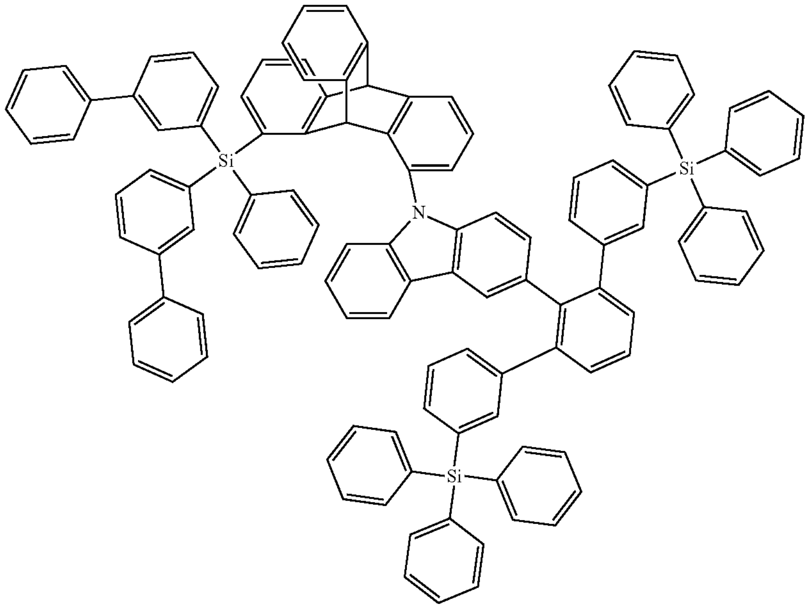
A-71
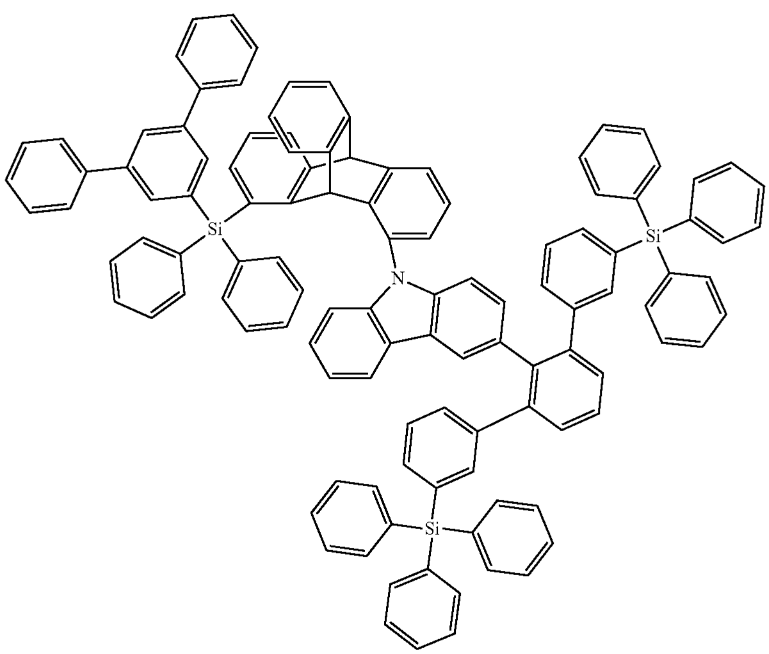

-continued
A-72
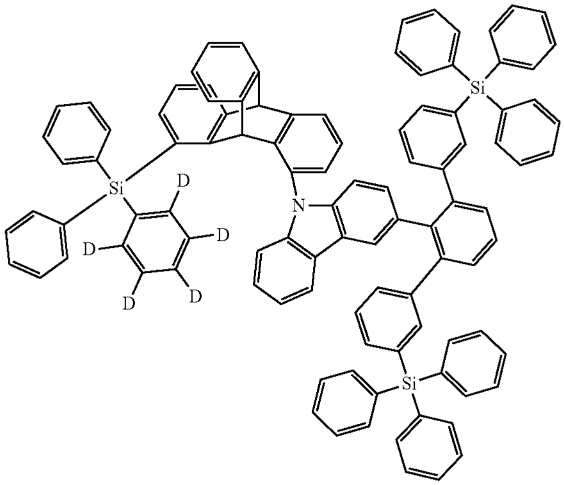
A-73
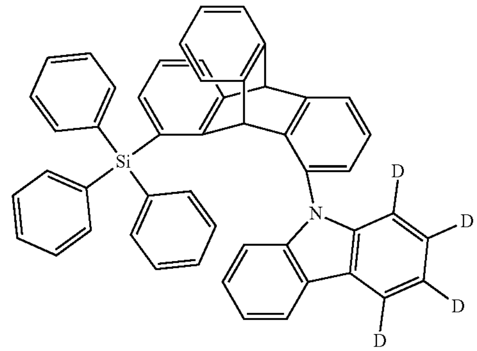
A-74
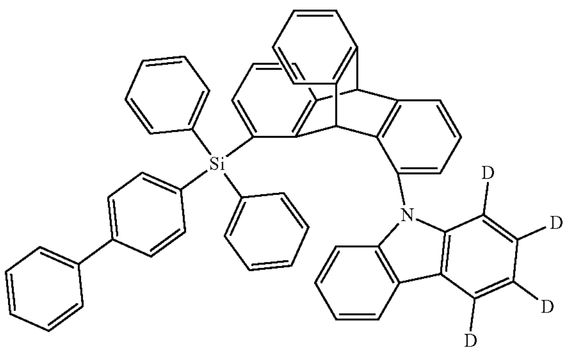
A-75
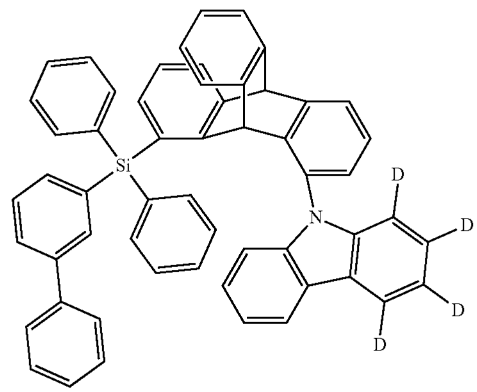
A-76
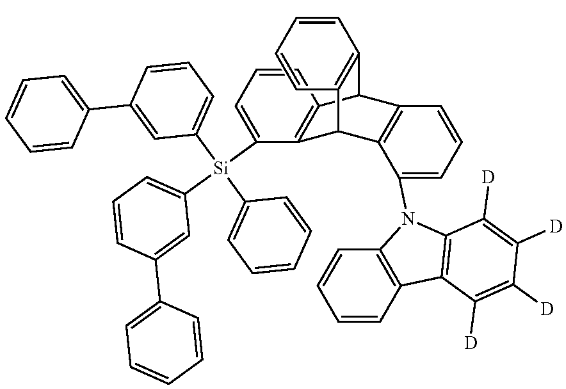
A-77
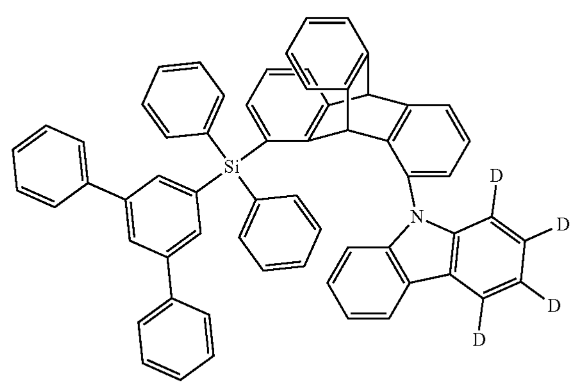

-continued
A-78
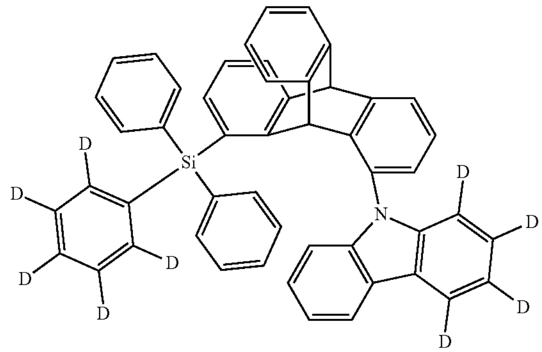
A-79
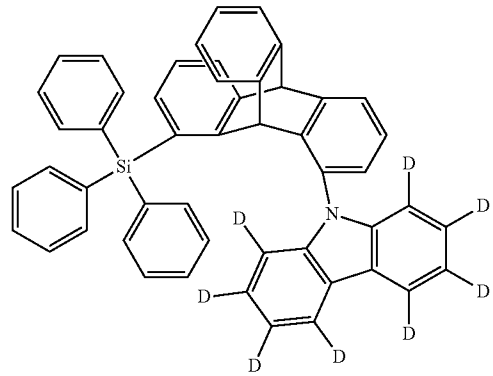
A-80
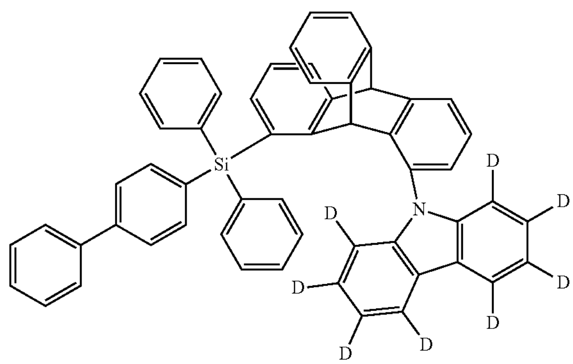
A-81
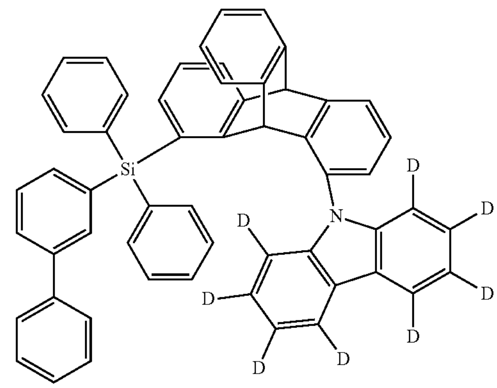
A-82
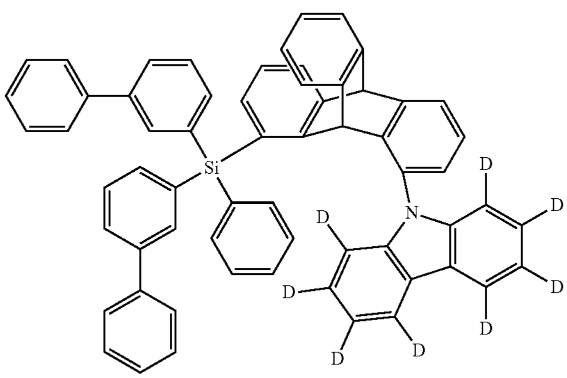
A-83
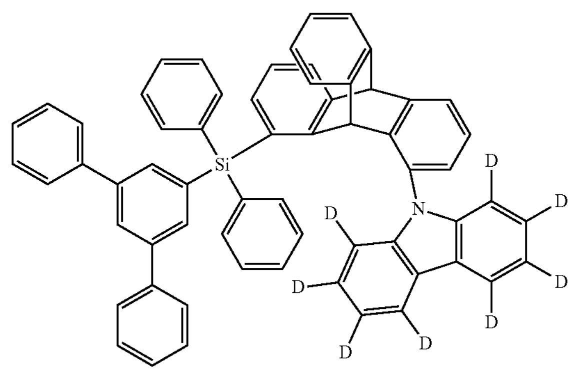
A-84
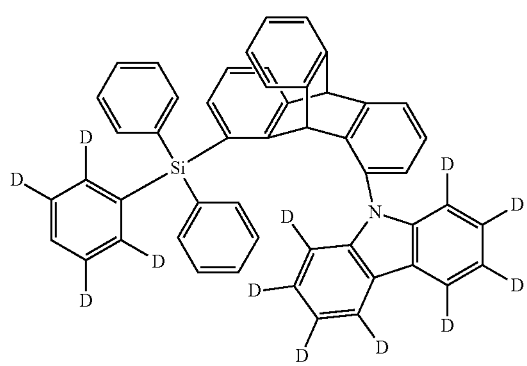
A-85
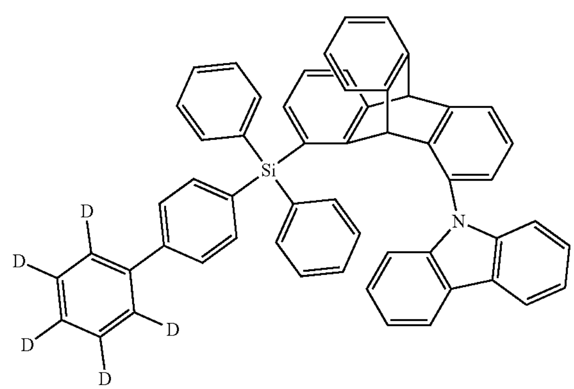

-continued
A-86
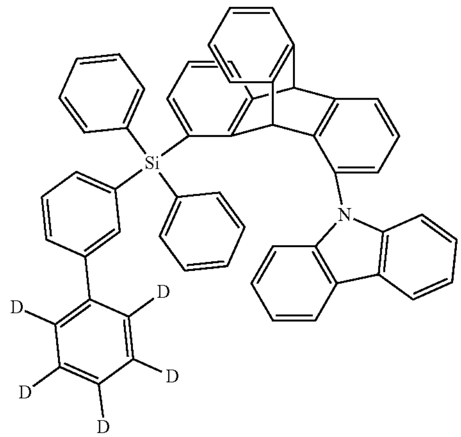
A-87
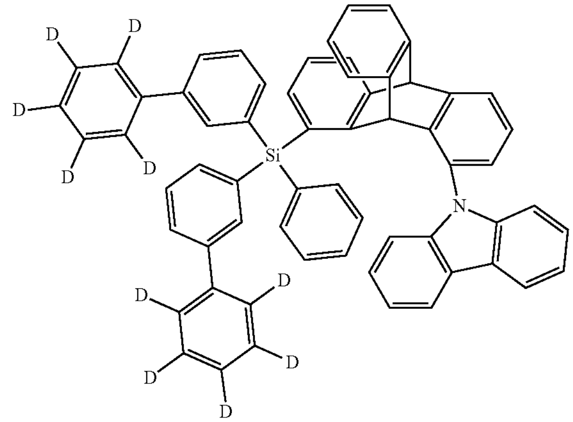
A-88
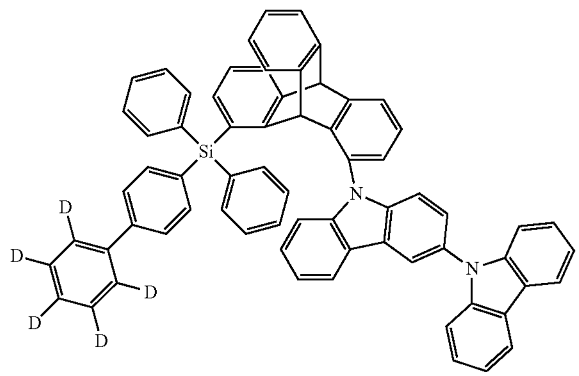
A-89
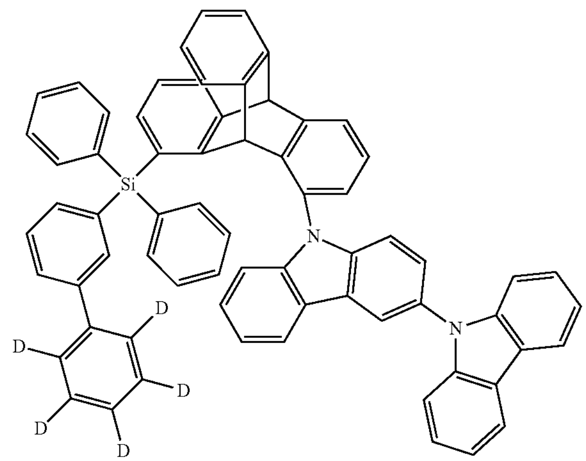
A-90
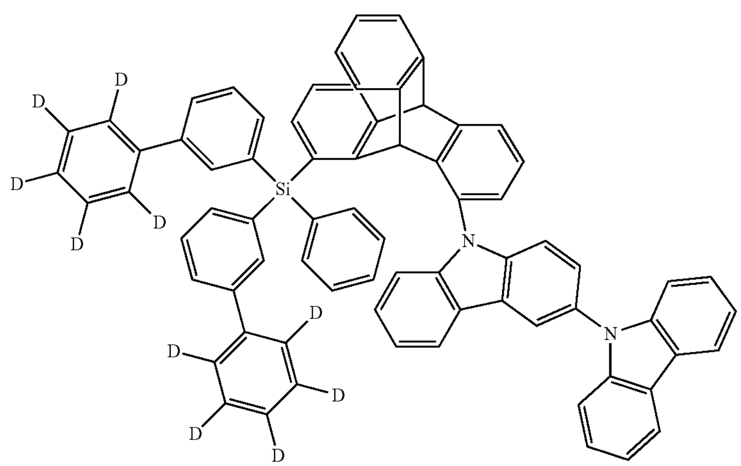

-continued
A-91
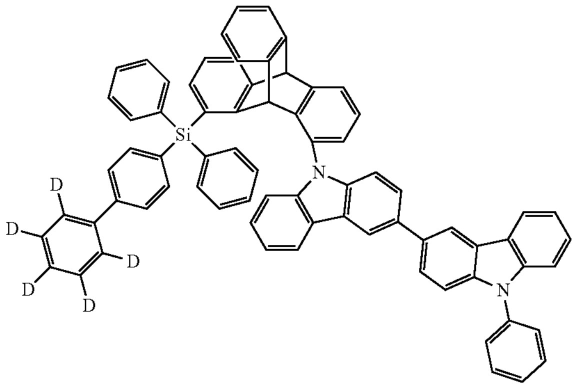
A-92
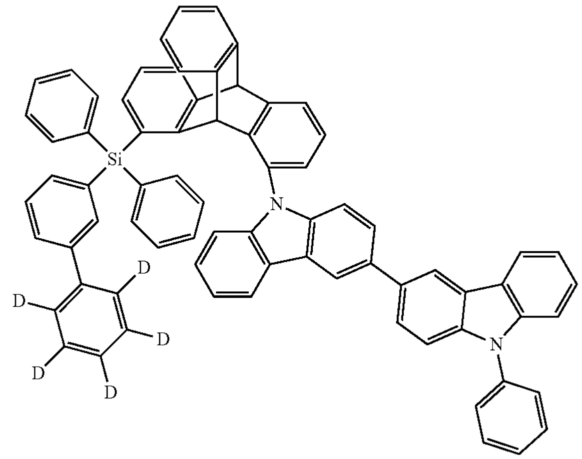
A-93
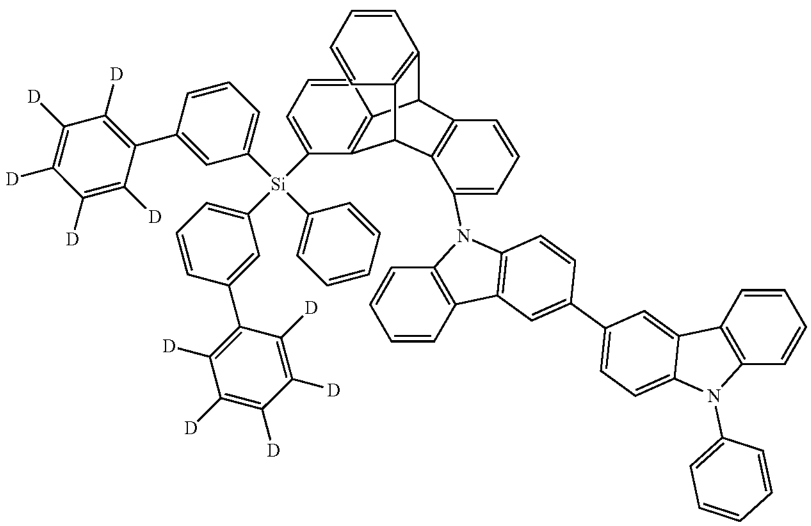
A-94
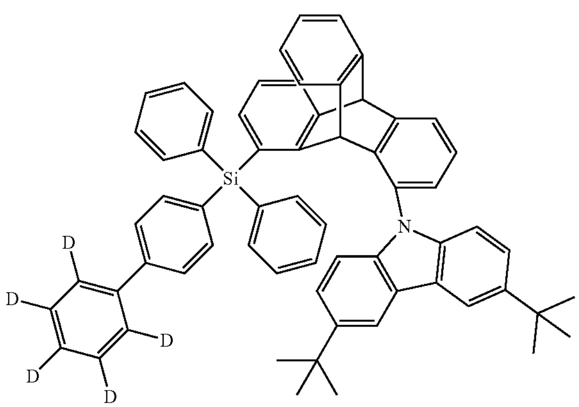
A-95
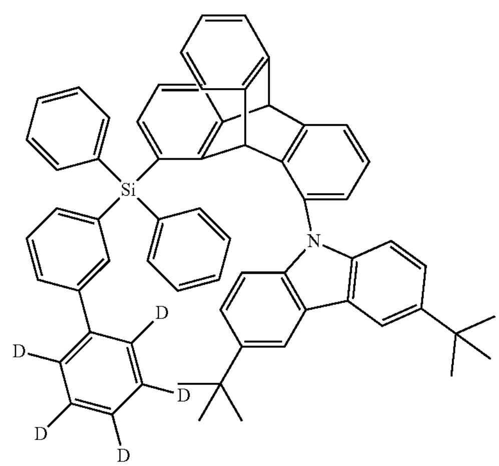

-continued
A-96
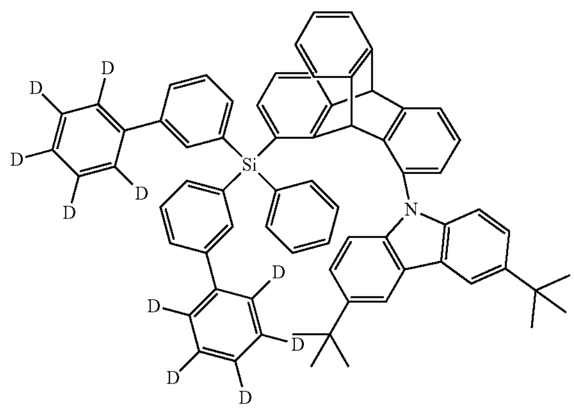
A-97
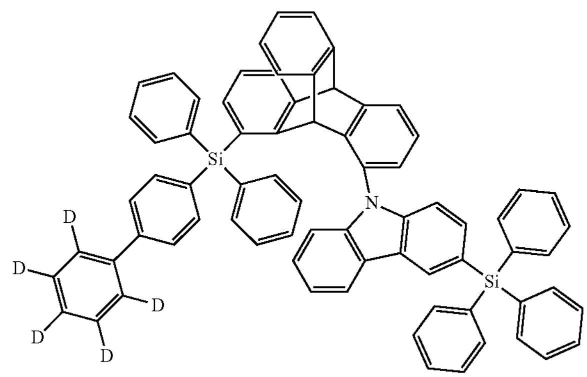
A-98
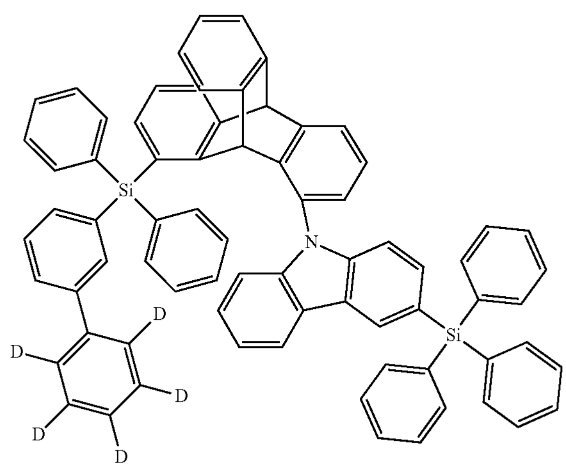
A-99
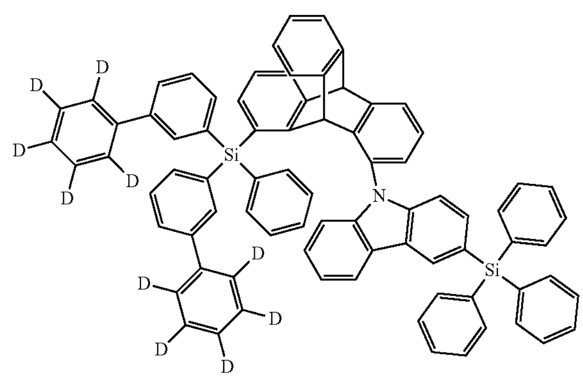
A-101
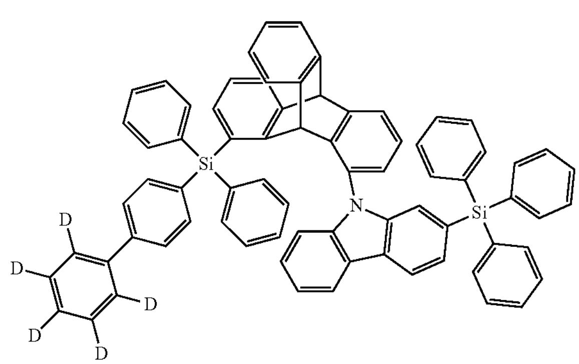
A-101
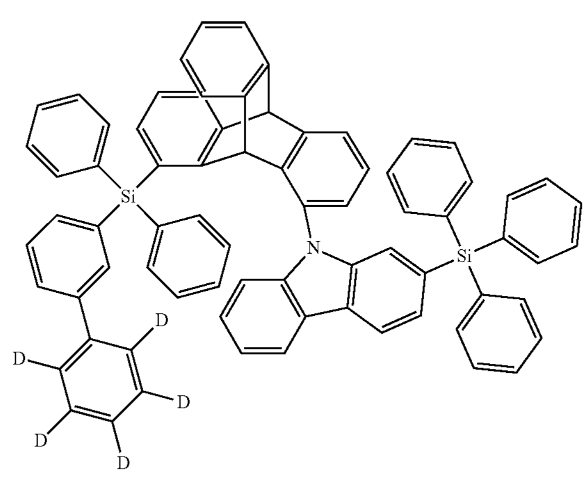

-continued
A-102
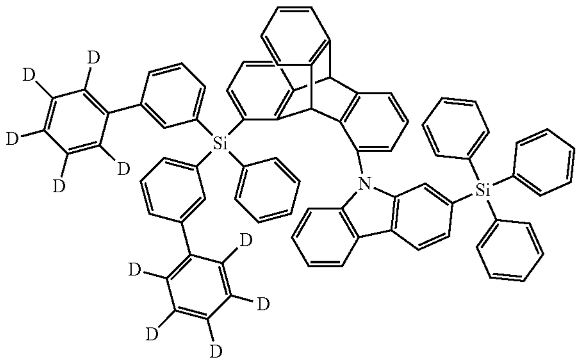
A-103
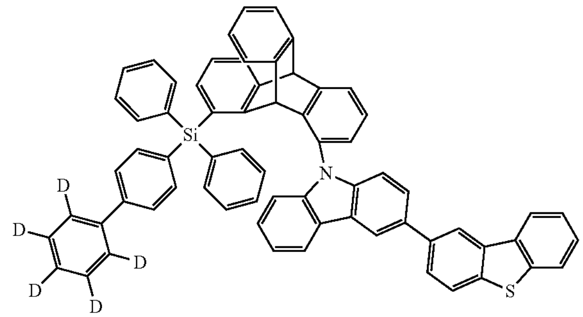
A-104
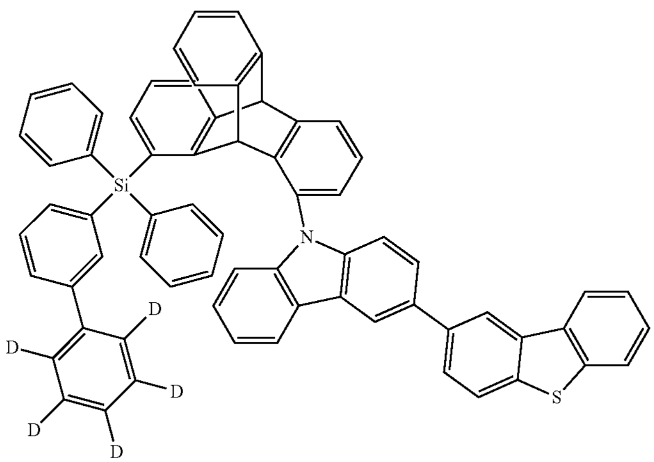
A-105
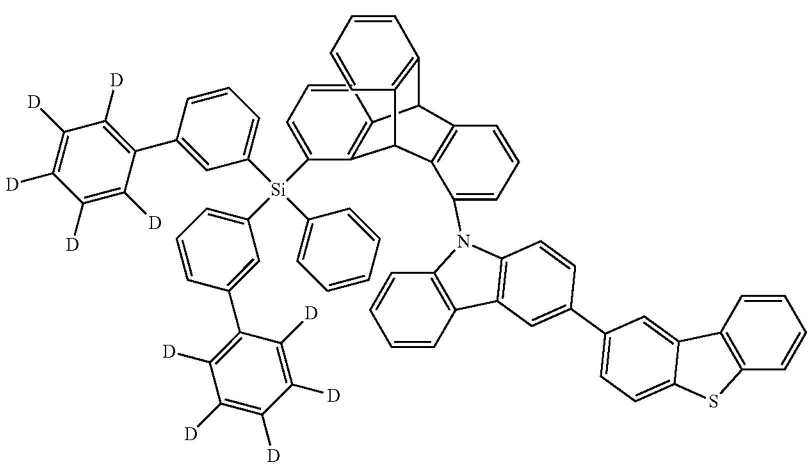

-continued
A-106
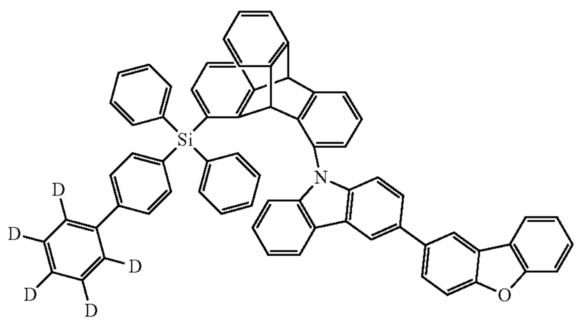
A-107
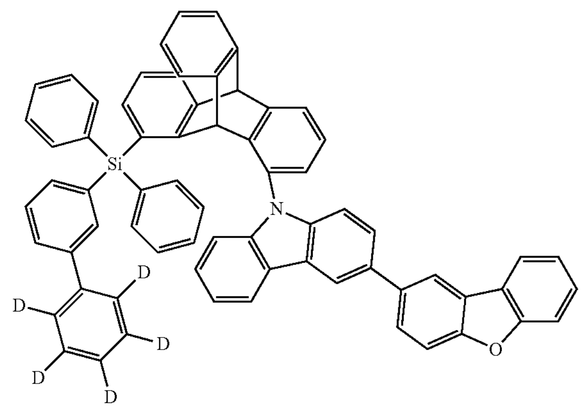
A-108
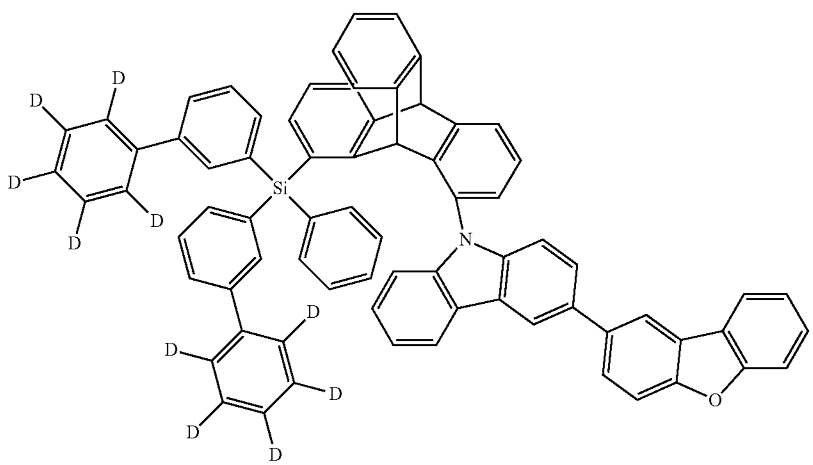
A-109
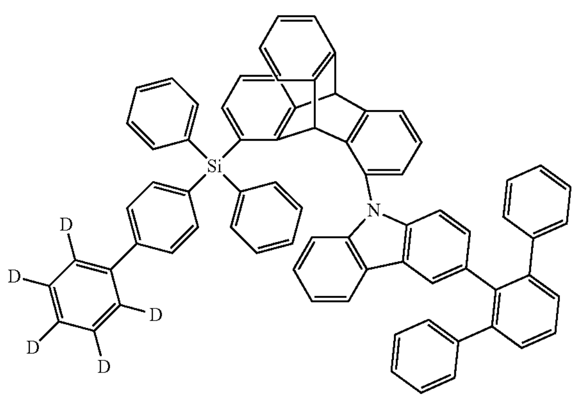
A-110
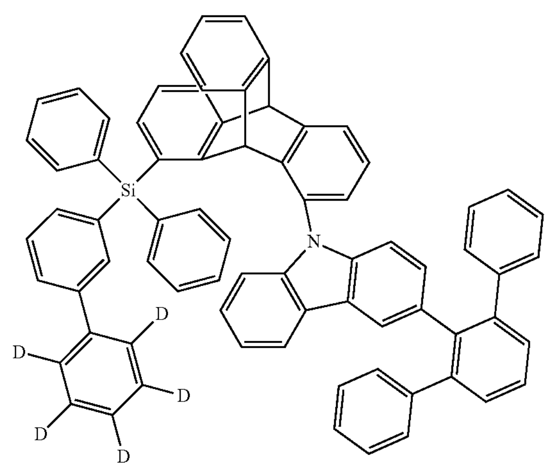

-continued
A-111
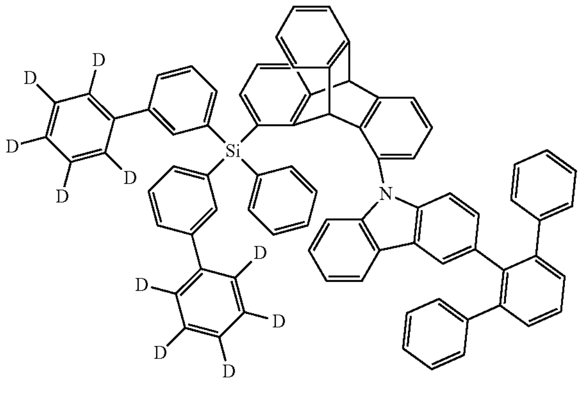
A-112
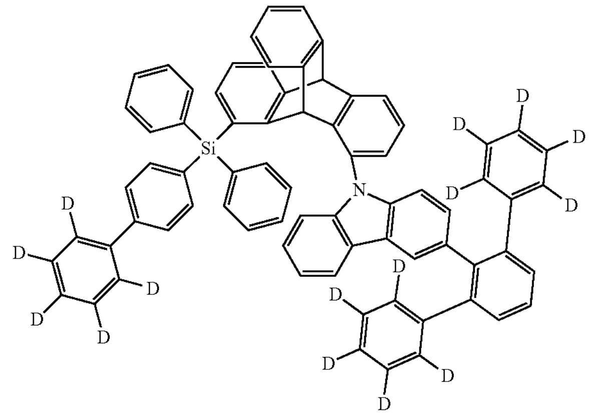
A-113
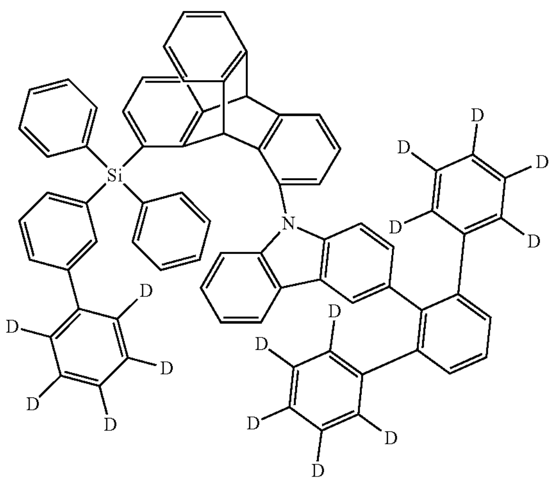
A-114
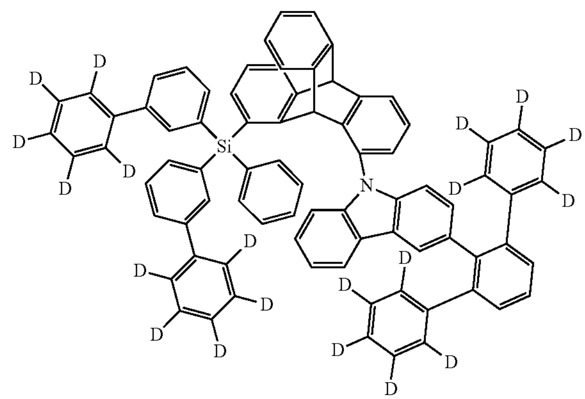
A-115
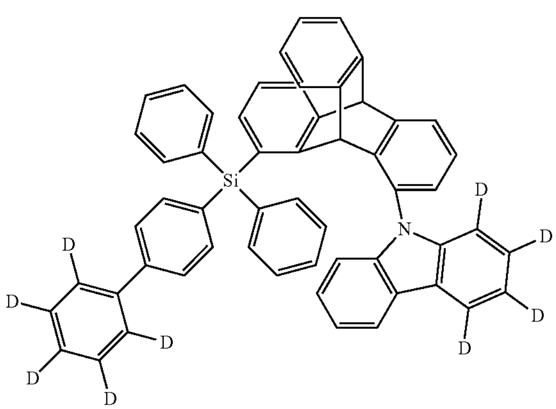
A-116
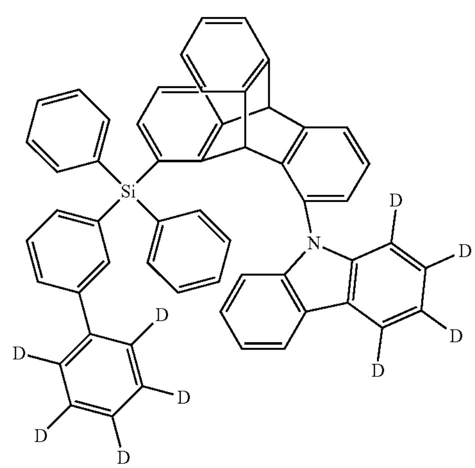

-continued
A-117
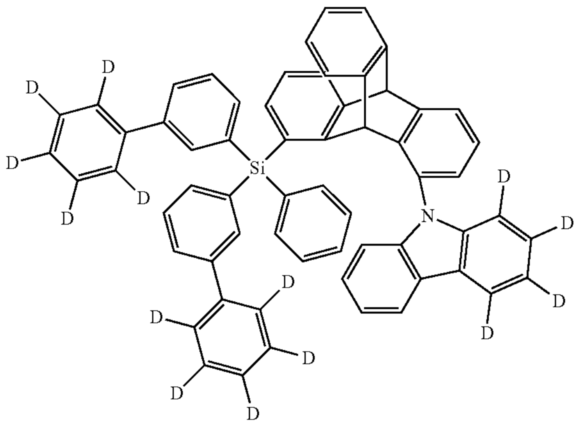
A-118
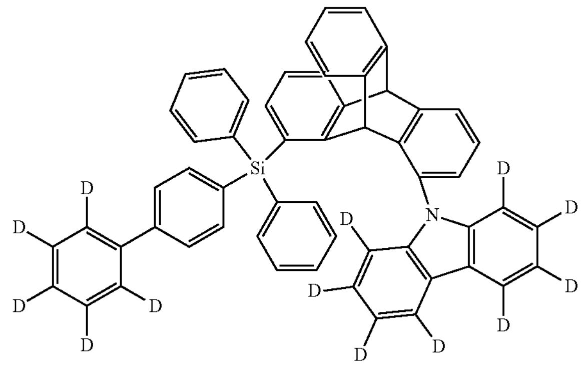
A-119
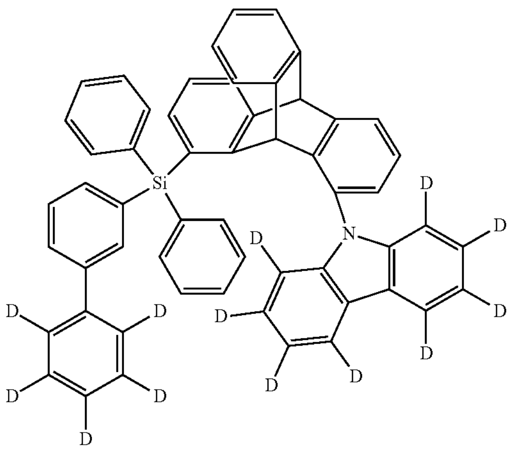
A-120
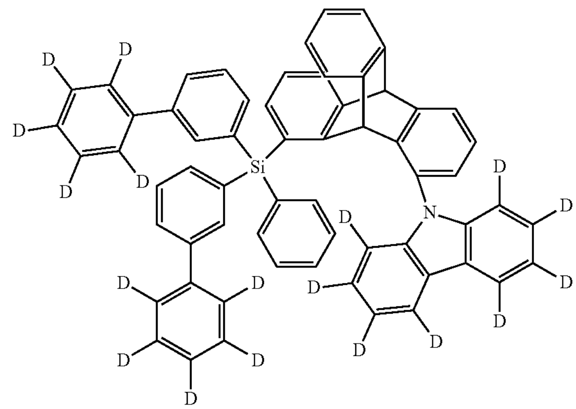
A-121
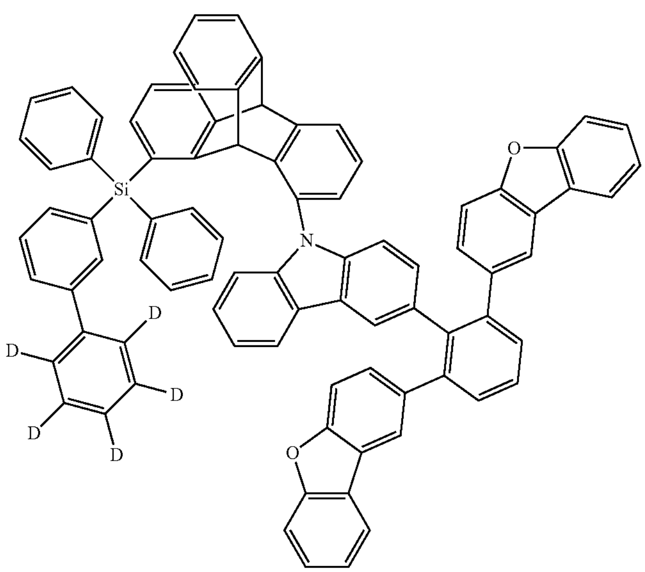

-continued
A-122
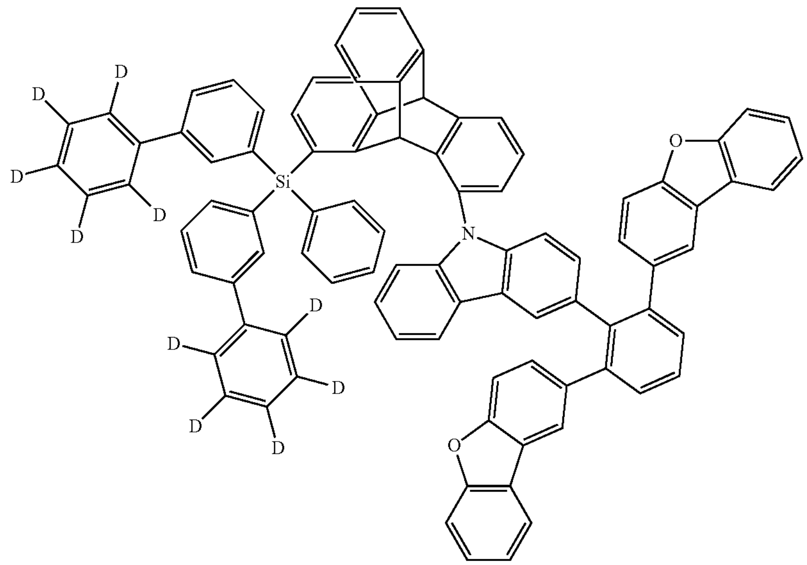
A-123
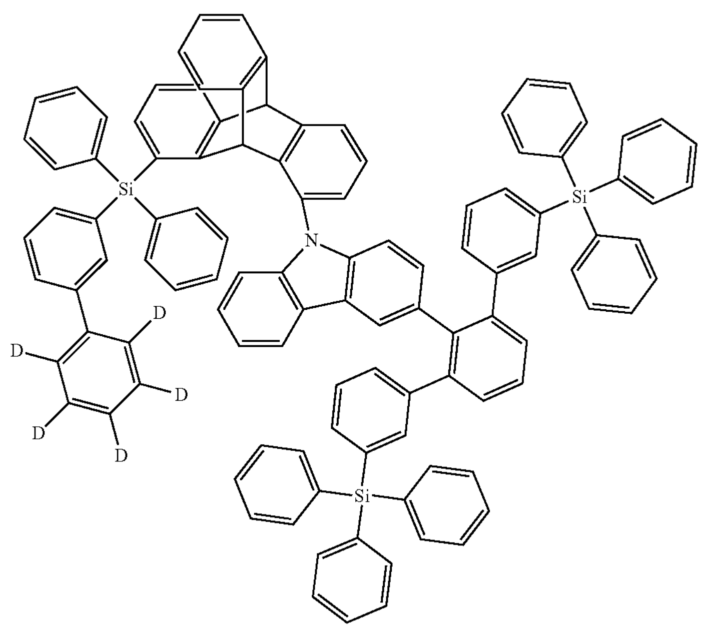

-continued
A-124
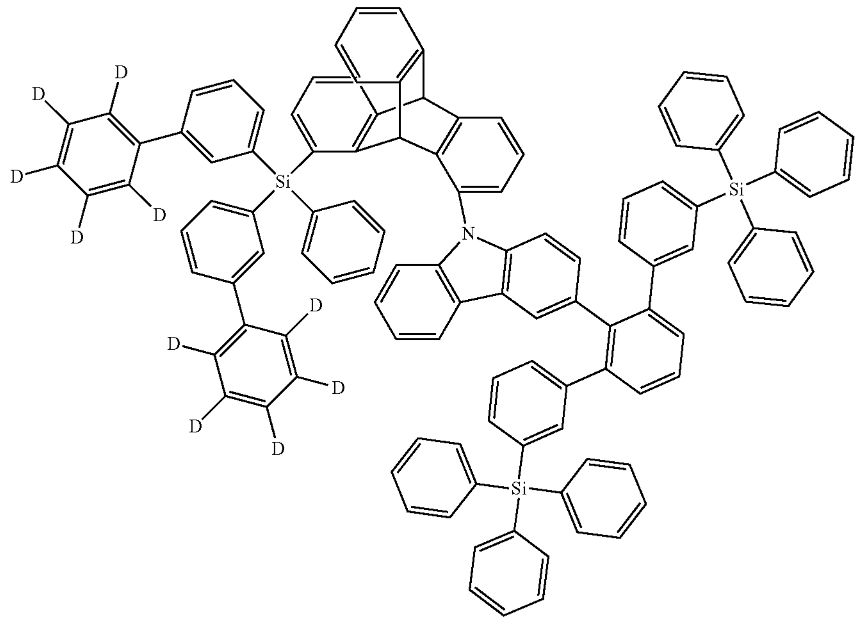
A-125
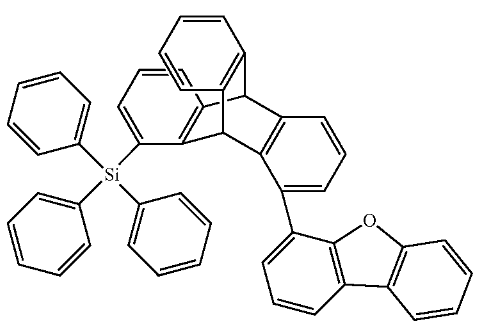
A-126
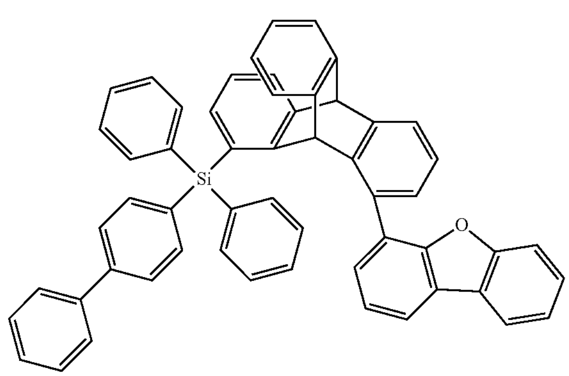
-continued
A-127
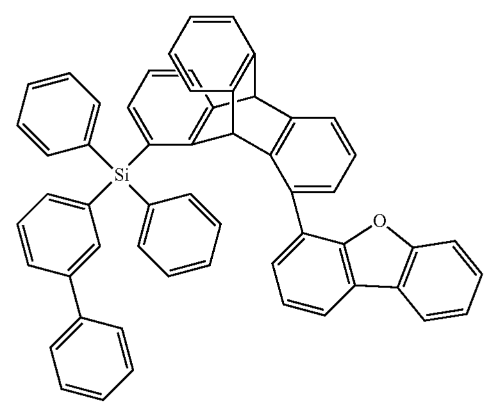
A-128
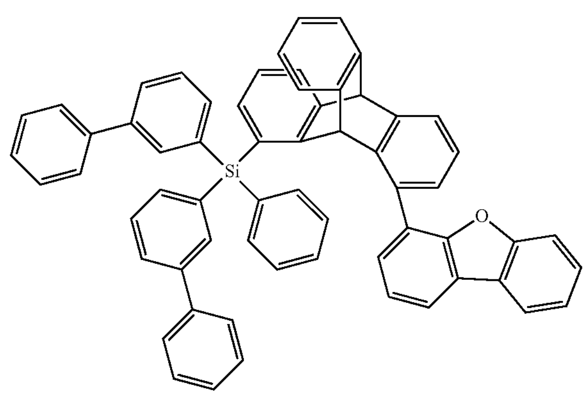

A-129
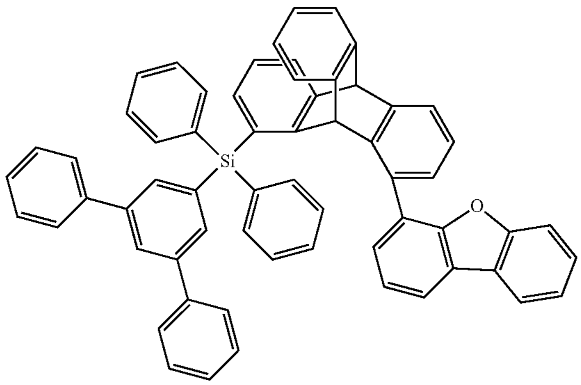
A-130
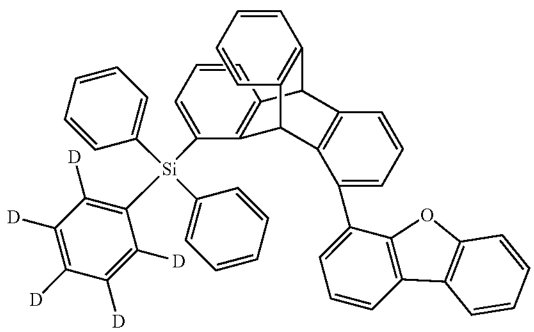
A-131
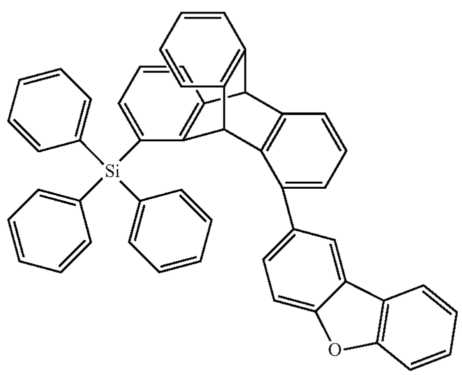
A-132
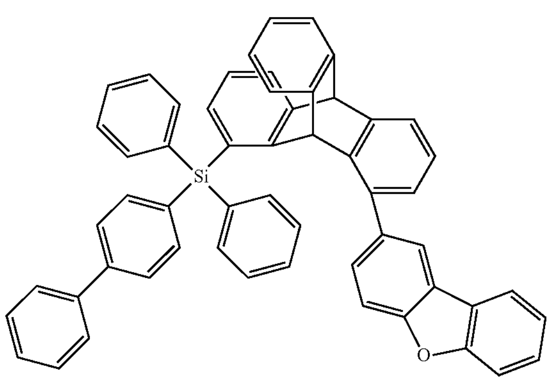
A-133
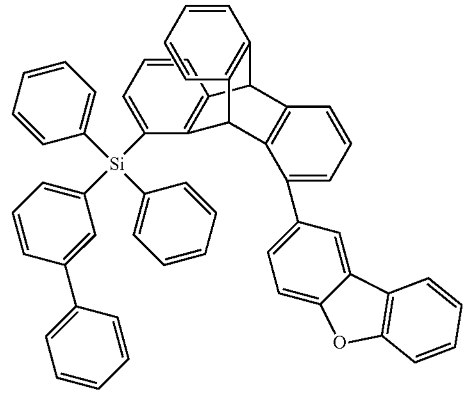
A-134
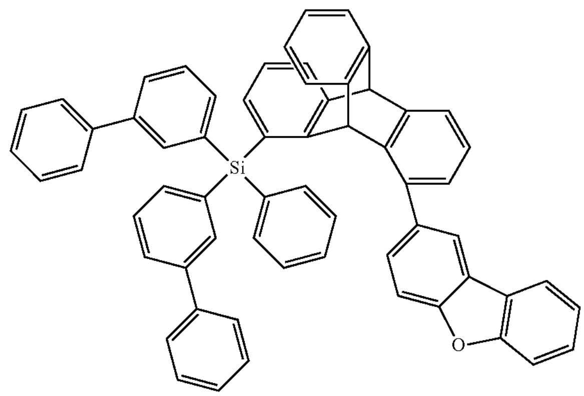
A-135
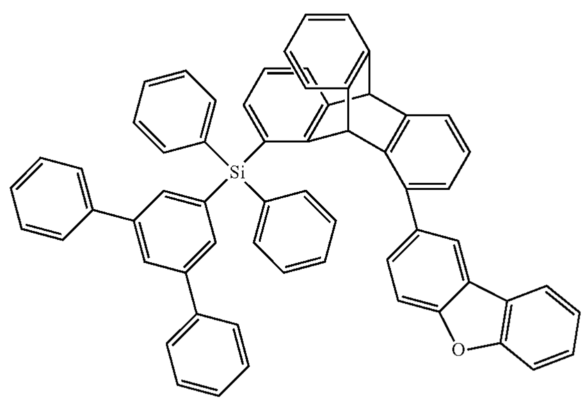
A-136
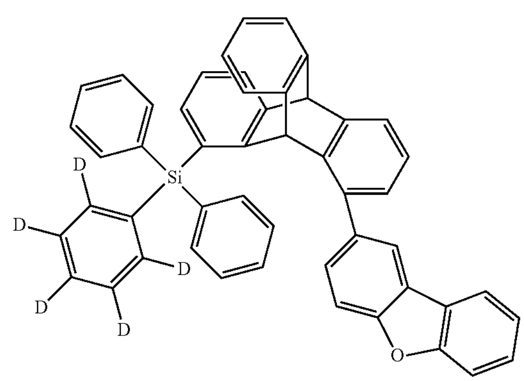

-continued
A-137
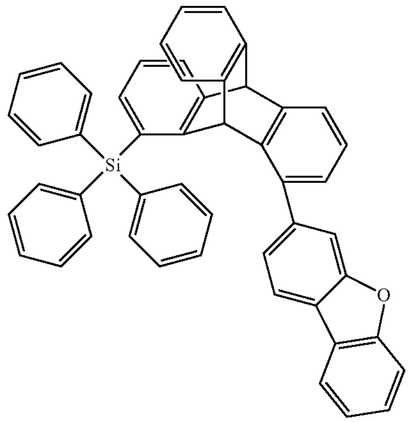
A-138
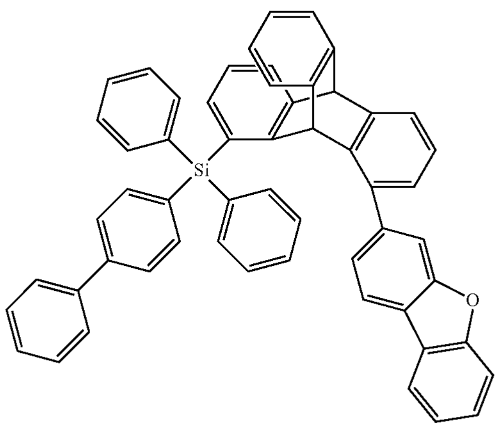
A-139
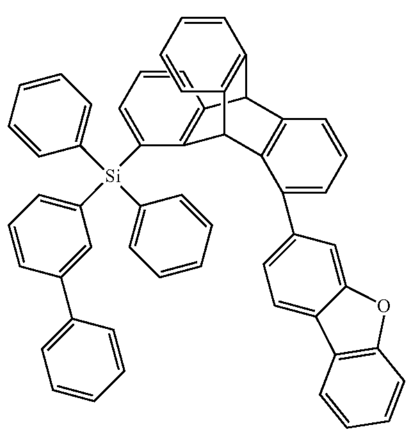
-continued
A-140
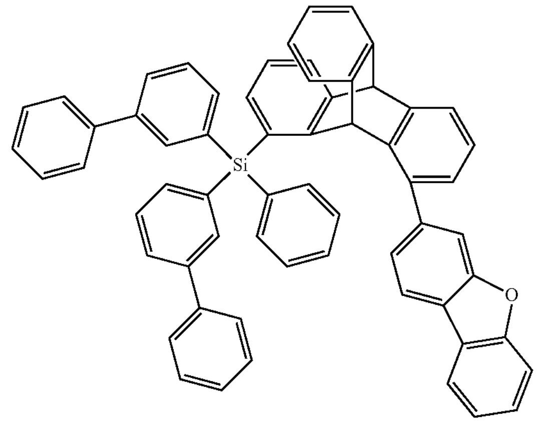
A-141
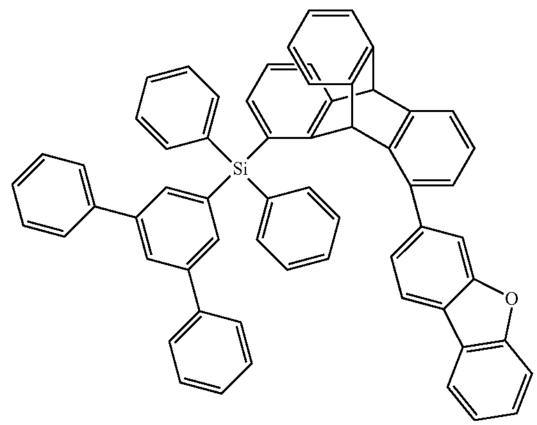
A-142
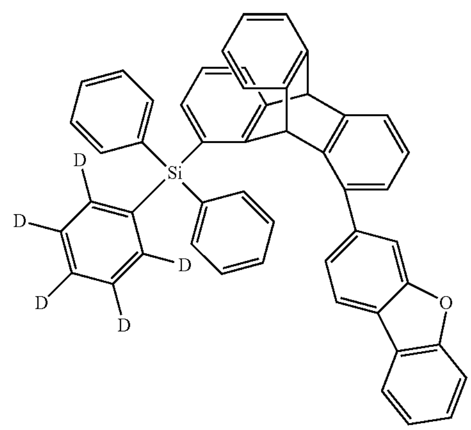
A143
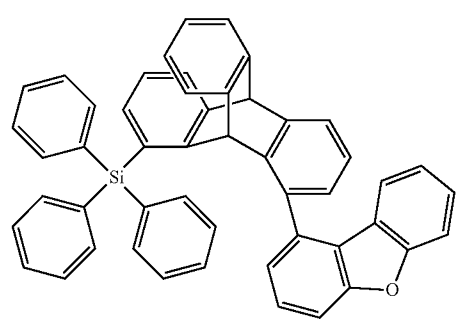

-continued
A-144
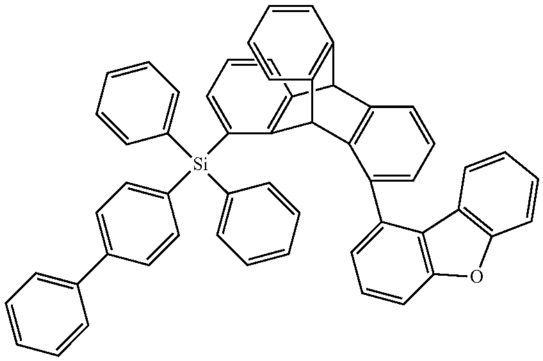
A-145
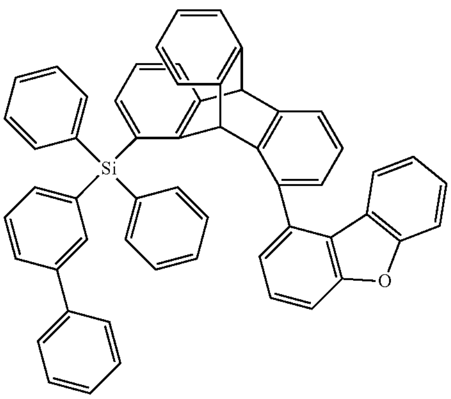
A-146
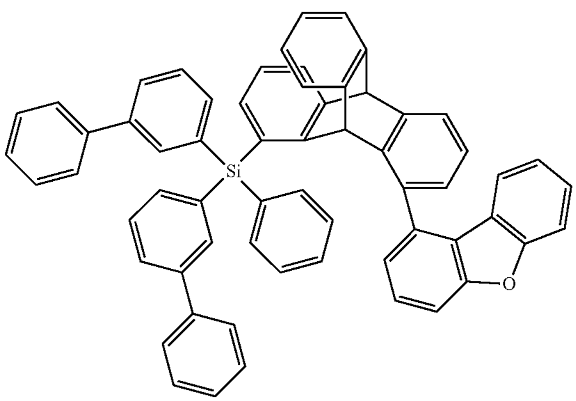
A-147
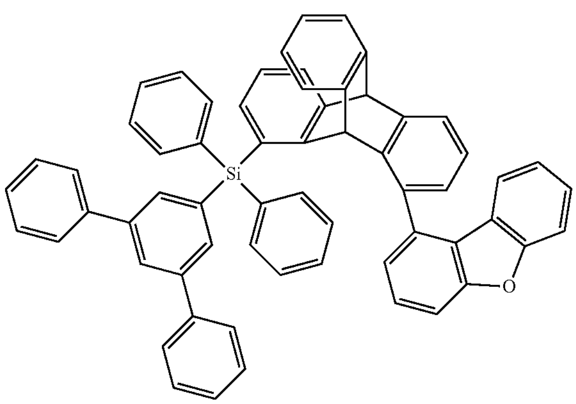
-continued
A-148
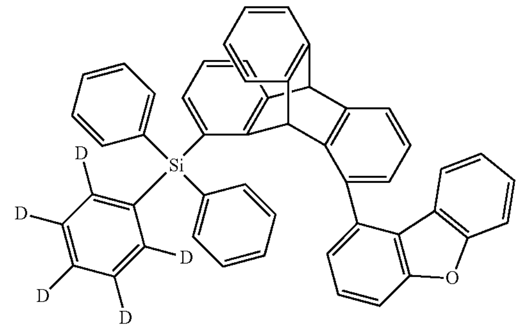
A-149
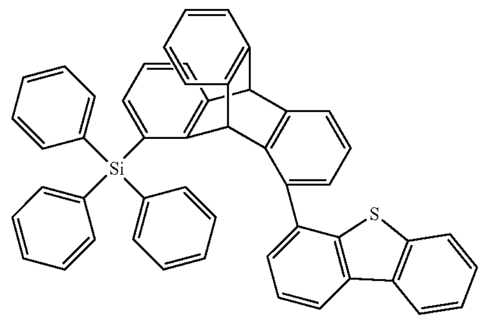
A-150
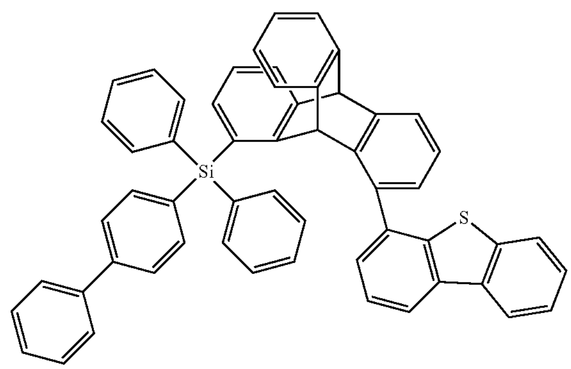
A-151
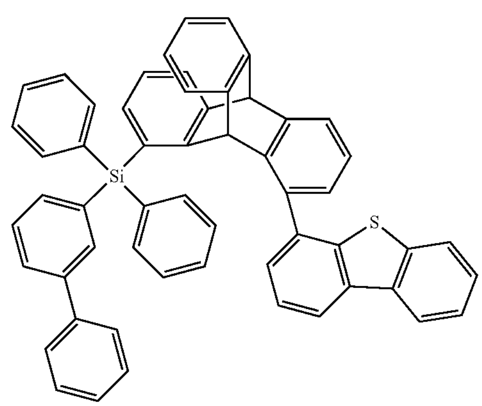

-continued
A-152
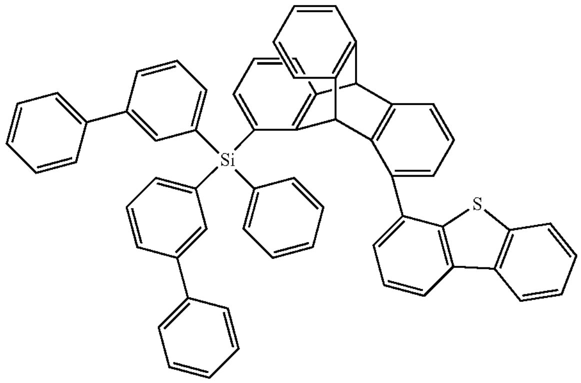
A-153
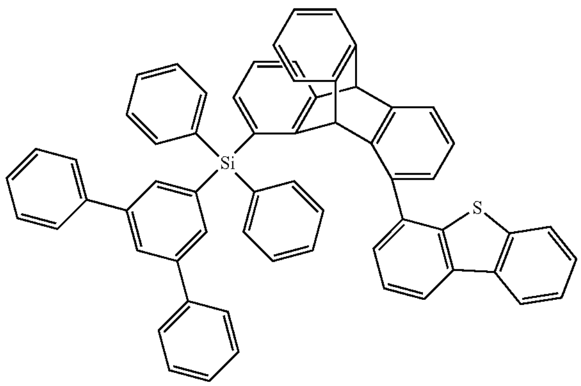
A-154
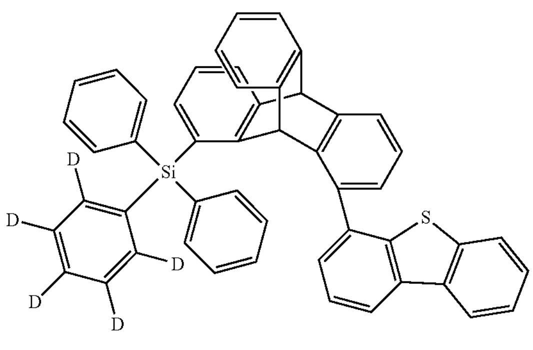
A-155
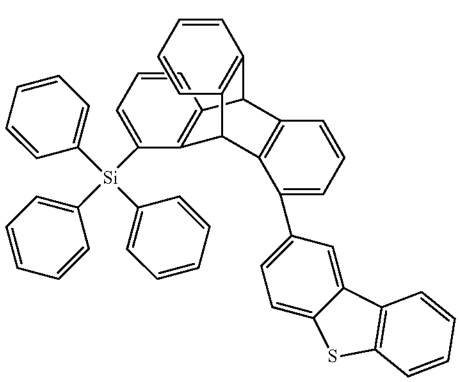
-continued
A-156
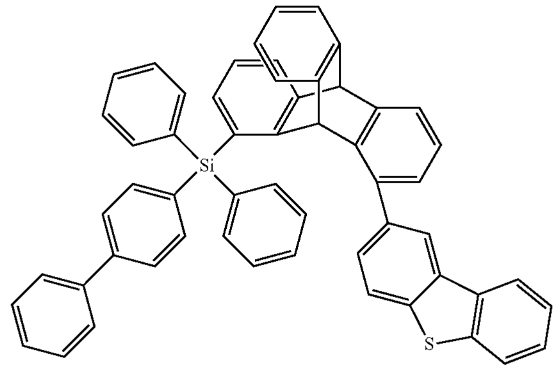
A-157
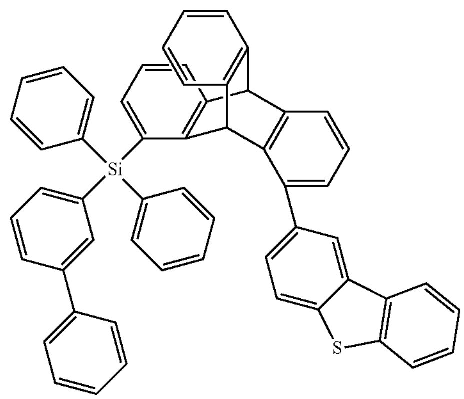
A-158
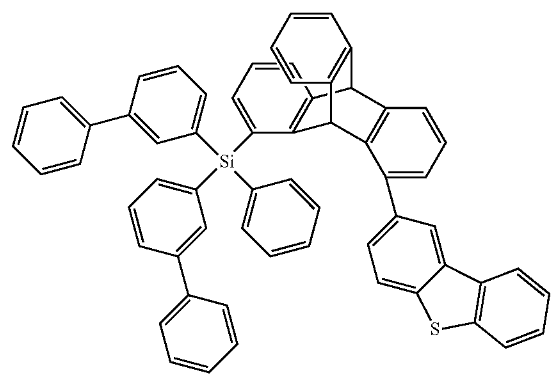
A-159
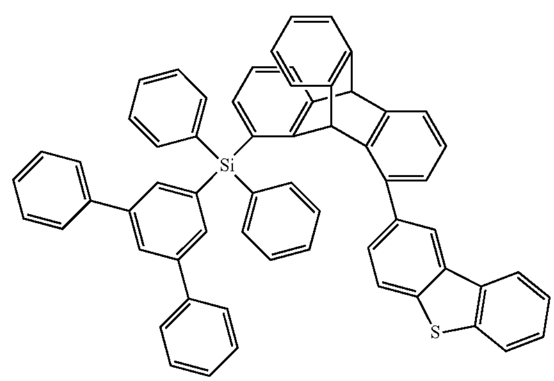

-continued
A-160
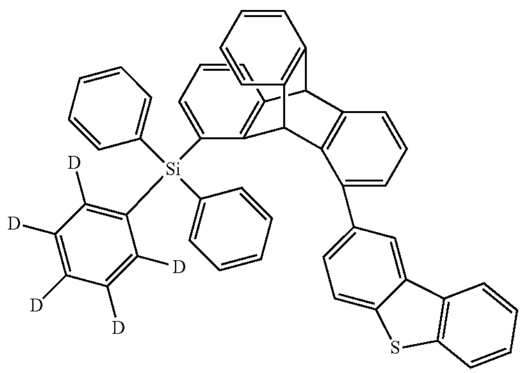
A-161
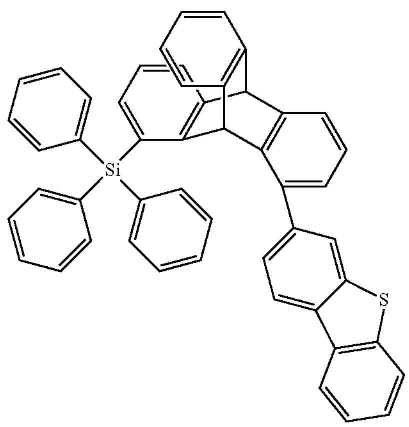
A-162
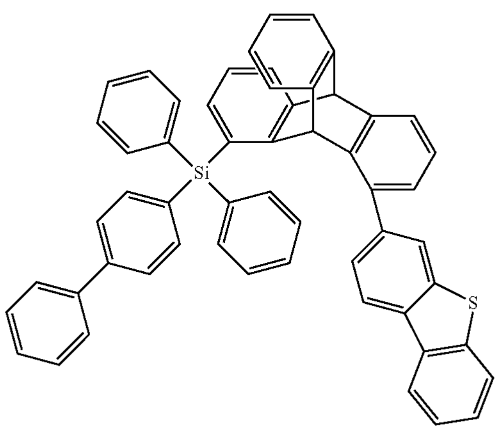
A-163
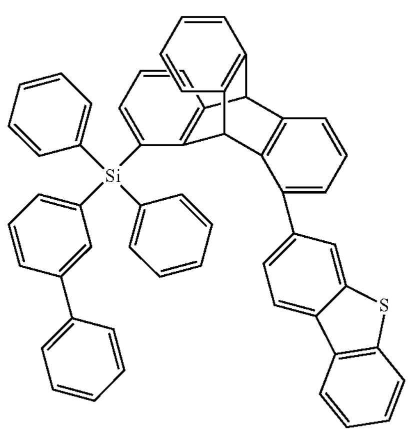
-continued
A-164
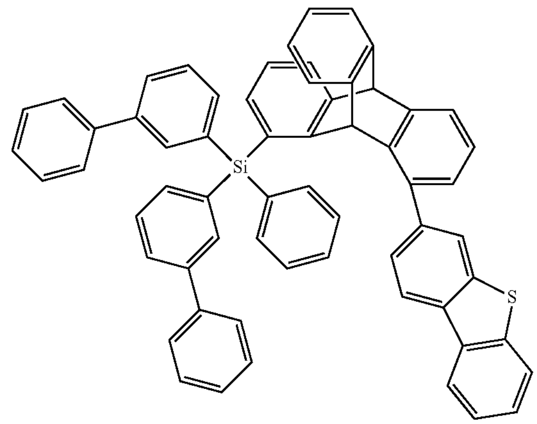
A-165
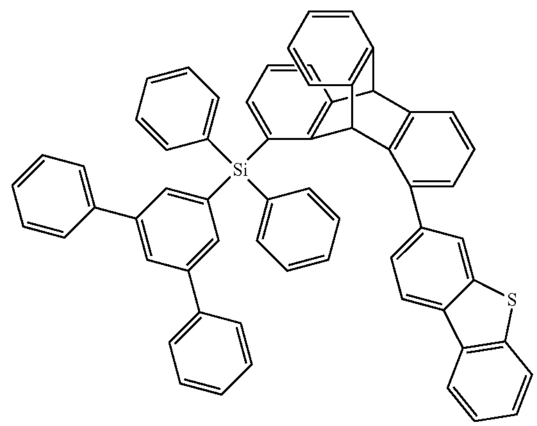
A-166
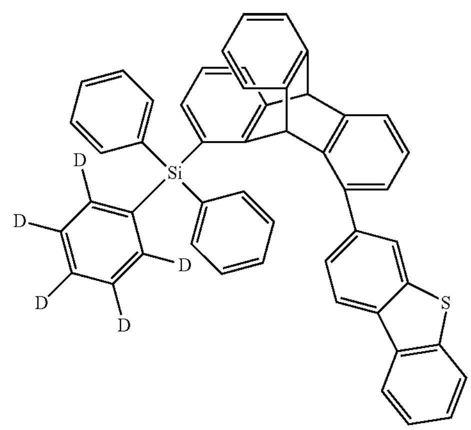
A167
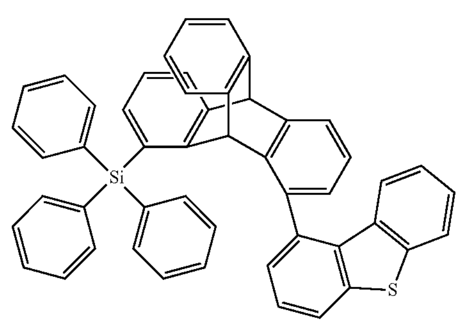

-continued
A-168
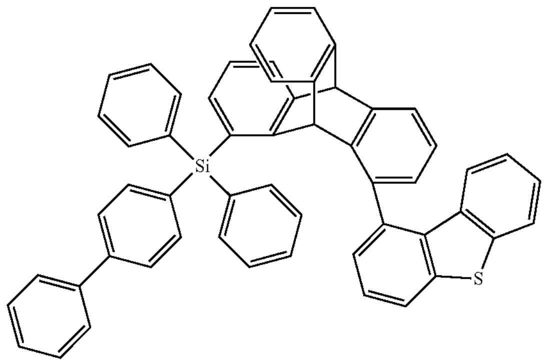
A-169
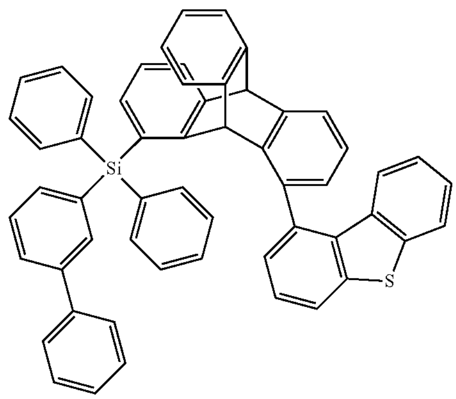
A-170
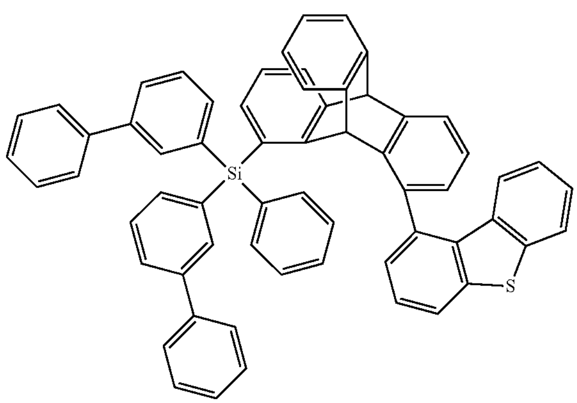
A-171
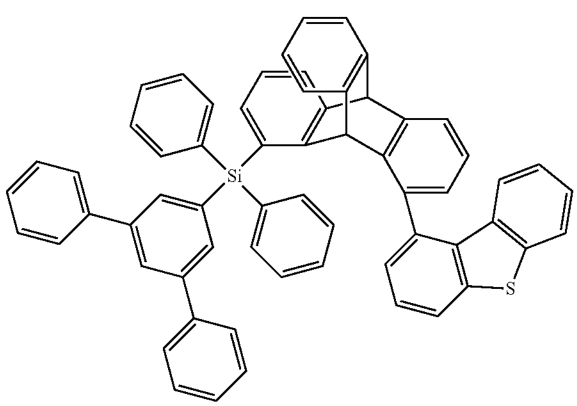
-continued
A-172
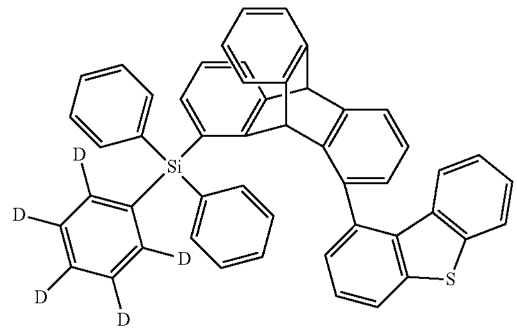
A-173
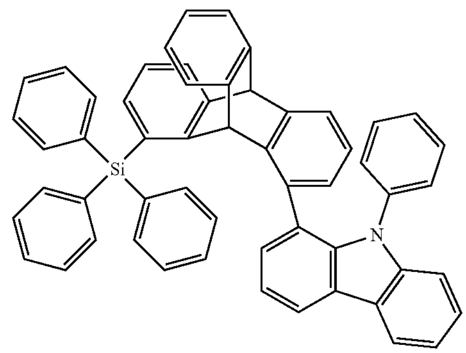
A-174
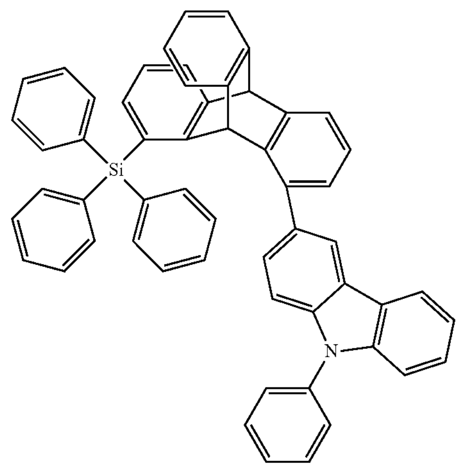
A-175
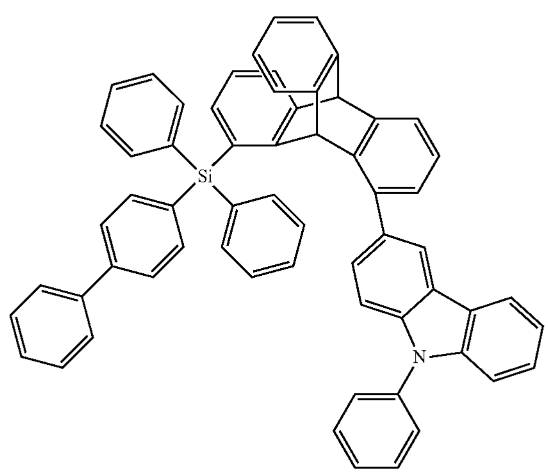

-continued
A-176
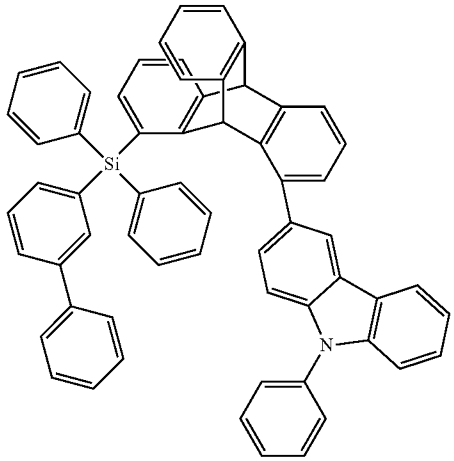
A-177
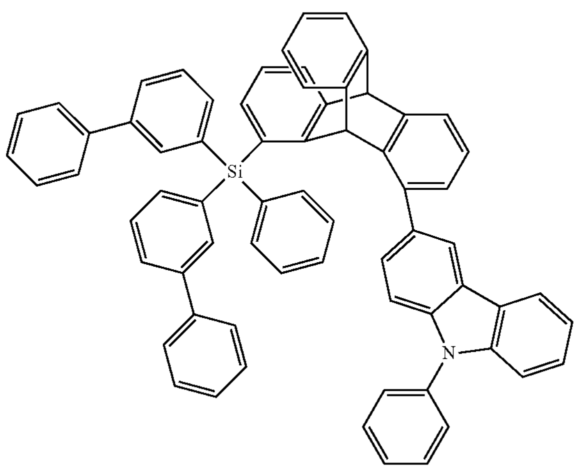
A-178
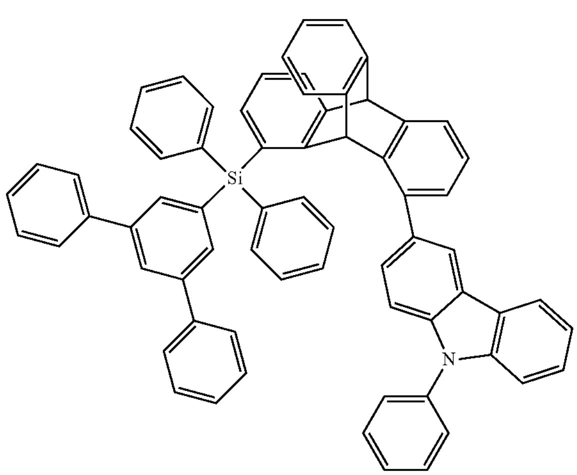
-continued
A-179
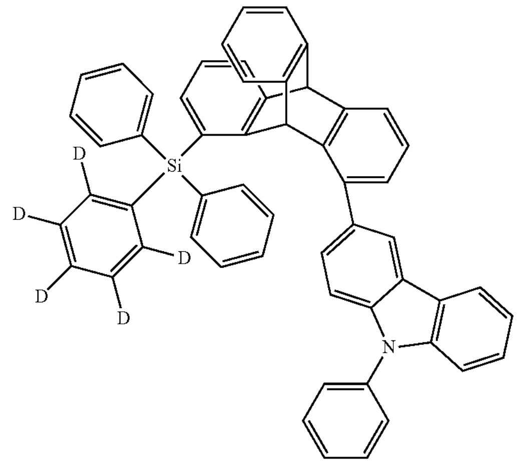
A-180
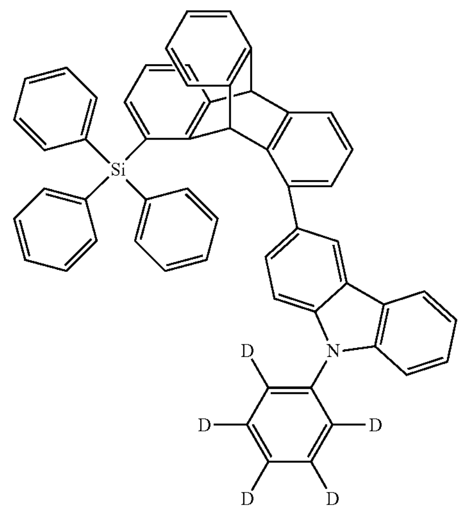
A-181
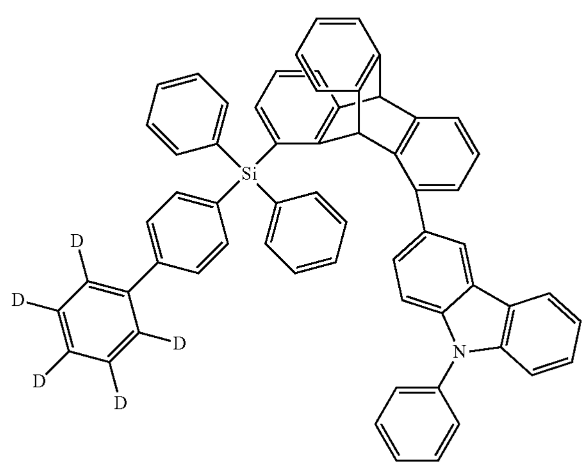

-continued
A-182
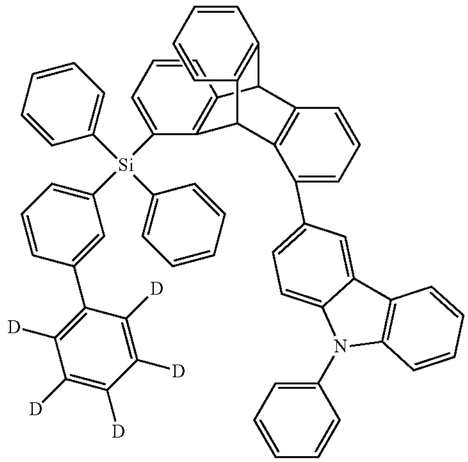
A-183
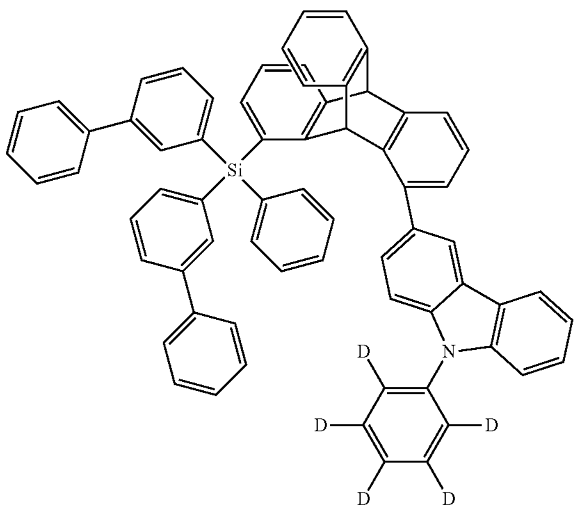
A-184
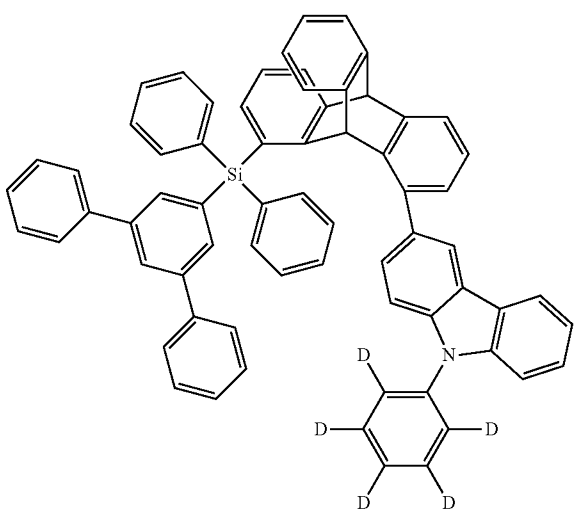
-continued
A-185
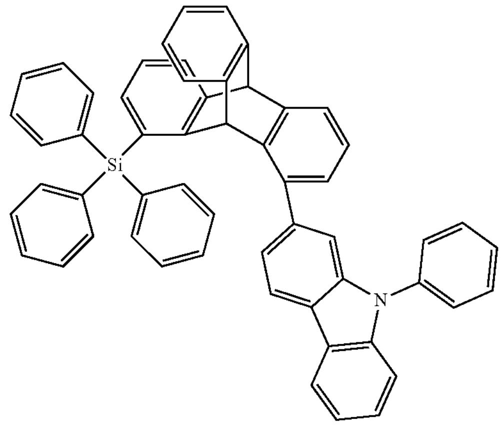
A-186
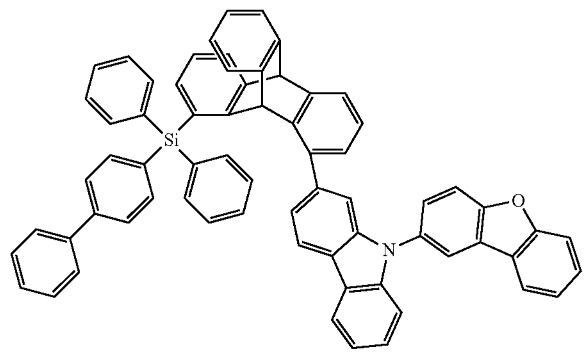
A-187
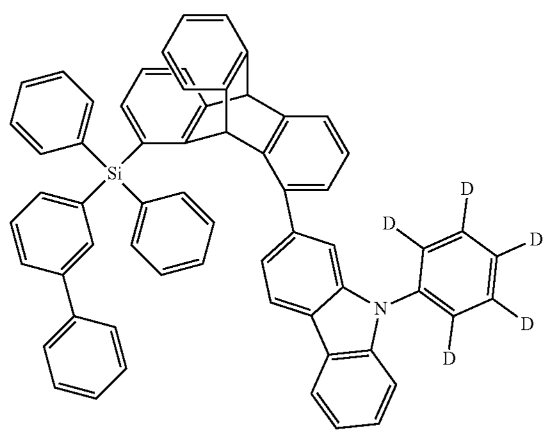

-continued
A-188
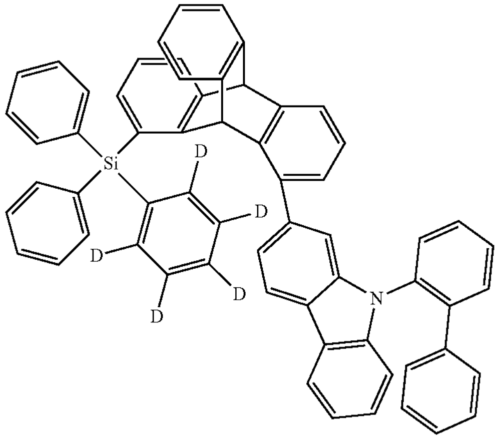
A-189
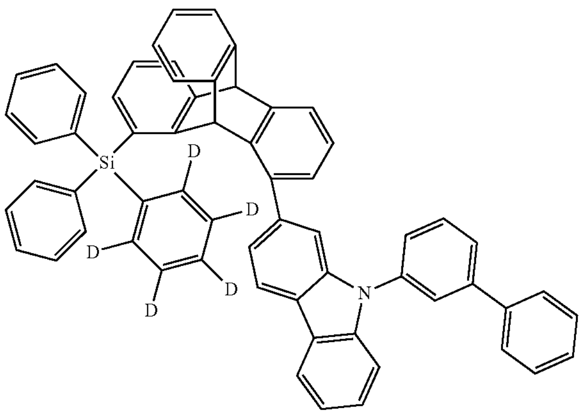
A-190
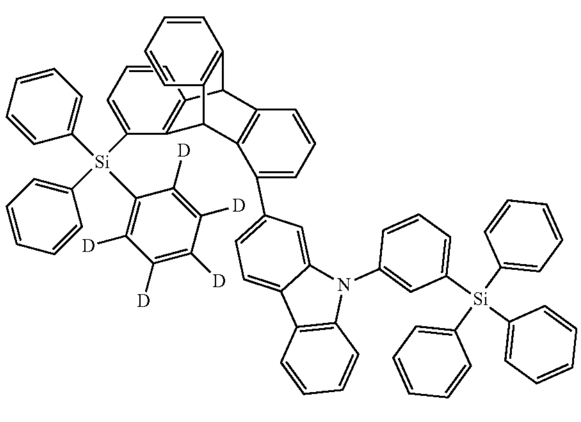
-continued
A-191
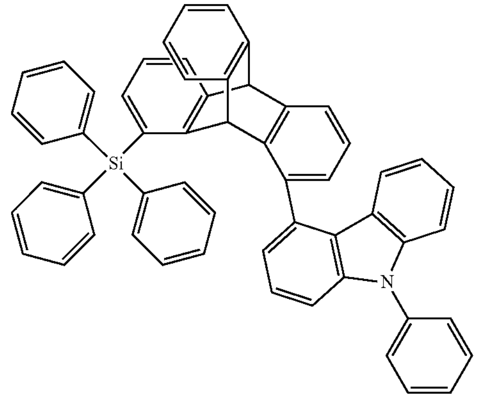
A-192
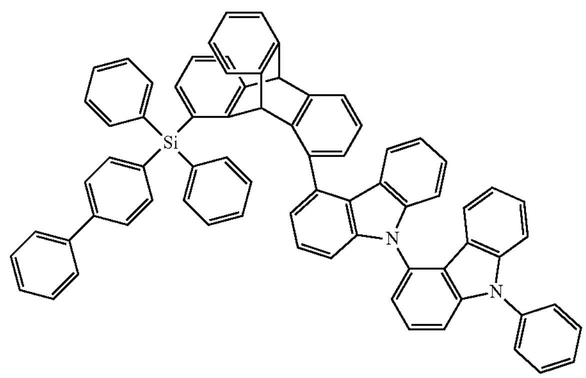
A-193
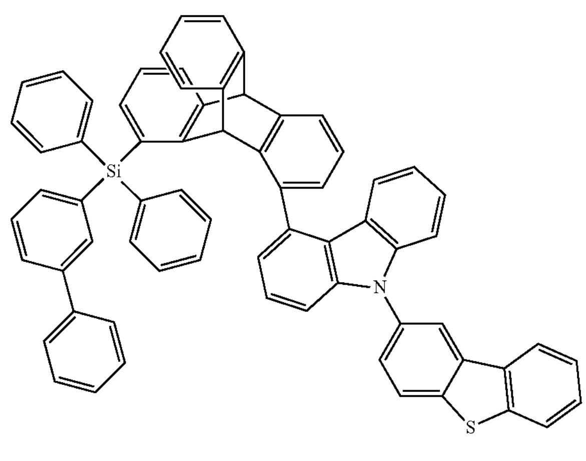

-continued
A-194
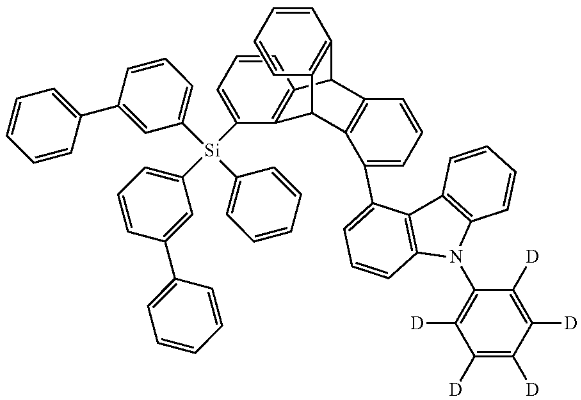
A-195
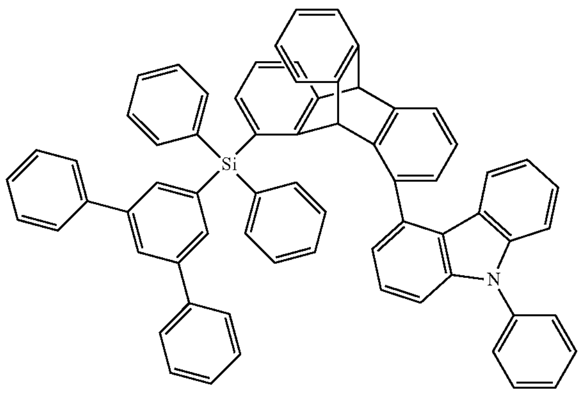
-continued
A-196
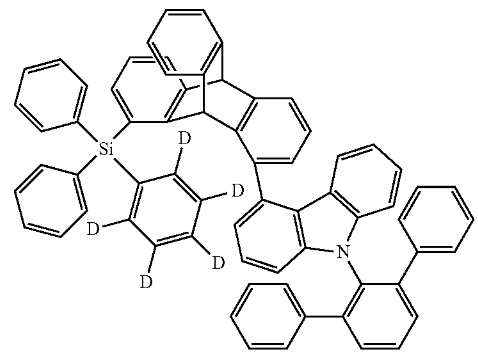
A-197
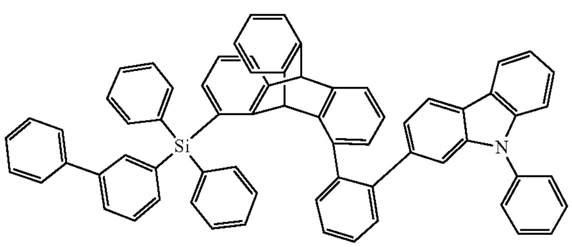
A-198
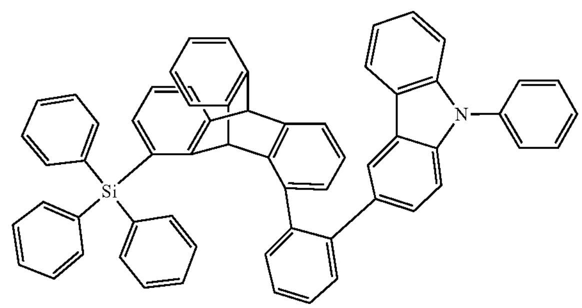
A-199
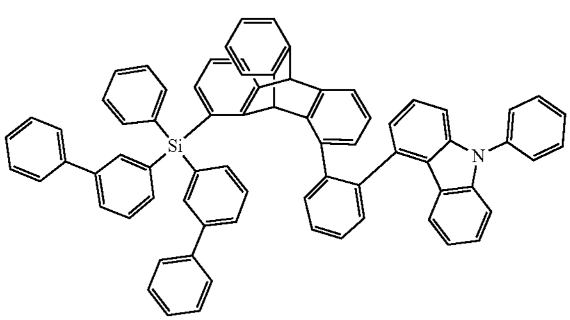
A-200
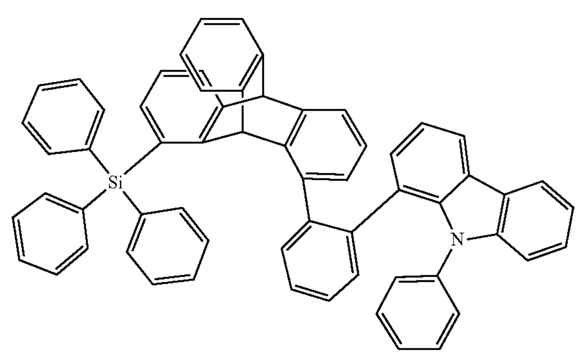

-continued
A-201
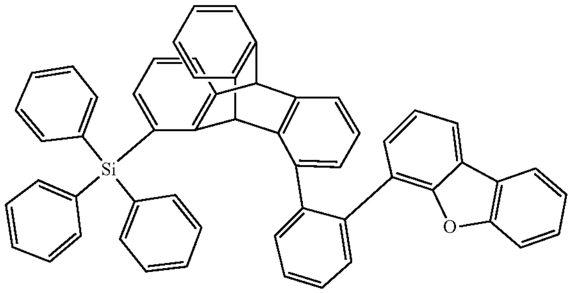
A-202
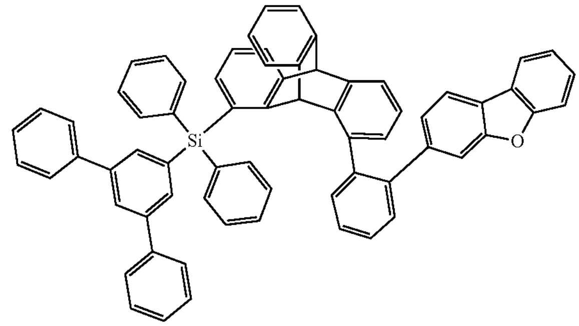
A-203
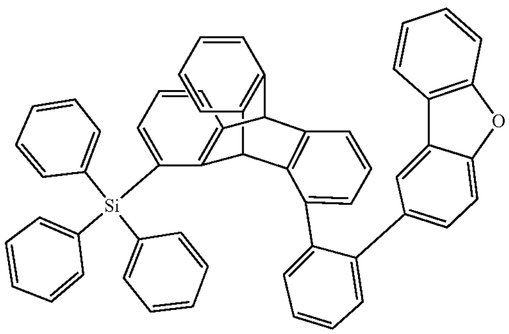
A-204
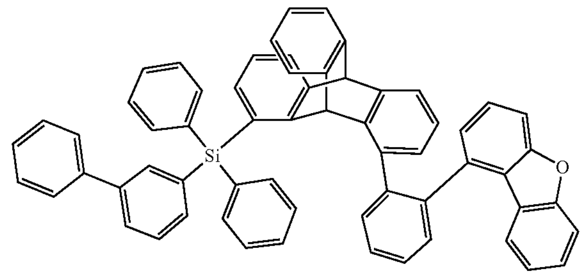
A-205
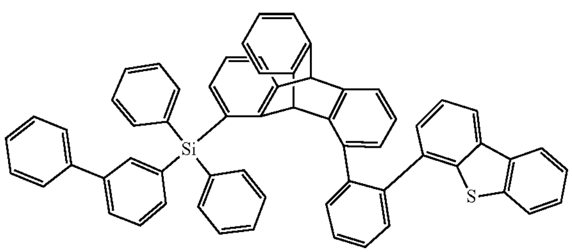
A-206
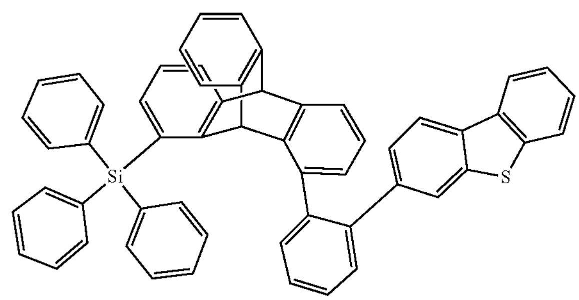
A-207
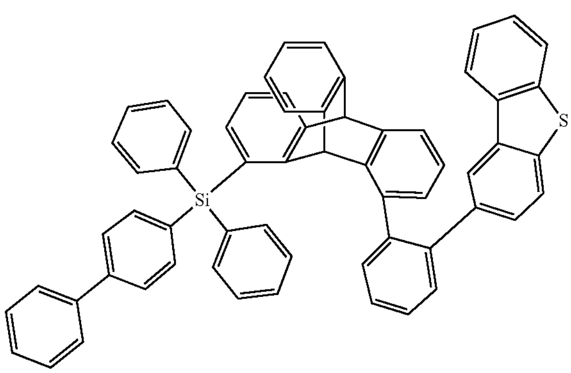
A-208
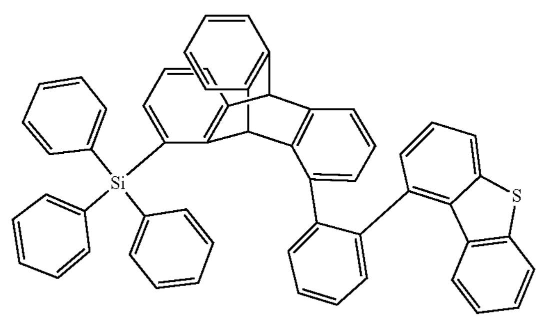

-continued
A-209
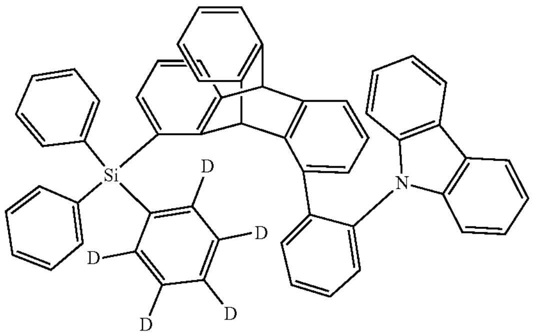
A-210
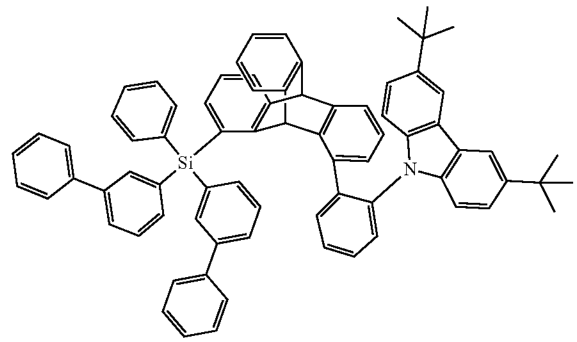
A-211
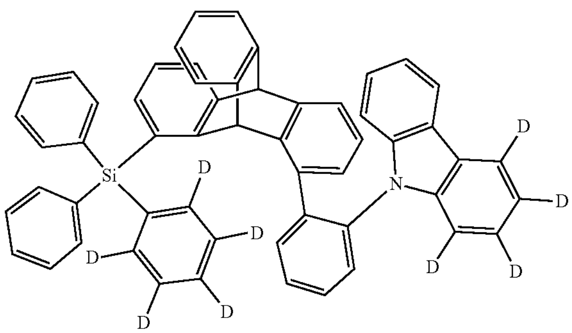
A-212
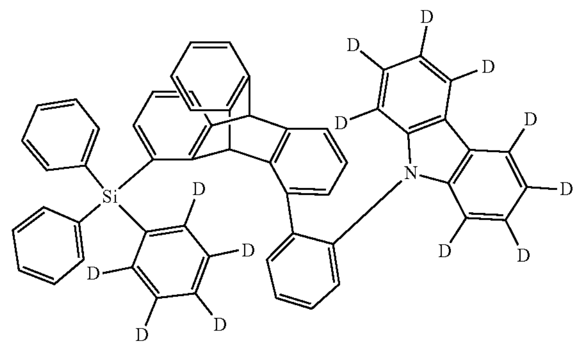
A-213
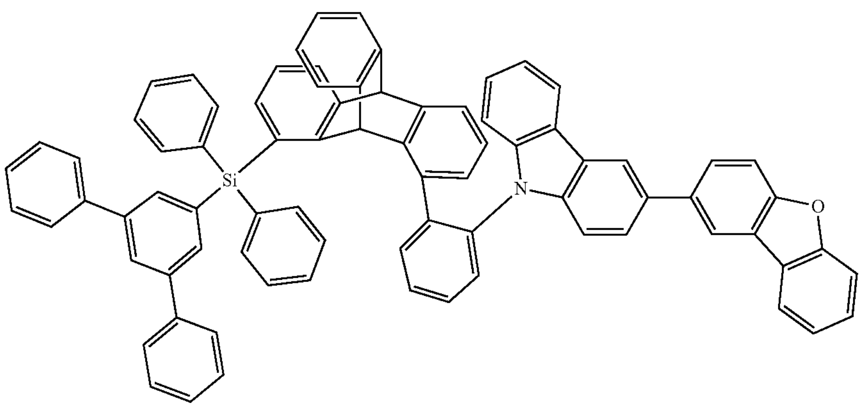
A-214
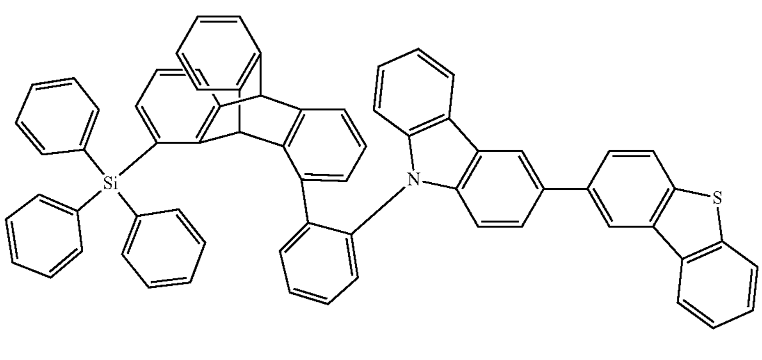

-continued
A-215
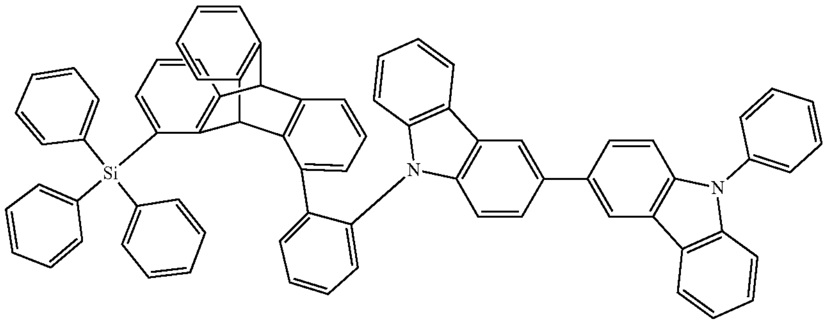
A-216
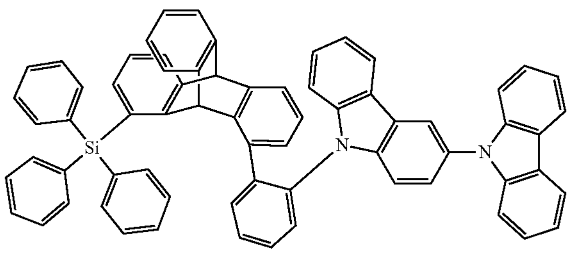
A-217
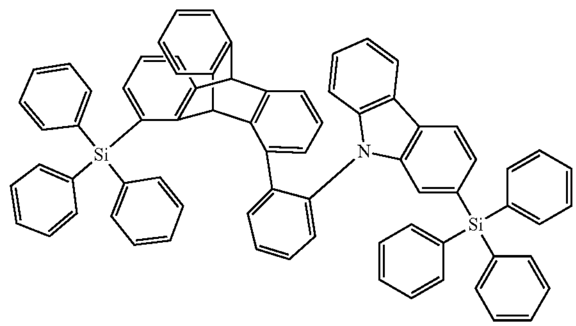
A-218
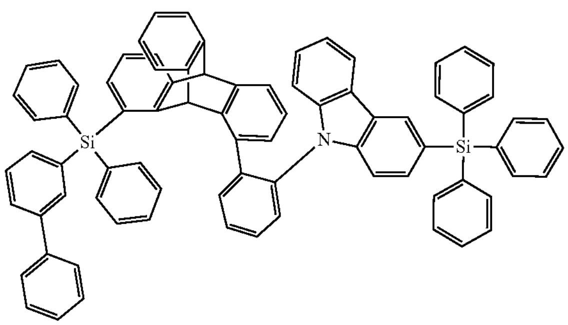
A-219
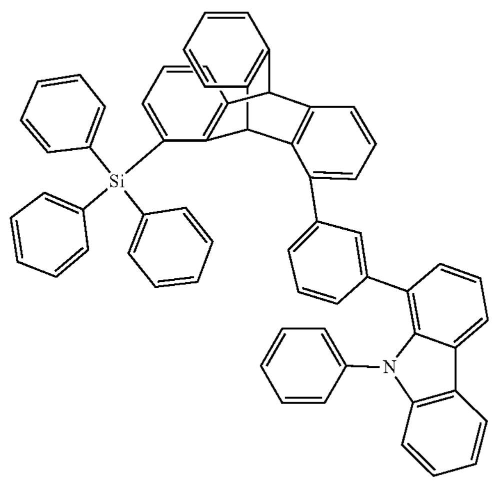
A-220
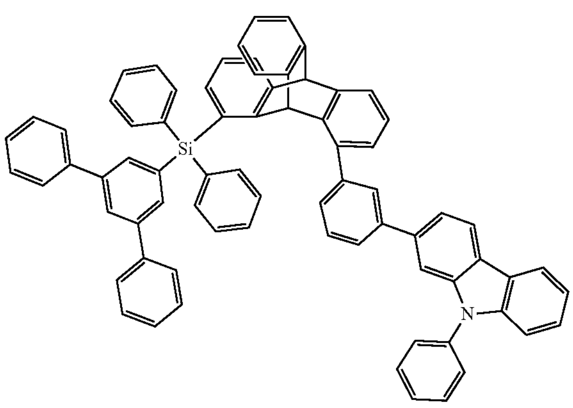
A-221
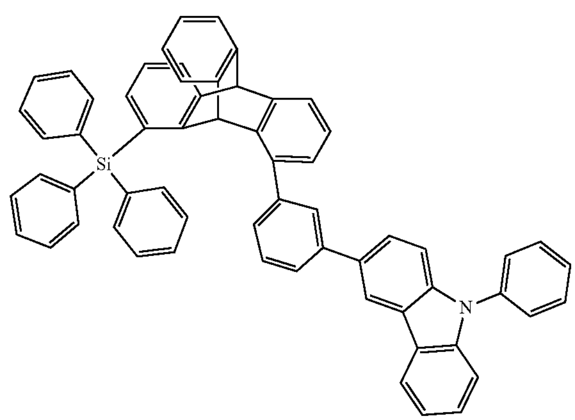

-continued
A-222
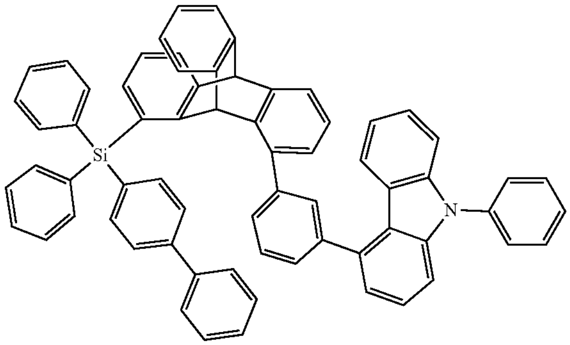
A-223
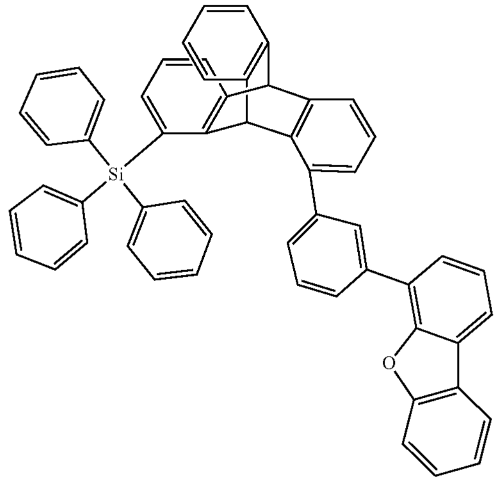
A-224
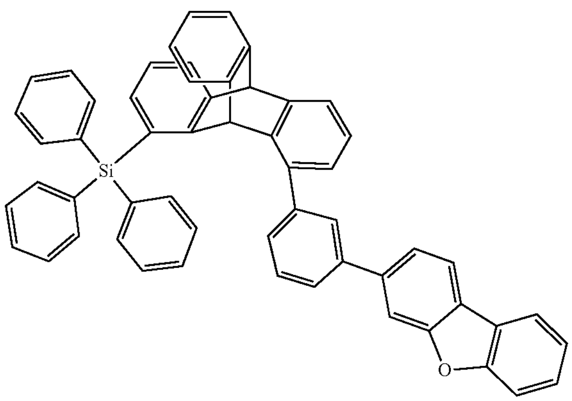
A-225
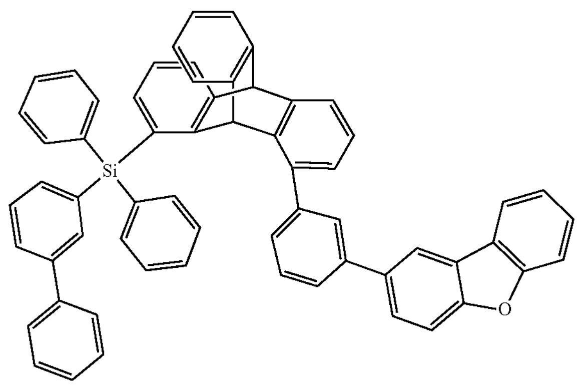
A-226
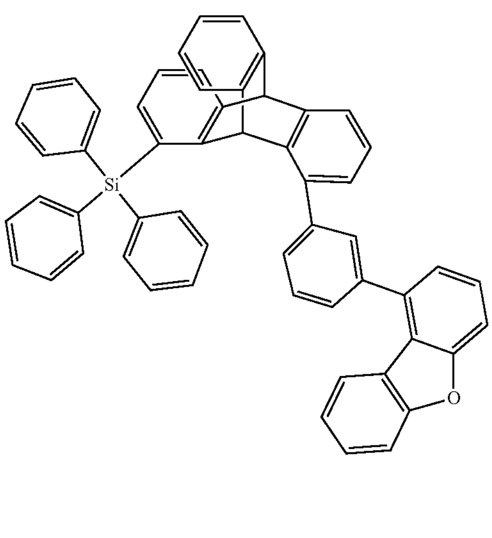

-continued
A-227
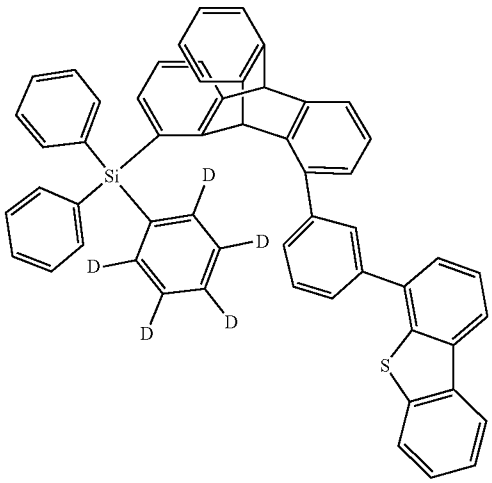
A-228
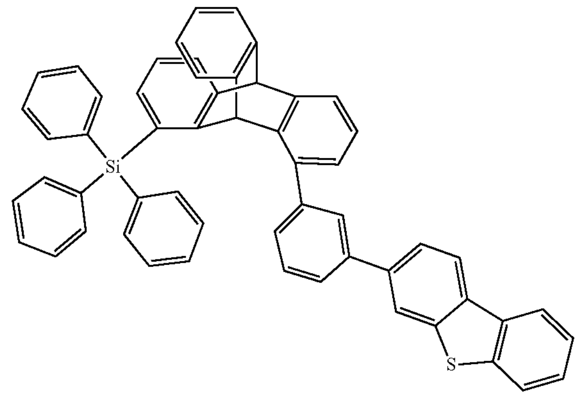
A-229
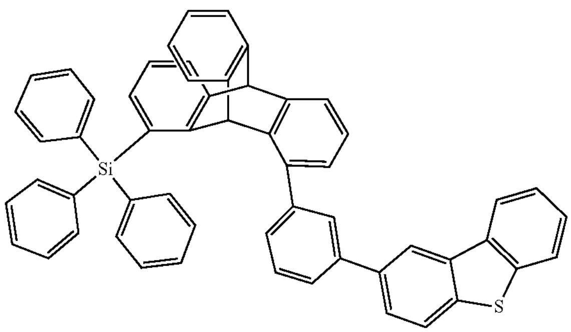
A-230
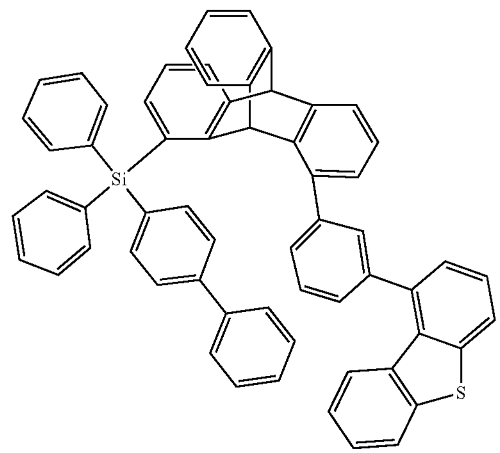
A-231
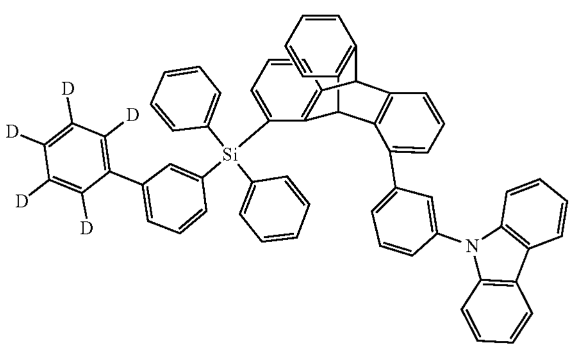
A-232
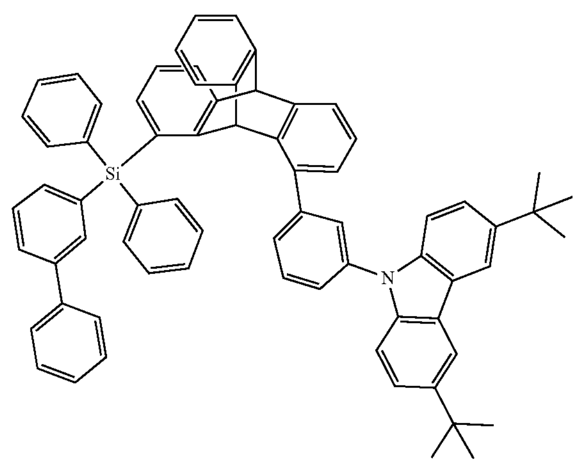

-continued
A-233
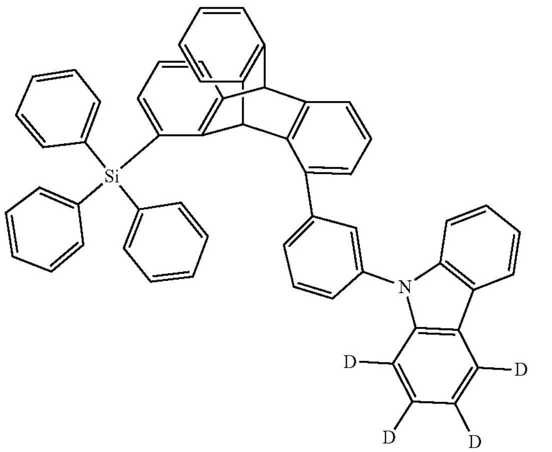
A-234
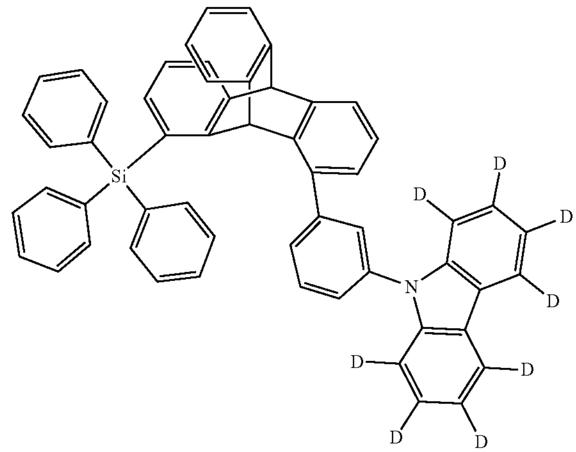
A-235
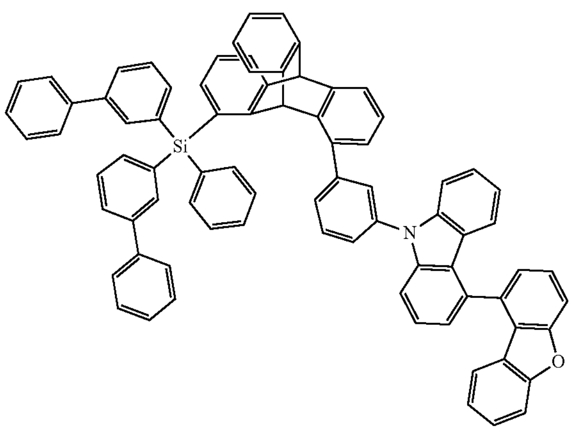
A-236
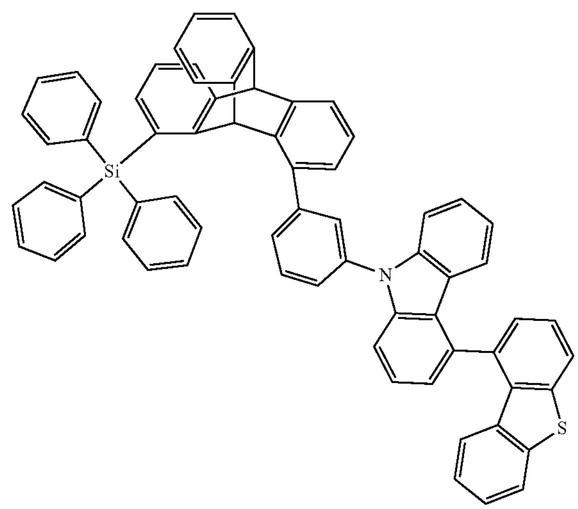
A-237
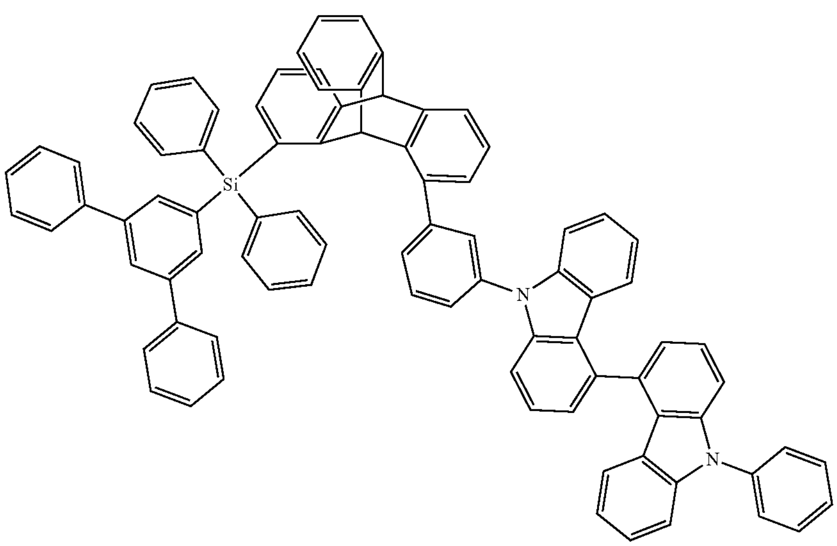

-continued
A-238
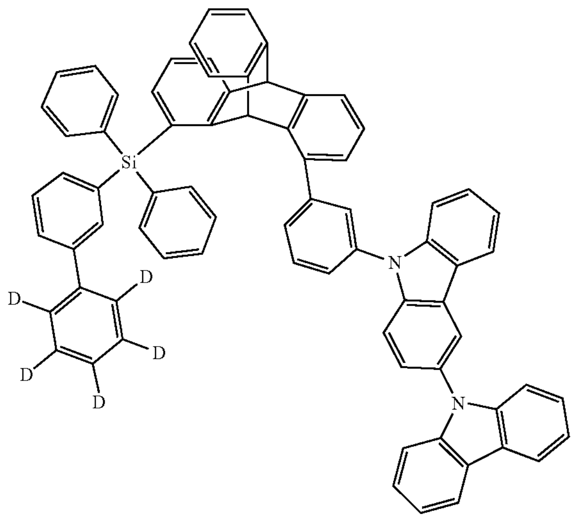
A-239
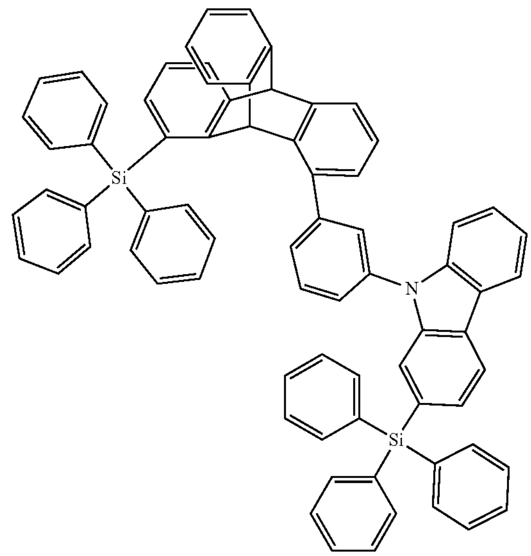
A-240
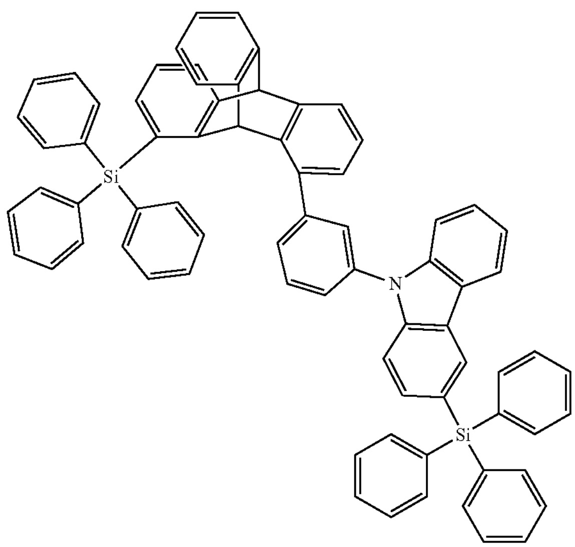
C-1
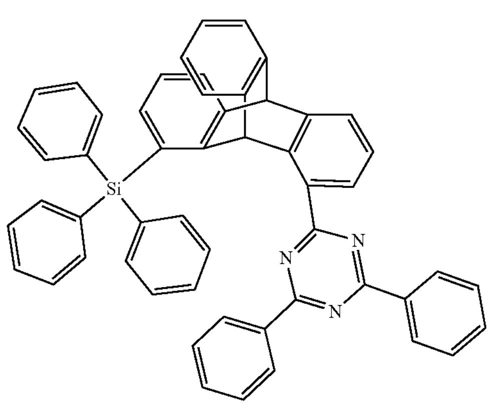
C-2
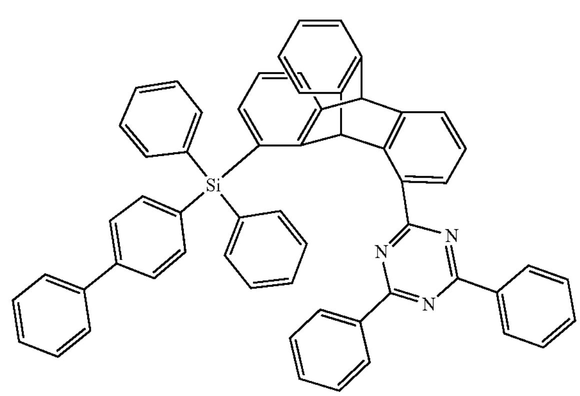

-continued
C-3
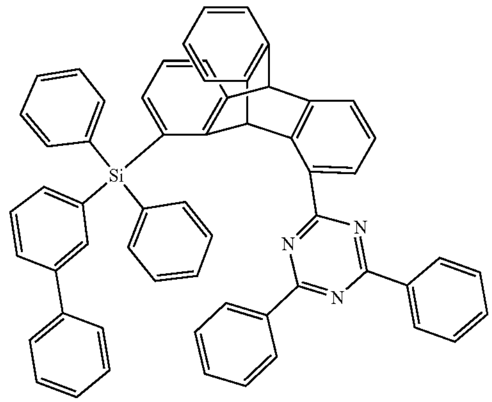
C-4
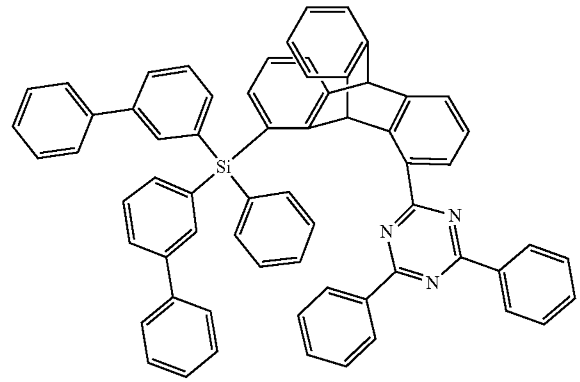
C-5
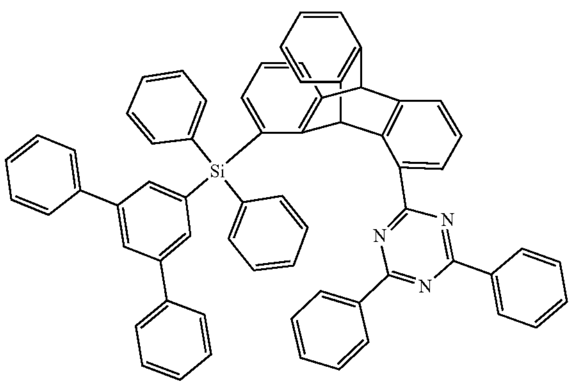
C-6
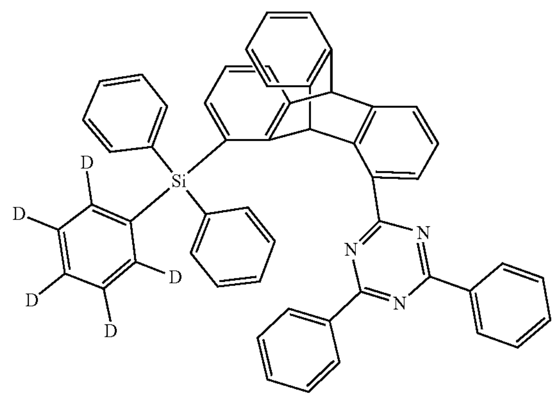
C-7
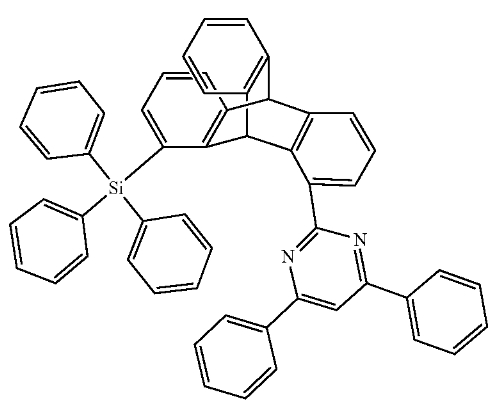
C-8
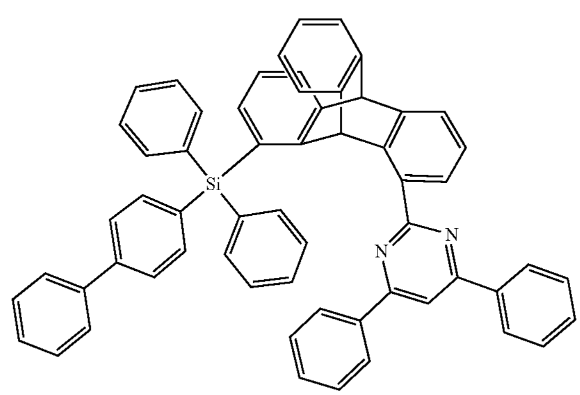

-continued
C-9
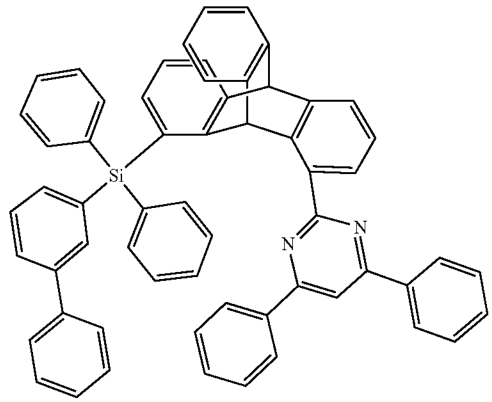
C-10
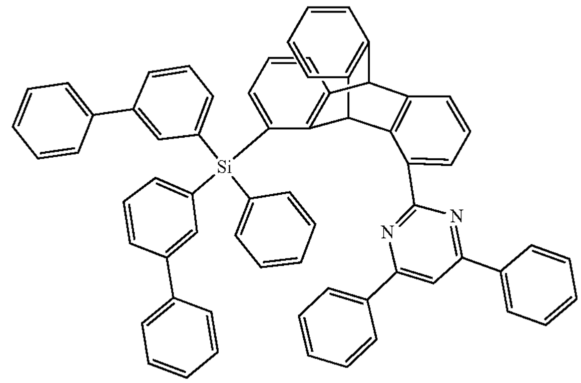
C-11
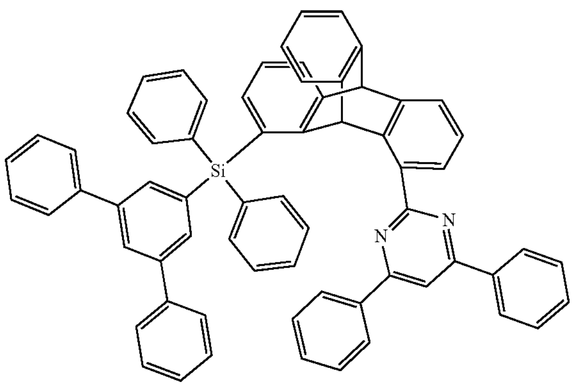
C-12
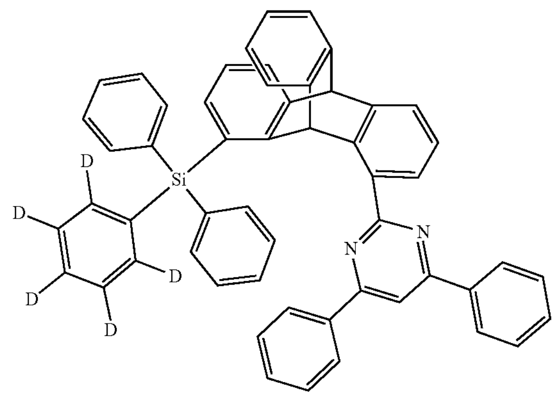
C-13
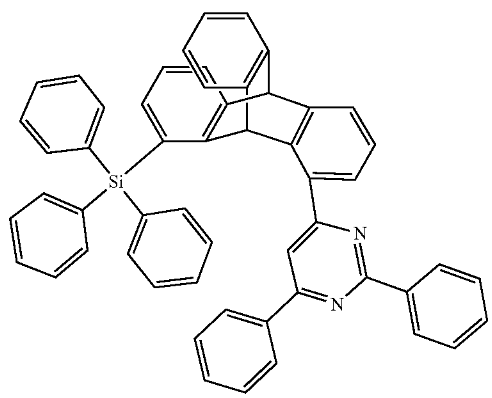
C-14
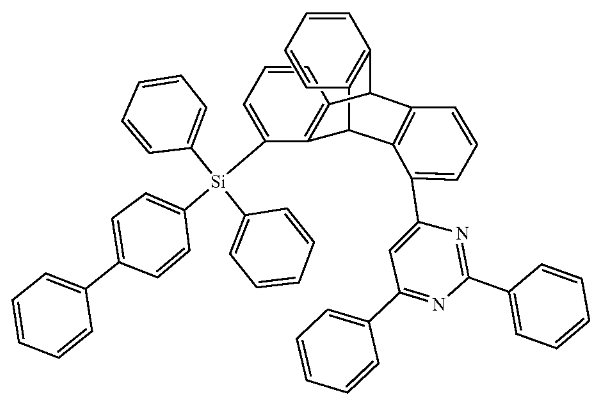

-continued
C-15
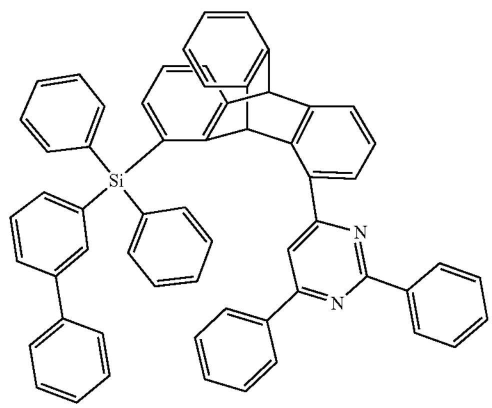
C-16
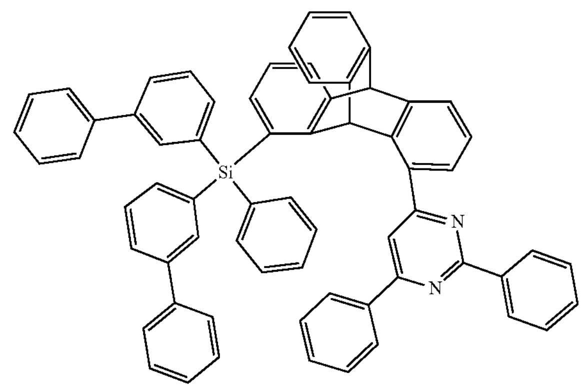
C-17
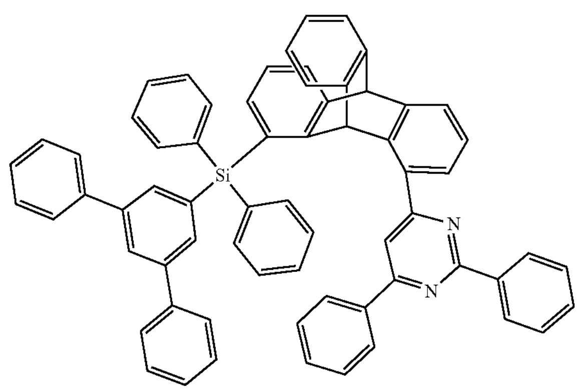
C-18
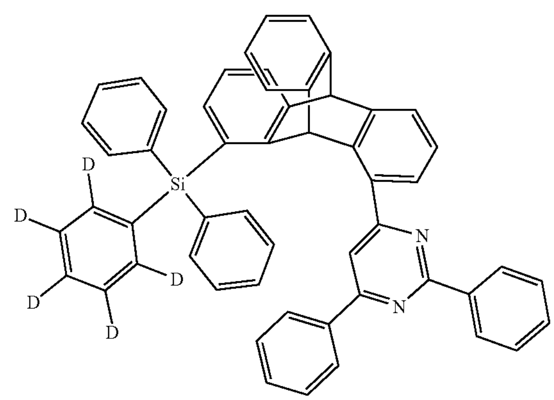
C-19
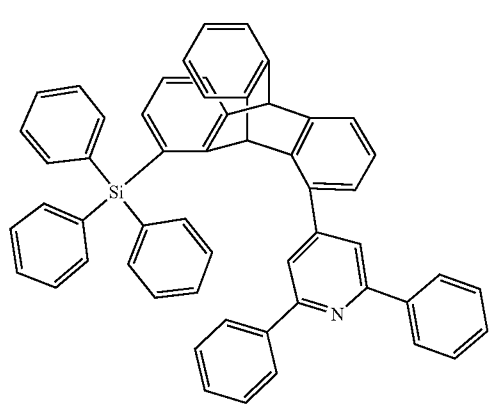
C-20
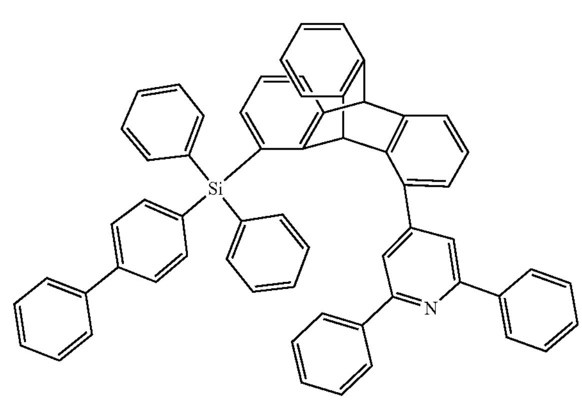

-continued
C-21
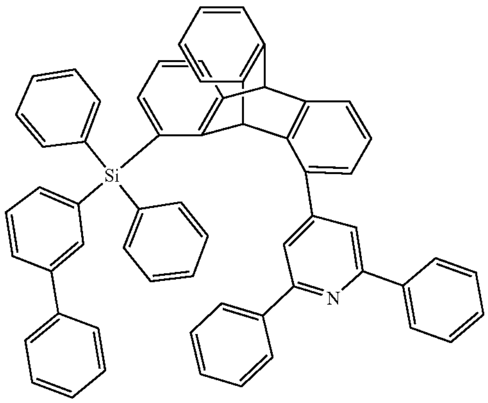
C-22
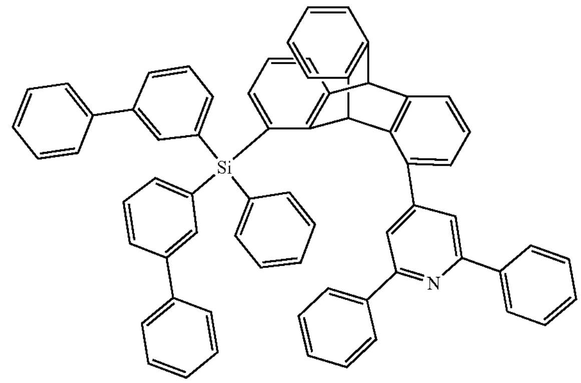
C-23
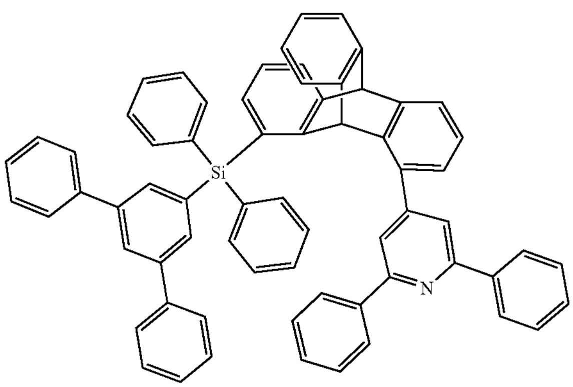
C-24
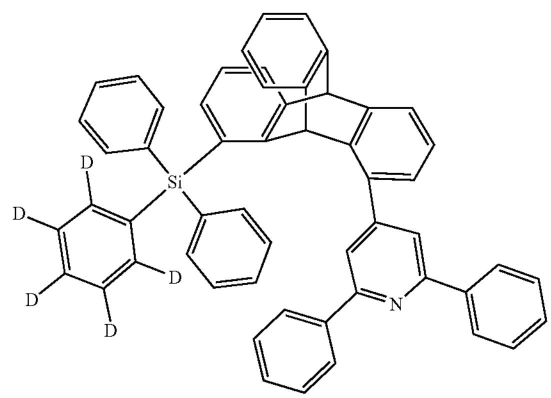
C-25
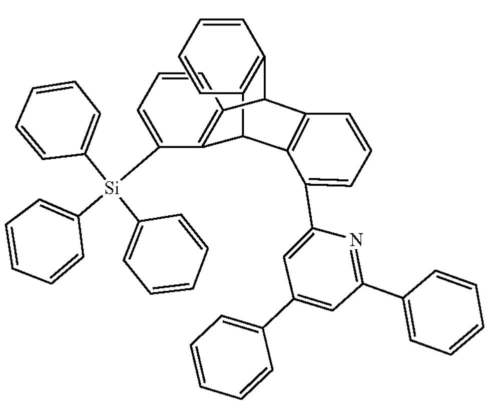
C-26
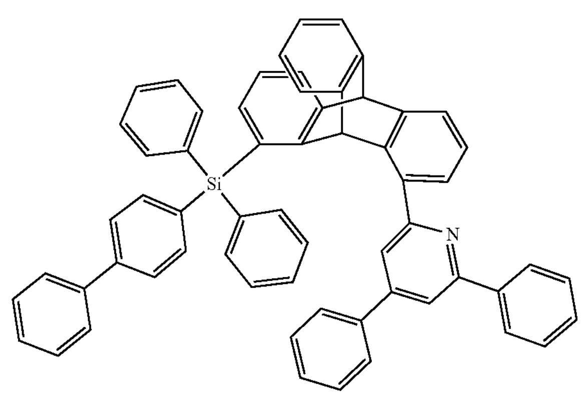

-continued
C-27
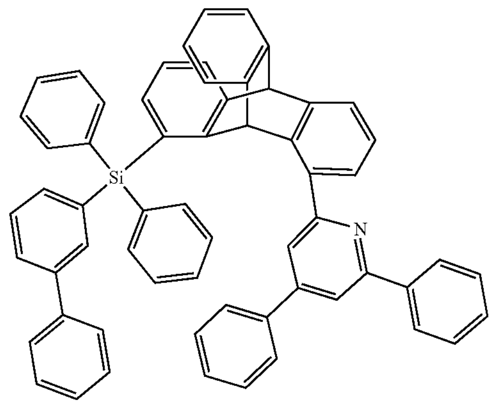
C-28
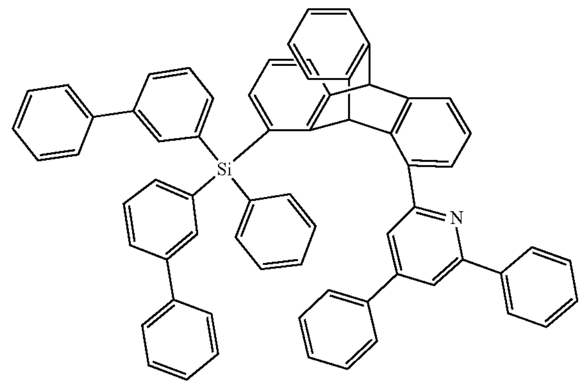
C-29
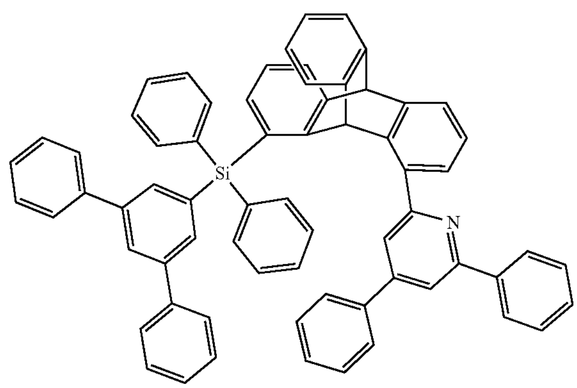
C-30
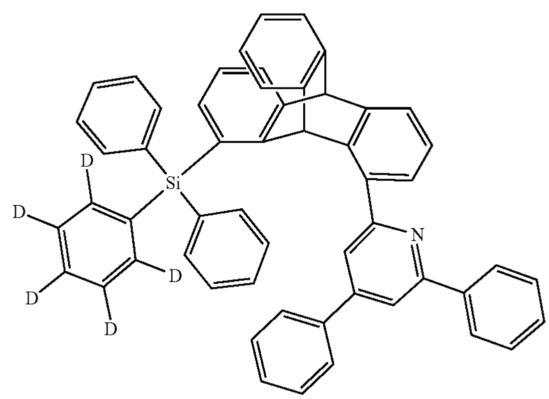
C-31
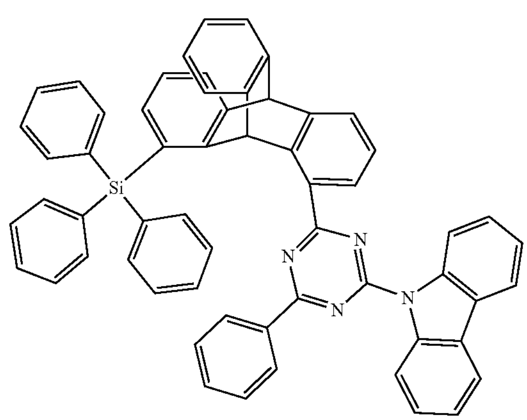
C-32
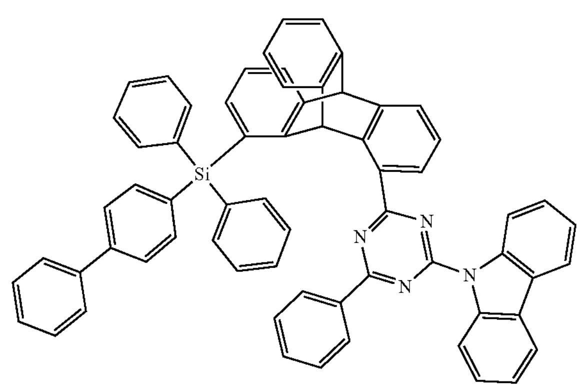

-continued
C-33
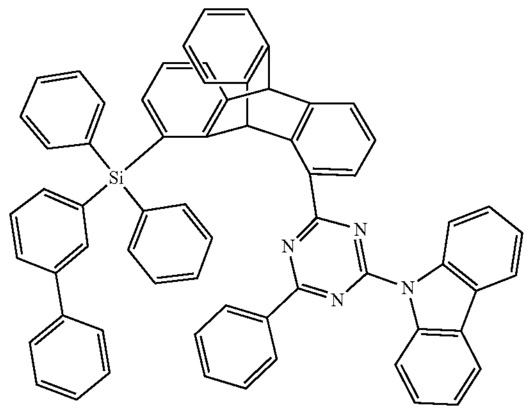
C-34
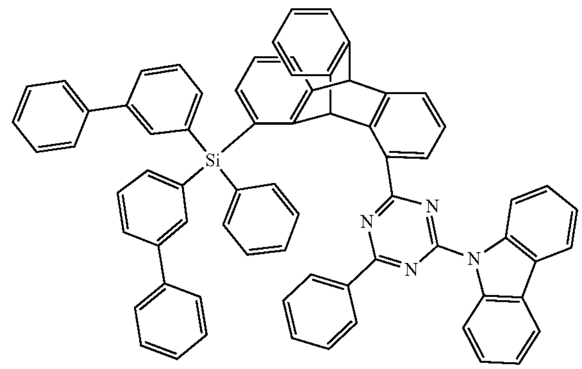
C-35
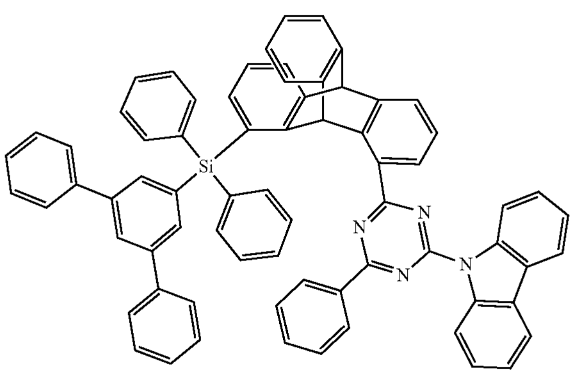
C-36
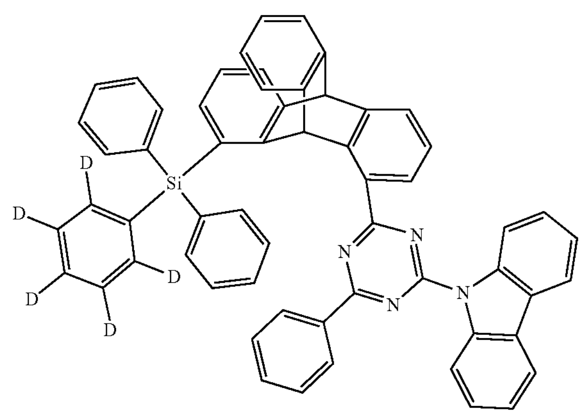
C-37
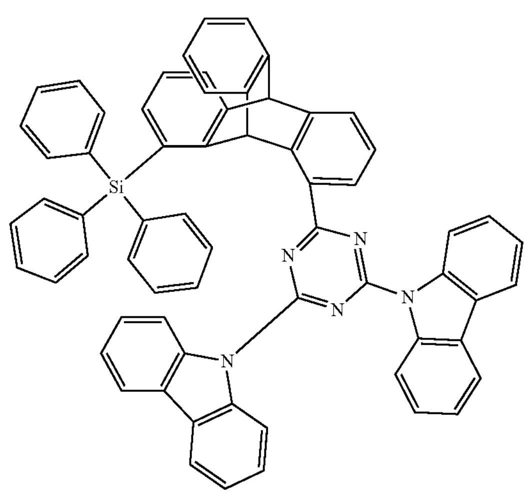
C-38
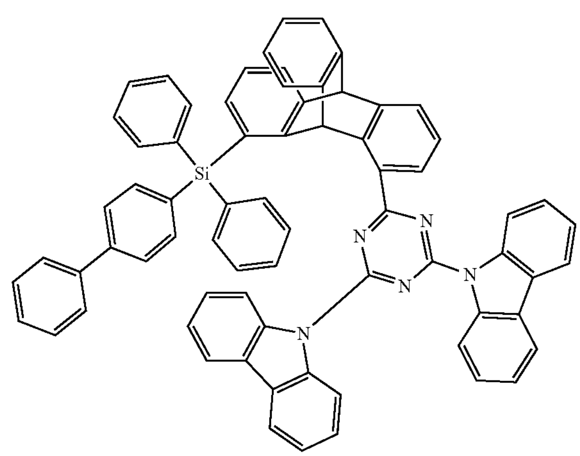

-continued
C-39
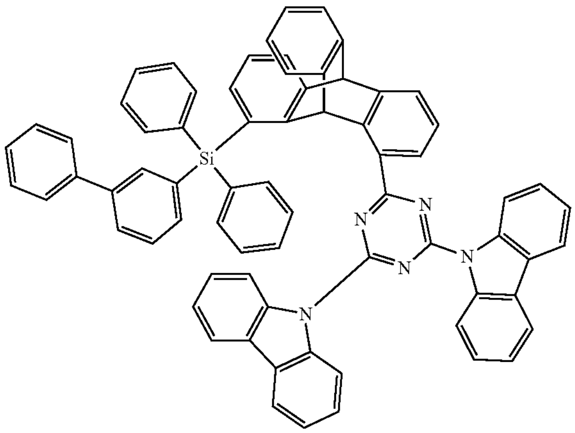
C-40
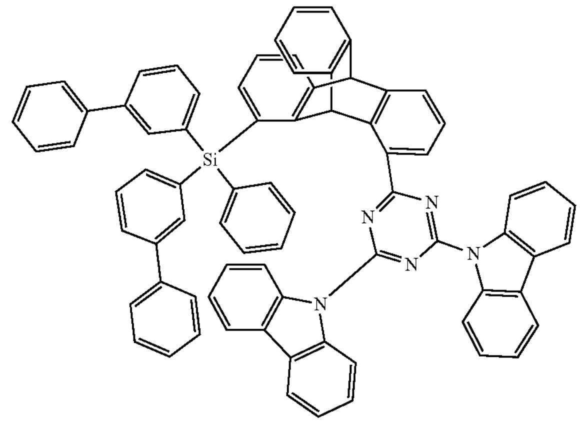
C-41
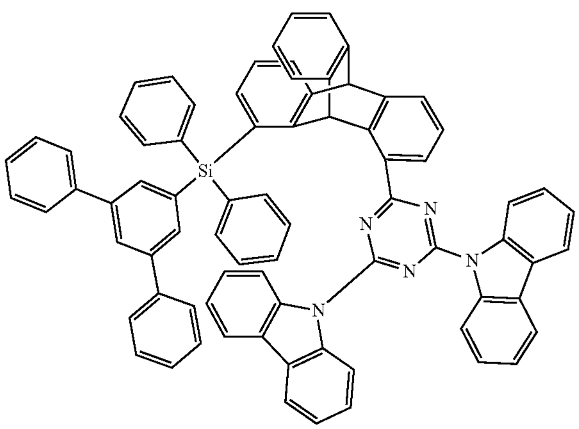
C-42
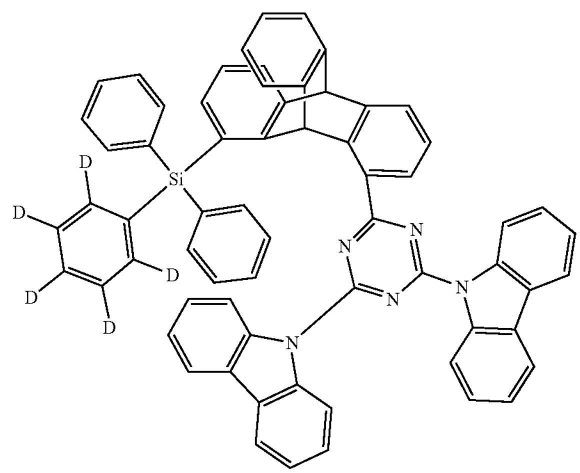
C-43
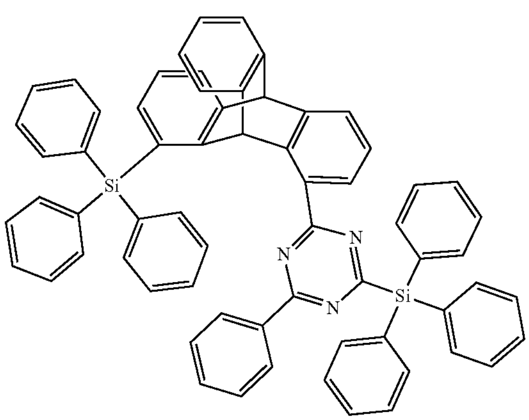
C-44
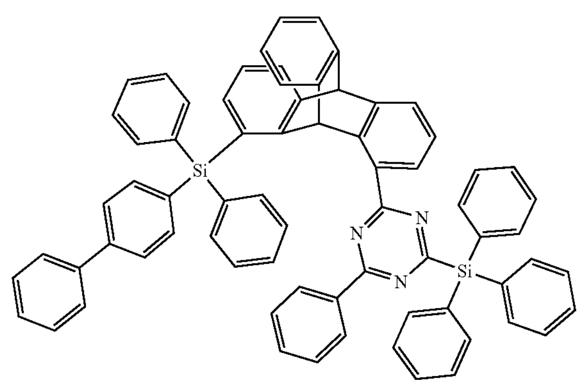

-continued
C-45
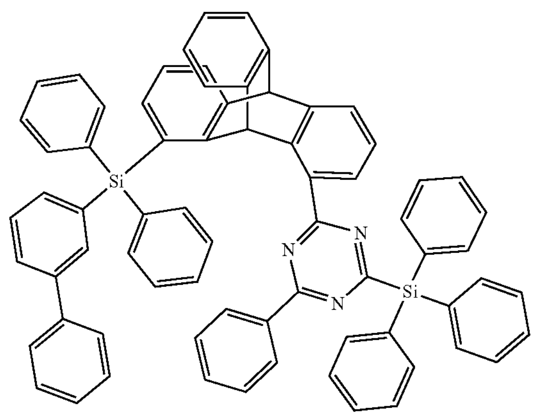
C-46
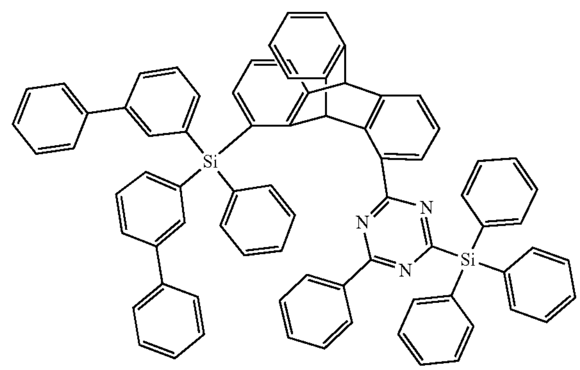
C-47
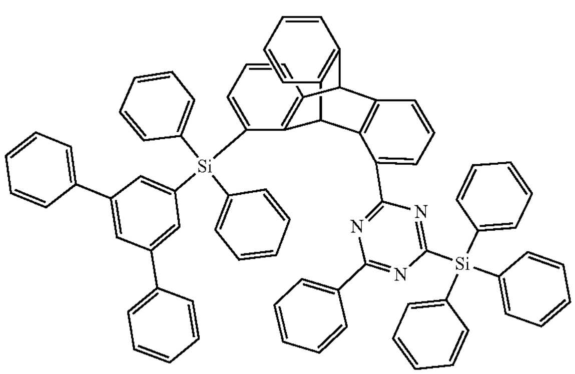
C-48
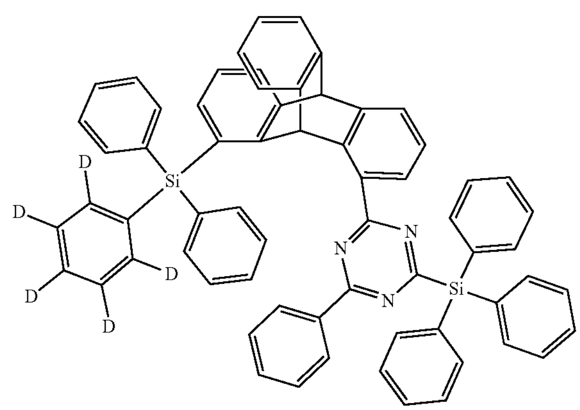
C-49
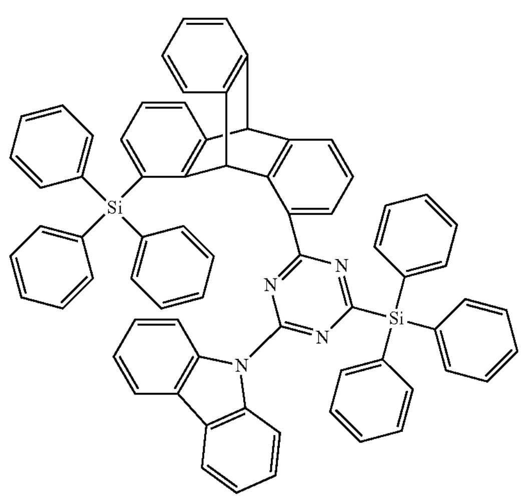
C-50
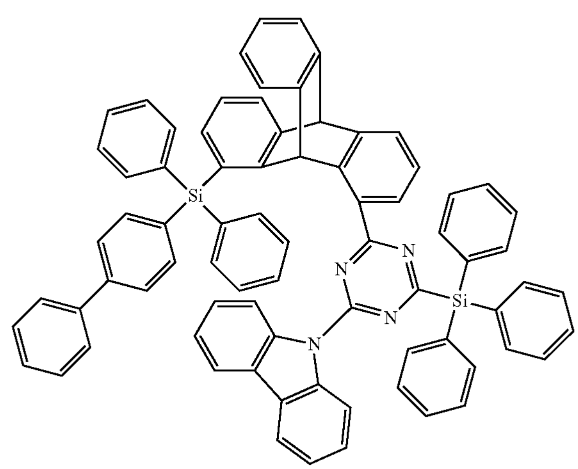

-continued
C-51
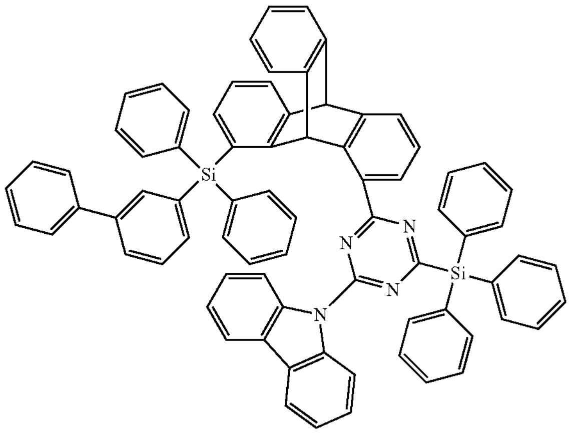
C-52
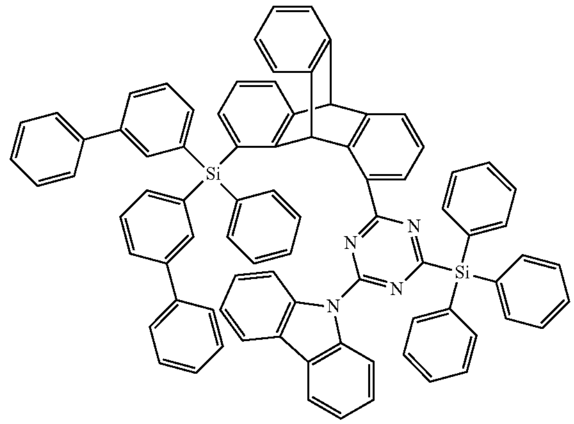
C-53
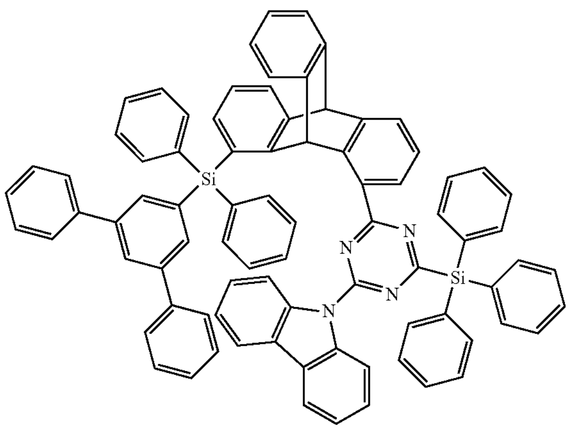
C-54
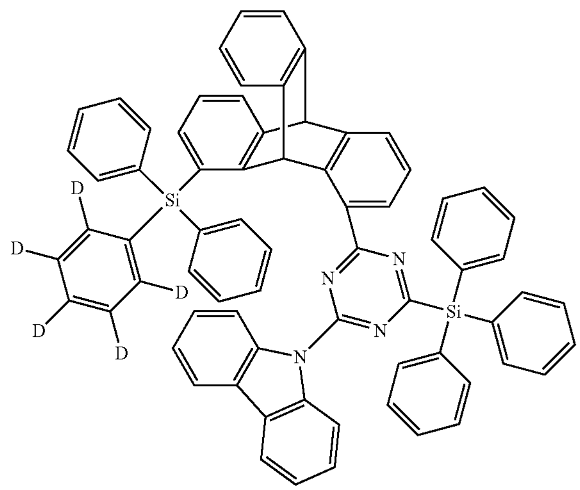
C-55
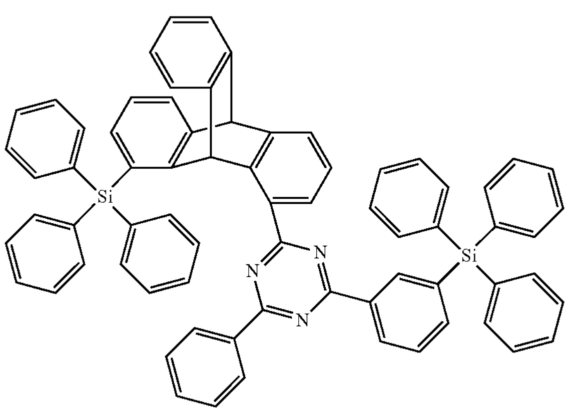
C-56
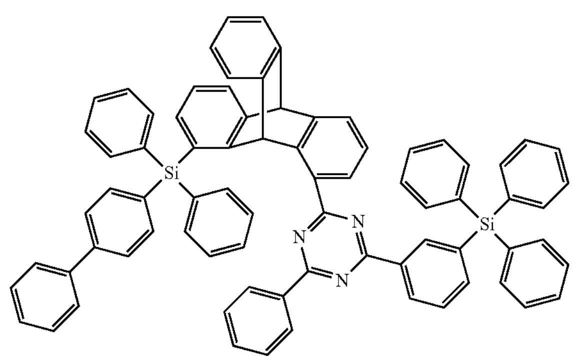

-continued
C-57
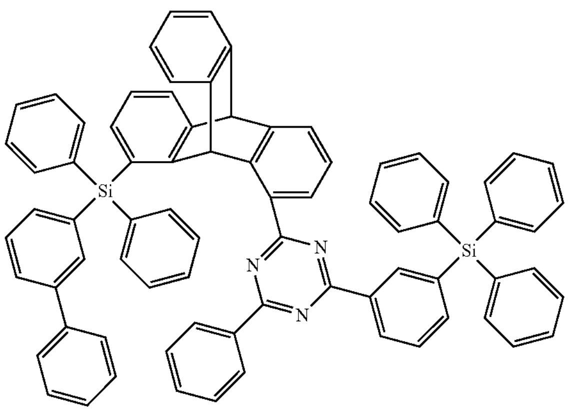
C-58
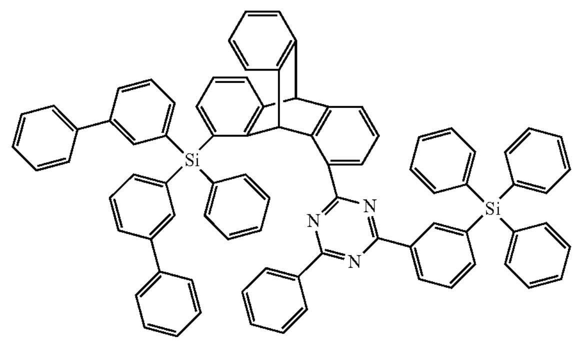
C-59
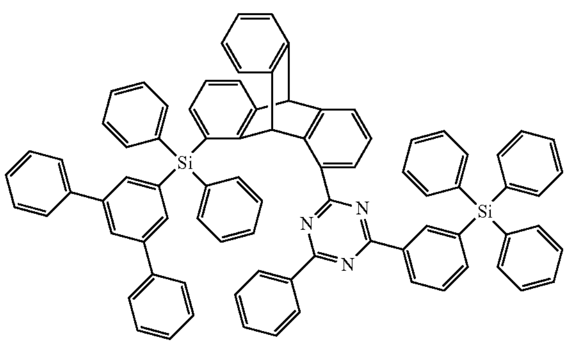
C-60
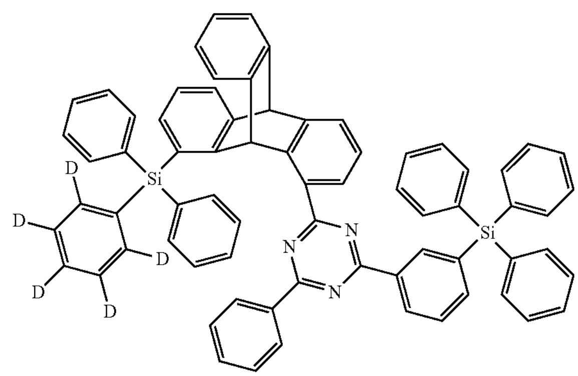
C-61
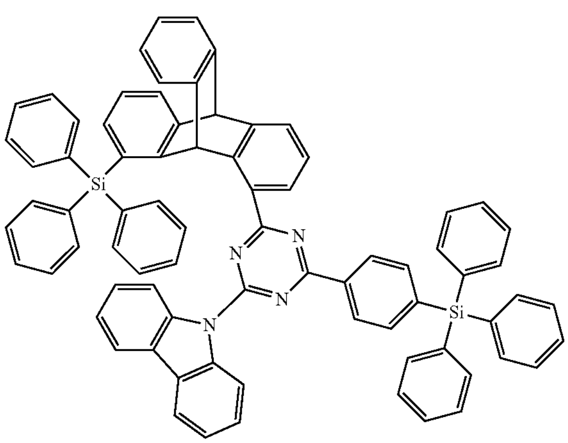
C-62
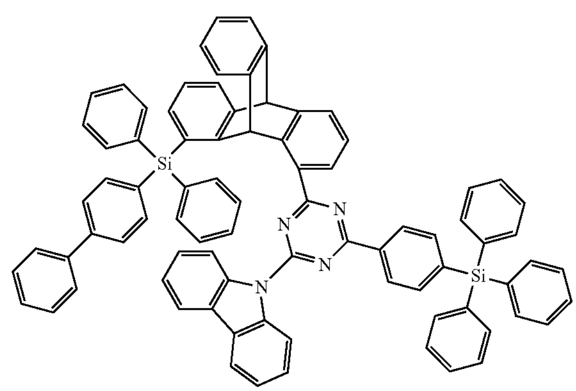
C-63
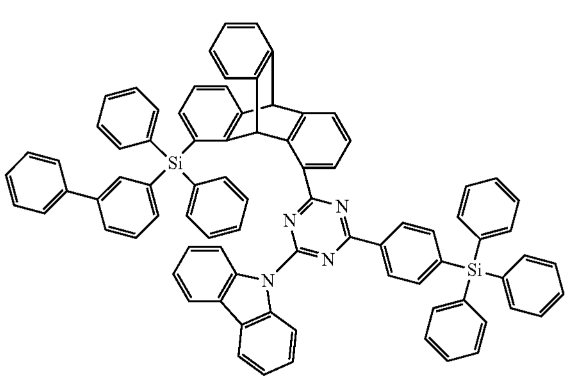
C-64
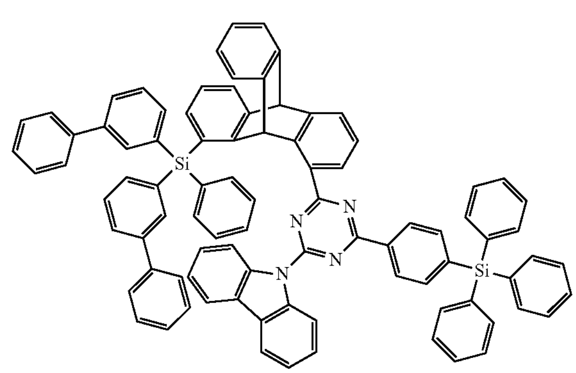

-continued
C-65
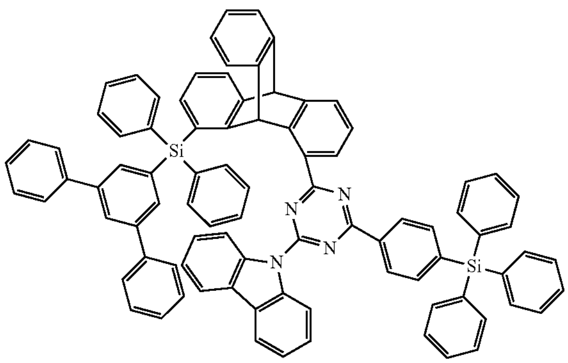
C-66
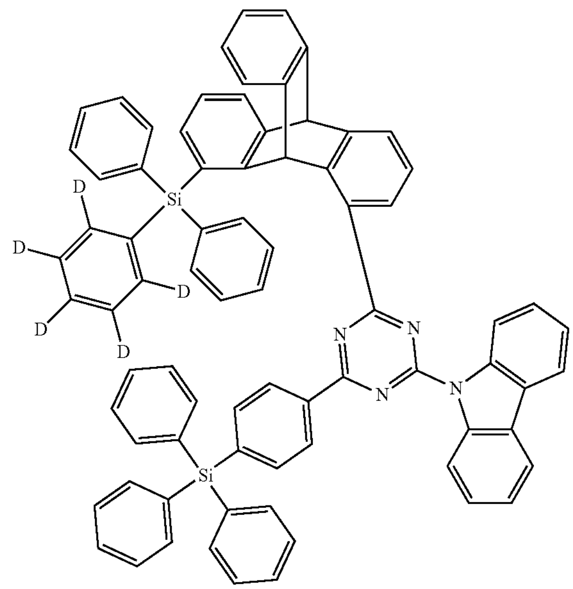
C-67
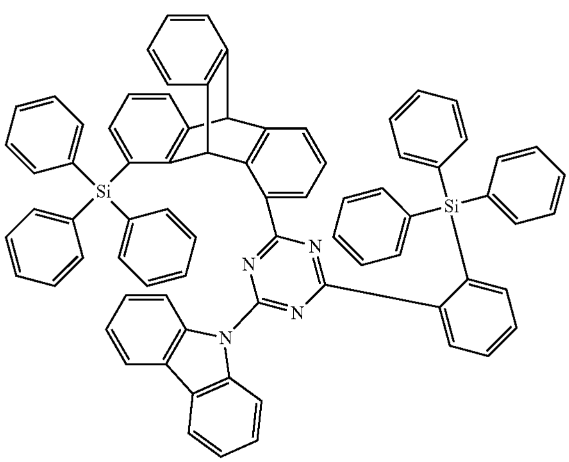
C-68
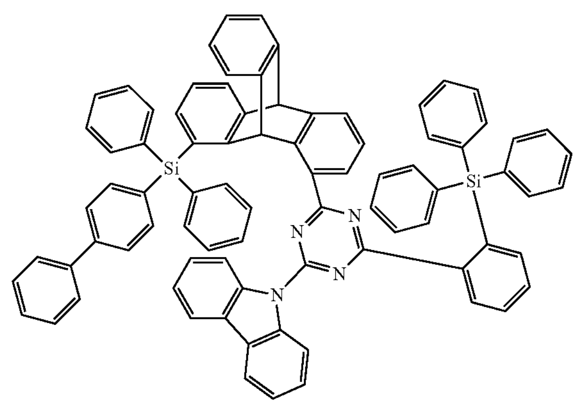
C-69
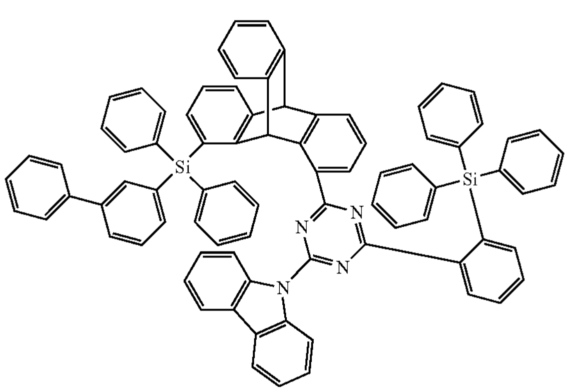
C-70
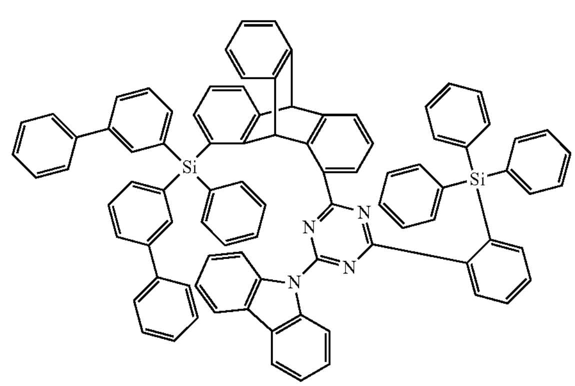

-continued
C-71
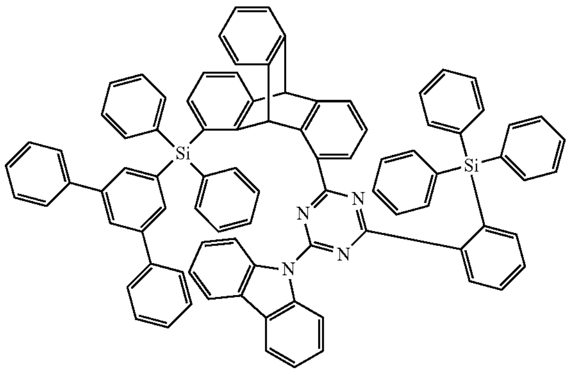
C-72
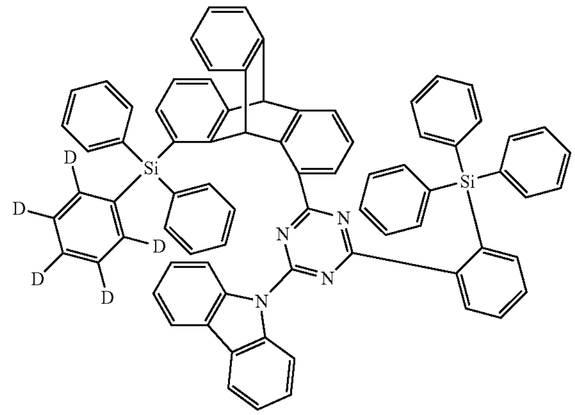
C-73
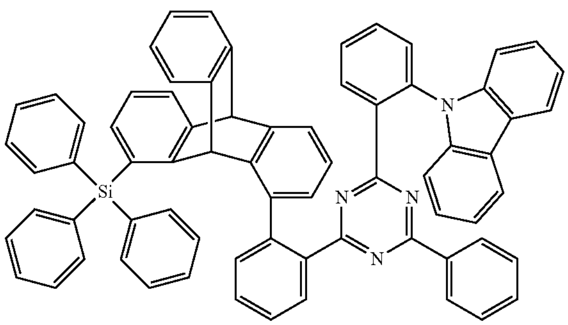
C-74
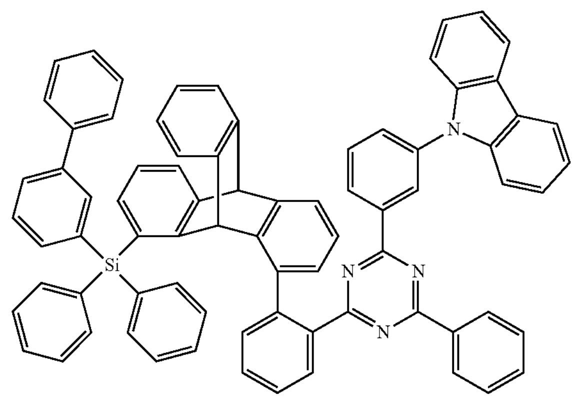
C-75
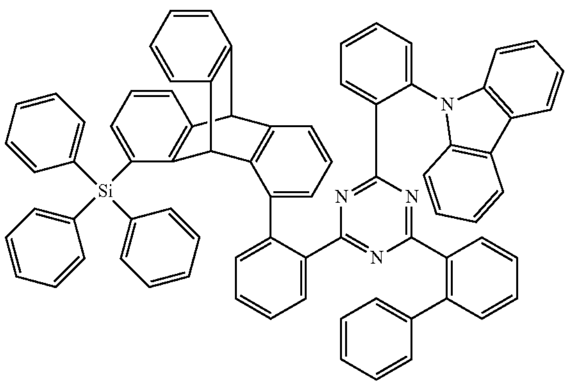
C-76
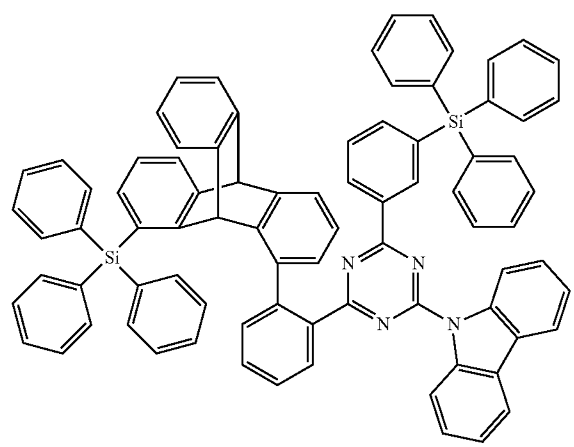

-continued
C-77
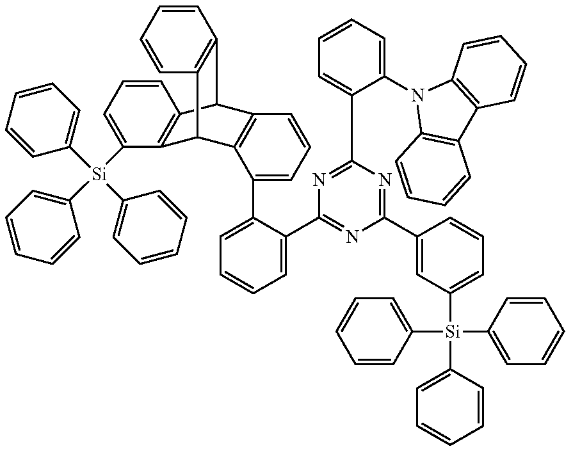
C-78
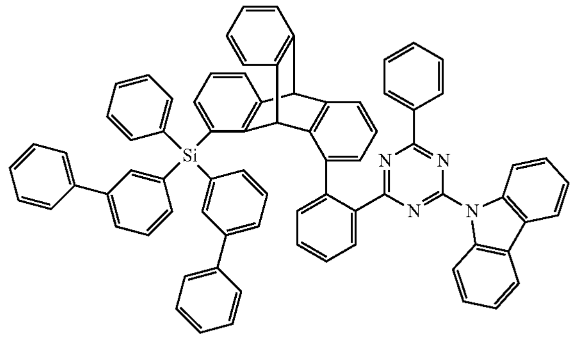
C-79
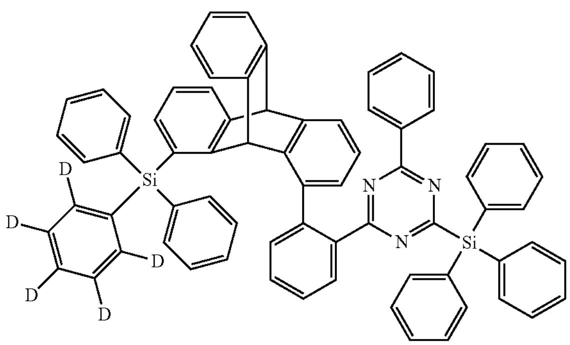
C-80
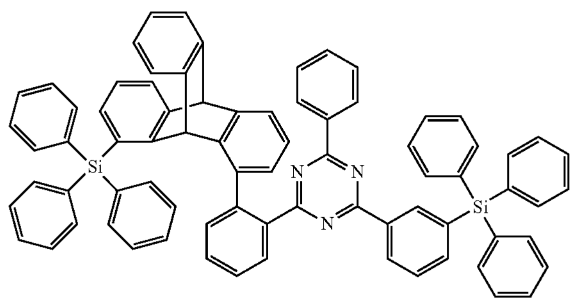
C-81
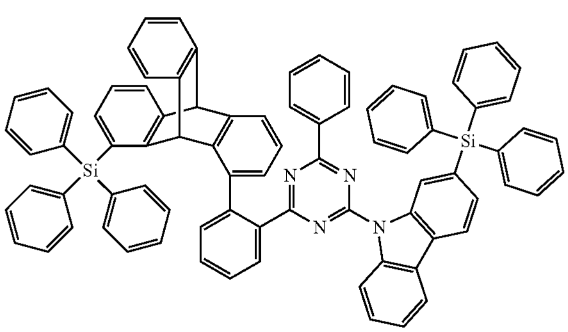
C-82
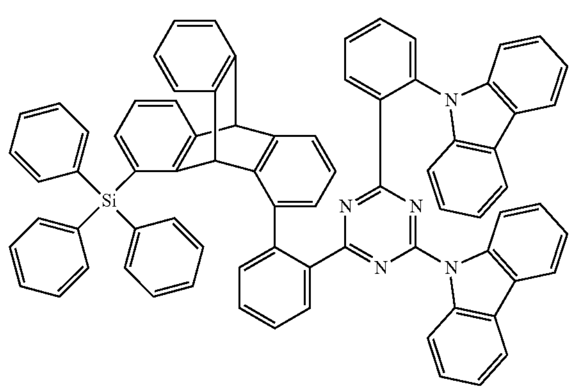

-continued
C-83
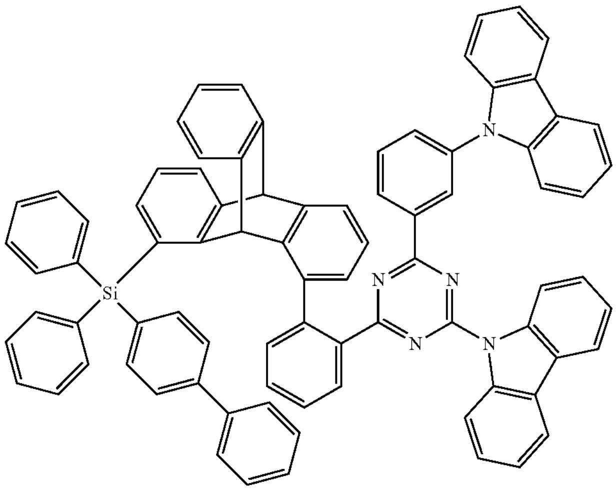
C-84
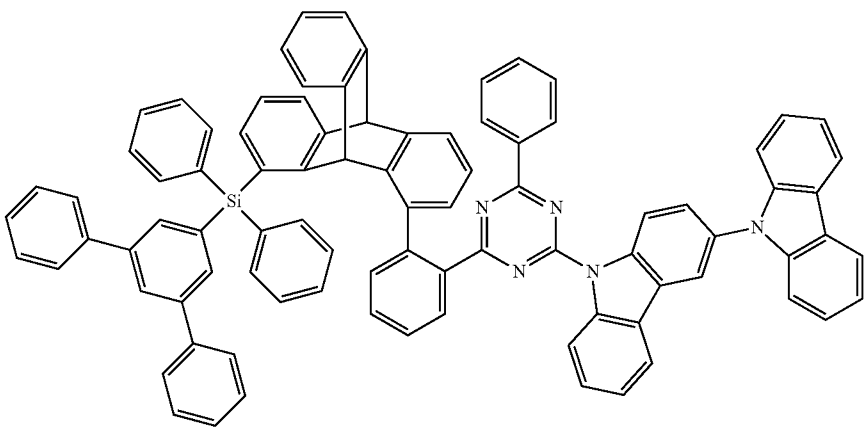
C-85
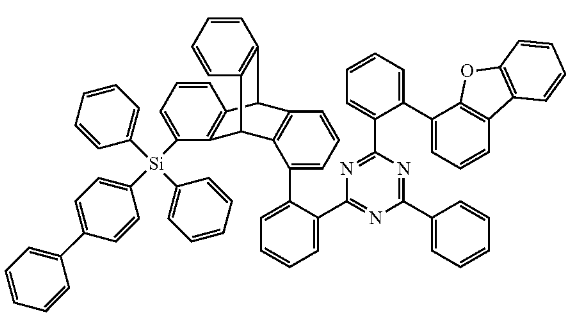
C-86
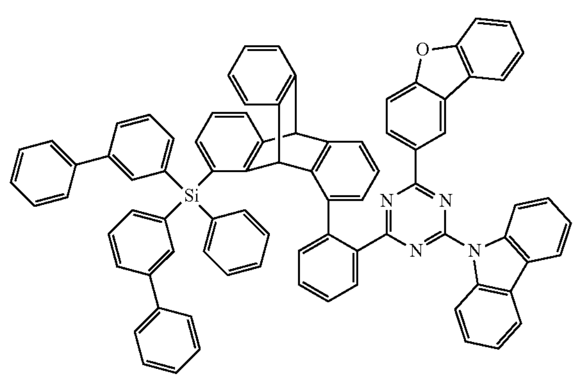

-continued
C-87
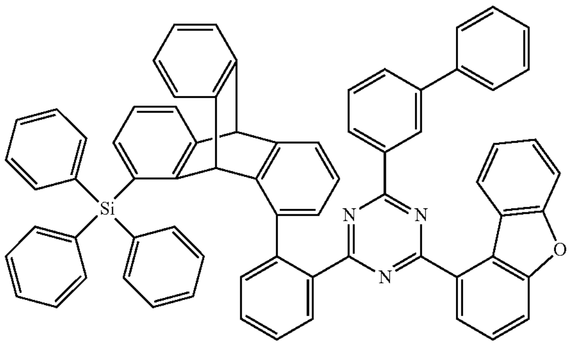
C-88
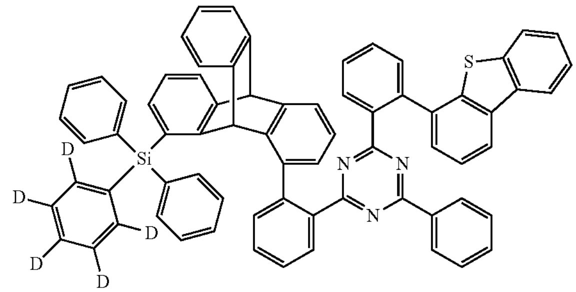
C-89
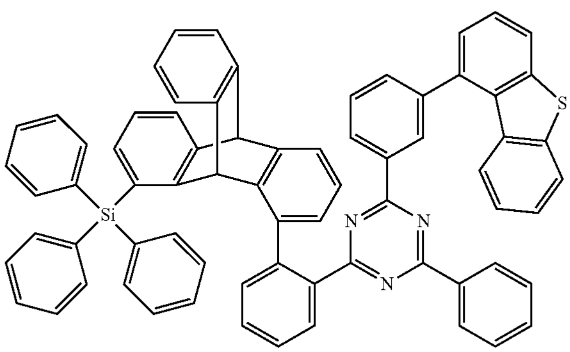
C-90
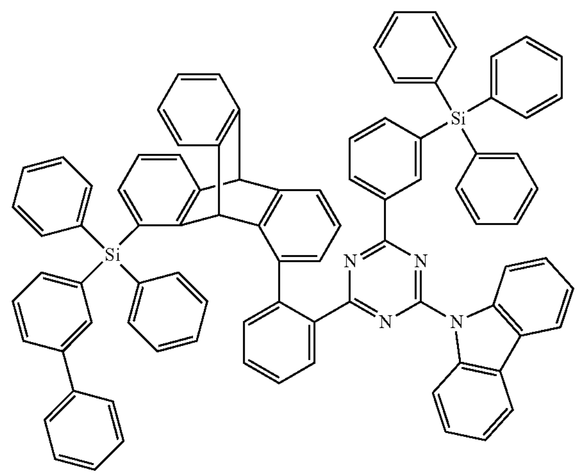
C-91
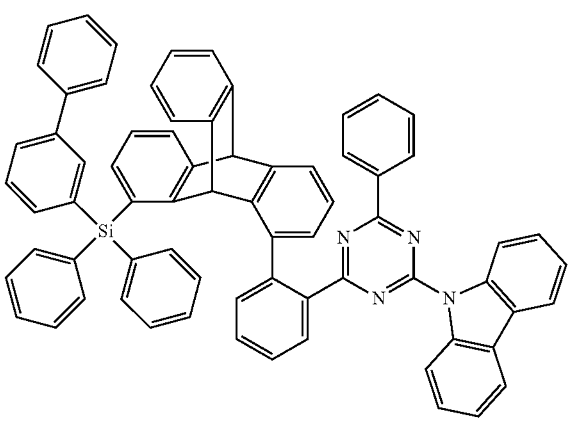
C-92
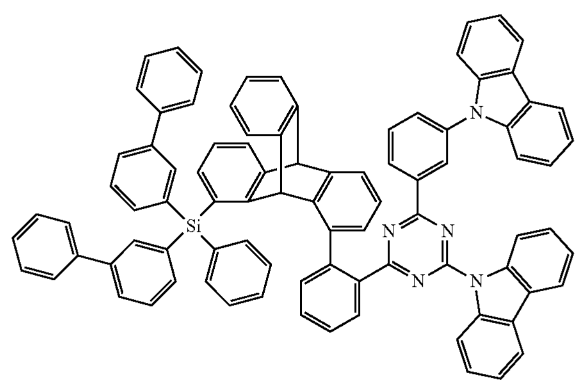

-continued
C-93
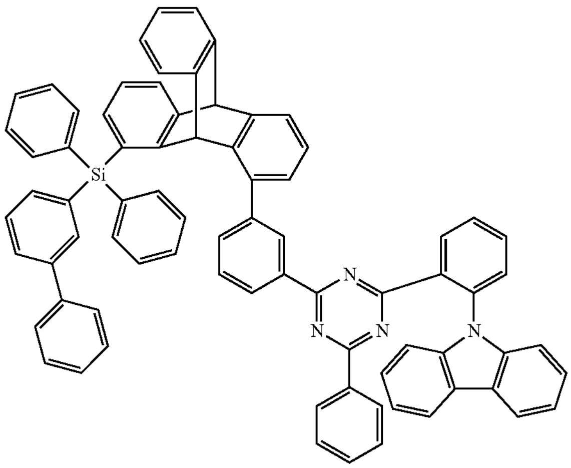
C-94
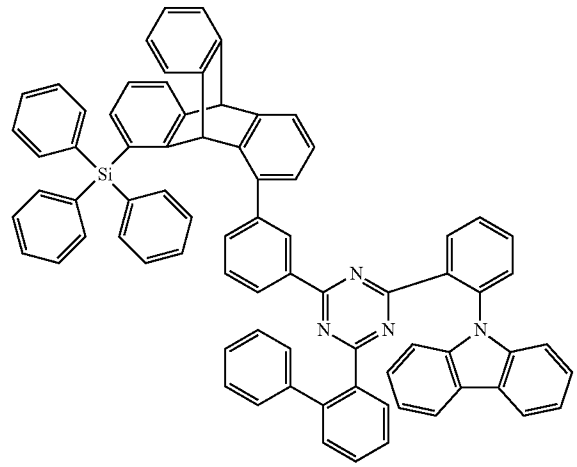
C-95
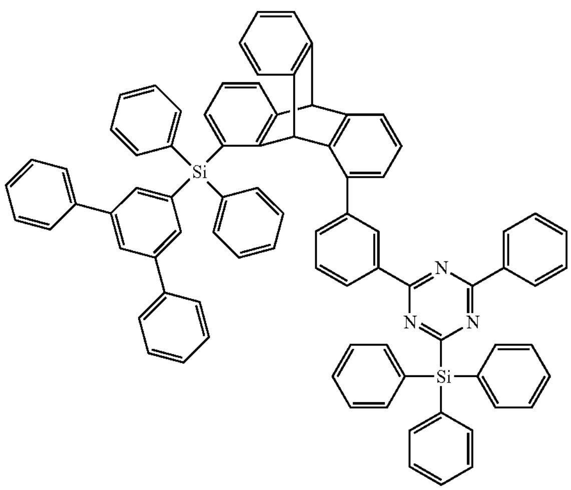
C-96
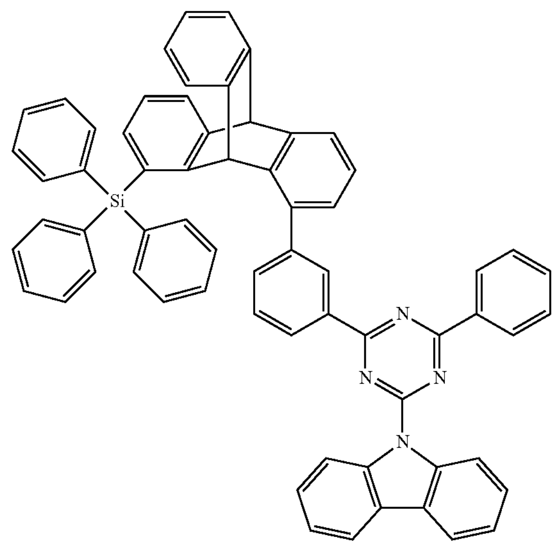
C-97
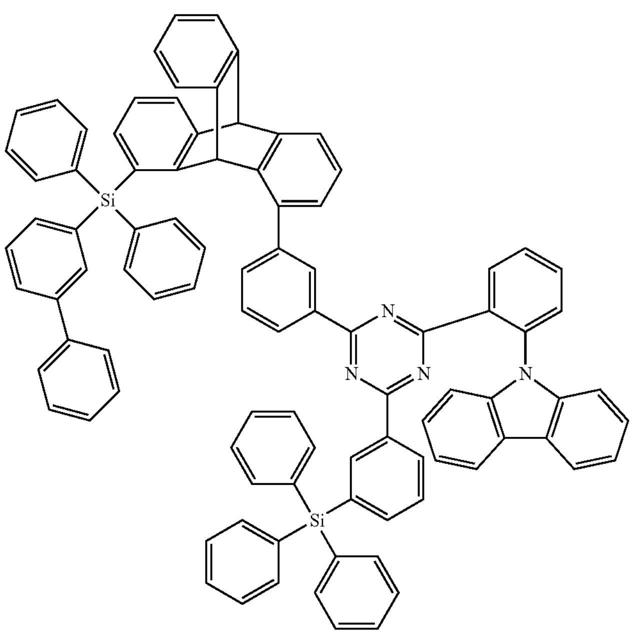

-continued
C-98
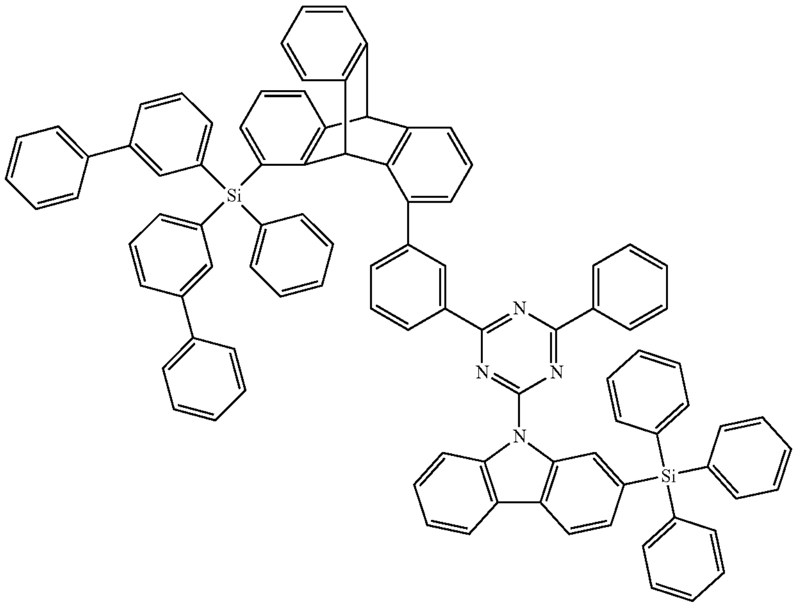
C-99
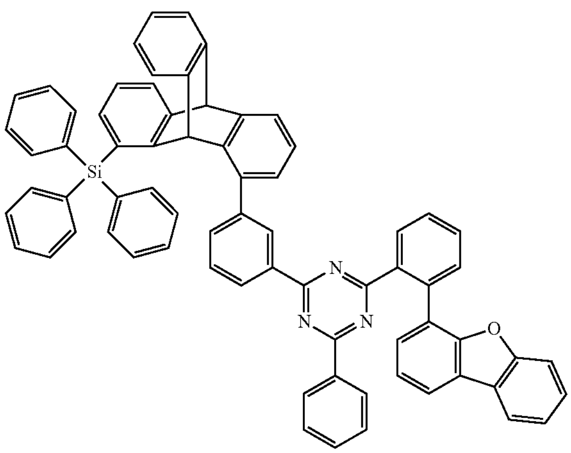
C-100
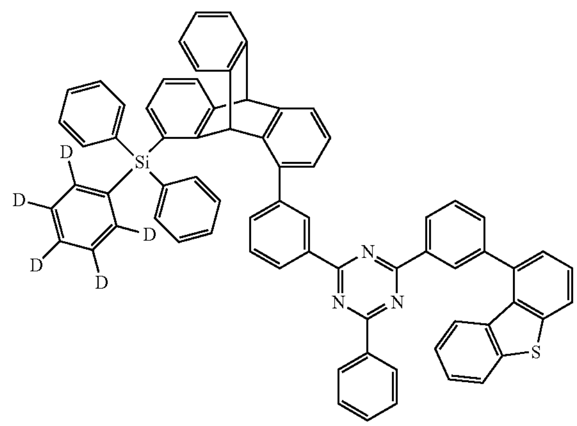
C-101
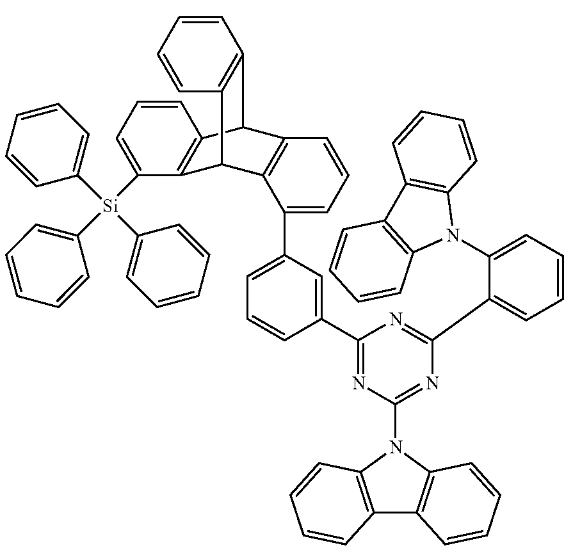
C-102
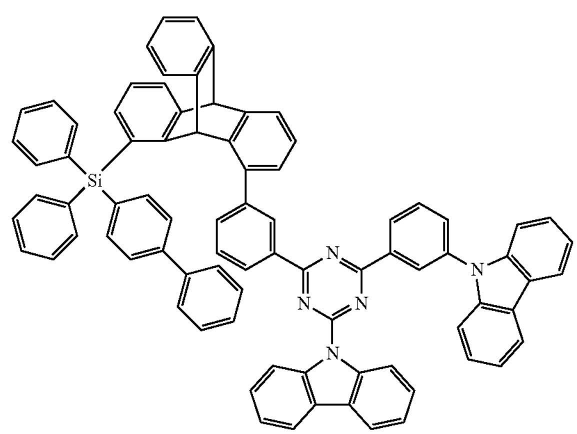

-continued
C-103
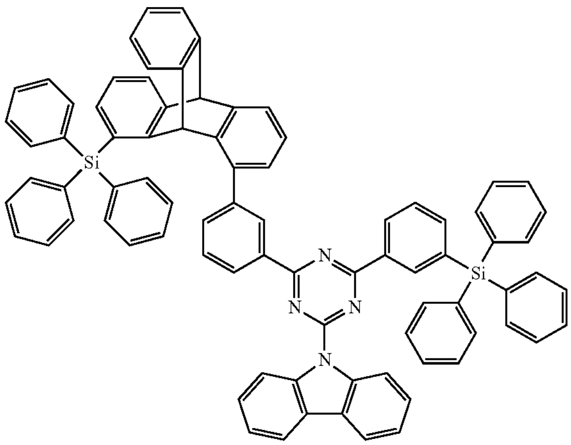
C-104
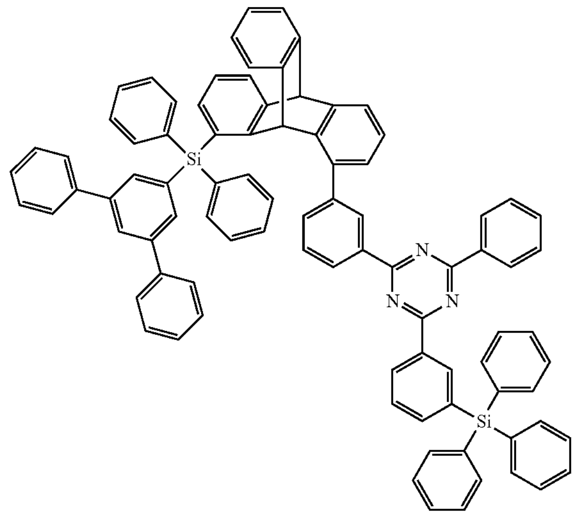
C-105
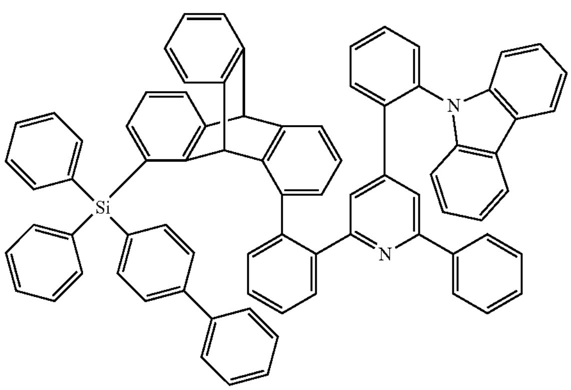
C-106
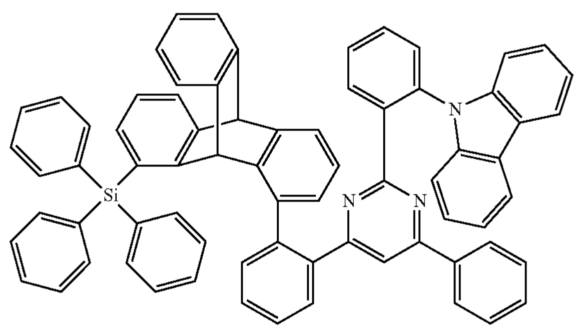
C-107
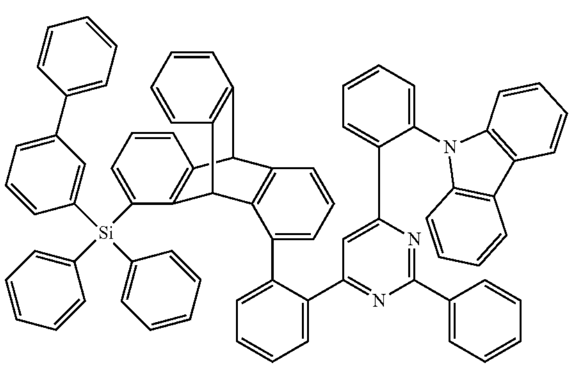
C-108
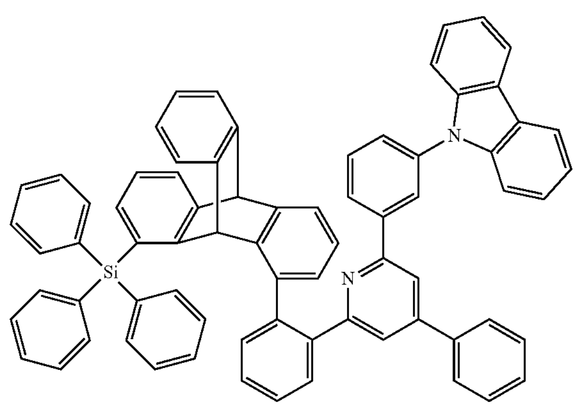

-continued
C-109
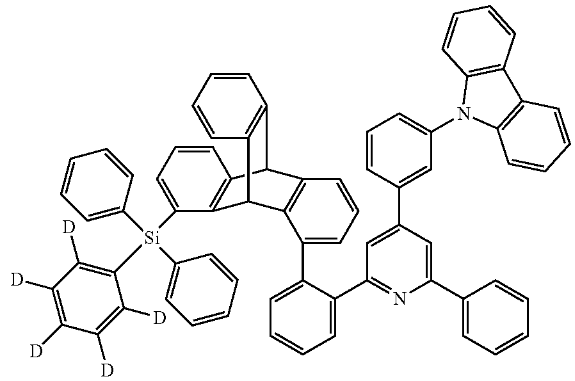
C-110
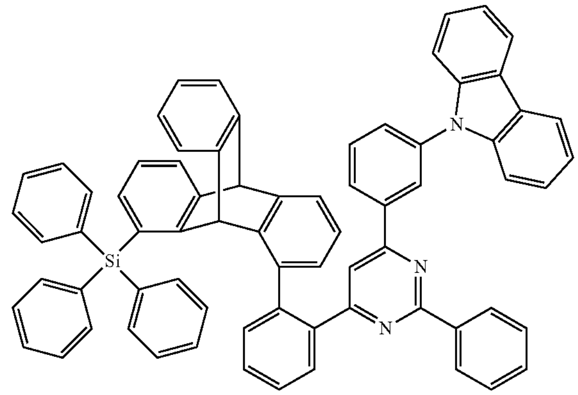
C-111
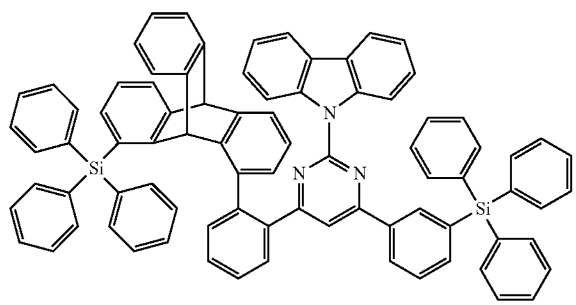
C-112
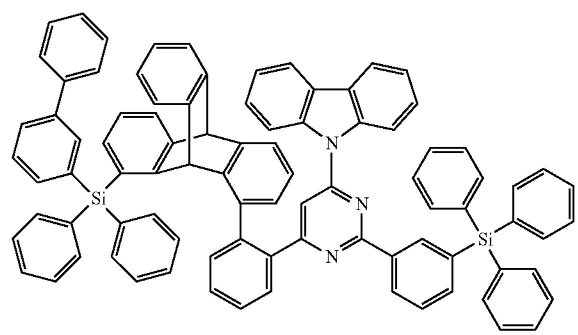
C-113
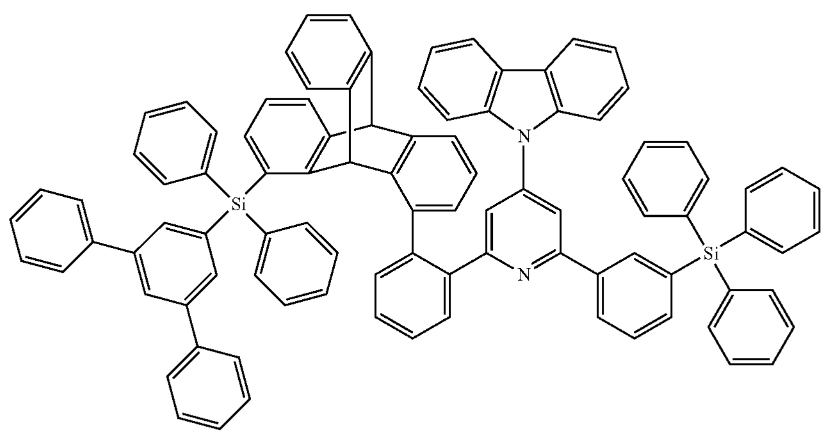
C-114
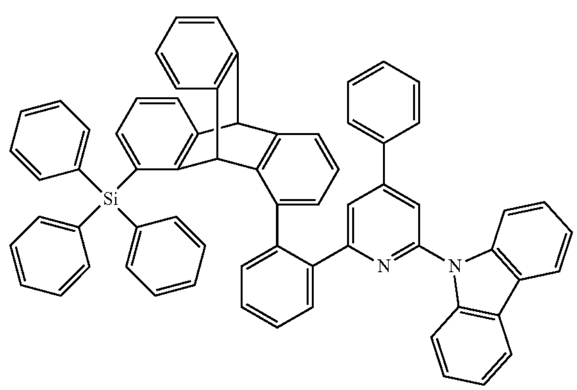
C-115
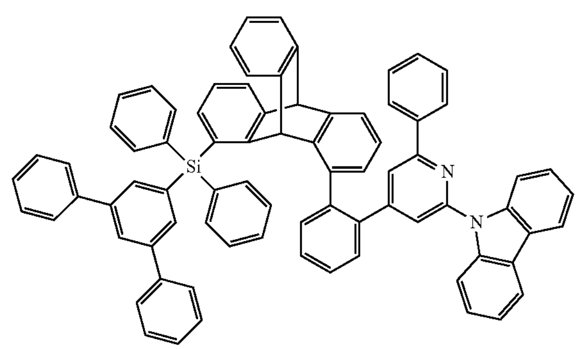

-continued
C-116
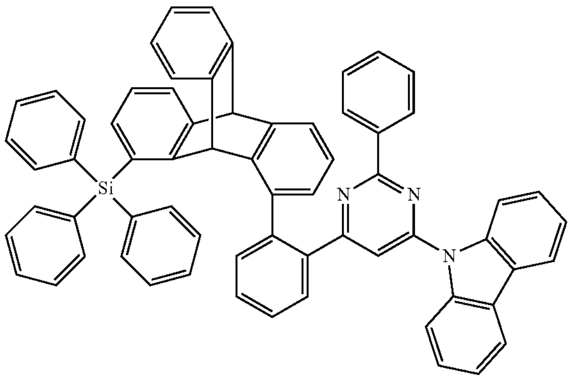
C-117
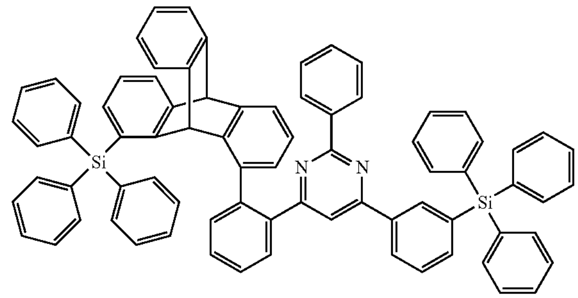
C-118
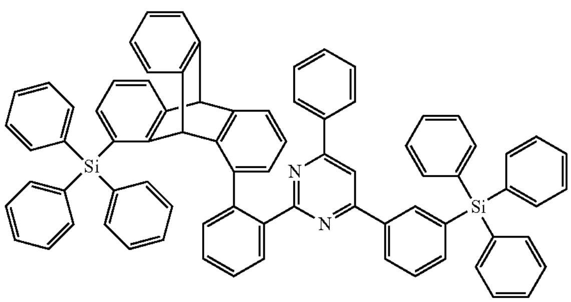
C-119
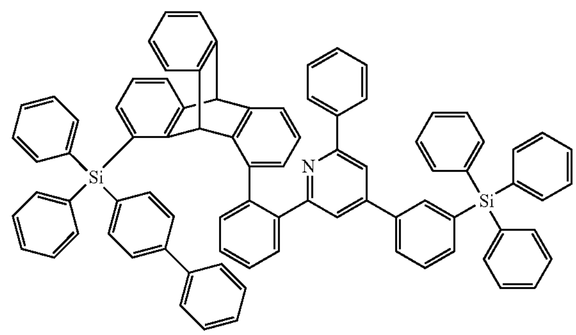
C-120
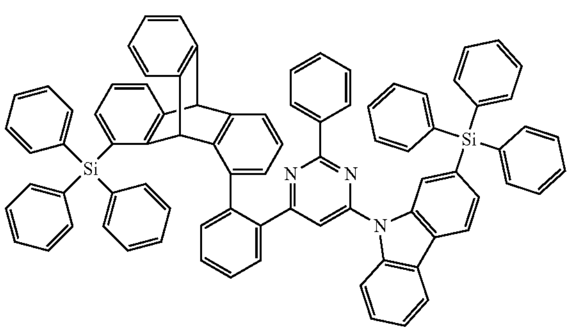
C-121
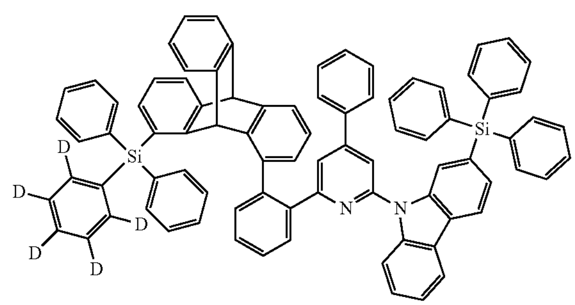
C-122
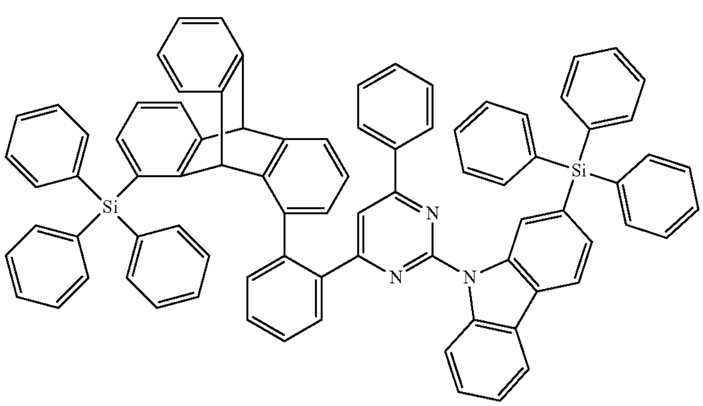

-continued
C-123
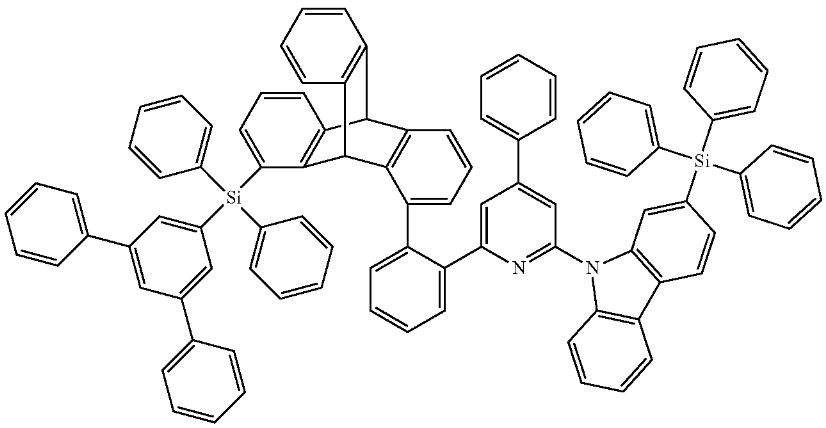
C-124
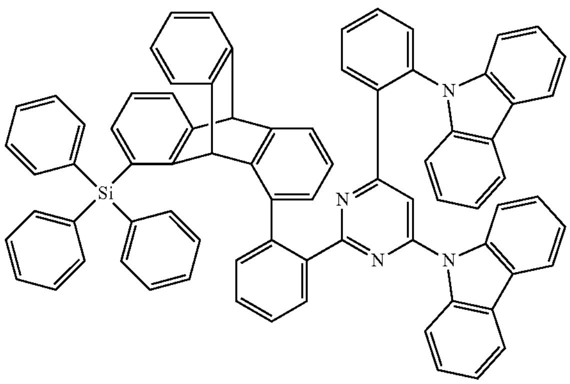
C-125
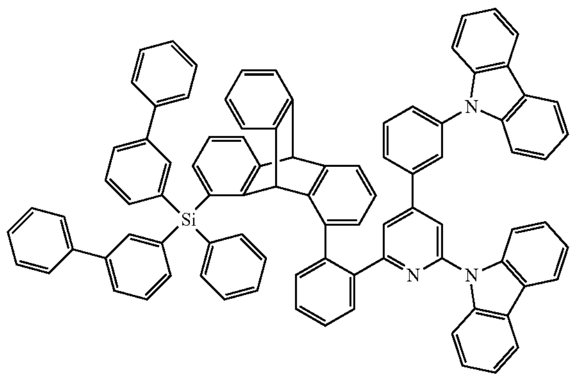
C-126
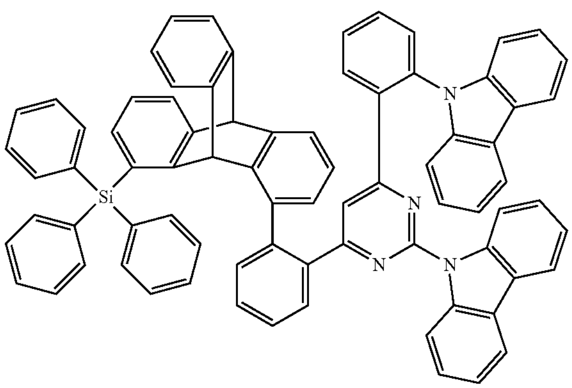
C-127
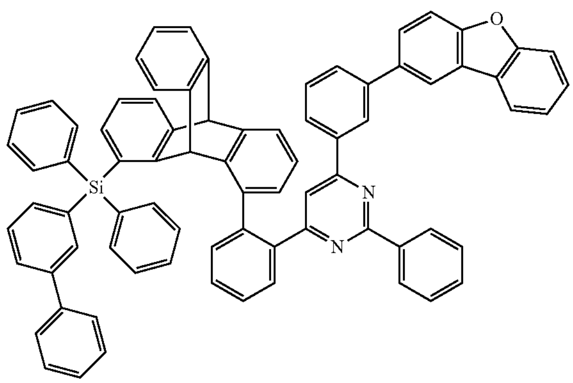
C-128
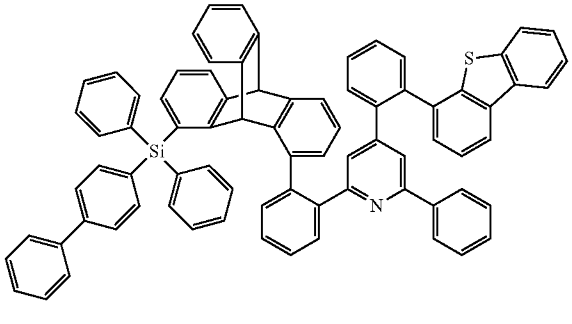
C-129
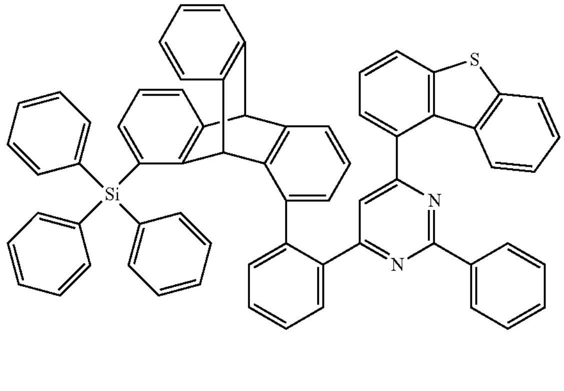

-continued
C-130
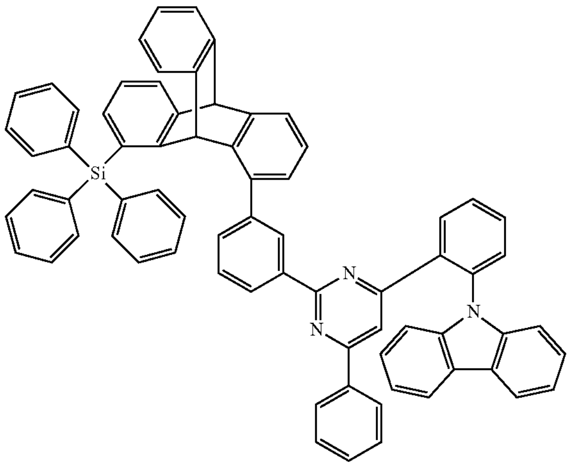
C-131
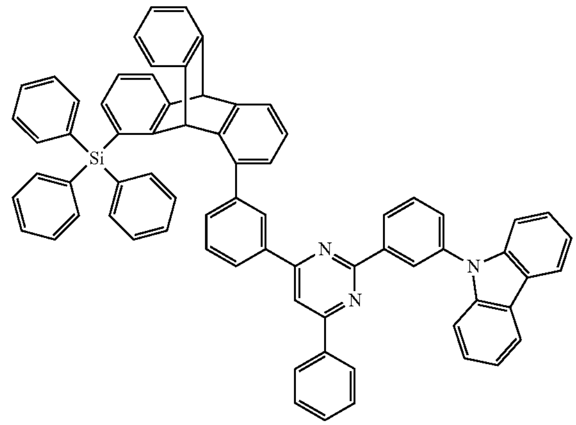
C-132
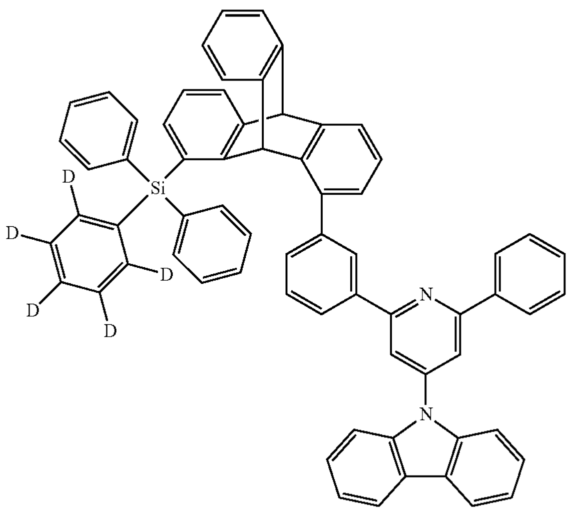
C-133
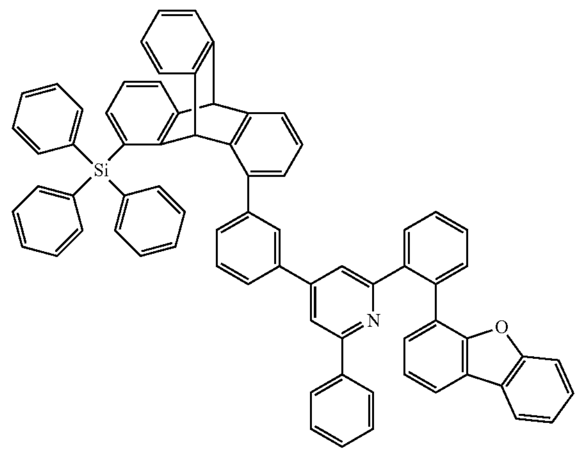
C-134
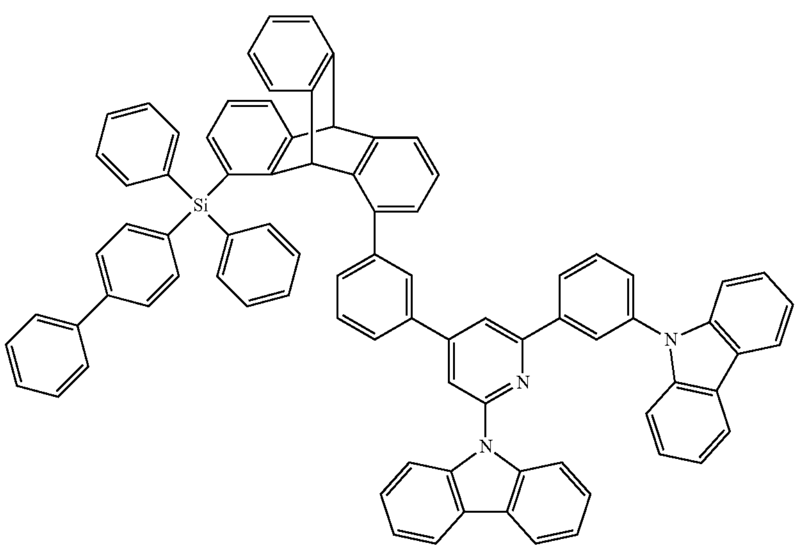

-continued
C-135
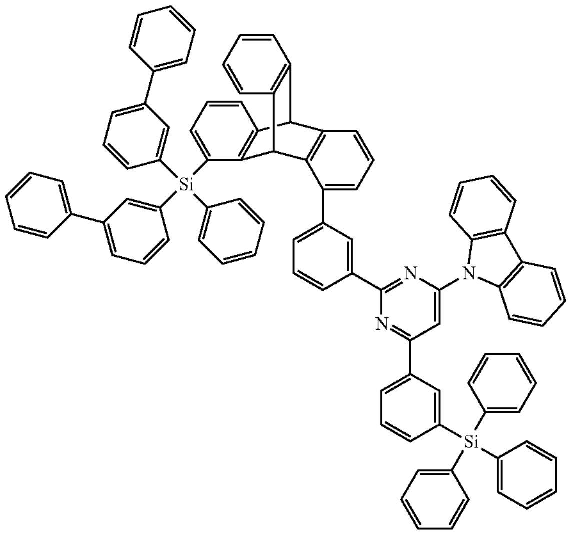
C-136
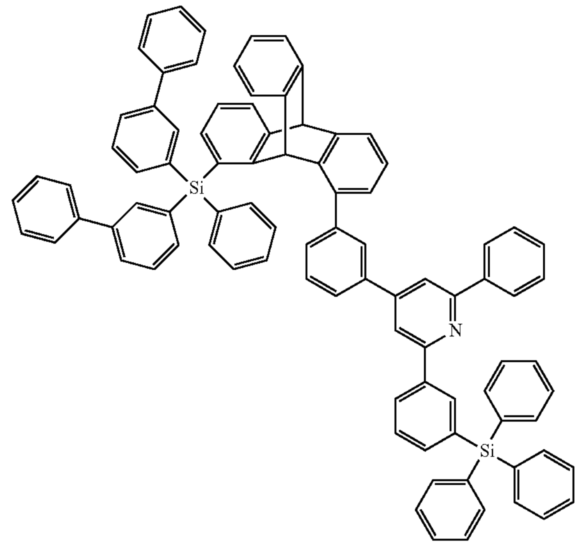
* * * * *